US009601696B2

(12) United States Patent
Tanaka et al.

(10) Patent No.: US 9,601,696 B2
(45) Date of Patent: Mar. 21, 2017

(54) ELECTROLUMINESCENT COMPOSITION AND ELECTRIC DEVICE WITH HIGH BRIGHTNESS

(75) Inventors: Masanobu Tanaka, Tsukuba (JP); Rui Ishikawa, Tsukuba (JP); Takayuki Iijima, Tsukuba (JP); Kensaku Horie, Tsukuba (JP); Ken Sakakibara, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 535 days.

(21) Appl. No.: 14/008,043

(22) PCT Filed: Dec. 22, 2011

(86) PCT No.: PCT/JP2011/079878

§ 371 (c)(1), (2), (4) Date: Sep. 27, 2013

(87) PCT Pub. No.: WO2012/132149

PCT Pub. Date: Oct. 4, 2012

(65) Prior Publication Data

US 2014/0008637 A1 Jan. 9, 2014

(30) Foreign Application Priority Data

Mar. 28, 2011 (JP) ................................ 2011-071199

(51) Int. Cl.
*H01L 51/50* (2006.01)
*H01L 51/00* (2006.01)
(Continued)

(52) U.S. Cl.
CPC .......... *H01L 51/0039* (2013.01); *C08G 61/02* (2013.01); *C08K 3/22* (2013.01);
(Continued)

(58) Field of Classification Search
None
See application file for complete search history.

(56) References Cited

U.S. PATENT DOCUMENTS 4,519,938 A 5/1985 Papir
5,637,652 A 6/1997 Kato et al.
(Continued)

FOREIGN PATENT DOCUMENTS

CN 101085857 A 12/2007
CN 101516960 A 8/2009
(Continued)

OTHER PUBLICATIONS

Extended European Search Report issued Aug. 14, 2014 in EP Application No. 11862571.4.
Office Action issued Nov. 4, 2015 in JP Application No. 2011281498.
Office Action issued Feb. 29, 2016 in CN Application No. 201180069631.3.
Int'l Search Report issued Mar. 19, 2012 in Int'l Application No. PCT/JP2011/079878.
Office Action mailed Apr. 26, 2016 in JP Application No. 2011-281498.
Int'l Search Report and Written Opinion issued Jun. 12, 2012 in Int'l Application No. PCT/JP2012/057884.
(Continued)

*Primary Examiner* — Gregory Clark
(74) *Attorney, Agent, or Firm* — Panitch Schwarze Belisario & Nadel LLP

(57) ABSTRACT

The present invention is to provide a composition that can provide an electroluminescent device emitting light with high brightness. The present invention provides following: a composition including a polymer compound comprising one or more structural unit(s) selected from the group consisting of a structural unit represented by Formula (1), a structural unit represented by Formula (3), a structural unit represented by Formula (5), a structural unit represented by Formula (16), a structural unit represented by Formula (18), a structural unit represented by Formula (20), and a structural unit represented by Formula (22) and an ionic compound represented by Formula (23); an organic film and an electric device comprising the composition.

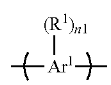

(1)

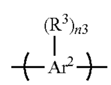

(3)

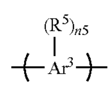

(5)

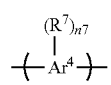

(16)

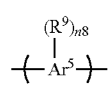

(18)

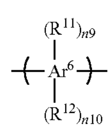

(20)

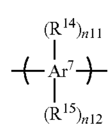

(22)

$$(M^3)_{a5}(Z^3)_{b1}$$ (23)

14 Claims, No Drawings

(51) Int. Cl.

| | |
|---|---|
| ***C08G 61/02*** | (2006.01) |
| ***C08L 65/00*** | (2006.01) |
| ***C08K 3/22*** | (2006.01) |
| ***C08K 5/098*** | (2006.01) |
| ***C09K 11/06*** | (2006.01) |
| ***H05B 33/22*** | (2006.01) |

(52) U.S. Cl.

CPC .............. *C08K 5/098* (2013.01); *C08L 65/00* (2013.01); *C09K 11/06* (2013.01); *H01L 51/0035* (2013.01); *H01L 51/0043* (2013.01); *H05B 33/22* (2013.01); *C08G 2261/1424* (2013.01); *C08G 2261/1426* (2013.01); *C08G 2261/314* (2013.01); *C08G 2261/3142* (2013.01); *C08G 2261/52* (2013.01); *C08G 2261/95* (2013.01); *C09K 2211/1416* (2013.01); *C09K 2211/1433* (2013.01); *C09K 2211/1466* (2013.01); *C09K 2211/1475* (2013.01); *Y02E 10/549* (2013.01)

(56) References Cited

U.S. PATENT DOCUMENTS

| | | | | |
|---|---|---|---|---|
| 6,259,201 | B1 | 7/2001 | Lee et al. | |
| 6,538,263 | B1 | 3/2003 | Park et al. | |
| 6,723,828 | B2 | 4/2004 | Pei | |
| 7,118,810 | B2 | 10/2006 | Park et al. | |
| 7,436,649 | B2 | 10/2008 | Omura | |
| 8,815,414 | B2 | 8/2014 | Kobayashi et al. | |
| 2002/0037432 | A1 | 3/2002 | Park et al. | |
| 2003/0013843 | A1 | 1/2003 | Pei | |
| 2005/0033015 | A1 | 2/2005 | Pei | |
| 2007/0120115 | A1 | 5/2007 | Makiura et al. | |
| 2008/0020208 | A1 | 1/2008 | Lee et al. | |
| 2008/0048555 | A1 | 2/2008 | Aoyama et al. | |
| 2009/0326150 | A1 | 12/2009 | Kang et al. | |
| 2010/0151319 | A1 | 6/2010 | Park et al. | |
| 2011/0006294 | A1 * | 1/2011 | Tanaka .................. | C08G 61/02 257/40 |
| 2011/0169045 | A1 | 7/2011 | Oyamada et al. | |
| 2012/0032121 | A1 | 2/2012 | Higashimura et al. | |
| 2012/0181529 | A1 | 7/2012 | Tanaka et al. | |
| 2013/0099224 | A1 | 4/2013 | Iljima et al. | |

FOREIGN PATENT DOCUMENTS

| | | | |
|---|---|---|---|
| EP | 2418033 | A1 | 2/2012 |
| EP | 2687304 | A1 | 1/2014 |
| JP | S59-502026 | A | 12/1984 |
| JP | H06145386 | A | 5/1994 |
| JP | H07-048437 | A | 2/1995 |
| JP | H0967429 | A | 3/1997 |
| JP | 2003-238773 | A | 8/2003 |
| JP | 2003-238773 | A1 | 8/2003 |
| JP | 2003-530676 | A | 10/2003 |
| JP | 2004269702 | A | 9/2004 |
| JP | 2004-534872 | A | 11/2004 |
| JP | 2006-299015 | A | 11/2006 |
| JP | 2007-172984 | A | 7/2007 |
| JP | 2007-327058 | A | 12/2007 |
| JP | 2009-537061 | A | 10/2009 |
| JP | 2010-084094 | A | 4/2010 |
| JP | 2010-116441 | A | 5/2010 |
| JP | 2010261102 | A | 11/2010 |
| WO | 2005064702 | A1 | 7/2005 |
| WO | 2006128352 | A1 | 12/2006 |
| WO | 2009110642 | A1 | 9/2009 |
| WO | 2010016101 | A1 | 2/2010 |
| WO | 2010117075 | A1 | 10/2010 |
| WO | 2012002284 | A1 | 1/2012 |

OTHER PUBLICATIONS

Qin et al, "High solubility and photoluminescence quantum yield water-soluble polyfluorenes with dendronized amino acid side chains: synthesis, photophysical, and metal ion sensing properties," Journal of Materials Chemistry, vol. 20, pp. 7957-7964 (2010).

Molina et al, "A Novel L-Tyrosine Derivative of Poly[(fluoren-2,7-diyl)-alt-co-(benzen-1,4-diyl)]: Strategy of Synthesis and Chiroptical and Electrochemical Characterization," Macromolecules, vol. 40, pp. 3042-3048 (2007).

Liu et al, "Anionic benzothiadiazole containing polyfluorene and oligofluorene as organic sensitizers for dye-sensitized solar cells," Chem. Commun., vol. 32, pp. 3789-3791 (Jun. 23, 2008).

Office Action issued Sep. 21, 2016 in CN Application No. 2016091801158290.

Office Action issued Sep. 21, 2016 in CN Application No. 201180069631.3.

Frampton et al, "Synthesis and Optoelectronic Properties of Non-polar Polyrotaxane Insulated Molecular Wires with High Solubility in Organic Solvents," Advanced Functional Materials, vol. 18, pp. 3367-3376 (2008).

Burrows et al, "Aqueous Solution Behavior of Anionic Fluorene-co-thiophene-Based Conjugated Polyelectrolytes," Applied Materials & Interfaces, vol. 1, No. 4, pp. 864-874 (2009).

Office Action issued Jul. 10, 2015 in CN Application No. 201280015865.4.

Office Action issued Dec. 8, 2015 in JP Application No. 2012072123.

Tae-Woo, et al., "Polymer light-emitting devices using ionomers as an electron injecting and hole blocking layer", Journal of Applied Physics, vol. 90, No. 5, pp. 2128-2134 (2001).

* cited by examiner

ELECTROLUMINESCENT COMPOSITION AND ELECTRIC DEVICE WITH HIGH BRIGHTNESS

CROSS-REFERENCE TO RELATED APPLICATION

This application is a Section 371 of International Application No. PCT/JP2011/079878, filed Dec. 22, 2011, which was published in the Japanese language on Oct. 4, 2012, under International Publication No. WO 2012/132149 A1, and the disclosure of which is incorporated herein by reference.

TECHNICAL FIELD

The present invention relates to a composition, and an organic film and an electronic device using the composition.

BACKGROUND

In order to improve the characteristics of an electroluminescent device, insertion of various layers between a light emitting layer and an electrode has been investigated. For example, an electroluminescent device having a layer made of a non-conjugated polymer compound including a substituent having a cation and two heteroatoms placed between a light emitting layer and an electrode has been known (Patent Literature 1).

RELATED ART DOCUMENTS

Patent Literature

Patent Literature 1: Japanese Patent Application Laid-open No. 2003-530676

SUMMARY OF THE INVENTION

Problem to be Solved by the Invention

Brightness of the electroluminescent device was, however, not yet sufficient.

An object of the present invention is to provide a composition that can provide an electroluminescent device emitting light with high brightness.

Means for Solving Problem

The inventors of the present invention have found out that the object described above can be achieved by the following composition, and have reached the present invention.

The invention provides the following [1] to [20]:

[1] A composition comprising:

a polymer compound comprising one or more structural unit(s) selected from the group consisting of a structural unit represented by Formula (1), a structural unit represented by Formula (3), a structural unit represented by Formula (5), a structural unit represented by Formula (16), a structural unit represented by Formula (18), a structural unit represented by Formula (20), and a structural unit represented by Formula (22); and an ionic compound represented by Formula (23); wherein the structural unit represented by Formula (1) is:

[Chemical Formula 1]

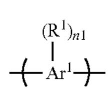

(1)

wherein:

$R^1$ is a monovalent group comprising a group represented by Formula (2);

$Ar^1$ is a (2+n1)-valent aromatic group that optionally has a substituent other than $R^1$;

$n^1$ is an integer of 1 or more;

when a plurality of $R^1$ are present, each $R^1$ may be the same as or different from each other; and wherein the group represented by Formula (2) is:

$$—R^2\text{-}\{(Q^1)_{n2}\text{-}Y^1(M^1)_{a1}\}_{m1} \quad (2)$$

wherein:

$R^2$ is a single bond or a (1+m1)-valent organic group;

$Q^1$ is a divalent organic group;

$Y^1$ is $—CO_2^-$, $—SO_3^-$, $—SO_2^-$, $PO_3^{2-}$, or $—B(R^\alpha)_3^-$;

$M^1$ is a metallic cation or an ammonium cation that optionally has a substituent;

n2 is an integer of 0 or more;

a1 is an integer of 1 or more and is selected so that the charge of the group represented by Formula (2) is zero;

$R^\alpha$ is an alkyl group having 1 to 30 carbon atoms that optionally has a substituent or an aryl group having 6 to 50 carbon atoms that optionally has a substituent;

each $R^\alpha$ may be the same as or different from each other;

m1 is an integer of 1 or more, and when $R^2$ is a single bond, m1 is 1;

when a plurality of $Q^1$ are present, each $Q^1$ may be the same as or different from each other;

when a plurality of $Y^1$ are present, each $Y^1$ may be the same as or different from each other;

when a plurality of $M^1$ are present, each $M^1$ may be the same as or different from each other;

when a plurality of n2 are present, each n2 may be the same as or different from each other; and when a plurality of a1 are present, each a1 may be the same as or different from each other;

wherein the structural unit represented by Formula (3) is:

[Chemical Formula 2]

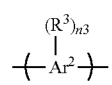

(3)

wherein:

$R^3$ is a monovalent group comprising a group represented by Formula (4);

$Ar^2$ is a (2+n3)-valent aromatic group that optionally has a substituent other than $R^3$;

n3 is an integer of 1 or more;

when a plurality of $R^3$ are present, each $R^3$ may be the same as or different from each other; and wherein the group represented by Formula (4) is:

$$—R^4\text{-}\{(Q^2)_{n4}\text{-}Y^2(M^2)_{a2}\}_{m2} \quad (4)$$

wherein:

$R^4$ is a single bond or a (1+m2)-valent organic group;

$Q^2$ is a divalent organic group;

$Y^2$ is a carbocation, an ammonium cation, a phosphonium cation, a sulfonium cation, or an iodonium cation;

$M^2$ is $F^-$, $Cl^-$, $Br^-$, $I^-$, $OH^-$, $B(R^b)_4^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$;

n4 is an integer of 0 or more;

a2 is 1;

$R^b$ is an alkyl group having 1 to 30 carbon atoms that optionally has a substituent or an aryl group having 6 to 50 carbon atoms that optionally has a substituent;

when a plurality of $R^b$ are present, each $R^b$ may be the same as or different from each other;

m2 is an integer of 1 or more, and when $R^4$ is a single bond, m2 is 1;

when a plurality of $Q^2$ are present, each $Q^2$ may be the same as or different from each other;

when a plurality of $Y^2$ are present, each $Y^2$ may be the same as or different from each other;

when a plurality of $M^2$ are present, each $M^2$ may be the same as or different from each other; and when a plurality of n4 are present, each n4 may be the same as or different from each other;

wherein the structural unit represented by Formula (5) is:

[Chemical Formula 3]

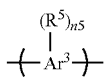

(5)

wherein:

$R^5$ is a monovalent group comprising a group represented by Formula (6);

$Ar^3$ is a (2+n5)-valent aromatic group that optionally has a substituent other than $R^5$;

n5 is an integer of 1 or more;

when a plurality of $R^5$ are present, each $R^5$ may be the same as or different from each other; and wherein the group represented by Formula (6) is:

$$—R^6\text{-}\{(Q^3)_{n6}\text{-}Y^3\}_{m3} \quad (6)$$

wherein:

$R^6$ is a single bond or a (1+m3)-valent organic group;

$Q^3$ is a divalent organic group;

$Y^3$ is a cyano group or a group represented by either of Formulas (7) to (15);

n6 is an integer of 0 or more;

m3 is an integer of 1 or more, and when $R^6$ is a single bond, m3 is 1;

when a plurality of $Q^3$ are present, each $Q^3$ may be the same as or different from each other;

when a plurality of $Y^3$ are present, each $Y^3$ may be the same as or different from each other; and when a plurality of n6 are present, each n6 may be the same as or different from each other; and wherein Formulas (7) to (15) are:

$$—O—(R'O)_{a3}—R'' \quad (7)$$

[Chemical Formula 4]

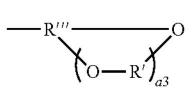

(8)

$$—S—(R'S)_{a4}—R'' \quad (9)$$

$$—C(=O)—(R'—C(=O))_{a4}—R'' \quad (10)$$

$$—C(=S)—(R'—C(=S))_{a4}—R'' \quad (11)$$

$$—N\{(R')_{a4}—R''\}_2 \quad (12)$$

$$—C(=O)O—(R'—C(=O)O)_{a4}—R'' \quad (13)$$

$$—C(=O)O—(R'O)_{a4}—R'' \quad (14)$$

$$—NHC(=O)—(R'NHC(=O))_{a4}—R'' \quad (15)$$

wherein:

R' is a divalent hydrocarbon group that optionally has a substituent;

R'' is a hydrogen atom, a monovalent hydrocarbon group that optionally has a substituent, a carboxyl group, a sulfo group, a hydroxyl group, a mercapto group, $—NR^C_2$, a cyano group, or $—C(=O)NR^c_2$;

R''' is a trivalent hydrocarbon group that optionally has a substituent;

a3 is an integer of 1 or more;

a4 is an integer of 0 or more;

$R^c$ is an alkyl group having 1 to 30 carbon atoms that optionally has a substituent or an aryl group having 6 to 50 carbon atoms that optionally has a substituent;

each $R^c$ may be the same as or different from each other;

when a plurality of R' are present, each R' may be the same as or different from each other;

when a plurality of R'' are present, each R'' may be the same as or different from each other; and when a plurality of a4 are present, each a4 may be the same as or different from each other;

wherein the structural unit represented by Formula (16) is:

[Chemical Formula 5]

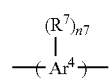

(16)

wherein:

$R^7$ is a monovalent group comprising a group represented by Formula (17);

$Ar^4$ is a (2+n7)-valent aromatic group that optionally has a substituent other than $R^7$;

n7 is an integer of 1 or more;

when a plurality of $R^7$ are present, each $R^9$ may be the same as or different from each other; and wherein the structural unit represented by Formula (17) is:

[Chemical Formula 6]

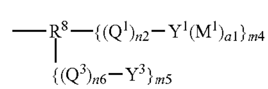

(17)

wherein:

$R^8$ is a (1+m4+m5)-valent organic group;

$Q^1$, $Q^3$, $Y^1$, $M^1$, $Y^3$, n2, a1, and n6 are the same as the corresponding definitions above;

m4 and m5 are each independently an integer of 1 or more;

when a plurality of $Q^1$ are present, each $Q^1$ may be the same as or different from each other;

when a plurality of $Q^3$ are present, each $Q^3$ may be the same as or different from each other;

when a plurality of $Y^1$ are present, each $Y^1$ may be the same as or different from each other;

when a plurality of $M^1$ are present, each $M^1$ may be the same as or different from each other;

when a plurality of $Y^3$ are present, each $Y^3$ may be the same as or different from each other;

when a plurality of n2 are present, each n2 may be the same as or different from each other;

when a plurality of a1 are present, each a1 may be the same as or different from each other; and when a plurality of n6 are present, each n6 may be the same as or different from each other;

wherein the structural unit represented by Formula (18) is:

[Chemical Formula 7]

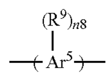

(18)

wherein:

$R^9$ is a monovalent group comprising a group represented by Formula (19);

$Ar^5$ is a (2+n8)-valent aromatic group that optionally has a substituent other than $R^9$;

n8 is an integer of 1 or more;

when a plurality of $R^9$ are present, each $R^9$ may be the same as or different from each other; and wherein the group represented by Formula (19) is:

[Chemical Formula 8]

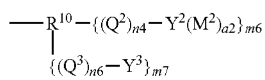

(19)

wherein:

$R^{10}$ is a (1+m6+m7)-valent organic group;

$Q^2$, $Q^3$, $Y^2$, $M^2$, $Y^3$, n4, a2, and n6 are the same as the corresponding definitions above;

m6 and m7 are each independently an integer of 1 or more; and when a plurality of $Q^2$ are present, each $Q^2$ may be the same as or different from each other;

when a plurality of $Q^3$ are present, each $Q^3$ may be the same as or different from each other;

when a plurality of $Y^2$ are present, each $Y^2$ may be the same as or different from each other;

when a plurality of $M^2$ are present, each $M^2$ may be the same as or different from each other;

when a plurality of $Y^3$ are present, each $Y^3$ may be the same as or different from each other;

when a plurality of n4 are present, each n4 may be the same as or different from each other; and when a plurality of n6 are present, each n6 may be the same as or different from each other;

wherein the structural unit represented by Formula (20) is:

[Chemical Formula 9]

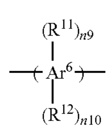

(20)

wherein:

$R^{11}$ is a monovalent group comprising a group represented by Formula (2) or a group represented by Formula (17);

$R^{12}$ is a monovalent group comprising a group represented by Formula (21);

$Ar^6$ is a (2+n9+n10)-valent aromatic group that optionally has a substituent other than either $R^{11}$ or $R^{12}$;

n9 and n10 are each independently an integer of 1 or more; and when a plurality of $R^{11}$ are present, each $R^{11}$ may be the same as or different from each other;

when a plurality of $R^{12}$ are present, each $R^{12}$ may be the same as or different from each other; and wherein the group represented by Formula (21) is:

$$—R^{13}\text{-}\{(Q^3)_{n6}\text{-}Y^3\}_{m8} \quad (21)$$

wherein:

$R^{13}$ is a single bond or a (1+m8)-valent organic group;

$Q^3$, $Y^3$, and n6 are the same as the corresponding definitions above;

m8 is an integer of 1 or more, and when $R^{13}$ is a single bond, m8 is 1;

when a plurality of $Q^3$ are present, each $Q^3$ may be the same as or different from each other;

when a plurality of $Y^3$ are present, each $Y^3$ may be the same as or different from each other; and when a plurality of n6 are present, each n6 may be the same as or different from each other;

wherein the structural unit represented by Formula (22) is:

[Chemical Formula 10]

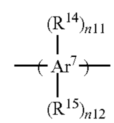

(22)

wherein:

$R^{14}$ is a monovalent group comprising a group represented by Formula (4) or a group represented by Formula (19);

$R^{15}$ is a monovalent group comprising a group represented by Formula (21);

$Ar^7$ is a (2+n11+n12)-valent aromatic group that optionally has a substituent other than either $R^{14}$ or $R^{15}$;

n11 and n12 are each independently an integer of 1 or more;

when a plurality of $R^{14}$ are present, each $R^{14}$ may be the same as or different from each other;

when a plurality of $R^{15}$ are present, each $R^{15}$ may be the same as or different from each other; and wherein the group represented by Formula (23) is:

$$(M^3)_{a5}(Z^3)_{b1} \quad (23)$$

wherein:

$M^3$ is a metallic cation or an ammonium cation that optionally has a substituent;

$Z^3$ is $F^-$, $Cl^-$, $Br^-$, $I^-$, $OH^-$, $B(R^P)_4^-$, $R^PSO_3^-$, $R^PCOO^-$, $R^PO^-$, $ClO^-$, $ClO_2^-$, $ClO_3^-$, $ClO_4^-$, $SCN^-$, $CN^-$, $NO_3^-$, $CO_3^{2-}$, $SO_4^{2-}$, $HSO_4^-$, $PO_4^{3-}$, $HPO_4^{2-}$, $H_2PO_4^-$, $BF_4^-$, or $PF_6^-$;

a5 is an integer of 1 or more, b1 is an integer of 1 or more, and a5 and b1 are selected so that the charge of the ionic compound represented by Formula (23) is zero;

$R^P$ is a monovalent organic group that optionally has a substituent; and when a plurality of $R^P$ are present, each $R^P$ may be the same as or different from each other.

[2] The composition according to [1], wherein the (2+n1)-valent aromatic group represented by $Ar^1$ is a group in which (2+n1) hydrogen atoms are removed from a ring represented by any one of Formulas 1 to 4, 6, 13 to 15, 19, 21, 23, 31 to 33, 43, 46, 47, and 51:

[Chemical Formula 11]

1

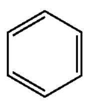

2

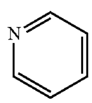

3

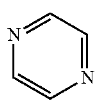

4

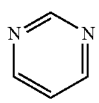

6

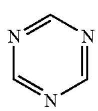

13

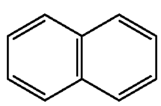

14

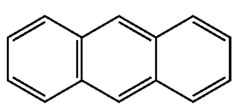

15

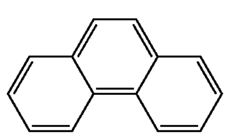

19

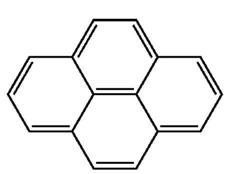

21

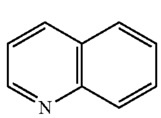

23

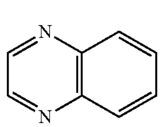

-continued

31

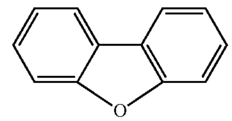

32

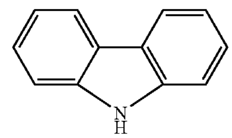

33

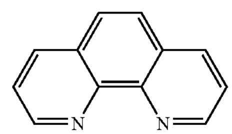

43

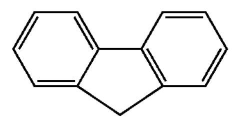

46

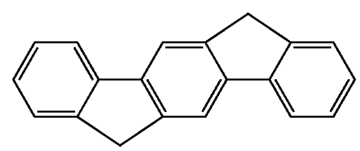

47

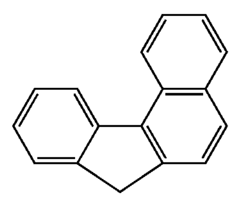

51

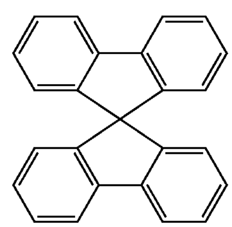

[3] The composition according to [1] or [2], wherein the (2+n1)-valent aromatic group represented by $Ar^1$ is a group in which n1 hydrogen atom(s) is(are) removed from a group represented by any one of Formulas 1', 3', 6', 13' to 15', 21', 23', 33', 43', 46', and 47':

[Chemical Formula 12]

1'

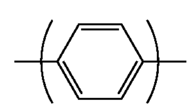

3'

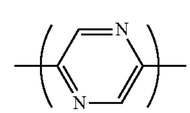

-continued
6′
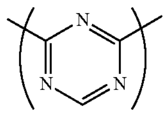
13′
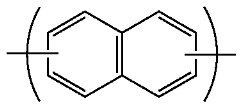
14′
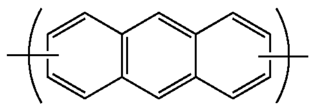
15′
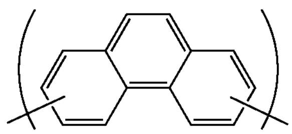
21′
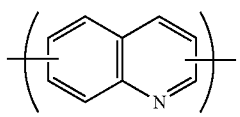
23′
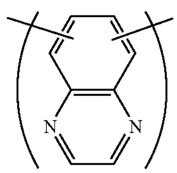
33′
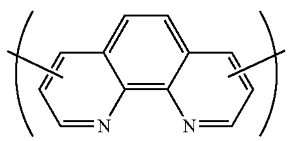
43′
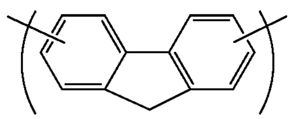
46′
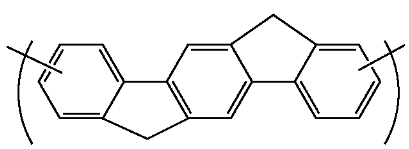
47′
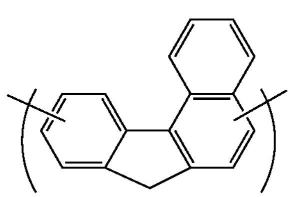
[4] The composition according to [1], wherein the (2+n3)-valent aromatic group represented by $Ar^2$ is a group in which (2+n3) hydrogen atoms are removed from a ring represented by any one of Formulas 1 to 4, 6, 13 to 15, 19, 21, 23, 31 to 33, 43, 46, 47, and 51:
[Chemical Formula 13]
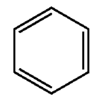
1
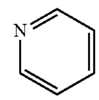
2
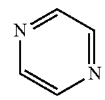
3
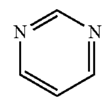
4
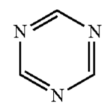
6
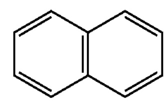
13
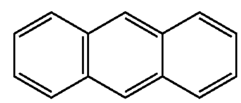
14
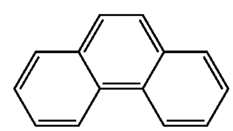
15
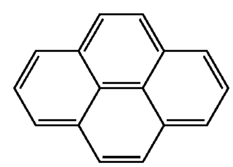
19
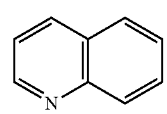
21
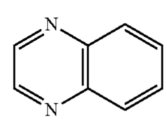
23
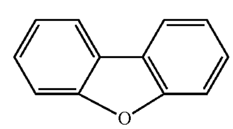
31
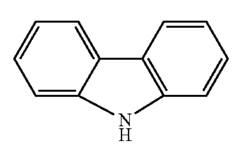
32

-continued

33

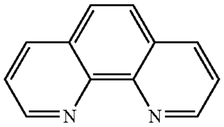

43

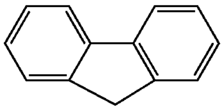

46

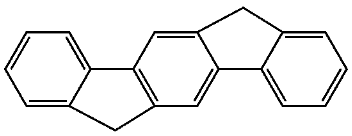

47

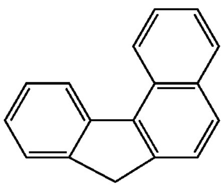

51

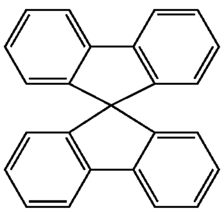

[5] The composition according to [1] or [4], wherein the (2+n3)-valent aromatic group represented by $Ar^2$ is a group in which n3 hydrogen atom(s) is(are) removed from a group represented by any one of Formulas 1', 3', 6', 13' to 15', 21', 23', 33', 43', 46', and 47':

[Chemical Formula 14]

1'

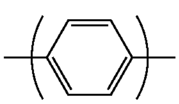

3'

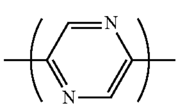

6'

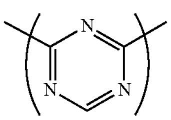

13'

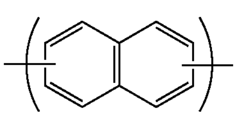

-continued

14'

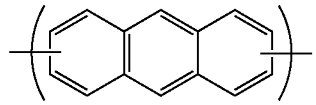

15'

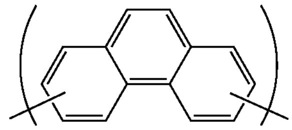

21'

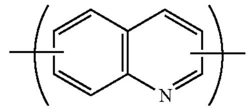

23'

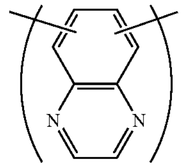

33'

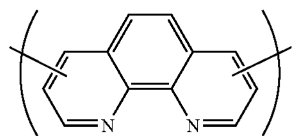

43'

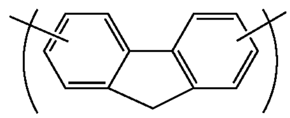

46'

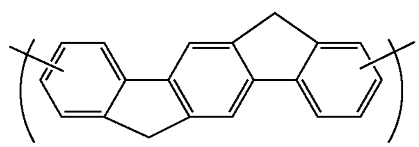

47'

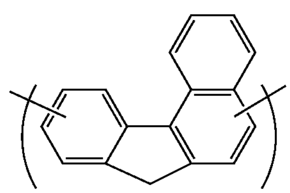

[6] The composition according to [1], wherein the (2+n5)-valent aromatic group represented by $Ar^3$ is a group in which (2+n5) hydrogen atoms are removed from a ring represented by any one of Formulas 1 to 4, 6, 13 to 15, 19, 21, 23, 31 to 33, 43, 46, 47, and 51:

[Chemical Formula 15]

1

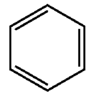

-continued
2
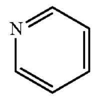
3
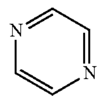
4
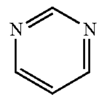
6
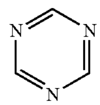
13
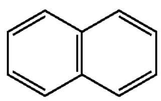
14
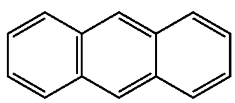
15
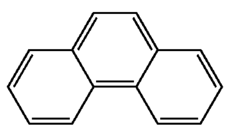
19
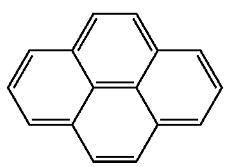
21
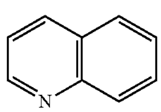
23
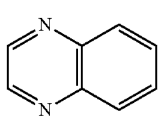
31
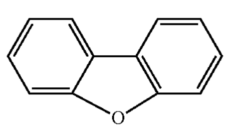
32
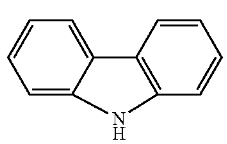
33
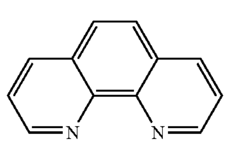
-continued
43
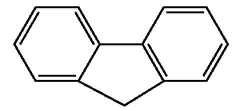
46
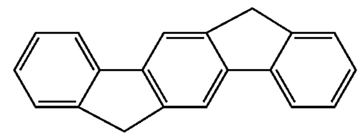
47
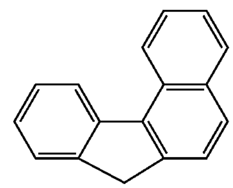
51
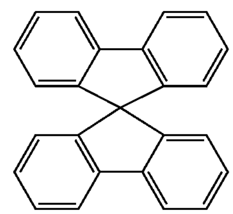
[7] The composition according to [1] or [6], wherein the (2+n5)-valent aromatic group represented by $Ar^3$ is a group in which n5 hydrogen atom(s) is(are) removed from a group represented by any one of Formulas 1', 3', 6', 13' to 15', 21', 23', 33', 43', 46', and 47':
[Chemical Formula 12]
1'
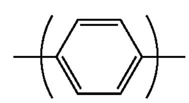
3'
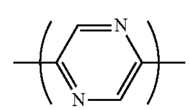
6'
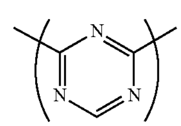
13'
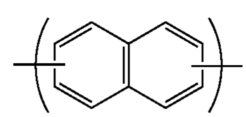
14'
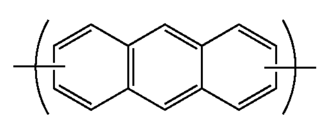

-continued
15′
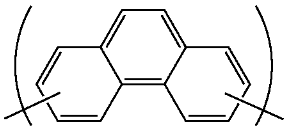
21′
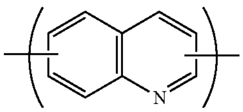
23′
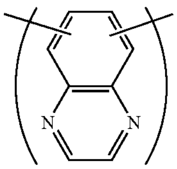
33′
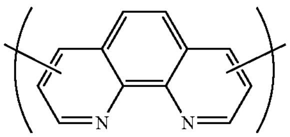
43′
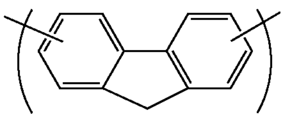
46′
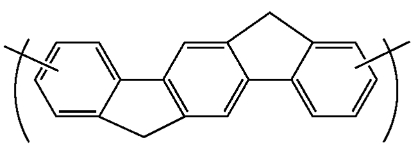
47′
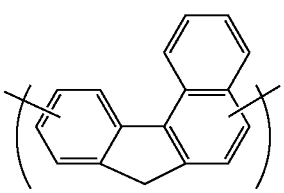
[8] The composition according to [1], wherein the (2+n7)-valent aromatic group represented by $Ar^4$ is a group in which (2+n7) hydrogen atoms are removed from a ring represented by any one of Formulas 1 to 4, 6, 13 to 15, 19, 21, 23, 31 to 33, 43, 46, 47, and 51:
[Chemical Formula 17]
1
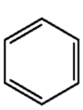
2
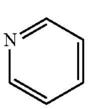
-continued
3
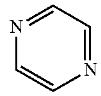
4
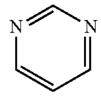
6
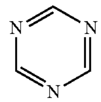
13
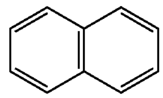
14
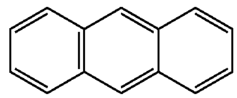
15
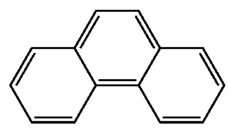
19
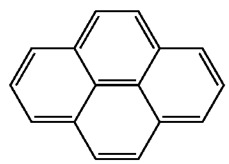
21
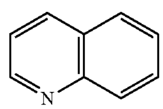
23
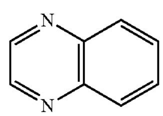
31
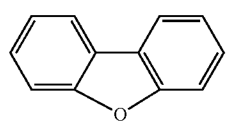
32
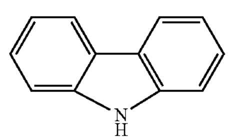
33
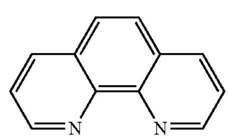
43
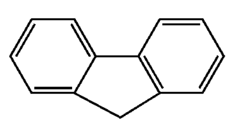

-continued

46

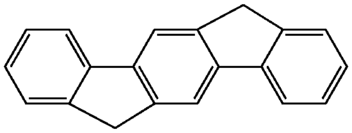

47

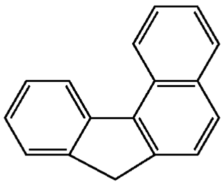

51

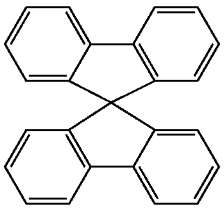

[9] The composition according to [1] or [8], wherein the (2+n7)-valent aromatic group represented by $Ar^4$ is a group in which n7 hydrogen atom(s) is(are) removed from a group represented by any one of Formulas 1', 3', 6', 13' to 15', 21', 23', 33', 43', 46', and 47':

[Chemical Formula 18]

1′

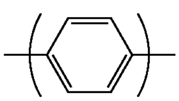

3′

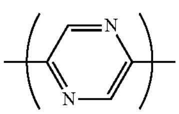

6′

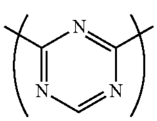

13′

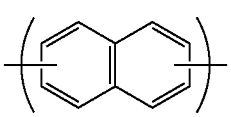

14′

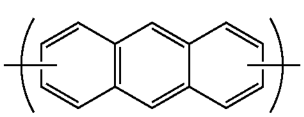

15′

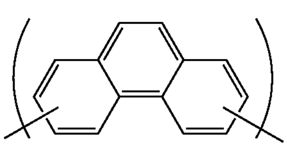

-continued

21′

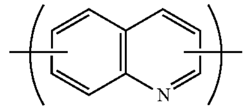

23′

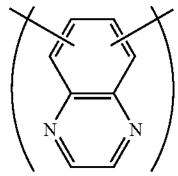

33′

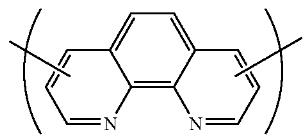

43′

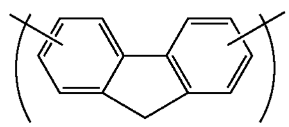

46′

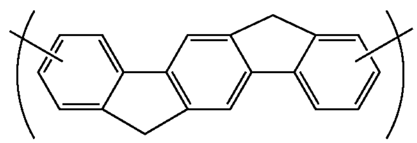

47′

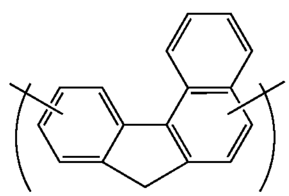

[10] The composition according to [1], wherein the (2+n8)-valent aromatic group represented by $Ar^5$ is a group in which (2+n8) hydrogen atoms are removed from a ring represented by any one of Formulas 1 to 4, 6, 13 to 15, 19, 21, 23, 31 to 33, 43, 46, 47, and 51:

[Chemical Formula 19]

1

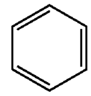

2

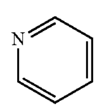

3

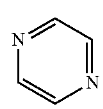

4

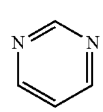

-continued
6
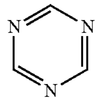
13
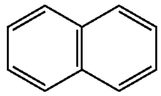
14
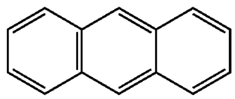
15
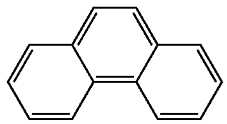
19
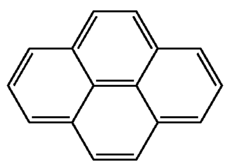
21
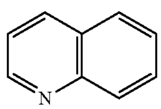
23
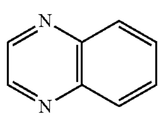
31
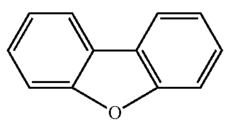
32
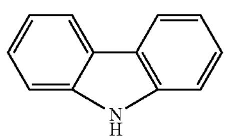
33
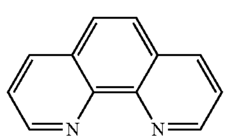
43
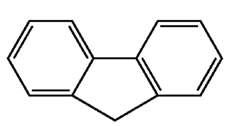
46
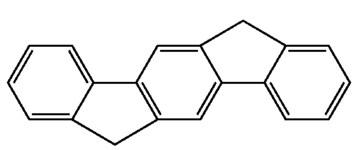
-continued
47
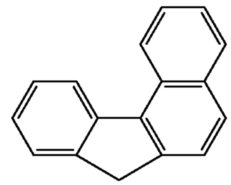
51
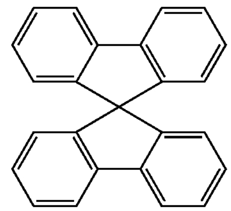
[11] The composition according to [1] or [10], wherein the (2+n8)-valent aromatic group represented by $Ar^5$ is a group in which n8 hydrogen atom(s) is(are) removed from a group represented by any one of Formulas 1', 3', 6', 13' to 15', 21', 23', 33', 43', 46', and 47':
[Chemical Formula 20]
1′
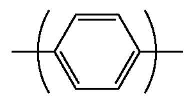
3′
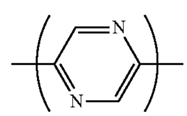
6′
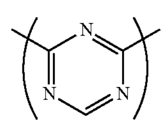
13′
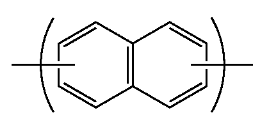
14′
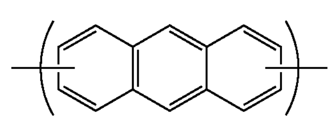
15′
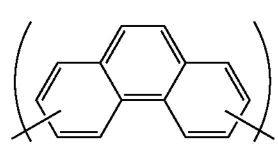
21′
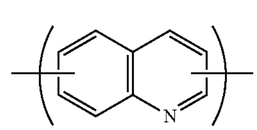

23′
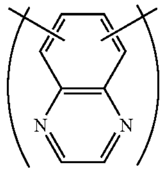
33′
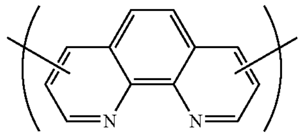
43′
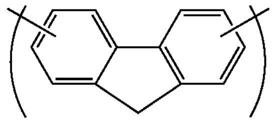
46′
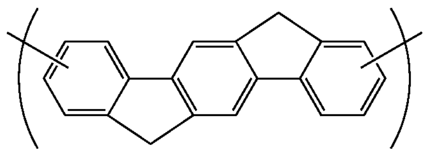
47′
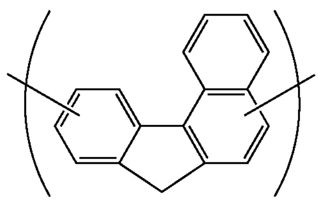
[12] The composition according to [1], wherein the (2+n9+n10)-valent aromatic group represented by $Ar^6$ is a group in which (2+n9+n10) hydrogen atoms are removed from a ring represented by any one of Formulas 1 to 4, 13 to 15, 19, 21, 23, 31 to 33, 43, 46, 47, and 51:
[Chemical Formula 21]
1
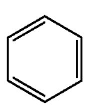
2
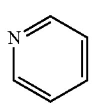
3
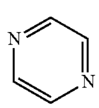
4
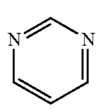
13
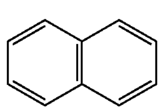
14
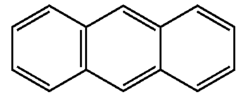
15
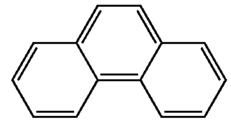
19
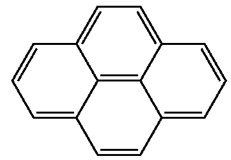
21
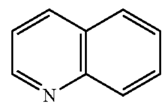
23
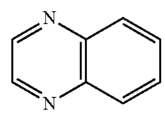
31
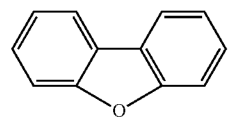
32
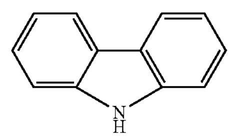
33
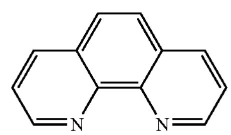
43
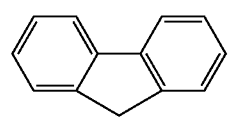
46
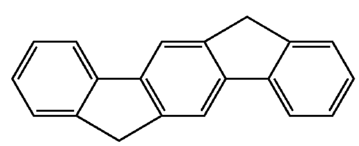
47
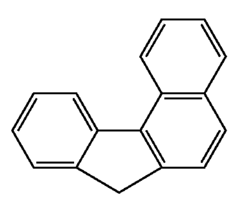

-continued

51

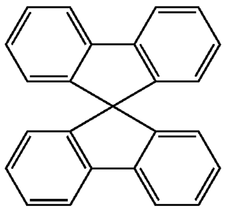

[13] The composition according to [1] or [12], wherein the (2+n9+n10)-valent aromatic group represented by $Ar^6$ is a group in which (n9+n10) hydrogen atoms are removed from a group represented by any one of Formulas 1', 3', 13' to 15', 21', 23', 33', 43', 46', and 47':

[Chemical Formula 22]

1'

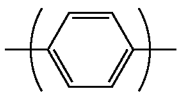

3'

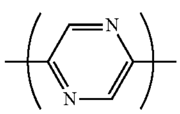

13'

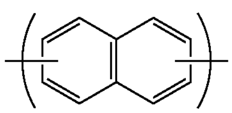

14'

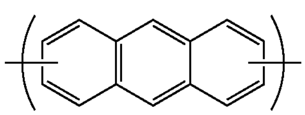

15'

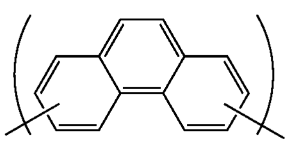

21'

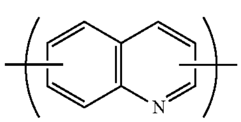

23'

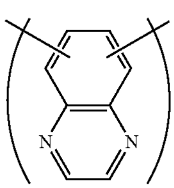

33'

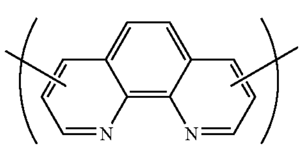

-continued

43'

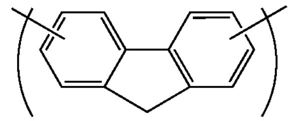

46'

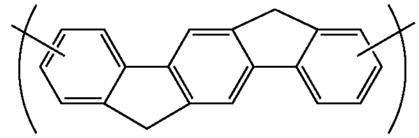

47'

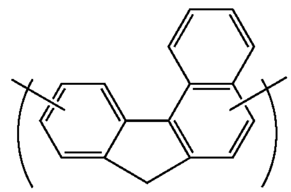

[14] The composition according to [1], wherein the (2+n11+n12)-valent aromatic group represented by $Ar^7$ is a group in which (2+n11+n12) hydrogen atoms are removed from a ring represented by any one of Formulas 1 to 4, 13 to 15, 19, 21, 23, 31 to 33, 43, 46, 47, and 51:

[Chemical Formula 23]

1

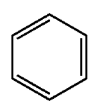

2

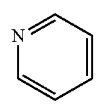

3

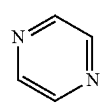

4

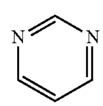

13

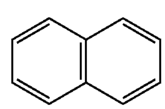

14

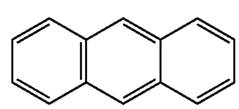

15

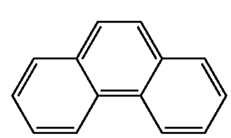

-continued
19
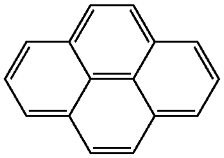
21
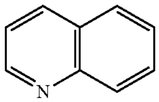
23
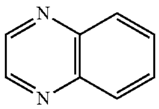
31
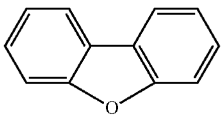
32
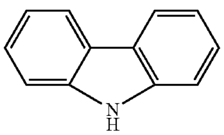
33
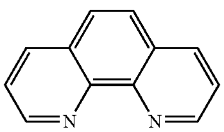
43
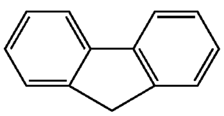
46
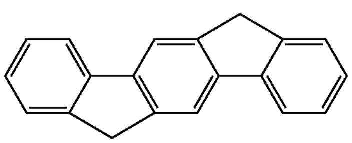
47
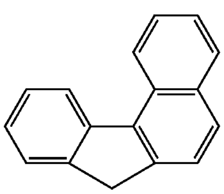
51
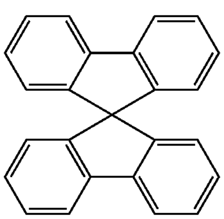
[15] The composition according to [1] or [14], wherein the (2+n11+n12)-valent aromatic group represented by $Ar^7$ is a group in which (n11+n12) hydrogen atoms are removed from a group represented by any one of Formulas 1', 3', 13' to 15', 21', 23', 33', 43', 46', and 47':
[Chemical Formula 24]
1'
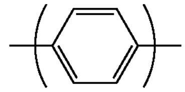
3'
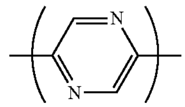
13'
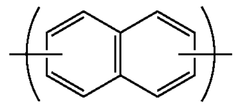
14'
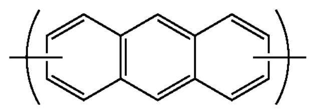
15'
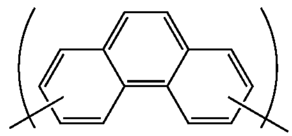
21'
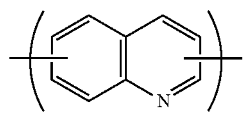
23'
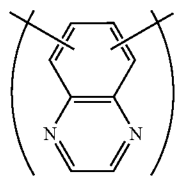
33'
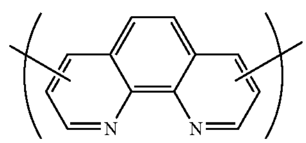
43'
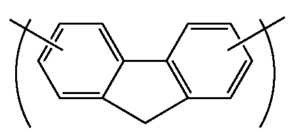
46'
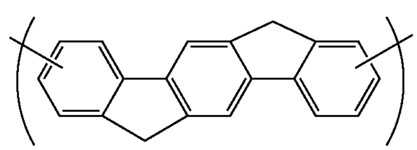
47'
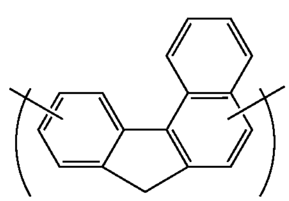

[16] The composition according to any one of [1] to [15], wherein $M^3$ is an alkali metal cation or an alkaline earth metal cation.
[17] The composition according to any one of [1] to [16], wherein the proportion of the ionic compound represented by Formula (23) comprised in the composition is 0.1 to 100% by weight to the weight of a polymer compound comprised in the composition.
[18] An organic film comprising the composition according to any one of [1] to [17].
[19] An electric device comprising:

a first electrode;

a second electrode;

a light emitting layer or a charge separation layer placed between the first electrode and the second electrode; and a layer comprising the compound according to any one of [1] to [17] placed between the first electrode and any one of the light emitting layer or the charge separation layer.

[20] The electric device according to claim 19, wherein the first electrode is a cathode.

Effect of the Invention

The use of a layer including the composition of the present invention as a charge injection layer and/or a charge transport layer can improve light emission brightness of the electroluminescent device. In a preferred embodiment, the electroluminescent device also has excellent light emitting efficiency.

EMBODIMENTS FOR CARRYING OUT THE INVENTION

Hereinafter, the present invention will be described in detail. A composition of the present invention, an organic film including the composition of the present invention, an electronic device including the composition of the present invention, an electroluminescent device including the composition of the present invention, and a photovoltaic cell including the composition of the present invention will be described in this order.

<Composition>

Hereinafter, in the composition of the present invention, a polymer compound, an ionic compounds, and characteristics as the composition will be described in this order.

[1. Polymer Compound]

The polymer compound includes one or more structural units selected from the group consisting of a structural unit represented by Formula (1), a structural unit represented by Formula (3), a structural unit represented by Formula (5), a structural unit represented by Formula (16), a structural unit represented by Formula (18), a structural unit represented by Formula (20), and a structural unit represented by Formula (22). The polymer compound has one or more of the structural units as at least a part of whole structural units that constitute the polymer compound. When a plurality of structural units represented by Formula (1) are present in the polymer compound, each of the structural units may be the same as or different from each other. When a plurality of structural units represented by Formula (3) are present in the polymer compound, each of the structural units may be the same as or different from each other. When a plurality of structural units represented by Formula (5) are present in the polymer compound, each of the structural units may be the same as or different from each other. When a plurality of structural units represented by Formula (16) are present in the polymer compound, each of the structural units may be the same as or different from each other. When a plurality of structural units represented by Formula (18) are present in the polymer compound, each of the structural units may be the same as or different from each other. When a plurality of structural units represented by Formula (20) are present in the polymer compound, each of the structural units may be the same as or different from each other. When a plurality of structural units represented by Formula (22) are present in the polymer compound, each of the structural units may be the same as or different from each other.

Hereinafter, the polymer compound included in the composition of the present invention will be described from the viewpoints of construction of each structural unit constituting the polymer compound, a ratio of the structural units that are included in the polymer compound, structural units at the terminals of the polymer compound, characteristics of the polymer compound, examples of the polymer compound, and a method for producing the polymer compound in this order.

[1.1. Structural Unit Represented by Formula (1)]

In Formula (1), $R^1$ is a monovalent group including a group represented by Formula (2). $Ar^1$ is a (2+n1)-valent aromatic group that optionally has a substituent other than $R^1$. n1 is an integer of 1 or more.

Hereinafter, $R^1$, Formula (2), $Ar^1$, and n1 will be described in this order.

[1.1.1. Description of $R^1$]

$R^1$ is the monovalent group including the group represented by Formula (2). When a plurality of $R^1$ are present in Formula (1), each $R^1$ may be the same as or different from each other.

$R^1$ may also be a monovalent group consisting of the group represented by Formula (2). In other words, the group represented by Formula (2) may be directly bonded to $Ar^1$.

$R^1$ may be a group partially including the group represented by Formula (2). In other words, the group represented by Formula (2) may be bonded to $Ar^1$ through, for example, the group or the atom described below:

an alkylene group having 1 to 50 carbon atom(s) that optionally has a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent;

an alkyleneoxy group having 1 to 50 carbon atom(s) that optionally has a substituent such as a methyleneoxy group, an ethyleneoxy group, a propyleneoxy group, a butyleneoxy group, a pentyleneoxy group, a hexyleneoxy group, a nonyleneoxy group, a dodecyleneoxy group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group among these groups in which at least one hydrogen atom is substituted with a substituent (in other words, a divalent organic group represented by the formula: $—R^f—O—$ wherein $R^f$ is an alkylene group having 1 to 50 carbon atom(s) that optionally has a substituent and examples of the alkylene group having 1 to 50 carbon atom(s) that optionally has a substituent include a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent);

an imino group that optionally has a substituent;

a silylene group that optionally has a substituent;

an ethenylene group that optionally has a substituent;

an ethynylene group; and a hetero atom such as an oxygen atom, a nitrogen atom, and a sulfur atom.

For example, $R^1$ is a group represented by Formula (2) or a group represented by the formula: —$B^1$-$(A^1)_{n*1}$ wherein: $A^1$ is a group represented by Formula (2); $B^1$ is the alkylene group having 1 to 50 carbon atom(s), the alkyleneoxy group having 1 to 50 carbon atom(s), an imino group optionally having a substituent, a silylene group optionally having a substituent, an ethenylene group optionally having a substituent, an ethynylene group, or a hetero atom; n*1 is an integer of 1 or more; and when a plurality of $A^1$ are present, each $A^1$ may be the same as or different from each other.

Examples of the substituent that the alkylene group having 1 to 50 carbon atom(s), the alkyleneoxy group having 1 to 50 carbon atom(s), the imino group, the silylene group, and the ethenylene group, which may be included in $R^1$, optionally have include an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amido group, an acid imido group, a monovalent heterocyclic group, a hydroxyl group, a carboxyl group, a substituted carboxyl group, a cyano group, and a nitro group. When the alkylene group having 1 to 50 carbon atom(s), the alkyleneoxy group having 1 to 50 carbon atom(s), the imino group, the silylene group or the ethenylene group has a plurality of substituents, each substituent may be the same as or different from each other. Among them, a substituent other than the amino group, the silyl group, the halogen atom, the hydroxyl group, or the nitro group includes a carbon atom.

Hereinafter, the substituent will be described.

In this specification, the term "$C_m$-$C_n$", in which m and n are positive integers that satisfy m<n, represents that the number of carbon atom(s) in an organic group described just after this term is m to n. For example, a $C_m$-$C_n$ alkyl group represents that the number of carbon atom(s) in the alkyl group is m to n; a $C_m$-$C_n$ alkylaryl group represents that the number of carbon atom(s) in the alkyl group included in the alkylaryl group is m to n; and an aryl-$C_m$-$C_n$ alkyl group represents that the number of carbon atom(s) in the alkyl group included in the arylalkyl is m to n.

In this specification, "optionally has a substituent" includes both of the case that hydrogen atoms constituting the compound or the group described just after this term are not substituted and the case that a part of or all of the hydrogen atoms constituting the compound or the group described just after this term are substituted by the substituent(s).

The alkyl group may be liner or branched and may be a cycloalkyl group. The number of carbon atom(s) in the alkyl group is usually 1 to 20 and preferably 1 to 10. Examples of the alkyl group include a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, and a lauryl group. Hydrogen atoms in the alkyl group are optionally substituted with fluorine atoms. Examples of this alkyl group (a fluorine atom-substituted alkyl group) include a trifluoromethyl group, a pentafluoroethyl group, a perfluorobutyl group, a perfluorohexyl group, and a perfluorooctyl group. Examples of the $C_1$-$C_{12}$ alkyl group include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group, and a lauryl group.

The alkoxy group may be liner or branched, may be a cycloalkyloxy group, and optionally has a substituent. The number of carbon atom(s) in the alkoxy group is usually 1 to 20 and preferably 1 to 10. Examples of the alkoxy group include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a nonyloxy group, a decyloxy group, and a lauryloxy group. Hydrogen atoms in the alkoxy group are optionally substituted with fluorine atoms. Examples of the alkoxy groups (a fluorine atom-substituted alkoxy group) include a trifluoromethoxy group, a pentafluoroethoxy group, a perfluorobutoxy group, a perfluorohexyloxy group, and a perfluorooctyloxy group. Examples of the alkoxy group may also include a methoxymethyloxy group and a 2-methoxyethyloxy group. Examples of the $C_1$-$C_{12}$ alkoxy group include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a lauryloxy group.

The alkylthio group may be liner or branched, may be a cycloalkylthio group, and optionally has a substituent. The number of carbon atom(s) in the alkylthio group is usually 1 to 20 and preferably 1 to 10. Examples of the alkylthio group include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a nonylthio group, a decylthio group and a laurylthio group. Hydrogen atoms in the alkylthio group are optionally substituted with fluorine atoms. Examples of the alkylthio group (a fluorine atom-substituted alkylthio group) include a trifluoromethylthio group.

The aryl group is a remaining atomic group formed by removing one hydrogen atom bonded to a carbon atom constituting an aromatic ring from an aromatic hydrocarbon. Examples of the aryl group may also include a group having a benzene ring, a group having a condensed ring, a group in which two or more independent benzene rings and/or condensed rings are bonded through a single bond, and a group in which two or more independent benzene rings and/or condensed rings are bonded through a divalent organic group (for example, an alkenylene group such as vinylene group). The number of carbon atoms in the aryl group is usually 6 to 60 and preferably 6 to 48. Examples of the aryl group include a phenyl group, a $C_1$-$C_{12}$ alkoxyphenyl group, a $C_1$-$C_{12}$ alkylphenyl group, a 1-naphthyl group, a 2-naphthyl group, a 1-anthracenyl group, a 2-anthracenyl group, and a 9-anthracenyl group. Hydrogen atoms in the aryl group are optionally substituted with fluorine atoms. Examples of the aryl group (a fluorine atom-substituted aryl group) include a pentafluorophenyl group. Among the aryl groups, the phenyl group, the $C_1$-$C_{12}$ alkoxyphenyl group, and a $C_1$-$C_{12}$ alkylphenyl group are preferable.

Examples of the $C_1$-$C_{12}$ alkoxyphenyl group include a methoxyphenyl group, an ethoxyphenyl group, a propyloxyphenyl group, an isopropyloxyphenyl group, a butoxyphenyl group, an isobutoxyphenyl group, a sec-butoxyphenyl group, a tert-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, and a lauryloxyphenyl group.

Examples of $C_1$-$C_{12}$ alkylphenyl group include a methylphenyl group, an ethylphenyl group, a dimethylphenyl group, a propylphenyl group, a mesityl group, a methylethylphenyl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group, and a dodecylphenyl group.

The number of carbon atoms in the aryloxy group is usually 6 to 60 and preferably 6 to 48. Examples of the aryloxy group include a phenoxy group, a $C_1$-$C_{12}$ alkoxyphenoxy group, a $C_1$-$C_{12}$ alkylphenoxy group, a 1-naphthyloxy group, a 2-naphthyloxy group and a pentafluorophenyloxy group. Among the aryloxy groups, the phenoxy group, the $C_1$-$C_{12}$ alkoxyphenoxy group, and the $C_1$-$C_{12}$ alkylphenoxy group are preferable.

Examples the $C_1$-$C_{12}$ alkoxyphenoxy group include a methoxyphenoxy group, an ethoxyphenoxy group, a propyloxyphenoxy group, an isopropyloxyphenoxy group, a butoxyphenoxy group, an iso-butoxyphenoxy group, a sec-butoxyphenoxy group, a tert-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group, and a lauryl oxyphenoxy group.

The arylthio group is, for example, a group in which the aryl group is bonded to a sulfur atom. The arylthio group optionally has a substituent on the aromatic ring of the aryl group. The number of carbon atoms in the arylthio group is usually 6 to 60 and preferably 6 to 30. Examples of the arylthio group include a phenylthio group, a $C_1$-$C_{12}$ alkoxyphenylthio group, a $C_1$-$C_{12}$ alkylphenylthio group, a 1-naphthylthio group, a 2-naphthylthio group, and a pentafluorophenylthio group.

The arylalkyl group is, for example, a group in which the aryl group is bonded to the alkyl group. The arylalkyl group optionally has a substituent. The number of carbon atoms in the arylalkyl group is usually 7 to 60 and preferably 7 to 30. Examples of the arylalkyl group include a phenyl-$C_1$-$C_{12}$ alkyl group, a $C_1$-$C_{12}$ alkoxyphenyl-$C_1$-$C_{12}$ alkyl group, a $C_1$-$C_{12}$ alkylphenyl-$C_1$-$C_{12}$ alkyl group, a 1-naphthyl-$C_1$-$C_{12}$ alkyl group, and a 2-naphthyl-$C_1$-$C_{12}$ alkyl group.

The arylalkoxy group is, for example, a group in which the aryl group is bonded to the alkoxy group. The arylalkoxy group optionally has a substituent. The number of carbon atoms in the arylalkoxy group is usually 7 to 60 and preferably 7 to 30. Examples of the arylalkoxy group include a phenyl-$C_1$-$C_{12}$ alkoxy group, a $C_1$-$C_{12}$ alkoxyphenyl-$C_1$-$C_{12}$ alkoxy group, a $C_1$-$C_{12}$ alkylphenyl-$C_1$-$C_{12}$ alkoxy group, a 1-naphthyl-$C_1$-$C_{12}$ alkoxy group, and a 2-naphthyl-$C_1$-$C_{12}$ alkoxy group.

The arylalkylthio group is, for example, a group in which the aryl group is bonded to the alkylthio group. The arylalkylthio group optionally has a substituent. The number of carbon atoms in the arylalkylthio group is usually 7 to 60 and preferably 7 to 30. Examples of the arylalkylthio group include a phenyl-$C_1$-$C_{12}$ alkylthio group, a $C_1$-$C_{12}$ alkoxyphenyl-$C_1$-$C_{12}$ alkylthio group, a $C_1$-$C_{12}$ alkylphenyl-$C_1$-$C_{12}$ alkylthio group, a 1-naphthyl-$C_1$-$C_{12}$ alkylthio group, and a 2-naphthyl-$C_1$-$C_{12}$ alkylthio group.

The arylalkenyl group is, for example, a group in which the aryl group is bonded to an alkenyl group. The number of carbon atoms in the arylalkenyl group is usually 8 to 60 and preferably 8 to 30. Examples of the arylalkenyl group include a phenyl-$C_2$-$C_{12}$ alkenyl group, a $C_1$-$C_{12}$ alkoxyphenyl-$C_2$-$C_{12}$ alkenyl group, a $C_1$-$C_{12}$ alkylphenyl-$C_2$-$C_{12}$ alkenyl group, a 1-naphthyl-$C_2$-$C_{12}$ alkenyl group, and a 2-naphthyl-$C_2$-$C_{12}$ alkenyl group. The $C_1$-$C_{12}$ alkoxyphenyl-$C_2$-$C_{12}$ alkenyl group and the $C_2$-$C_{12}$ alkylphenyl-$C_2$-$C_{12}$ alkenyl group are preferable. Examples of the $C_2$-$C_{12}$ alkenyl group include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group, and a 1-octenyl group.

The arylalkynyl group is, for example, a group in which the aryl group is bonded to an alkynyl group. The number of carbon atoms in the arylalkynyl group is usually 8 to 60 and preferably 8 to 30. Examples of the arylalkynyl group include a phenyl-$C_2$-$C_{12}$ alkynyl group, a $C_1$-$C_{12}$ alkoxyphenyl-$C_2$-$C_{12}$ alkynyl group, a $C_1$-$C_{12}$ alkylphenyl-$C_2$-$C_{12}$ alkynyl group, a 1-naphthyl-$C_2$-$C_{12}$ alkynyl group, and a 2-naphthyl-$C_2$-$C_{12}$ alkynyl group. The $C_1$-$C_{12}$ alkoxyphenyl-$C_2$-$C_{12}$ alkynyl group and the $C_1$-$C_{12}$ alkylphenyl-$C_2$-$C_{12}$ alkynyl group are preferable. Examples of the $C_2$-$C_{12}$ alkynyl group include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group, and a 1-octynyl group.

As the substituted amino group, an amino group in which at least one hydrogen atom in the amino group is substituted with one or two groups selected from the group consisting of an alkyl group, an aryl group, an arylalkyl group, and a monovalent heterocyclic group is preferable. The alkyl group, the aryl group, the arylalkyl group, and the monovalent heterocyclic group optionally have a substituent. The number of carbon atom(s) in the substituted amino group is usually 1 to 60 and preferably 2 to 48, not including the number of carbon atom(s) in the substituent that the alkyl group, the aryl group, the arylalkyl group, and the monovalent heterocyclic group optionally have. Examples of the substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, a ($C_1$-$C_{12}$ alkoxyphenyl)amino group, a di($C_1$-$C_{12}$ alkoxyphenyl)amino group, a di($C_1$-$C_{12}$ alkylphenyl)amino group, a 1-naphthylamino group, a 2-naphthylamino group, a pentafluorophenylamino group, a pyridylamino group, a pyridazinylamino, a pyrimidylamino, a pyrazinylamino group, triazinylamino group, a (phenyl-$C_1$-$C_{12}$ alkyl)amino group, a ($C_1$-$C_{12}$ alkoxyphenyl-$C_1$-$C_{12}$ alkyl)amino group, a ($C_1$-$C_{12}$ alkylphenyl-$C_1$-$C_{12}$ alkyl)amino group, a di($C_1$-$C_{12}$ alkoxyphenyl-$C_1$-$C_{12}$ alkyl)amino group, a di($C_1$-$C_{12}$ alkylphenyl-$C_1$-$C_{12}$ alkyl)amino group, a 1-naphthyl-$C_1$-$C_{12}$ alkylamino group, and 2-naphthyl-$C_1$-$C_{12}$ alkylamino group.

Examples of the substituted silyl group include a silyl group in which at least one hydrogen atom in the silyl group is substituted with one to three group(s) selected from the group consisting of an alkyl group, an aryl group, an arylalkyl group, and a monovalent heterocyclic group. The alkyl group, the aryl group, the arylalkyl group, and the monovalent heterocyclic group optionally have a substituent. The number of carbon atom(s) in the substituted silyl group is usually 1 to 60 and preferably 3 to 48, not including the number of carbon atom(s) in the substituent that the alkyl group, the aryl group, the arylalkyl group, and the monovalent heterocyclic group optionally have. Examples of the substituted silyl group include a trimethylsilyl group, a triethylsilyl group, a tripropylsilyl group, a triisopropylsilyl group, an isopropyldimethylsilyl group, an isopropyldiethylsilyl group, a tert-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, a (phenyl-$C_1$-$C_{12}$ alkyl) silyl group, a ($C_1$-$C_{12}$ alkoxyphenyl-$C_1$-$C_{12}$ alkyl) silyl group, a ($C_1$-$C_{12}$ alkylphenyl-$C_1$-$C_{12}$ alkyl)silyl group, a (1-naphthyl-$C_1$-$C_{12}$ alkyl)silyl group, a (2-naphthyl-$C_1$-$C_{12}$ alkyl)silyl group, a (phenyl-$C_1$-$C_{12}$ alkyl)dimethylsilyl group, a triphenylsilyl group, a tri(p-xylyl)silyl group, a tribenzylsilyl group, a diphenylmethylsilyl group, a tert-butyldiphenylsilyl group, and a dimethylphenylsilyl group.

Examples of the halogen atom include a fluorine atom, a chlorine atom, a bromine atom, and an iodine atom.

The number of carbon atoms in the acyl group is usually 2 to 20 and preferably 2 to 18. Examples of the acyl group include an acetyl group, a propionyl group, a butyryl group, an isobutyryl group, a pivaloyl group, a benzoyl group, a trifluoroacetyl group, and a pentafluorobenzoyl group.

The number of carbon atoms in the acyloxy group is usually 2 to 20 and preferably 2 to 18. Examples of the acyloxy groups include an acetoxy group, a propionyloxy group, a butyryloxy group, an isobutyryloxy group, a pivaloyloxy group, a benzoyloxy group, a trifluoroacetyloxy group, and a pentafluorobenzoyloxy group.

The imine residue means a group in which, from imine compound having a structure represented by at least one of the formula: H—N═C< or the formula: —N═CH—, a hydrogen atom in this structure is removed. Examples of the imine compound include a compound in which a hydrogen atom bonded to an aldimine, a ketimine, and a nitrogen atom in the aldimine is substituted with a substituent such as an alkyl group, an aryl group, an arylalkyl group, an arylalkenyl group, or an arylalkynyl group. The number of carbon atoms in the imine residue is usually 2 to 20 and preferably 2 to 18. Examples of the imine residue include a group represented by the general formula: $—CR^{\beta}═N—R^{\gamma}$, and a group represent by the general formula: $—N═C(R^{\gamma})_2$ wherein $R^{\beta}$ is a hydrogen atom, an alkyl group, an aryl group, an arylalkyl group, an arylalkenyl group, or an arylalkynyl group. $R^{\gamma}$ is independently an alkyl group, an aryl group, an arylalkyl group, an arylalkenyl group, or an arylalkynyl group. Here, when two $R^{\gamma}$ are present, the two $R^{\gamma}$ may form a ring as a divalent group formed by bonding each other in an integrated manner. Examples of the divalent group include an alkylene group having 2 to 18 carbon atoms such as an ethylene group, a trimethylene group, a tetramethylene group, a pentamethylene group, and a hexamethylene group). Examples of the imine residue include a group represented by the following formulas.

[Chemical Formula 25]

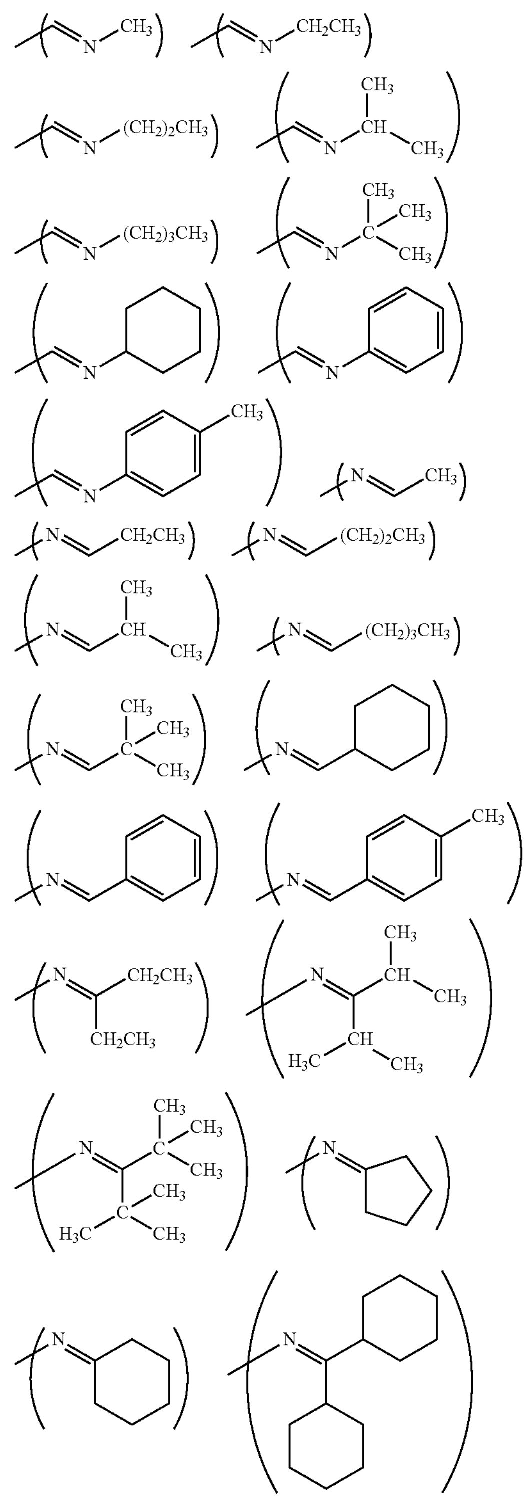

-continued

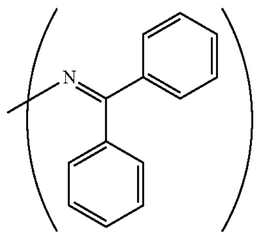

The number of carbon atom(s) in the amido group is usually 1 to 20 and preferably 2 to 18. Examples of the amido group include a formamide group, an acetamide group, a propioamide group, a butyroamide group, a benzamide group, a trifluoroacetamide group, a pentafluorobenzamide group, a diformamide groups, a diacetamide group, a dipropioamide group, a dibutyroamide group, a dibenzamide group, a ditrifluoroacetamide group, and a dipentafluorobenzamide group.

The acid imido group is a group that is formed by removing a hydrogen atom bonded to a nitrogen atom in the acid imido from the acid imido. The number of carbon atoms in the acid imido group is usually 4 to 20 and preferably 4 to 18.

Examples of the acid imido group include a group represented by the following formulas.

[Chemical Formula 26]

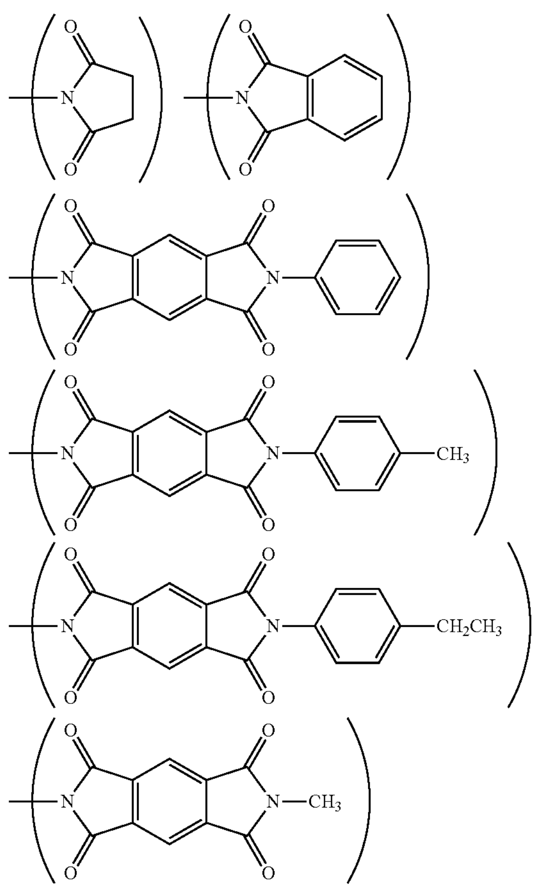

-continued

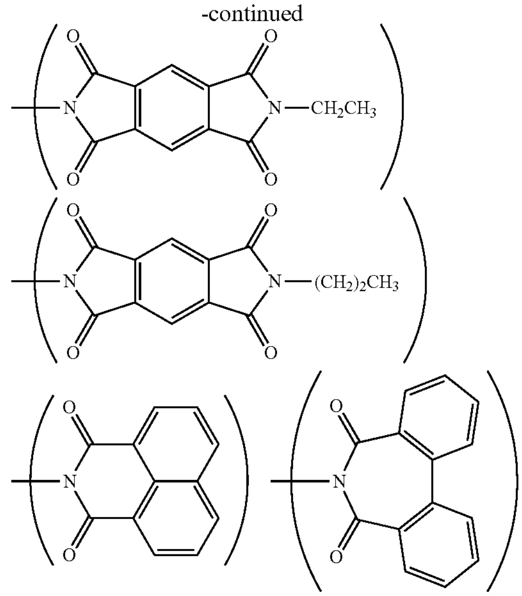

The monovalent heterocyclic group means a remaining atomic group formed by removing one hydrogen atom from a heterocyclic compound. Here, the heterocyclic compound means, among organic compounds having a ring structure, an organic compound including a hetero atom such as an oxygen atom, a sulfur atom, a nitrogen atom, a phosphorus atom, a boron atom, a silicon atom, a selenium atom, a tellurium atom, and an arsenic atom in addition to carbon atoms as elements constituting the ring. The monovalent heterocyclic group optionally has a substituent. The number of carbon atoms in the monovalent heterocyclic group is usually 3 to 60 and preferably 3 to 20. The number of carbon atoms in the substituent is not included in the number of the monovalent heterocyclic group. Examples of the monovalent heterocyclic group described above include a thienyl group, a $C_1$-$C_{12}$ alkylthienyl group, a pyrrolyl group, a furyl group, a pyridyl group, a $C_1$-$C_{12}$ alkylpyridyl group, a pyridazinyl group, a pyrimidyl group, a pyrazinyl group, a triazinyl group, a pyrrolidyl group, a piperidyl group, a quinolyl group, and an isoquinolyl group. Among them, the thienyl group, the $C_1$-$C_{12}$ alkylthienyl group, the pyridyl group, a $C_1$-$C_{12}$ alkylpyridyl group, and the triazinyl group are preferable. As the monovalent heterocyclic group, a monovalent aromatic heterocyclic group is preferable. The monovalent aromatic heterocyclic group means that a remaining atomic group formed by removing one hydrogen atom from a heterocyclic compound in which the heterocyclic ring itself exhibits aromaticity and a remaining atomic group formed by removing one hydrogen atom from a compound in which an aromatic ring is condensed to a heterocyclic ring that includes the hetero atom but does not exhibits aromaticity such as example, phenoxazine, phenothiazine, dibenzoborole, dibenzosilole, and benzopyran.

The substituted carboxyl group is a carboxyl group in which a hydrogen atom (hydrogen atoms) in the carboxyl group is substituted with one or more groups selected from the group consisting of an alkyl group, an aryl group, an arylalkyl group, and a monovalent heterocyclic group. In other words, the substituted carboxyl group is a group represented by the formula: —C(=O)OR* wherein R* is an alkyl group, an aryl group, an arylalkyl group, or a monovalent heterocyclic group. The number of carbon atoms in the substituted carboxyl group is usually 2 to 60 and preferably 2 to 48. The alkyl group, the aryl group, the arylalkyl group, and the monovalent heterocyclic group optionally have a substituent. The number of carbon atoms in the substituents that the alkyl group, the aryl group, the arylalkyl group, and the monovalent heterocyclic group have is not included in the number of carbon atoms in the substituted carboxyl group. Examples of the substituted carboxyl group include a methoxycarbonyl group, an ethoxycarbonyl group, a propyloxycarbonyl group, an isopropyloxycarbonyl group, a butoxycarbonyl group, an isobutoxycarbonyl group, a sec-butoxycarbonyl group, a tert-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group, and a pyridyloxycarbonyl group.

[1.1.2. Description of Group Represented by Formula (2)]

In Formula (2), $R^2$ is a single bond or a (1+m1)-valent organic group. $Q^1$ is a divalent organic group. $Y^1$ is $—CO_2^-$, $—SO_3^-$, $—SO_2^-$, $—PO_3^{2-}$ or $—B(R^\alpha)_3^-$. $M^1$ is a metallic cation or an ammonium cation that optionally has a substituent. n2 is an integer of 0 or more. a1 is an integer of 1 or more and is selected so that the charge of the group represented by Formula (2) is zero. $R^\alpha$ is an alkyl group having 1 to 30 carbon atom(s) that optionally has a substituent or an aryl group having 6 to 50 carbon atoms that optionally has a substituent. Each $R^\alpha$ may be the same as or different from each other. m1 is an integer of 1 or more, and when $R^2$ is a single bond, m1 is 1. When a plurality of $Q^1$ are present, each $Q^1$ may be the same as or different from each other. When a plurality of $Y^1$ are present, each $Y^1$ may be the same as or different from each other. When a plurality of $M^1$ are present, each $M^1$ may be the same as or different from each other. When a plurality of n2 are present, each n2 may be the same as or different from each other. When a plurality of a1 are present, each a1 may be the same as or different from each other.

Examples of the (1+m1)-valent organic group include the following groups:

a group formed by removing m1 hydrogen atom(s) from an alkyl group having 1 to 20 carbon atom(s) that optionally has a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group among these groups in which at least one hydrogen atom is substituted with a substituent;

a group formed by removing m1 hydrogen atom(s) from an aryl group having 6 to 30 carbon atoms that optionally has a substituent such as a phenyl group, a 1-naphthyl group, a 2-naphthyl group, a 1-anthracenyl group, a 2-anthracenyl group, a 9-anthracenyl group, a group among these groups in which at least one hydrogen atom is substituted with a substituent.

a group formed by removing m1 hydrogen atom(s) from an alkoxy group having 1 to 50 carbon atom(s) that optionally has a substituent such as a methoxy group, an ethoxy group, a propyloxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group among these groups in which at least one hydrogen atom is substituted with a substituent;

a group in which m1 hydrogen atom(s) is(are) removed from an amino group having a substituent including a carbon atom; and a group in which m1 hydrogen atom(s) is(are) removed from a silyl group having a substituent including a carbon atom.

In terms of easy synthesis of raw material monomers, the (1+m1)-valent organic group represented by $R^2$ is preferably the group in which the m1 hydrogen atom(s) is(are) removed from the alkyl group having 1 to 20 carbon atom(s) that optionally has a substituent, the group in which the m1 hydrogen atom(s) is(are) removed from the aryl group having 6 to 30 carbon atoms that optionally has a substituent, or the group in which the m1 hydrogen atom(s) is(are) removed from the alkoxy group having 1 to 50 carbon atom(s) that optionally has a substituent.

Examples of the substituent that the (1+m1)-valent organic group represented by $R^2$ optionally has include a substituent similar to the substituent shown as examples in the description of $R^1$ described above. When the (1+m1)-valent organic group represented by $R^2$ has a plurality of substituents, each substituent may be the same as or different from each other.

In Formula (2), m1 is an integer of 1 or more, and when $R^2$ is a single bond, m1 is 1.

In Formula (2), $Q^1$ is a divalent organic group. Examples of the divalent organic group include the following groups:

a divalent chain saturated hydrocarbon group having 1 to 50 carbon atom(s) that optionally has a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group, and a group among these groups in which at least one hydrogen atom is substituted with a substituent;

a divalent chain unsaturated hydrocarbon group having 2 to 50 carbon atoms that optionally has a substituent including: an alkenylene group having 2 to 50 carbon atoms that optionally has a substituent such as an ethenylene group, a propenylene group, a 3-butenylene group, a 2-butenylene group, a 2-pentenylene group, a 2-hexenylene group, a 2-nonenylene group, a 2-dodecenylene group, and a group among these groups in which at least one hydrogen atom is substituted with a substituent; and/or an ethynylene group;

a divalent cyclic saturated hydrocarbon group having 3 to 50 carbon atoms that optionally has a substituent such as a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent;

an arylene group having 6 to 50 carbon atoms that optionally has a substituent such as a 1,3-phenylene group, a 1,4-phenylene group, a 1,4-naphthylene group, a 1,5-naphthylene group, a 2,6-naphthylene group, a biphenyl-4,4'-diyl group, and a group among these groups in which at least one hydrogen atom is substituted with a substituent;

an alkyleneoxy group having 1 to 50 carbon atom(s) that optionally has a substituent such as a methyleneoxy group, an ethyleneoxy group, a propyleneoxy group, a butyleneoxy group, a pentyleneoxy group, a hexyleneoxy group, and a group among these groups in which at least one hydrogen atom is substituted with a substituent, and an aryleneoxy group having 6 to 50 carbon atoms that optionally has a substituent such as a 1,3-phenyleneoxy group, a 1,4-phenyleneoxy group, a 1,4-naphthyleneoxy group, a 1,5-naphthyleneoxy group, a 2,6-naphthyleneoxy group, and a group among these groups in which at least one hydrogen atom is substituted with a substituent (that is, a divalent organic group represented by the formula: —$R^d$—O— wherein $R^d$ is an alkylene group having 1 to 50 carbon atom(s) that optionally has a substituent or an arylene group having 1 to 50 carbon atom(s) that optionally has a substituent and examples of the alkylene group having 1 to 50 carbon atom(s) that optionally has a substituent include a methylene group, an ethylene group, a propylene group, a butylene group, a pentylene group, a hexylene group, and a group among these groups in which at least one hydrogen atom is substituted with a substituent, and examples of the arylene group having 1 to 50 carbon atom(s) that optionally has a substituent include a 1,3-phenylene group, a 1,4-phenylene group, a 1,4-naphthylene group, a 1,5-naphthylene group, a 2,6-naphthylene group, and a group among these groups in which at least one hydrogen atom is substituted with a substituent);

an imino group having a substituent including a carbon atom; and a silylene group having a substituent including a carbon atom.

In terms of easy synthesis of a monomer being a raw material of the polymer compound (hereinafter referred to as a "raw material monomer"), the divalent organic group represented by $Q^1$ is preferably a divalent chain saturated hydrocarbon group, an arylene group, and an alkyleneoxy group.

Examples of a substituent that is optionally included in the divalent chain saturated hydrocarbon group having 1 to 50 carbon atom(s), the divalent chain unsaturated hydrocarbon group having 2 to 50 carbon atoms, the divalent cyclic saturated hydrocarbon group having 3 to 50 carbon atoms, the arylene group having 6 to 50 carbon atoms, the alkyleneoxy group having 1 to 50 carbon atom(s), the imino group, and the silylene group, as the divalent organic group represented by $Q^1$, include a substituent similar to the substituent shown as examples in the description of $R^2$ described above. When the divalent chain saturated hydrocarbon group having 1 to 50 carbon atom(s), the divalent chain unsaturated hydrocarbon group having 2 to 50 carbon atoms, the divalent cyclic saturated hydrocarbon group having 3 to 50 carbon atoms, the divalent aromatic group having 6 to 50 carbon atoms, the alkyleneoxy group having 1 to 50 carbon atom(s), the imino group, or the silylene group has a plurality of substituents, each substituent may be the same as or different from each other.

In Formula (2), $Y^2$ is —$CO_2^-$, —$SO_3^-$, —$SO_2^-$, —$PO_3^{2-}$ or —$B(R^\alpha)_3^-$. In terms of acidity of the polymer compound, $Y^1$ is preferably —$CO_2^-$, —$SO_2^-$, or —$PO_3^{2-}$, and more preferably —$CO_2^-$. In terms of stability of the polymer compound, $Y^1$ is preferably —$CO_2^-$, —$SO_3^-$, —$SO_2^-$, or —$PO_3^{2-}$.

$R^\alpha$ is an alkyl group having 1 to 30 carbon atom(s) that optionally has a substituent or an aryl group having 6 to 50 carbon atoms that optionally has a substituent. Examples of a substituent that optionally the alkyl group having 1 to 30 carbon atom(s) or the aryl group having 6 to 50 carbon atoms has include a substituent similar to the substituent shown as examples in the description of $R^1$ described above. When the alkyl group having 1 to 30 carbon atom(s) or the aryl group having 6 to 50 carbon atoms has a plurality of substituents, each substituent may be the same as or different from each other. Examples of $R^\alpha$ include an alkyl group having 1 to 20 carbon atom(s) that optionally has a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group among these groups in which at least one hydrogen atom is substituted with a substituent, and an aryl group having 6 to 30 carbon atoms that optionally has a substituent such as a phenyl group, a 1-naphthyl group, a 2-naphthyl group, a 1-anthracenyl group, a 2-anthracenyl group, a 9-anthracenyl group, and a group among these groups in which at least one hydrogen atom is substituted with a substituent. Each $R^\alpha$ in —$B(R^\alpha)_3^-$ may be the same as or different from each other.

In Formula (2), $M^1$ is a metallic cation or an ammonium cation that optionally has a substituent. Examples of the metallic cation include a monovalent or divalent metallic cation. Examples of the monovalent or divalent metallic cation include a cation of Li, a cation of Na, a cation of K, a cation of Rb, a cation of Cs, a cation of Be, a cation of Mg, a cation of Ca, a cation of Ba, a cation of Ag, a cation of Al, a cation of Bi, a cation of Cu, a cation of Fe, a cation of Ga, a cation of Mn, a cation of Pb, a cation of Sn, a cation of Ti, a cation of V, a cation of W, a cation of Y, a cation of Yb, a cation of Zn and a cation of Zr, and $Li^+$, $Na^+$, $K^+$, $Cs^+$, $Ag^+$, $Mg^{2+}$, and $Ca^{2+}$ are preferable. Examples of the substituent that the ammonium cation optionally has include an alkyl group having 1 to 10 carbon atom(s) such as a methyl group, an ethyl group, a propyl group, an isopropyl group, an n-butyl group, an isobutyl group, and a tert-butyl group, and an aryl group having 6 to 60 carbon atoms such as a phenyl group, a 1-naphthyl group, and a 2-naphthyl group.

In Formula (2), n2 is an integer of 0 or more. In terms of synthesis of the raw material monomers, n2 is preferably an integer from 0 to 8 and more preferably an integer from 0 to 2.

In Formula (2), a1 is an integer of 1 or more.

a1 is selected so that a charge of a group represented by Formula (2) is 0. For example, when $Y^1$ is —$CO_2^-$, —$SO_3^-$, —$SO_2^-$, or —$B(R^\alpha)_3^-$, and $M^1$ is a monovalent metallic cation or a ammonium cation that optionally has a substituent, a1 is equal to 1; when $Y^1$ is —$PO_3^{2-}$ and $M^1$ is a monovalent metallic cation, a1 is equal to 2; and when $Y^1$ is —$PO_3^{2-}$ and $M^1$ is a divalent metallic cation, a1 is equal to 1.

In Formula (2), when a plurality of $Q^1$ are present, each $Q^1$ may be the same as or different from each other. In Formula (2), when a plurality of $Y^1$ are present, each $Y^1$ may be the same as or different from each other. In Formula (2), when a plurality of $M^1$ are present, each $M^1$ may be the same as or different from each other. In Formula (2), when a plurality of n2 are present, each n2 may be the same as or different from each other. In Formula (2), when a plurality of a1 are present, each a1 may be the same as or different from each other.

[1.1.3. Examples of Group Represented by Formula (2)]

Examples of the group represented by Formula (2) include groups represented by the following formulas. In the following formulas, M is Li, Na, K, Rb, Cs, or $N(CH_3)_4$.

[Chemical Formula 27]

$$—(COO^-M^+) \quad —(CH_2—COO^-M^+) \quad —((CH_2)_2—COO^-M^+)$$

-continued

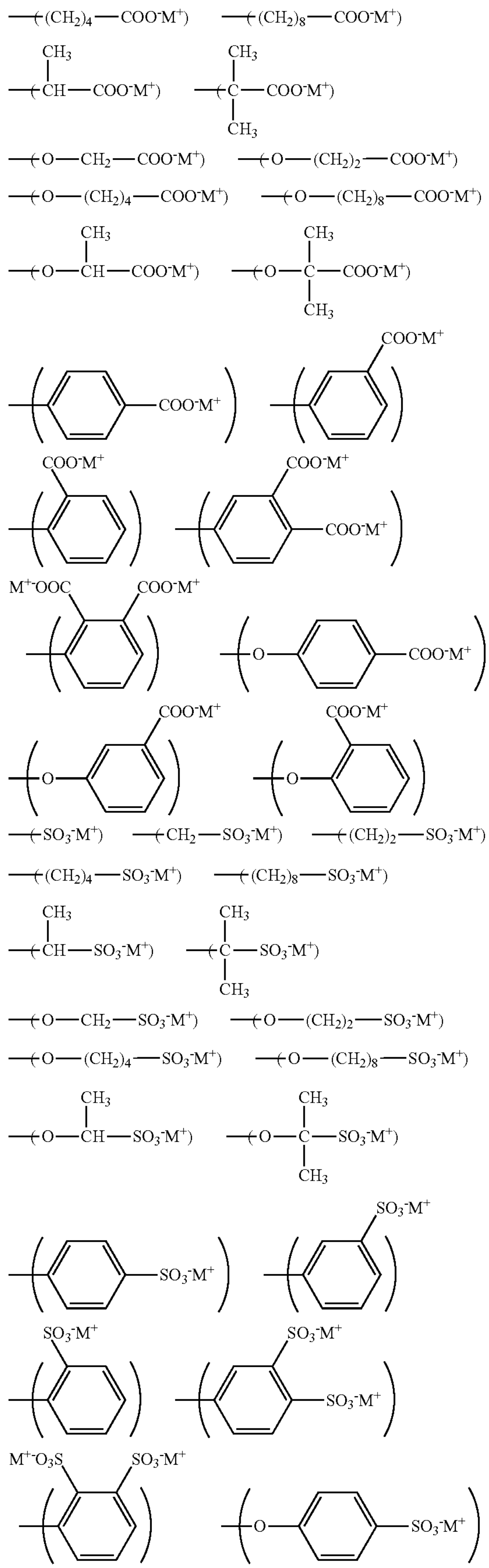

-continued

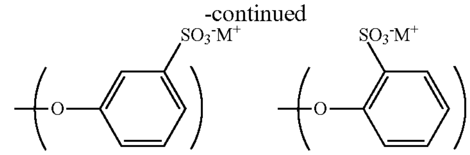

[1.1.4. Description of $Ar^1$ and n1]

The $Ar^1$ is a (2+n1)-valent aromatic group that optionally has a substituent other than $R^1$.

$Ar^1$ optionally has a substituent other than $R^1$. Examples of the substituent include a substituent similar to the substituent shown as examples in the description of $R^1$ described above. When $Ar^1$ has a plurality of substituents, each substituent may be the same as or different from each other.

In terms of easy synthesis of raw material monomers, the substituent other than $R^1$ that $Ar^1$ optionally has is preferably an alkyl group, an alkoxy group, an aryl group, an aryloxy group, a carboxyl group, a substituted carboxyl group, or a halogen atom.

In Formula (1), n1 is an integer of 1 or more, preferably an integer from 1 to 4, and more preferably an integer from 1 to 3.

Examples of the (2+n1)-valent aromatic group represented by $Ar^1$ in Formula (1) include a (2+n1)-valent aromatic hydrocarbon group and a (2+n1)-valent aromatic heterocyclic group, and a (2+n1)-valent aromatic group consisting of only carbon atoms or a (2+n1)-valent aromatic group consisting of carbon atoms and one or more atoms selected from the group consisting of a hydrogen atom, a nitrogen atom, and an oxygen atom are preferable. Examples of the (2+n1)-valent aromatic group include a (2+n1)-valent group in which (2+n1) hydrogen atoms are removed from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; a (2+n1)-valent group in which (2+n1) hydrogen atoms are removed from a condensed polycyclic aromatic ring having a structure formed by condensing two or more of the monocyclic aromatic ring; a (2+n1)-valent group in which (2+n1) hydrogen atoms are removed from an aromatic ring assembly having a structure linking two or more aromatic rings selected from the group consisting of the monocyclic aromatic ring and the condensed polycyclic aromatic ring through a single bond, an ethenylene group, or an ethynylene group; and a (2+n1)-valent group in which (2+n1) hydrogen atoms are removed from a bridged polycyclic aromatic ring that includes two or more of aromatic rings selected from the monocyclic aromatic ring, the condensed polycyclic aromatic ring, and the aromatic ring assembly and has a structure bridging the adjacent two aromatic rings among the aromatic rings by a divalent group such as a methylene group, an ethylene group, and a carbonyl group, or a methanetetrayl group.

In the condensed polycyclic aromatic ring, the number of condensed monocyclic aromatic rings is preferably 2 to 4, more preferably 2 to 3, and further preferably 2, in terms of solubility of the polymer compound. In the aromatic ring assembly, the number of linked aromatic rings is preferably 2 to 4, more preferably 2 to 3, and further preferably 2, in terms of solubility. In the bridged polycyclic aromatic ring, the number of bridged aromatic rings is preferably 2 to 4, more preferably 2 to 3, and further preferably 2, in terms of solubility of the polymer compound.

Examples of the monocyclic aromatic ring include the rings represented by the following formulas.
[Chemical Formula 28]
1
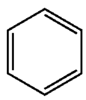
2
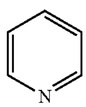
3
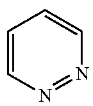
4
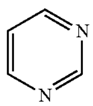
5
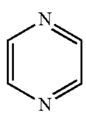
6
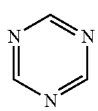
7
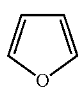
8
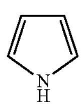
9
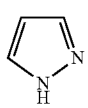
10
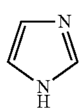
11
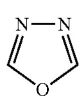
12
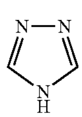
Examples of the condensed polycyclic aromatic ring include the rings represented by the following formulas.
[Chemical Formula 29]
13
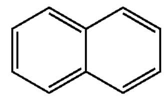
14
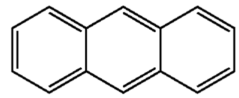
15
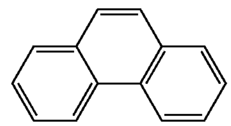
16
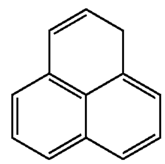
17
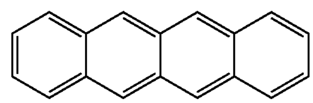
18
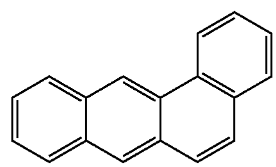
19
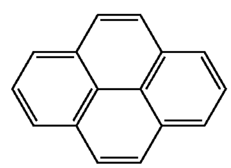
20
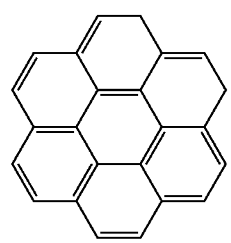
21
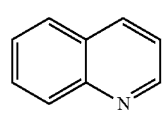
22
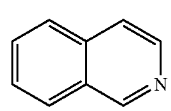
23
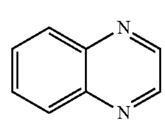

-continued
24
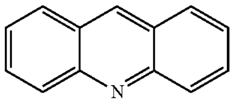
25
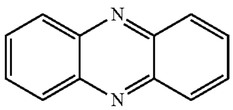
26
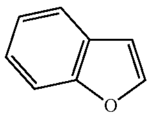
27
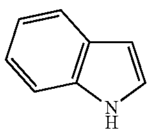
28
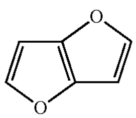
29
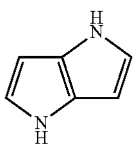
30
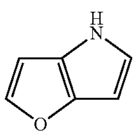
31
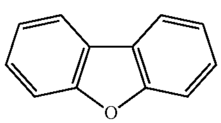
32
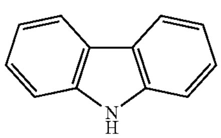
33
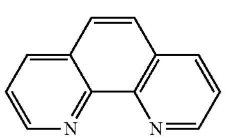
Examples of the aromatic ring assembly include the rings represented by the following formulas.
[Chemical Formula 30]
34
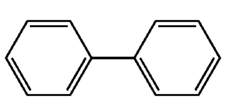
-continued
35
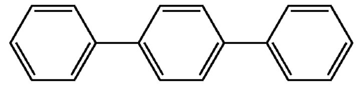
36
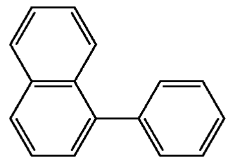
37
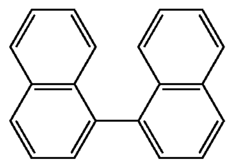
38
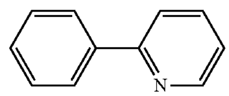
39
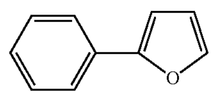
40
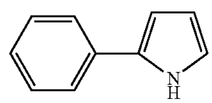
41
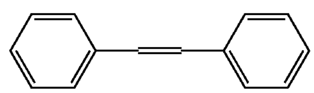
42
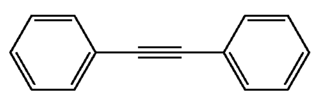
Examples of the bridged polycyclic aromatic ring include the rings represented by the following formulas.
[Chemical Formula 31]
43
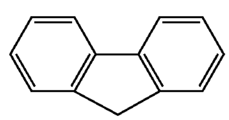
44
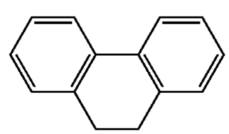
45
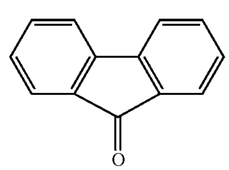

-continued

46

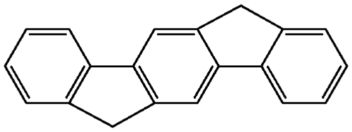

47

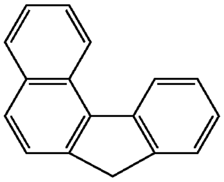

48

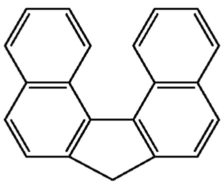

49

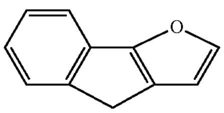

50

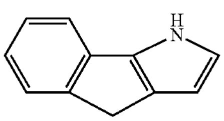

51

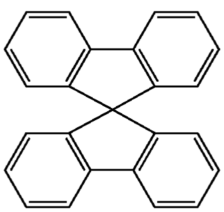

In terms of electric conductivity of the polymer compound and easy synthesis of raw material monomers, the (2+n1)-valent aromatic group represented by $Ar^1$ is preferably a (2+n1)-valent group in which (2+n1) hydrogen atoms are removed from the ring represented by any one of Formulas 1 to 15, 19 to 25, 31 to 35, 43, 46 to 48, and 51, more preferably the (2+n1)-valent group in which (2+n1) hydrogen atoms are removed from the ring represented by any one of Formulas 1, 2, 5, 4, 6, 13 to 15, 19, 21, 23, 31, 32, 33, 43, 46, 47, and 51, and further preferably the (2+n1)-valent group in which (2+n1) hydrogen atoms are removed from the ring represented by any one of Formulas 1, 5, 6, 13 to 15, 21, 23, 33, 43, 46, and 47.

In terms of electric conductivity of the polymer compound and easy synthesis of raw material monomers, the (2+n1)-valent aromatic group represented by $Ar^1$ is preferably a group in which n1 hydrogen atom(s) is(are) removed from a divalent group represented by any one of Formulas 1', 3', 6', 13' to 15', 21', 23', 33', 43', 46' and 47'.

[Chemical Formula 32]

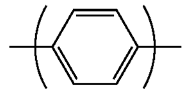

1′

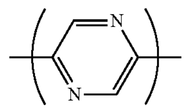

3′

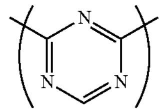

6′

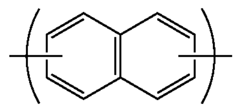

13′

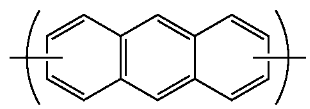

14′

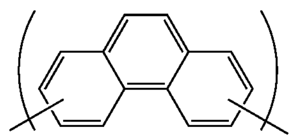

15′

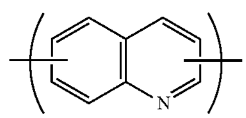

21′

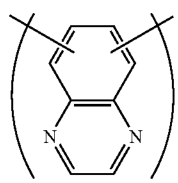

23′

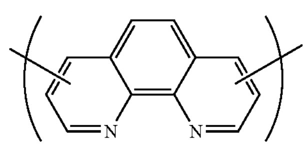

33′

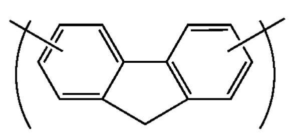

43′

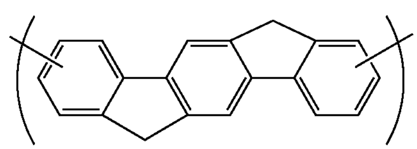

46′

-continued

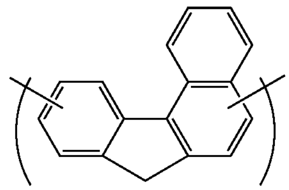

47'

[1.2. Structural Unit Represented by Formula (3)]

In Formula (3), $R^3$ is a monovalent group including a group represented by Formula (4). $Ar^2$ is a (2+n3)-valent aromatic group that optionally has a substituent other than $R^3$. n3 is an integer of 1 or more. When a plurality of $R^3$ are present, each $R^3$ may be the same as or different from each other.

Hereinafter, $R^3$, Formula (4), $Ar^2$, and n3 will be described in this order.

[1.2.1. Description of $R^3$]

$R^3$ is a monovalent group including a group represented by Formula (4). When a plurality of $R^3$ are present, each $R^3$ may be the same as or different from each other.

$R^3$ may also be a monovalent group consisting of a group represented by Formula (4). In other words, the group represented by Formula (4) may be directly bonded to $Ar^1$.

$R^3$ may be a group partially including the group represented by Formula (4). In other words, the group represented by Formula (4) may be bonded to $Ar^2$ through, for example, the group or the atom described below:

an alkylene group having 1 to 50 carbon atom(s) that optionally has a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent;

an alkyleneoxy group having 1 to 50 carbon atom(s) that optionally has a substituent such as a methyleneoxy group, an ethyleneoxy group, a propyleneoxy group, a butyleneoxy group, a pentyleneoxy group, a hexyleneoxy group, a nonyleneoxy group, a dodecyleneoxy group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group among these groups in which at least one hydrogen atom is substituted with a substituent (in other words, a divalent organic group represented by the formula: —$R^g$—O—, wherein $R^g$ is an alkylene group having 1 to 50 carbon atom(s) that optionally has a substituent and examples of the alkylene group having 1 to 50 carbon atom(s) that optionally has a substituent include a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent);

an imino group that optionally has a substituent;

a silylene group that optionally has a substituent;

an ethenylene group that optionally has a substituent;

an ethynylene group; and a hetero atom such as an oxygen atom, a nitrogen atom, and a sulfur atom.

For example, $R^3$ is a group represented by Formula (4) or a group represented by the formula: —$B^2$-$(A^2)_{n*2}$ wherein $A^2$ is a group represented by Formula (4); $B^2$ is the same as the definition of $B^1$; n*2 is an integer of 1 or more; and when a plurality of A2 are present, each $A^2$ may be the same as or different from each other.

Examples of the substituent that an alkylene group having 1 to 50 carbon atom(s), an alkyleneoxy group having 1 to 50 carbon atom(s), an imino group, a silylene group and an ethenylene group, which may be included in $R^3$, optionally have include a substituent similar to the substituent shown as examples in the description of $R^1$ described above. When the alkylene group having 1 to 50 carbon atom(s), the alkyleneoxy group having 1 to 50 carbon atom(s), the imino group, the silylene group or the ethenylene group has a plurality of substituents, each substituent may be the same as or different from each other.

[1.2.2. Description of Group Represented by Formula (4)]

In Formula (4), $R^4$ is a single bond or a (1+m2)-valent organic group. $Q^2$ is a divalent organic group. $Y^2$ is a carbocation, an ammonium cation, a phosphonium cation, a sulfonium cation, or an iodonium cation. $M^2$ is $F^-$, $Cl^-$, $Br^-$, $I^-$, $OH^-$, $B(R^b)_4^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$. n4 is an integer of 0 or more. a2 is 1. $R^b$ is an alkyl group having 1 to 30 carbon atom(s) that optionally has a substituent or an aryl group having 6 to 50 carbon atoms that optionally has a substituent. When a plurality of $R^b$ are present, each $R^b$ may be the same as or different from each other. m2 is an integer of 1 or more, and when $R^4$ is a single bond, m2 is 1. When a plurality of $Q^2$ are present, each $Q^2$ may be the same as or different from each other. When a plurality of $Y^2$ are present, each $Y^2$ may be the same as or different from each other. When a plurality of $M^2$ are present, each $M^2$ may be the same as or different from each other. When a plurality of n4 are present, each n4 may be the same as or different from each other.

Examples of the (1+m2)-valent organic group represented by $R^4$ include the following groups:

a group formed by removing m2 hydrogen atom(s) from an alkyl group having 1 to 20 carbon atom(s) that optionally has a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group among these groups in which at least one hydrogen atom is substituted with a substituent;

a group formed by removing m2 hydrogen atom(s) from an aryl group having 6 to 30 carbon atoms that optionally has a substituent such as a phenyl group, a 1-naphthyl group, a 2-naphthyl group, a 1-anthracenyl group, a 2-anthracenyl group, a 9-anthracenyl group, a group among these groups in which at least one hydrogen atom is substituted with a substituent.

a group formed by removing m2 hydrogen atom(s) from an alkoxy group having 1 to 50 carbon atom(s) that optionally has a substituent such as a methoxy group, an ethoxy group, a propyloxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group among these groups in which at least one hydrogen atom is substituted with a substituent;

a group in which m2 hydrogen atom(s) is(are) removed from an amino group having a substituent including a carbon atom; and a group in which m2 hydrogen atom(s) is(are) removed from a silyl group having a substituent including a carbon atom.

In terms of easy synthesis of raw material monomers, the (1+m2)-valent organic group represented by $R^4$ is preferably the group in which m2 hydrogen atom(s) is(are) removed from the alkyl group having 1 to 20 carbon atom(s) that optionally has a substituent, the group in which the m2 hydrogen atom(s) is(are) removed from the aryl group having 6 to 30 carbon atoms that optionally has a substituent, or the group in which the m2 hydrogen atom(s) is(are) removed from the alkoxy group having 1 to 50 carbon atom(s) that optionally has a substituent.

Examples of a substituent that is optionally included in the group in which m2 hydrogen atom(s) is(are) removed from the alkyl group having 1 to 20 carbon atom(s), the group in which m2 hydrogen atom(s) is(are) removed from the aryl group having 6 to 30 carbon atoms, the group in which m2 hydrogen atom(s) is(are) removed from the alkoxy group having 1 to 50 carbon atom(s), the group in which m2 hydrogen atom(s) is(are) removed from the amino group, and the group in which m2 hydrogen atom(s) is(are) removed from the silyl group as the (1+m2)-valent organic group represented by $R^4$ include a substituent similar to the substituent shown as examples in the description of $R^4$ described above. When the group in which m2 hydrogen atom(s) is(are) removed from the alkyl group having 1 to 20 carbon atom(s), the group in which m2 hydrogen atom(s) is(are) removed from the aryl group having 6 to 30 carbon atoms, the group in which m2 hydrogen atom(s) is(are) removed from the alkoxy group having 1 to 50 carbon atom(s), the group in which m2 hydrogen atom(s) is(are) removed from the amino group, and the group in which m2 hydrogen atom(s) is(are) removed from the silyl group have a plurality of substituents, each substituent may be the same as or different from each other.

In Formula (4), m2 is an integer of 1 or more, and when $R^4$ is a single bond, m2 is 1.

In Formula (4), $Q^2$ is a divalent organic group. Examples of the divalent organic group include an organic group similar to the organic group shown as examples about the divalent organic group represented by $Q^1$ described above. In terms of easy synthesis of raw material monomers, the divalent organic group represented by $Q^2$ is preferably a divalent chain saturated hydrocarbon group, an arylene group, an alkyleneoxy group, and an aryleneoxy group.

Also, examples of the substituent that is optionally included in $Q^2$ include a substituent similar to the substituent shown as examples about the divalent organic group represented by $Q^1$ described above. When $Q^2$ has a plurality of substituents, each substituent may be the same as or different from each other.

In Formula (4), $Y^2$ is a carbocation, an ammonium cation, a phosphonium cation, a sulfonium cation, or an iodonium cation.

Examples of the carbocation include a group represented by $$—C^+R_2$$

wherein R is an alkyl group or an aryl group; and each R may be the same as or different from each other.

Examples of the ammonium cation include a group represented by $$—N^+R_3$$

wherein R is the same as the corresponding definition above; and each R may be the same as or different from each other.

Examples of the phosphonium cation include a group represented by $$—P^+R_3$$

wherein R is same as the corresponding definition above; and each R may be the same as or different from each other.

Examples of the sulfonium cation include a group represented by $$—S^+R_2$$

wherein R is same as the corresponding definition above; and each R may be the same as or different from each other.

Examples of the iodonium cation include a group represented by $$—I^+R_2$$

wherein R is same as the corresponding definition above; and each R may be the same as or different from each other.

In terms of easy synthesis of raw material monomers, stability, and stability of the polymer compound, $Y^2$ is preferably the carbocation, the ammonium cation, the phosphonium cation, or the sulfonium cation and more preferably the ammonium cation.

In Formula (4), $M^2$ is $F^-$, $Cl^-$, $Br^-$, $I^-$, $OH^-$, $B(R^b)_4^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$.

$R^b$ is an alkyl group having 1 to 30 carbon atom(s) that optionally has a substituent or an aryl group having 6 to 50 carbon atoms that optionally has a substituent. Examples of the substituent that the alkyl group having 1 to 30 carbon atom(s) and the aryl group having 6 to 50 carbon atoms, which are represented by $R^b$, optionally have include a substituent similar to the substituent shown as examples in the description of $Q^1$ described above. When the alkyl group having 1 to 30 carbon atom(s) or the aryl group having 6 to 50 carbon atoms has a plurality of substituents, each substituent may be the same as or different from each other.

Examples of $R^b$ include an alkyl group having 1 to 20 carbon atom(s) that optionally has a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group among these groups in which at least one hydrogen atom is substituted with a substituent, and an aryl group having 6 to 30 carbon atoms that optionally has a substituent such as a phenyl group, a 1-naphthyl group, a 2-naphthyl group, a 1-anthracenyl group, a 2-anthracenyl group, a 9-anthracenyl group, and a group among these groups in which at least one hydrogen atom is substituted with a substituent. Each $R^b$ in $B(R^b)_4$ may be the same as or different from each other.

In Formula (4), n4 is an integer of 0 or more, preferably an integer from 0 to 6, and more preferably an integer from 0 to 2.

In Formula (4), a2 is 1.

In Formula (4), when a plurality of $Q^2$ are present, each $Q^2$ may be the same as or different from each other. In Formula (4), when a plurality of $Y^2$ are present, each $Y^2$ may be the same as or different from each other. In Formula (4), when a plurality of $M^2$ are present, each $M^2$ may be the same as or different from each other. In Formula (4), when a plurality of n4 are present, each n4 may be the same as or different from each other.

[1.2.3. Examples of Group Represented by Formula (4)]

Examples of the group represented by Formula (4) include groups represented by the following formulas. In the following formulas, X is F, Cl, Br, I, $B(C_6H_5)_4$, $CH_3COO$ or $CF_3SO_3$.

[Chemical Formula 33]

$-(N^+(CH_3)_3X^-)$ $-(CH_2-N^+(CH_3)_3X^-)$ $-((CH_2)_2-N^+(CH_3)_3X^-)$ $-((CH_2)_4-N^+(CH_3)_3X^-)$ $-((CH_2)_8-N^+(CH_3)_3X^-)$ $-(CH(CH_3)-N^+(CH_3)_3X^-)$ $-(C(CH_3)_2-N^+(CH_3)_3X^-)$ $-(O-CH_2-N^+(CH_3)_3X^-)$ $-(O-(CH_2)_2-N^+(CH_3)_3X^-)$ $-(O-(CH_2)_4-N^+(CH_3)_3X^-)$ $-(O-(CH_2)_8-N^+(CH_3)_3X^-)$ $-(O-CH(CH_3)-N^+(CH_3)_3X^-)$ $-(O-C(CH_3)_2-N^+(CH_3)_3X^-)$ 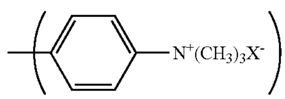

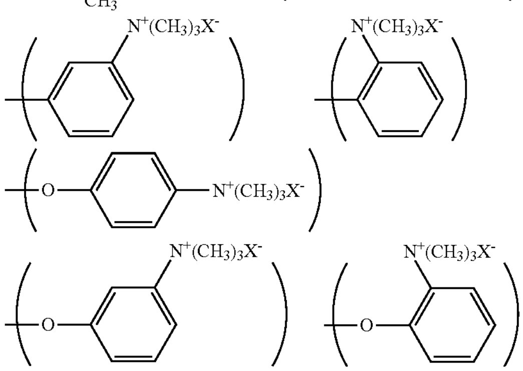

[Chemical Formula 34]

$-(N^+(C_2H_5)_3X^-)$ $-(CH_2-N^+(C_2H_5)_3X^-)$ $-((CH_2)_2-N^+(C_2H_5)_3X^-)$ $-((CH_2)_4-N^+(C_2H_5)_3X^-)$ $-((CH_2)_8-N^+(C_2H_5)_3X^-)$ $-(CH(CH_3)-N^+(C_2H_5)_3X^-)$ $-(C(CH_3)_2-N^+(C_2H_5)_3X^-)$ $-(O-CH_2-N^+(C_2H_5)_3X^-)$ $-(O-(CH_2)_2-N^+(C_2H_5)_3X^-)$ $-(O-(CH_2)_4-N^+(C_2H_5)_3X^-)$ $-(O-(CH_2)_8-N^+(C_2H_5)_3X^-)$ $-(O-CH(CH_3)-N^+(C_2H_5)_3X^-)$ $-(O-C(CH_3)_2-N^+(C_2H_5)_3X^-)$

-continued

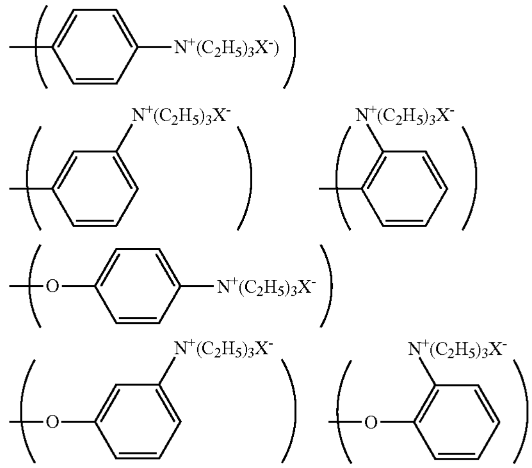

[Chemical Formula 35]

$-(N^+(C_2H_5)_2X^-)$ $-(CH_2-N^+(C_2H_5)_2X^-)$ $-((CH_2)_2-N^+(C_2H_5)_2X^-)$ $-((CH_2)_4-N^+(C_2H_5)_2X^-)$ $-((CH_2)_8-N^+(C_2H_5)_2X^-)$ $-(CH(CH_3)-N^+(C_2H_5)_2X^-)$ $-(C(CH_3)_2-N^+(C_2H_5)_2X^-)$ $-(O-CH_2-N^+(C_2H_5)_2X^-)$ $-(O-(CH_2)_2-N^+(C_2H_5)_2X^-)$ $-(O-(CH_2)_4-N^+(C_2H_5)_2X^-)$ $-(O-(CH_2)_8-N^+(C_2H_5)_2X^-)$ $-(O-CH(CH_3)-N^+(C_2H_5)_2X^-)$ $-(O-C(CH_3)_2-N^+(C_2H_5)_2X^-)$

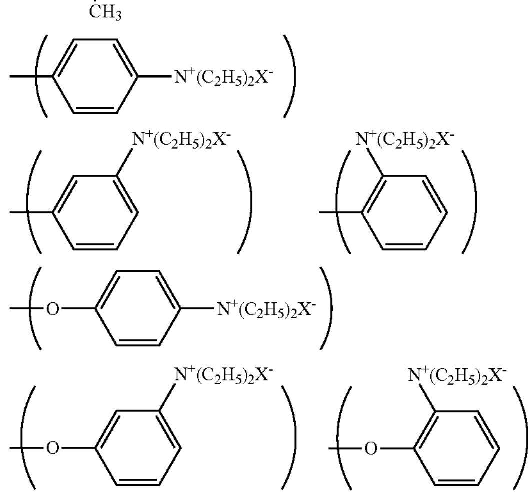

[Chemical Formula 36]

$-(N^+(C_6H_5)_3X^-)$ $-(CH_2-N^+(C_6H_5)_3X^-)$ $-((CH_2)_2-N^+(C_6H_5)_3X^-)$ $-((CH_2)_4-N^+(C_6H_5)_3X^-)$ $-((CH_2)_8-N^+(C_6H_5)_3X^-)$ $-(CH(CH_3)-N^+(C_6H_5)_3X^-)$

-continued

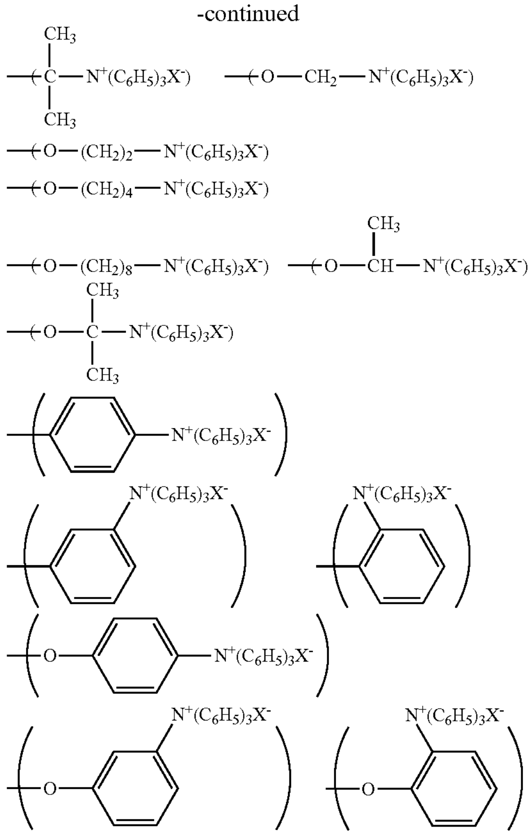

[1.2.4. Description of $Ar^2$ and n3]

$Ar^2$ is a (2+n3)-valent aromatic group that optionally has a substituent other than $R^3$.

$Ar^2$ optionally has a substituent other than $R^3$. Examples of the substituent include a substituent similar to the substituent shown as examples in the description of $R^1$ described above. When $Ar^2$ has the substituents, each substituent may be the same as or different from each other.

In terms of easy synthesis of raw material monomers, the substituent other than $R^3$ that $Ar^2$ optionally has is preferably an alkyl group, an alkoxy group, an aryl group, an aryloxy group, a carboxyl group, a substituted carboxyl group, or a halogen atom.

In Formula (3), n3 is an integer of 1 or more, preferably an integer from 1 to 4, and more preferably an integer from 1 to 3.

Examples of the (2+n3)-valent aromatic group represented by $Ar^2$ in Formula (3) include a (2+n3)-valent aromatic hydrocarbon group and a (2+n3)-valent aromatic heterocyclic group, and a (2+n3)-valent aromatic group consisting of only carbon atoms or a (2+n3)-valent aromatic group consisting of carbon atoms and one or more atoms selected from the group consisting of a hydrogen atom, a nitrogen atom, and an oxygen atom are preferable. Examples of the (2+n3)-valent aromatic group include a (2+n3)-valent group in which (2+n3) hydrogen atoms are removed from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; a (2+n3)-valent group in which (2+n3) hydrogen atoms are removed from a condensed polycyclic aromatic ring having a structure formed by condensing two or more of the monocyclic aromatic ring; a (2+n3)-valent group in which (2+n3) hydrogen atoms are removed from an aromatic ring assembly having a structure linking two or more aromatic rings selected from the group consisting of the monocyclic aromatic ring and the condensed polycyclic aromatic ring through a single bond, an ethenylene group, or an ethynylene group; and a (2+n3)-valent group in which (2+n3) hydrogen atoms are removed from a bridged polycyclic aromatic ring that includes two or more of aromatic rings selected from the monocyclic aromatic ring, the condensed polycyclic aromatic ring, and the aromatic ring assembly and has a structure bridging the adjacent two aromatic rings among the aromatic rings by a divalent group such as a methylene group, an ethylene group, and a carbonyl group or a methanetetrayl group.

In the condensed polycyclic aromatic ring, the number of condensed monocyclic aromatic rings is preferably 2 to 4, more preferably 2 to 3, and further preferably 2, in terms of solubility of the polymer compound. In the aromatic ring assembly, the number of linked aromatic rings is preferably 2 to 4, more preferably 2 to 3, and further preferably 2, in terms of solubility of the polymer compound. In the bridged polycyclic aromatic ring, the number of bridged aromatic rings is preferably 2 to 4, more preferably 2 to 3, and further preferably 2, in terms of solubility of the polymer compound.

Examples of the monocyclic aromatic ring include the rings represented by Formulas 1 to 12 shown as examples in the description of the structural unit represented by Formula (1).

Examples of the condensed polycyclic aromatic ring include the rings represented by Formulas 13 to 33 shown as examples in the description of the structural unit represented by Formula (1).

Examples of the aromatic ring assembly include the rings represented by Formulas 34 to 42 shown as examples in the description of the structural unit represented by Formula (1).

Examples of the bridged polycyclic aromatic ring include the rings represented by Formulas 43 to 51 shown as examples in the description of the structural unit represented by Formula (1).

In terms of electric conductivity of the polymer compound and easy synthesis of raw material monomers, the (2+n3)-valent aromatic group represented by $Ar^2$ is preferably a group in which (2+n3) hydrogen atoms are removed from the ring represented by any one of Formulas 1 to 15, 19 to 25, 31 to 35, 43, 46 to 48, and 51, more preferably the group in which (2+n3) hydrogen atoms are removed from the ring represented by any one of Formulas 1, 2, 5, 4, 6, 13 to 15, 19, 21, 23, 31, 32, 33, 43, 46, 47, and 51, and further preferably the group in which (2+n3) hydrogen atoms are removed from the ring represented by any one of Formulas 1, 5, 6, 13 to 15, 21, 23, 33, 43, 46, and 47.

In terms of electric conductivity of the polymer compound and easy synthesis of raw material monomers, the (2+n3)-valent aromatic group represented by $Ar^2$ is preferably a group in which n3 hydrogen atom(s) is(are) removed from a divalent group represented by any one of Formulas 1', 3', 6', 13' to 15', 21', 23', 33', 43', 46' and 47' that is shown as an example in the description for the structural unit represented by Formula (1).

[1.3. Structural Unit Represented by Formula (5)]

In Formula (5), $R^5$ is a monovalent group comprising a group represented by Formula (6). $Ar^3$ is a (2+n5)-valent aromatic group that optionally has a substituent other than $R^5$. n5 is an integer of 1 or more. When a plurality of $R^5$ are present, each $R^5$ may be the same as or different from each other.

Hereinafter, $R^5$, Formula (6), $Ar^3$, and n5 will be described in this order.

[1.3.1. Description of $R^5$]

$R^5$ is a monovalent group including a group represented by Formula (6). When a plurality of $R^5$ are present, each $R^5$ may be the same as or different from each other.

$R^5$ may also be a monovalent group consisting of a group represented by Formula (6). In other words, the group represented by Formula (6) may be directly bonded to $Ar^3$.

$R^5$ may be a group partially including the group represented by Formula (6). In other words, the group represented by Formula (6) may be bonded to $Ar^3$ through, for example, the group or the atom described below:

an alkylene group having 1 to 50 carbon atom(s) that optionally has a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent;

an alkyleneoxy group having 1 to 50 carbon atom(s) that optionally has a substituent such as a methyleneoxy group, an ethyleneoxy group, a propyleneoxy group, a butyleneoxy group, a pentyleneoxy group, a hexyleneoxy group, a nonyleneoxy group, a dodecyleneoxy group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group among these groups group in which at least one hydrogen atom is substituted with a substituent (in other words, a divalent organic group represented by the formula: —$R^h$—O— wherein $R^h$ is an alkylene group having 1 to 50 carbon atom(s) that optionally has a substituent and examples of the alkylene group having 1 to 50 carbon atom(s) that optionally has a substituent include a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent);

an imino group that optionally has a substituent;

a silylene group that optionally has a substituent;

an ethenylene group that optionally has a substituent;

an ethynylene group; and a hetero atom such as an oxygen atom, a nitrogen atom, and a sulfur atom.

For example, $R^5$ is a group represented by Formula (6) or a group represented by the formula: —$B^3$-$(A^3)_{n*3}$ wherein $A^3$ is a group represented by Formula (6); $B^3$ is the same as the definition of $B^1$; n*3 is an integer of 1 or more; and when a plurality of $A^3$ are present, each $A^3$ may be the same as or different from each other.

Examples of the substituent that an alkylene group having 1 to 50 carbon atom(s), an alkyleneoxy group having 1 to 50 carbon atom(s), an imino group, a silylene group and an ethenylene group, which may be included in $R^5$, optionally have include a substituent similar to the substituent shown as examples in the description of $R^1$ described above. When the alkylene group having 1 to 50 carbon atom(s), the alkyleneoxy group having 1 to 50 carbon atom(s), the imino group, the silylene group or the ethenylene group has a plurality of substituents, each substituent may be the same as or different from each other.

[1.3.2. Description of Group Represented by Formula (6)]

In Formula (6), $R^6$ is a single bond or a (1+m3)-valent organic group. $Q^3$ is a divalent organic group. $Y^3$ is a cyano group or a group represented by any one of Formulas (7) to (15). n6 is an integer of 0 or more. m3 is an integer of 1 or more, and when $R^6$ is a single bond, m3 is 1. When a plurality of $Q^3$ are present, each $Q^3$ may be the same as or different from each other. When a plurality of $Y^3$ are present, each $Y^3$ may be the same as or different from each other. When a plurality of n6 are present, each n6 may be the same as or different from each other.

Examples of the (1+m3)-valent organic group represented by $R^6$ include the following groups:

a group formed by removing m3 hydrogen atom(s) from an alkyl group having 1 to 20 carbon atom(s) that optionally has a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group among these groups in which at least one hydrogen atom is substituted with a substituent;

a group formed by removing m3 hydrogen atom(s) from an aryl group having 6 to 30 carbon atoms that optionally has a substituent such as a phenyl group, a 1-naphthyl group, a 2-naphthyl group, a 1-anthracenyl group, a 2-anthracenyl group, a 9-anthracenyl group, a group among these groups in which at least one hydrogen atom is substituted with a substituent;

a group formed by removing m3 hydrogen atom(s) from an alkoxy group having 1 to 50 carbon atom(s) that optionally has a substituent such as a methoxy group, an ethoxy group, a propyloxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group among these groups in which at least one hydrogen atom is substituted with a substituent;

a group in which m3 hydrogen atom(s) is(are) removed from an amino group having a substituent including a carbon atom; and a group in which m3 hydrogen atom(s) is(are) removed from a silyl group having a substituent including a carbon atom.

In terms of easy synthesis of raw material monomers, the (1+m3)-valent organic group represented by $R^6$ is preferably the group in which the m3 hydrogen atom(s) is(are) removed from the alkyl group having 1 to 20 carbon atom(s) that optionally has a substituent, the group in which the m3 hydrogen atom(s) is(are) removed from the aryl group having 6 to 30 carbon atoms that optionally has a substituent, or the group in which the m3 hydrogen atom(s) is(are) removed from the alkoxy group having 1 to 50 carbon atom(s) that optionally has a substituent.

Examples of the substituent that the (1+m3)-valent organic group represented by $R^6$ optionally has include a substituent that is similar to the substituents shown as examples in the description of $R^1$ described above. When the (1+m3)-valent organic group represented by $R^6$ has a plurality of substituents, each substituent may be the same as or different from each other.

In Formula (6), m3 is an integer of 1 or more, and when $R^6$ is a single bond, m3 is 1.

In Formula (6), $Q^3$ is a divalent organic group. Examples of the divalent organic group include an organic group similar to the organic group shown as examples about the divalent organic group represented by $Q^1$ described above. In terms of easy synthesis of raw material monomers, the divalent organic group represented by $Q^3$ is preferably a divalent chain saturated hydrocarbon group, an arylene group, an alkyleneoxy group, and an aryleneoxy group.

Also, examples of the substituent that is optionally included in $Q^3$ include a substituent similar to the organic group shown as examples about the divalent organic group represented by $Q^1$ described above. When $Q^3$ has a plurality of substituents, each substituent may be the same as or different from each other.

In Formula (6), $Y^3$ is a cyano group or a group represented by any one of Formulas (7) to (15). In Formulas (7) to (15), R' is a divalent hydrocarbon group that optionally has a substituents. R" is a hydrogen atom, a monovalent hydrocarbon group that optionally has a substituent, a carboxyl group, a sulfo group, a hydroxyl group, a mercapto group, —$NR^c_2$, a cyano group, or —C(═O)$NR^c_2$. R'" is a trivalent hydrocarbon group that optionally has a substituent. a3 is an integer of 1 or more. a4 is an integer of 0 or more. $R^c$ is an alkyl group having 1 to 30 carbon atom(s) that optionally has a substituent or an aryl group having 6 to 50 carbon atoms that optionally has a substituent. Each $R^c$ may be the same as or different from each other. When a plurality of R' are present, each R' may be the same as or different from each other. When a plurality of R" are present, each R" may be the same as or different from each other. When a plurality of a4 are present, each a4 may be the same as or different from each other.

In Formulas (7) to (15), R' is a divalent hydrocarbon group that optionally has a substituents.

Examples of the divalent hydrocarbon group represented by R' that optionally has substituent include the following groups:

a divalent chain saturated hydrocarbon group having 1 to 50 carbon atom(s) that optionally has a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group, and a group among these groups in which at least one hydrogen atom is substituted with a substituent;

a divalent chain unsaturated hydrocarbon group having 2 to 50 carbon atoms that optionally has a substituent including an alkenylene group having 2 to 50 carbon atoms that optionally has a substituent such as an ethenylene group, a propenylene group, a 3-butenylene group, a 2-butenylene group, a 2-pentenylene group, a 2-hexenylene group, a 2-nonenylene group, a 2-dodecenylene group, and a group among these groups in which at least one hydrogen atom is substituted with a substituent and/or an ethynylene group;

a divalent cyclic saturated hydrocarbon group having 3 to 50 carbon atoms that optionally has a substituent such as a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent; and an arylene group having 6 to 50 carbon atoms that optionally has a substituent such as a 1,3-phenylene group, a 1,4-phenylene group, a 1,4-naphthylene group, a 1,5-naphthylene group, a 2,6-naphthylene group, a biphenyl-4,4'-diyl group, and a group among these groups in which at least one hydrogen atom is substituted with a substituent.

Examples of the substituent that the divalent hydrocarbon group represented by R' optionally has include a substituent that is similar to the substituents shown as examples in the description of $R^1$ described above. When the divalent hydrocarbon group represented by R' has a plurality of substituents, each substituent may be the same as or different from each other.

In Formula (7) and Formulas (9) to (15), R" is a hydrogen atom, a monovalent hydrocarbon group that optionally has a substituent, a carboxyl group, a sulfo group, a hydroxyl group, a mercapto group, —$NR^c_2$, a cyano group, or —C(═O)$NR^c_2$.

Examples of a monovalent hydrocarbon group represented by R" that optionally has a substituent include an alkyl group having 1 to 20 carbon atom(s) that optionally has a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group among these groups in which at least one hydrogen atom is substituted with a substituent, and an aryl group having 6 to 30 carbon atoms that optionally has a substituent such as a phenyl group, a 1-naphthyl group, a 2-naphthyl group, a 1-anthracenyl group, a 2-anthracenyl group, a 9-anthracenyl group, and a group among these groups in which at least one hydrogen atom is substituted with a substituent.

In terms of solubility of the polymer compound, the monovalent hydrocarbon group represented by R" that optionally has a substituent is preferably the methyl group, the ethyl group, the phenyl group, the 1-naphthyl group, the 2-naphthyl group, or the group among these groups in which at least one hydrogen atom is substituted with a substituent.

Examples of the substituent that the monovalent hydrocarbon group represented by R" include a substituent that is similar to the substituent shown as examples in the description of $R^1$ described above. When the monovalent hydrocarbon group represented by R" has a plurality of substituents, each substituent may be the same as or different from each other.

$R^c$ in —$NR^c_2$ represented by R" is an alkyl group having 1 to 30 carbon atom(s) that optionally has a substituent or an aryl group having 6 to 50 carbon atoms that optionally has a substituent. Examples of the substituent that $R^c$ optionally has include a substituent that is similar to the substituent shown as examples in the description of $R^1$ described above. In terms of solubility of the polymer compound, $R^c$ is preferably a methyl group, an ethyl group, a phenyl group, a 1-naphthyl group, or a 2-naphthyl group. Each $R^c$ may be the same as or different from each other.

In Formula (8), R'" is a trivalent hydrocarbon group that optionally has a substituent.

Examples of the trivalent hydrocarbon group represented by R'" include an alkanetriyl group having 1 to 20 carbon atom(s) that optionally has a substituent such as a methanetriyl group, an ethanetriyl group, a 1,2,3-propanetriyl group, a 1,2,4-butanetriyl group, a 1,2,5-pentanetriyl group, a 1,3,5-pentanetriyl group, a 1,2,6-hexanetriyl group, a 1,3,6-hexanetriyl group, and a group among these groups in which at least one hydrogen atom is substituted by a substituent, and an arenetriyl group having 6 to 30 carbon atoms that optionally has a substituent such as a 1,2,3-benzenetriyl group, a 1,2,4-benzenetriyl group, a 1,3,5-benzenetriyl group, and a group among these groups in which at least one hydrogen atom is substituted by a substituent.

In terms of solubility of the polymer compound, the trivalent hydrocarbon group represented by R''' is preferably the methanetriyl group, the ethanetriyl group, the 1,2,4-benzenetriyl group, and the 1,3,5-benzenetriyl group.

Examples of the substituent that the trivalent hydrocarbon group represented by R''' optionally has include a substituent that is similar to the substituent shown as examples in the description of $R^1$ described above. When the trivalent hydrocarbon group represented by R''' has a plurality of substituents, each substituent may be the same as or different from each other.

In Formula (7) and Formula (8), a3 is an integer of 1 or more and preferably an integer from 3 to 10.

In Formulas (9) to (15), a4 is an integer of 0 or more. In Formula (9), a4 is preferably an integer from 0 to 30 and more preferably an integer from 3 to 20. In Formulas (10) to (13), a4 is preferably an integer from 0 to 10 and more preferably an integer from 0 to 5. In Formula (14), a4 is preferably an integer from 0 to 20 and more preferably an integer from 3 to 20. In Formula (15), a4 is preferably an integer from 0 to 20 and more preferably an integer from 0 to 10.

In any one of Formulas (7) to (15), when a plurality of R' are present, each R' may be the same as or different from each other. In any one of Formulas (7) and (9) to (15), when a plurality of R'' are present, each R'' may be the same as or different from each other. In Formula (12), when a plurality of a4 are present, each a4 may be the same as or different from each other.

In terms of easy synthesis of raw material monomers, $Y^3$ is preferably a cyano group, a group represented by Formula (7), a group represented by Formula (8), a group represented by Formula (9), a group represented by Formula (13), or a group represented by Formula (14), more preferably the group represented by Formula (7), the group represented by Formula (8), the group represented by Formula (9), or the group represented by Formula (14), and more preferably a group selected from the group represented by the following formulas.

[Chemical Formula 37]

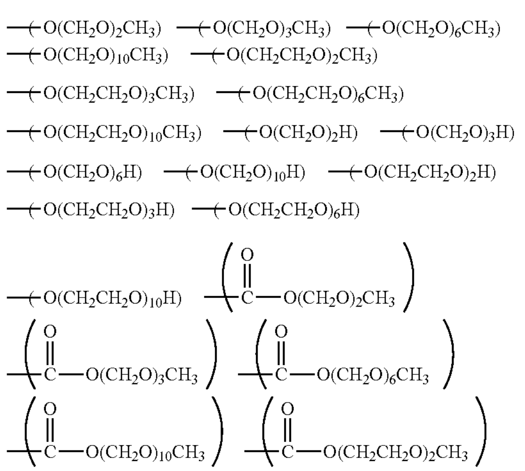

-continued

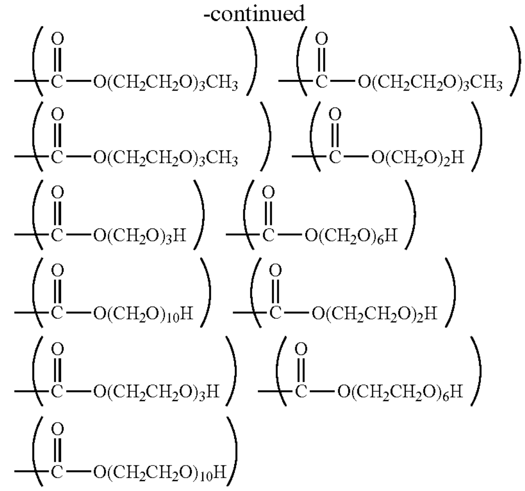

In Formula (6), n6 is an integer of 0 or more, preferably an integer from 0 to 6, and more preferably an integer from 0 to 2.

When a plurality of $Q^3$ are present, each $Q^3$ may be the same as or different from each other. When a plurality of $Y^3$ are present, each $Y^3$ may be the same as or different from each other. When a plurality of n6 are present, each n6 may be the same as or different from each other.

[1.3.3. Examples of Group Represented by Formula (6)]

Examples of the group represented by Formula (6) include groups represented by the following formulas.

[Chemical Formula 38]

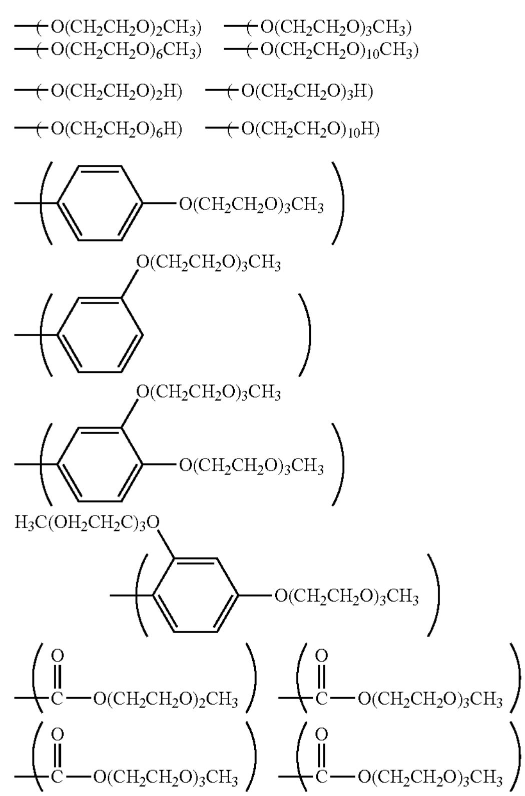

-continued

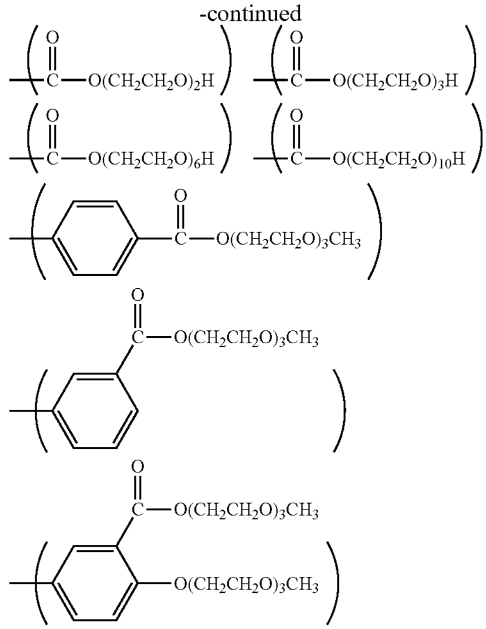

[1.3.4. Description of $Ar^3$ and n5]

In Formula (5), $Ar^3$ is a (2+n5)-valent aromatic group that optionally has a substituent other than $R^5$.

$Ar^3$ optionally has a substituent other than $R^5$. Examples of the substituent include a substituent similar to the substituent shown as examples in the description of $R^1$ described above. When $Ar^3$ has the substituents, each substituent may be the same as or different from each other.

In terms of easy synthesis of raw material monomers, the substituent other than $R^5$ that $Ar^3$ optionally has is preferably an alkyl group, an alkoxy group, an aryl group, an aryloxy group, a carboxyl group, a substituted carboxyl group, or a halogen atom.

In Formula (5), n5 is an integer of 1 or more, preferably an integer from 1 to 4, and more preferably an integer from 1 to 3.

Examples of the (2+n5)-valent aromatic group represented by $Ar^3$ in Formula (5) include a (2+n5)-valent aromatic hydrocarbon group and a (2+n5)-valent aromatic heterocyclic group, and a (2+n5)-valent aromatic group consisting of only carbon atoms or a (2+n5)-valent aromatic group consisting of carbon atoms and one or more atoms selected from the group consisting of a hydrogen atom, a nitrogen atom, and an oxygen atom are preferable. Examples of the (2+n5)-valent aromatic group include a (2+n5)-valent group in which (2+n5) hydrogen atoms are removed from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; a (2+n5)-valent group in which (2+n5) hydrogen atoms are removed from a condensed polycyclic aromatic ring having a structure formed by condensing two or more of the monocyclic aromatic ring; a (2+n5)-valent group in which (2+n5) hydrogen atoms are removed from an aromatic ring assembly having a structure linking two or more aromatic rings selected from the group consisting of the monocyclic aromatic ring and the condensed polycyclic aromatic ring through a single bond, an ethenylene group, or an ethynylene group; and a (2+n5)-valent group in which (2+n5) hydrogen atoms are removed from a bridged polycyclic aromatic ring that includes two or more of aromatic rings selected from the monocyclic aromatic ring, the condensed polycyclic aromatic ring, and the aromatic ring assembly and has a structure bridging the adjacent two aromatic rings among the aromatic rings by a divalent group such as a methylene group, an ethylene group, and a carbonyl group or a methanetetrayl group.

In the condensed polycyclic aromatic ring, the number of condensed monocyclic aromatic rings is preferably 2 to 4, more preferably 2 to 3, and further preferably 2, in terms of solubility of the polymer compound. In the aromatic ring assembly, the number of linked aromatic rings is preferably 2 to 4, more preferably 2 to 3, and further preferably 2, in terms of solubility of the polymer compound. In the bridged polycyclic aromatic ring, the number of bridged aromatic rings is preferably 2 to 4, more preferably 2 to 3, and further preferably 2, in terms of solubility of the polymer compound.

Examples of the monocyclic aromatic ring include the rings represented by Formulas 1 to 12 shown as examples in the description of the structural unit represented by Formula (1).

Examples of the condensed polycyclic aromatic ring include the rings represented by Formulas 13 to 33 shown as examples in the description of the structural unit represented by Formula (1).

Examples of the aromatic ring assembly include the rings represented by Formulas 34 to 42 shown as examples in the description of the structural unit represented by Formula (1).

Examples of the bridged polycyclic aromatic ring include the rings represented by the Formulas 43 to 51 shown as examples in the description of the structural unit represented by Formula (1).

In terms of electric conductivity of the polymer compound and easy synthesis of raw material monomers, the (2+n5)-valent aromatic group represented by $Ar^3$ is preferably a group in which (2+n5) hydrogen atoms are removed from the ring represented by any one of Formulas 1 to 15, 19 to 25, 31 to 35, 43, 46 to 48, and 51, more preferably the group in which (2+n5) hydrogen atoms are removed from the ring represented by any one of Formulas 1, 2, 5, 4, 6, 13 to 15, 19, 21, 23, 31, 32, 33, 43, 46, 47, and 51, and further preferably the group in which (2+n5) hydrogen atoms are removed from the ring represented by any one of Formulas 1, 5, 6, 13 to 15, 21, 23, 33, 43, 46, and 47.

In terms of electric conductivity of the polymer compound and easy synthesis of raw material monomers, the (2+n5)-valent aromatic group represented by $Ar^3$ is preferably a group in which n5 hydrogen atom(s) is(are) removed from a divalent group represented by any one of Formulas 1', 3', 6', 13' to 15', 21', 23', 33', 43', 46' and 47' that is shown as an example in the description for the structural unit represented by Formula (1).

In Formula (5), n5 is an integer of 1 or more, preferably an integer from 1 to 4, and more preferably an integer from 1 to 3.

[1.4. Structural Unit Represented by Formula (16)]

In Formula (16), $R^7$ is a monovalent group including the group represented by Formula (17). $Ar^4$ is a (2+n7) valent aromatic group that optionally has a substituent other than $R^7$. n7 is an integer of 1 or more. When a plurality of $R^7$ are present, each $R^7$ may be the same as or different from each other.

Hereinafter, $R^7$, Formula (17), $Ar^4$, and n7 will be described in this order.

[1.4.1. Description of $R^7$]

$R^7$ is a monovalent group including a group represented by Formula (17). In Formula (16), when a plurality of $R^7$ are present, each $R^7$ may be the same as or different from each other.

$R^7$ may also be a monovalent group consisting of the group represented by Formula (17). In other words, the group represented by Formula (17) may be directly bonded to $Ar^4$.

$R^7$ may be a group partially including the group represented by Formula (17). In other words, the group represented by Formula (17) may be bonded to $Ar^4$ through, for example, the group or the atom described below:

an alkylene group having 1 to 50 carbon atom(s) that optionally has a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent;

an alkyleneoxy group having 1 to 50 carbon atom(s) that optionally has a substituent such as a methyleneoxy group, an ethyleneoxy group, a propyleneoxy group, a butyleneoxy group, a pentyleneoxy group, a hexyleneoxy group, a nonyleneoxy group, a dodecyleneoxy group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group among these groups in which at least one hydrogen atom is substituted with a substituent (in other words, a divalent organic group represented by the formula: —$R^i$—O— wherein $R^i$ is an alkylene group having 1 to 50 carbon atom(s) that optionally has a substituent and examples of the alkylene group having 1 to 50 carbon atom(s) that optionally has a substituent include a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent);

an imino group that optionally has a substituent;

a silylene group that optionally has a substituent;

an ethenylene group that optionally has a substituent;

an ethynylene group; and a hetero atom such as an oxygen atom, a nitrogen atom, and a sulfur atom.

For example, $R^7$ is a group represented by Formula (17) or a group represented by the formula: wherein $A^4$ is a group represented by Formula (17); $B^4$ is the same as the definition of $B^1$; n*4 is an integer of 1 or more; and when a plurality of $A^4$ are present, each $A^4$ may be the same as or different from each other.

Examples of the substituent that can be included in $R^7$ and that an alkylene group having 1 to 50 carbon atom(s), an alkyleneoxy group having 1 to 50 carbon atom(s), an imino group, a silylene group and an ethenylene group optionally have include a substituent similar to the substituent shown as examples in the description of $R^1$ described above. When the alkylene group having 1 to 50 carbon atom(s), the alkyleneoxy group having 1 to 50 carbon atom(s), the imino group, the silylene group or the ethenylene group has a plurality of substituents, each substituent may be the same as or different from each other.

[1.4.2. Description of Group Represented by Formula (17)]

In Formula (17), $R^8$ is a (1+m4+m5)-valent organic group. $Q^1$, $Q^3$, $Y^1$, $M^1$, $Y^3$, n2, a1, and n6 are the same as the corresponding definitions above. m4 and m5 are each independently an integer of 1 or more. When a plurality of $Q^1$ are present, each $Q^1$ may be the same as or different from each other. When a plurality of $Q^3$ are present, each $Q^3$ may be the same as or different from each other. When a plurality of $Y^1$ are present, each $Y^1$ may be the same as or different from each other. When a plurality of $M^1$ are present, each $M^1$ may be the same as or different from each other. When a plurality of $Y^3$ are present, each $Y^3$ may be the same as or different from each other. When a plurality of n2 are present, each n2 may be the same as or different from each other. When a plurality of a1 are present, each a1 may be the same as or different from each other. When a plurality of n6 are present, each n6 may be the same as or different from each other.

In Formula (17), examples of the (1+m4+m5)-valent organic group represented by $R^8$ include the following groups:

a group formed by removing (m4+m5) hydrogen atoms from an alkyl group having 1 to 20 carbon atom(s) that optionally has a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group among these groups in which at least one hydrogen atom is substituted with a substituent;

a group formed by removing (m4+m5) hydrogen atoms from an aryl group having 6 to 30 carbon atoms that optionally has a substituent such as a phenyl group, a 1-naphthyl group, a 2-naphthyl group, a 1-anthracenyl group, a 2-anthracenyl group, a 9-anthracenyl group, and a group among these groups in which at least one hydrogen atom is substituted with a substituent.

a group formed by removing (m4+m5) hydrogen atoms from an alkoxy group having 1 to 50 carbon atom(s) that optionally has a substituent such as a methoxy group, an ethoxy group, a propyloxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group among these groups in which at least one hydrogen atom is substituted with a substituent;

a group in which (m4+m5) hydrogen atoms are removed from an amino group having a substituent including a carbon atom; and a group in which (m4+m5) hydrogen atoms are removed from a silyl group having a substituent including a carbon atom.

In terms of easy synthesis of raw material monomers, the (1+m4+m5)-valent organic group represented by $R^8$ is preferably the group in which the (m4+m5) hydrogen atoms are removed from the alkyl group having 1 to 20 carbon atom(s) that optionally has a substituent, the group in which the (m4+m5) hydrogen atoms are removed from the aryl group having 6 to 30 carbon atoms that optionally has a substituent, or the group in which the (m4+m5) hydrogen atoms are removed from the alkoxy group having 1 to 50 carbon atom(s) that optionally has a substituent.

Examples of the substituent that the (1+m4+m5)-valent organic group represented by $R^8$ optionally has include a substituent that is similar to the substituents shown as examples in the description of $R^1$ described above. When the (1+m4+m5)-valent organic group represented by $R^8$ has a plurality of substituents, each substituent may be the same as or different from each other.

In Formula (17), m4 and m5 are each independently an integer of 1 or more.

In Formula (17), $Q^1$, $Q^3$, $Y^1$, $M^1$, $Y^3$, n2, a1, and n6 are the same as the corresponding definitions above.

In Formula (17), when a plurality of $Q^1$ are present, each $Q^1$ may be the same as or different from each other. In Formula (17), when a plurality of $Q^3$ are present, each $Q^3$ may be the same as or different from each other.

In Formula (17), when a plurality of $Y^1$ are present, each $Y^1$ may be the same as or different from each other. In Formula (17), when a plurality of $M^1$ are present, each $M^1$ may be the same as or different from each other. In Formula (17), when a plurality of $Y^3$ are present, each $Y^3$ may be the same as or different from each other. In Formula (17), when a plurality of n2 are present, each n2 may be the same as or different from each other. In Formula (17), when a plurality of a1 are present, each a1 may be the same as or different from each other. In Formula (17), when a plurality of n6 are present, each n6 may be the same as or different from each other.

[1.4.3. Examples of Group Represented by Formula (17)]

Examples of the group represented by Formula (17) include groups represented by the following formulas. In the following formulas, M is the same as the corresponding definition above.

[Chemical Formula 39]

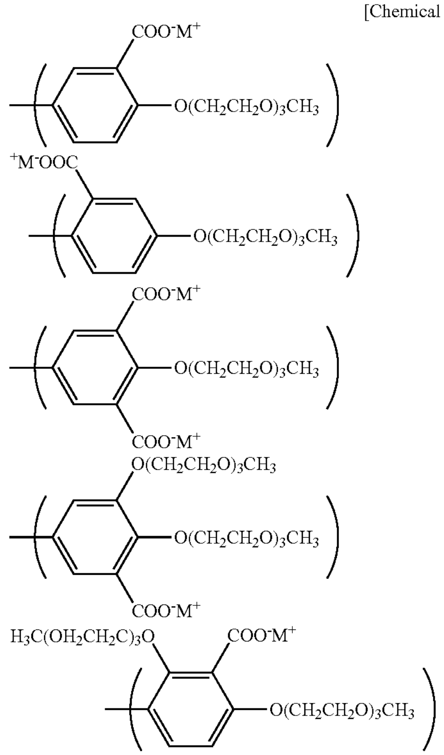

-continued

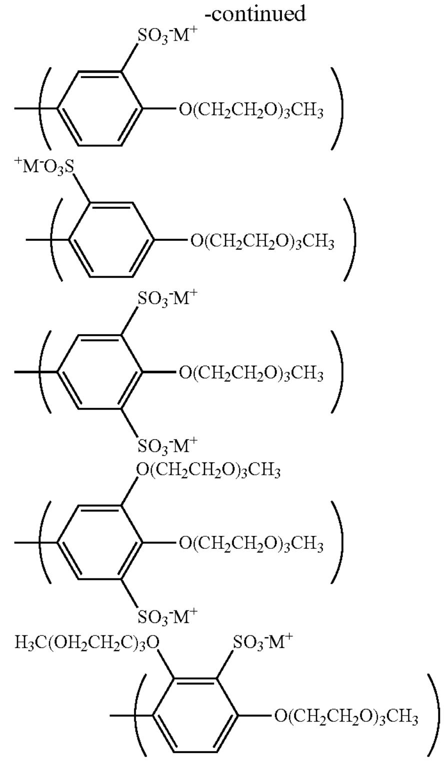

[1.4.4. Description of $Ar^4$ and n7]

In Formula (16), $Ar^4$ is a (2+n7) valent aromatic group that optionally has a substituent other than $R^7$.

$Ar^4$ optionally has a substituent other than $R^7$. Examples of the substituent include a substituent similar to the substituent shown as examples in the description of $R^1$ described above. When $Ar^4$ has the substituents, each substituent may be the same as or different from each other.

In terms of easy synthesis of raw material monomers, the substituent other than $R^7$ that $Ar^4$ optionally has is preferably an alkyl group, an alkoxy group, an aryl group, an aryloxy group, a carboxyl group, a substituted carboxyl group, or a halogen atom.

In Formula (16), n7 is an integer of 1 or more, preferably an integer from 1 to 4, and more preferably an integer from 1 to 3.

Examples of the (2+n7)-valent aromatic group represented by $Ar^4$ in Formula (16) include a (2+n7)-valent aromatic hydrocarbon group and a (2+n7)-valent aromatic heterocyclic group, and a (2+n7)-valent aromatic group consisting of only carbon atoms or a (2+n7)-valent aromatic group consisting of carbon atoms and one or more atoms selected from the group consisting of a hydrogen atom, a nitrogen atom, and an oxygen atom are preferable. Examples of the (2+n7)-valent aromatic group include a (2+n7)-valent group in which (2+n7) hydrogen atoms are removed from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; a (2+n7)-valent group in which (2+n7) hydrogen atoms are removed from a condensed polycyclic aromatic ring having a structure formed by condensing two or more of the monocyclic aromatic ring; a (2+n7)-valent group in which (2+n7) hydrogen atoms are removed from an aromatic ring assembly having a structure linking two or more aromatic rings selected from the group consisting of the monocyclic aromatic ring and the condensed polycyclic aromatic ring through a single bond, an ethenylene group, or an ethynylene group; and a (2+n7)-valent group in which (2+n7) hydrogen atoms are removed from a bridged polycyclic aromatic ring that includes two or more of aromatic rings selected from the monocyclic aromatic ring and the condensed polycyclic aromatic ring and the aromatic ring assembly and has a structure bridging the adjacent two aromatic rings among the aromatic rings by a divalent group such as a methylene group, an ethylene group, and a carbonyl group or a methanetetrayl group.

In the condensed polycyclic aromatic ring, the number of condensed monocyclic aromatic rings is preferably 2 to 4, more preferably 2 to 3, and further preferably 2, in terms of solubility of the polymer compound. In the aromatic ring assembly, the number of linked aromatic rings is preferably 2 to 4, more preferably 2 to 3, and further preferably 2, in terms of solubility of the polymer compound. In the bridged polycyclic aromatic ring, the number of bridged aromatic rings is preferably 2 to 4, more preferably 2 to 3, and further preferably 2, in terms of solubility of the polymer compound.

Examples of the monocyclic aromatic ring include the rings represented by Formulas 1 to 12 shown as examples in the description of the structural unit represented by Formula (1).

Examples of the condensed polycyclic aromatic ring include the rings represented by Formulas 13 to 33 shown as examples in the description of the structural unit represented by Formula (1).

Examples of the aromatic ring assembly include the rings represented by Formulas 34 to 42 shown as examples in the description of the structural unit represented by Formula (1).

Examples of the bridged polycyclic aromatic ring include the rings represented by Formula 43 to 51 shown as examples in the description of the structural unit represented by Formula (1).

In terms of electric conductivity of the polymer compound and easy synthesis of raw material monomers, the (2+n7)-valent aromatic group represented by $Ar^4$ is preferably a group in which (2+n7) hydrogen atoms are removed from the ring represented by any one of Formulas 1 to 15, 19 to 25, 31 to 35, 43, 46 to 48, and 51, more preferably the group in which (2+n7) hydrogen atoms are removed from the ring represented by any one of Formulas 1, 2, 5, 4, 6, 13 to 15, 19, 21, 23, 31, 32, 33, 43, 46, 47, and 51, and further preferably the group in which (2+n7) hydrogen atoms are removed from the ring represented by any one of Formulas 1, 5, 6, 13 to 15, 21, 23, 33, 43, 46, and 47.

In terms of electric conductivity of the polymer compound and easy synthesis of raw material monomers, the (2+n7)-valent aromatic group represented by $Ar^4$ is preferably a group in which n7 hydrogen atom(s) is(are) removed from a divalent group represented by Formula 1', 3', 6', 13' to 15', 21', 23', 33', 43', 46' or 47' that is shown as an example in the description for the structural unit represented by Formula (1).

[1.5. Structural Unit Represented by Formula (18)]

In Formula (18), $R^9$ is a monovalent group comprising a group represented by Formula (19). $Ar^5$ is a (2+n8)-valent aromatic group that optionally has a substituent other than $R^9$. n8 is an integer of 1 or more. When a plurality of $R^9$ are present, each $R^9$ may be the same as or different from each other.

Hereinafter, $R^9$, Formula (19), $Ar^5$, and n8 will be described in this order.

[1.5.1. Description of $R^9$]

$R^9$ is a monovalent group comprising a group represented by Formula (19).

$R^9$ may also be a monovalent group consisting of the group represented by Formula (19). In other words, the group represented by Formula (19) may be directly bonded to $Ar^5$.

$R^9$ may be a group partially including the group represented by Formula (19). In other words, the group represented by Formula (19) may be bonded to $Ar^5$ through, for example, the group or the atom described below:

an alkylene group having 1 to 50 carbon atom(s) that optionally has a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent;

an alkyleneoxy group having 1 to 50 carbon atom(s) that optionally has a substituent such as a methyleneoxy group, an ethyleneoxy group, a propyleneoxy group, a butyleneoxy group, a pentyleneoxy group, a hexyleneoxy group, a nonyleneoxy group, a dodecyleneoxy group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group among these groups in which at least one hydrogen atom is substituted with a substituent (in other words, a divalent organic group represented by the formula: —$R^j$—O— wherein $R^j$ is an alkylene group having 1 to 50 carbon atom(s) that optionally has a substituent; and examples of the alkylene group having 1 to 50 carbon atom(s) that optionally has a substituent include a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent);

an imino group that optionally has a substituent;

a silylene group that optionally has a substituent;

an ethenylene group that optionally has a substituent;

an ethynylene group; and a hetero atom such as an oxygen atom, a nitrogen atom, and a sulfur atom.

For example, $R^9$ is a group represented by Formula (19) or a group represented by the formula: —$B^5$-$(A^5)_{n*5}$ wherein $A^5$ is a group represented by Formula (19); $B^5$ is the same as the definition of $B^1$; n*5 is an integer of 1 or more; and when a plurality of $A^5$ are present, each $A^5$ may be the same as or different from each other.

Examples of the substituent that can be included in $R^9$ and that an alkylene group having 1 to 50 carbon atom(s), an alkyleneoxy group having 1 to 50 carbon atom(s), an imino group, a silylene group and an ethenylene group optionally have include a substituent similar to the substituent shown as examples in the description of $R^1$ described above.

When a plurality of substituents are present, each substituent may be the same as or different from each other.

[1.5.2. Description of Group Represented by Formula (19)]

In Formula (19), $R^{10}$ is a (1+m6+m7)-valent organic group. $Q^2$, $Q^3$, $Y^2$, $M^2$, $Y^3$, n4, a2, and n6 are the same as the corresponding definitions above. m6 and m7 are each independently an integer of 1 or more. When a plurality of $Q^2$ are present, each $Q^2$ may be the same as or different from each other. When a plurality of $Q^3$ are present, each $Q^3$ may be the same as or different from each other. When a plurality of $Y^2$ are present, each $Y^2$ may be the same as or different from each other. When a plurality of $M^2$ are present, each $M^2$ may be the same as or different from each other. When a plurality of $Y^3$ are present, each $Y^3$ may be the same as or different from each other. When a plurality of n4 are present, each n4 may be the same as or different from each other. When a plurality of n6 are present, each n6 may be the same as or different from each other.

In Formula (19), examples of the (1+m6+m7)-valent organic group represented by $R^{10}$ include the following groups:

a group formed by removing (m6+m7) hydrogen atoms from an alkyl group having 1 to 20 carbon atom(s) that optionally has a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group among these groups in which at least one hydrogen atom is substituted with a substituent;

a group formed by removing (m6+m7) hydrogen atoms from an aryl group having 6 to 30 carbon atoms that optionally has a substituent such as a phenyl group, a 1-naphthyl group, a 2-naphthyl group, a 1-anthracenyl group, a 2-anthracenyl group, a 9-anthracenyl group, a group among these groups in which at least one hydrogen atom is substituted with a substituent;

a group formed by removing (m6+m7) hydrogen atoms from an alkoxy group having 1 to 50 carbon atom(s) that optionally has a substituent such as a methoxy group, an ethoxy group, a propyloxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group among these groups in which at least one hydrogen atom is substituted with a substituent;

a group in which (m6+m7) hydrogen atoms are removed from an amino group having a substituent including a carbon atom; and a group in which (m6+m7) hydrogen atoms are removed from a silyl group having a substituent including a carbon atom.

In terms of easy synthesis of raw material monomers, the (1+m6+m7)-valent organic group represented by $R^{10}$ is preferably the group in which the (m6+m7) hydrogen atoms are removed from the alkyl group having 1 to 20 carbon atom(s) that optionally has a substituent, the group in which the (m6+m7) hydrogen atoms are removed from the aryl group having 6 to 30 carbon atoms that optionally has a substituent, or the group in which the (m6+m7) hydrogen atoms are removed from the alkoxy group having 1 to 50 carbon atom(s) that optionally has a substituent.

Examples of the substituent that the (1+m6+m7)-valent organic group represented by $R^{10}$ optionally has include a substituent that is similar to the substituents shown as examples in the description of $R^1$ described above. When the (1+m6+m7)-valent organic group represented by $R^{10}$ has a plurality of substituents, each substituent may be the same as or different from each other.

In Formula (19), m6 and m7 are each independently an integer of 1 or more.

In Formula (19), $Q^2$, $Q^3$, $Y^2$, $M^2$, $Y^3$, n4, a2, and n6 are the same as the corresponding definitions above.

In Formula (19), when a plurality of $Q^2$ are present, each $Q^2$ may be the same as or different from each other. In Formula (19), when a plurality of $Q^3$ are present, each $Q^3$ may be the same as or different from each other. In Formula (19), when a plurality of $Y^2$ are present, each $Y^2$ may be the same as or different from each other. In Formula (19), when a plurality of $M^2$ are present, each $M^2$ may be the same as or different from each other. In Formula (19), when a plurality of $Y^3$ are present, each $Y^3$ may be the same as or different from each other. In Formula (19), when a plurality of n4 are present, each n4 may be the same as or different from each other. In Formula (19), when a plurality of n6 are present, each n6 may be the same as or different from each other.

[Examples of Group Represented by Formula (19)]

Examples of the group represented by Formula (19) include groups represented by the following formulas.

In the following formulas, X is the same as the corresponding definition above.

[Chemical Formula 40]

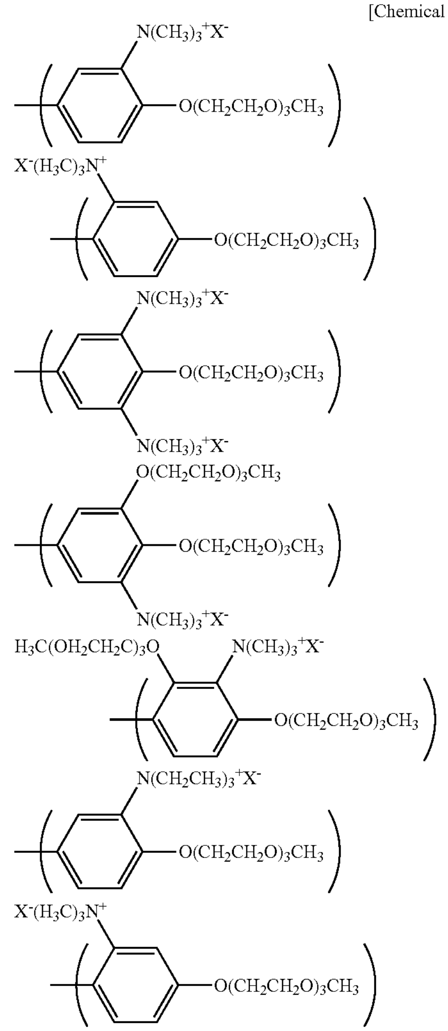

-continued

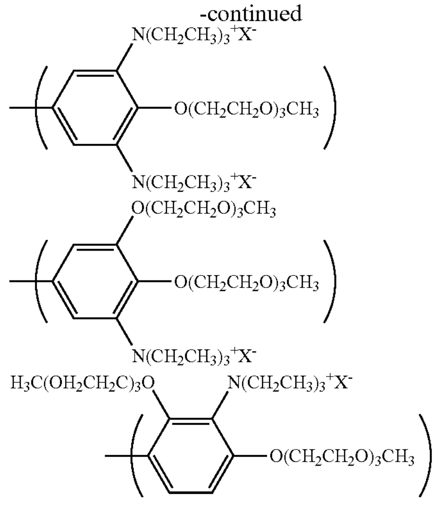

[1.5.3. Description of $Ar^5$ and n8]

In Formula (18), $Ar^5$ is a (2+n8)-valent aromatic group that optionally has a substituent other than $R^9$.

$Ar^5$ optionally has a substituent other than $R^9$. Examples of the substituent include a substituent similar to the substituent shown as examples in the description of $R^1$ described above. When $Ar^5$ has a plurality of substituents, each substituent may be the same as or different from each other.

In terms of easy synthesis of raw material monomers, the substituent other than $R^9$ that $Ar^5$ optionally has is preferably an alkyl group, an alkoxy group, an aryl group, an aryloxy group, a carboxyl group, a substituted carboxyl group, or a halogen atom.

In Formula (18), n8 is an integer of 1 or more, preferably an integer from 1 to 4, and more preferably an integer from 1 to 3.

Examples of the (2+n8)-valent aromatic group represented by $Ar^5$ in Formula (18) include a (2+n8)-valent aromatic hydrocarbon group and a (2+n8)-valent aromatic heterocyclic group, and a (2+n8)-valent aromatic group consisting of only carbon atoms or a (2+n8)-valent aromatic group consisting of carbon atoms and one or more atoms selected from the group consisting of a hydrogen atom, a nitrogen atom, and an oxygen atom are preferable. Examples of the (2+n8)-valent aromatic group include a (2+n8)-valent group in which (2+n8) hydrogen atoms are removed from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; a (2+n8)-valent group in which (2+n8) hydrogen atoms are removed from a condensed polycyclic aromatic ring having a structure formed by condensing two or more of the monocyclic aromatic ring; a (2+n8)-valent group in which (2+n8) hydrogen atoms are removed from an aromatic ring assembly having a structure linking two or more aromatic rings selected from the group consisting of the monocyclic aromatic ring and the condensed polycyclic aromatic ring through a single bond, an ethenylene group, or an ethynylene group; and a (2+n8)-valent group in which (2+n8) hydrogen atoms are removed from a bridged polycyclic aromatic ring that includes two or more of aromatic rings selected from the monocyclic aromatic ring, the condensed polycyclic aromatic ring, and the aromatic ring assembly and has a structure bridging the adjacent two aromatic rings among the aromatic rings by a divalent group such as a methylene group, an ethylene group, and a carbonyl group or a methanetetrayl group.

In the condensed polycyclic aromatic ring, the number of condensed polymer compound rings is preferably 2 to 4, more preferably 2 to 3, and further preferably 2, in terms of solubility of the polymer compound. In the aromatic ring assembly, the number of linked aromatic rings is preferably 2 to 4, more preferably 2 to 3, and further preferably 2, in terms of solubility of the polymer compound. In the bridged polycyclic aromatic ring, the number of bridged aromatic rings is preferably 2 to 4, more preferably 2 to 3, and further preferably 2, in terms of solubility of the polymer compound.

Examples of the monocyclic aromatic ring include the rings represented by Formulas 1 to 12 shown as examples in the description of the structural unit represented by Formula (1).

Examples of the condensed polycyclic aromatic ring include the rings represented by Formulas 13 to 33 shown as examples in the description of the structural unit represented by Formula (1).

Examples of the aromatic ring assembly include the rings represented by Formulas 34 to 42 shown as examples in the description of the structural unit represented by Formula (1).

Examples of the bridged polycyclic aromatic ring include the rings represented by Formulas 43 to 51 shown as examples in the description of the structural unit represented by Formula (1).

In terms of electric conductivity of the polymer compound and easy synthesis of raw material monomers, the (2+n8)-valent aromatic group represented by $Ar^5$ is preferably a group in which (2+n8) hydrogen atoms are removed from the ring represented by any one of Formulas 1 to 15, 19 to 25, 31 to 35, 43, 46 to 48, and 51, more preferably the group in which (2+n8) hydrogen atoms are removed from the ring represented by any one of Formulas 1, 2, 5, 4, 6, 13 to 15, 19, 21, 23, 31, 32, 33, 43, 46, 47, and 51, and further preferably the group in which (2+n8) hydrogen atoms are removed from the ring represented by any one of Formulas 1, 5, 6, 13 to 15, 21, 23, 33, 43, 46, and 47.

In terms of electric conductivity of the polymer compound and easy synthesis of raw material monomers, the (2+n8)-valent aromatic group represented by $Ar^5$ is preferably a group in which n8 hydrogen atom(s) is(are) removed from a divalent group represented by any one of Formulas 1', 3', 6', 13' to 15', 21', 23', 33', 43', 46' and 47' that is shown as an example in the description for the structural unit represented by Formula (1).

[1.6. Structural Unit Represented by Formula (20)]

In Formula (20), $R^{11}$ is a monovalent group including a group represented by Formula (2) or a group represented by Formula (17). $R^{12}$ is a monovalent group including the group represented by Formula (21). $Ar^6$ is a (2+n9+n10)-valent aromatic group that optionally has a substituent other than $R^{11}$ or $R^{12}$. n9 and n10 are each independently an integer of 1 or more. When a plurality of $R^{11}$ are present, each $R^{11}$ may be the same as or different from each other. When a plurality of $R^{12}$ are present, each $R^{12}$ may be the same as or different from each other.

Hereinafter, $R^{11}$, $R^{12}$, Formula (21), $Ar^6$, n9 and n10 will be described in this order.

[1.6.1. Description of $R^{11}$]

$R^{11}$ is a monovalent group including a group represented by Formula (2) or a group represented by Formula (17).

$R^{11}$ may also be a monovalent group consisting of a group represented by Formula (2) or a group represented by Formula (17). In other words, the group represented by Formula (2) or the group represented by Formula (17) may be directly bonded to $Ar^6$.

$R^{11}$ may be a group partially including the group represented by Formula (2) or the group represented by Formula (17). In other words, the group represented by Formula (2) or the group represented by Formula (17) may be bonded to $Ar^6$ through, for example, the group or the atom described below:

an alkylene group having 1 to 50 carbon atom(s) that optionally has a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent;

an alkyleneoxy group having 1 to 50 carbon atom(s) that optionally has a substituent such as a methyleneoxy group, an ethyleneoxy group, a propyleneoxy group, a butyleneoxy group, a pentyleneoxy group, a hexyleneoxy group, a nonyleneoxy group, a dodecyleneoxy group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group among these groups in which at least one hydrogen atom is substituted with a substituent (in other words, a divalent organic group represented by the formula: —$R^k$—O— wherein $R^k$ is an alkylene group having 1 to 50 carbon atom(s) that optionally has a substituent and examples of the alkylene group having 1 to 50 carbon atom(s) that optionally has a substituent include a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent);

an imino group having a substituent including a carbon atom;

a silylene group that optionally has a substituent;

an ethenylene group that optionally has a substituent;

an ethynylene group; and a hetero atom such as an oxygen atom, a nitrogen atom, and a sulfur atom.

For example, $R^{11}$ is a group represented by Formula (2), a group represented by Formula (17) or a group represented by the formula: —$B^6$-$(A^6)_{n*6}$ wherein $A^6$ is a group represented by Formula (2) or a group represented by Formula (17); $B^6$ is the same as the definition of $B^1$; n*6 is an integer of 1 or more; and when a plurality of $A^6$ are present, each $A^6$ may be the same as or different from each other.

Examples of the substituent that an alkylene group having 1 to 50 carbon atom(s), an alkyleneoxy group having 1 to 50 carbon atom(s), an imino group, a silylene group and an ethenylene group, which may be included in $R^{11}$, optionally have include a substituent similar to the substituent shown as examples in the description of $R^1$ described above. When the alkylene group having 1 to 50 carbon atom(s), the alkyleneoxy group having 1 to 50 carbon atom(s), the imino group, the silylene group or the ethenylene group has a plurality of substituents, each substituent may be the same as or different from each other.

[1.6.2. Description of $R^{12}$]

$R^{12}$ is a monovalent group including a group represented by Formula (21). When a plurality of $R^{12}$ are present, each $R^{12}$ may be the same as or different from each other.

$R^{12}$ may also be a monovalent group consisting of a group represented by Formula (21). In other words, the group represented by Formula (21) may be directly bonded to $Ar^6$.

$R^{12}$ may be a group partially including the group represented by Formula (21). In other words, the group represented by Formula (21) may be bonded to $Ar^6$ through the group (the substituent also has the same examples as the group) or the atom shown as examples in the description of $R^{11}$ described below.

For example, $R^{12}$ is a group represented by Formula (21) or a group represented by the formula: —$B^7$-$(A^7)_{n*7}$ wherein $A^7$ is a group represented by Formula (21); $B^7$ is the same as the definition of $B^1$; n*7 is an integer of 1 or more; and when a plurality of $A^7$ are present, each $A^7$ may be the same as or different from each other.

[1.6.3. Description of Group Represented by Formula (21)]

In Formula (21), $R^{13}$ is a single bond or a (1+m8)-valent organic group. $Q^3$, $Y^3$, and n6 are the same as the corresponding definitions above. m8 is an integer of 1 or more, and when $R^{13}$ is a single bond, m8 is 1. When a plurality of $Q^3$ are present, each $Q^3$ may be the same as or different from each other. When a plurality of $Y^3$ are present, each $Y^3$ may be the same as or different from each other. When a plurality of n6 are present, each n6 may be the same as or different from each other.

In Formula (21), examples of the (1+m8)-valent organic group represented by $R^{13}$ include the following groups:

a group formed by removing m8 hydrogen atom(s) from an alkyl group having 1 to 20 carbon atom(s) that optionally has a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group among these groups in which at least one hydrogen atom is substituted with a substituent;

a group formed by removing m8 hydrogen atom(s) from an aryl group having 6 to 30 carbon atoms that optionally has a substituent such as a phenyl group, a 1-naphthyl group, a 2-naphthyl group, a 1-anthracenyl group, a 2-anthracenyl group, a 9-anthracenyl group, a group among these groups in which at least one hydrogen atom is substituted with a substituent;

a group formed by removing m8 hydrogen atom(s) from an alkoxy group having 1 to 50 carbon atom(s) that optionally has a substituent such as a methoxy group, an ethoxy group, a propyloxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group among these groups in which at least one hydrogen atom is substituted with a substituent;

a group in which m8 hydrogen atom(s) is(are) removed from an amino group having a substituent including a carbon atom; and a group in which m8 hydrogen atom(s) is(are) removed from a silyl group having a substituent including a carbon atom.

In terms of easy synthesis of raw material monomers, the (1+m8)-valent organic group represented by $R^{13}$ is preferably the group in which the m8 hydrogen atom(s) is(are) removed from the alkyl group having 1 to 20 carbon atom(s) that optionally has a substituent, the group in which the m8 hydrogen atom(s) is(are) removed from the aryl group having 6 to 30 carbon atoms that optionally has a substituent, or the group in which the m8 hydrogen atom(s) is(are) removed from the alkoxy group having 1 to 50 carbon atom(s) that optionally has a substituent.

Examples of the substituent that the (1+m8)-valent organic group represented by $R^{13}$ optionally has include a substituent that is similar to the substituents shown as examples in the description of $R^1$ described above. When the (1+m8)-valent organic group represented by $R^{13}$ has a plurality of substituents, each substituent may be the same as or different from each other.

In Formula (21), m8 is an integer of 1 or more, and when $R^{13}$ is a single bond, m8 is 1.

In Formula (21), $Q^3$, $Y^3$, and n6 are the same as the corresponding definitions above.

In Formula (21), when a plurality of $Q^3$ are present, each $Q^3$ may be the same as or different from each other. In Formula (21), when a plurality of $Y^3$ are present, each $Y^3$ may be the same as or different from each other. In Formula (21), when a plurality of n6 are present, each n6 may be the same as or different from each other.

[1.6.4. Examples of Group Represented by Formula (21)]

Examples of the group represented by Formula (21) include groups represented by the following formulas.

[Chemical Formula 41]

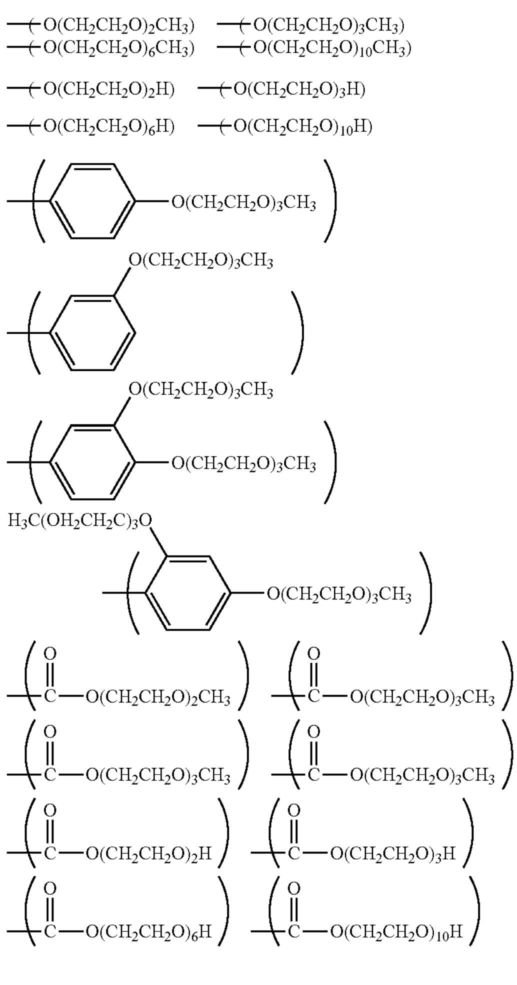

-continued

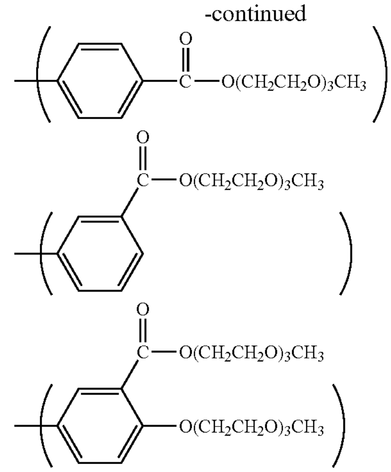

[1.6.5. Description of $Ar^6$, n9, and n10]

In Formula (20), $Ar^6$ is a (2+n9+n10)-valent aromatic group that optionally has a substituent other than $R^{11}$ or $R^{12}$.

$Ar^6$ optionally has a substituent other than $R^{11}$ or $R^{12}$. Examples of the substituent include a substituent similar to the substituent shown as examples in the description of the substituent shown as examples in the description of $R^1$ described above. When $Ar^6$ has a plurality of substituents, each substituent may be the same as or different from each other.

In terms of easy synthesis of raw material monomers, the substituent other than $R^{11}$ or $R^{12}$ that $Ar^6$ has is preferably an alkyl group, an alkoxy group, an aryl group, an aryloxy group, a carboxyl group, a substituted carboxyl group, or a halogen atom.

In Formula (20), n9 is an integer of 1 or more, preferably an integer from 1 to 4, and more preferably an integer from 1 to 3.

In Formula (20), n10 is an integer of 1 or more, preferably an integer from 1 to 4, and more preferably an integer from 1 to 3.

Examples of the (2+n9+n10)-valent aromatic group represented by $Ar^6$ in Formula (20) include a (2+n9+n10)-valent aromatic hydrocarbon group and a (2+n9+n10)-valent aromatic heterocyclic group, and a (2+n9+n10)-valent aromatic group consisting of only carbon atoms or a (2+n9+n10)-valent aromatic group consisting of carbon atoms and one or more atoms selected from the group consisting of a hydrogen atom, a nitrogen atom, and an oxygen atom are preferable. Examples of the (2+n9+n10)-valent aromatic group include a (2+n9+n10)-valent group in which (2+n9+n10) hydrogen atoms are removed from a monocyclic aromatic ring such as a benzene ring, a pyridine ring, a 1,2-diazine ring, a 1,3-diazine ring, a 1,4-diazine ring, a furan ring, a pyrrole ring, a pyrazole ring, and an imidazole ring; a (2+n9+n10)-valent group in which (2+n9+n10) hydrogen atoms are removed from a condensed polycyclic aromatic ring having a structure formed by condensing two or more of the monocyclic aromatic ring; a (2+n9+n10)-valent group in which (2+n9+n10) hydrogen atoms are removed from an aromatic ring assembly having a structure linking two or more aromatic rings selected from the group consisting of the monocyclic aromatic ring and the condensed polycyclic aromatic ring through a single bond, an ethenylene group, or an ethynylene group; and a (2+n9+n10)-valent group in which (2+n9+n10) hydrogen atoms are removed from a bridged polycyclic aromatic ring that includes two or more of aromatic rings selected from the monocyclic aromatic ring, the condensed polycyclic aromatic ring, and the aromatic ring assembly and has a structure bridging the adjacent two aromatic rings among the aromatic rings by a divalent group such as a methylene group, an ethylene group, and a carbonyl group or a methanetetrayl group.

In the condensed polycyclic aromatic ring, the number of condensed monocyclic aromatic rings is preferably 2 to 4, more preferably 2 to 3, and further preferably 2, in terms of solubility of the polymer compound. In the aromatic ring assembly, the number of linked aromatic rings is preferably 2 to 4, more preferably 2 to 3, and further preferably 2, in terms of solubility of the polymer compound. In the bridged polycyclic aromatic ring, the number of bridged aromatic rings is preferably 2 to 4, more preferably 2 to 3, and further preferably 2, in terms of solubility of the polymer compound.

Examples of the monocyclic aromatic ring include the rings represented by Formulas 1 to 5 and Formulas 7 to 10 shown as examples in the description of the structural unit represented by Formula (1).

Examples of the condensed polycyclic aromatic ring include the rings represented by Formulas 13 to 33 shown as examples in the description of the structural unit represented by Formula (1).

Examples of the aromatic ring assembly include the rings represented by Formulas 34 to 42 shown as examples in the description of the structural unit represented by Formula (1).

Examples of the bridged polycyclic aromatic ring include the rings represented by Formulas 43 to 51 shown as examples in the description of the structural unit represented by Formula (1).

In terms of electric conductivity of the polymer compound and easy synthesis of raw material monomers, the (2+n9+n10)-valent aromatic group represented by $Ar^6$ is preferably a (2+n9+n10)-valent group in which (2+n9+n10) hydrogen atoms are removed from the ring represented by any one of Formulas 1 to 5, 7 to 10, Formulas 13 to 15, 19 to 25, 31 to 35, 43, 46 to 48, and 51, more preferably the (2+n9+n10)-valent group in which (2+n9+n10) hydrogen atoms are removed from the ring represented by any one of Formulas 1, 2, 5, 4, 13 to 15, 19, 21, 23, 31, 32, 33, 43, 46, 47, and 51, and further preferably the (2+n9+n10)-valent group in which (2+n9+n10) hydrogen atoms are removed from the ring represented by any one of Formulas 1, 13 to 15, 21, 23, 33, 43, 46, and 47.

The (2+n9+n10)-valent aromatic group represented by $Ar^6$ is preferably a group in which (n9+n10) hydrogen atoms are removed from a divalent group represented by any one of Formulas 1', 3', 13' to 15', 21', 23', 33', 43', 46' and 47' that is shown as an example in the description for the structural unit represented by Formula (1).

[1.7. Structural Unit Represented by Formula (22)]

In Formula (22), $R^{14}$ is a monovalent group including a group represented by Formula (4) or a group represented by Formula (19). $R^{15}$ is a monovalent group including a group represented by Formula (21). $Ar^7$ is a (2+n11+n12)-valent aromatic group that optionally has a substituent other than $R^{14}$ or $R^{15}$. n11 and n12 are each independently an integer of 1 or more. When a plurality of $R^{14}$ are present, each $R^{14}$ may be the same as or different from each other. When a plurality of $R^{15}$ are present, each $R^{15}$ may be the same as or different from each other.

Hereinafter, $R^{14}$, $R^{15}$, $Ar^7$, n11, and n12 will be described in this order.

[1.7.1. Description of $R^{14}$]

$R^{14}$ is a monovalent group including a group represented by Formula (4) or a group represented by Formula (19).

$R^{14}$ may also be a monovalent group consisting of a group represented by Formula (4) or a group represented by Formula (19). In other words, the group represented by Formula (4) or the group represented by Formula (19) may be directly bonded to $Ar^7$.

$R^{14}$ may be a group partially including the group represented by Formula (4) or the group represented by Formula (19). In other words, the group represented by Formula (4) or the group represented by Formula (19) may be bonded to $Ar^7$ through, for example, the group or the atom described below:

an alkylene group having 1 to 50 carbon atom(s) that optionally has a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent;

an alkyleneoxy group having 1 to 50 carbon atom(s) that optionally has a substituent such as a methyleneoxy group, an ethyleneoxy group, a propyleneoxy group, a butyleneoxy group, a pentyleneoxy group, a hexyleneoxy group, a nonyleneoxy group, a dodecyleneoxy group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group among these groups in which at least one hydrogen atom is substituted with a substituent (in other words, a divalent organic group represented by the formula: —$R^1$—O— wherein $R^1$ is an alkylene group having 1 to 50 carbon atom(s) that optionally has a substituent; and examples of the alkylene group having 1 to 50 carbon atom(s) that optionally has a substituent include a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group among these groups in which at least one hydrogen atom is substituted with a substituent);

an imino group that optionally has a substituent;

a silylene group that optionally has a substituent;

an ethenylene group that optionally has a substituent;

an ethynylene group; and a hetero atom such as an oxygen atom, a nitrogen atom, and a sulfur atom.

In other words, $R^{14}$ is a group represented by Formula (4), a group represented by Formula (19) or a group represented by the formula: —$B^9$-$(A^9)_{n*9}$ wherein $A^9$ is a group represented by Formula (4) or a group represented by Formula (19); $B^9$ is the same as the definition of $B^1$; n*9 is an integer of 1 or more; and when a plurality of $A^9$ are present, each $A^9$ may be the same as or different from each other.

Examples of the substituent that an alkylene group having 1 to 50 carbon atom(s), an alkyleneoxy group having 1 to 50 carbon atom(s), an imino group, a silylene group and an ethenylene group optionally have include a substituent similar to the substituent shown as examples in the description of $R^1$ described above. When the alkylene group having 1 to 50 carbon atom(s), the alkyleneoxy group having 1 to 50 carbon atom(s), the imino group, the silylene group or the ethenylene group has a plurality of substituents, each substituent may be the same as or different from each other.

[1.7.2. Description of $R^{15}$]

$R^{15}$ is a monovalent group including a group represented by Formula (21).

$R^{15}$ may also be a monovalent group consisting of the group represented by Formula (21). In other words, the group represented by Formula (21) may be directly bonded to $Ar^7$.

$R^{15}$ may be a group partially including the group represented by Formula (21). In other words, the group represented by Formula (21) may be bonded to $Ar^7$ through the group (the substituent also has the same examples as the group) or the atom shown as examples in the description of $R^{14}$ described below.

For example, $R^{15}$ is a group represented by Formula (21) or a group represented by the formula: —$B^8$-$(A^8)_{n*8}$ wherein $A^8$ is a group represented by Formula (21); $B^8$ is the same as the definition of $B^1$; n*8 is an integer of 1 or more; and when a plurality of $A^8$ are present, each $A^8$ may be the same as or different from each other.

[1.7.3. Description of $Ar^7$]

In Formula (22), $Ar^7$ is a (2+n11+n12)-valent aromatic group that optionally has a substituent other than $R^{14}$ or $R^{15}$.

$Ar^7$ optionally has a substituent other than $R^{14}$ or $R^{15}$. Examples of the substituent include a substituent similar to the substituent shown as examples in the description of the substituent shown as examples in the description of $R^1$ described above. When $Ar^7$ has the substituents, each substituent may be the same as or different from each other.

In terms of easy synthesis of raw material monomers, the substituent other than $R^{14}$ or $R^{15}$ that $Ar^7$ has is preferably an alkyl group, an alkoxy group, an aryl group, an aryloxy group, a carboxyl group, a substituted carboxyl group, or a halogen atom.

In Formula (22), n11 is an integer of 1 or more, preferably an integer from 1 to 4, and more preferably an integer from 1 to 3.

In Formula (22), n12 is an integer of 1 or more, preferably an integer from 1 to 4, and more preferably an integer from 1 to 3.

Examples of the (2+n11+n12)-valent aromatic group represented by $Ar^7$ in Formula (22) include a (2+n11+n12)-valent aromatic hydrocarbon group and a (2+n11+n12)-valent aromatic heterocyclic group, and a (2+n11+n12)-valent aromatic group consisting of only carbon atoms or a (2+n11+n12)-valent aromatic group consisting of carbon atoms and one or more atoms selected from the group consisting of a hydrogen atom, a nitrogen atom, and an oxygen atom are preferable. Examples of the (2+n11+n12)-valent aromatic group include a (2+n11+n12)-valent group in which (2+n11+n12) hydrogen atoms are removed from a monocyclic aromatic ring such as a benzene ring, a pyridine ring, a 1,2-diazine ring, a 1,3-diazine ring, a 1,4-diazine ring, a furan ring, a pyrrole ring, a pyrazole ring and an imidazole ring; a (2+n11+n12)-valent group in which (2+n11+n12) hydrogen atoms are removed from a condensed polycyclic aromatic ring having a structure formed by condensing two or more of the monocyclic aromatic ring; a (2+n11+n12)-valent group in which (2+n11+n12) hydrogen atoms are removed from an aromatic ring assembly having a structure linking two or more aromatic rings selected from the group consisting of the monocyclic aromatic ring and the condensed polycyclic aromatic ring through a single bond, an ethenylene group, or an ethynylene group; and a (2+n11+n12)-valent group in which (2+n11+n12) hydrogen atoms are removed from a bridged polycyclic aromatic ring that includes two or more of aromatic rings selected from the monocyclic aromatic ring, the condensed polycyclic aromatic ring, and the aromatic ring assembly and has a structure bridging the adjacent two aromatic rings among the aromatic rings by a divalent group such as a methylene group, an ethylene group, and a carbonyl group or a methanetetrayl group.

In the condensed polycyclic aromatic ring, the number of condensed monocyclic aromatic rings is preferably 2 to 4, more preferably 2 to 3, and further preferably 2, in terms of solubility of the polymer compound. In the aromatic ring assembly, the number of linked aromatic rings is preferably 2 to 4, more preferably 2 to 3, and further preferably 2, in terms of solubility of the polymer compound. In the bridged polycyclic aromatic ring, the number of bridged aromatic rings is preferably 2 to 4, more preferably 2 to 3, and further preferably 2, in terms of solubility of the polymer compound.

Examples of the monocyclic aromatic ring include the rings represented by Formulas 1 to 5 and Formulas 7 to 10 shown as examples in the description of the structural unit represented by Formula (1).

Examples of the condensed polycyclic aromatic ring include the rings represented by Formulas 13 to 33 shown as examples in the description of the structural unit represented by Formula (1).

Examples of the aromatic ring assembly include the rings represented by Formulas 34 to 42 shown as examples in the description of the structural unit represented by Formula (1).

Examples of the bridged polycyclic aromatic ring include the rings represented by Formulas 43 to 51 shown as examples in the description of the structural unit represented by Formula (1).

In terms of electric conductivity of the polymer compound and easy synthesis of raw material monomers, the (2+n11+n12)-valent aromatic group represented by $Ar^7$ is preferably a group in which (2+n11+n12) hydrogen atoms are removed from the ring represented by any one of Formulas 1 to 5, 7 to 10, Formula 13 to 15, 19 to 25, 31 to 35, 43, 46 to 48, and 51, more preferably the group in which (2+n11+n12) hydrogen atoms are removed from the ring represented by any one of Formulas 1, 2, 5, 4, 13 to 15, 19, 21, 23, 31, 32, 33, 43, 46, 47, and 51, and further preferably the group in which (2+n11+n12) hydrogen atoms are removed from the ring represented by any one of Formulas 1, 13 to 15, 21, 23, 33, 43, 46, and 47.

In terms of electric conductivity of the polymer compound and easy synthesis of raw material monomers, the (2+n11+n12)-valent aromatic group represented by $Ar^7$ is preferably a group in which (n11+n12) hydrogen atoms are removed from a divalent group represented by any one of Formulas 1', 3', 13' to 15', 21', 23', 33', 43', 46' and 47' that is shown as an example in the description for the structural unit represented by Formula (1).

[1.8. Examples of Each Structural Unit]

[1.8.1. Examples of Structural Unit Represented by Formula (1)]

Examples of the structural unit represented by Formula (1) include a structural unit represented by the following formulas that optionally has a substituent. In terms of easy synthesis of the polymer compound and electron transport properties, the structural unit is preferably a structural unit represented by Formula $52a^1$, $55a^1$, $55b^1$, $55c^1$, $56b^1$, $57b^1$, $58a^1$, $59b^1$, $60b^1$, $61a^1$, $61b^1$, $61c^1$, or $63b^1$. Examples of the substituent include a substituent similar to the substituent shown as examples in the description of the substituent in the description of $R^1$ described above. When a plurality of substituents are present in one formula, each substituent may be the same as or different from each other. In the following formulas, $R^2$, $Q^1$, n2, $Y^1$, $M^1$, a1, and m1 are the same as the corresponding definitions above. When each of a plurality of $R^2$, $Q^1$, n2, $Y^1$, $M^1$, a1, and m1 is present in one formula, each of the plurality of $R^2$, $Q^1$, n2, $Y^1$, $M^1$, a1, and m1 may be the same as or different from each other.

[Chemical Formula 42]

$52a^1$

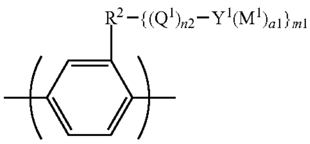

$52b^1$

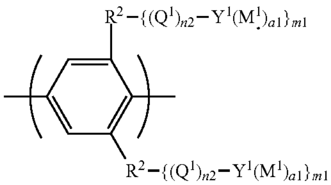

$53a^1$

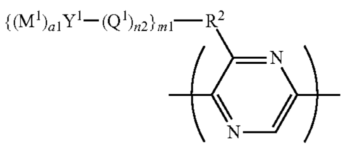

$53b^1$

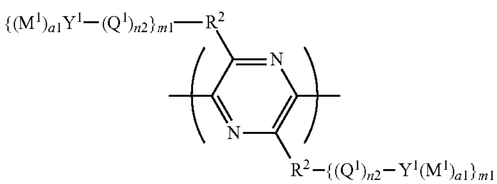

$54a^1$

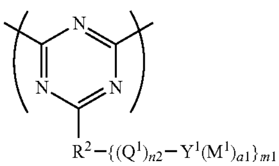

$55a^1$

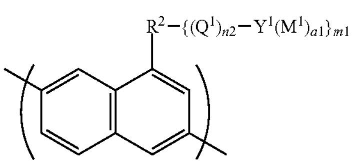

$55b^1$

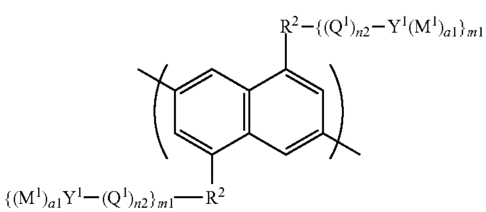

-continued $55c^1$

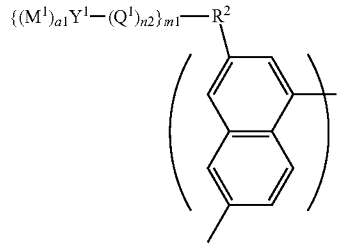

$56a^1$

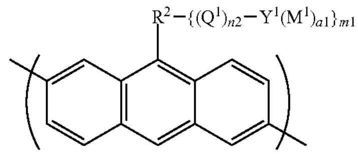

$56b^1$

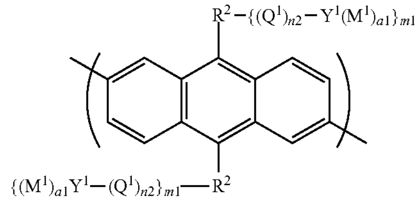

$57a^1$

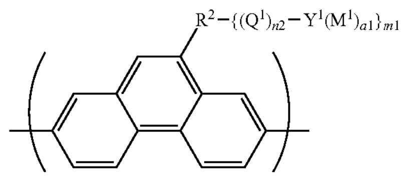

$57b^1$

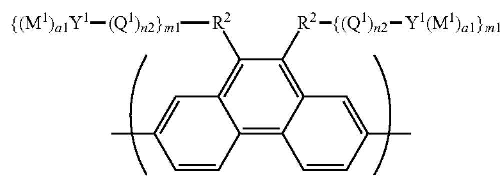

$58a^1$

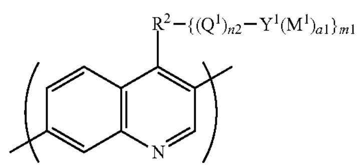

$58b^1$

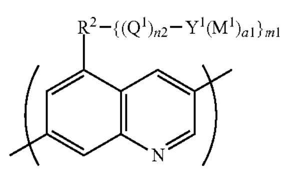

$58c^1$

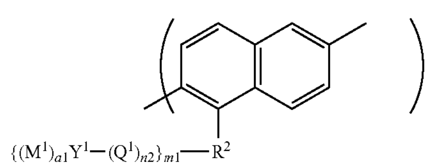

-continued

59a[1]

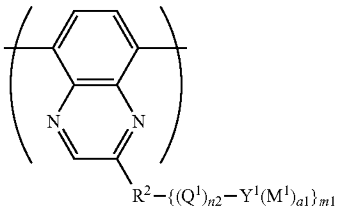

59b[1]

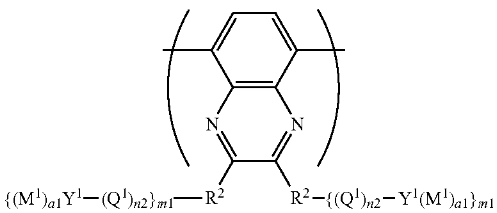

[Chemical Formula 43]

60a[1]

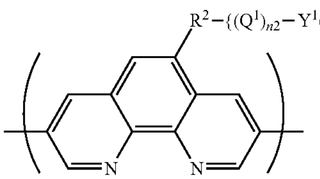

60b[1]

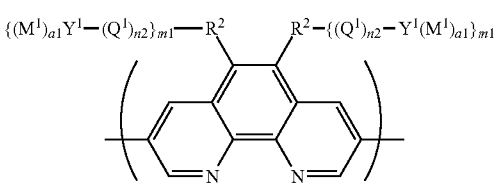

61a[1]

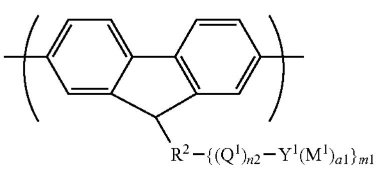

61b[1]

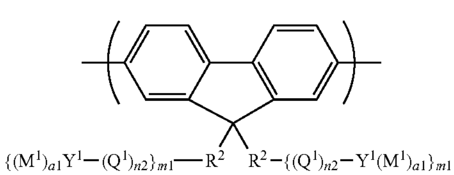

61c[1]

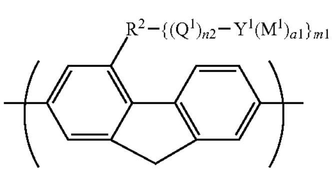

-continued

62a[1]

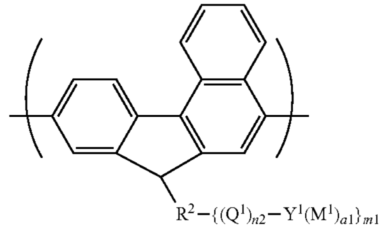

62b[1]

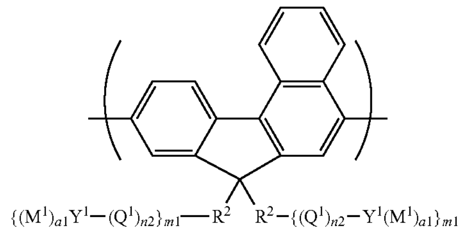

63a[1]

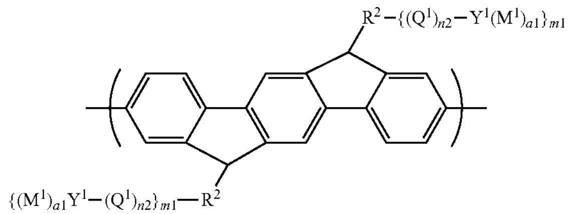

63b[1]

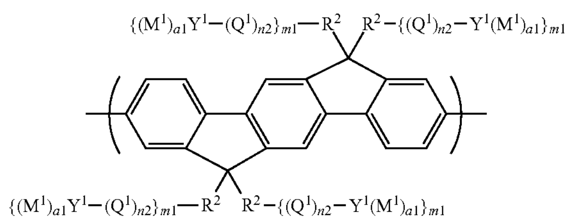

In the formulas described above, in terms of easy synthesis, $R^2$ is preferably a direct bond or a group in which m1 hydrogen atom(s) is(are) removed from an aryl group having 6 to 30 carbon atoms that optionally has a substituent. The aryl group having 6 to 30 carbon atoms that optionally has a substituent is preferably a phenyl group, a 1-naphthyl group, a 2-naphthyl group, a 1-anthracenyl group, a 2-anthracenyl group, a 9-anthracenyl group, or a group among these groups in which at least one hydrogen atom is substituted with a substituent.

Examples of the substituent include a substituent similar to the substituent shown as examples in the description of $R^1$ described above. When $R^2$ has a plurality of substituents, each substituent may be the same as or different from each other.

Examples of the structural unit represented by Formula (1) may also include a structural unit represented by the following formulas that optionally has a substituent. Examples of the substituent include a substituent similar to the substituent shown as examples in the description of the substituent in the description of $R^1$ described above. When a plurality of substituents are present in one formula, each substituent may be the same as or different from each other. In the following formulas, M is the same as the corresponding definition above. When a plurality of M are present in one formula, each M may be the same as or different from each other.

[Chemical Formula 44]
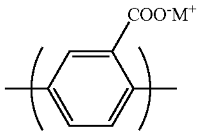
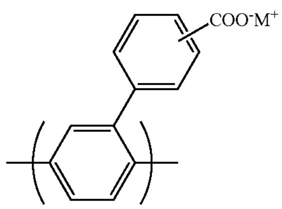
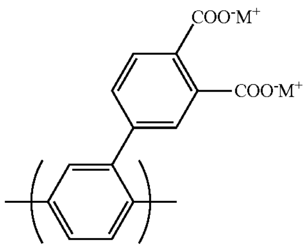
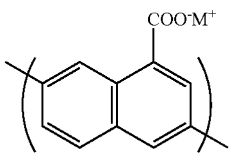
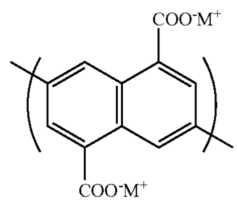
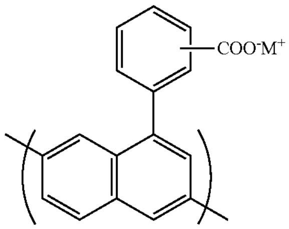
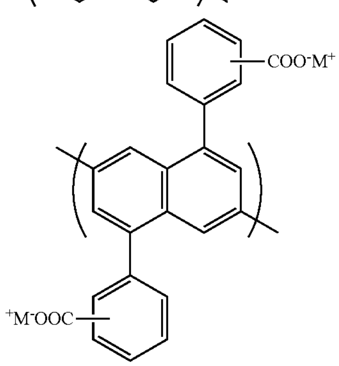
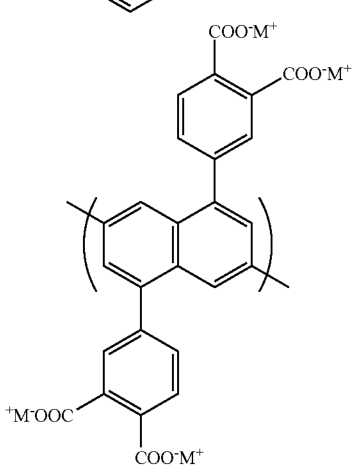
-continued
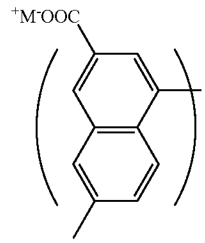
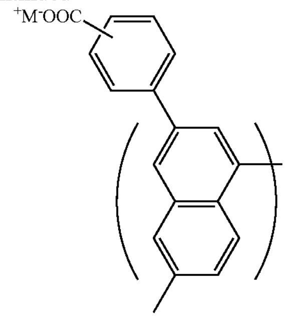
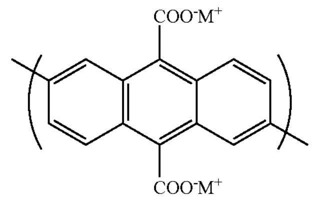
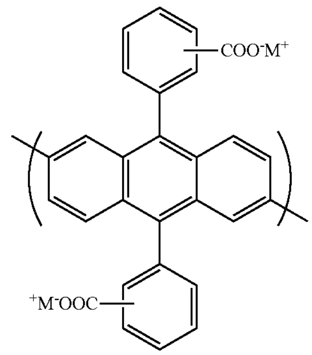
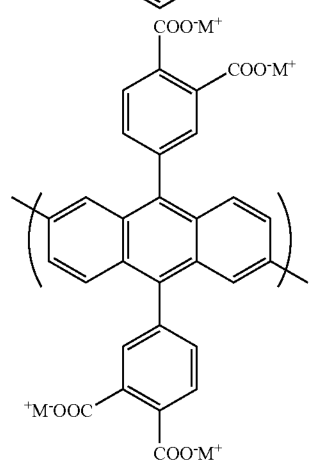
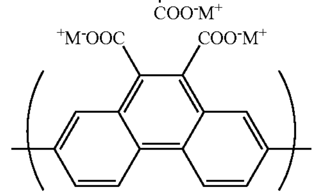
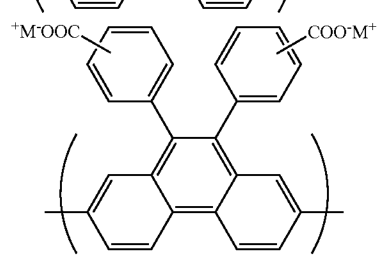

-continued
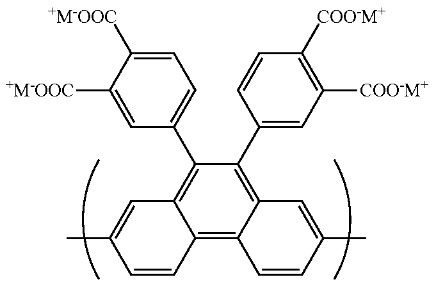
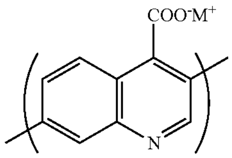
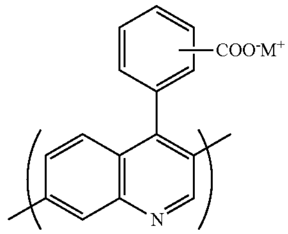
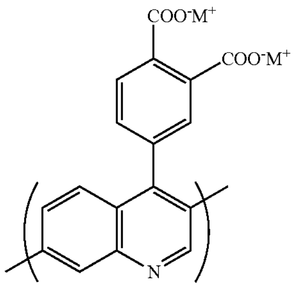
[Chemical Formula 45]
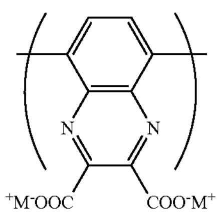
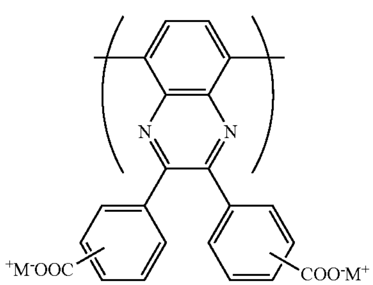
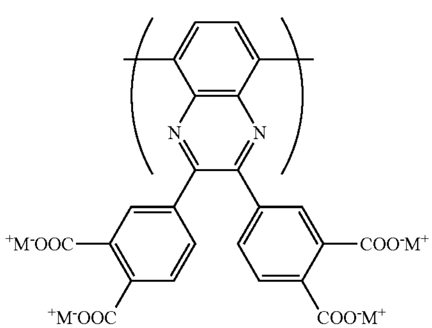
-continued
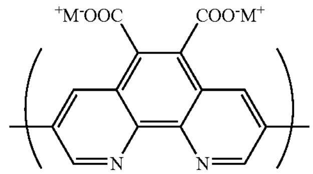
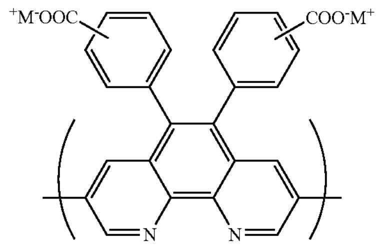
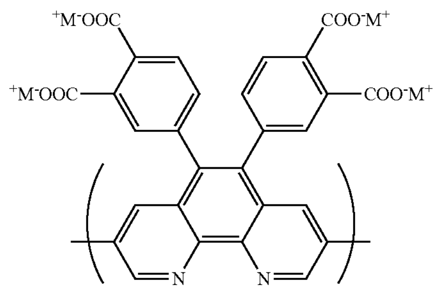
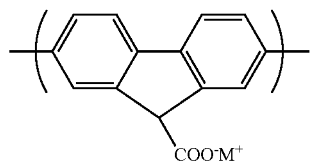
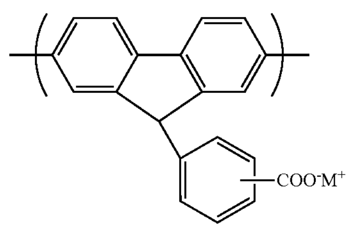
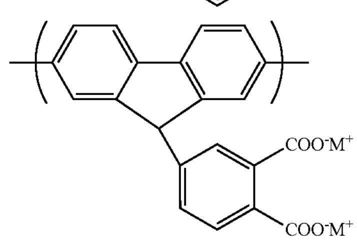
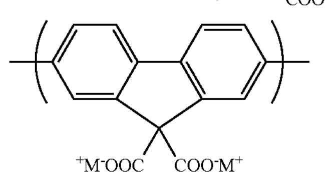
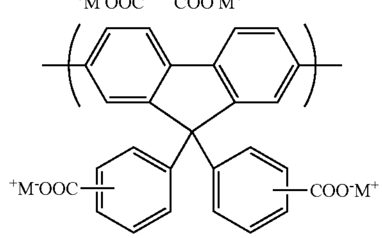

-continued
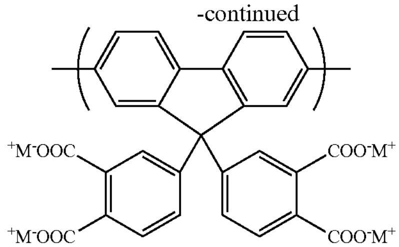
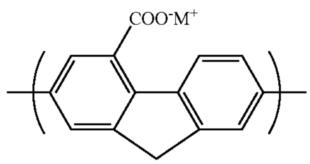
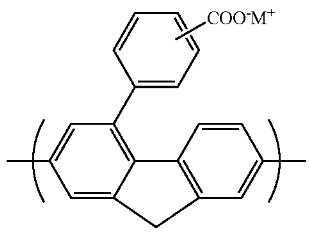
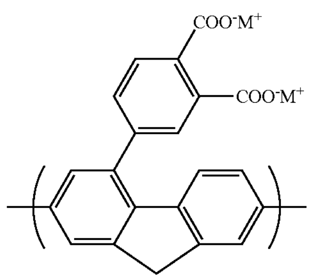
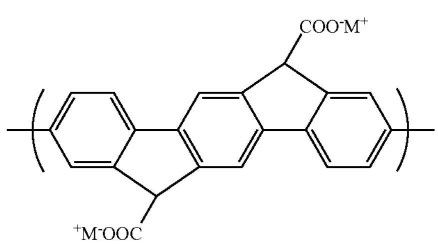
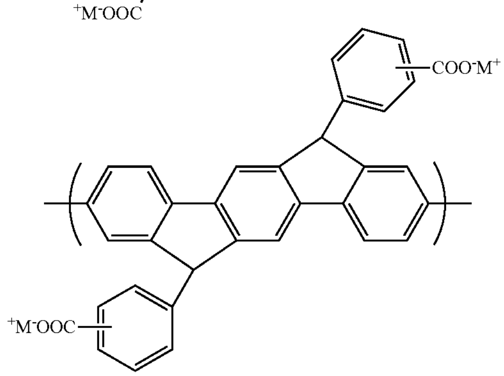
-continued
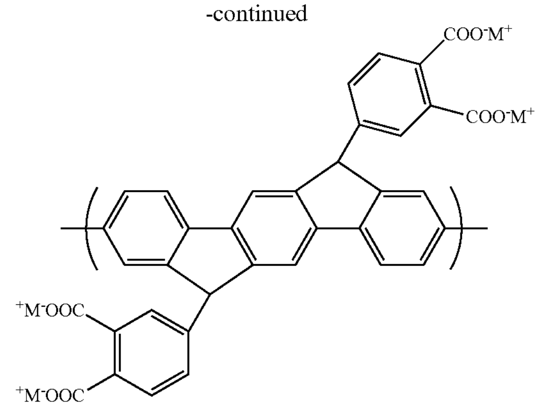
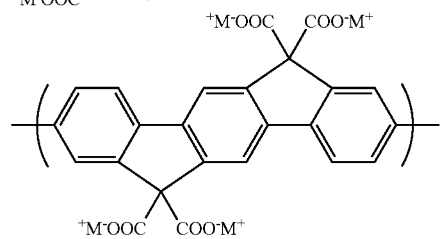
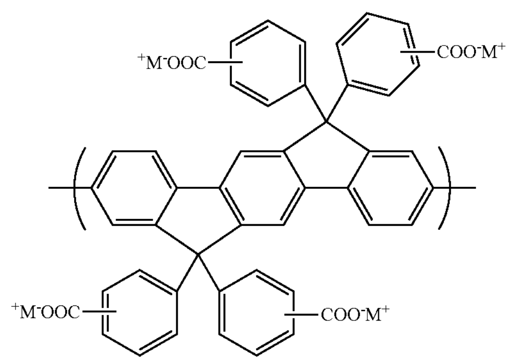
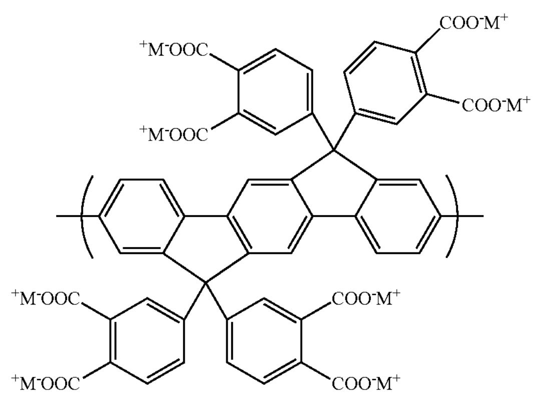
[Chemical Formula 46]
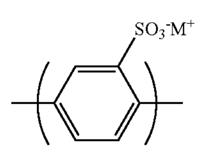
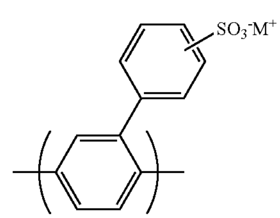

-continued
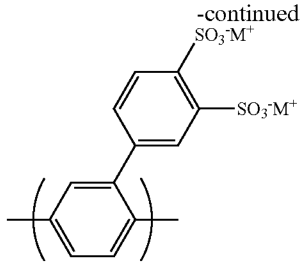
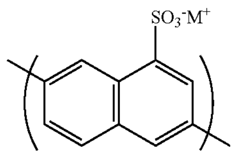
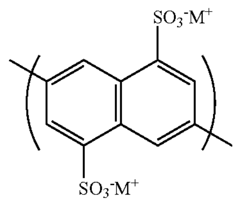
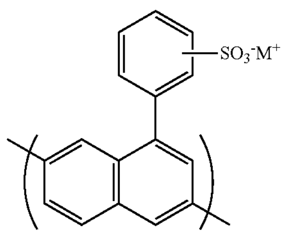
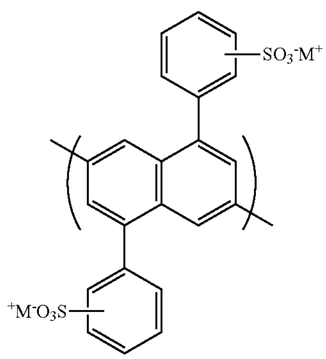
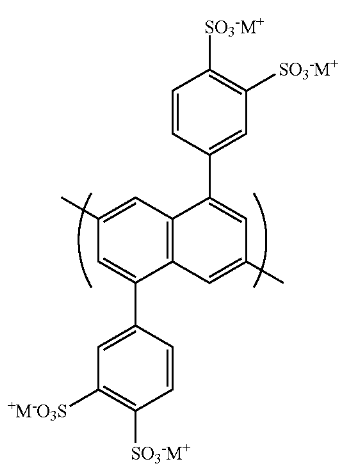
-continued
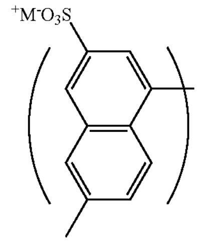
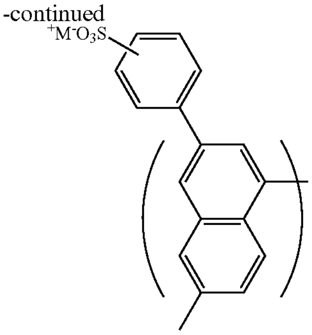
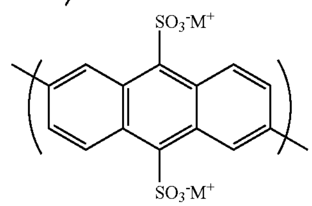
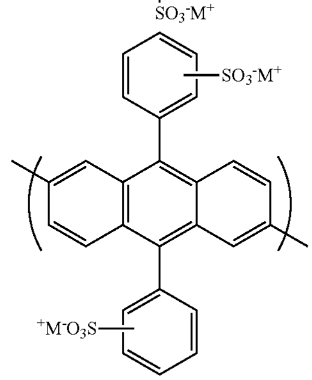
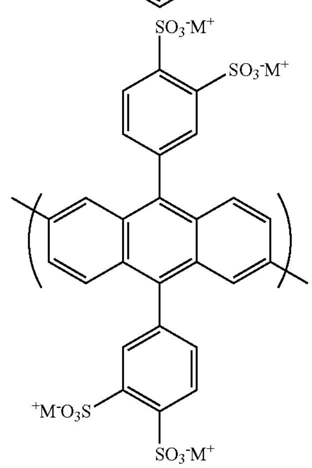
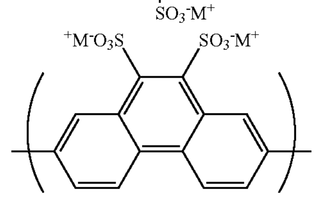
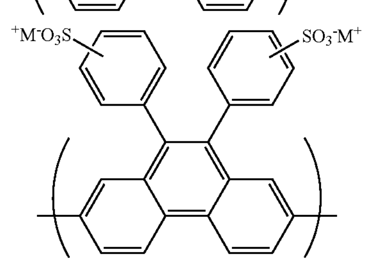

-continued
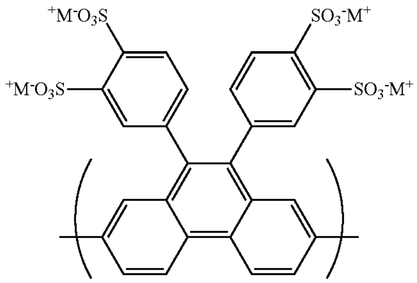
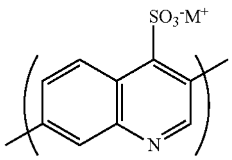
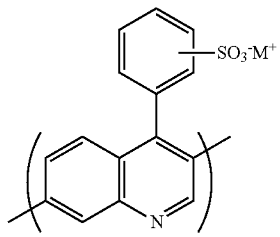
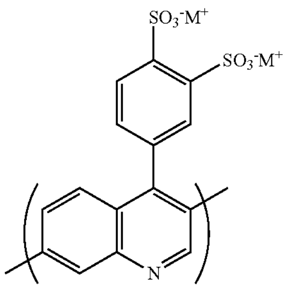
[Chemical Formula 47]
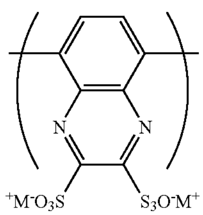
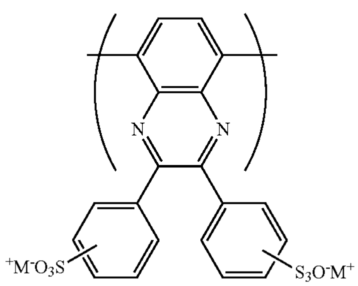
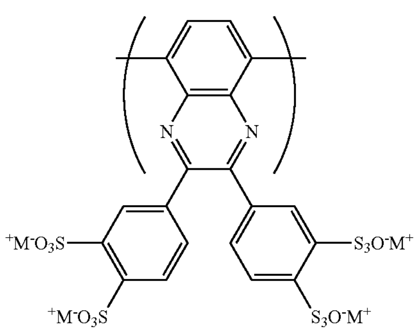
-continued
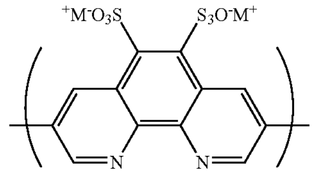
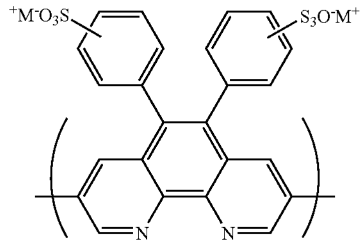
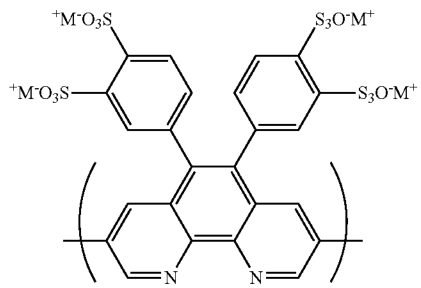
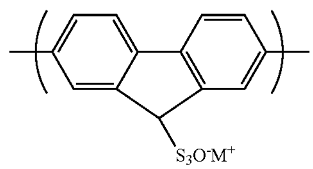
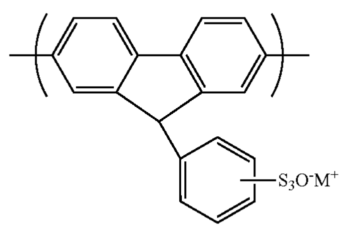
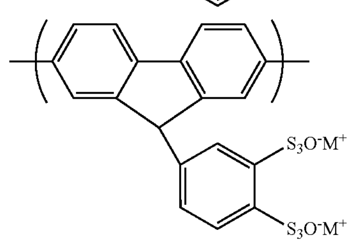
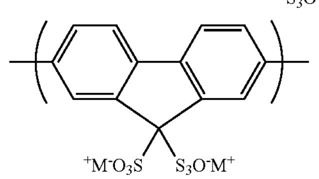
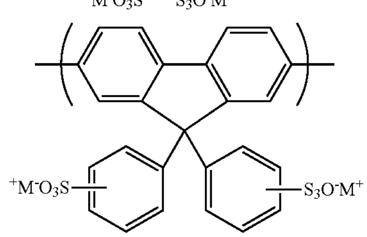

-continued

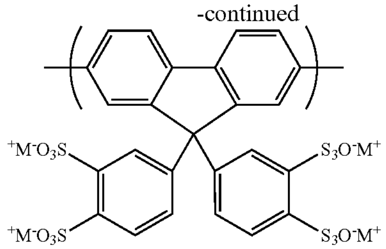

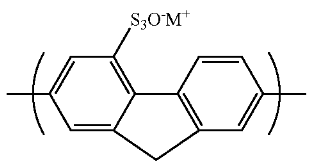

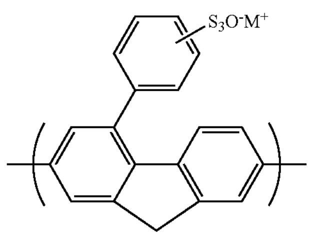

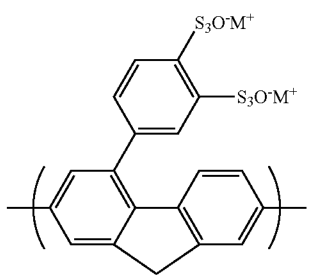

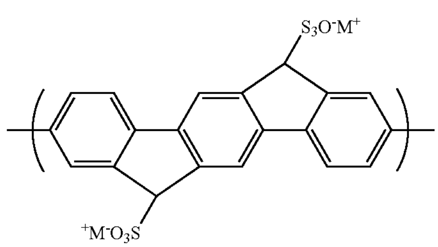

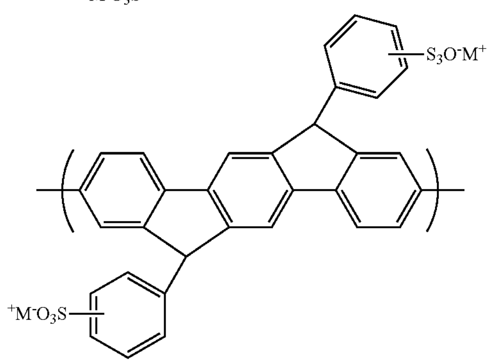

-continued

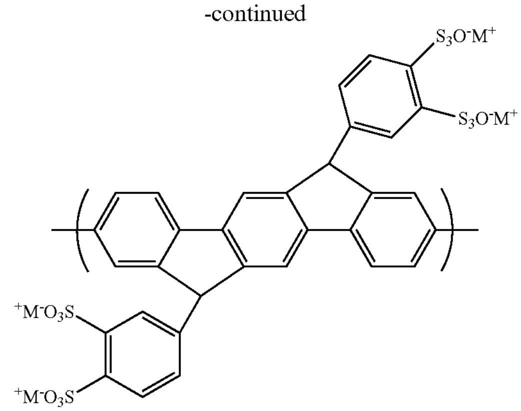

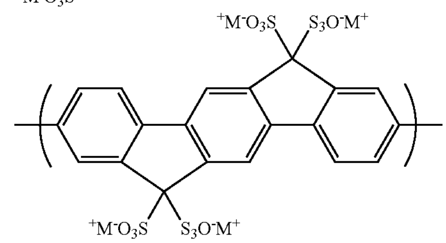

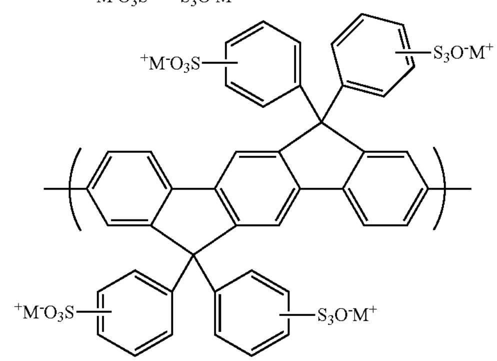

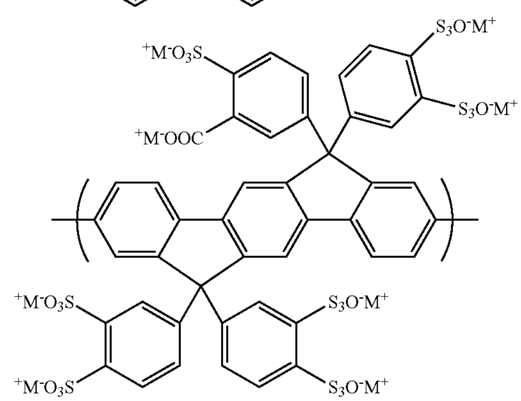

[1.8.2. Examples of Structural Unit Represented by Formula (3)]

Examples of the structural unit represented by Formula (3) include a structural unit represented by the following formulas that optionally has a substituent. In terms of easy synthesis of the polymer compound and electron transport properties, the structural unit is preferably a structural unit represented by Formula $52a^2$, $55a^2$, $55b^2$, $55c^2$, $56b^2$, $57b^2$, $58a^2$, $59b^2$, $60b^2$, $61a^2$, $61b^2$, $61c^2$, or $63b^2$. Examples of the substituent include a substituent similar to the substituent shown as examples in the description of the substituent in the description of $R^1$ described above. When a plurality of substituents are present in one formula, each substituent may be the same as or different from each other. In the following formulas, $R^4$, $Q^2$, n4, $Y^2$, $M^2$, a2, and m2 are the same as the corresponding definitions above. When each of a plurality of $R^4$, $Q^2$, n4, $Y^2$, $M^2$, and m2 is present in one formula, each of the plurality of $R^4$, $Q^2$, n4, $Y^2$, $M^2$, and m2 may be the same as or different from each other.

[Chemical Formula 48]

52a²

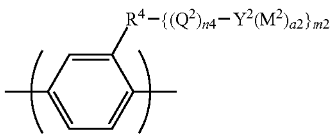

52b²

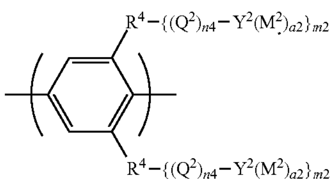

53a²

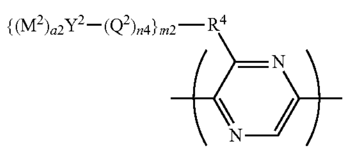

53b²

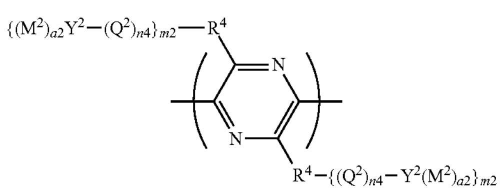

54a²

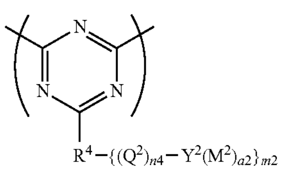

55a²

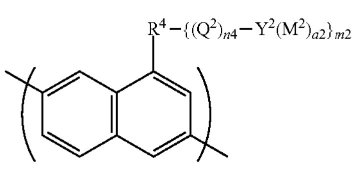

55b²

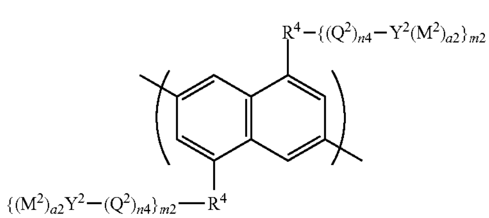

-continued

55c²

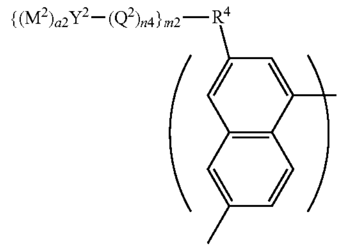

56a²

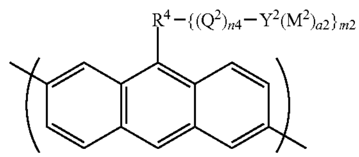

56b²

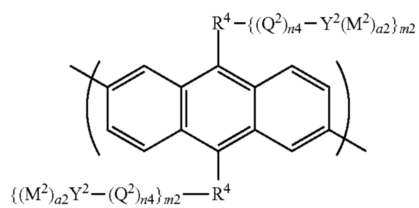

57a²

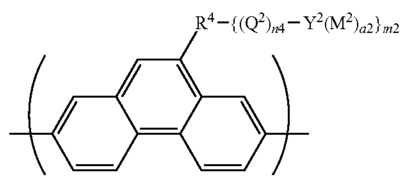

57b²

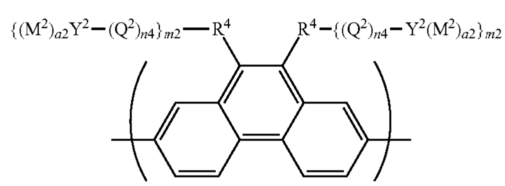

58a²

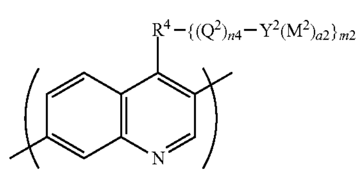

58b¹

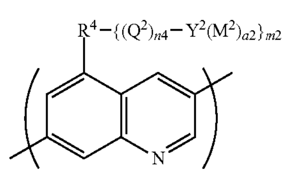

58c²

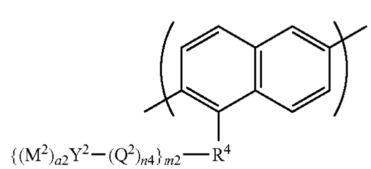

-continued

59a²

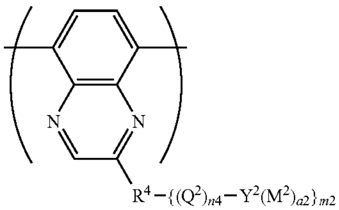

59b²

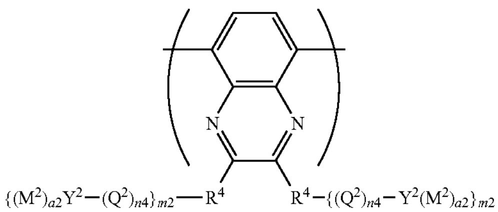

[Chemical Formula 49]

60a²

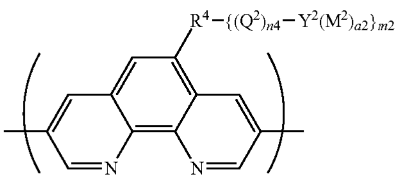

60b²

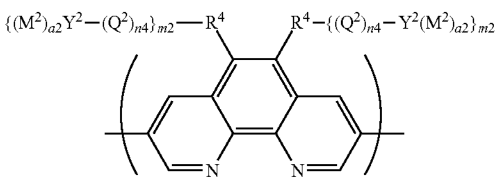

61a²

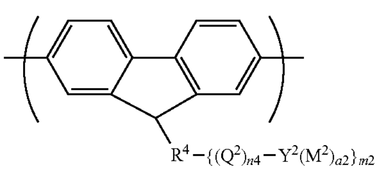

61b²

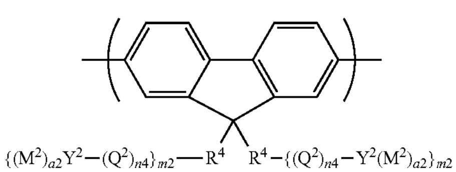

61c²

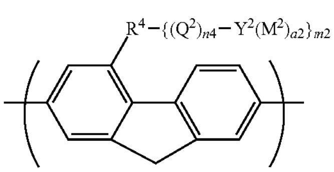

-continued

62a²

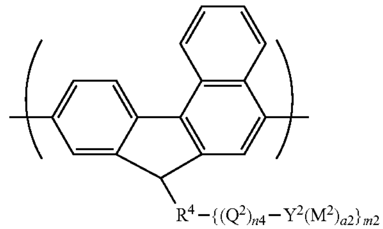

62b²

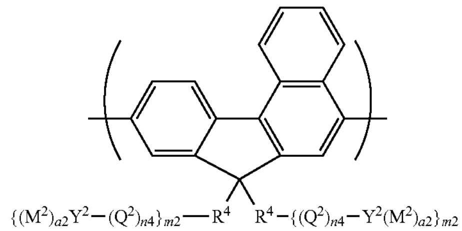

63a²

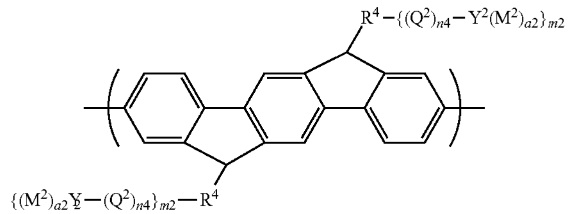

63b²

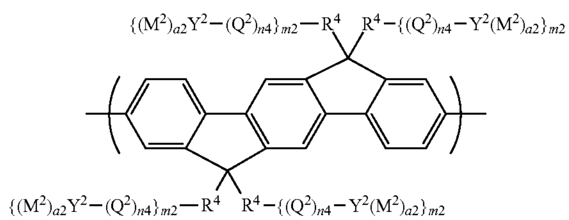

In the formulas described above, in terms of easy synthesis, $R^4$ is preferably a direct bond or a group in which m2 hydrogen atom(s) is(are) removed from an aryl group having 6 to 30 carbon atoms that optionally has a substituent. The aryl group having 6 to 30 carbon atoms that optionally has a substituent is preferably a phenyl group, a 1-naphthyl group, a 2-naphthyl group, a 1-anthracenyl group, a 2-anthracenyl group, a 9-anthracenyl group, or a group among these groups in which at least one hydrogen atom is substituted with a substituent.

Examples of the substituent include a substituent similar to the substituent shown as examples in the description of $R^1$ described above. When $R^4$ has a plurality of substituents, each substituent may be the same as or different from each other.

Examples of the structural unit represented by Formula (3) may also include a structural unit represented by the following formulas that optionally has a substituent. Examples of the substituent include a substituent similar to the substituent shown as examples in the description of the substituent in the description of $R^1$ described above. When a plurality of substituents are present in one formula, each substituent may be the same as or different from each other. In the following formulas, X is the same as the corresponding definition above. When a plurality of X are present in one formula, each X may be the same as or different from each other.

[Chemical Formula 50]
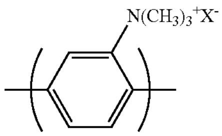
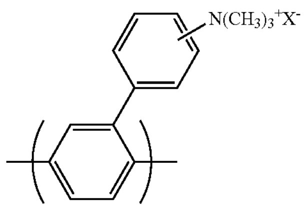
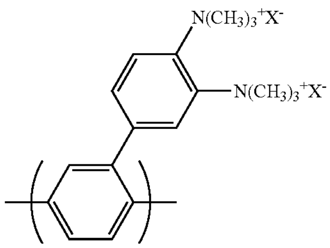
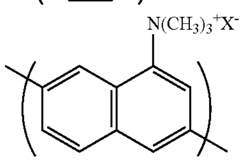
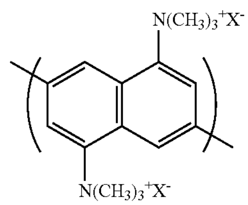
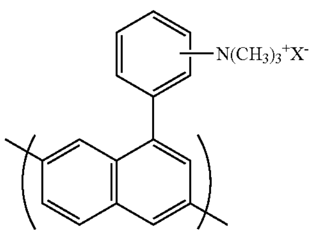
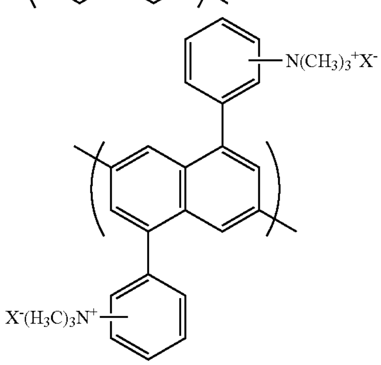
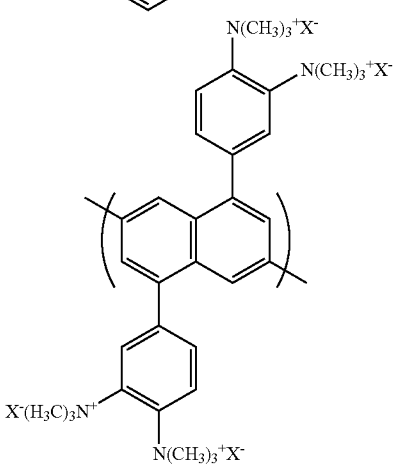
-continued
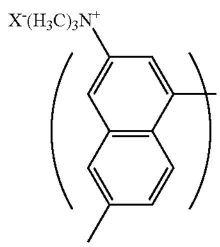
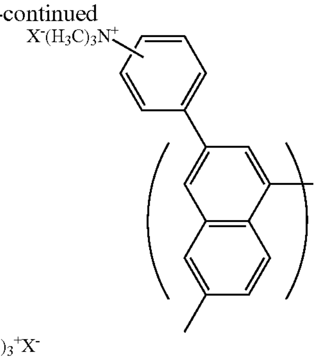
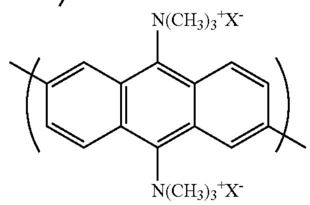
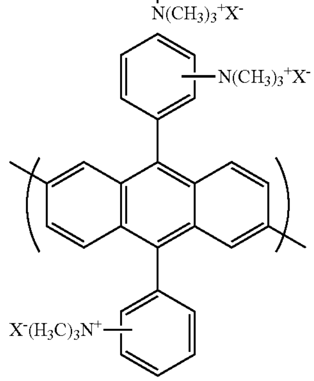
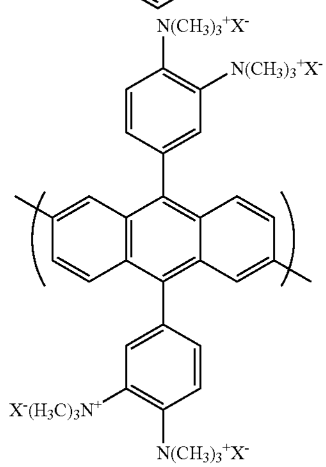
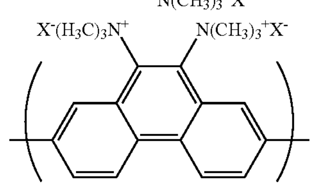
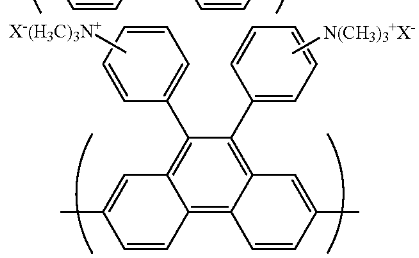

-continued
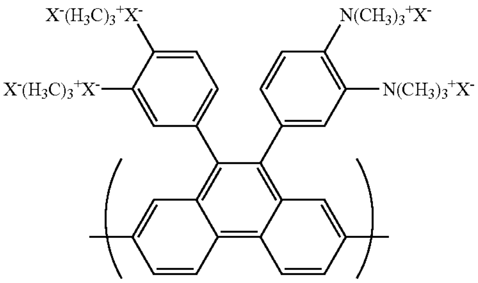
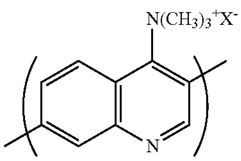
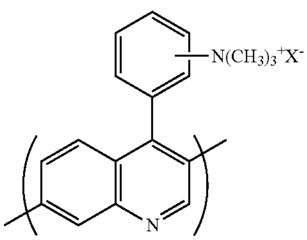
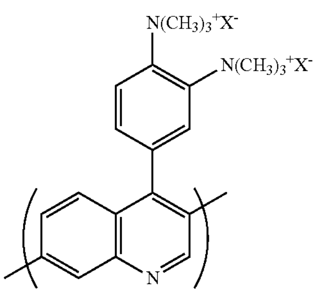
[Chemical Formula 51]
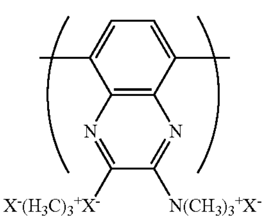
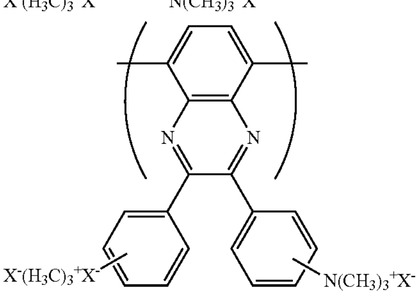
-continued
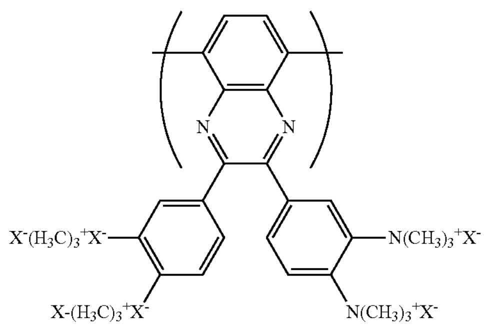
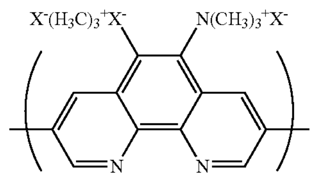
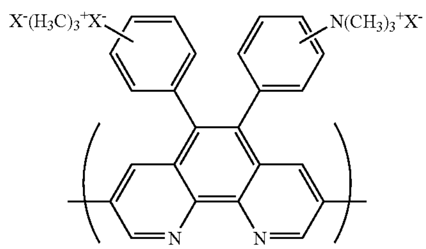
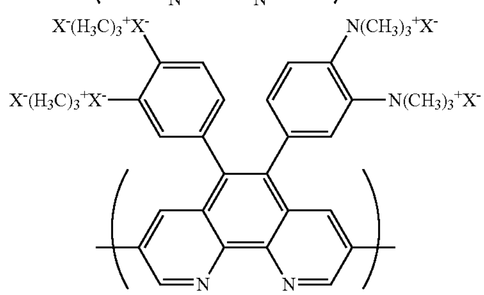
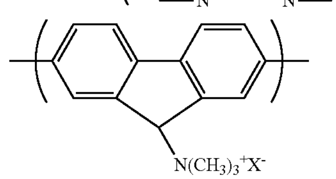
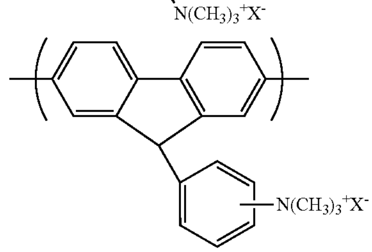
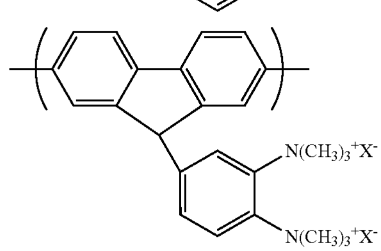

-continued
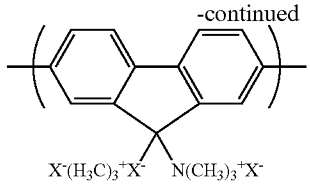
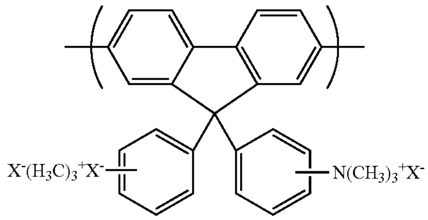
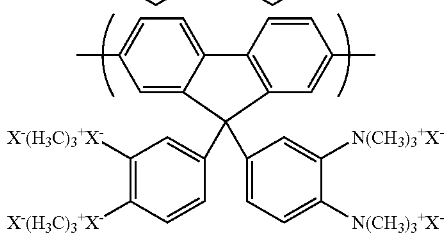
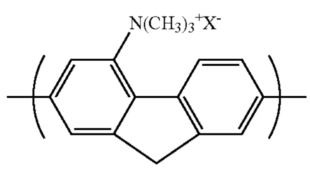
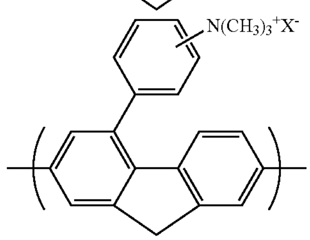
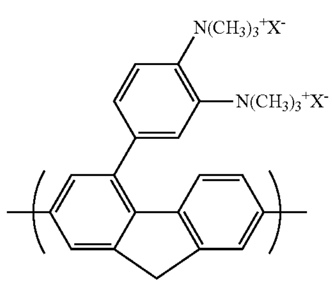
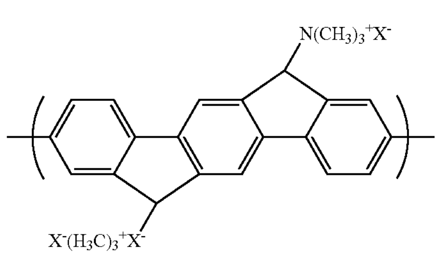
-continued
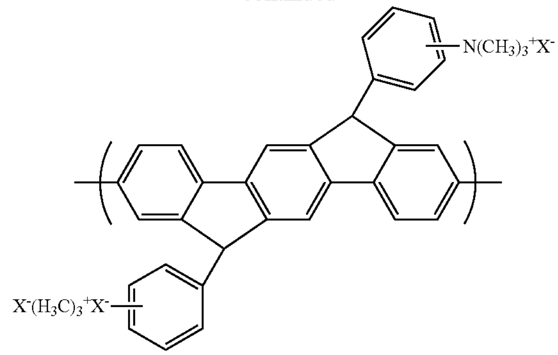
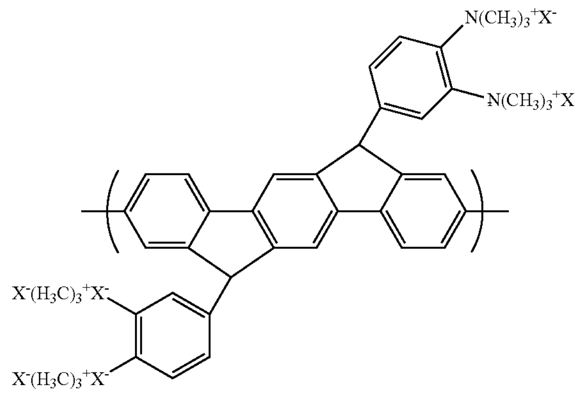
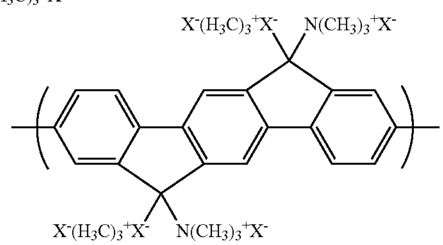
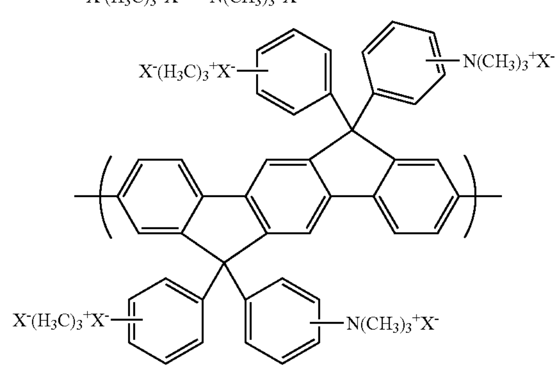
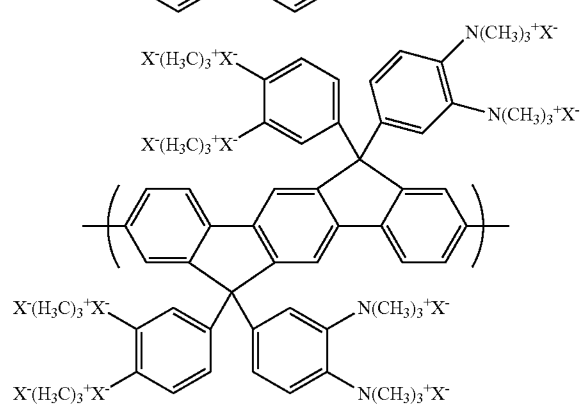

-continued
[Chemical Formula 52]
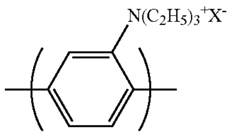
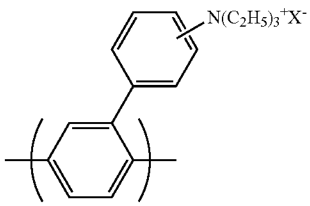
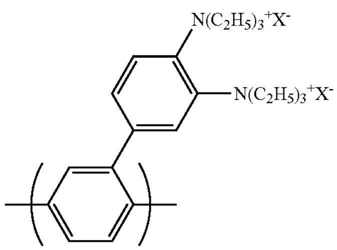
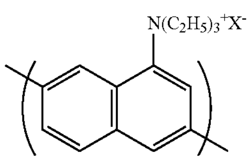
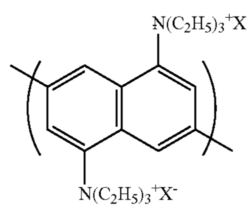
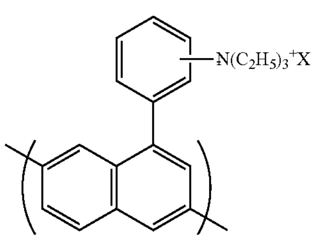
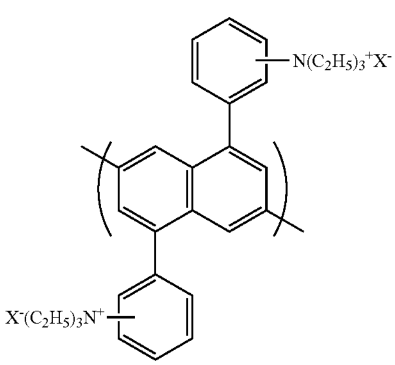
-continued
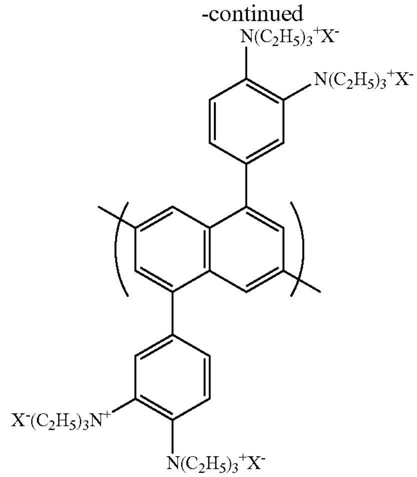
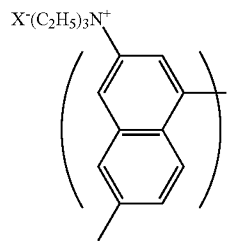
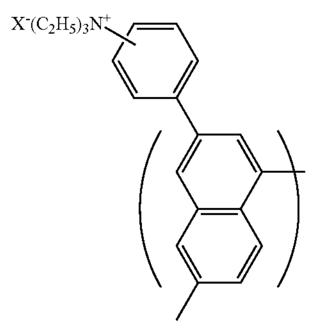
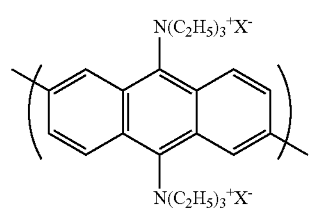
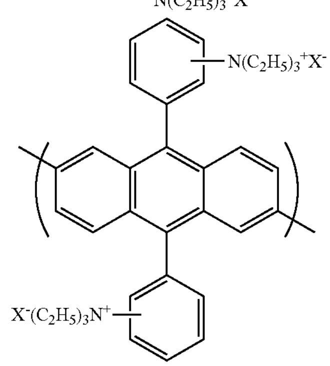

-continued
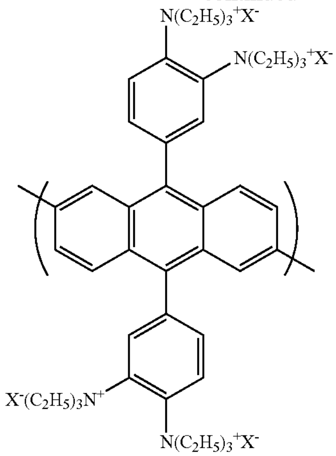
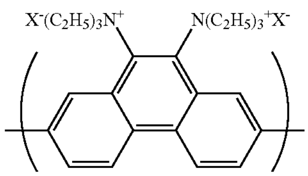
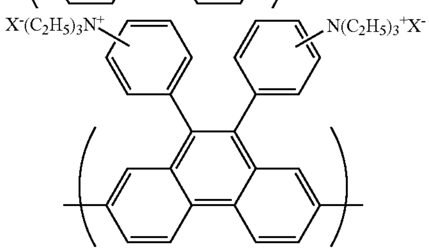
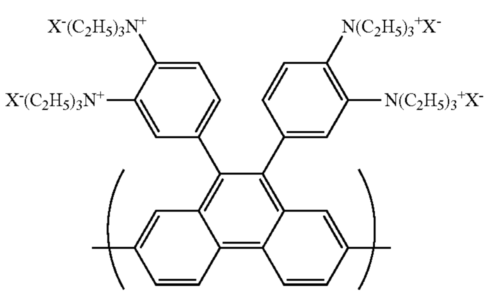
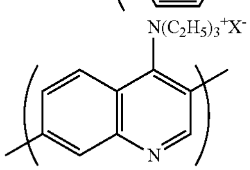
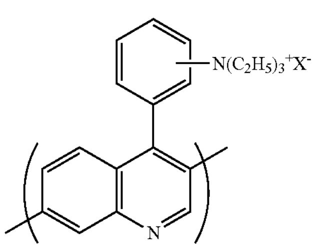
-continued
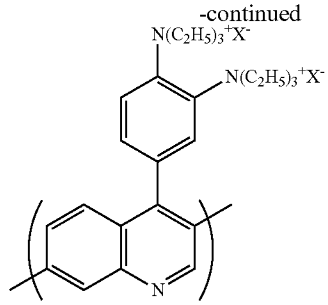
[Chemical Formula 53]
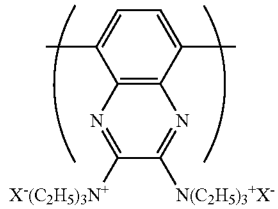
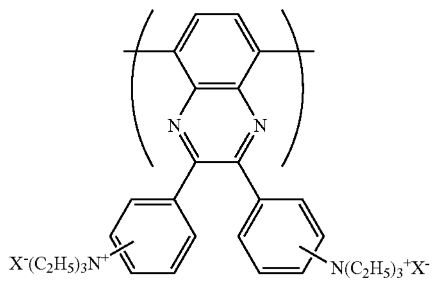
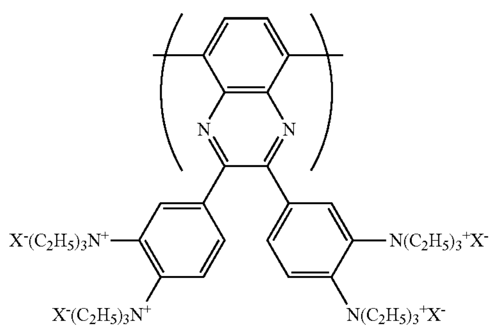
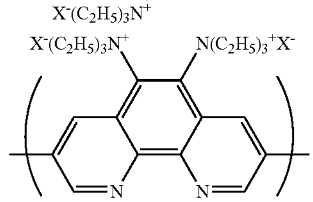
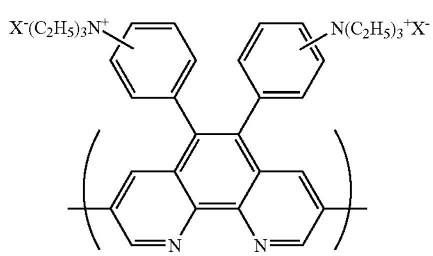

-continued
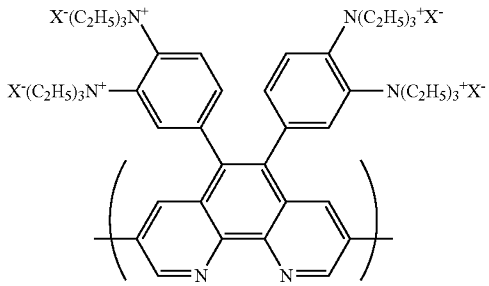
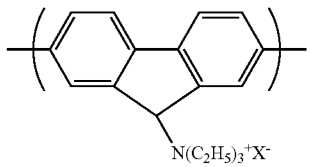
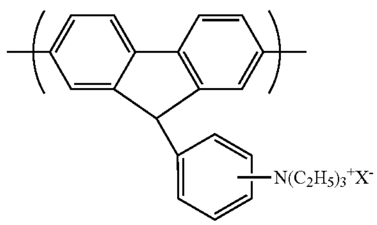
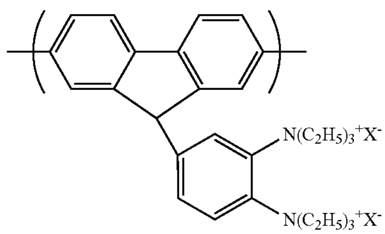
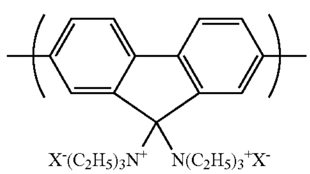
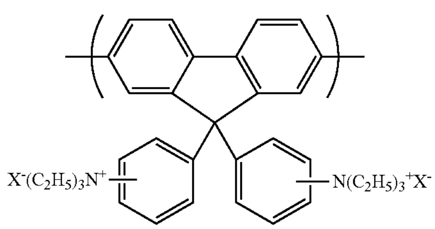
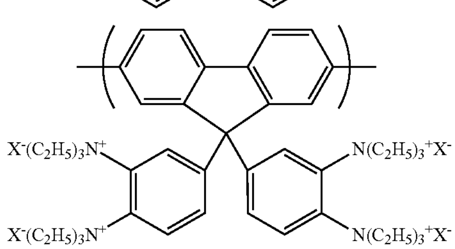
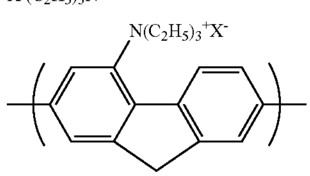
-continued
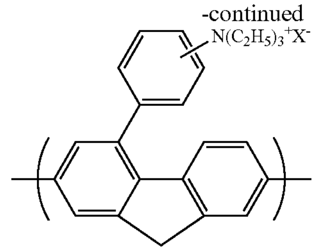
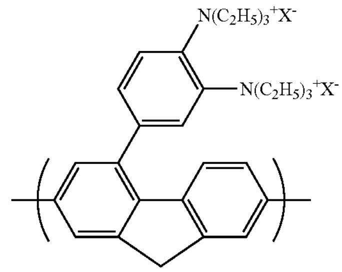
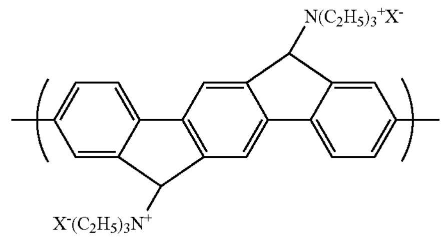
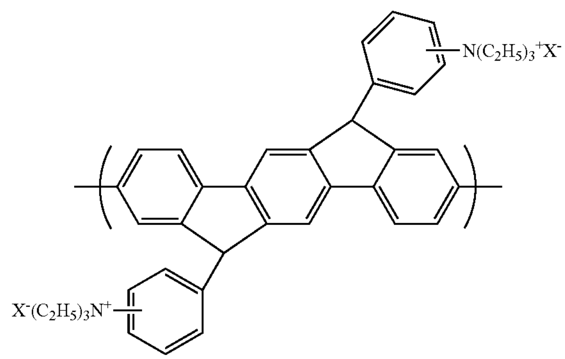
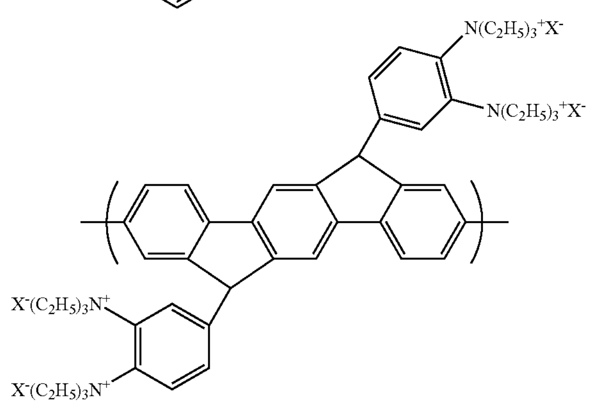
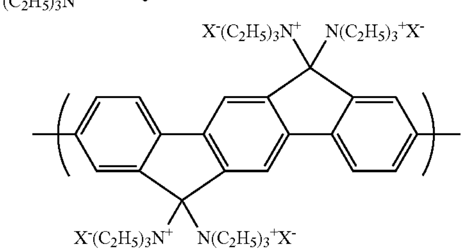

-continued

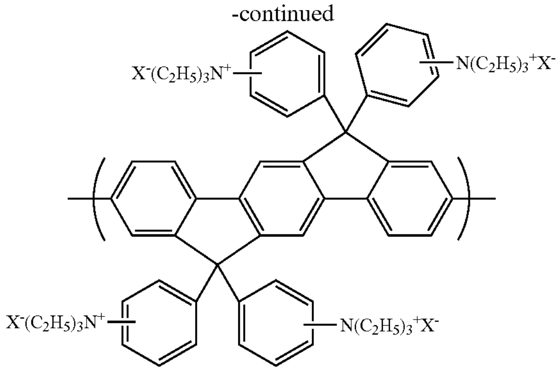

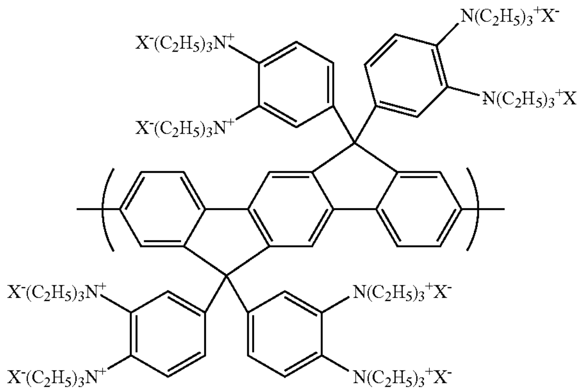

[1.8.3. Examples of Structural Unit Represented by Formula (5)]

Examples of the structural unit represented by Formula (5) include a structural unit represented by the following formulas that optionally has a substituent. In terms of easy synthesis of the polymer compound and electron transport properties, the structural unit is preferably a structural unit represented by Formula $52a^3$, $55a^3$, $55b^3$, $55c^3$, $56b^3$, $57b^3$, $58a^3$, $59b^3$, $60b^3$, $61a^3$, $61b^3$, $61c^3$, or $63b^3$. Examples of the substituent include a substituent similar to the substituent shown as examples in the description of the substituent in the description of $R^1$ described above. When a plurality of substituents are present in one formula, each substituent may be the same as or different from each other. In the following formulas, $R^6$, $Q^3$, n6, $Y^3$, and m3 are the same as the corresponding definitions above. When each of a plurality of $R^6$, $Q^3$, n6, $Y^3$, and m3 is present in one formula, each of the plurality of $R^6$, $Q^3$, n6, $Y^3$, and m3 may be the same as or different from each other.

[Chemical Formula 54]

$52a^3$

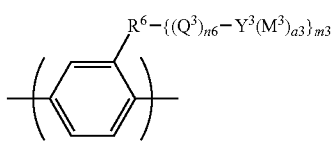

$52b^3$

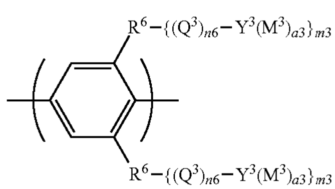

-continued $53a^3$

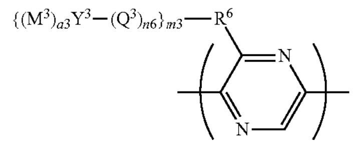

$53b^3$

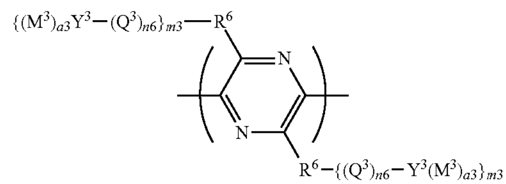

$54a^3$

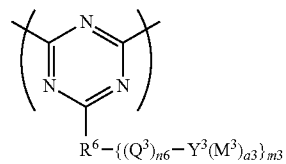

$55a^3$

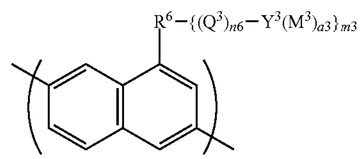

$55b^3$

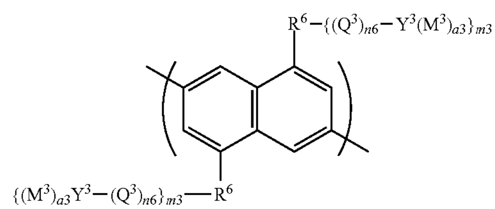

$55c^3$

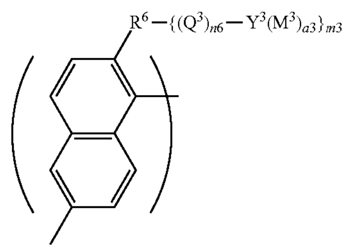

$56a^3$

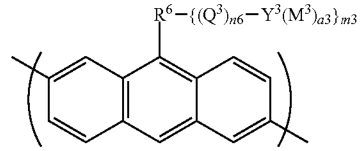

$56b^3$

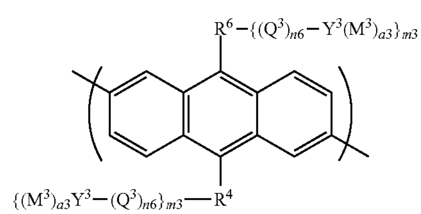

-continued
57a3
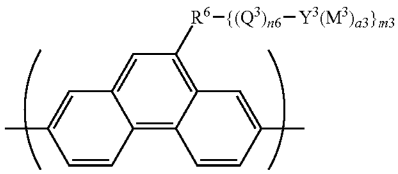
57b3
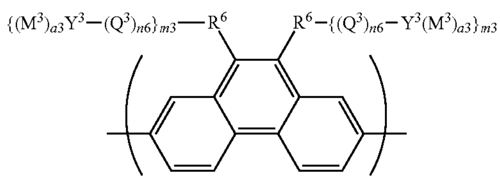
58a3
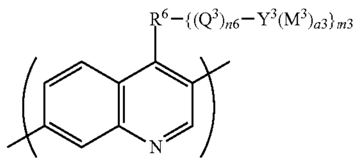
58b3
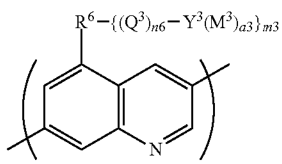
58c3
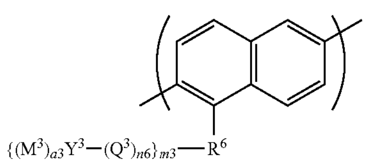
59a3
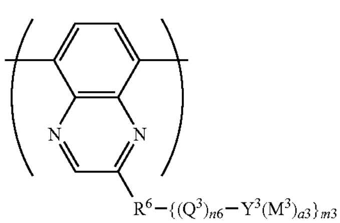
59b3
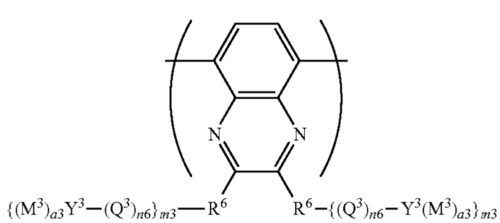
[Chemical Formula 55]
60a3
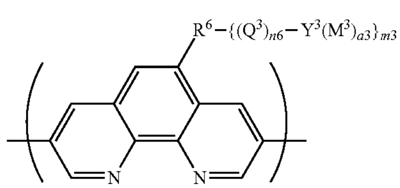
-continued
60b3
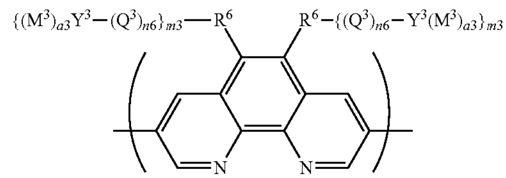
61a3
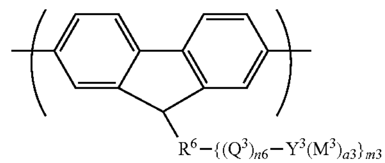
61b3
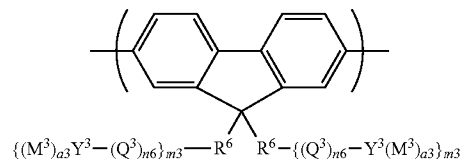
61c3
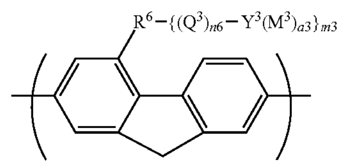
62a3
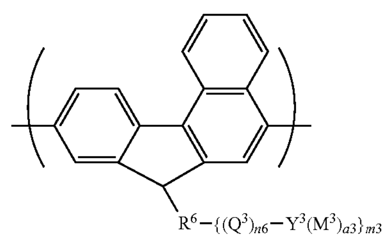
62b3
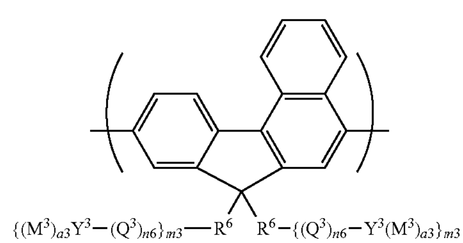
63a3
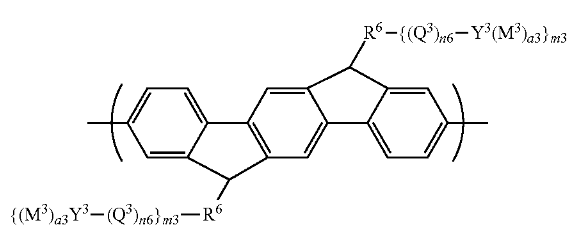

-continued

63b³

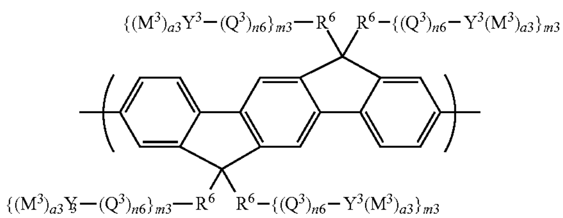

In the formulas described above, in terms of easy synthesis, $R^6$ is preferably a direct bond or a group in which m3 hydrogen atom(s) is(are) removed from an aryl group having 6 to 30 carbon atoms that optionally has a substituent. The aryl group having 6 to 30 carbon atoms that optionally has a substituent is preferably a phenyl group, a 1-naphthyl group, a 2-naphthyl group, a 1-anthracenyl group, a 2-anthracenyl group, a 9-anthracenyl group, or a group among these groups in which at least one hydrogen atom is substituted with a substituent.

Examples of the substituent include a substituent similar to the substituent shown as examples in the description of $R^1$ described above. When $R^6$ has a plurality of substituents, each substituent may be the same as or different from each other.

Examples of the structural unit represented by Formula (5) may also include a structural unit represented by the following formulas that optionally has a substituent. Examples of the substituent include a substituent similar to the substituent shown as examples in the description of the substituent in the description of $R^1$ described above. When a plurality of substituents are present in one formula, each substituent may be the same as or different from each other.

[Chemical Formula 56]

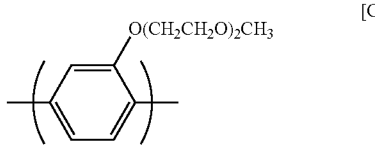

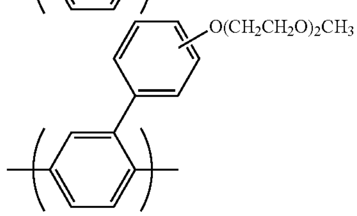

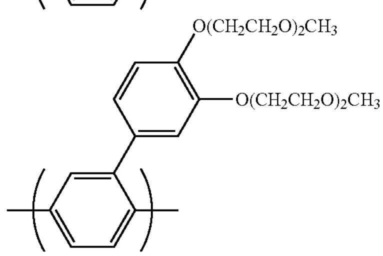

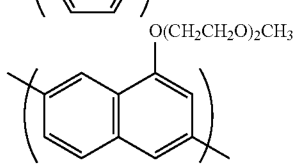

-continued

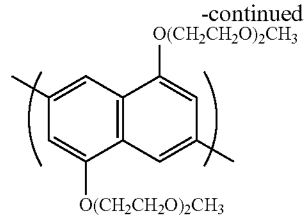

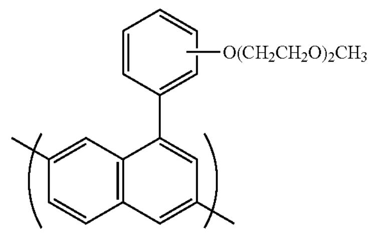

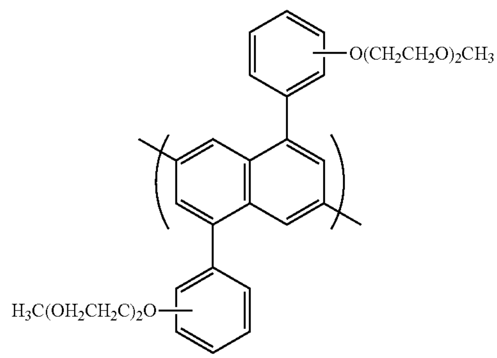

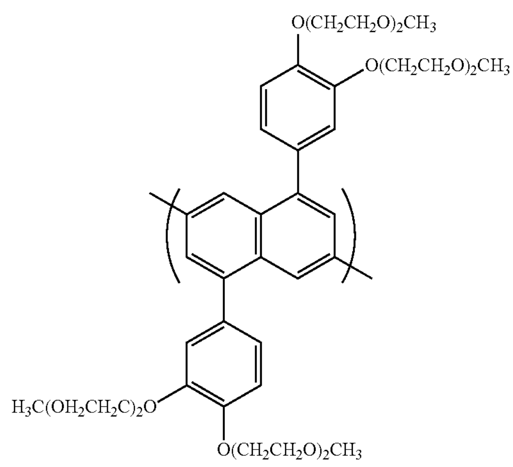

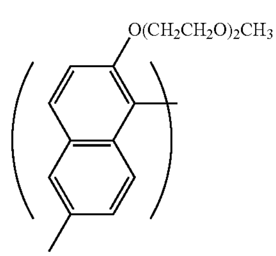

-continued
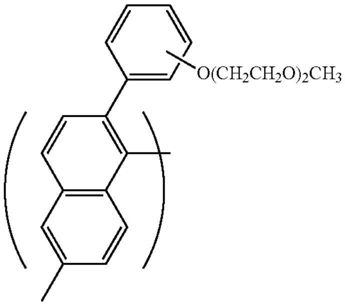
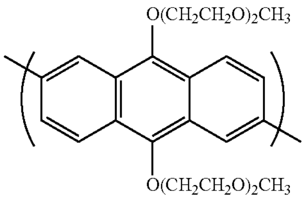
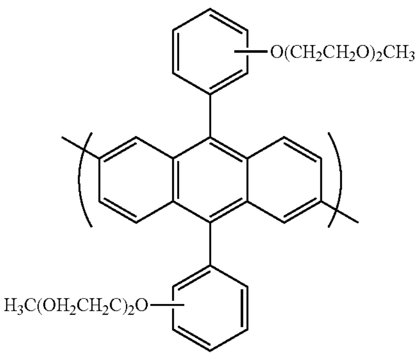
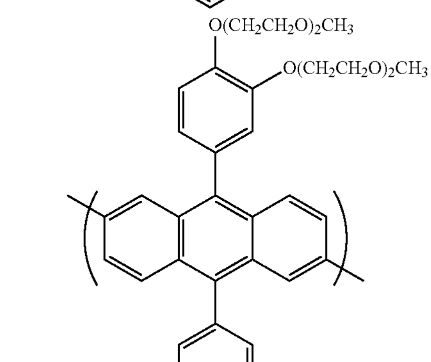
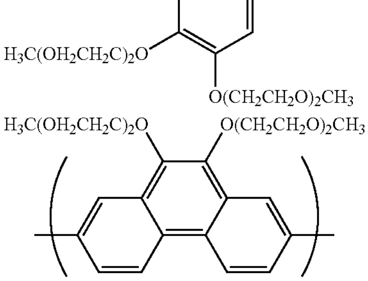
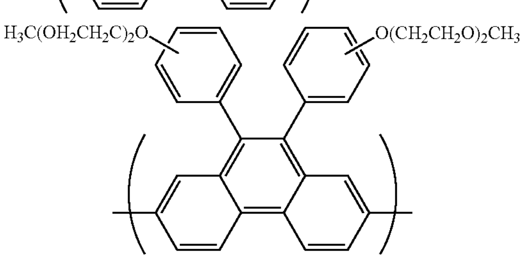
-continued
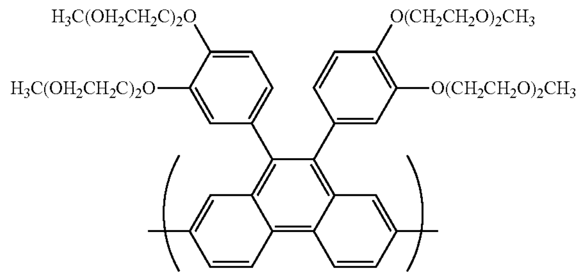
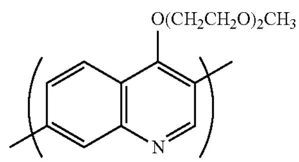
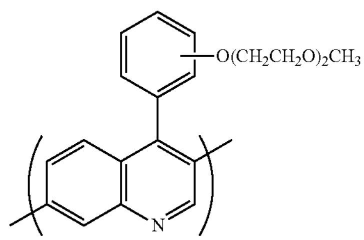
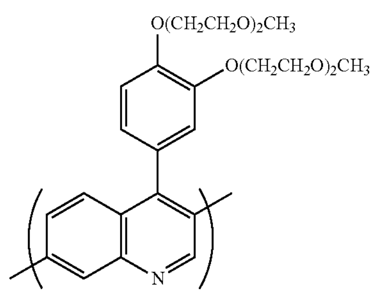
[Chemical Formula 57]
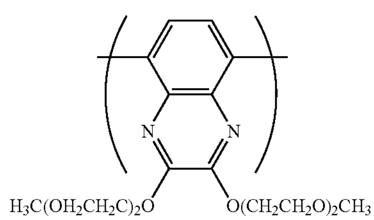
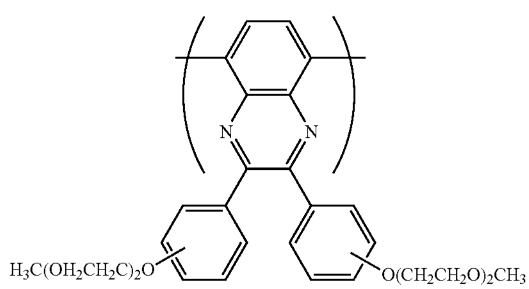

-continued
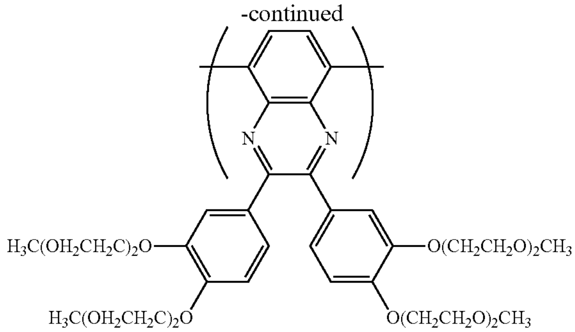
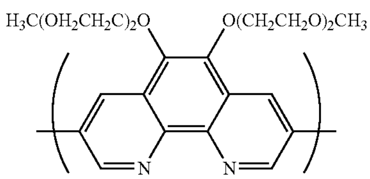
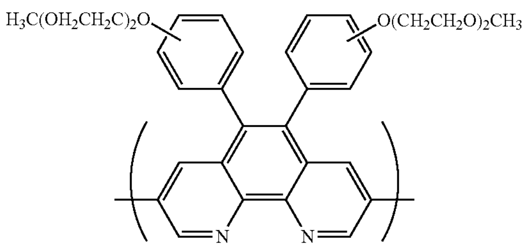
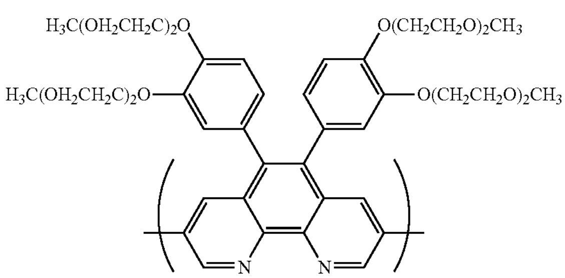
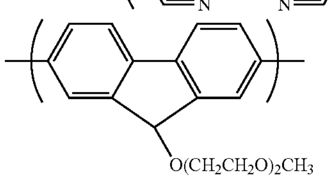
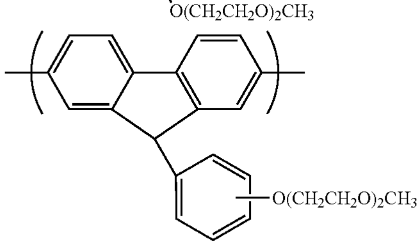
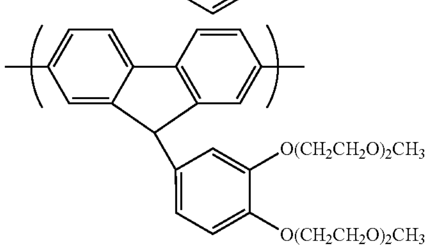
-continued
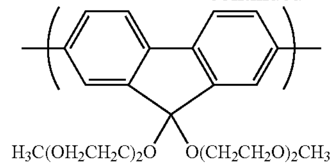
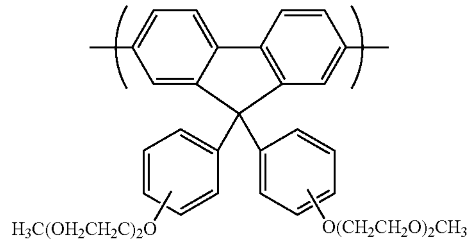
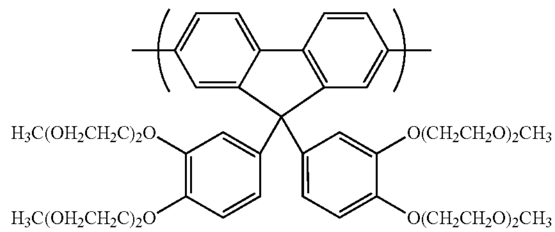
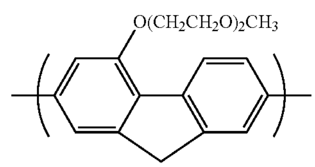
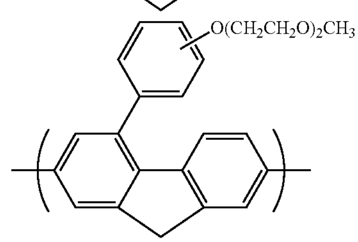
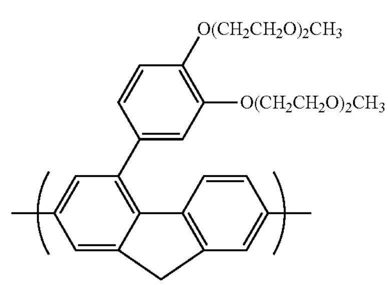
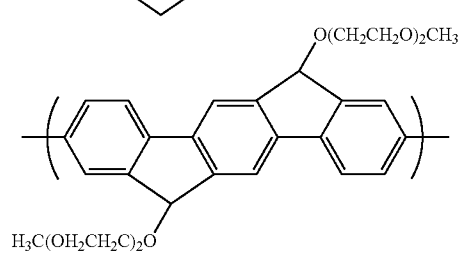

-continued
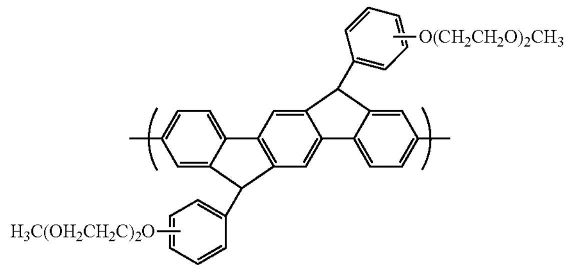
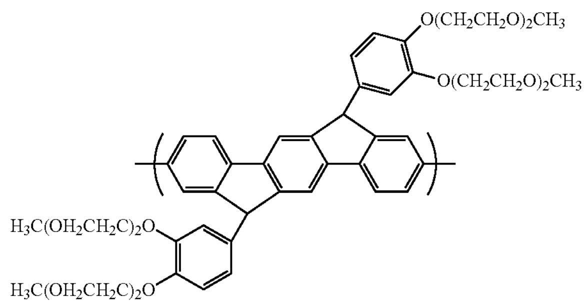
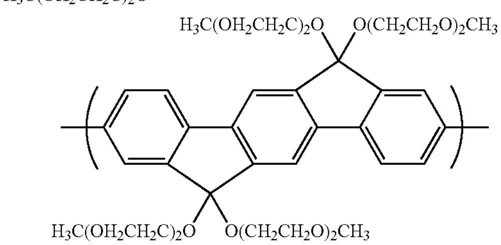
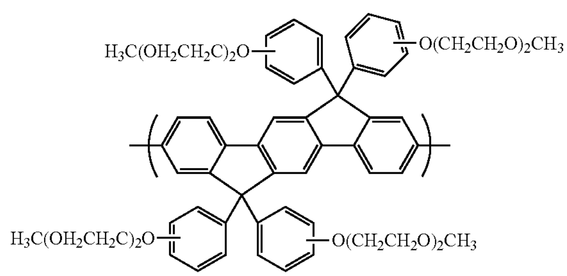
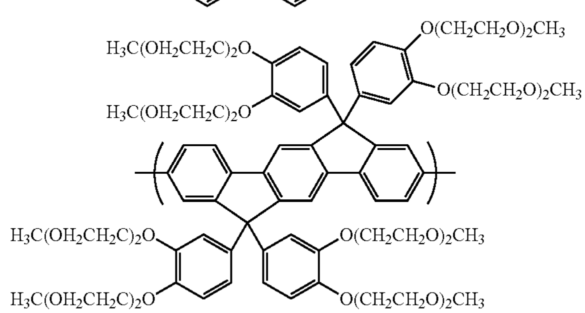
[Chemical Formula 58]
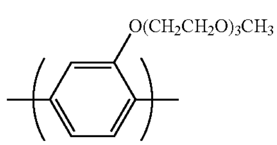
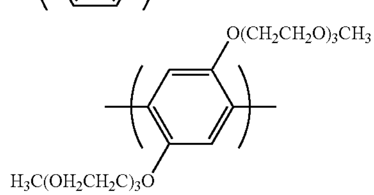
-continued
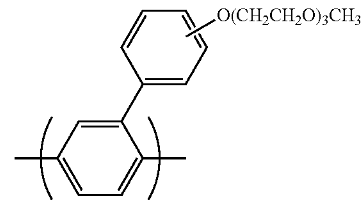
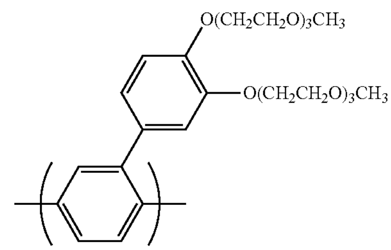
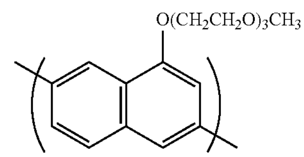
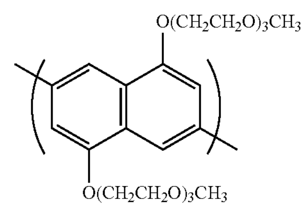
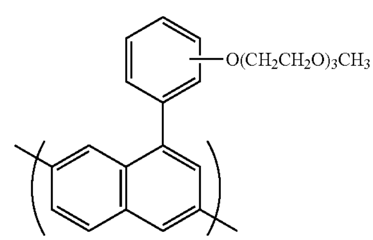
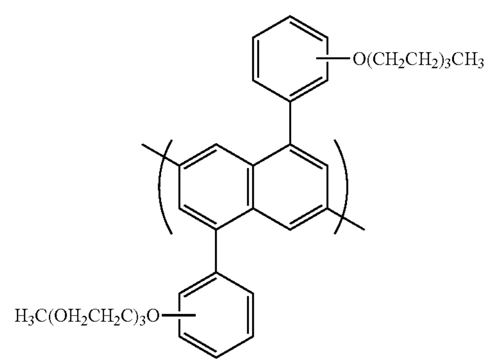

-continued
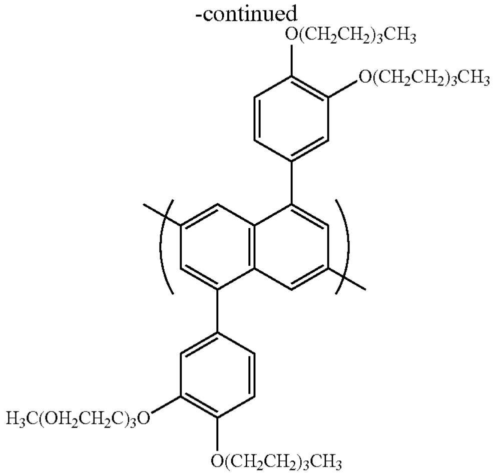
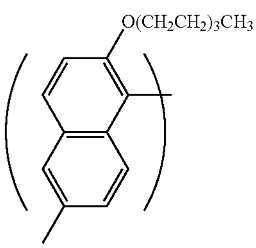
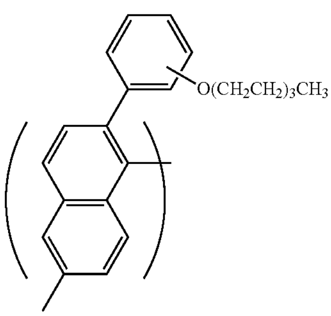
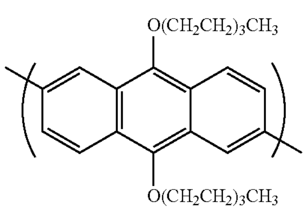
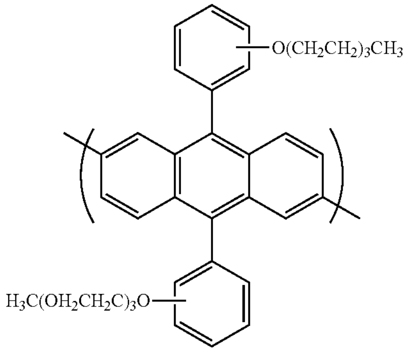
-continued
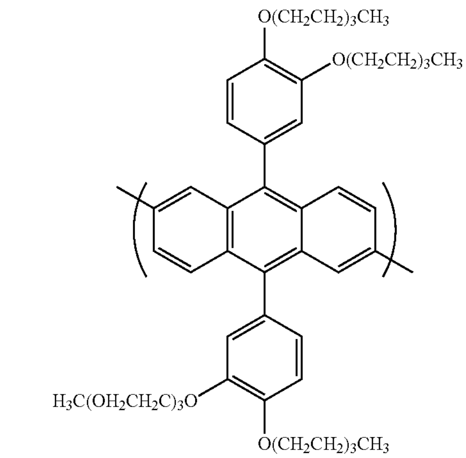
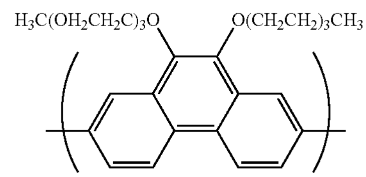
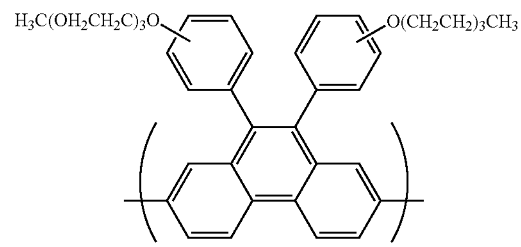
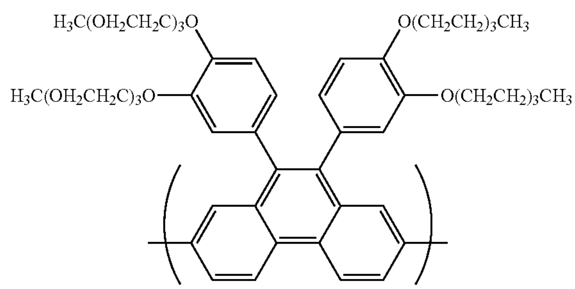
[Chemical Formula 59]
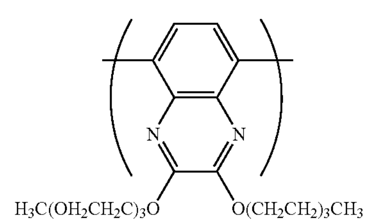
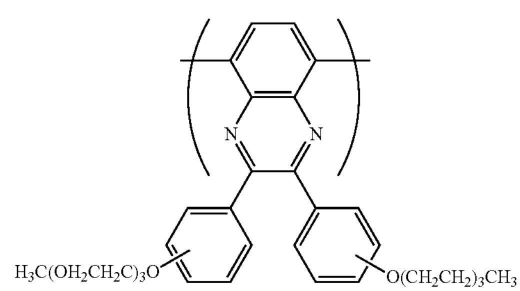

-continued
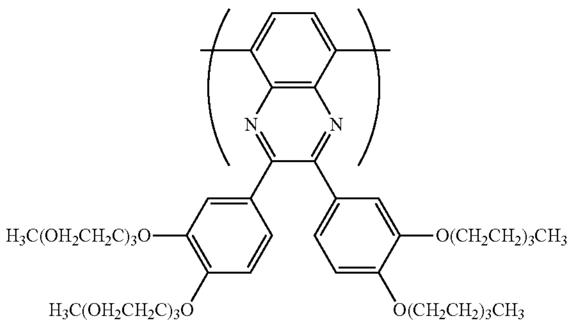
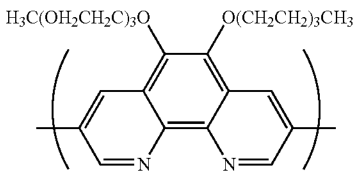
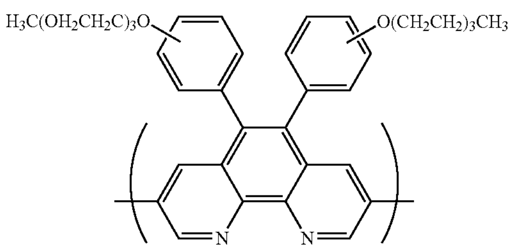
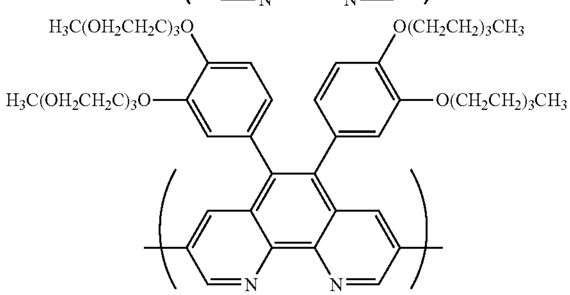
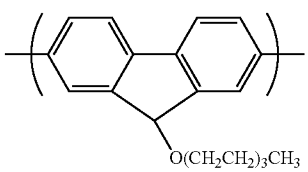
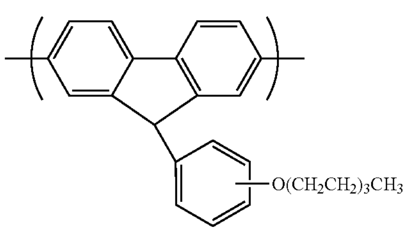
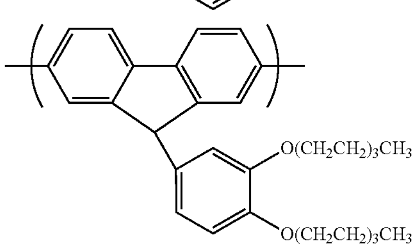
-continued
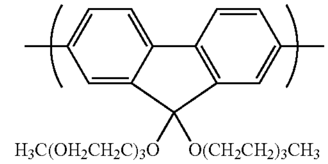
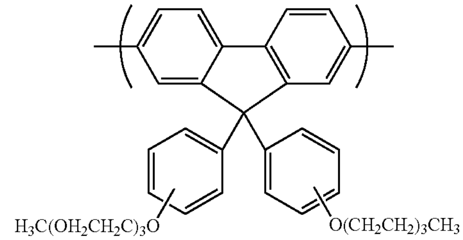
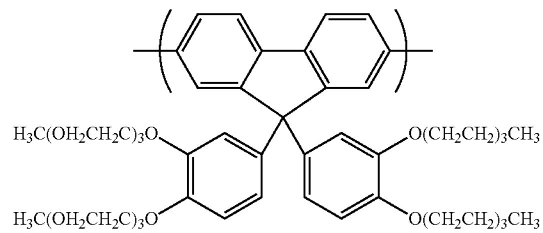
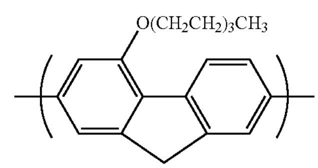
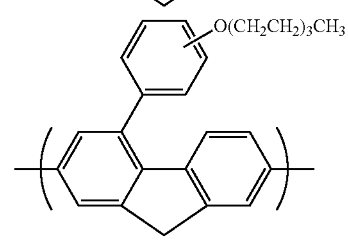
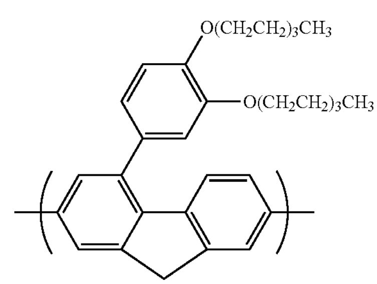
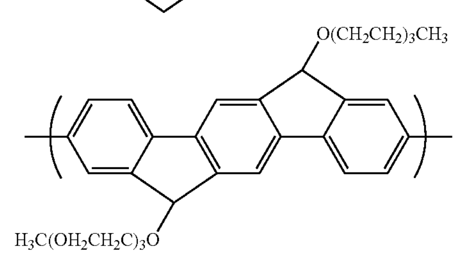

-continued

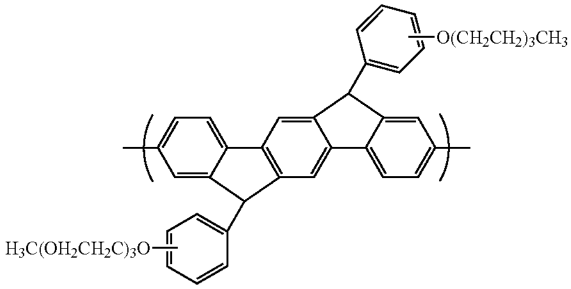

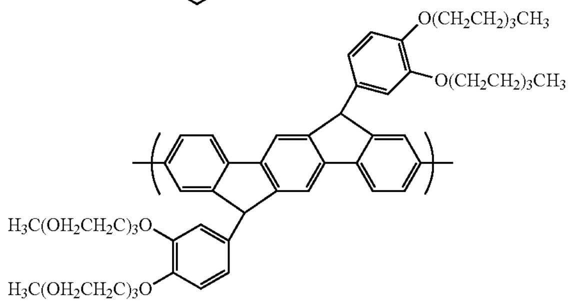

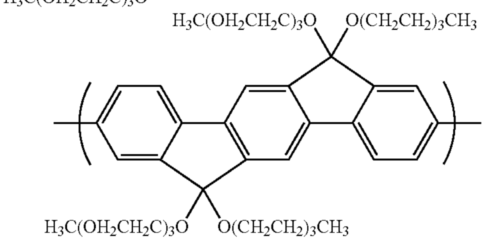

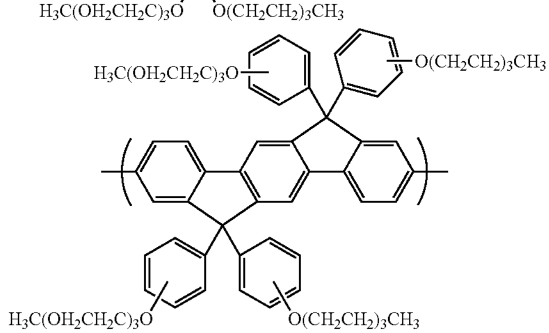

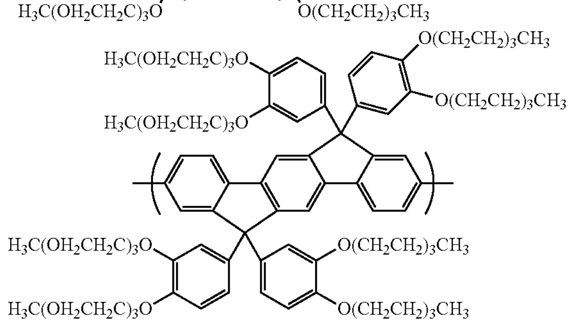

[1.8.4. Examples of Structural Unit Represented by Formula (16)]

Examples of the structural unit represented by Formula (16) include a structural unit represented by the following formulas that optionally has a substituent. In terms of easy synthesis of the polymer compound and electron transport properties, the structural unit is preferably a structural unit represented by Formula $52a^4$, $55a^4$, $55b^4$, $55c^4$, $56b^4$, $57b^4$, $58a^4$, $59b^4$, $60b^4$, $61a^4$, $61b^4$, $61c^4$, or $63b^4$. Examples of the substituent include a substituent similar to the substituent shown as examples in the description of the substituent in the description of $R^4$ described above. When a plurality of substituents are present in one formula, each substituent may be the same as or different from each other. In the following formulas, $R^8$, $Q^1$, n2, $Y^1$, $M^1$, a1, $Q^3$, n6, $Y^3$, m4, and m5 are the same as the corresponding definitions above. When each of a plurality of $R^8$, $Q^1$, n2, $Y^1$, $M^1$, a1, $Q^3$, n6, $Y^3$, m4, and m5 is present in one formula, each of the plurality of $R^8$, $Q^1$, n2, $Y^1$, $M^1$, a1, $Q^3$, n6, $Y^3$, m4, and m5 may be the same as or different from each other.

[Chemical Formula 60]

$52a^4$

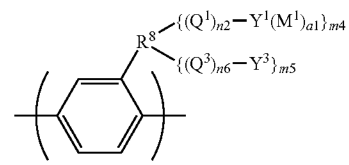

$52b^4$

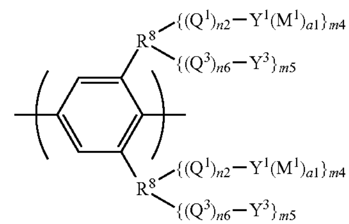

$53a^4$

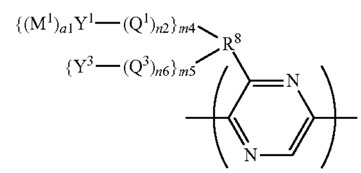

$53b^4$

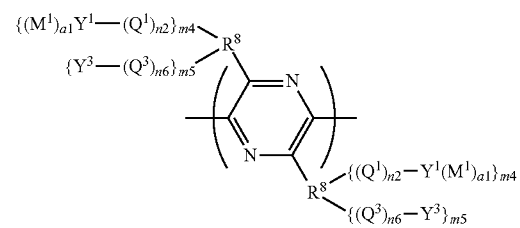

$54a^4$

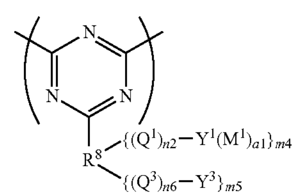

$55a^4$

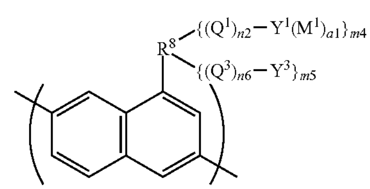

-continued
55b$^{4}$
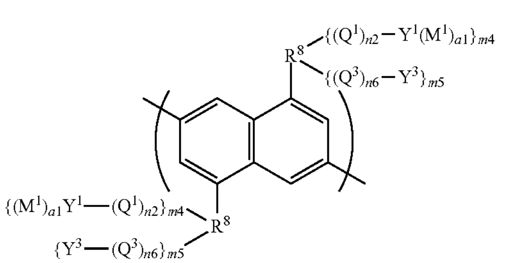
55c$^{4}$
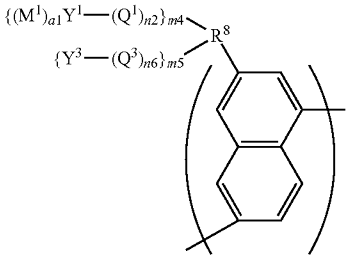
56a$^{4}$
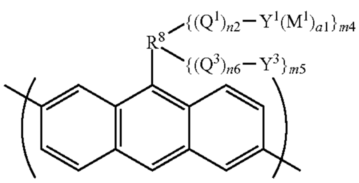
56b$^{4}$
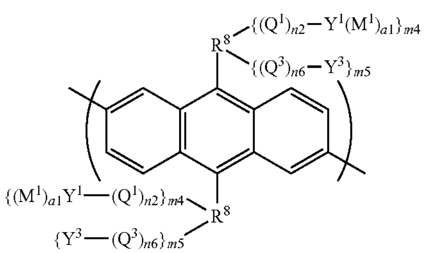
57a$^{4}$
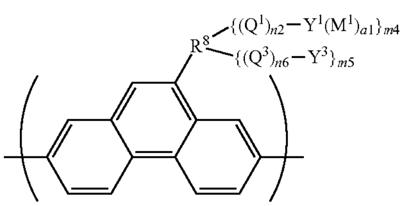
57b$^{4}$
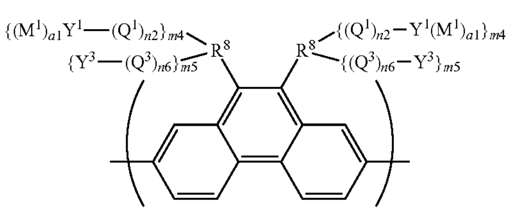
58a$^{4}$
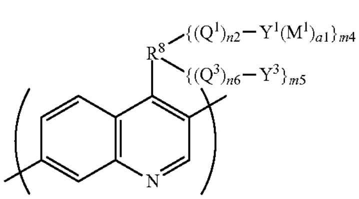
-continued
58b$^{4}$
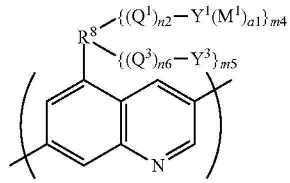
58c$^{4}$
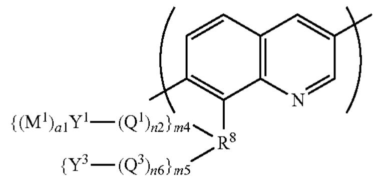
59a$^{4}$
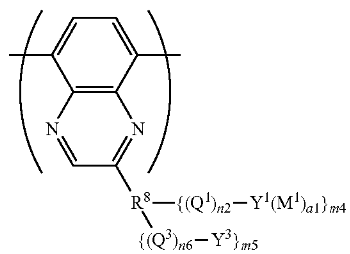
59b$^{4}$
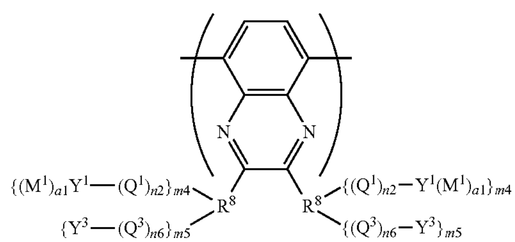
[Chemical Formula 61]
60a$^{4}$
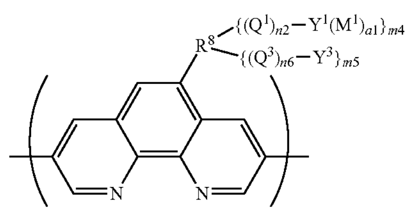
60b$^{4}$
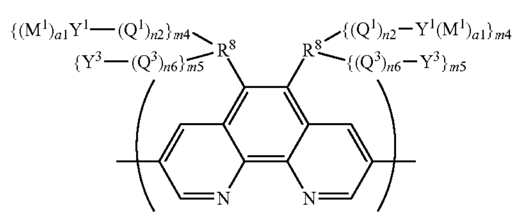
61a$^{4}$
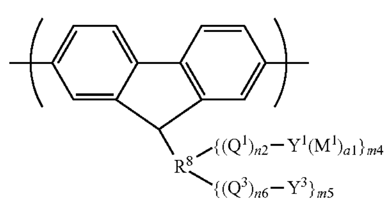

-continued

61b[4]

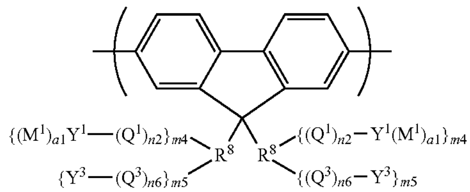

61c[4]

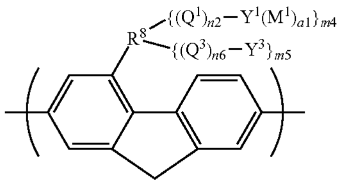

62a[4]

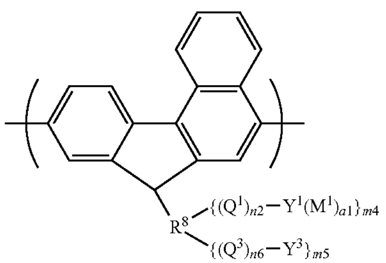

62b[4]

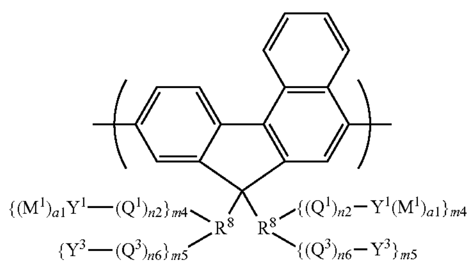

63a[4]

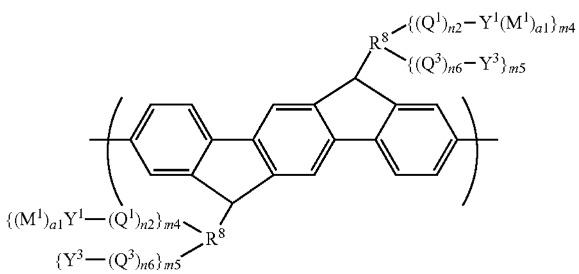

63b[4]

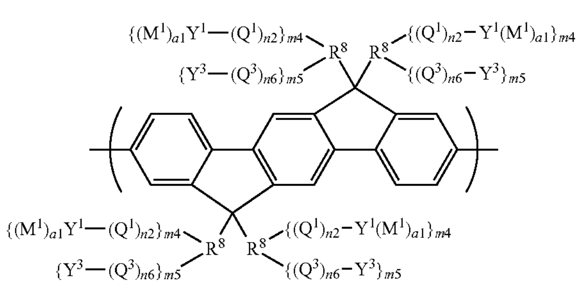

In the formulas described above, in terms of easy synthesis, $R^8$ is preferably a group in which (m4+m5) hydrogen atoms are removed from an aryl group having 6 to 30 carbon atoms that optionally has a substituent. The aryl group having 6 to 30 carbon atoms that optionally has a substituent is preferably a phenyl group, a 1-naphthyl group, a 2-naphthyl group, a 1-anthracenyl group, a 2-anthracenyl group, a 9-anthracenyl group, or a group among these groups in which at least one hydrogen atom is substituted with a substituent.

Examples of the substituent include a substituent similar to the substituent shown as examples in the description of $R^1$ described above. When $R^8$ has a plurality of substituents, each substituent may be the same as or different from each other.

Examples of the structural unit represented by Formula (16) may also include a structural unit represented by the following formulas that optionally has a substituent. Examples of the substituent include a substituent similar to the substituent shown as examples in the description of the substituent in the description of $R^1$ described above. When a plurality of substituents are present in one formula, each substituent may be the same as or different from each other. In the following formulas, M is the same as the corresponding definition above.

[Chemical Formula 62]

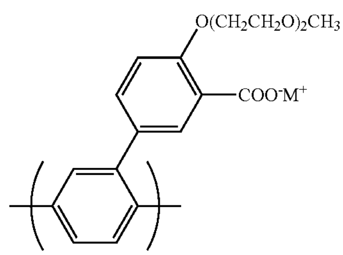

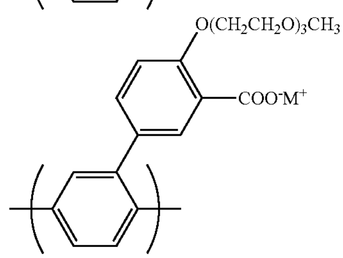

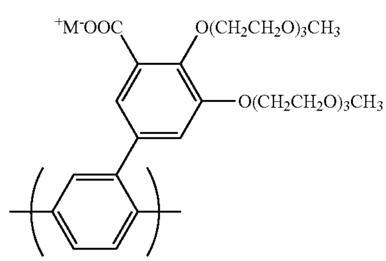

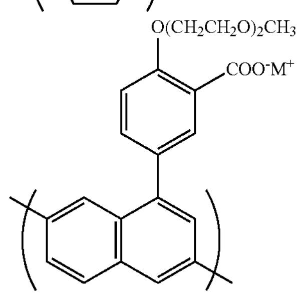

-continued
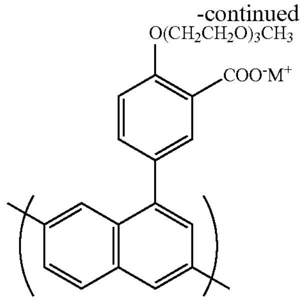
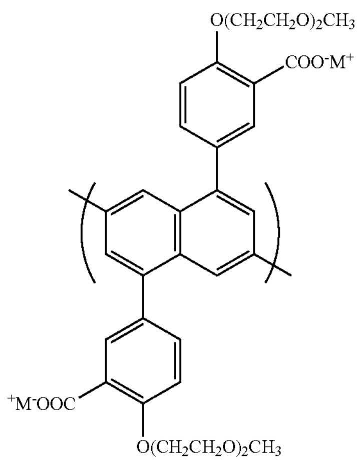
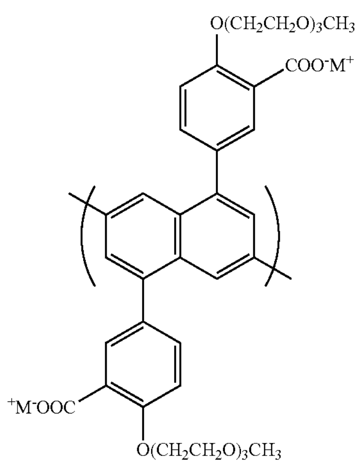
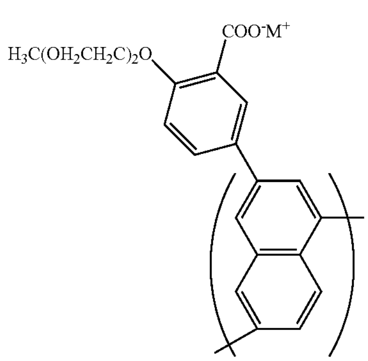
-continued
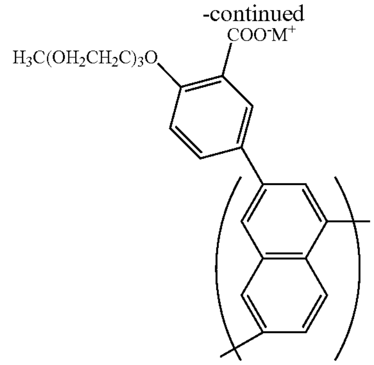
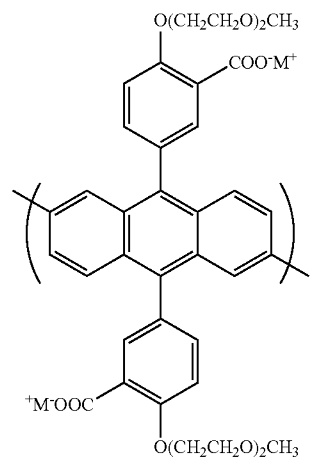
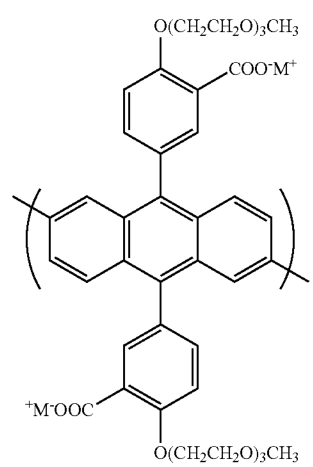
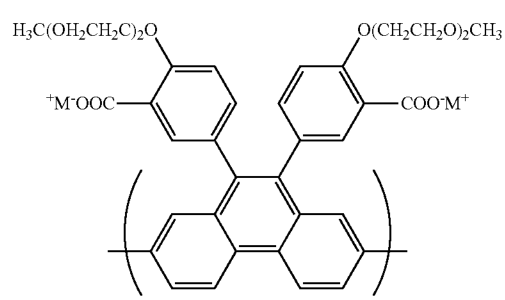

-continued
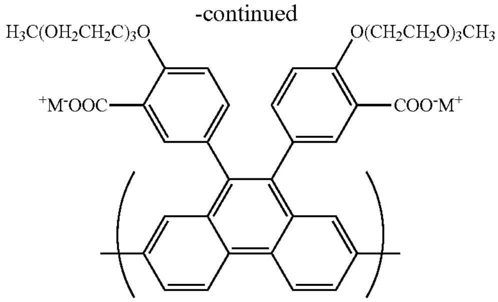
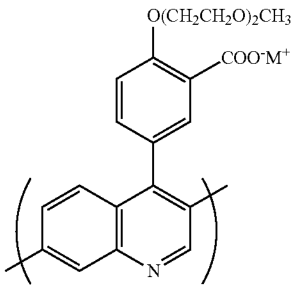
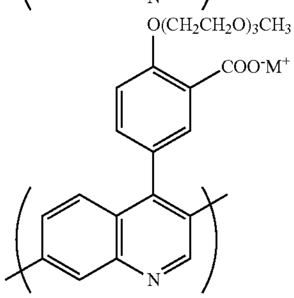
[Chemical Formula 63]
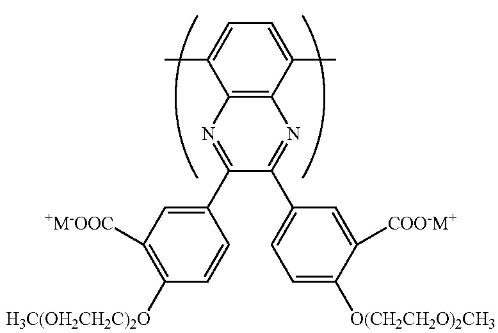
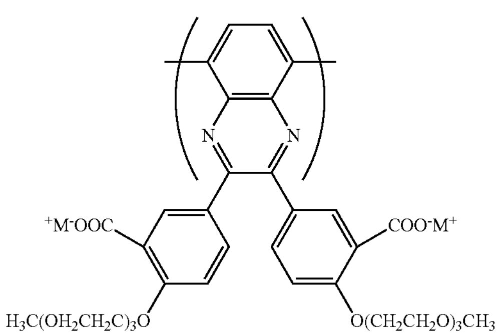
-continued
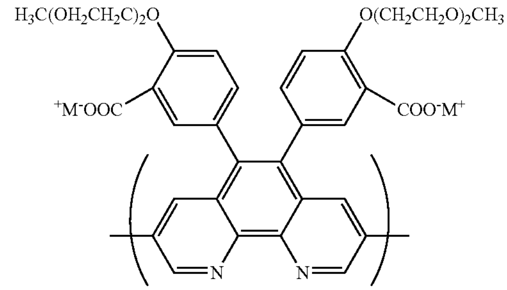
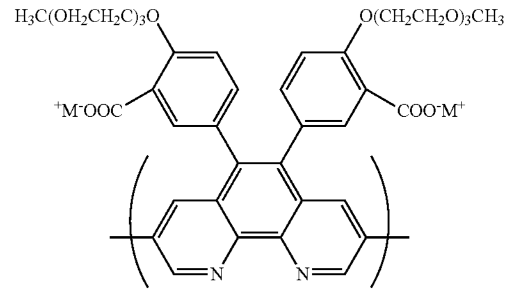
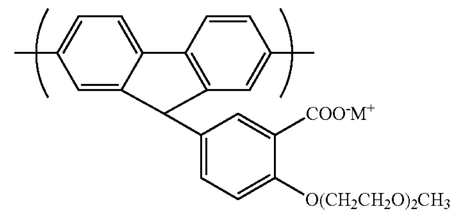
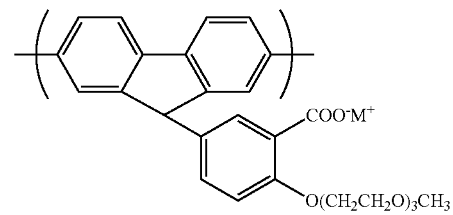
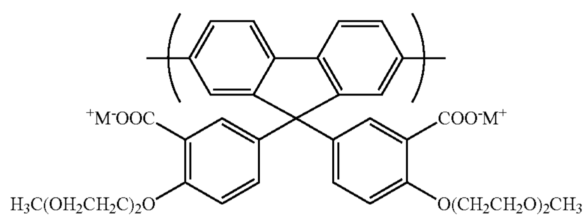
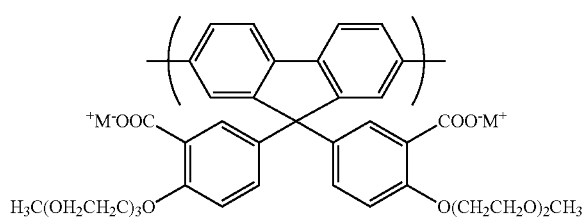
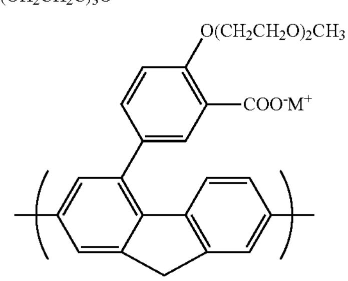

-continued
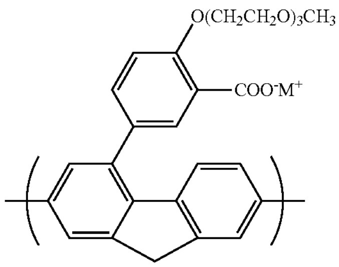
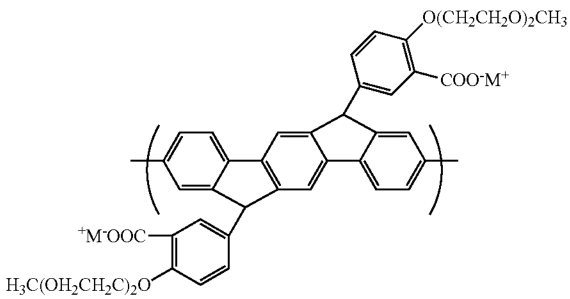
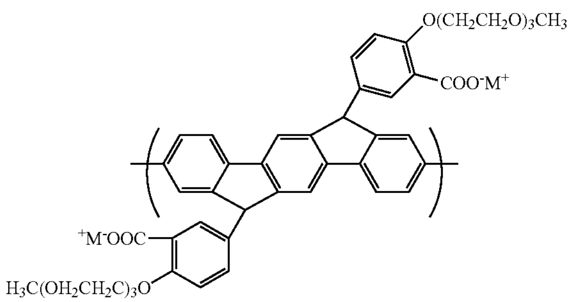
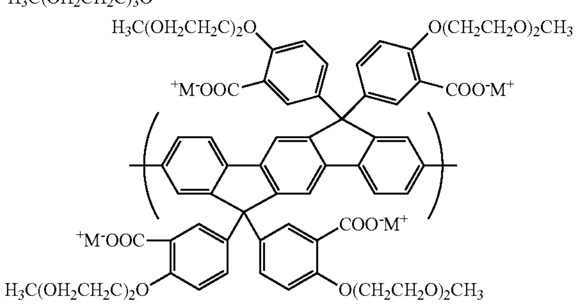
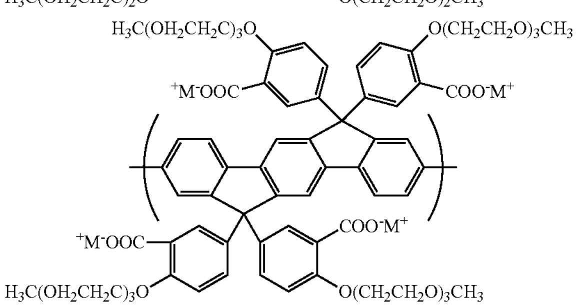
[Chemical Formula 64]
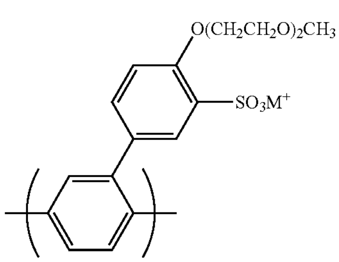
-continued
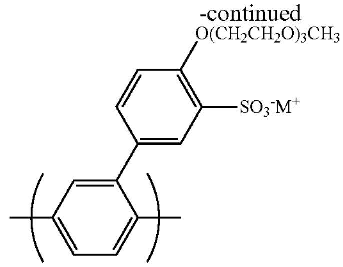
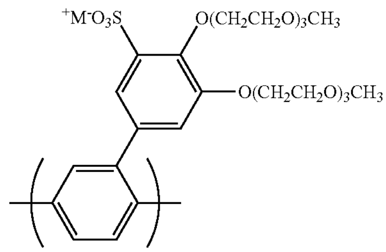
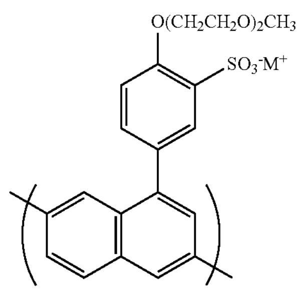
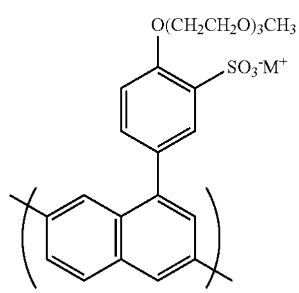
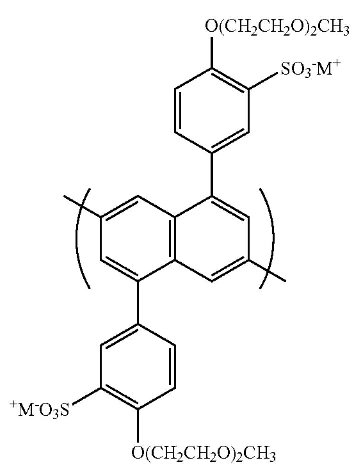

-continued
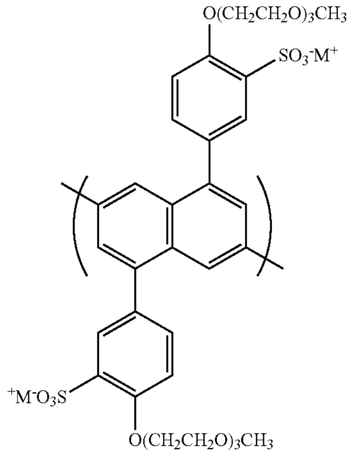
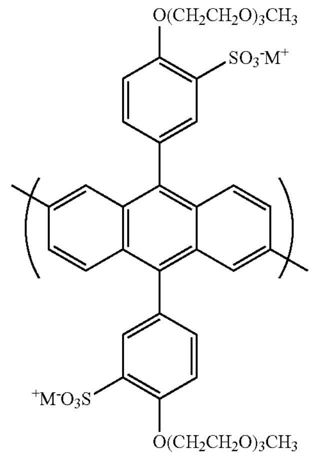
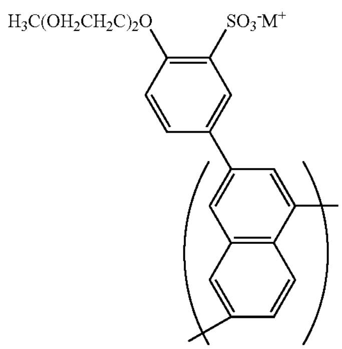
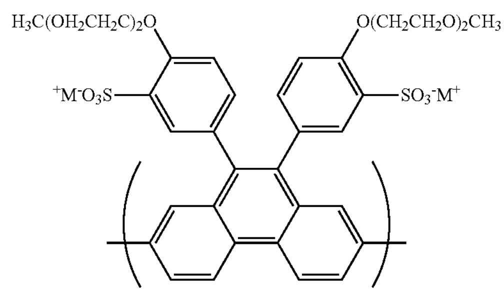
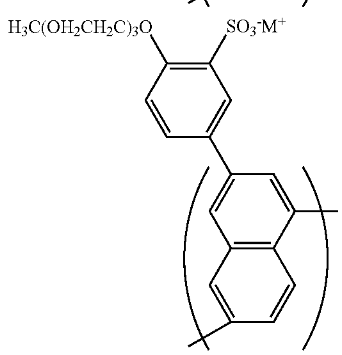
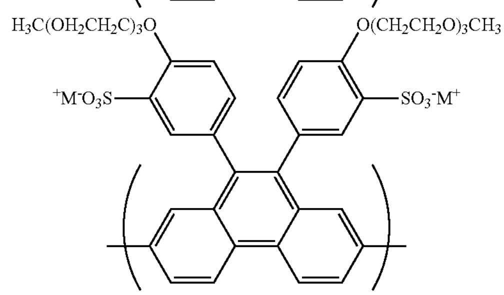
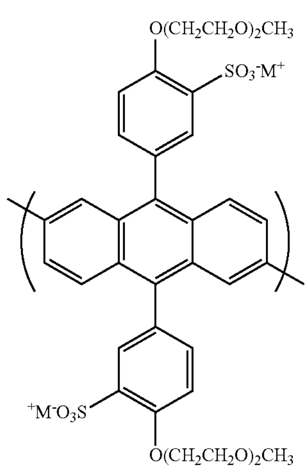
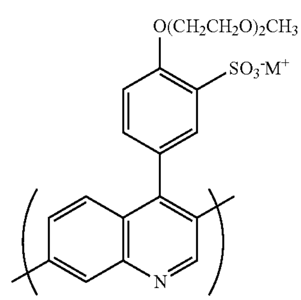
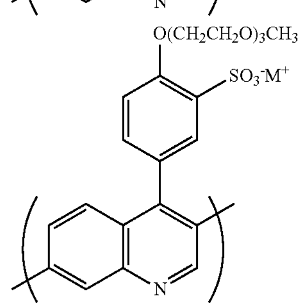

-continued
[Chemical Formula 65]
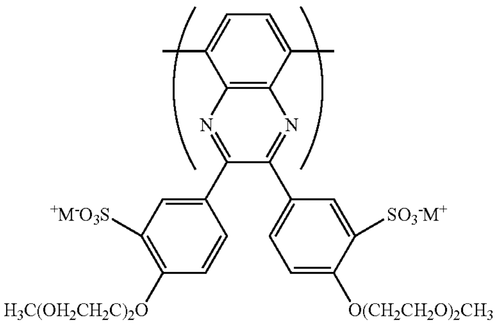
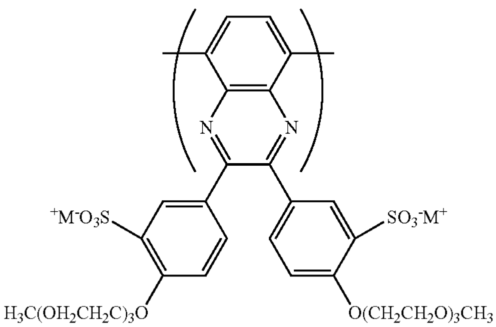
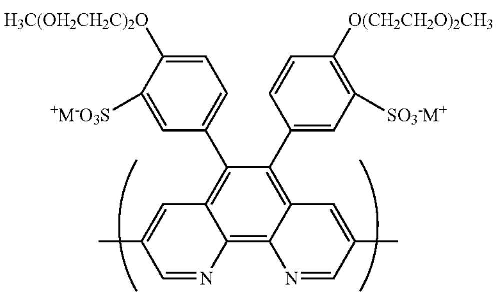
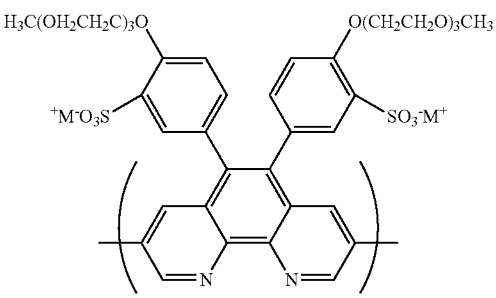
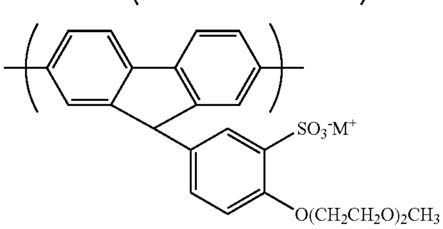
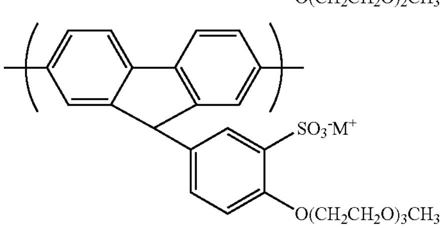
-continued
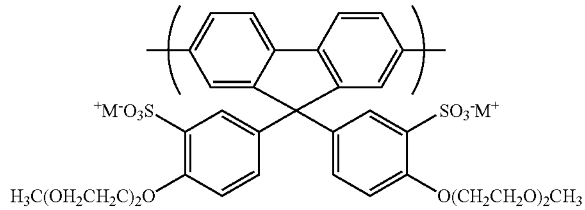
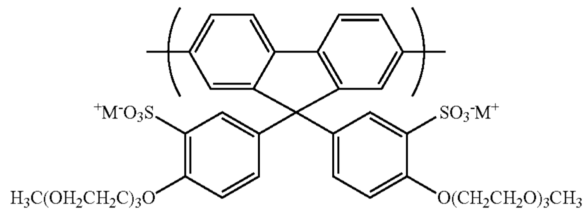
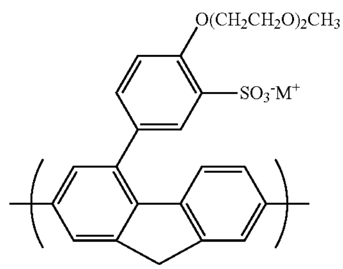
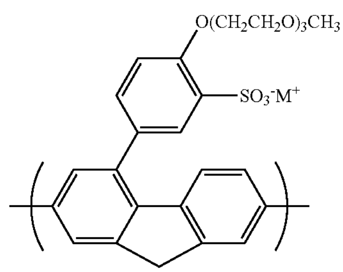
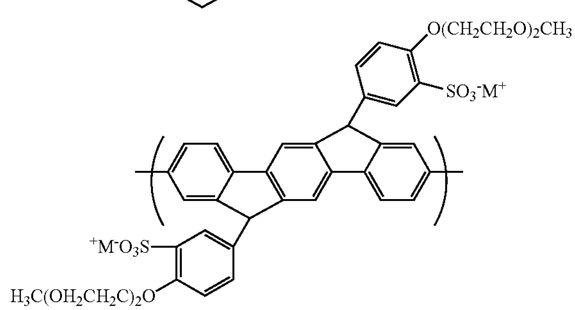
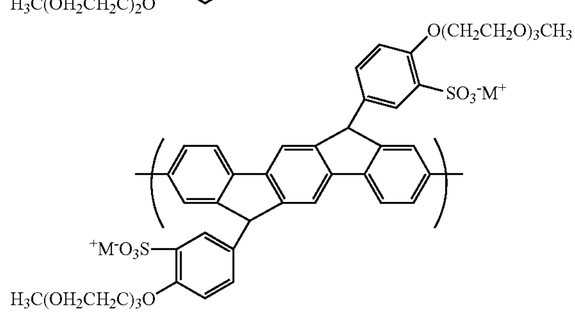

-continued

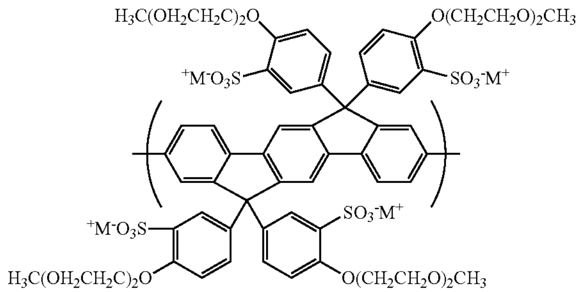

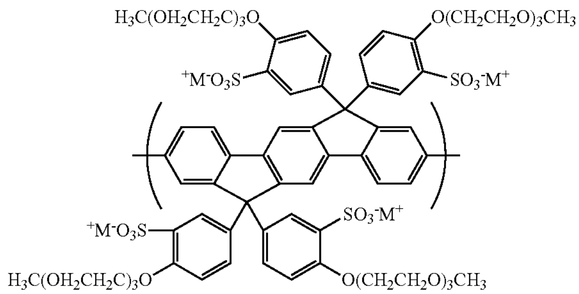

[1.8.5. Examples of Structural Unit Represented by Formula (18)]

Examples of the structural unit represented by Formula (18) include a structural unit represented by the following formulas that optionally has a substituent. In terms of easy synthesis of the polymer compound and electron transport properties, the structural unit is preferably a structural unit represented by Formula 52a$^5$, 55a$^5$, 55b$^5$, 55c$^5$, 56b$^5$, 57b$^5$, 58a$^5$, 59b$^5$, 60b$^5$, 61a$^5$, 61b$^5$, 61c$^5$, or 63b$^5$. Examples of the substituent include a substituent similar to the substituent shown as examples in the description of the substituent in the description of $R^1$ described above. When a plurality of substituents are present in one formula, each substituent may be the same as or different from each other. In the following formulas, $Q^2$, $Q^3$, $Y^2$, $M^2$, $Y^3$, n4, a2, n6, m6, and m7 are the same as the corresponding definitions above. When each of a plurality of $Q^2$, $Q^3$, $Y^2$, $M^2$, $Y^3$, n4, n6, m6, and m7 is present in one formula, each of the plurality of $Q^2$, $Q^3$, $Y^2$, $M^2$, $Y^3$, n4, n6, m6, and m7 may be the same as or different from each other.

[Chemical Formula 66]

52a$^5$

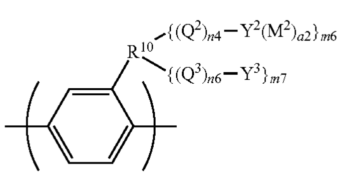

52b$^5$

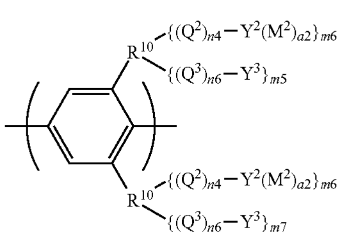

-continued

53a$^5$

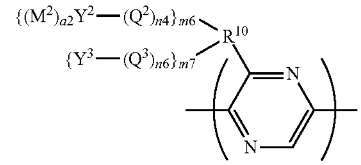

53b$^5$

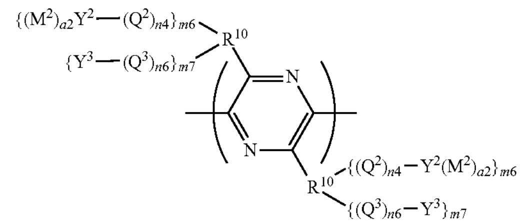

54a$^5$

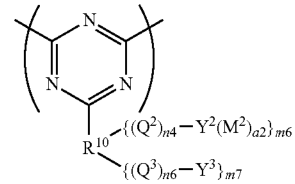

55a$^5$

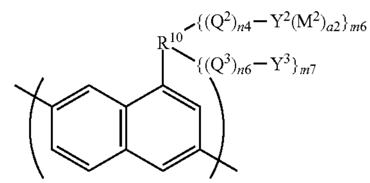

55b$^5$

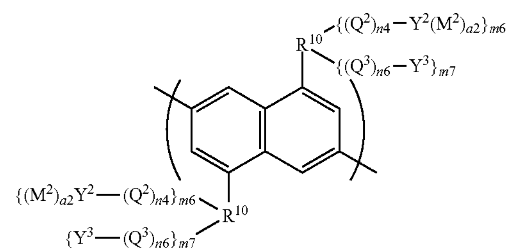

55c$^5$

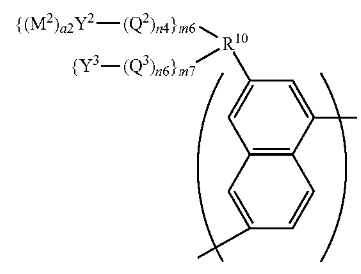

56a$^5$

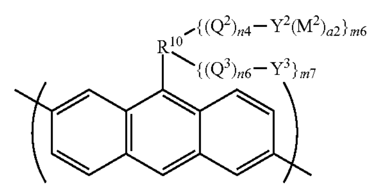

-continued
56b$^{5}$
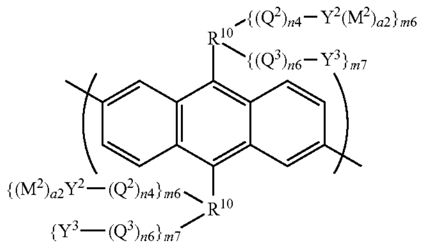
57a$^{5}$
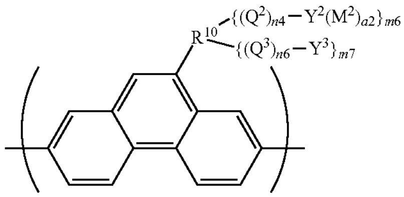
57b$^{5}$
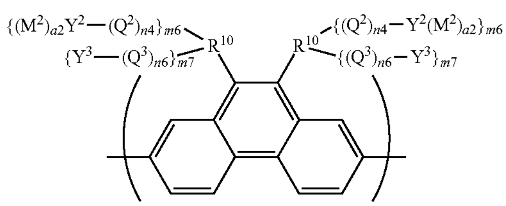
58a$^{5}$
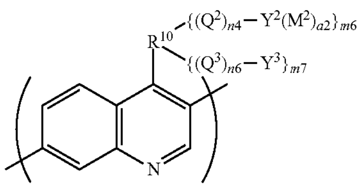
58b$^{5}$
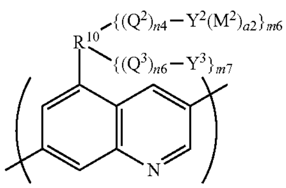
58c$^{5}$
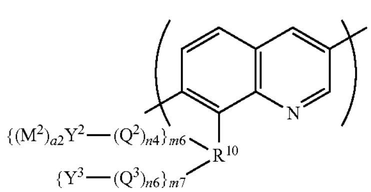
59a$^{5}$
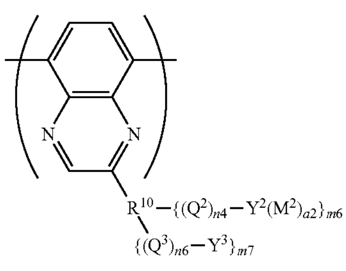
-continued
59b$^{5}$
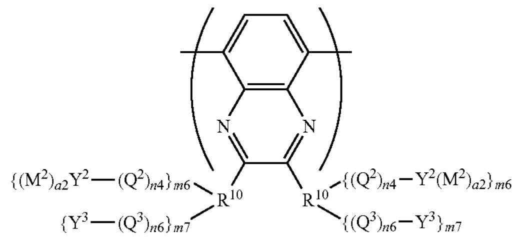
[Chemical Formula 67]
60a$^{5}$
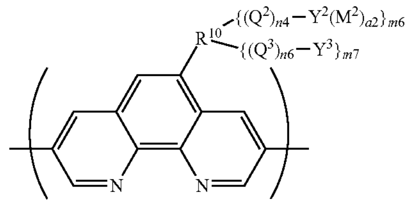
60b$^{5}$
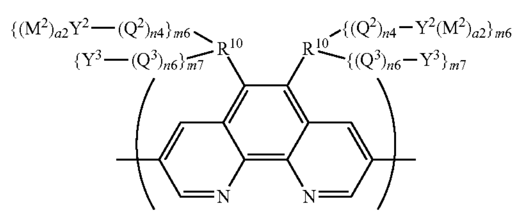
61a$^{5}$
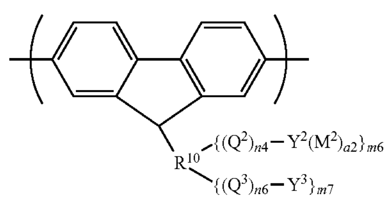
61b$^{5}$
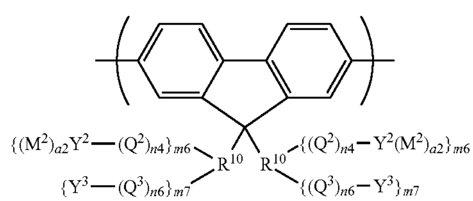
61c$^{5}$
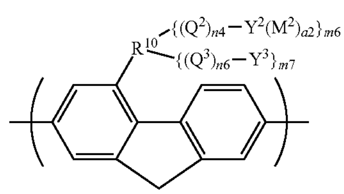
62a$^{5}$
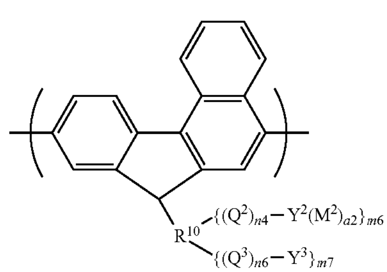

-continued

62b$^{5}$

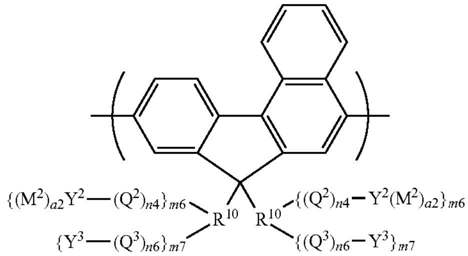

63a$^{5}$

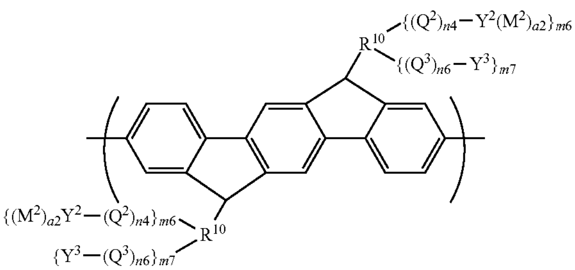

63b$^{5}$

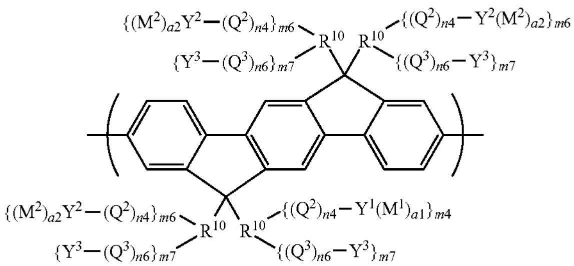

In the formulas described above, in terms of easy synthesis, $R^{10}$ is preferably a group in which (m6+m7) hydrogen atoms are removed from an aryl group having 6 to 30 carbon atoms that optionally has a substituent. The aryl group having 6 to 30 carbon atoms that optionally has a substituent is preferably a phenyl group, a 1-naphthyl group, a 2-naphthyl group, a 1-anthracenyl group, a 2-anthracenyl group, a 9-anthracenyl group, or a group among these groups in which at least one hydrogen atom is substituted with a substituent.

Examples of the substituent include a substituent similar to the substituent shown as examples in the description of $R^1$ described above. When $R^{10}$ has a plurality of substituents, each substituent may be the same as or different from each other.

Examples of the structural unit represented by Formula (18) may also include a structural unit represented by the following formulas that optionally has a substituent. Examples of the substituent include a substituent similar to the substituent shown as examples in the description of the substituent in the description of $R^1$ described above. When a plurality of substituents are present in one formula, each substituent may be the same as or different from each other. In the following formulas, X is the same as the corresponding definition above. When a plurality of X are present in one formula, each X may be the same as or different from each other.

[Chemical Formula 68]

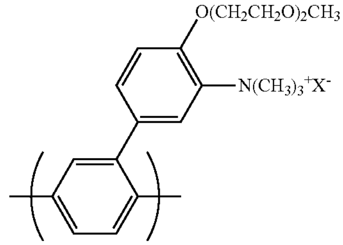

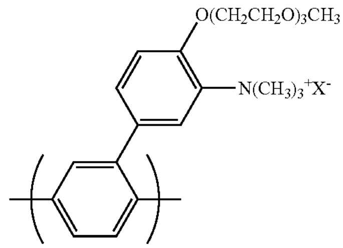

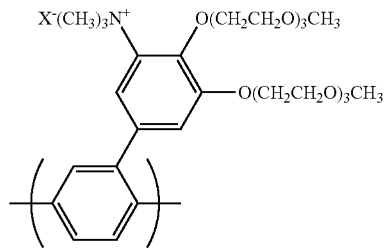

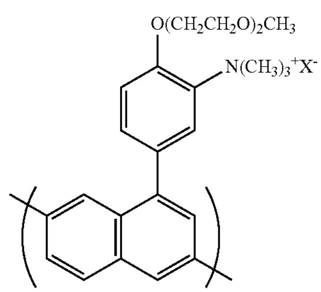

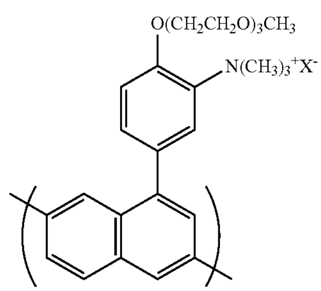

-continued
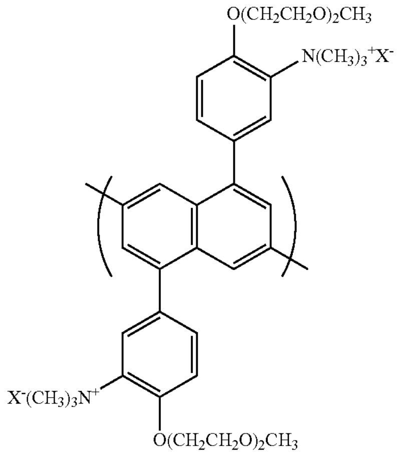
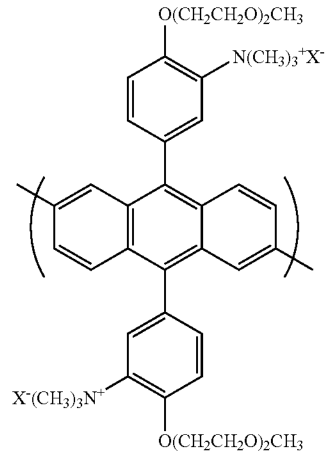
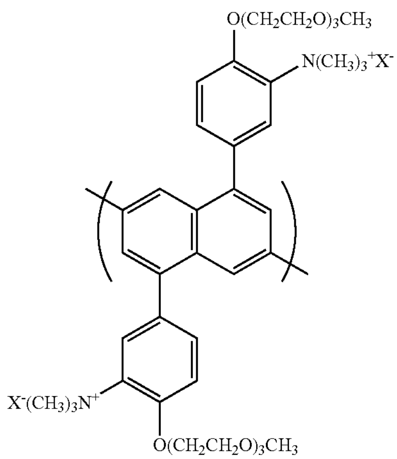
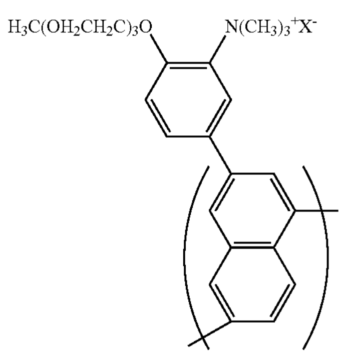
-continued
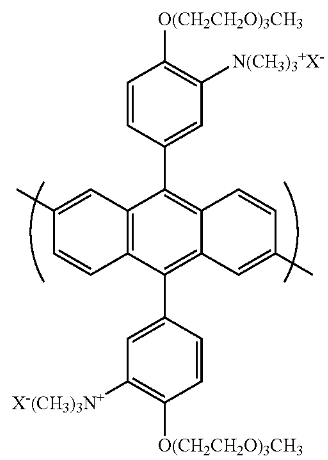
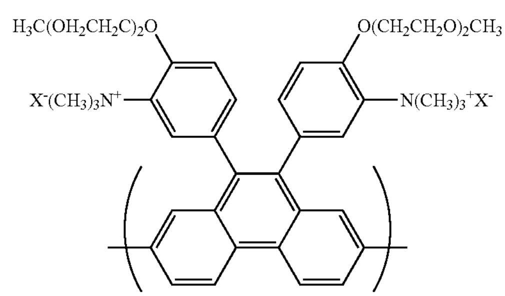
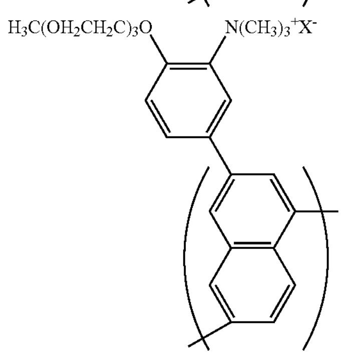
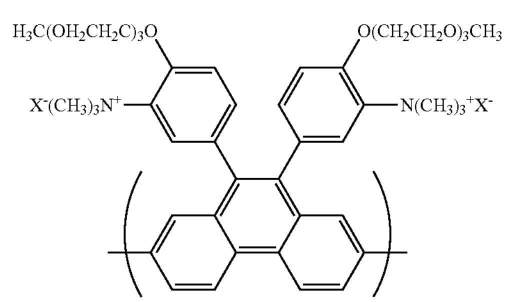

-continued
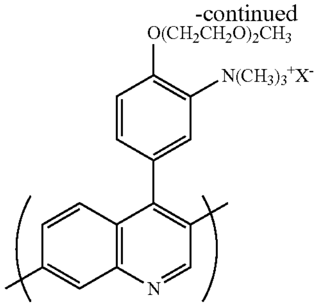
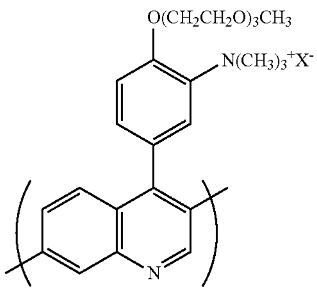
[Chemical Formula 69]
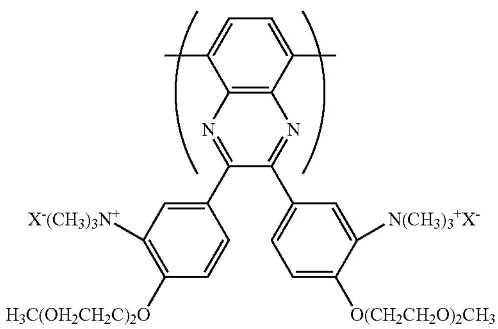
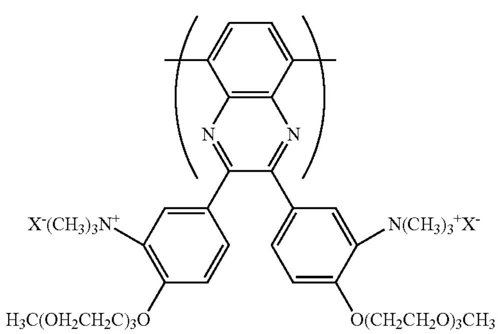
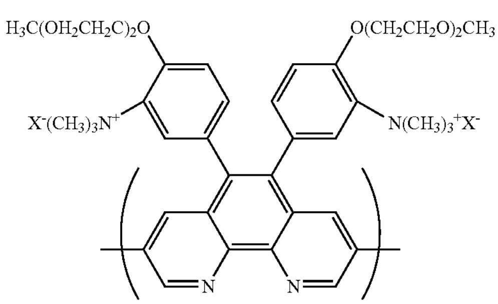
-continued
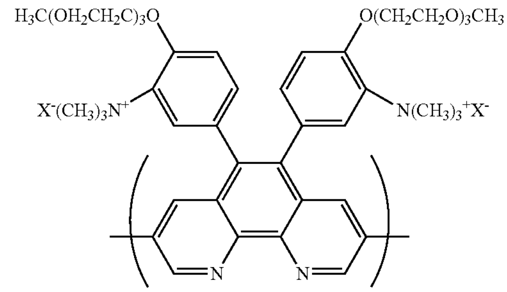
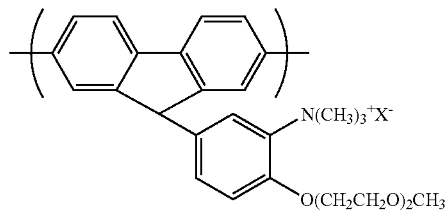
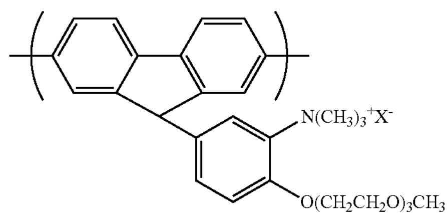
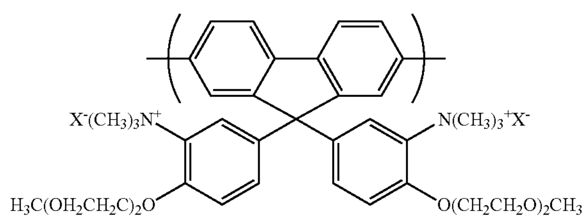
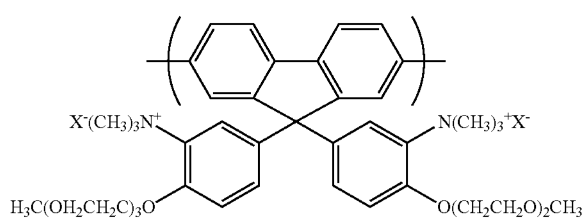
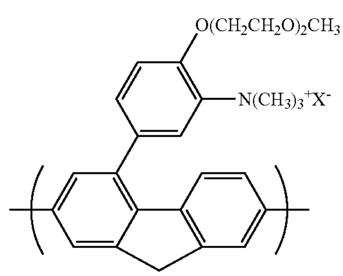
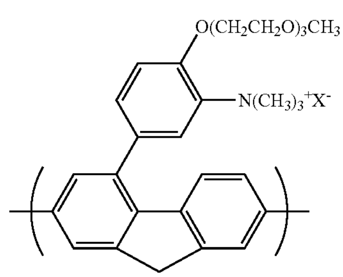

-continued
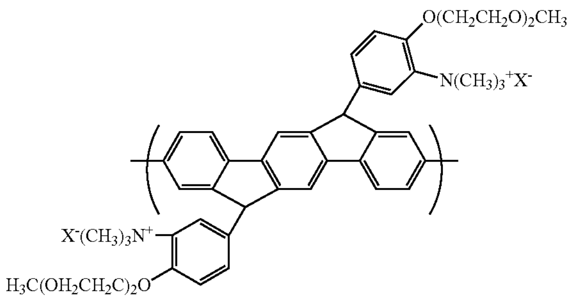
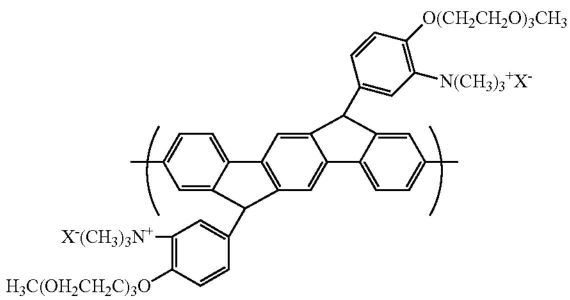
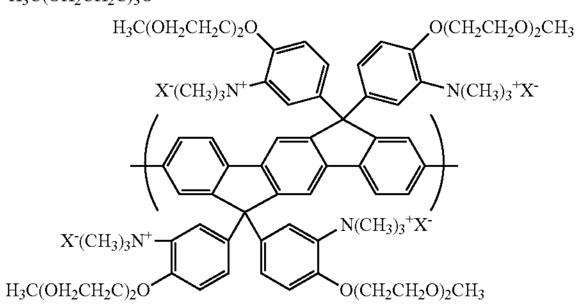
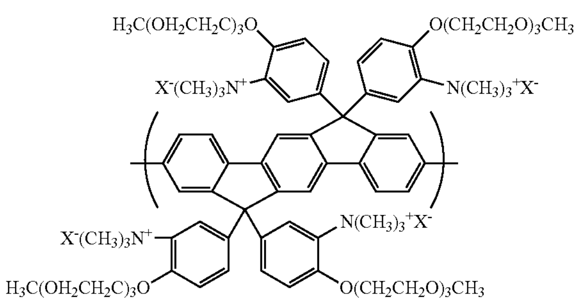
[Chemical Formula 70]
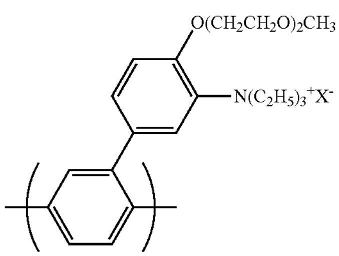
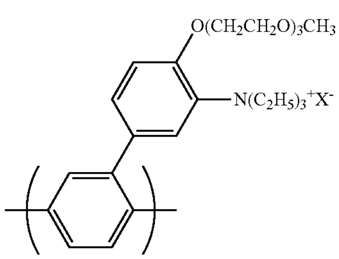
-continued
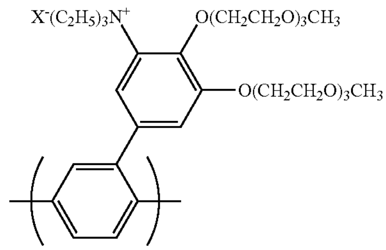
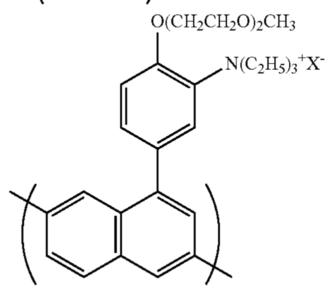
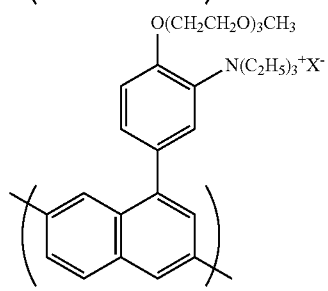
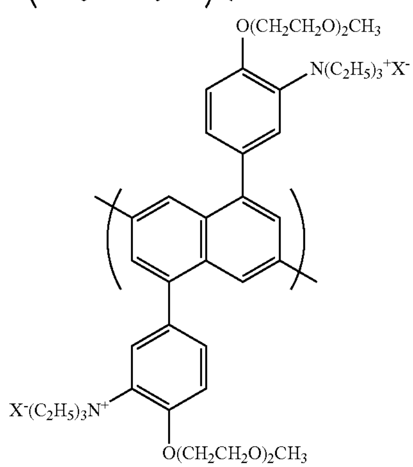
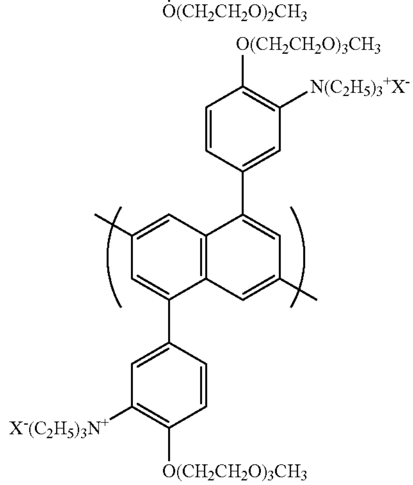

-continued
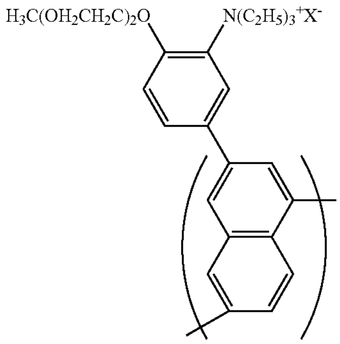
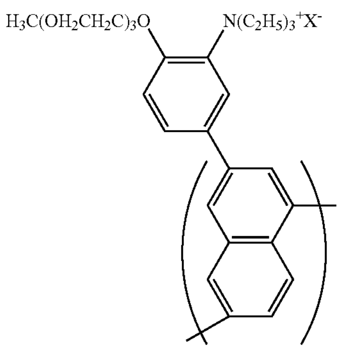
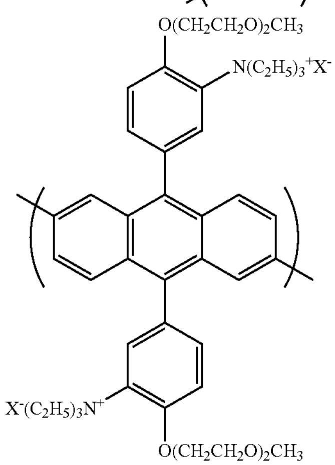
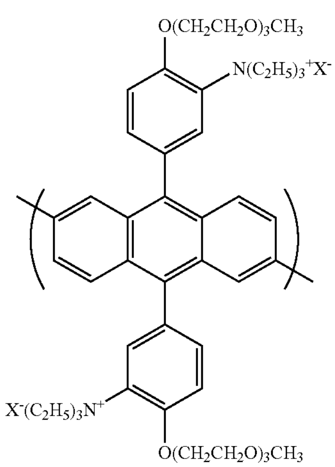
-continued
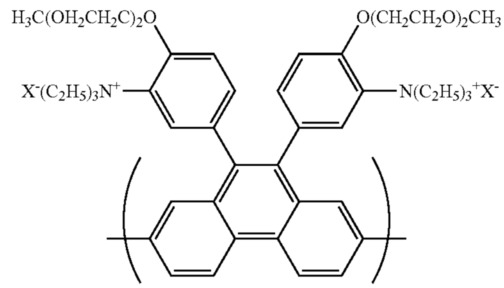
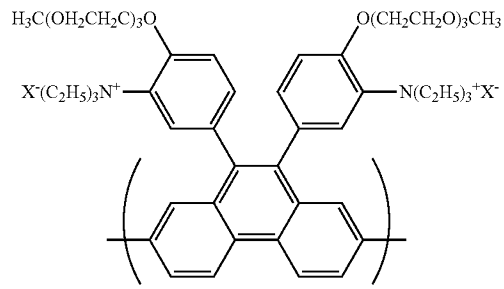
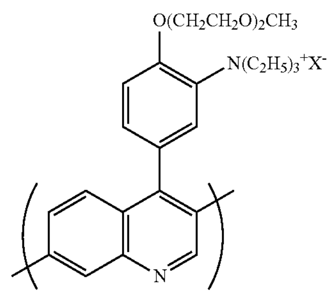
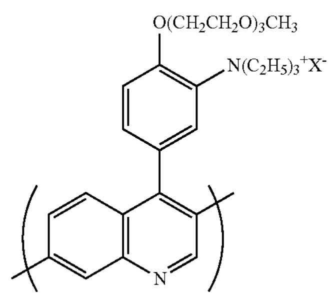
[Chemical Formula 71]
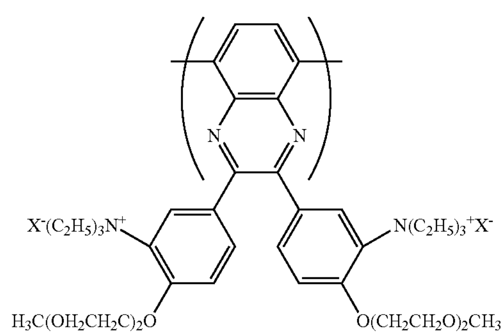

-continued
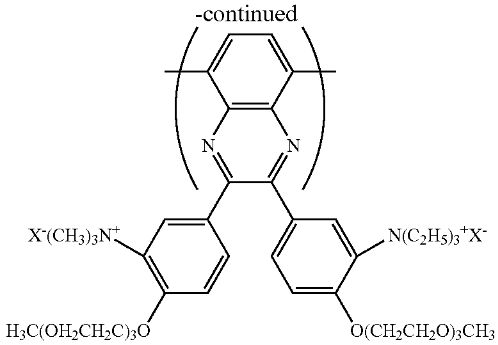
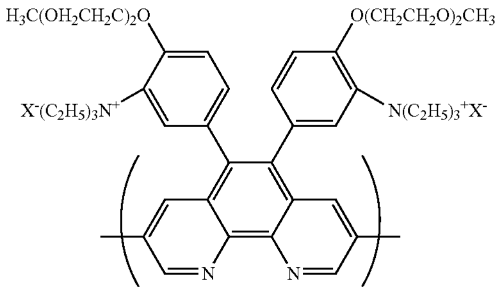
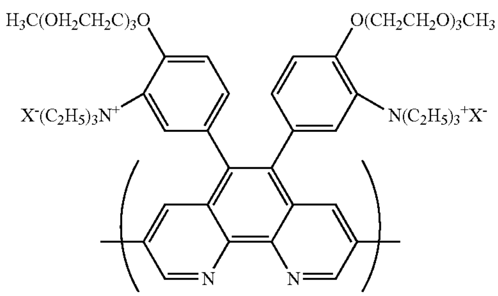
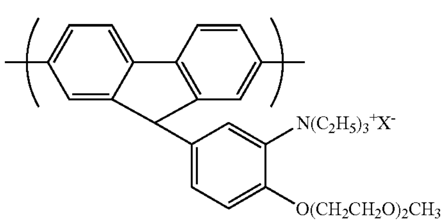
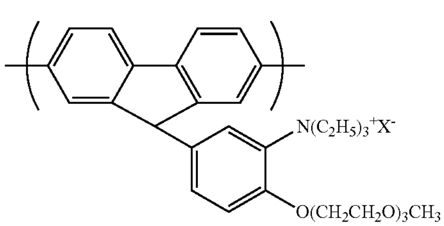
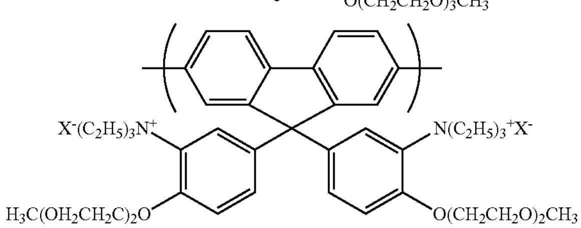
-continued
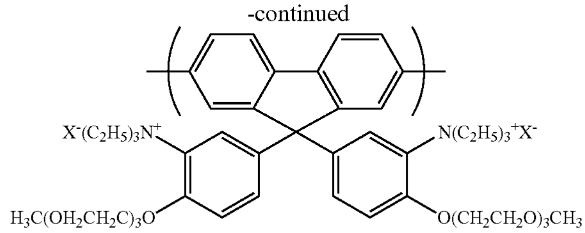
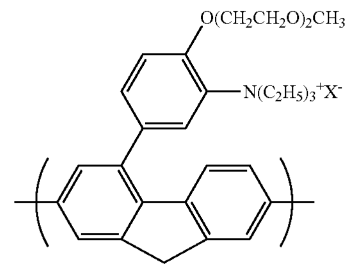
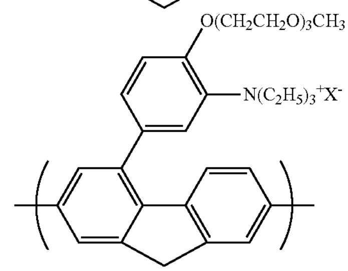
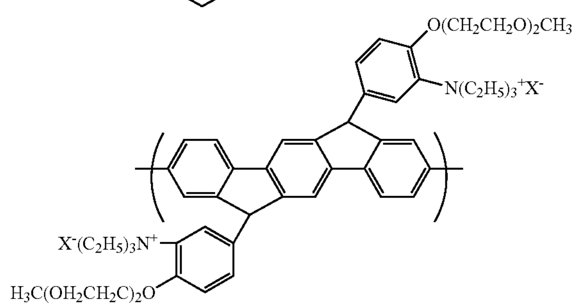
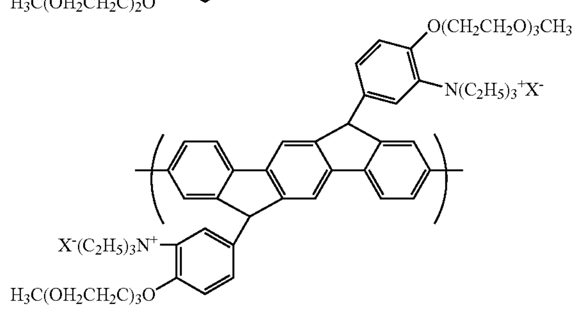
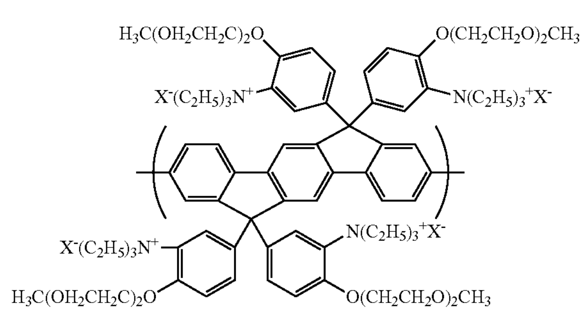

-continued

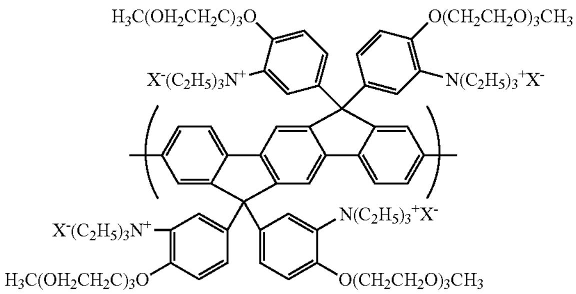

[1.8.6. Examples of Structural Unit Represented by Formula (20)]

Examples of the structural unit represented by Formula (20) include a structural unit represented by the following formulas that optionally has a substituent. In terms of easy synthesis of the polymer compound and electron transport properties, the structural unit is preferably a structural unit represented by Formula $52a^6$, $55a^6$, $55b^6$, $55c^6$, $56b^6$, $57b^6$, $58a^6$, $59a^6$, $60b^6$, $61a^6$, $61c^6$, or $63a^6$. Examples of the substituent include a substituent similar to the substituent shown as examples in the description of the substituent in the description of $R^1$ described above. When a plurality of substituents are present in one formula, each substituent may be the same as or different from each other. In the following formulas, $R^8$, $R^{13}$, $Q^1$, n2, $Y^1$, $M^1$, a1, m4, $Q^3$, n6, $Y^3$, m5, and m6 are the same as the corresponding definitions above. When each of a plurality of $R^8$, $R^{13}$, $Q^1$, n2, $Y^1$, $M^1$, a1, m4, $Q^3$, n6, $Y^3$, m5, and m6 is present in one formula, each of the plurality of $R^8$, $R^{13}$, $Q^1$, n2, $Y^1$, $M^1$, a1, m4, $Q^3$, n6, $Y^3$, m5, and m6 may be the same as or different from each other.

[Chemical Formula 72]

$52a^6$

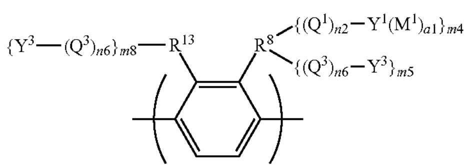

$52b^6$

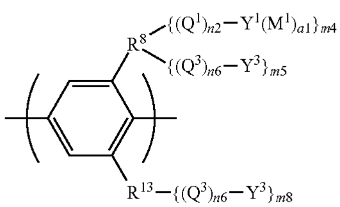

$53a^6$

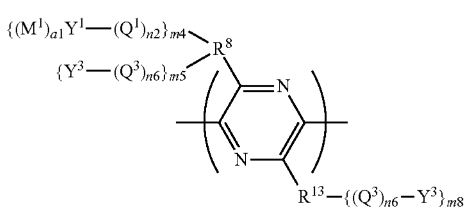

-continued $55a^6$

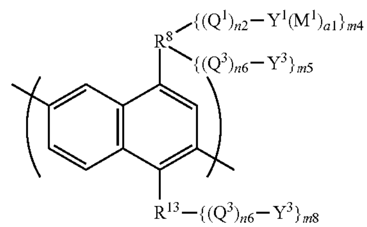

$55b^6$

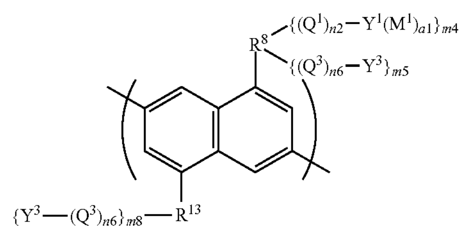

$55c^6$

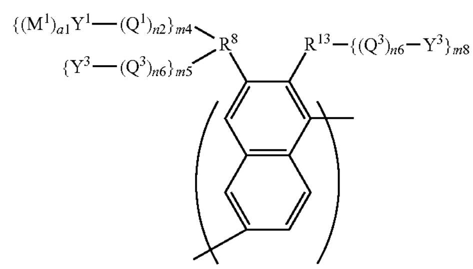

$56b^6$

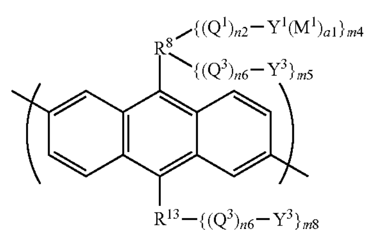

$57b^6$

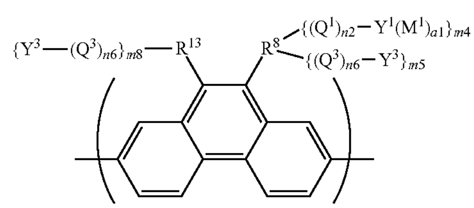

$58a^6$

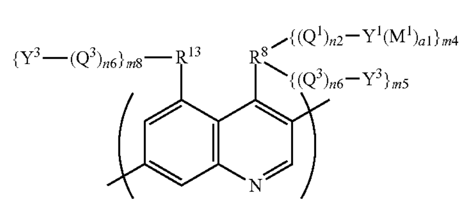

$58b^6$

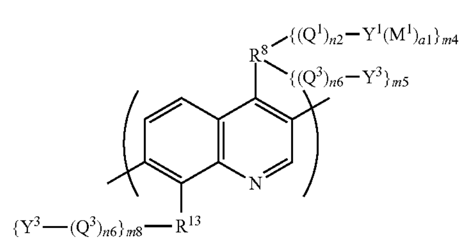

-continued
$58c^6$
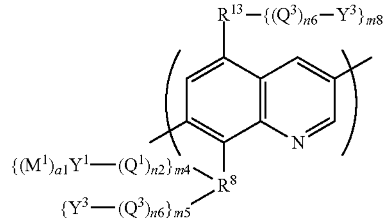
$59a^6$
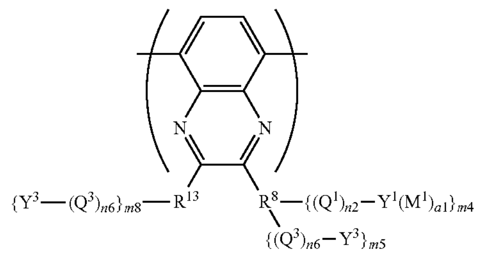
[Chemical Formula 73]
$60b^6$
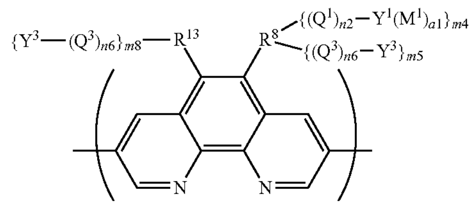
$61a^6$
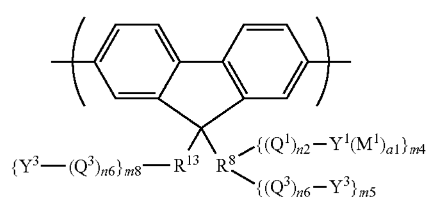
$61c^6$
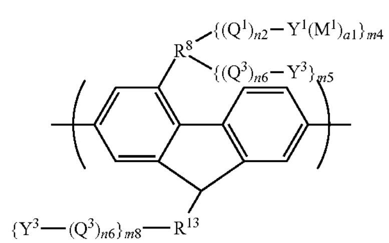
$62a^6$
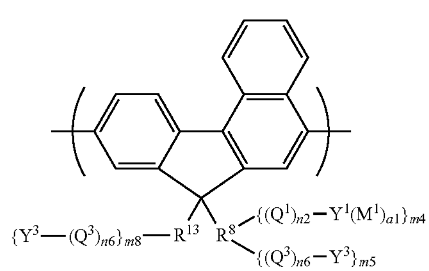
-continued
$63a^6$
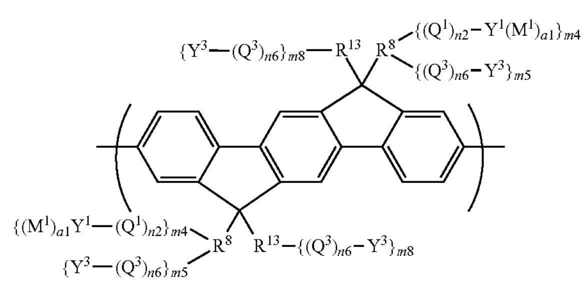
[Chemical Formula 74]
$52a^7$
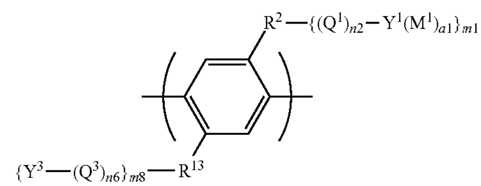
$52b^7$
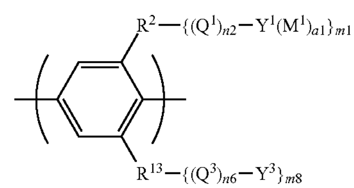
$53a^7$
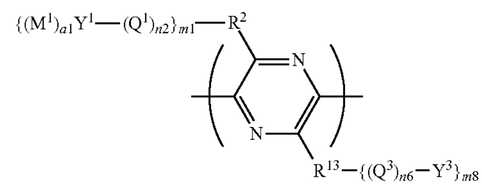
$55a^7$
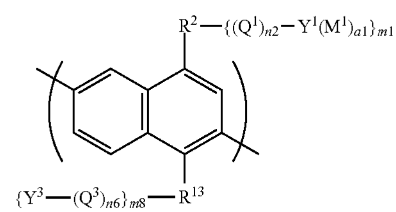
$55b^7$
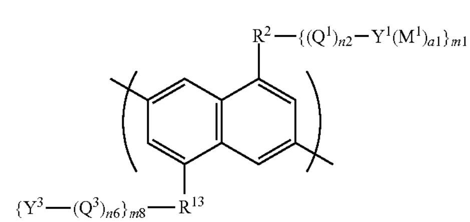
$55c^7$
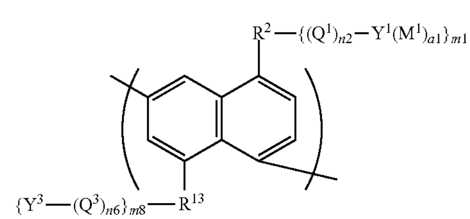

-continued

56b7

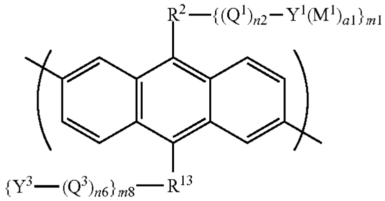

57b7

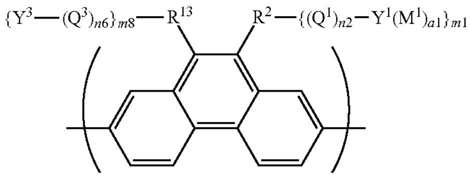

58a7

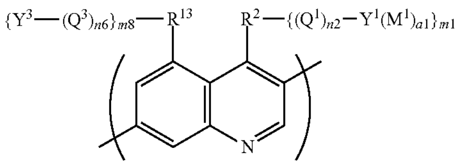

58b7

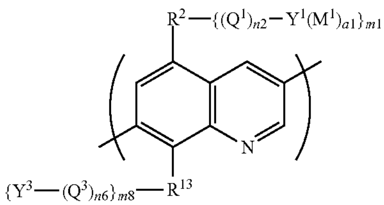

58c7

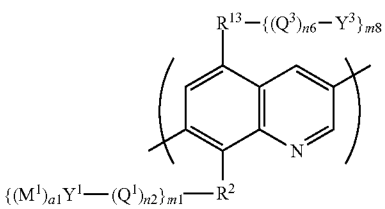

59b7

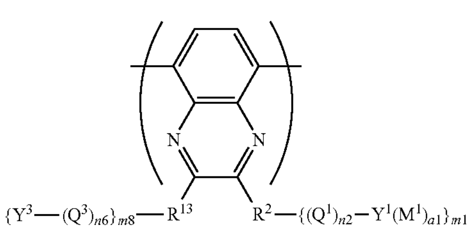

[Chemical Formula 75]

60b7

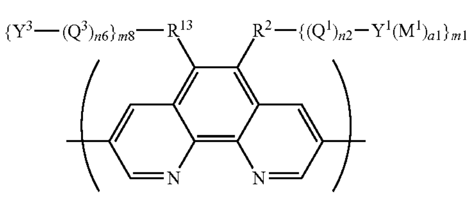

-continued

61b7

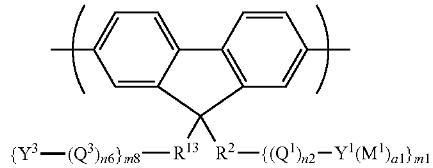

61c7

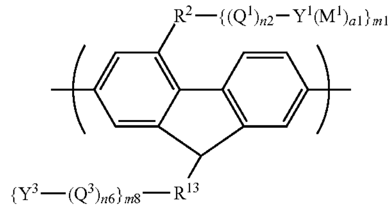

62b7

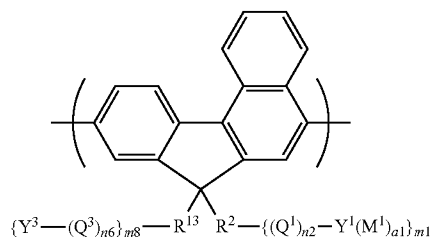

63b7

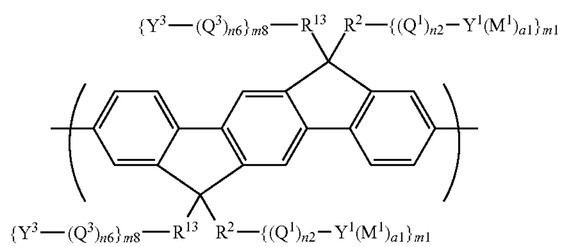

In the formulas described above, in terms of easy synthesis, $R^2$ is preferably a group in which m1 hydrogen atom(s) is(are) removed from an aryl group having 6 to 30 carbon atoms that optionally has a substituent. In the formulas described above, in terms of easy synthesis, $R^8$ is preferably a group in which (m4+m5) hydrogen atoms are removed from an aryl group having 6 to 30 carbon atoms that optionally has a substituent. The aryl group having 6 to 30 carbon atoms that optionally has a substituent is preferably a phenyl group, a 1-naphthyl group, a 2-naphthyl group, a 1-anthracenyl group, a 2-anthracenyl group, a 9-anthracenyl group, or a group among these groups in which at least one hydrogen atom is substituted with a substituent.

Examples of the substituent include a substituent similar to the substituent shown as examples in the description of $R^1$ described above. When $R^2$ has a plurality of substituents, each substituent may be the same as or different from each other.

Examples of the structural unit represented by Formula (20) may also include a structural unit represented by the following formulas that optionally has a substituent. Examples of the substituent include a substituent similar to the substituent shown as examples in the description of the substituent in the description of $R^1$ described above. When a plurality of substituents are present in one formula, each substituent may be the same as or different from each other. In the following formulas, M is the same as the corresponding definition above. When a plurality of M are present in one formula, each M may be the same as or different from each other.
[Chemical Formula 76]
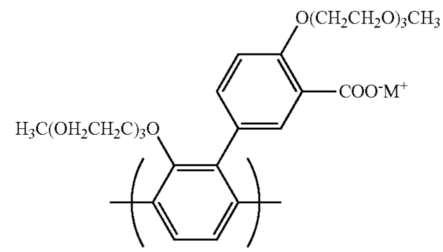
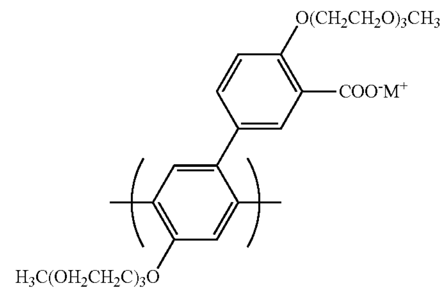
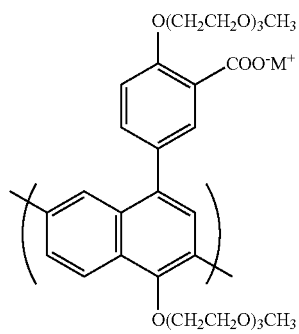
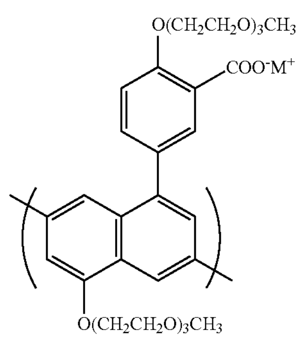
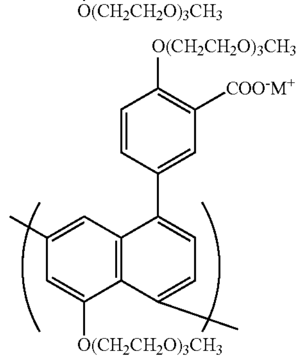
-continued
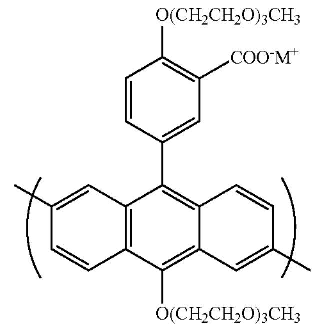
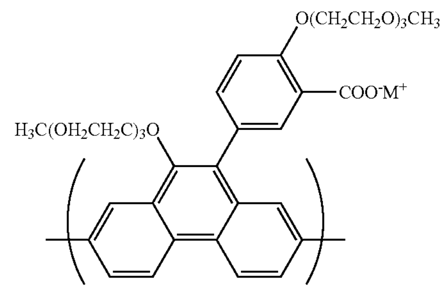
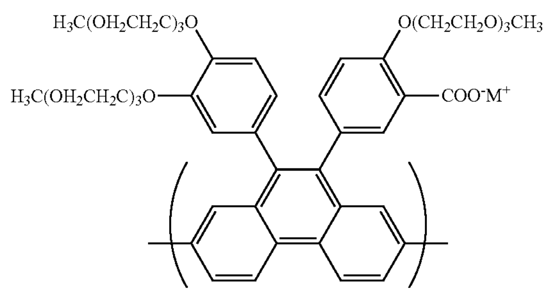
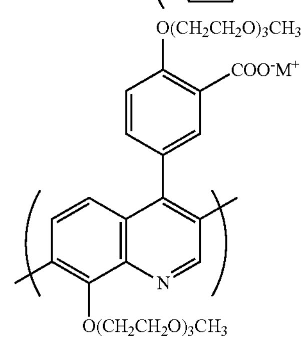
[Chemical Formula 77]
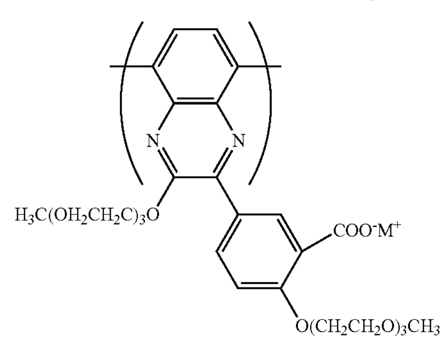

-continued
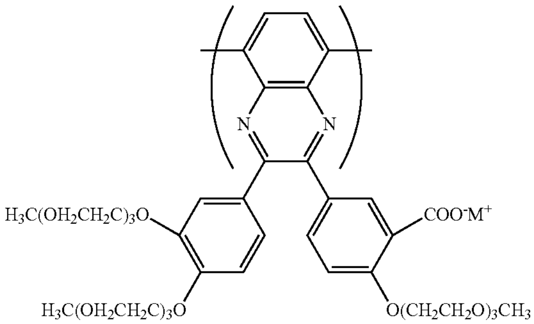
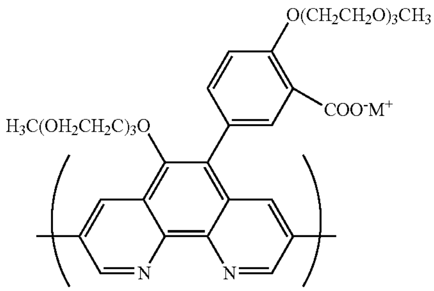
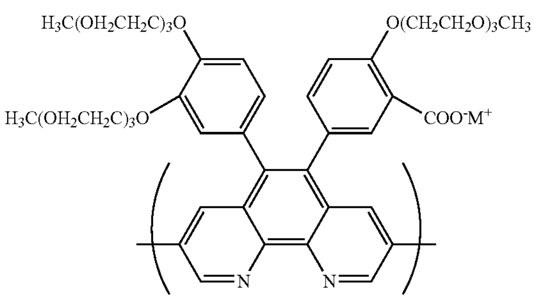
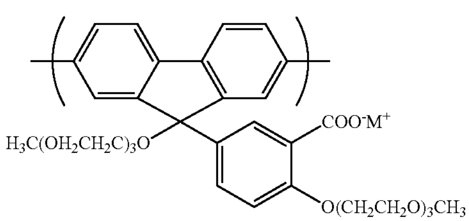
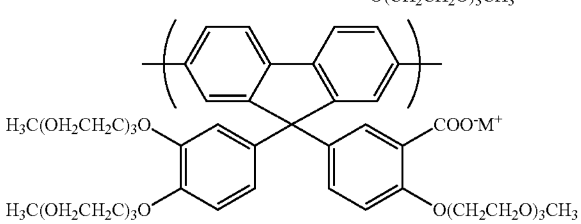
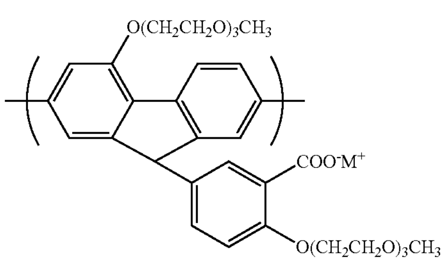
-continued
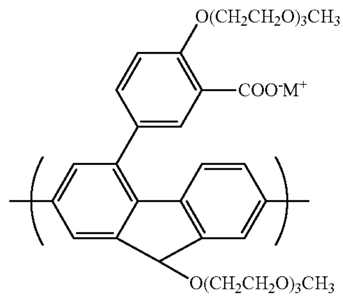
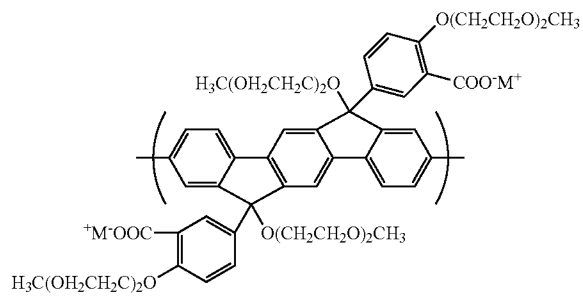
[Chemical Formula 78]
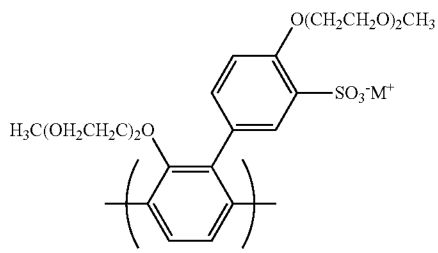
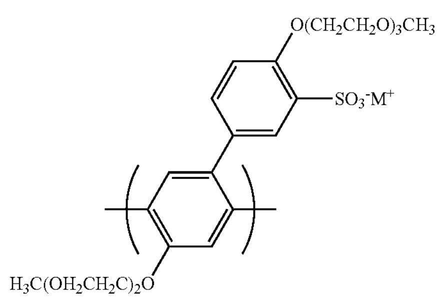
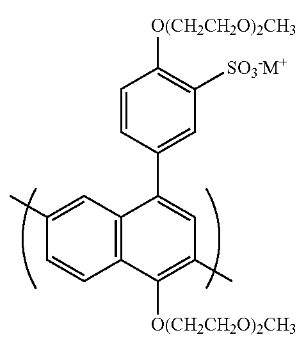

-continued
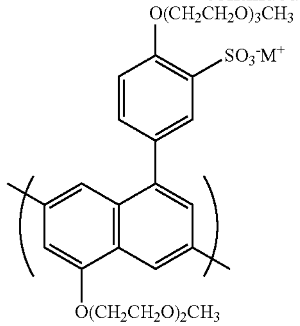
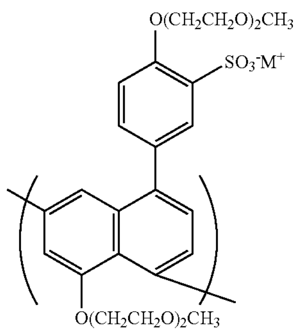
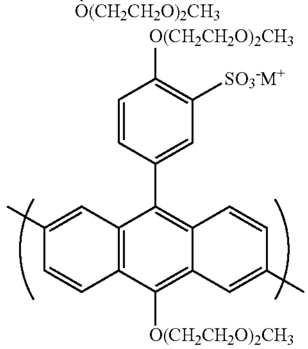
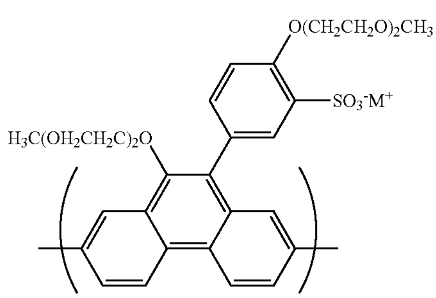
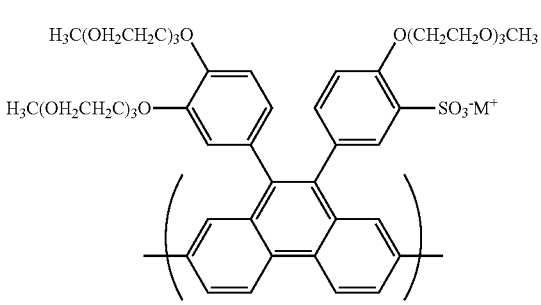
-continued
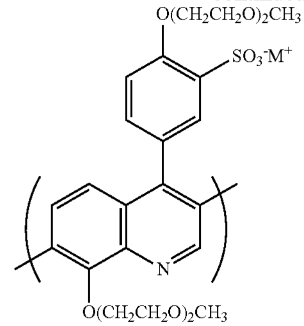
[Chemical Formula 79]
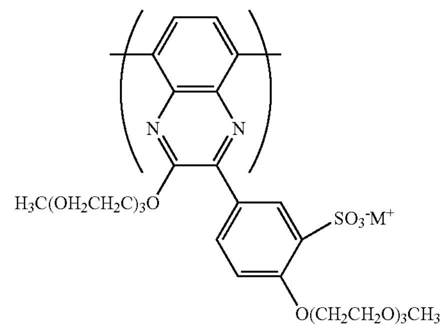
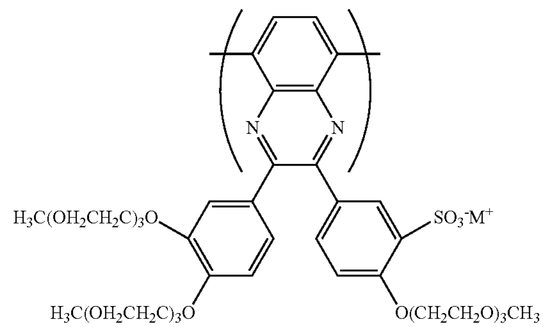
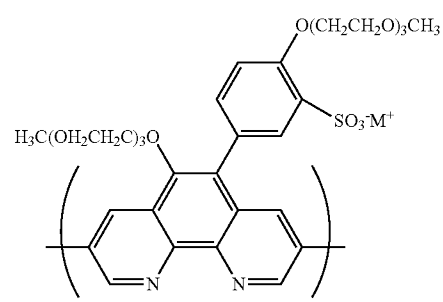
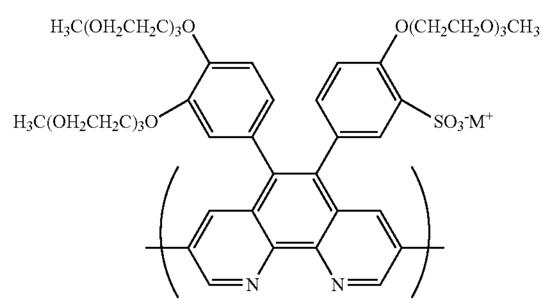

-continued
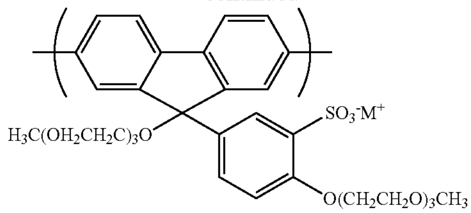
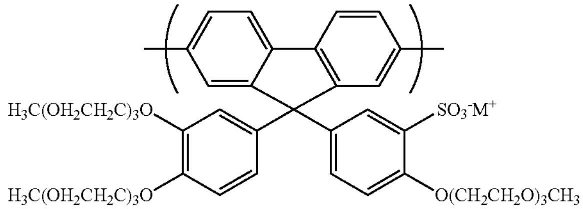
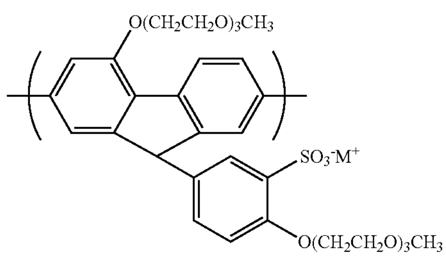
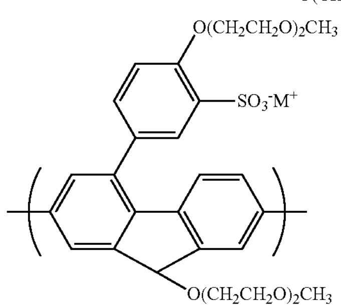
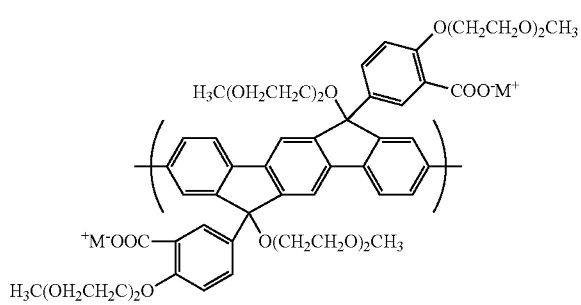
[Chemical Formula 80]
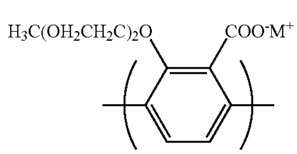
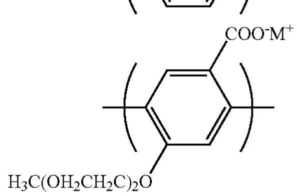
-continued
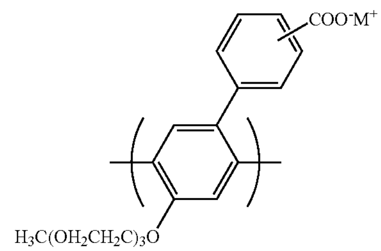
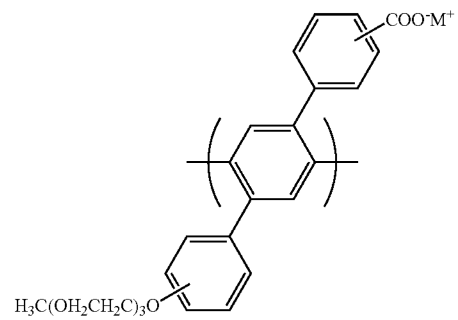
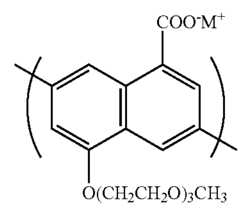
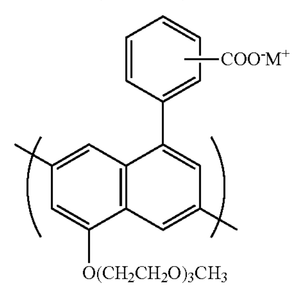
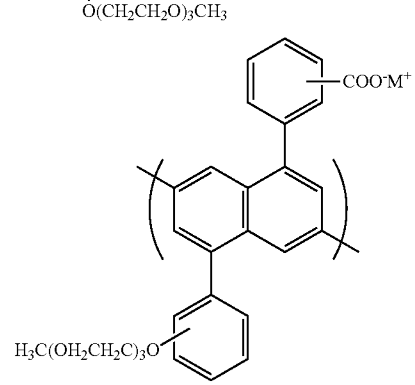
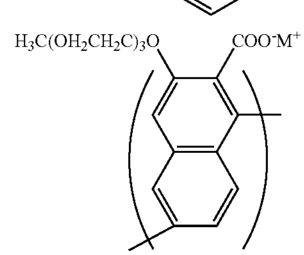

-continued
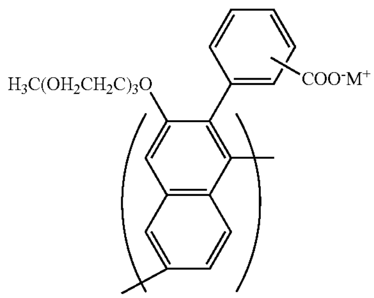
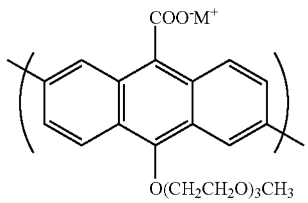
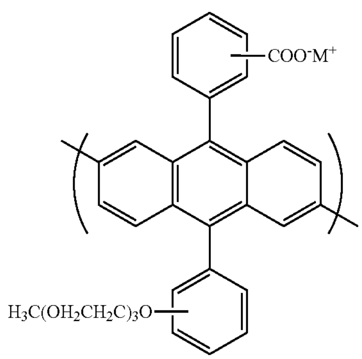
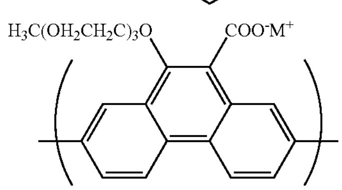
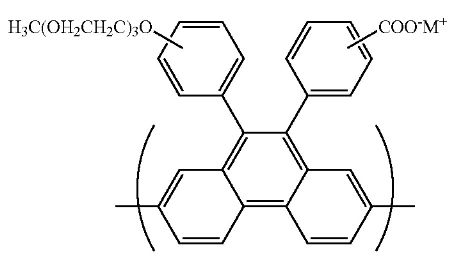
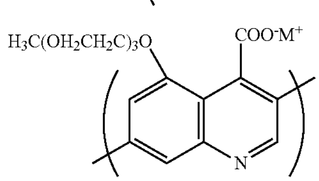
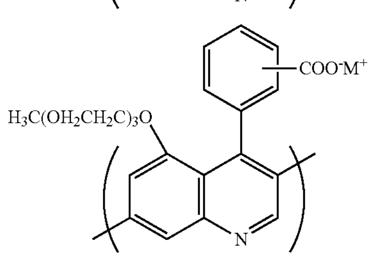
-continued
[Chemical Formula 81]
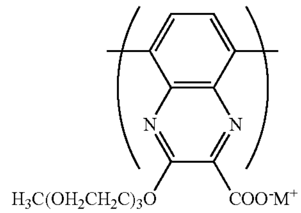
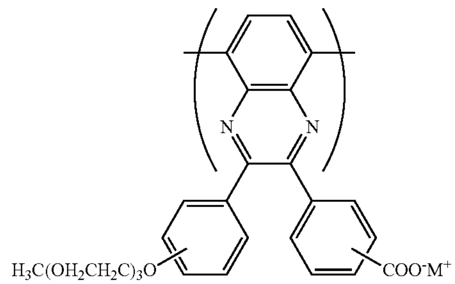
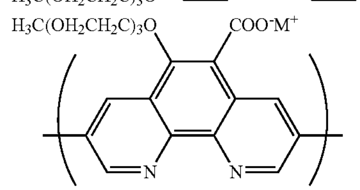
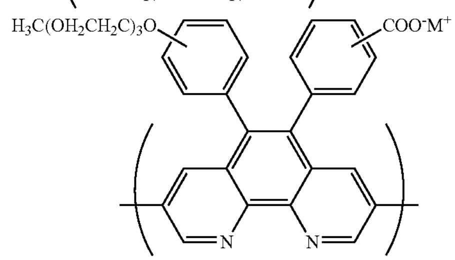
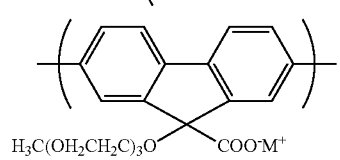
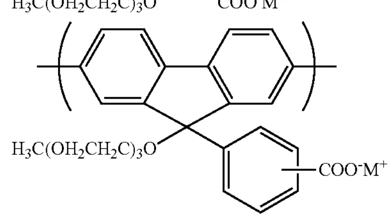
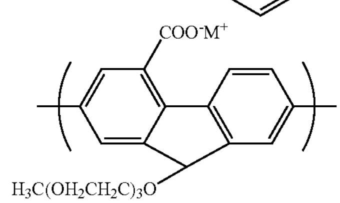
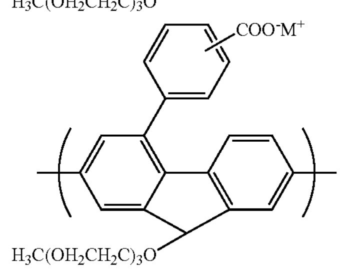

-continued
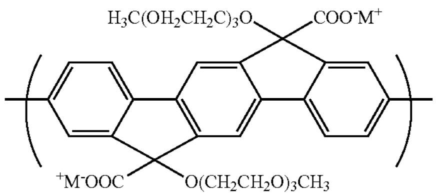
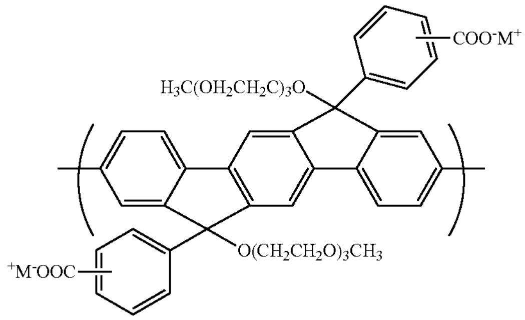
[Chemical Formula 82]
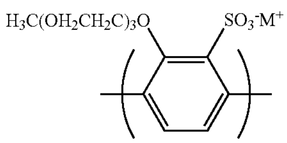
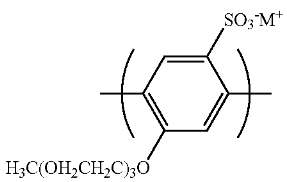
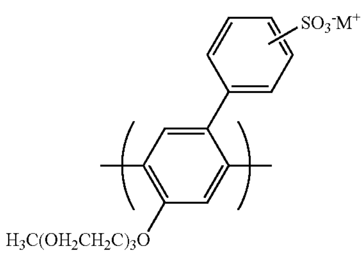
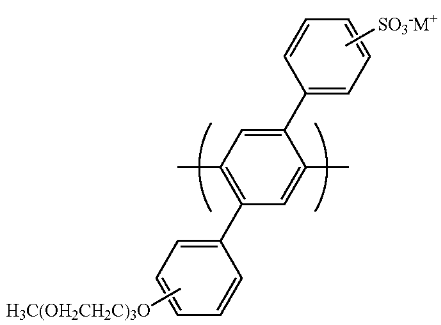
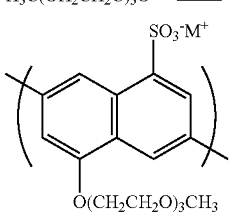
-continued
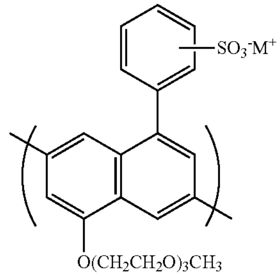
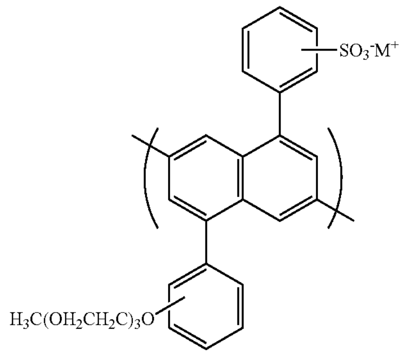
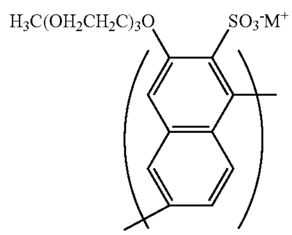
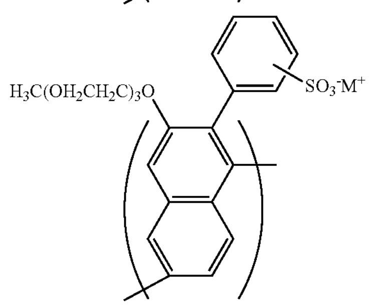
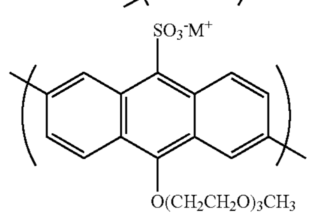
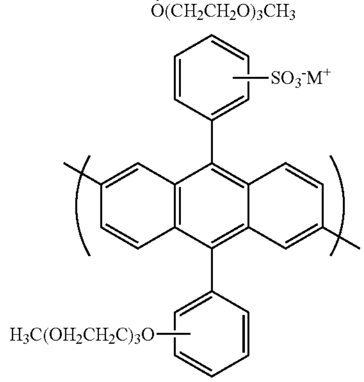

-continued

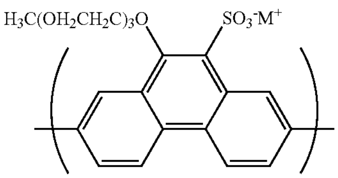

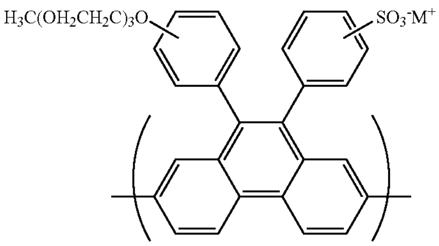

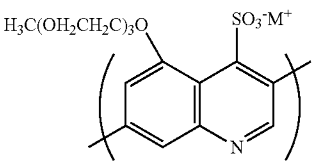

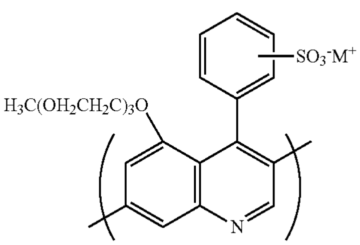

[Chemical Formula 83]

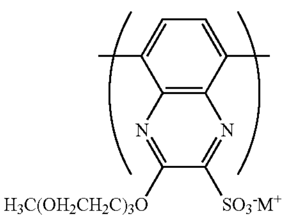

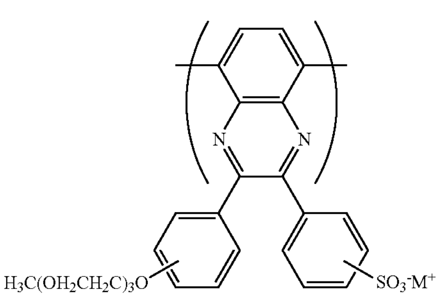

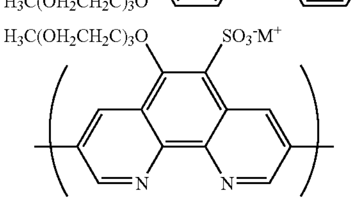

-continued

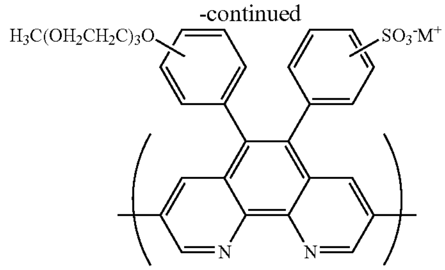

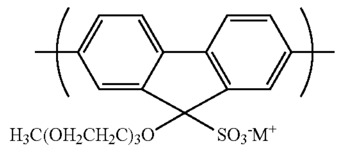

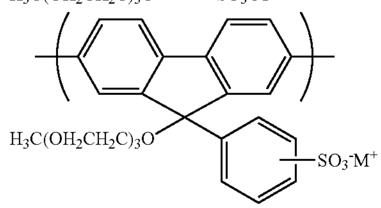

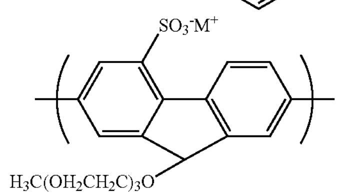

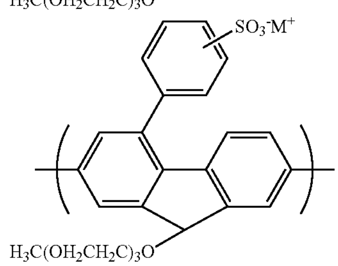

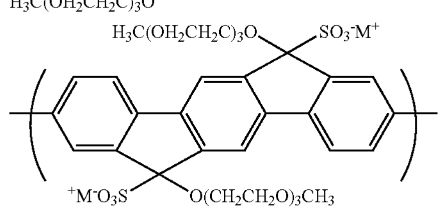

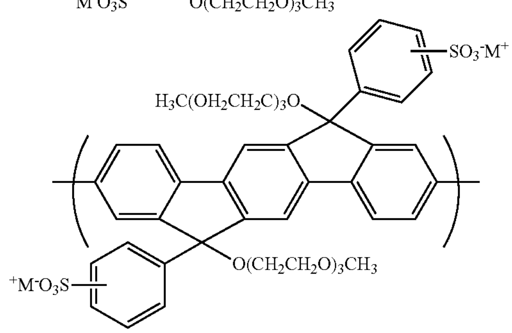

[1.8.7. Examples of Structural Unit Represented by Formula (22)]

Examples of the structural unit represented by Formula (22) include a structural unit represented by the following formulas that optionally has a substituent. In terms of easy synthesis of the polymer compound and electron transport properties, the structural unit is preferably a structural unit represented by Formula $52a^8$, $55a^8$, $55b^8$, $55c^8$, $56b^8$, $57b^8$, $58a^8$, $59a^8$, $60b^8$, $61a^8$, $61c^8$, or $63a^8$. Examples of the substituent include a substituent similar to the substituent shown as examples in the description of the substituent in the description of $R^1$ described above. When a plurality of substituents are present in one formula, each substituent may be the same as or different from each other. In the following formulas, $R^{10}$, $R^4$, $Q^2$, n4, $Y^2$, $M^2$, a2, m2, m6, $Q^3$, n6, $Y^3$, m7, $R^{13}$, and m8 are the same as the corresponding definitions above. When each of a plurality of $R^{10}$, $R^4$, $Q^2$, n4, $Y^2$, $M^2$, m2, m6, $Q^3$, n6, $Y^3$, m7, $R^{13}$, and m8 is present in one formula, each of the plurality of $R^{10}$, $R^4$, $Q^2$, n4, $Y^2$, $M^2$, m2, m6, $Q^3$, n6, $Y^3$, m7, $R^{13}$, and m8 may be the same as or different from each other.

[Chemical Formula 84]

$52a^8$

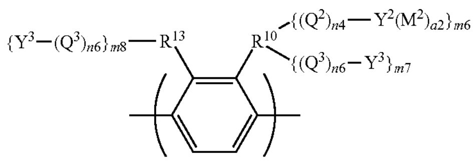

$52b^8$

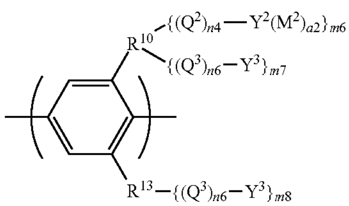

$53a^8$

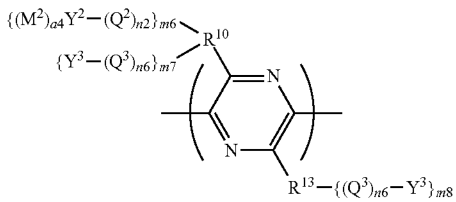

$55a^8$

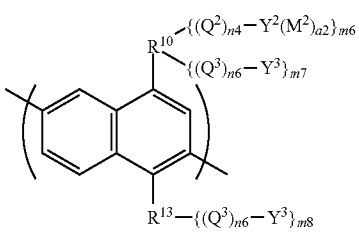

$55b^8$

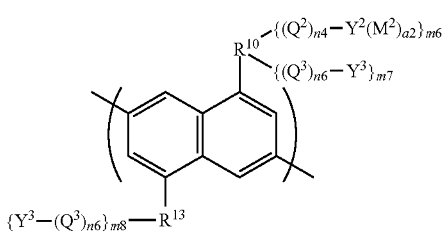

-continued $55c^8$

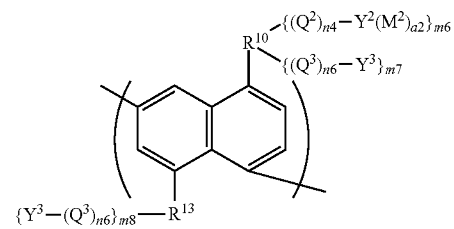

$56b^8$

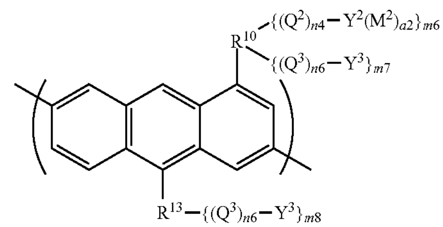

$57b^8$

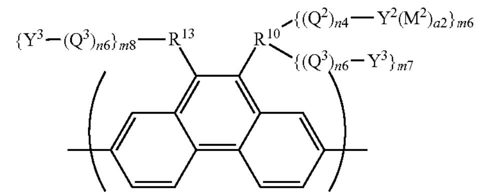

$58a^8$

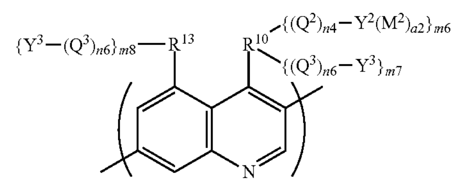

$58b^8$

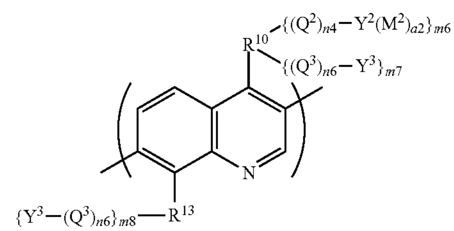

$58c^8$

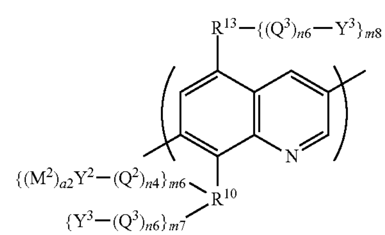

$59a^8$

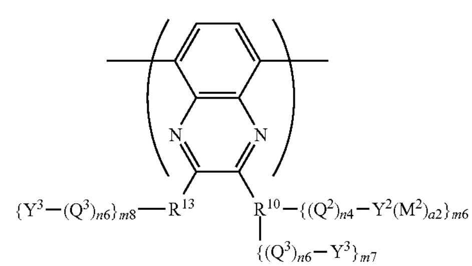

-continued
[Chemical Formula 85]
60b[8]
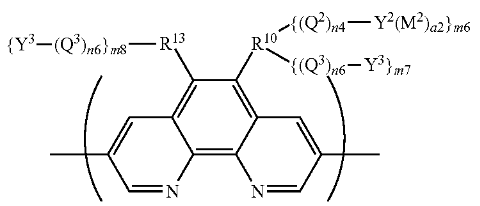
61a[8]
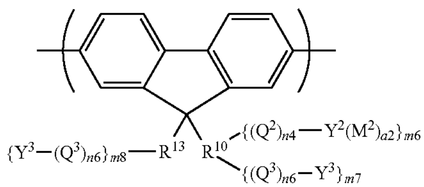
61c[8]
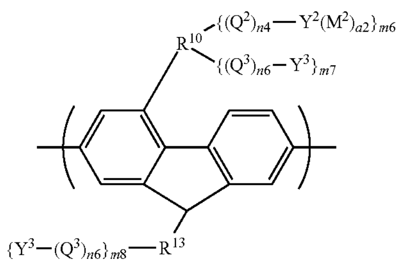
62a[8]
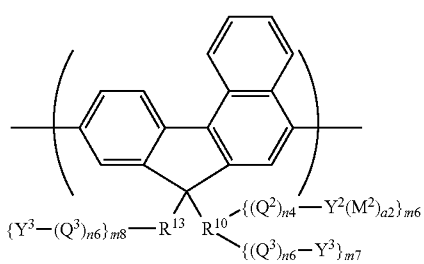
63a[8]
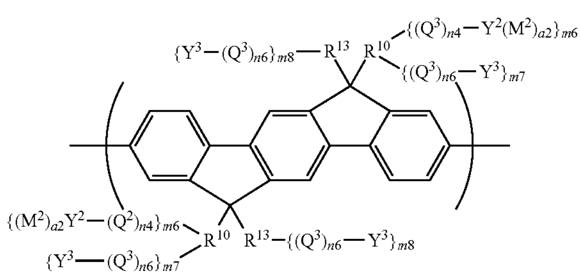
[Chemical Formula 86]
52a[9]
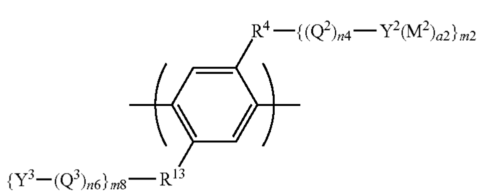
-continued
52b[9]
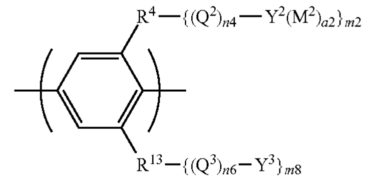
53a[9]
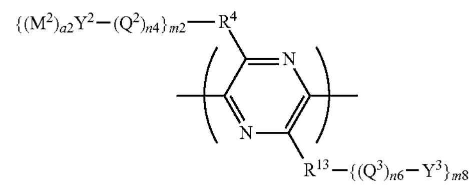
55a[9]
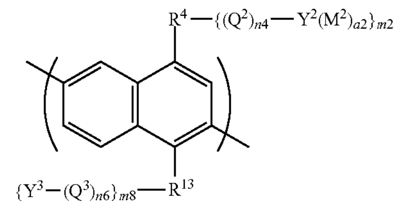
55b[9]
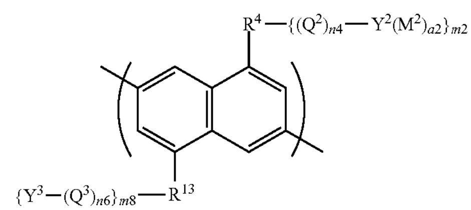
55c[9]
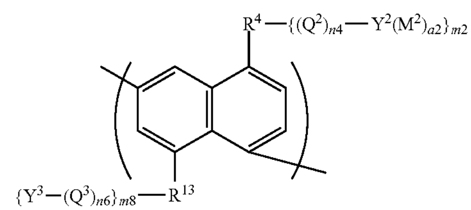
56b[9]
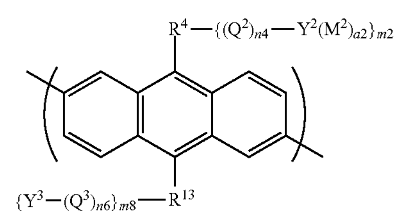
57b[9]
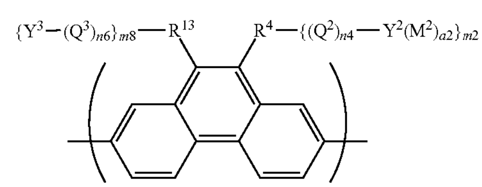
58a[9]
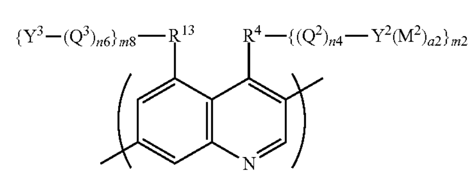

-continued

58b$^{9}$

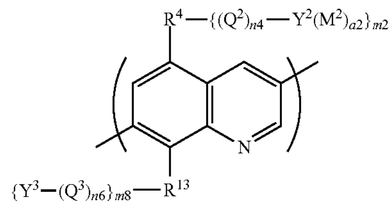

58c$^{9}$

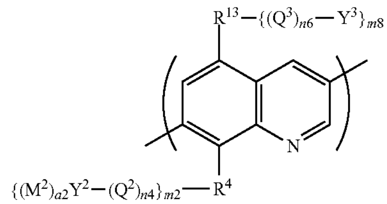

59b$^{9}$

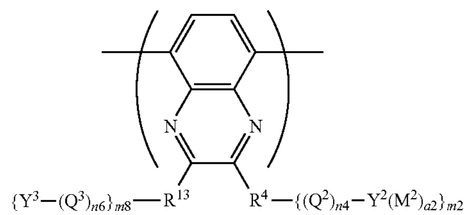

[Chemical Formula 87]

60b$^{9}$

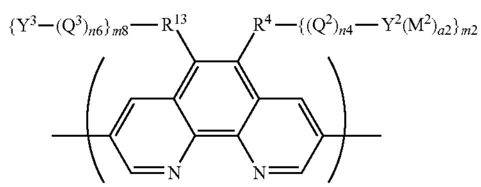

61b$^{9}$

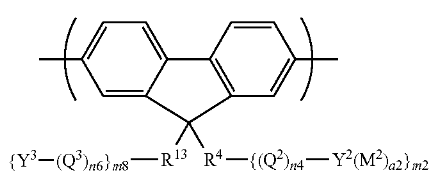

61c$^{9}$

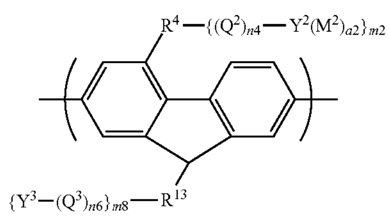

62b$^{9}$

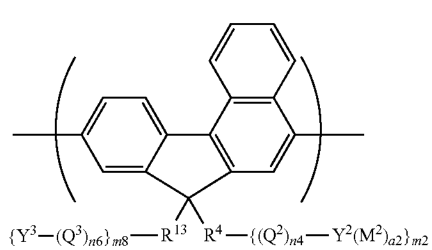

-continued

63b$^{9}$

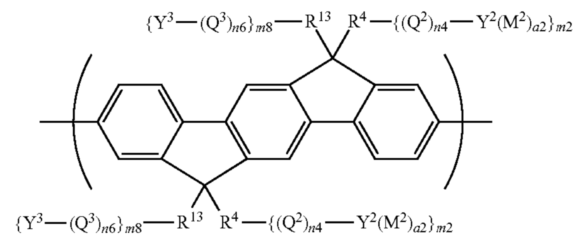

In the formulas described above, in terms of easy synthesis, $R^4$ is preferably a group in which m2 hydrogen atom(s) is(are) removed from an aryl group having 6 to 30 carbon atoms that optionally has a substituent. In the formulas described above, in terms of easy synthesis, $R^{10}$ is preferably a group in which (m6+m7) hydrogen atoms are removed from an aryl group having 6 to 30 carbon atoms that optionally has a substituent. The aryl group having 6 to 30 carbon atoms that optionally has a substituent is preferably a phenyl group, a 1-naphthyl group, a 2-naphthyl group, a 1-anthracenyl group, a 2-anthracenyl group, a 9-anthracenyl group, or a group among these groups in which at least one hydrogen atom is substituted with a substituent.

Examples of the substituent include a substituent similar to the substituent shown as examples in the description of $R^4$ described above. When $R^4$ has a plurality of substituents, each substituent may be the same as or different from each other.

Examples of the structural unit represented by Formula (22) also include a structural unit represented by the following formulas that optionally has a substituent. Examples of the substituent include a substituent similar to the substituent shown as examples in the description of $R^4$ described above. When a plurality of substituents are present in one formula, each substituent may be the same as or different from each other. In the following formulas, X is the same as the corresponding definition above. When a plurality of X are present in one formula, each X may be the same as or different from each other.

[Chemical Formula 88]

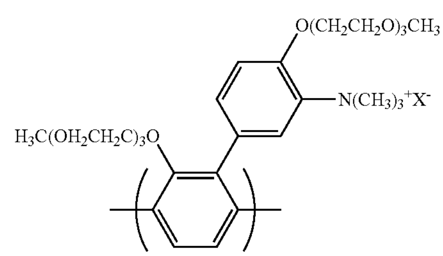

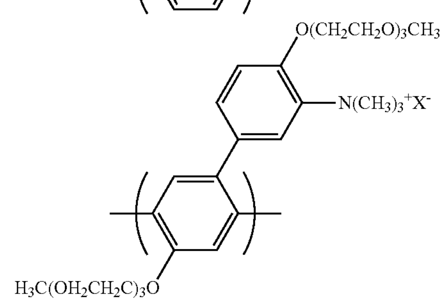

-continued
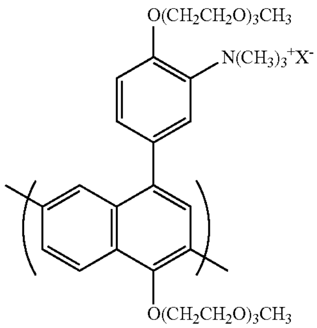
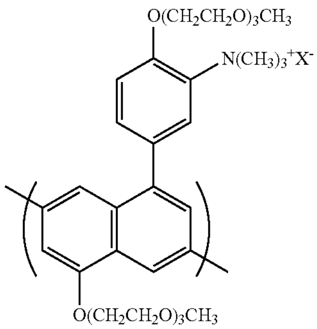
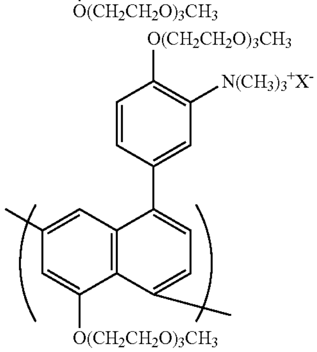
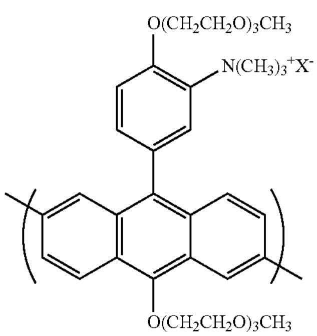
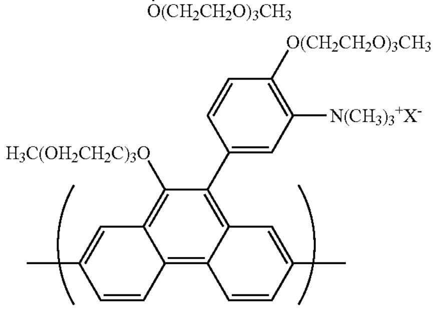
-continued
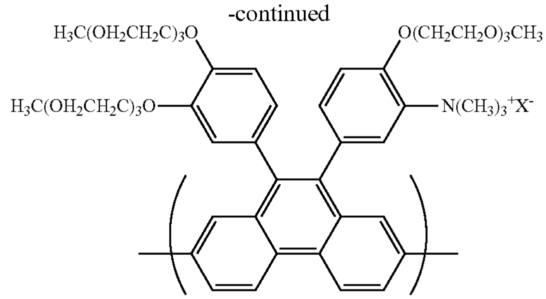
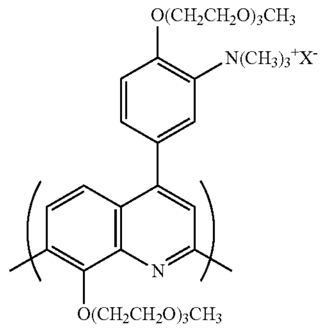
[Chemical Formula 89]
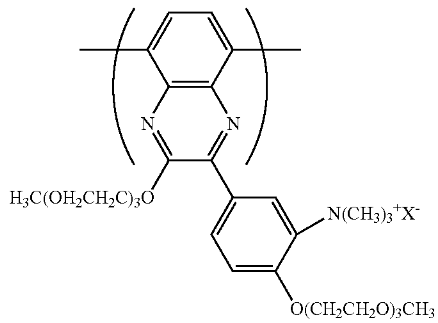
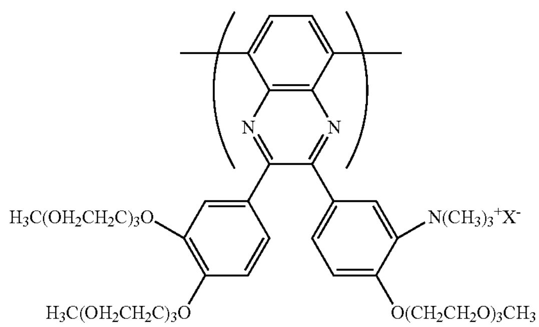
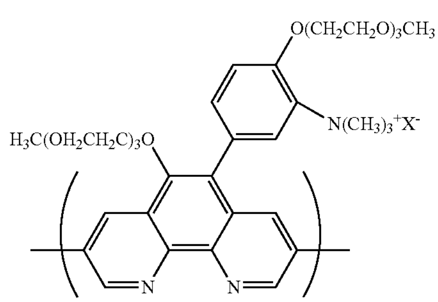

-continued
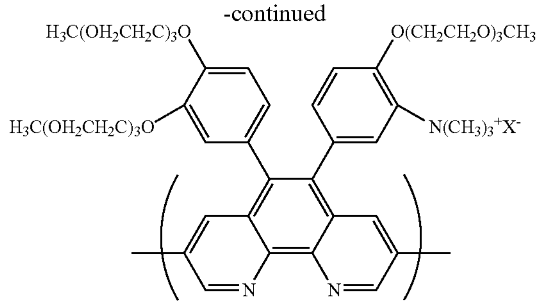
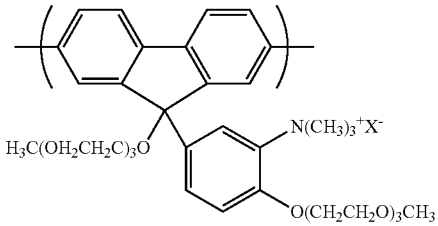
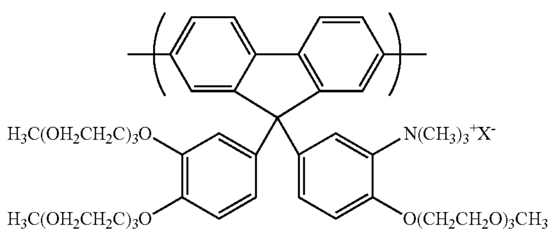
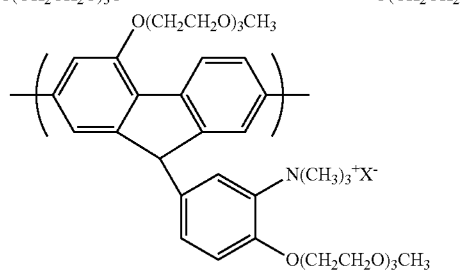
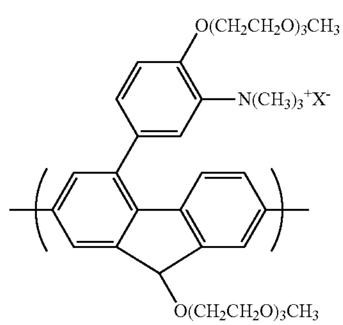
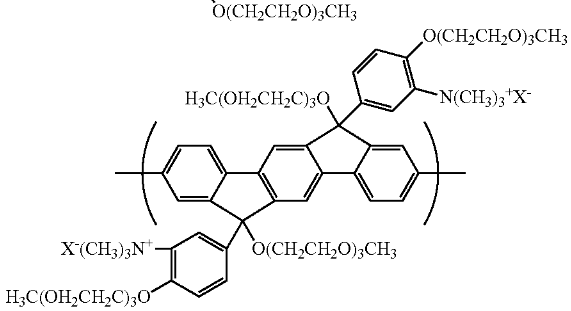
-continued
[Chemical Formula 90]
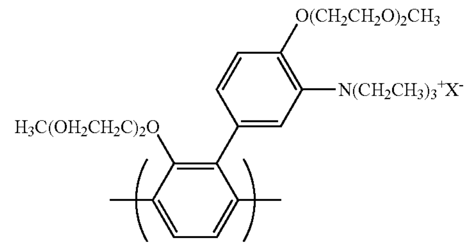
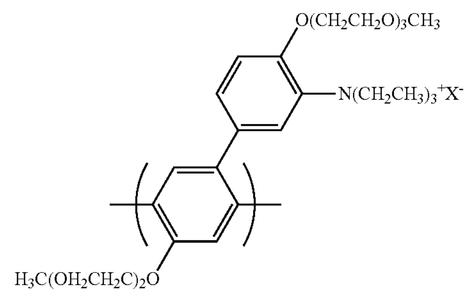
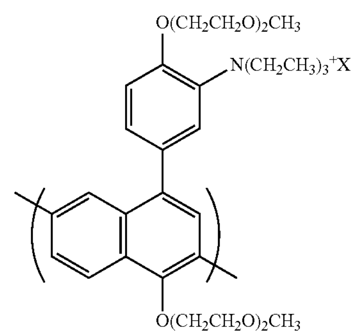
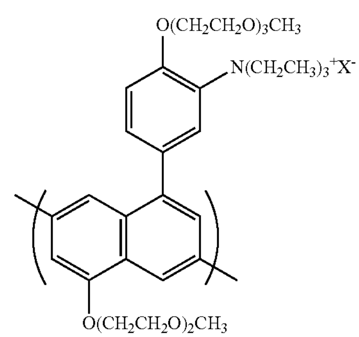
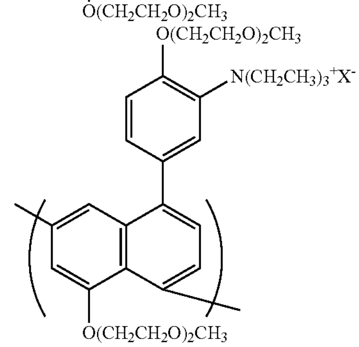

-continued
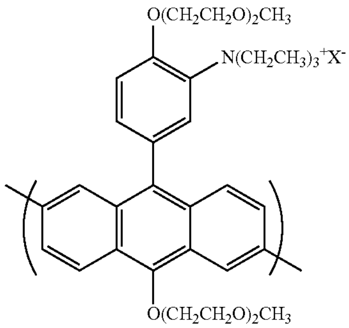
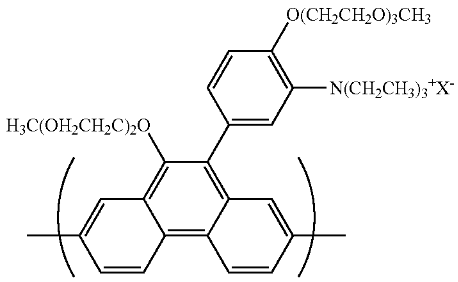
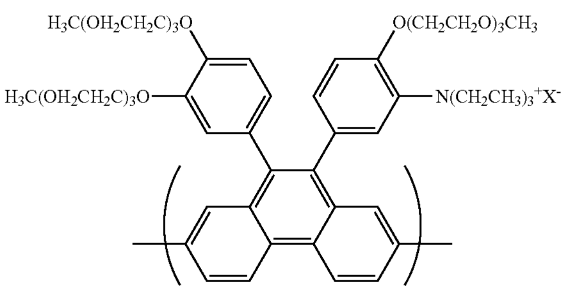
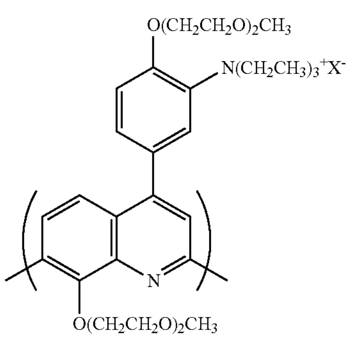
[Chemical Formula 91]
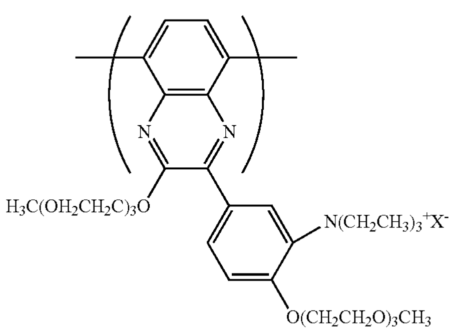
-continued
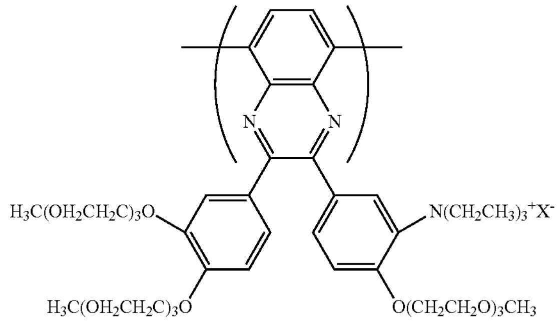
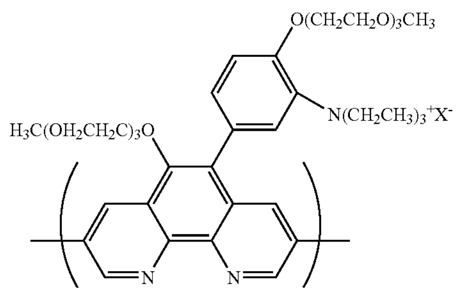
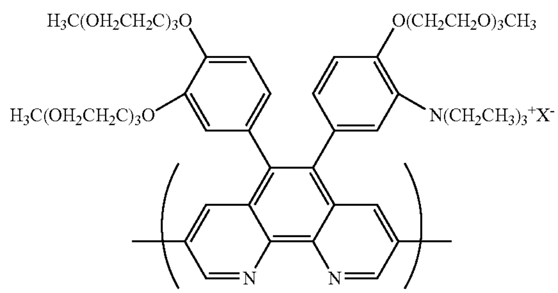
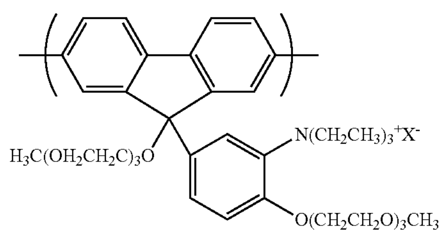
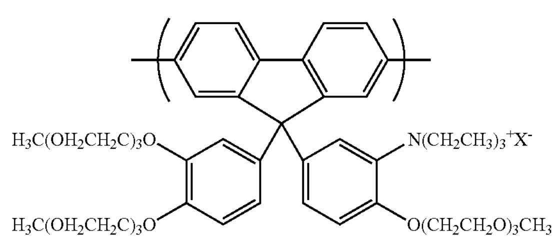
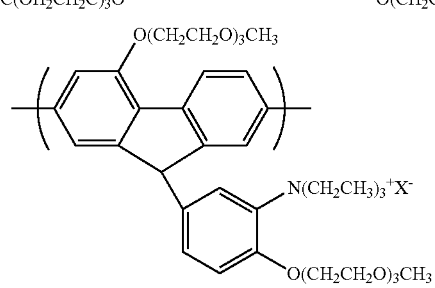

-continued
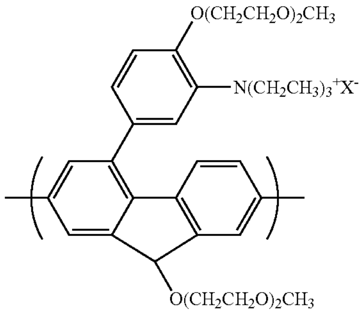
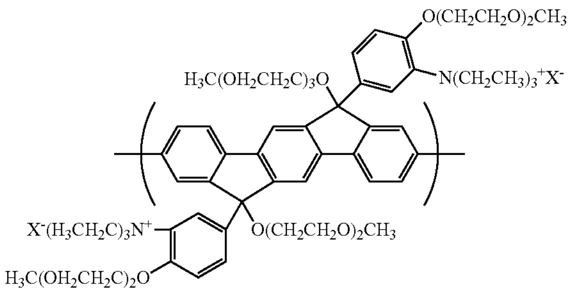
[Chemical Formula 92]
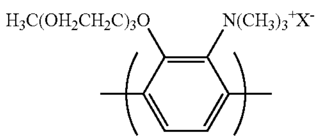
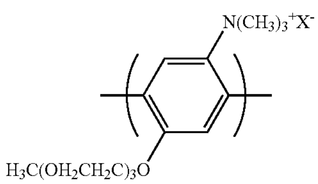
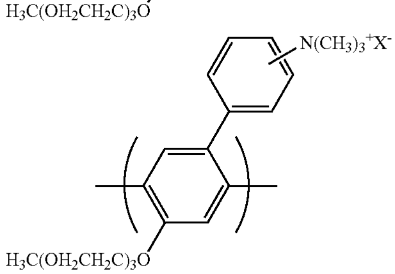
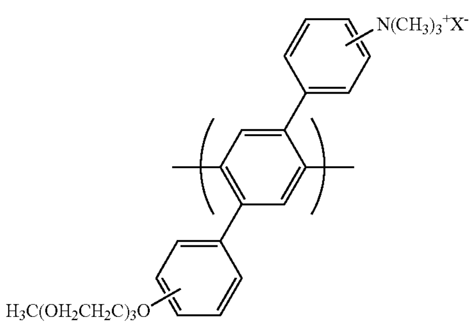
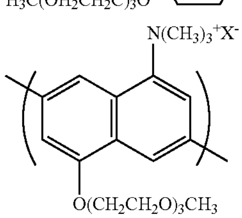
-continued
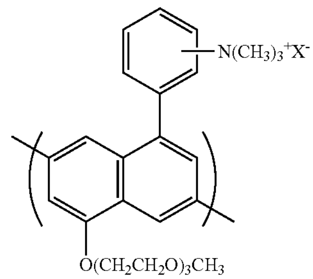
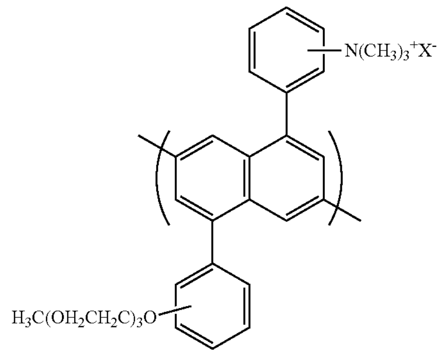
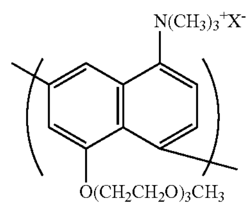
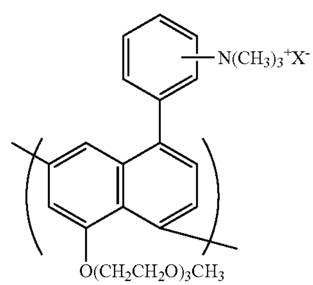
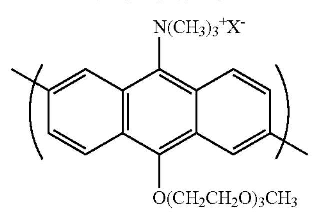
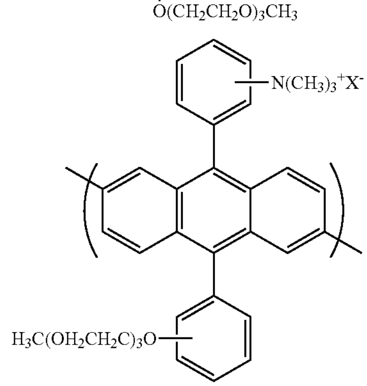

-continued
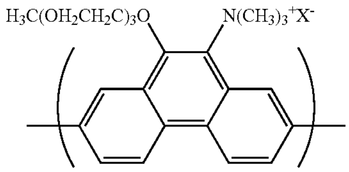
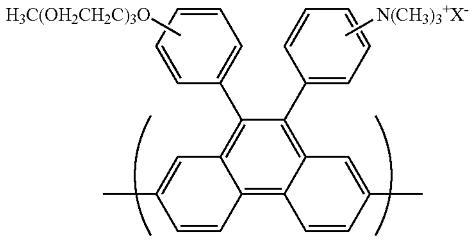
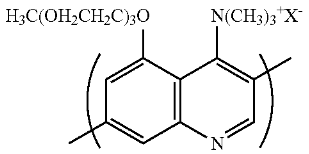
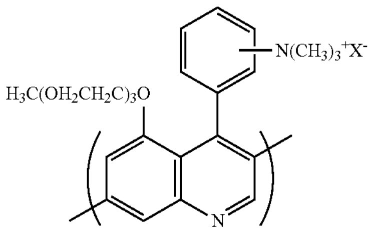
[Chemical Formula 93]
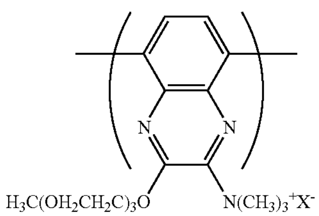
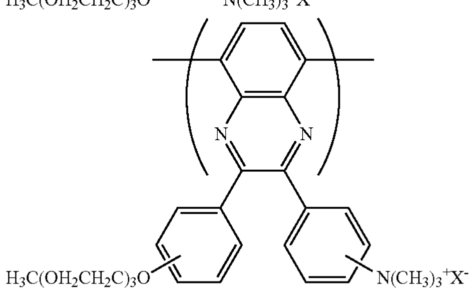
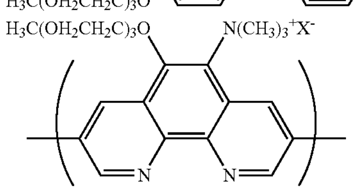
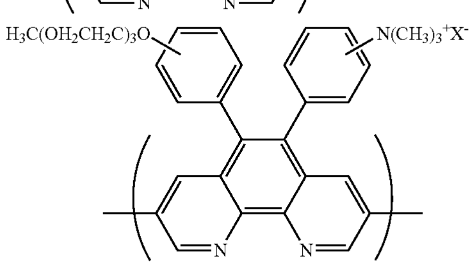
-continued
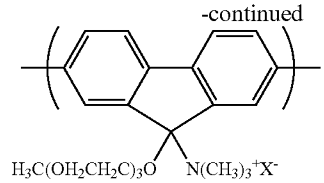
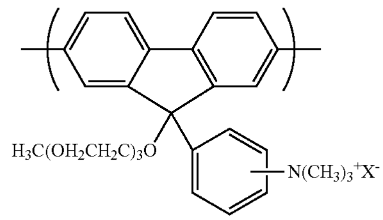
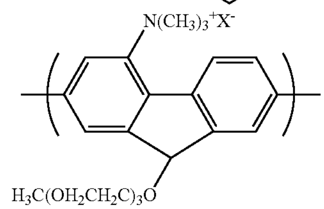
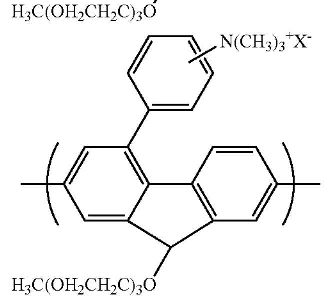
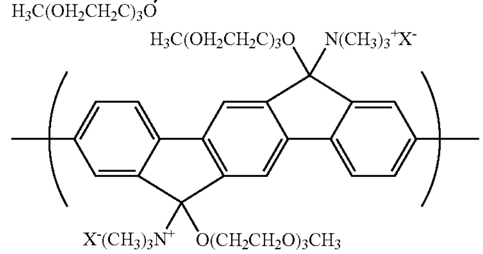
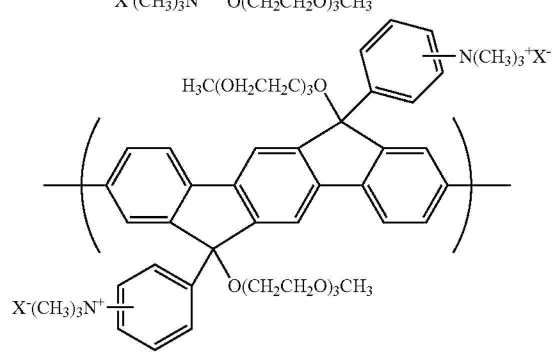
[Chemical Formula 94]
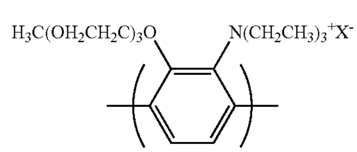

-continued
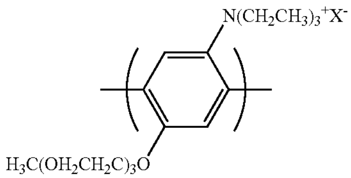
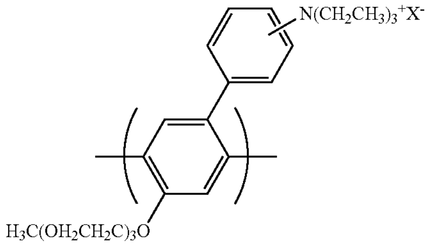
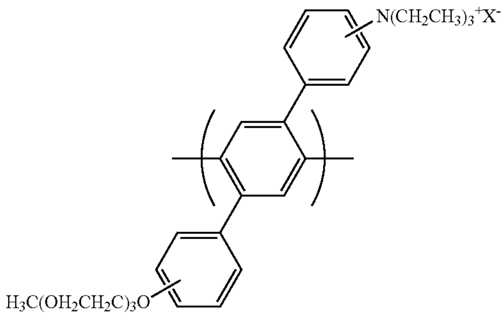
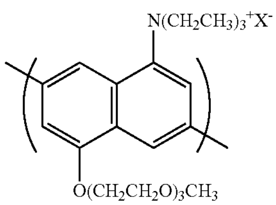
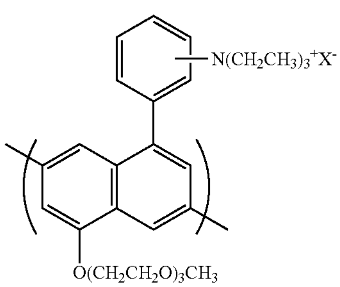
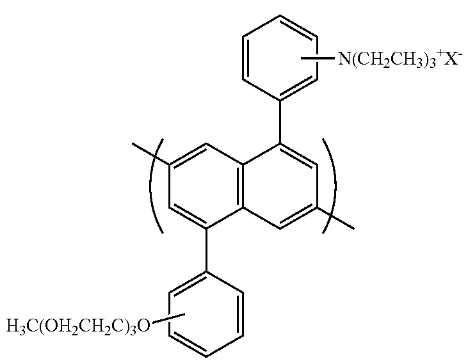
-continued
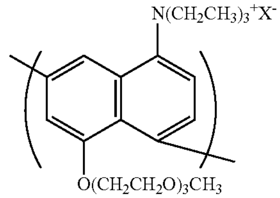
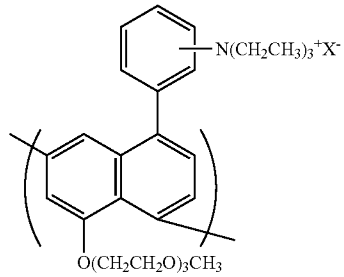
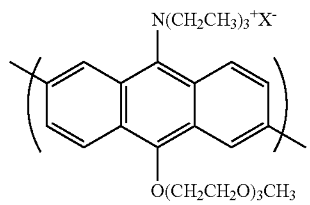
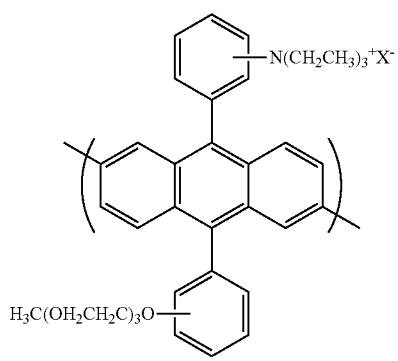
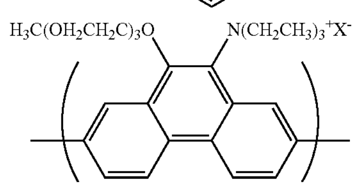
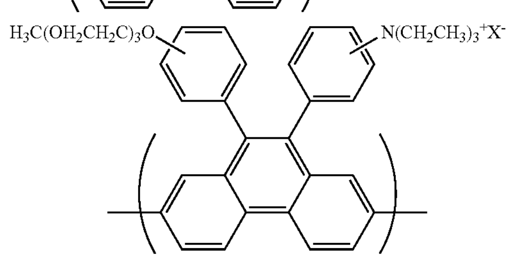
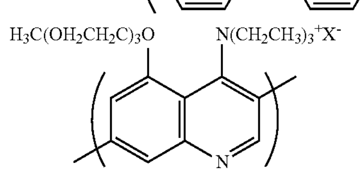

-continued

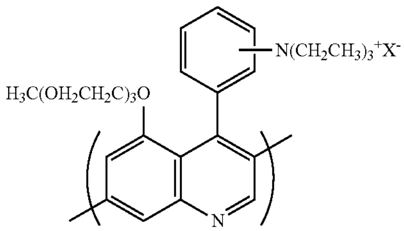

[Chemical Formula 95]

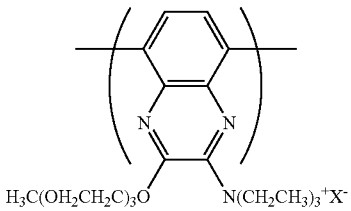

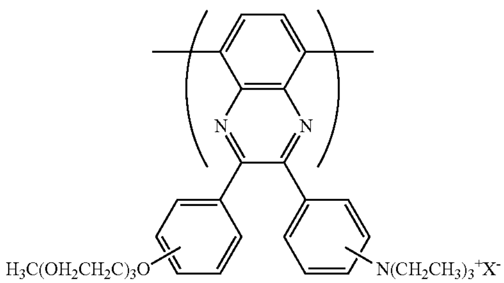

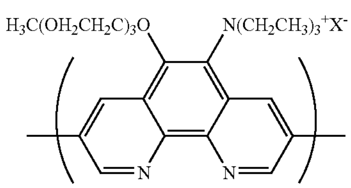

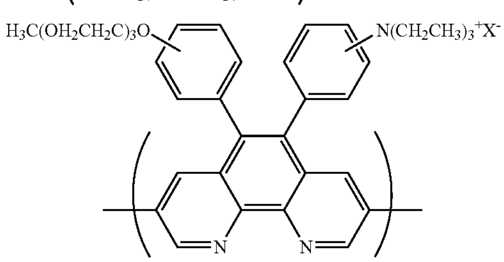

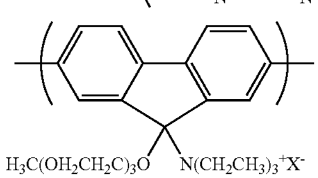

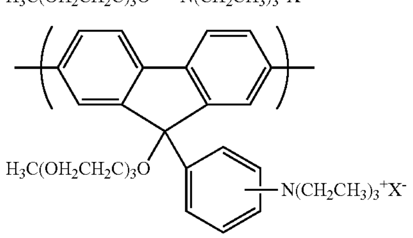

-continued

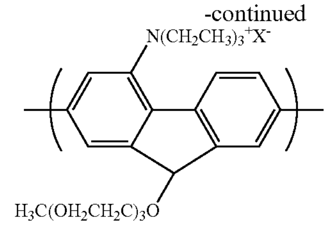

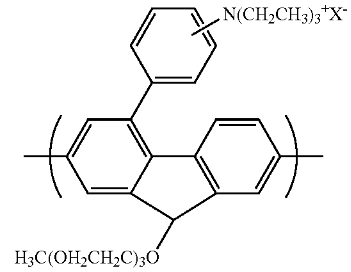

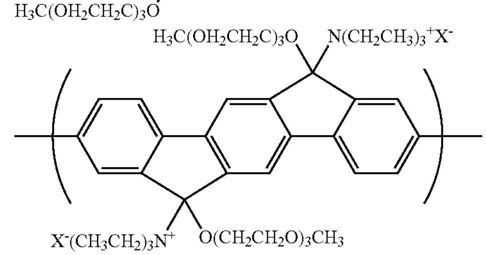

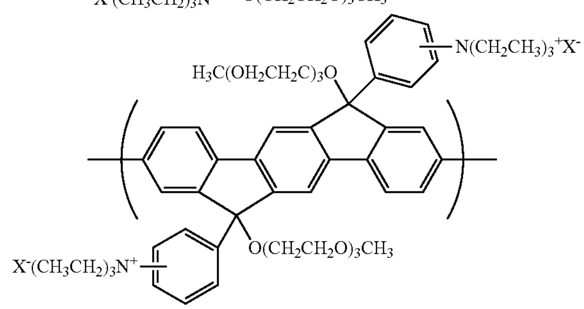

[1.9. Other Structural Units]

The polymer compound used in the present invention may further include a structural unit represented by Formula (24).

[Chemical Formula 96]

$$-\!\left(\!-(Ar^8)_{m9}\!-\!(X')_{m10}\!-\!\right)\!-\quad (24)$$

(In Formula (24), $Ar^8$ is a divalent aromatic group that optionally has a substituent or a divalent aromatic amine residue that optionally has a substituent; X' is an imino group that optionally has a substituent, a silylene group that optionally has a substituent, an ethenylene group that optionally has a substituent, or an ethynylene group; and m9 and m10 are each independently 0 or 1; and at least one of m9 and m10 is 1.)

In Formula (24), $Ar^8$ is a divalent aromatic group that optionally has a substituent or a divalent aromatic amine residue that optionally has a substituent.

Examples of the divalent aromatic group represented by $Ar^8$ in Formula (24) include a divalent aromatic hydrocarbon group and a divalent aromatic heterocyclic group. Examples of the divalent aromatic group include a divalent group in which two hydrogens are removed from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a thiophene ring, a pyrazole ring, an imidazole ring, an oxazole ring, an oxadiazole ring, and an azadiazole ring; a divalent group in which two hydrogens are removed from a condensed polycyclic aromatic ring having a structure formed by condensing two or more of the monocyclic aromatic rings; a divalent group in which two hydrogens are removed from an aromatic ring assembly having a structure linking two or more aromatic rings selected from the group consisting of the monocyclic aromatic ring and the condensed polycyclic aromatic ring through a single bond, an ethenylene group, or an ethynylene group; and a divalent group in which two hydrogens are removed from a bridged polycyclic aromatic ring that includes two or more of aromatic rings selected from the monocyclic aromatic ring, the condensed polycyclic aromatic ring, and the aromatic ring assembly and has a structure bridging the adjacent two aromatic rings among the aromatic rings by a divalent group such as a methylene group, an ethylene group, a carbonyl group, and an imino group or a methanetetrayl group.

In the condensed polycyclic aromatic ring, the number of condensed monocyclic aromatic rings is preferably 2 to 4, more preferably 2 to 3, and further preferably 2, in terms of solubility of the polymer compound. In the aromatic ring assembly, the number of linked aromatic rings is preferably 2 to 4, more preferably 2 to 3, and further preferably 2, in terms of solubility of the polymer compound. In the bridged polycyclic aromatic ring, the number of bridged aromatic rings is preferably 2 to 4, more preferably 2 to 3, and further preferably 2, in terms of solubility of the polymer compound.

Examples of the monocyclic aromatic ring include the rings represented by the following formulas.

[Chemical Formula 97]

52

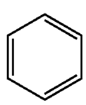

53

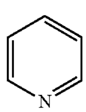

54

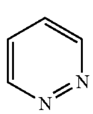

55

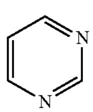

56

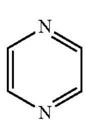

57

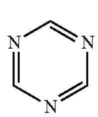

-continued

58

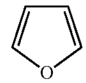

59

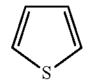

60

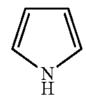

61

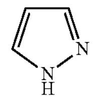

62

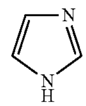

63

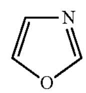

64

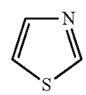

65

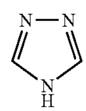

66

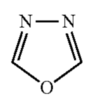

67

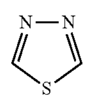

Examples of the condensed polycyclic aromatic ring include the rings represented by the following formulas.

[Chemical Formula 98]

68

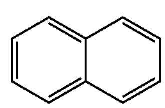

69

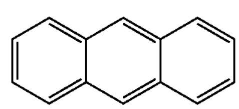

70

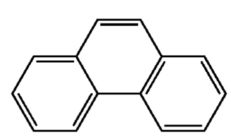

-continued
71
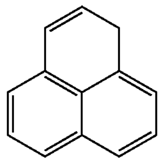
72
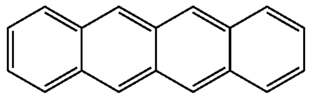
73
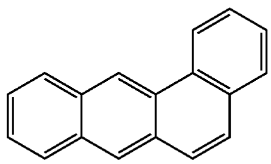
74
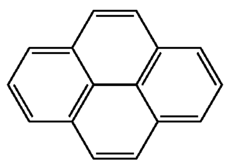
75
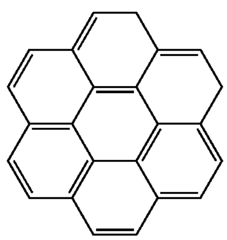
76
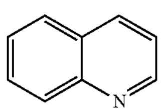
77
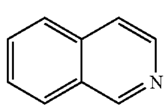
78
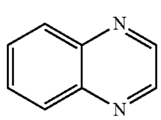
79
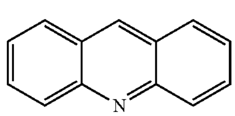
80
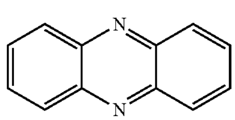
81
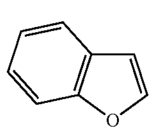
-continued
82
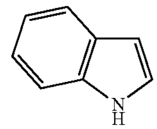
83
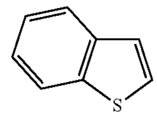
84
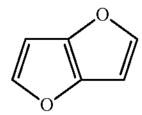
85
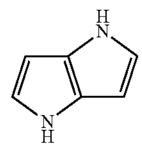
86
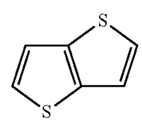
87
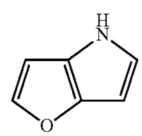
88
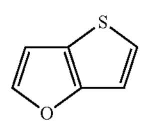
89
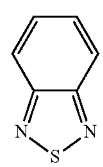
90
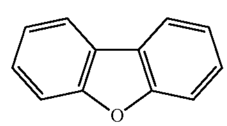
91
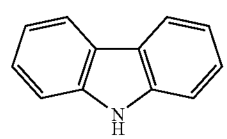
92
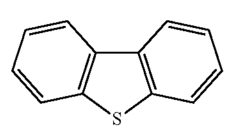

-continued
93
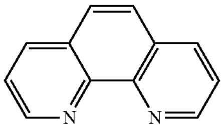
Examples of the aromatic ring assembly include the rings represented by the following formulas.
[Chemical Formula 99]
94
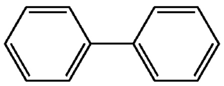
95
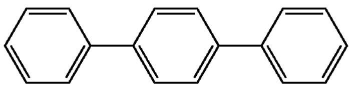
96
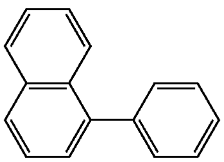
97
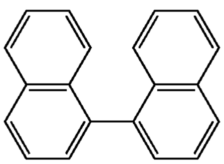
98
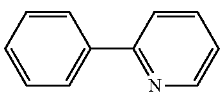
99
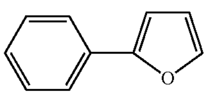
100
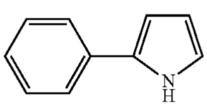
101
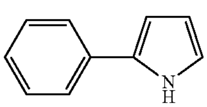
102
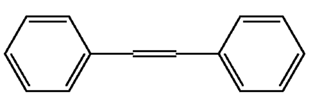
103
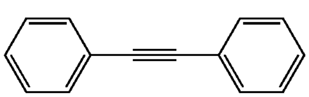
104
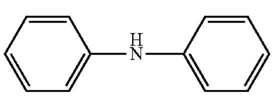
Examples of the bridged polycyclic aromatic ring include the following rings.
[Chemical Formula 100]
105
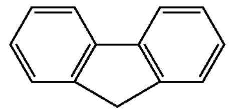
106
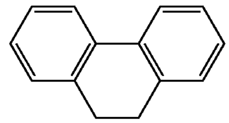
107
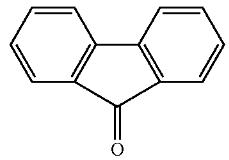
108
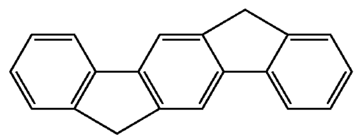
109
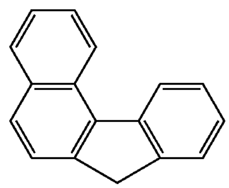
110
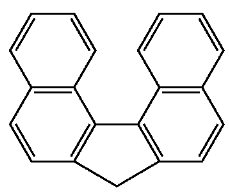
111
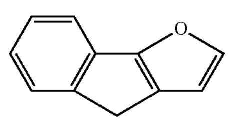
112
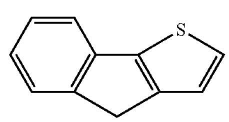
113
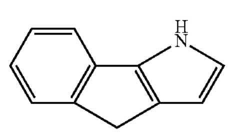

-continued

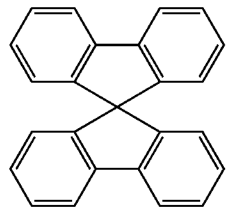

114

In terms of any one of or both of electron accepting properties and hole acceptance properties of the polymer compound, the divalent aromatic group represented by $Ar^8$ is preferably a divalent group in which two hydrogen atoms are removed from a ring represented by any one of Formulas 52 to 67, 68 to 83, 89 to 93, 104 to 106, 108, and 109, and more preferably the divalent group in which two hydrogen atoms are removed from a ring represented by any one of Formulas 52 to 57, 66, 67, 89, 91, 93, 104, 105, 108, and 109.

The divalent aromatic group optionally has a substituent. Examples of the substituent include a substituent similar to the substituent shown as examples in the description of $R^1$ described above.

Examples of a divalent aromatic amine residue represented by $Ar^8$ in Formula (24) include a group represented by Formula (25).

[Chemical Formula 101]

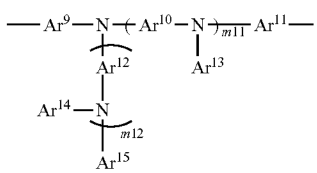

(25)

(In Formula (25), $Ar^9$, $Ar^{10}$, $Ar^{11}$, or $Ar^{12}$ are each independently an arylene group that optionally has a substituent or a divalent heterocyclic group that optionally has a substituent; $Ar^{13}$, $Ar^{14}$, and $Ar^{15}$ are each independently an aryl group that optionally has a substituent or a monovalent heterocyclic group that optionally has a substituent; and m11 and m12 are each independently 0 or 1.)

Examples of the substituent that the arylene group, the aryl group, the divalent heterocyclic group, and the monovalent heterocyclic group optionally have include a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amido group, an acid imido group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group, and a carboxyl group. The substituent may be a cross-linkable group such as a vinyl group, an acetylene group, a butenyl group, an acrylic group, an acrylate group, an acrylamide group, a methacrylic group, a methacrylate group, a methacrylamide group, a vinyl ether group, a vinylamino group, a silanol group, a group having a small-membered ring such as a cyclopropyl group, a cyclobutyl group, an epoxy group, an oxetane group, a diketene group, and an episulfide group, a lactone group, a lactam group, or a group including a structure of a siloxane derivative.

When m11 is 0, the carbon atom in $Ar^9$ and the carbon atom in $Ar^{11}$ may be directly bonded. The carbon atom in $Ar^9$ and the carbon atom in $Ar^{11}$ may be bonded through a divalent group such as —O— and —S—.

$Ar^{13}$, $Ar^{14}$, and $Ar^{15}$ are an aryl group that optionally has a substituent or a monovalent heterocyclic group that optionally has a substituent. Examples of the aryl group include a group that is similar to the aryl group shown as examples in the description of $R^1$ described above. Examples of the monovalent aromatic group include a group that is similar to the monovalent heterocyclic group shown as examples in the description of $R^1$ described above. Examples of the substituent include a substituent similar to the monovalent heterocyclic group shown as examples in the description of $R^1$ described above.

$Ar^9$, $Ar^{10}$, $Ar^{11}$, and $Ar^{12}$ are an arylene group that has or does not have a substituent. Examples of the arylene group include an atomic group remaining after removing two hydrogen atoms bonded to carbon atoms constituting an aromatic ring from an aromatic hydrocarbon. Examples of the arylene group include a group having a benzene ring, a group having a condensed ring, a group in which two or more rings selected from independent benzene rings or condensed rings are bonded through a single bond, and a group in which two or more rings selected from independent benzene rings and condensed rings are bonded through a divalent organic group (for example, an alkenylene group such as a vinylene group). The number of carbon atoms in the arylene group is usually 6 to 60 and preferably 7 to 48. Examples of the arylene group include a phenylene group, a biphenylene group, a $C_1$-$C_{17}$ alkoxyphenylene group, a $C_1$-$C_{17}$ alkylphenylene group, a 1-naphthylene group, a 2-naphthylene group, a 1-anthracenylene group, a 2-anthracenylene group, and a 9-anthracenylene group. A hydrogen atom in the arylene group is optionally substituted with a fluorine atom. Examples of the corresponding arylene group (a fluorine atom-substituted aryl group) include a tetrafluorophenylene group. Among the arylene groups, the phenylene group, the biphenylene group, the $C_1$-$C_{12}$ alkoxyphenylene group, and the $C_1$-$C_{12}$ alkylphenylene group are preferable.

The divalent heterocyclic groups represented by $Ar^9$, $Ar^{10}$, $Ar^{11}$, and $Ar^{12}$ are an atomic group remaining after removing two hydrogen atoms from heterocyclic compound. Here, the "heterocyclic compound" means, among organic compounds having a ring structure, an organic compound including a hetero atom such as an oxygen atom, a sulfur atom, a nitrogen atom, a phosphorus atom, a boron atom, a silicon atom, a selenium atom, a tellurium atom, and an arsenic atom in addition to carbon atoms as elements constituting the ring. The divalent heterocyclic group optionally has a substituent. The number of carbon atoms in the divalent heterocyclic group is usually 4 to 60 and preferably 4 to 20. The number of carbon atoms in the substituent is not included in the number of the divalent heterocyclic group. Examples of the divalent heterocyclic group described above include a thiophenediyl group, a $C_1$-$C_{12}$ alkylthiophenediyl group, a pyrrolediyl group, a furandiyl group, a pyridinediyl group, a $C_1$-$C_{12}$ alkylpyridinediyl group, a pyridazinediyl group, a pyrimidinediyl group, a pyrazinediyl group, a triazinediyl group, a pyrrolidinediyl group, a piperidinediyl group, a quinolinediyl group, and an isoquinolinediyl group. Among them, the thiophenediyl group, the $C_1$-$C_{12}$ alkylthiophenediyl group, the pyridinediyl group, and the $C_1$-$C_{12}$ alkylpyridinediyl group are preferable.

Examples of a divalent aromatic amine residue represented by Formula (25) include a group in which two hydrogen atoms are removed from an aromatic amine represented by any one of Formulas 115 to 124. In terms of stability to hole current of the polymer compound, a divalent aromatic amine residue represented by Formula (25) is preferably the group in which two hydrogen atoms are removed from an aromatic amine represented by Formula 115, 116, 117, or 120.

[Chemical Formula 102]

115

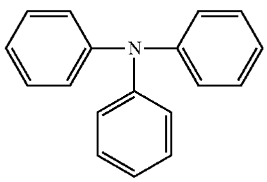

116

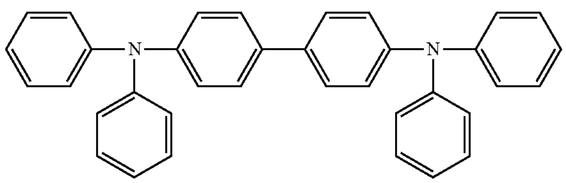

117

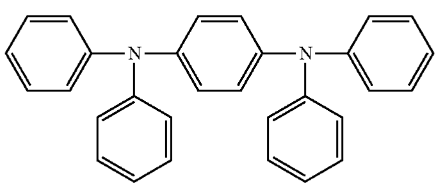

118

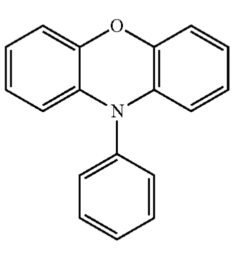

119

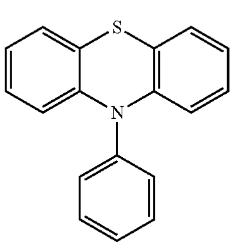

-continued

120

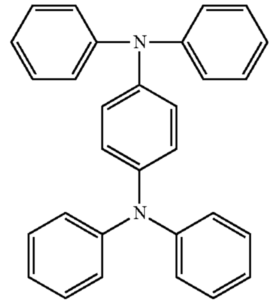

121

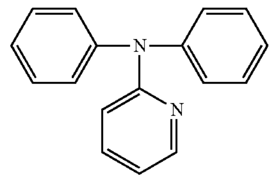

122

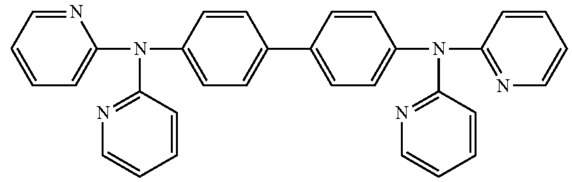

123

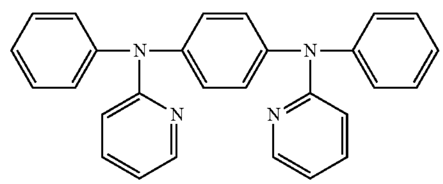

124

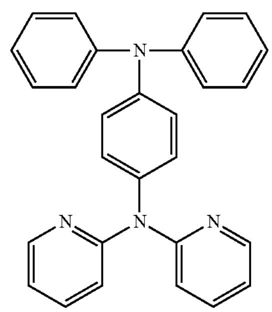

The aromatic amine represented by any one of Formulas 115 to 124 optionally has a substituent in a range capable of generating a divalent aromatic amine residue. Examples of the substituent include a substituent similar to the substituent shown as examples in the description of $R^1$ described above. When the aromatic amine has a plurality of substituents, each substituent may be the same as or different from each other.

In Formula (24), X' is an imino group that optionally has a substituent, a silylene group that optionally has a substituent, an ethenylene group that optionally has a substituent, or an ethynylene group. Examples of the substituent that the imino group, the silyl group, and the ethenylene group optionally have include the following groups:

an alkyl group having 1 to 20 carbon atom(s) such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a 2-ethylhexyl group, a nonyl group, a decyl group, a 3,7-dimethyloctyl, and a lauryl group; and an aryl group having 6 to 30 carbon atoms such as a phenyl group, a 1-naphthyl group, a 2-naphthyl group, a 1-anthracenyl group, a 2-anthracenyl group, and a 9-anthracenyl group.

When the imino group, the silylene group, the ethenylene group, or the ethynylene group has a plurality of substituents, each substituent may be the same as or different from each other.

In terms of stability of the polymer compound, X' is preferably the imino group, the ethenylene group, or the ethynylene group.

m9 and m10 are each independently 0 or 1, and at least one of m9 and m10 is 1. In terms of electron transport properties of the polymer compound, m9 and m10 are preferably 1 and 0, respectively.

[1.10. Content Ratio of Structural Units]

The polymer compound used in the present invention includes one or more structural units selected from the group consisting of a structural unit represented by Formula (1), a structural unit represented by Formula (3), a structural unit represented by Formula (5), a structural unit represented by Formula (16), a structural unit represented by Formula (18), a structural unit represented by Formula (20), and a structural unit represented by Formula (22). A ratio of a total amount of these structural units in the amount of whole structural units in the polymer compound (here, the structural units at terminals are excluded) is preferably 15% by mole to 100% by mole. In terms of a light emitting efficiency of an electroluminescent device, the ratio is preferably 30% by mole to 100% by mole.

[1.11. Structural Unit at Terminal]

Examples of the structural unit at the terminal (terminal group) of the polymer compound used in the present invention include a hydrogen atom, a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group, a lauryl group, a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a nonylthio group, a decylthio group, a laurylthio group, a methoxyphenyl group, an ethoxyphenyl group, a propyloxyphenyl group, an isopropyloxyphenyl group, a butoxyphenyl group, an isobutoxyphenyl group, a sec-butoxyphenyl group, a tert-butoxyphenyl, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, a lauryloxyphenyl group, a methylphenyl group, an ethylphenyl group, a dimethylphenyl group, a propylphenyl group, a mesityl group, a methylethylphenyl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group, a dodecylphenyl group, a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a cyclohexylamino group, a heptylamino group, an octyl amino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, a ($C_1$-$C_{12}$ alkoxyphenyl)amino group, a di($C_1$-$C_{12}$ alkoxyphenyl)amino group, a di($C_1$-$C_{12}$ alkylphenyl)amino group, a 1-naphthylamino group, a 2-naphthylamino group, a pentafluorophenylamino group, a pyridylamino group, a pyridazinylamino group, a pyrimidylamino group, a pyrazinylamino group, a triazinylamino group, a (phenyl-$C_1$-$C_{12}$ alkyl)amino group, a ($C_1$-$C_{12}$ alkoxyphenyl-$C_1$-$C_{12}$ alkyl)amino group, a ($C_1$-$C_{12}$ alkylphenyl-$C_1$-$C_{12}$ alkyl)amino group, a di($C_1$-$C_{12}$ alkoxyphenyl-$C_1$-$C_{12}$ alkyl)amino group, a di($C_1$-$C_{12}$ alkylphenyl-$C_1$-$C_{12}$ alkyl)amino group, a 1-naphthyl-$C_1$-$C_{12}$ alkylamino group, a 2-naphthyl-$C_1$-$C_{12}$ alkylamino group, a trimethylsilyl group, a triethylsilyl group, a tripropylsilyl group, a triisopropylsilyl group, an isopropyldimethylsilyl group, an isopropyldiethylsilyl group, a tert-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, a (phenyl-$C_1$-$C_{12}$ alkyl) silyl group, a ($C_1$-$C_{12}$ alkoxyphenyl-$C_1$-$C_{12}$ alkyl) silyl group, a ($C_1$-$C_{12}$ alkylphenyl-$C_1$-$C_{12}$ alkyl)silyl group, a (1-naphthyl-$C_1$-$C_{12}$ alkyl)silyl group, a (2-naphthyl-$C_1$-$C_{12}$ alkyl)silyl group, a (phenyl-$C_1$-$C_{12}$ alkyl)dimethylsilyl group, a triphenylsilyl group, a tri(p-xylyl)silyl group, a tribenzylsilyl group, a diphenylmethylsilyl group, a tert-butyldiphenylsilyl group, a dimethylphenylsilyl group, a thienyl group, a $C_1$-$C_{12}$ alkylthienyl group, a pyrrolyl group, a furyl group, a pyridyl group, a $C_1$-$C_{12}$ alkylpyridyl group, a pyridazinyl group, a pyrimidyl group, a pyrazinyl group, a triazinyl group, a pyrrolidyl group, a piperidyl group, a quinolyl group, an isoquinolyl group, a hydroxyl group, a mercapto group, a fluorine atom, a chlorine atom, a bromine atom, and an iodine atom.

When the polymer compound used in the present invention has a plurality of structural units at the terminals, each structural unit may be the same as or different from each other.

[1.12. Characteristics of Polymer Compound]

Hereinafter, characteristics of the polymer compound used in the present invention will be described.

[1.12.1. Molecular Weight]

The term "polymer compound" means a compound that has a polystyrene-equivalent weight average molecular weight of $1\times10^3$ or more.

In terms of a film forming property through application of the polymer compound used in the present invention, the lower limit of the polystyrene-equivalent weight average molecular weight of the polymer compound is preferably $1\times10^3$ or more, more preferably $2\times10^3$ or more, further preferably $3\times10^3$, and particularly preferably $5\times10^3$ or more. From the same reason, the upper limit of the polystyrene-equivalent weight average molecular weight of the polymer compound is preferably $1\times10^8$ or less and more preferably $1\times10^7$ or less. A range of the polystyrene-equivalent weight average molecular weight of the polymer compound is preferably $1\times10^3$ to $1\times10^8$, more preferably $2\times10^3$ to $1\times10^7$, further preferably $3\times10^3$ to $1\times10^7$, and particularly preferably $5\times10^3$ to $1\times10^7$.

In terms of purity of the polymer compound used in the present invention, the lower limit of the polystyrene-equivalent number average molecular weight of the polymer compound is preferably $1\times10^3$ or more. From the same reason, the upper limit of the polystyrene-equivalent number average molecular weight of the polymer compound is preferably $5\times10^7$ or less, more preferably $1\times10^7$ or less, and further preferably $5\times10^6$ or less. A range of the polystyrene-equivalent number average molecular weight of the polymer compound is preferably $1\times10^3$ to $5\times10^7$, more preferably $1\times10^3$ to $1\times10^7$, and further preferably $1\times10^3$ to $5\times10^6$.

In terms of solubility of the polymer compound used in the present invention, the lower limit of the polystyrene-equivalent weight average molecular weight of the polymer compound is preferably $1\times10^3$ or more. From the same reason, the upper limit of the polystyrene-equivalent weight average molecular weight of the polymer compound is preferably $5\times10^5$ or less, more preferably $5\times10^4$ or less, and further preferably $3\times10^3$ or less. In this sense, a range of the polystyrene-equivalent weight average molecular weight of the polymer compound is preferably $1\times10^3$ to $5\times10^5$, more preferably $1\times10^3$ to $5\times10^4$, and further preferably $1\times10^3$ to $3\times10^3$.

Each of the polystyrene-equivalent number average molecular weight and the polystyrene-equivalent weight average molecular weight of the polymer compound used in the present invention can be determined by, for example, using gel permeation chromatography (GPC).

[1.12.2 Characteristics as Conjugated Polymer Compound]

The polymer compound used in the present invention is preferably a conjugated polymer compound. The polymer compound used in the present invention being the "conjugated polymer compound" means that the polymer compound, in its main chain, includes a region where multiple bonds (for example, a double bond and a triple bond) and/or unshared electron pairs processed by an atom such as a nitrogen atom and an oxygen atom are linked through a single bond in series so that the single bond is interposed by them. When the polymer compound is a conjugated polymer compound, in terms of the electron transport properties, a ratio (%) calculated by a formula: {(the number of atoms in the main chain included in the region where the structure in which unshared electron pairs that the multiple bond and/or the atom such as nitrogen atom and oxygen atom have are bonded through a single bond in polymer compound)/(the number of whole atoms in the main chain of the polymer compound)}×100; is preferably 50% or more, more preferably 60% or more, further preferably 70% or more, particularly preferably 80% or more, and especially preferably 90% or more.

[1.12.3. Orbital Energy]

In terms of the electron accepting properties and the hole accepting properties of the polymer compound used in the present invention, the lower limit of an orbital energy of a lowest unoccupied molecular orbital (LUMO) of the polymer compound is preferably −5.0 eV or more and more preferably −4.5 eV or more. From the same reason, the upper limit of the orbital energy of LUMO of the polymer compound is preferably −2.0 eV or less. A range of the orbital energy of LUMO of the polymer compound is preferably −5.0 eV or more and −2.0 eV or less and more preferably −4.5 eV or more and −2.0 eV or less.

From the same reason, the lower limit of the orbital energy of a highest occupied molecular orbital (HOMO) of the polymer compound used in the present invention is preferably −6.0 eV or more and more preferably −5.5 eV or more. From the same reason, the upper limit of the orbital energy of HOMO of the polymer compound is preferably −3.0 eV or less. A range of the orbital energy of HOMO of the polymer compound is preferably −6.0 eV or more and −3.0 eV or less and more preferably −5.5 eV or more and −3.0 eV or less. The orbital energy of HOMO is usually lower than the orbital energy of LUMO.

The orbital energy of HOMO of the polymer compound can be determined by measuring an ionization potential of the polymer compound, and defining the obtained ionization potential measured above as the orbital energy. The orbital energy of LUMO of the polymer compound can be determined by calculating energy difference between HOMO and LUMO, and defining the sum of the obtained value and the ionization potential as the orbital energy. A photoelectron spectrometer can be used for measuring the ionization potential. The energy difference between HOMO and LUMO can be determined from an absorption end obtained by measuring an absorption spectrum of the polymer compound using an ultraviolet spectrophotometer/visible spectrophotometer or a near-infrared spectrophotometer.

[1.13. Examples of Polymer Compound]

In terms of ON/OFF response speed of an electronic device of the present invention, any one of the following polymer compounds is preferable as the polymer compound used in the present invention:

a polymer compound including a structural unit represented by Formula (1) and a structural unit represented by Formula (5) (preferably a polymer compound made of these units);

a polymer compound including a structural unit represented by Formula (1), a structural unit represented by Formula (5), and one or more structural units selected from the group consisting of structural units in which two hydrogen atoms are removed from a compound represented by any one of Formulas 52 to 57, 66, 67, 89, 91, 93, 104, 105, 108, 109, 115, 116, 117, and 120 (preferably a polymer compound made of these units);

a polymer compound including a structural unit represented by Formula (16) (preferably a polymer compound made of the unit);

a polymer compound including structural units represented by Formula (16) and one or more structural units selected from the group consisting of a structural unit in which two hydrogen atoms are removed from a compound represented by any one of Formulas 52 to 57, 66, 67, 89, 91, 93, 104, 105, 108, 109, 115, 116, 117, and 120 (preferably a polymer compound made of these units);

a polymer compound including a structural unit represented by Formula (16) and a structural unit represented by Formula (5) (preferably a polymer compound made of these units);

a polymer compound including a structural unit represented by Formula (16), a structural unit represented by Formula (5), and one or more structural units selected from the group consisting of structural units in which two hydrogen atoms are removed from a compound represented by Formula 52 to 57, 66, 67, 89, 91, 93, 104, 105, 108, 109, 115, 116, 117, or 120 (preferably a polymer compound made of these units);

a polymer compound including a structural unit represented by Formula (20) (preferably a polymer compound made of the unit);

a polymer compound including a structural unit represented by Formula (20) and one or more structural units selected from the group consisting of structural units in which two hydrogen atoms are removed from a compound represented by any one of Formulas 52 to 57, 66, 67, 89, 91, 93, 104, 105, 108, 109, 115, 116, 117, and 120 (preferably a polymer compound made of these units);

a polymer compound including a structural unit represented by Formula (20) and a structural unit represented by Formula (5) (preferably a polymer compound made of these units); and a polymer compound including a structural unit represented by Formula (20), a structural unit represented by Formula (5), and one or more structural units selected from the group consisting of structural units in which two hydrogen atoms are removed from a compound represented by any one of Formulas 52 to 57, 66, 67, 89, 91, 93, 104, 105, 108, 109, 115, 116, 117, and 120 (preferably a polymer compound made of these units).

Examples of the polymer compound used in the present invention include a polymer compound having a structural unit represented by the following Formulas. In this specification including the following Formulas, in a polymer compound having a structural unit represented by the formula in which a plurality of structures are separated by slash "/", these structural units are randomly arranged. When two structures are separated by a slash "/", a ratio of the left structural unit is p % by mole and a ratio of the right structural unit is (100−p) % by mole. p is preferable 15 to 99 and more preferably 30 to 99. In the polymer compound represented by a formula in which three structures are separated by each slash "/", a ratio of the left structural unit is p % by mole, a ratio of the center structural unit is q % by mole, and a ratio of the right structural unit is (100−p) % by mole. p is preferable 15 to 99 and more preferably 30 to 99. q is preferable 1 to 50 and more preferably 1 to 30. A structural unit other than the structural units represented by the following formulas is optionally further included. In this case, a structure can also be illustrated in a similar manner to the following formulas. These structural units are randomly arranged. In the following formulas, M is the same as the corresponding definition above. n is a degree of polymerization. Any hydrogen atoms in the formulas are optionally replaced with a substituent as long as the synthesis can be carried out. Examples of the substituent include a substituent similar to the substituent shown as examples in the description of $R^1$ described above.

[Chemical Formula 103]

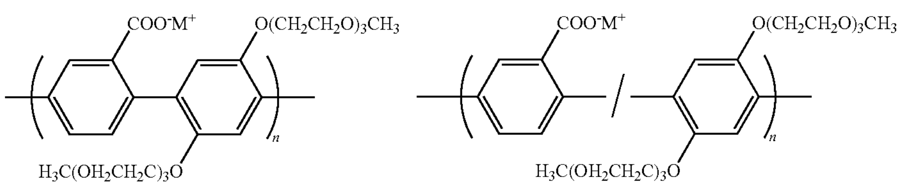

(p/100-p mol %)

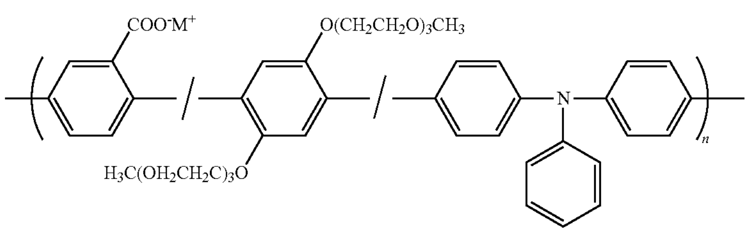

(p/q/100-p-q mol %)

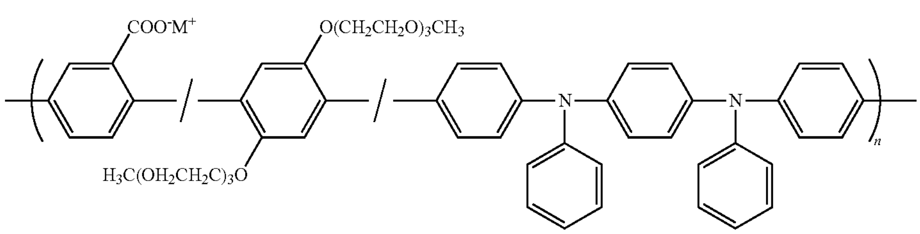

(p/q/100-p-q mol %)

-continued
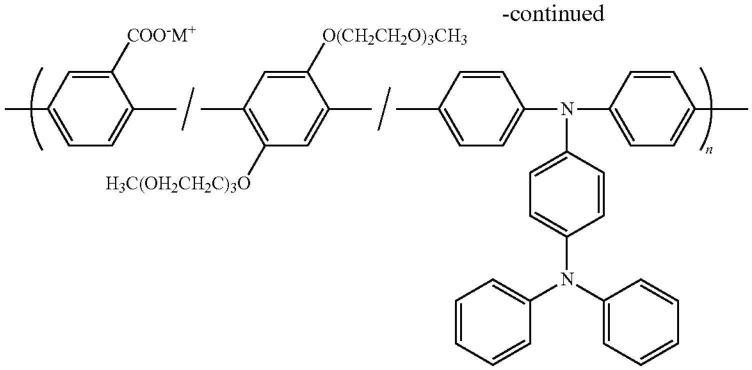
(p/q/100-p-q mol %)
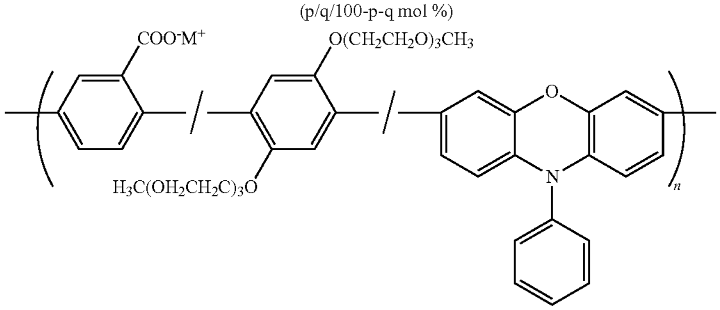
(p/q/100-p-q mol %)
[Chemical Formula 104]
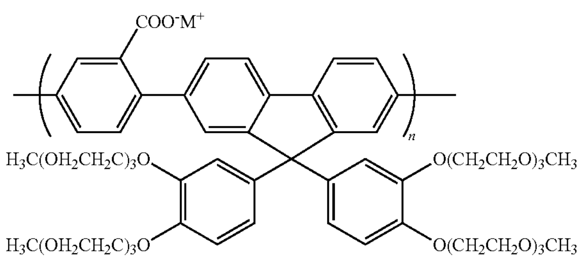
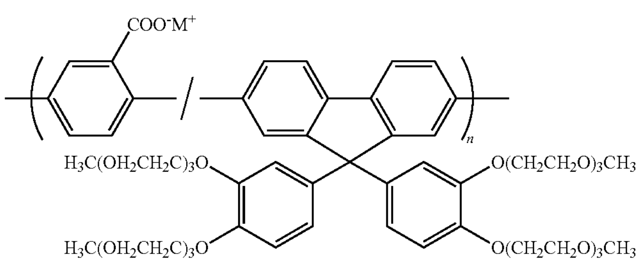
(p/100-p mol %)
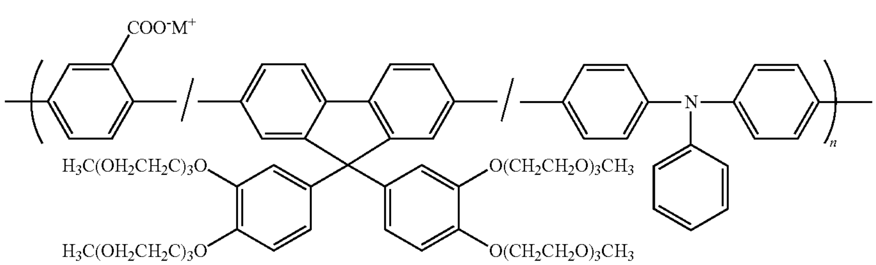
(p/q/100-p-q mol %)

-continued
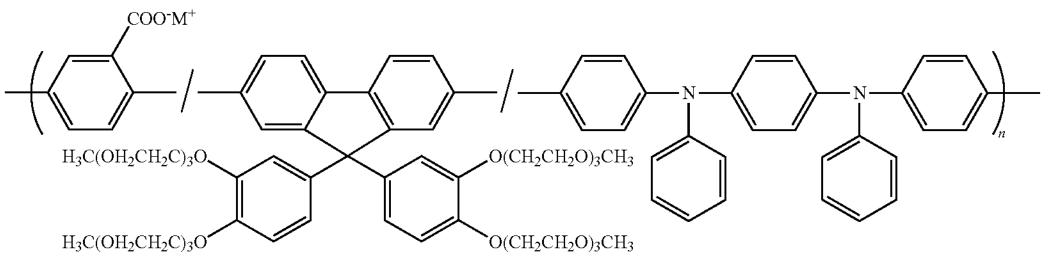
(p/q/100-p-q mol %)
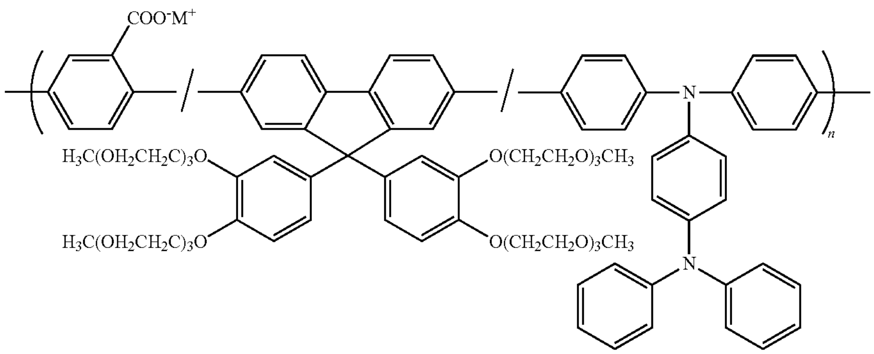
(p/q/100-p-q mol %)
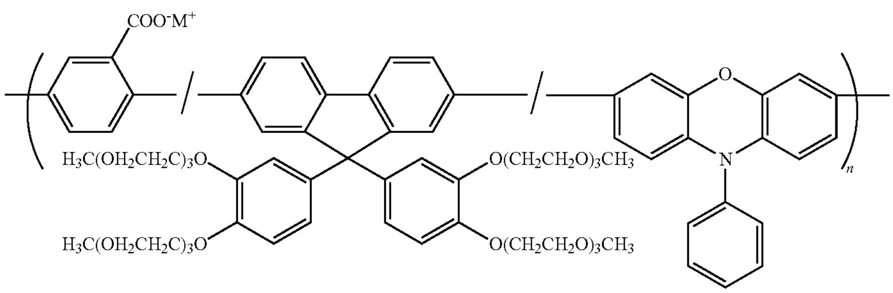
(p/q/100-p-q mol %)
[Chemical Formula 105]
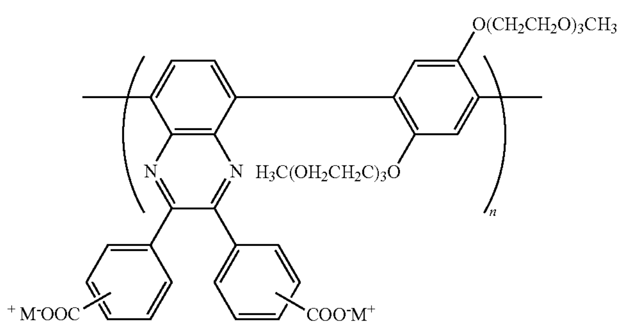
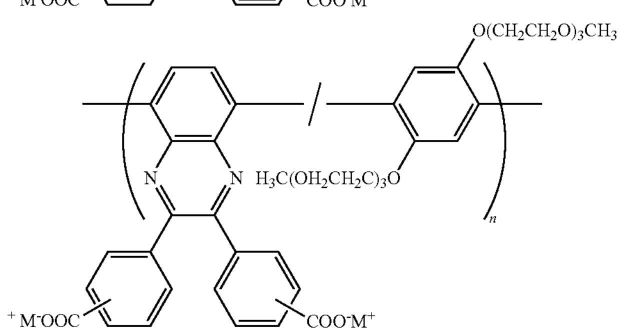
(p/100-p mol %)

-continued
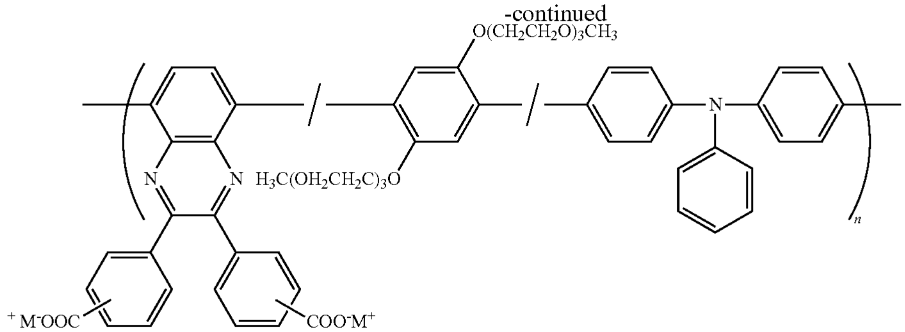
(p/q/100-p-q mol %)
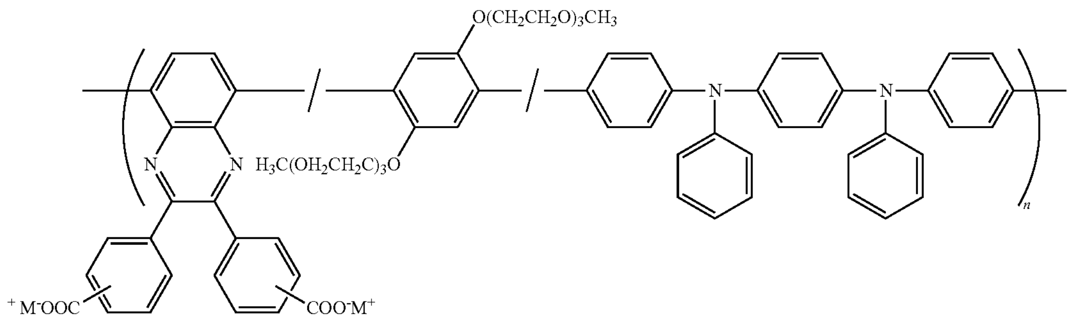
(p/q/100-p-q mol %)
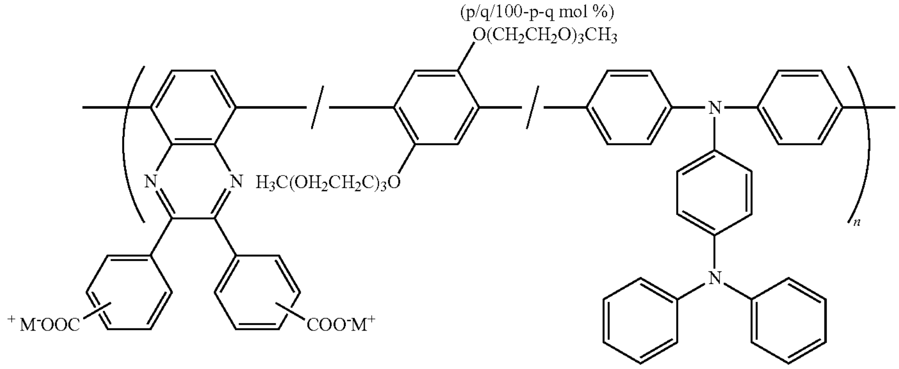
(p/q/100-p-q mol %)
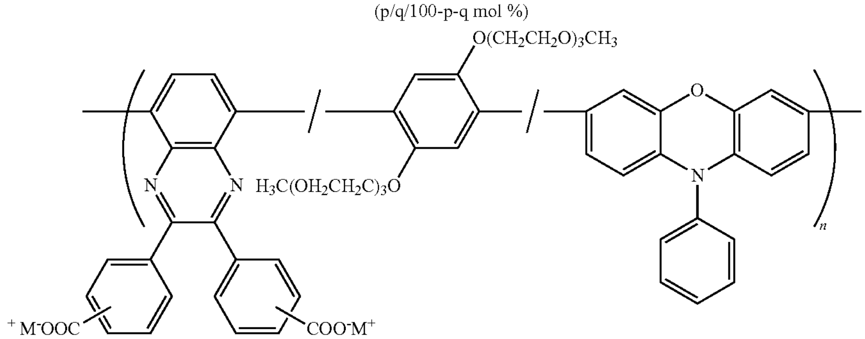
(p/q/100-p-q mol %)
[Chemical Formula 106]
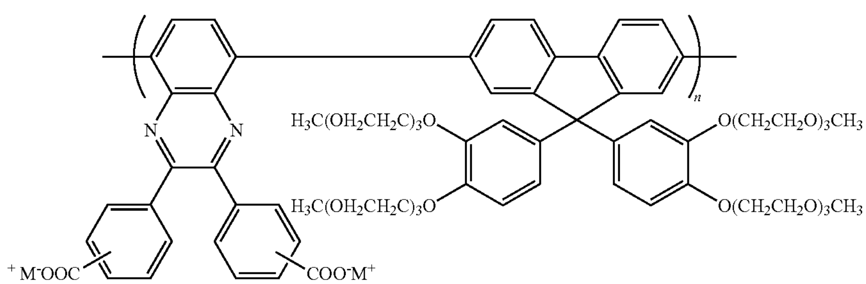

-continued
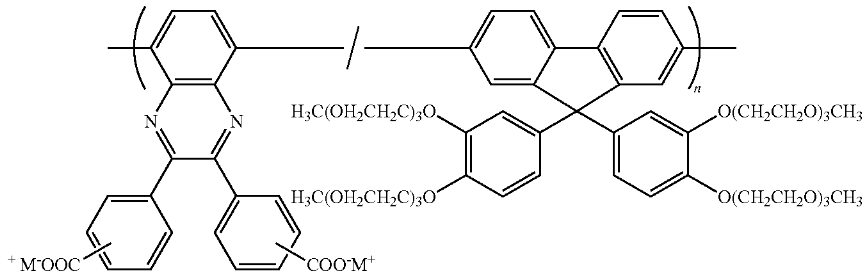
(p/100-p mol %)
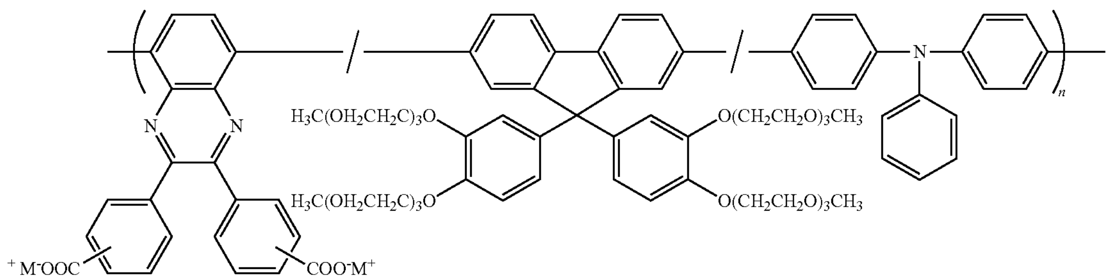
(p/q/100-p-q mol %)
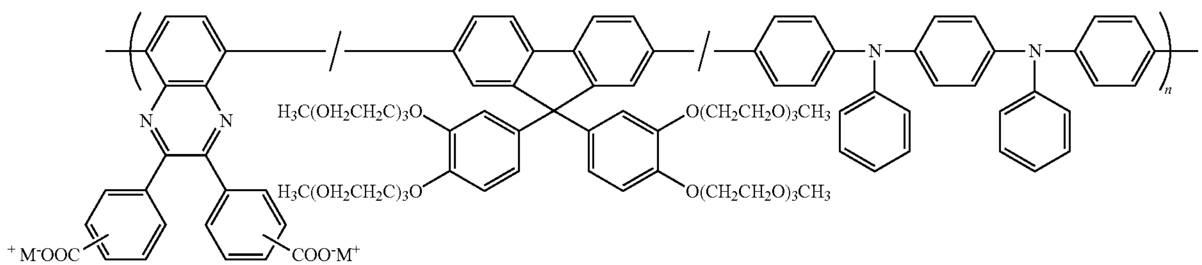
(p/q/100-p-q mol %)
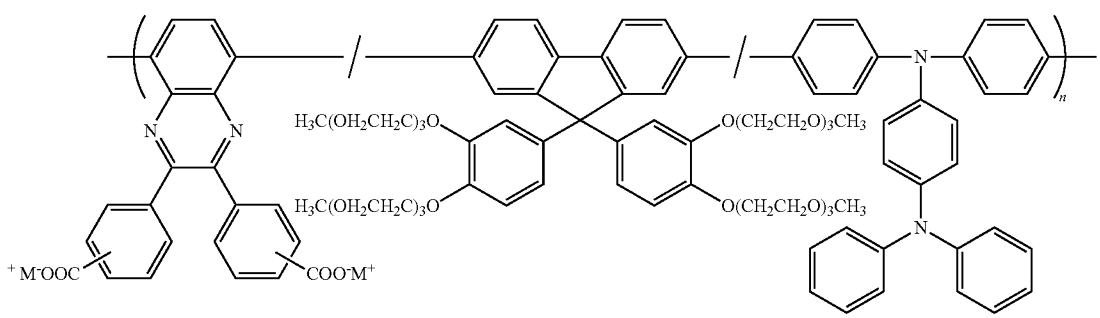
(p/q/100-p-q mol %)
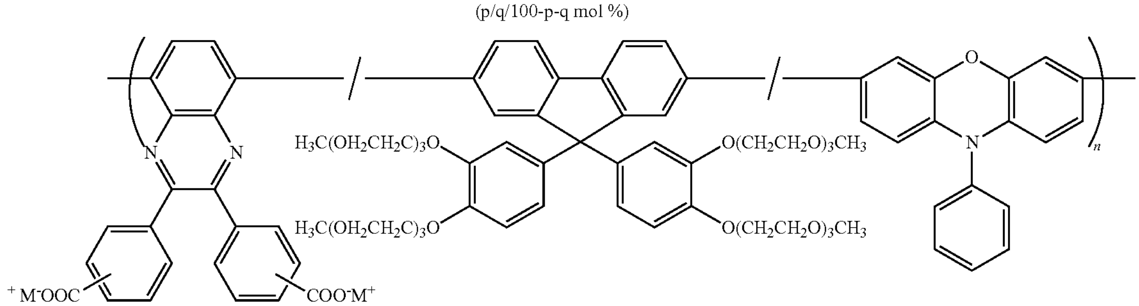
(p/q/100-p-q mol %)

-continued
[Chemical Formula 107]
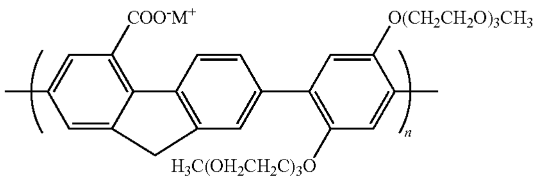
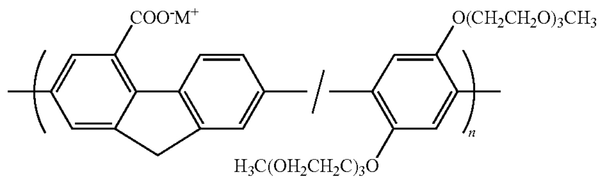
(p/100-p mol %)
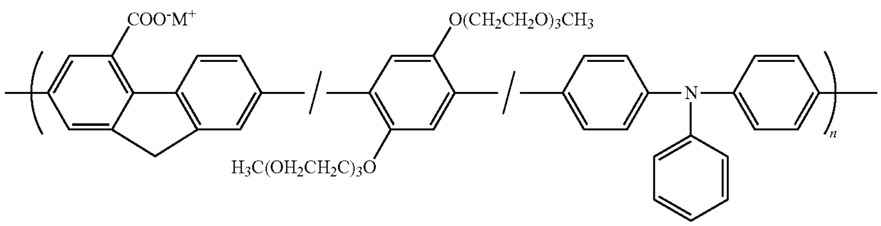
(p/q/100-p-q mol %)
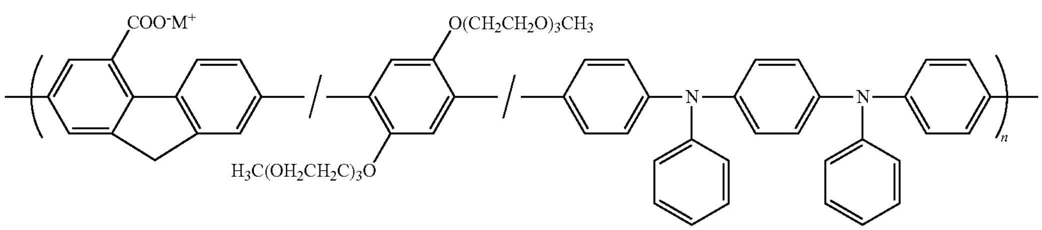
(p/q/100-p-q mol %)
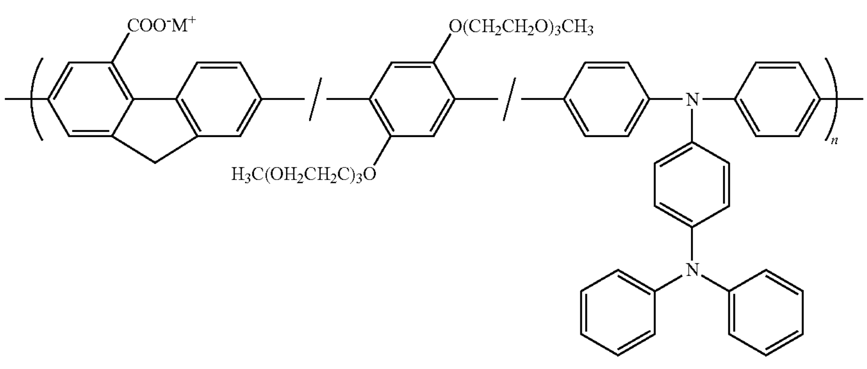
(p/q/100-p-q mol %)
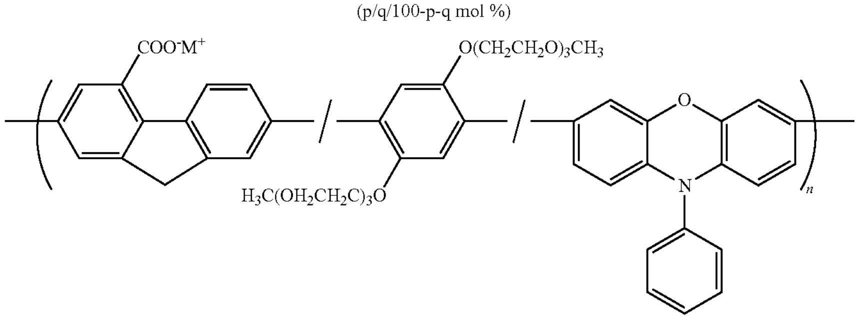
(p/q/100-p-q mol %)

-continued
[Chemical Formula 108]
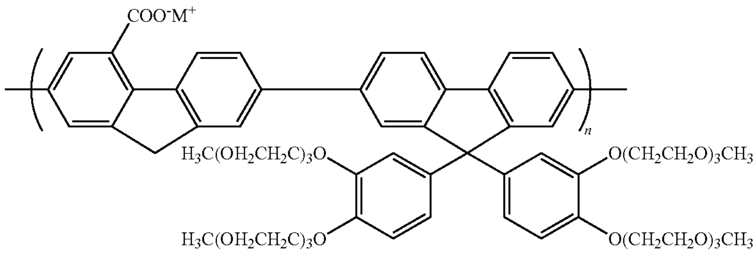
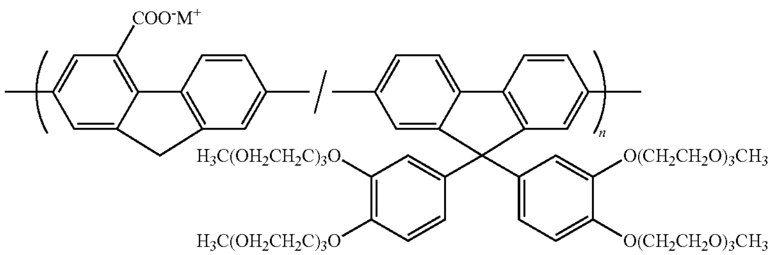
(p/100-p mol %)
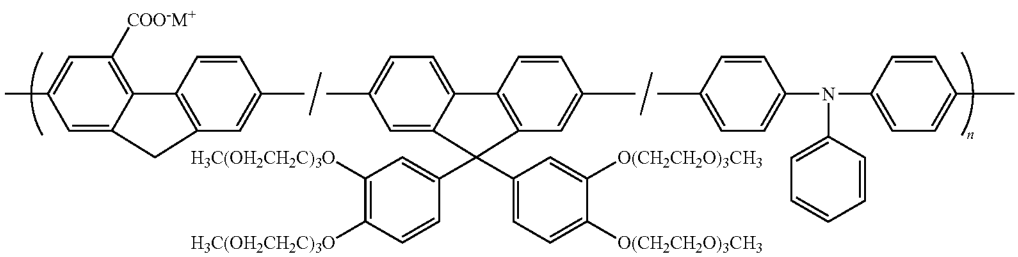
(p/q/100-p-q mol %)
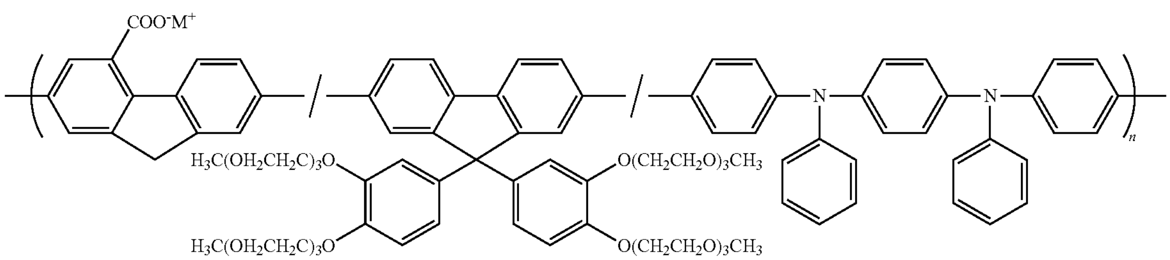
(p/q/100-p-q mol %)
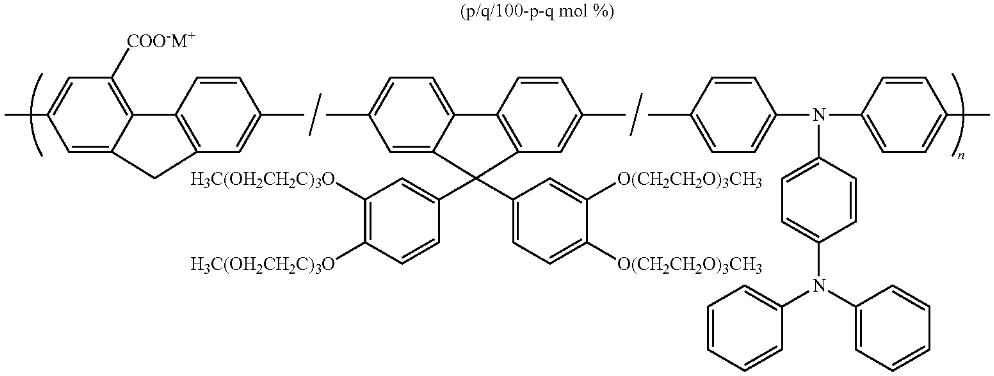
(p/q/100-p-q mol %)

-continued
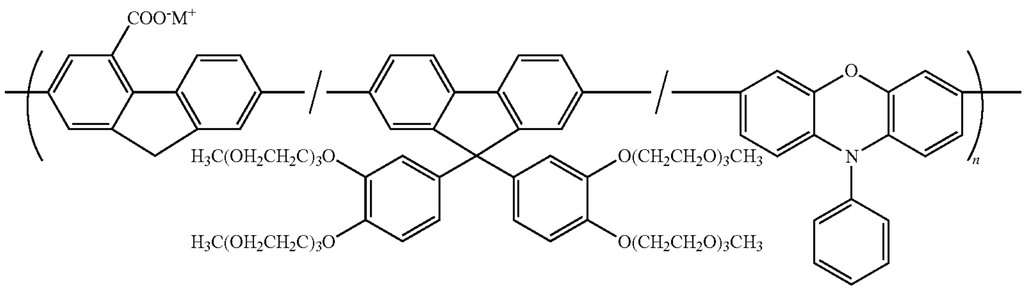
(p/q/100-p-q mol %)
[Chemical Formula 109]
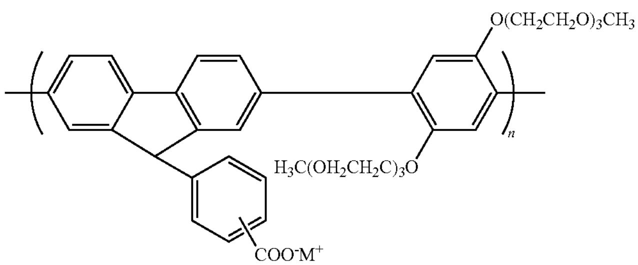
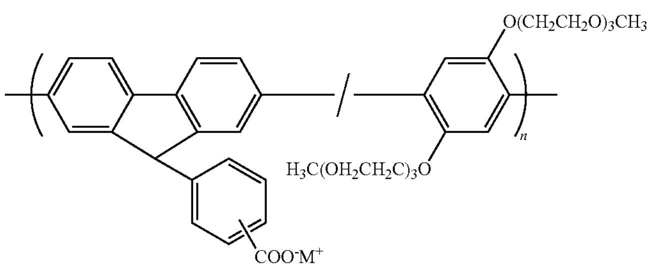
(p/100-p mol %)
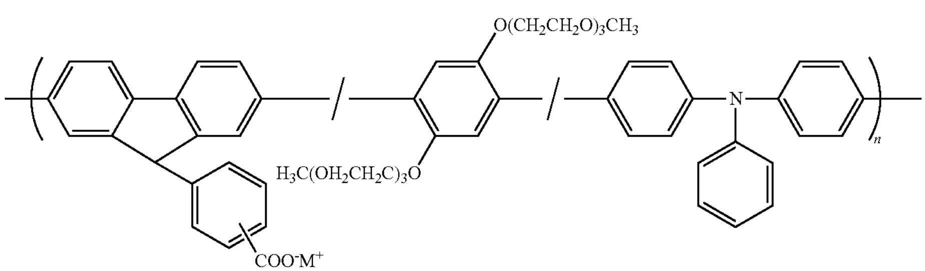
(p/q/100-p-q mol %)
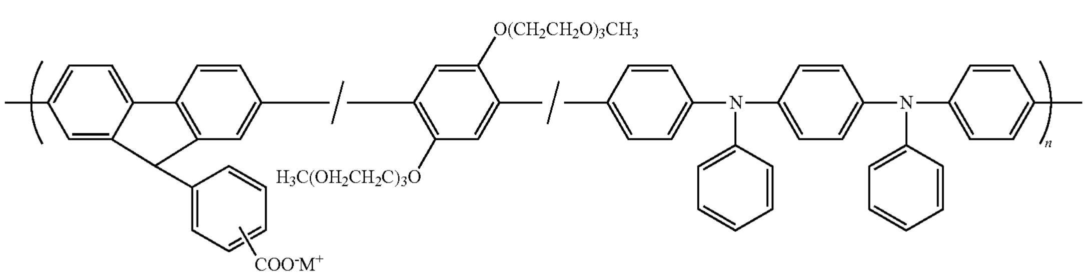
(p/q/100-p-q mol %)

-continued
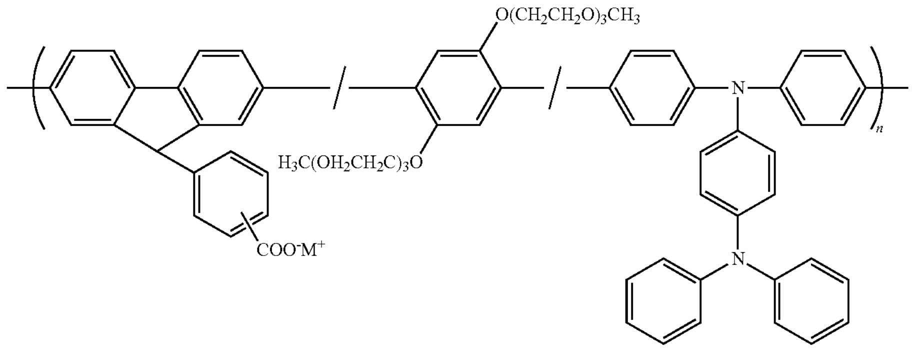
(p/q/100-p-q mol %)
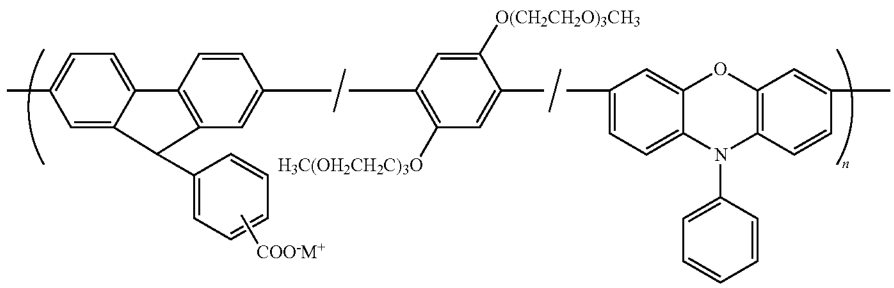
(p/q/100-p-q mol %)
[Chemical Formula 110]
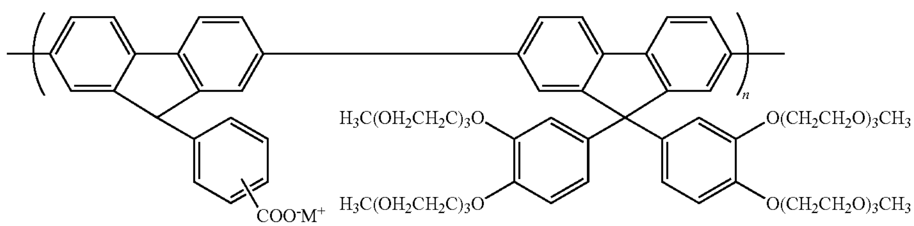
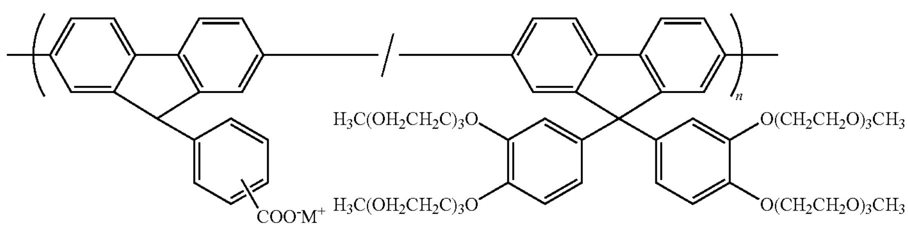
(p/100-p mol %)
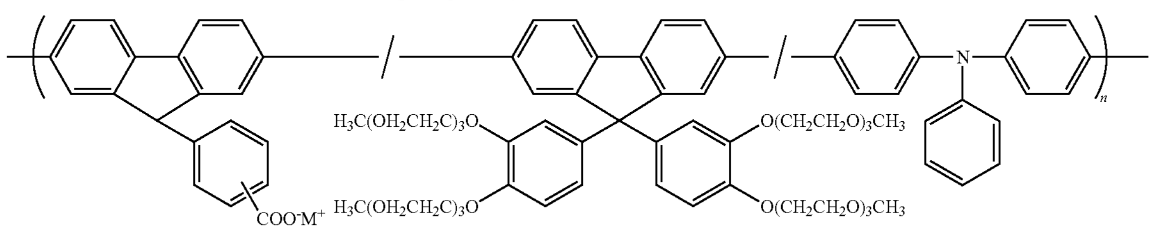
(p/q/100-p-q mol %)
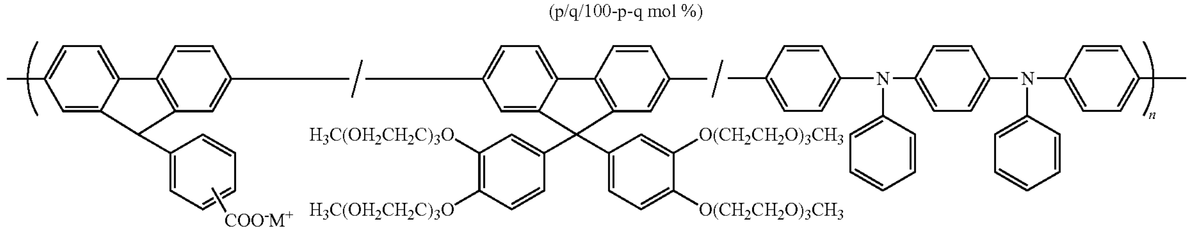
(p/q/100-p-q mol %)

-continued
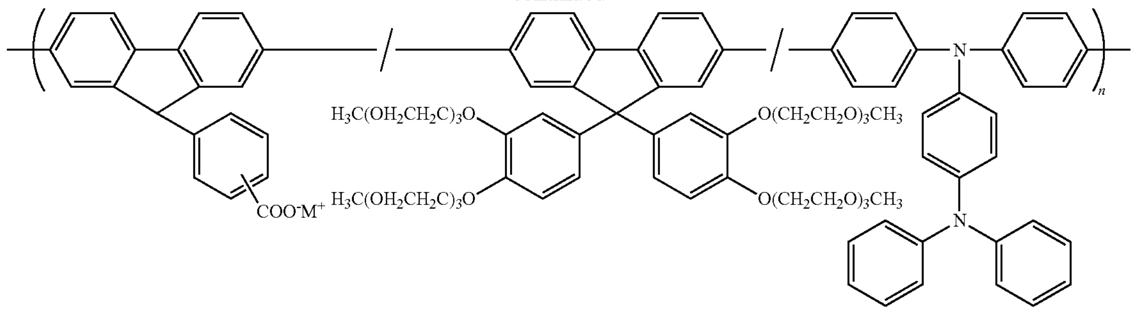
(p/q/100-p-q mol %)
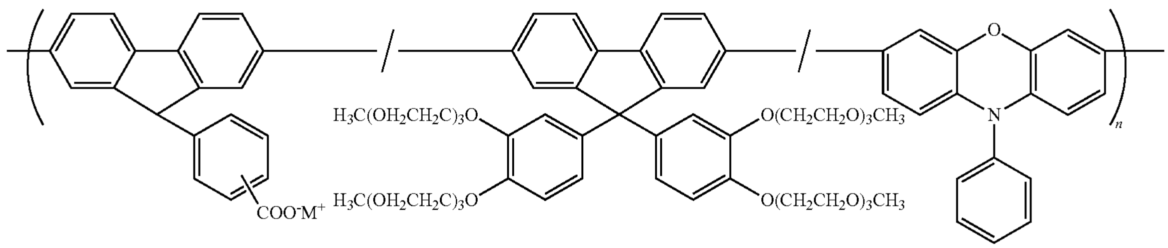
(p/q/100-p-q mol %)
[Chemical Formula 111]
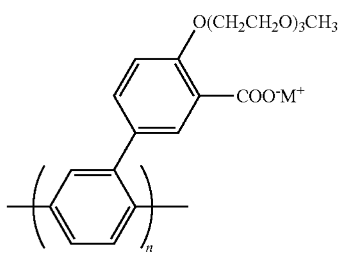
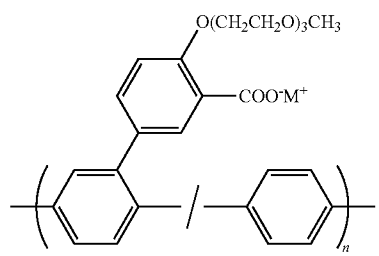
(p/100-p mol %)
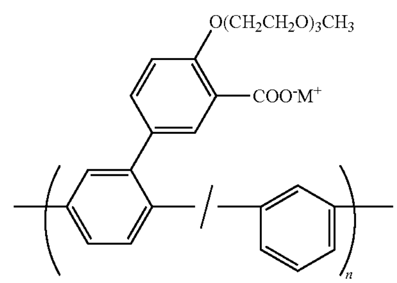
(p/100-p mol %)
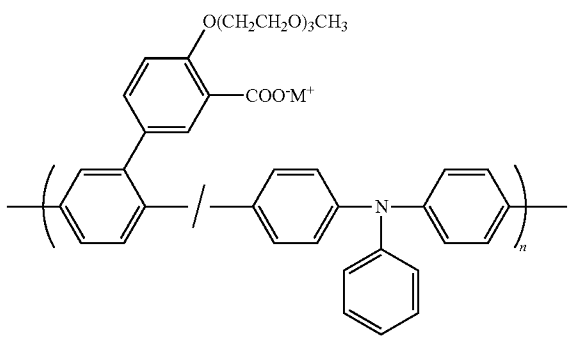
(p/100-p mol %)
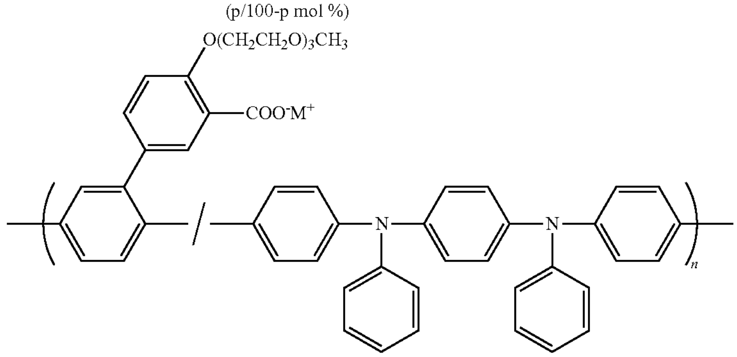
(p/100-p mol %)

-continued
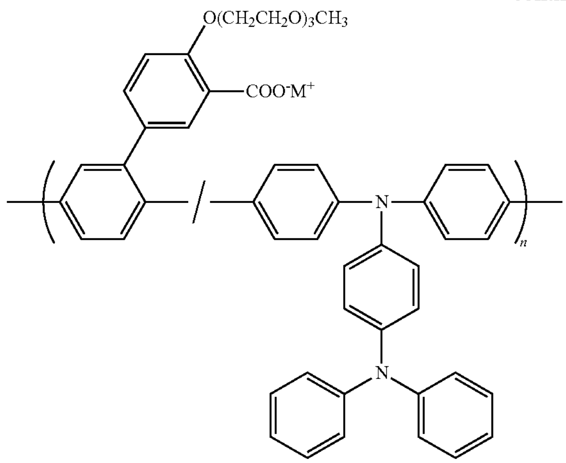
(p/100-p mol %)
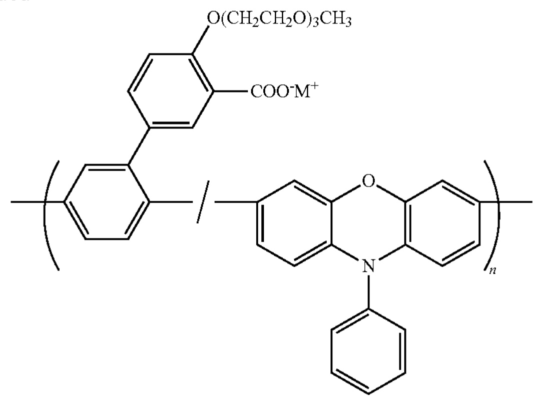
(p/100-p mol %)
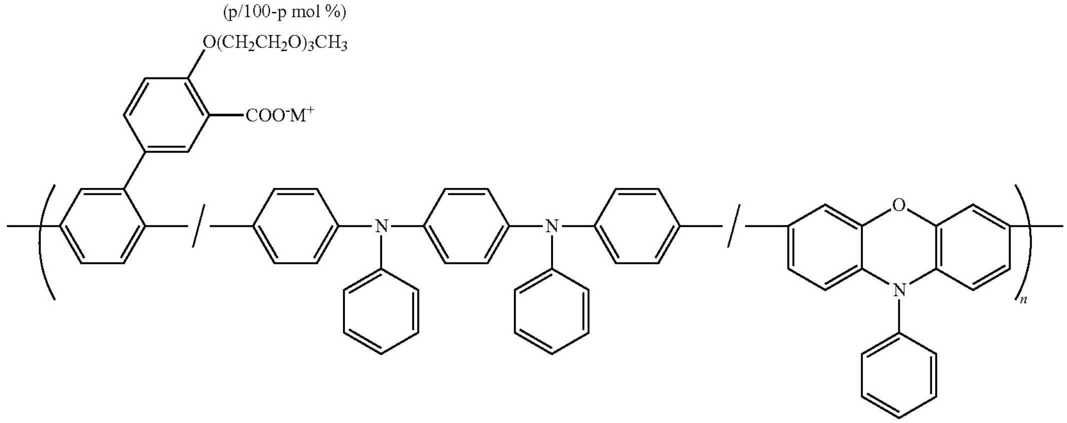
(p/q/100-p mol %)
[Chemical Formula 112]
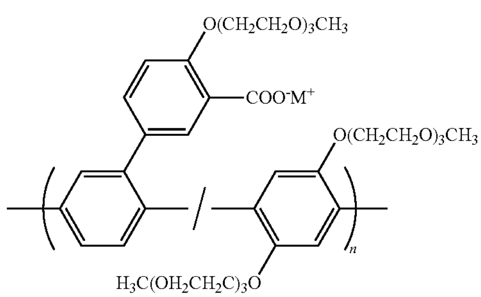
(p/100-p mol %)
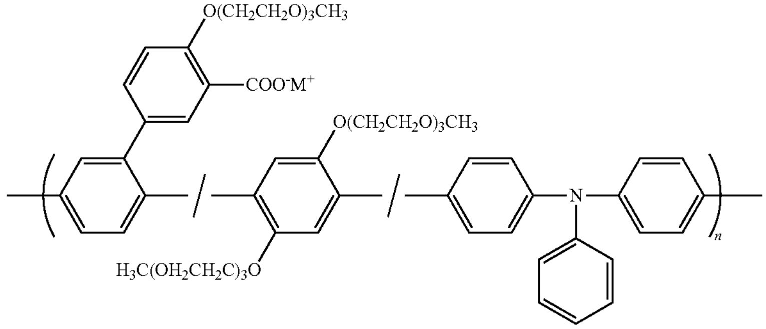
(p/q/100-p-q mol %)

-continued
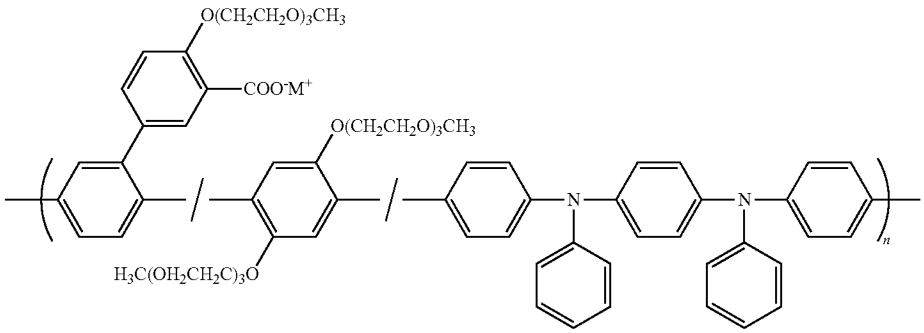
(p/q/100-p-q mol %)
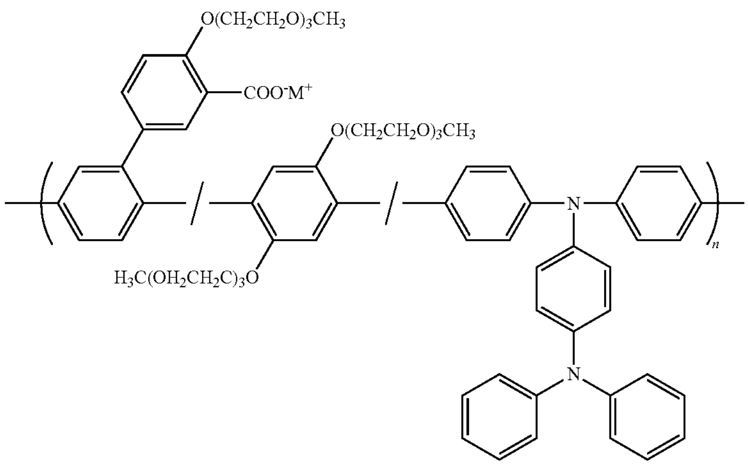
(p/q/100-p-q mol %)
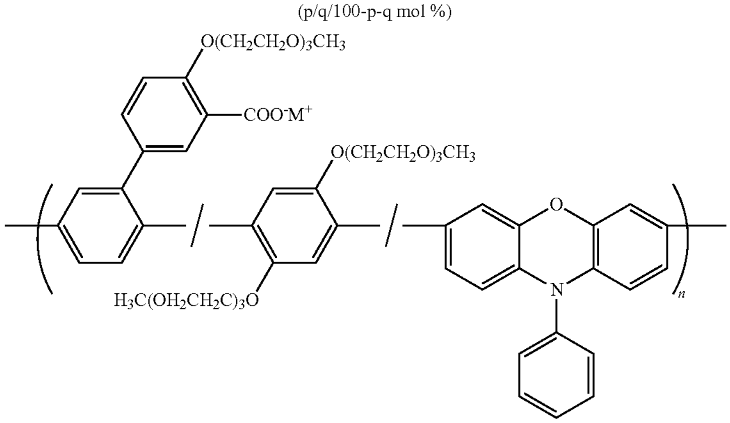
(p/q/100-p-q mol %)
[Chemical Formula 113]
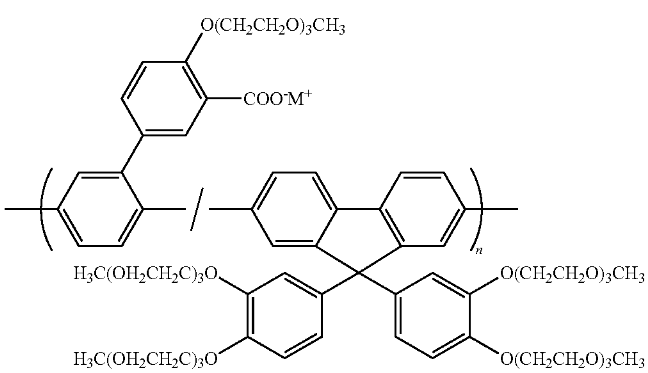
(p/100-p mol %)

-continued
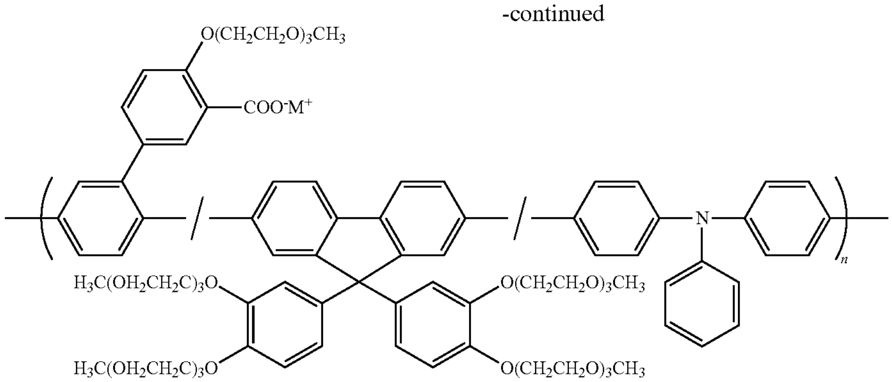
(p/q/100-p-q mol %)
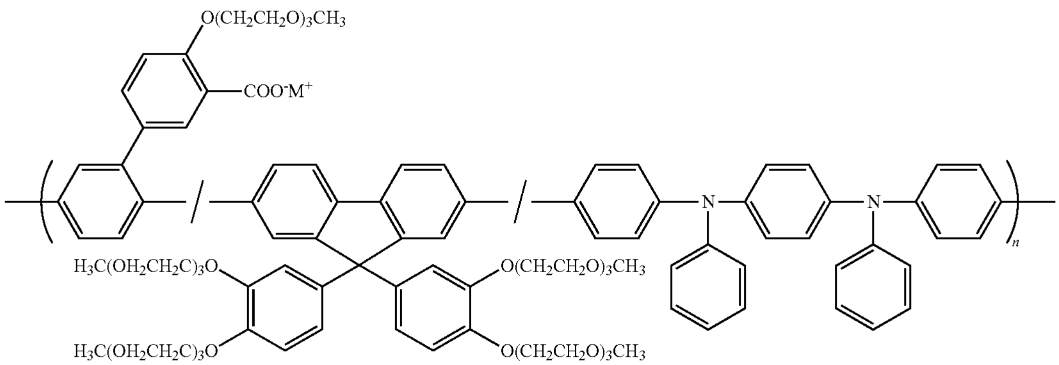
(p/q/100-p-q mol %)
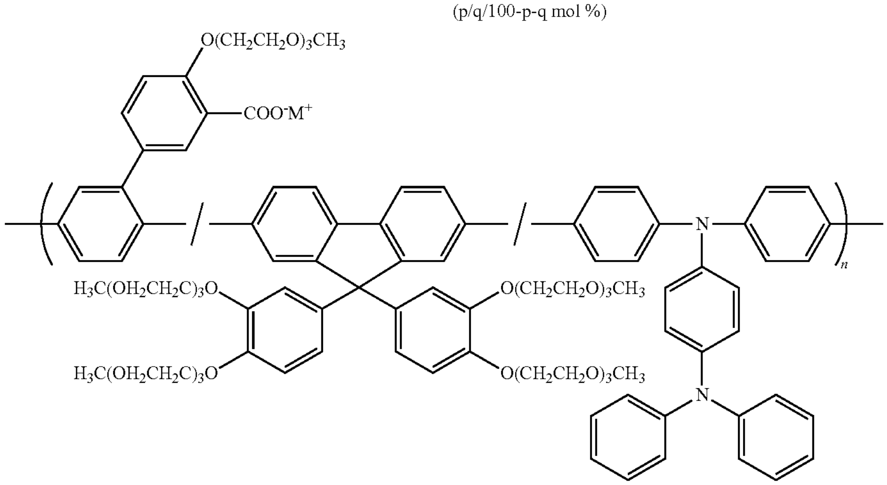
(p/q/100-p-q mol %)
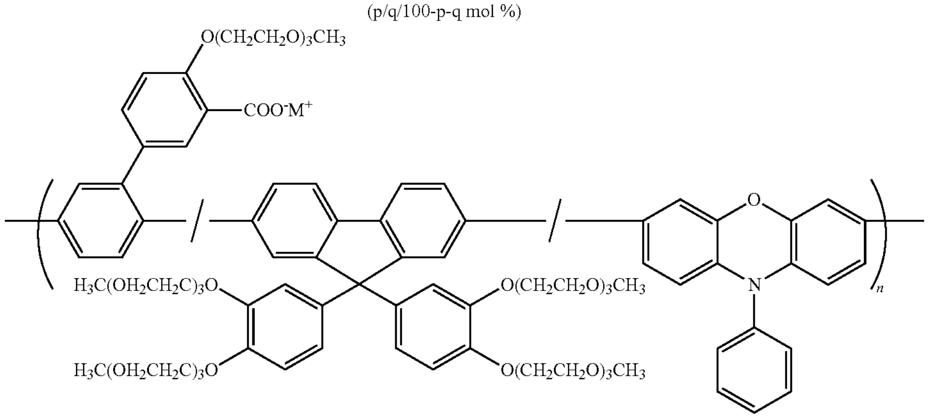
(p/q/100-p-q mol %)

-continued
[Chemical Formula 114]
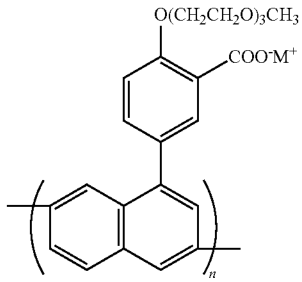
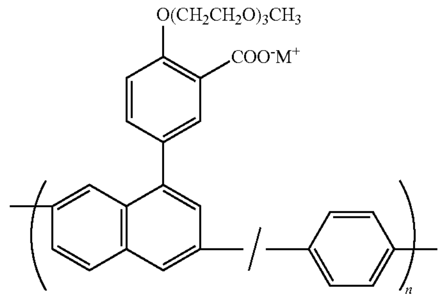
(p/100-p mol %)
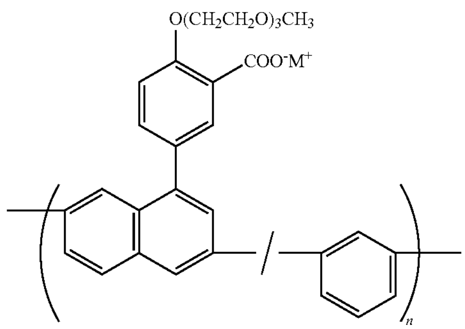
(p/100-p mol %)
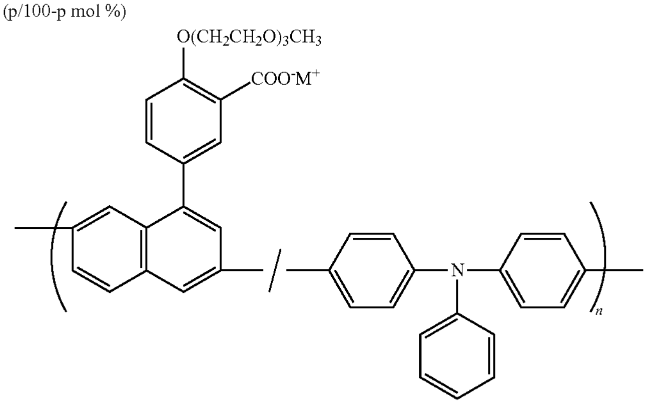
(p/100-p mol %)
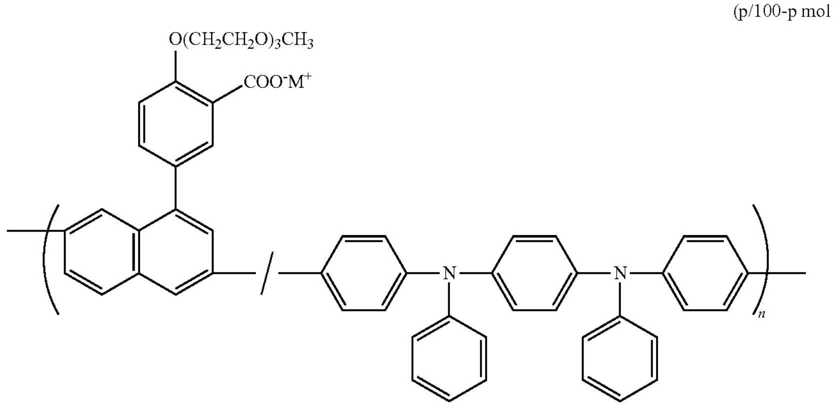
(p/100-p mol %)
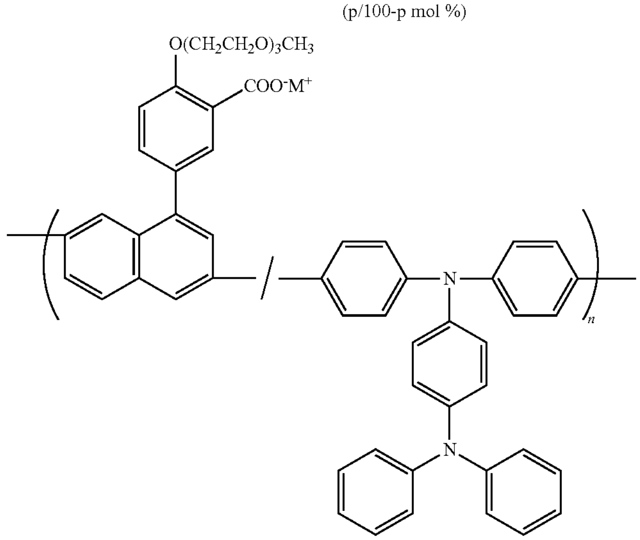
(p/100-p mol %)

-continued
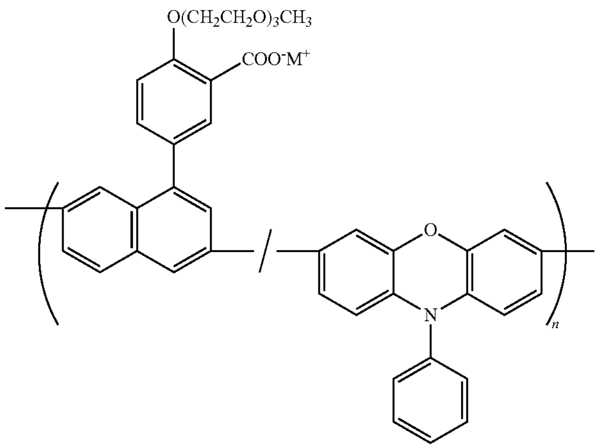
(p/100-p mol %)
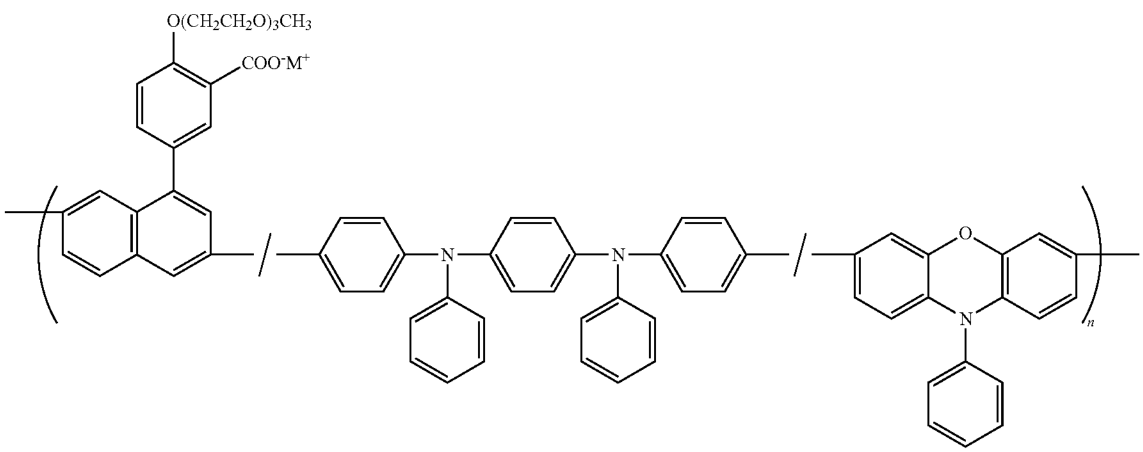
(p/q/100-p mol %)
[Chemical Formula 115]
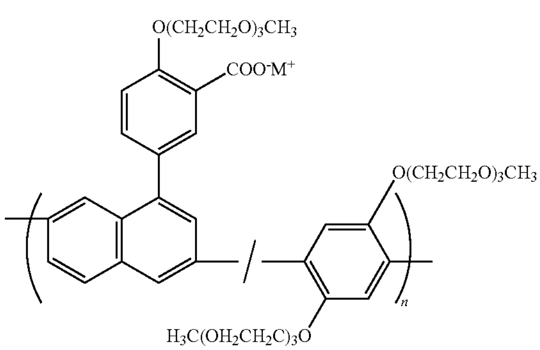
(p/100-p mol %)

-continued
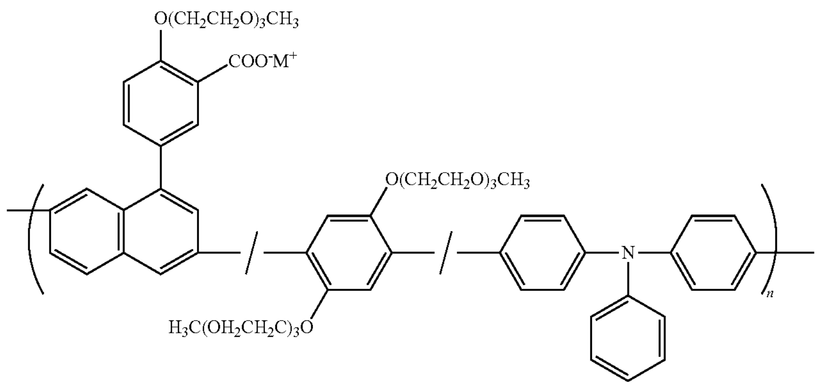
(p/q/100-p-q mol %)
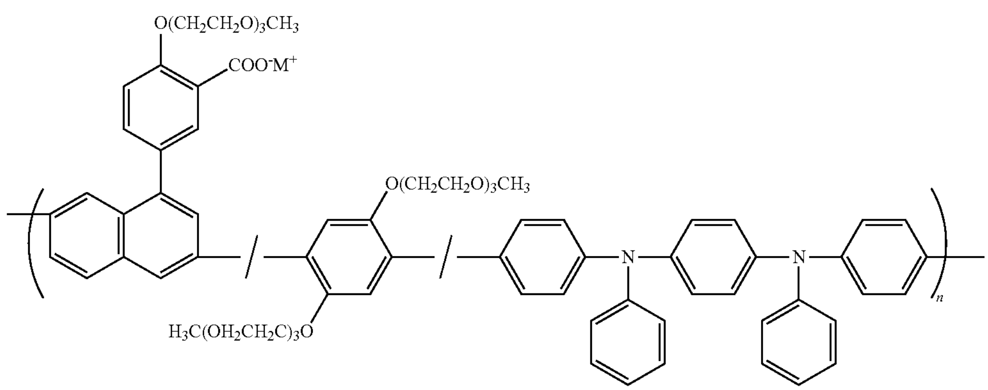
(p/q/100-p-q mol %)
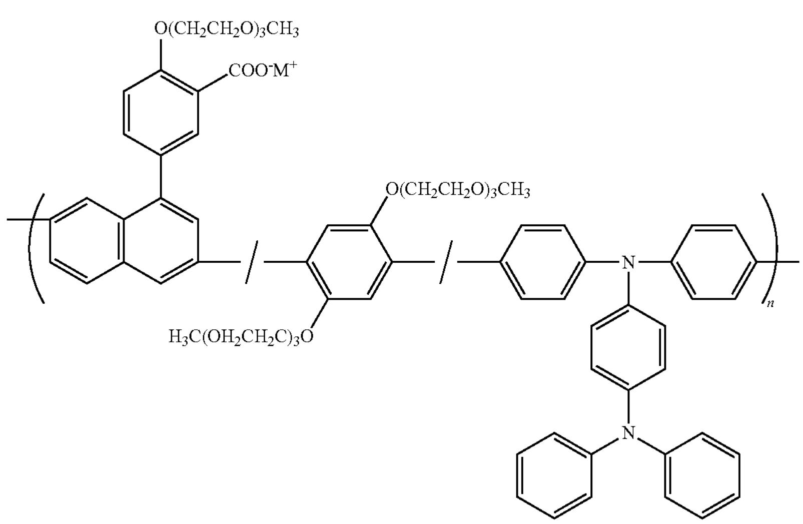
(p/q/100-p-q mol %)

-continued
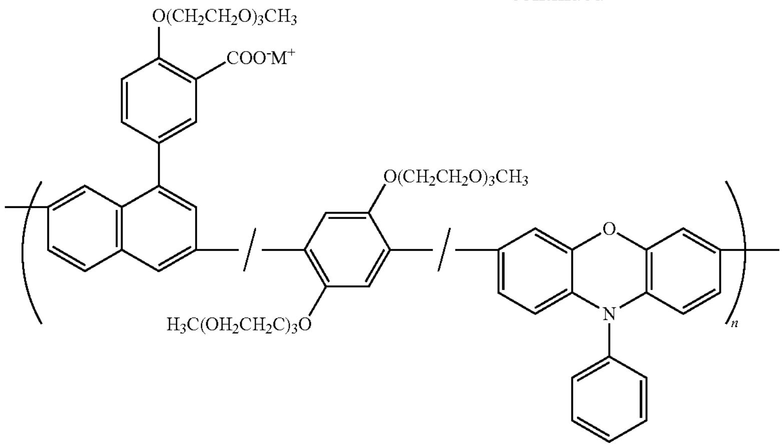
(p/q/100-p-q mol %)
[Chemical Formula 116]
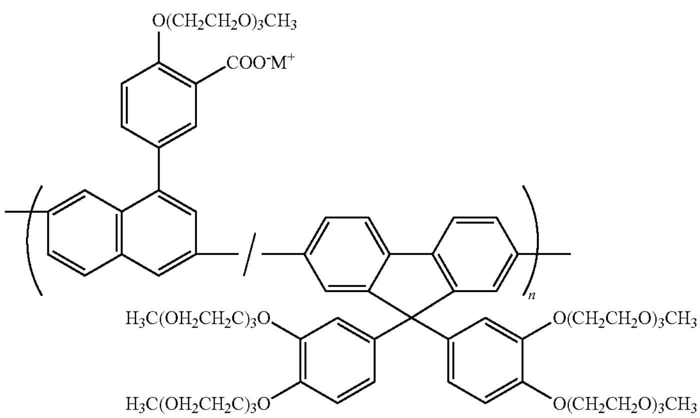
(p/100-p mol %)
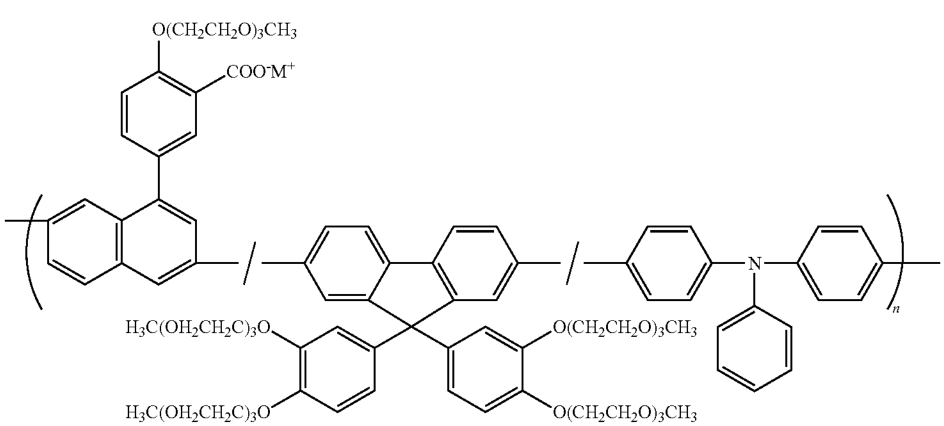
(p/q/100-p-q mol %)

-continued
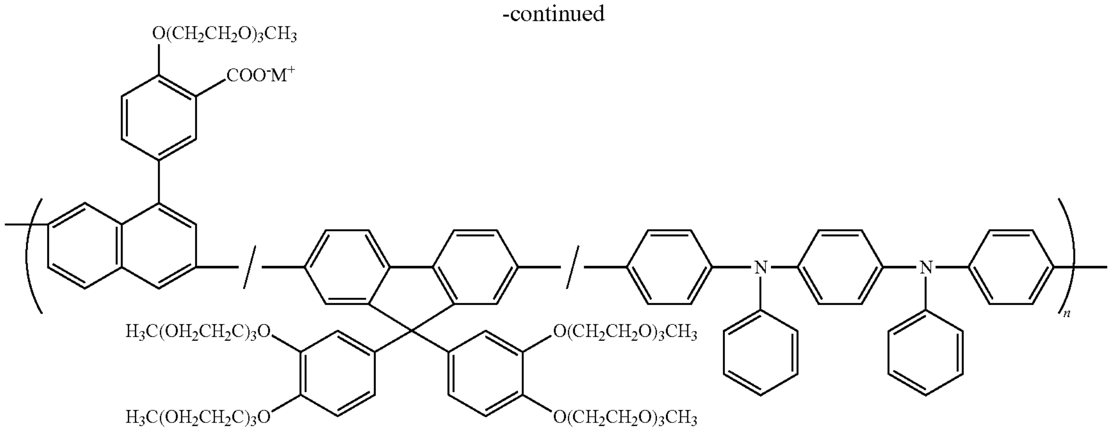
(p/q/100-p-q mol %)
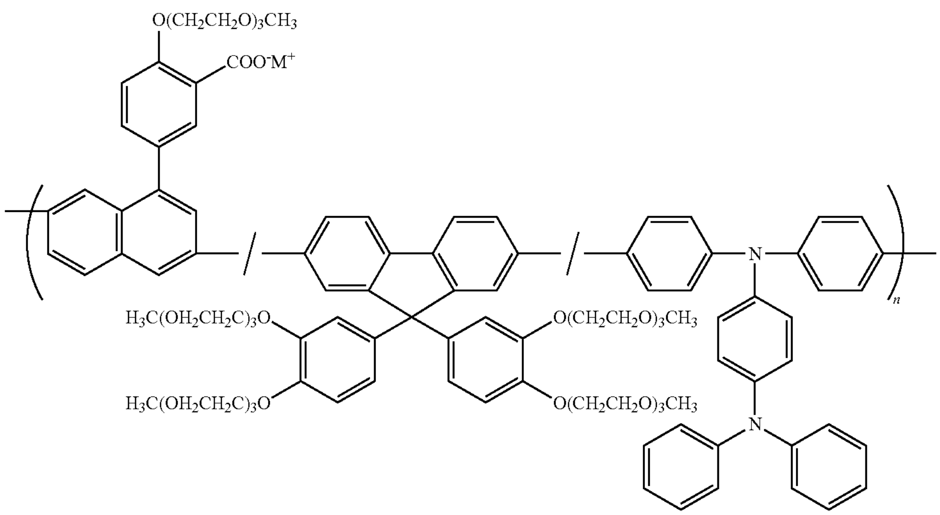
(p/q/100-p-q mol %)
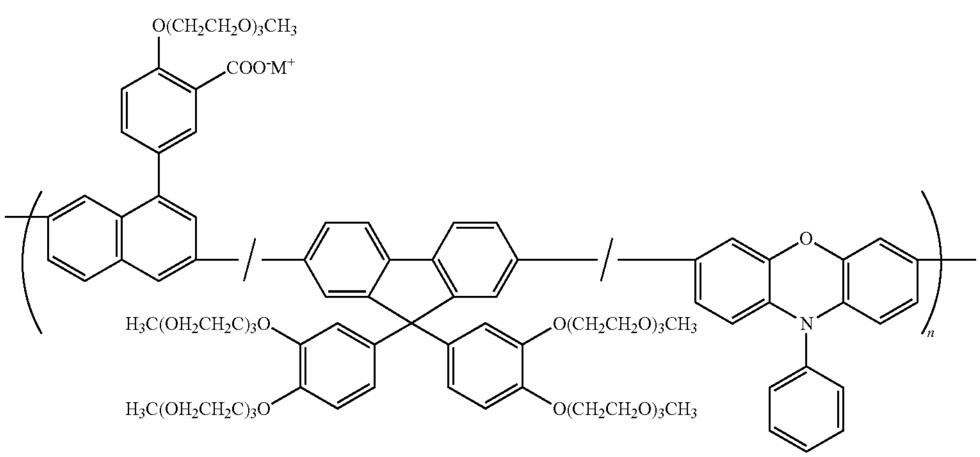
(p/q/100-p-q mol %)

-continued
[Chemical Formula 117]
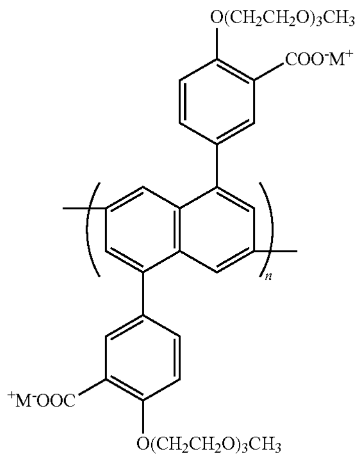
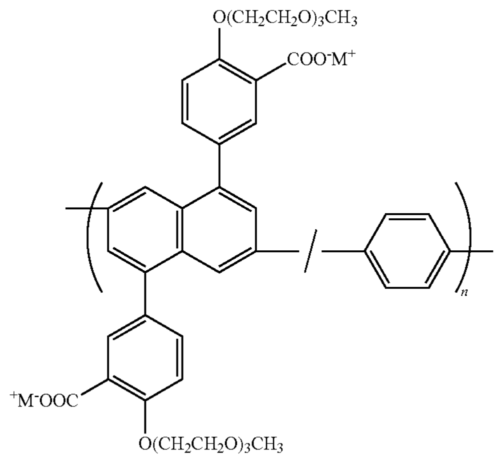
(p/100-p mol %)
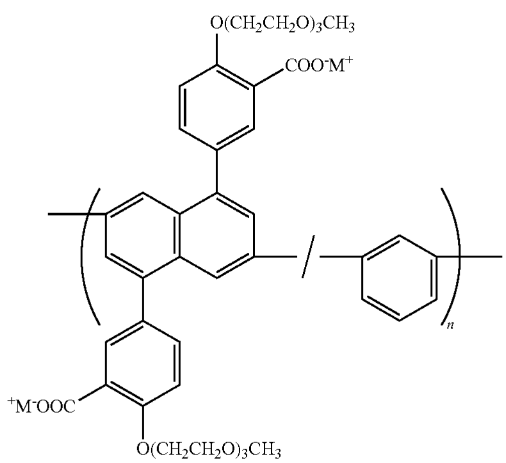
(p/100-p mol %)
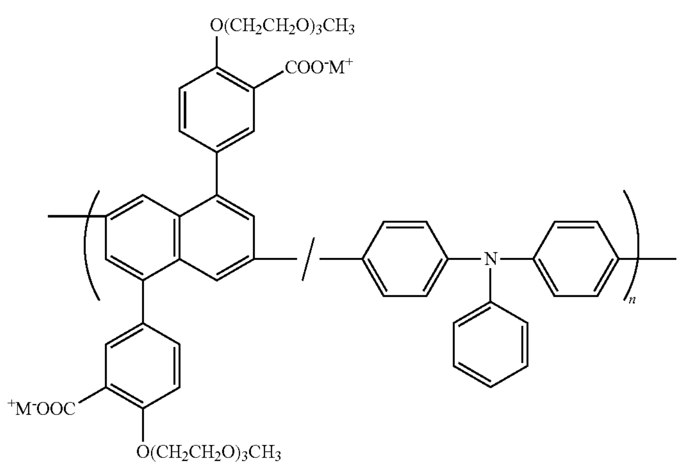
(p/100-p mol %)

-continued
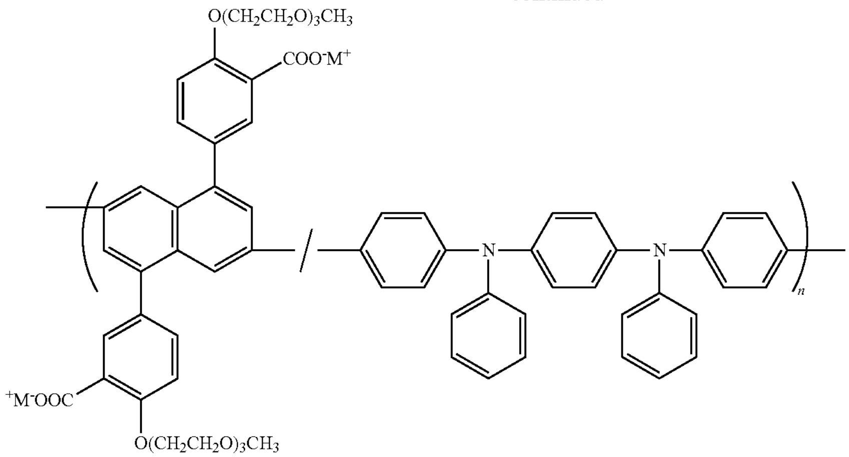
(p/100-p mol %)
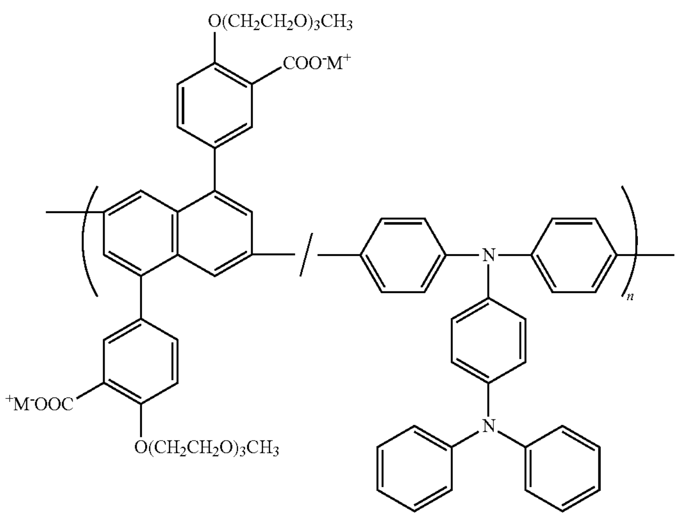
(p/100-p mol %)
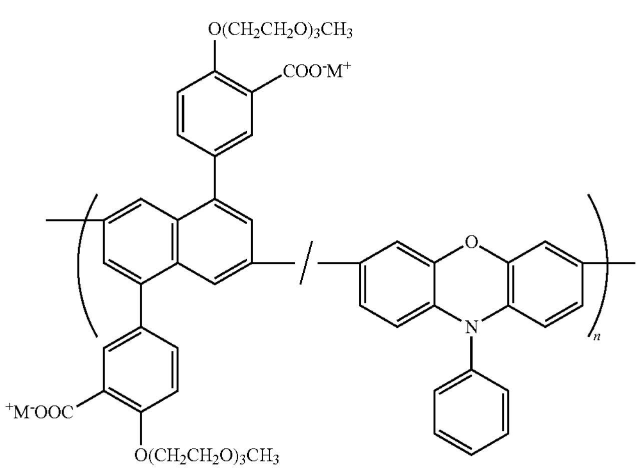
(p/100-p mol %)

-continued
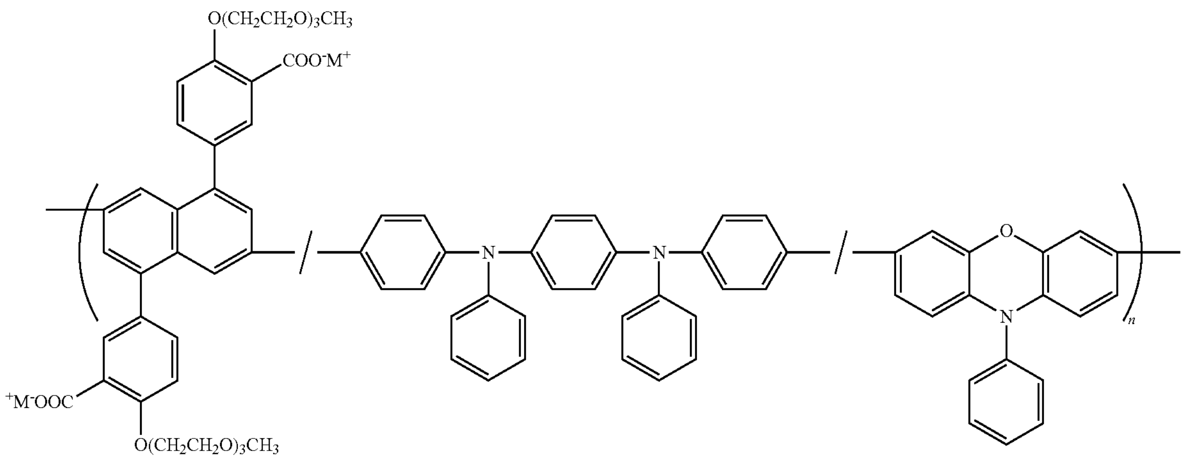
(p/q/100-p-q mol %)
[Chemical Formula 118]
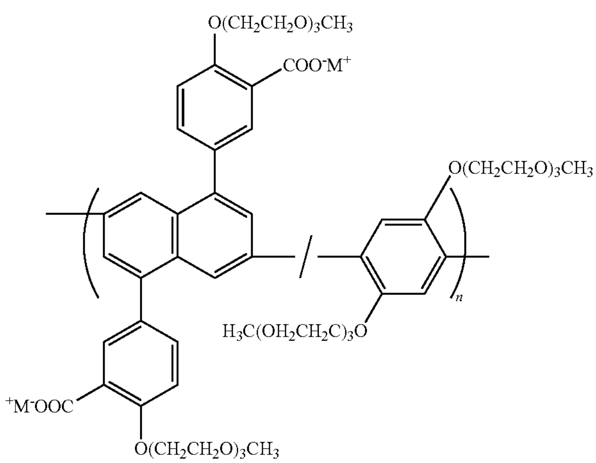
(p/100-p mol %)
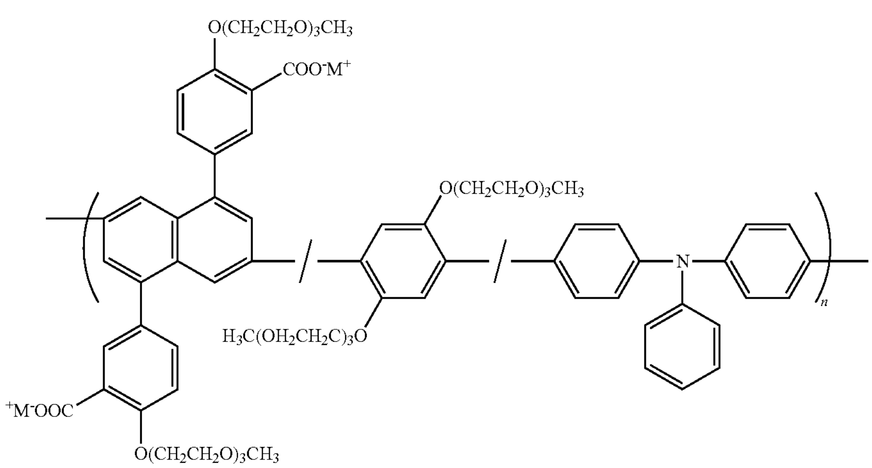
(p/q/100-p-q mol %)

-continued
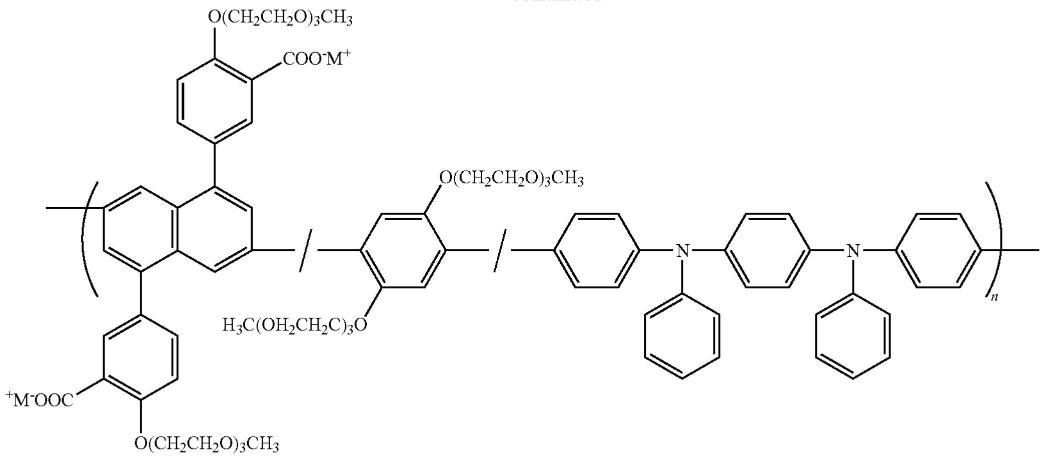
(p/q/100-p-q mol %)
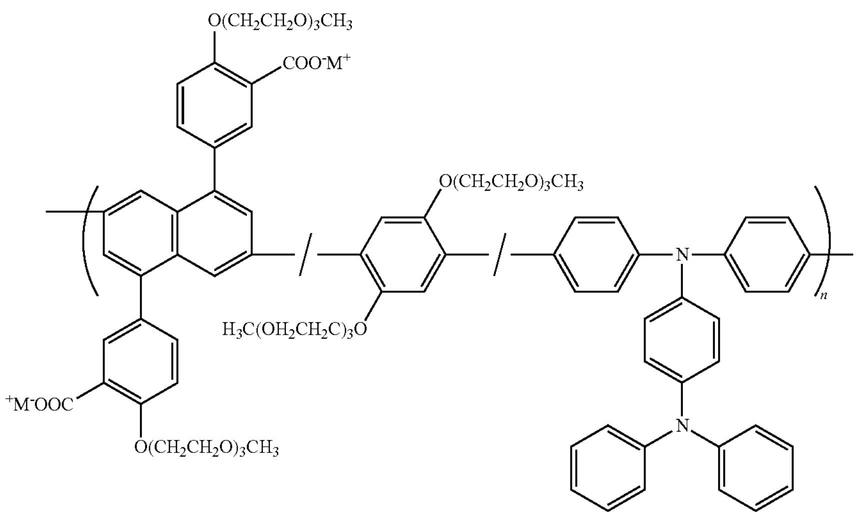
(p/q/100-p-q mol %)
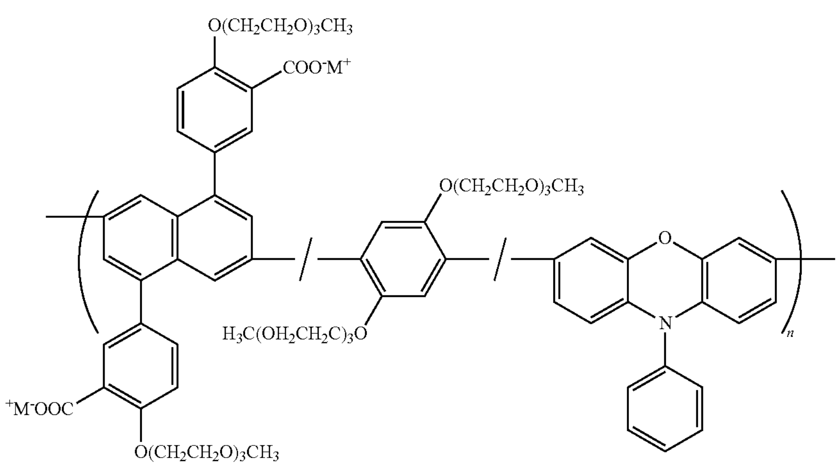
(p/q/100-p-q mol %)

-continued
[Chemical Formula 119]
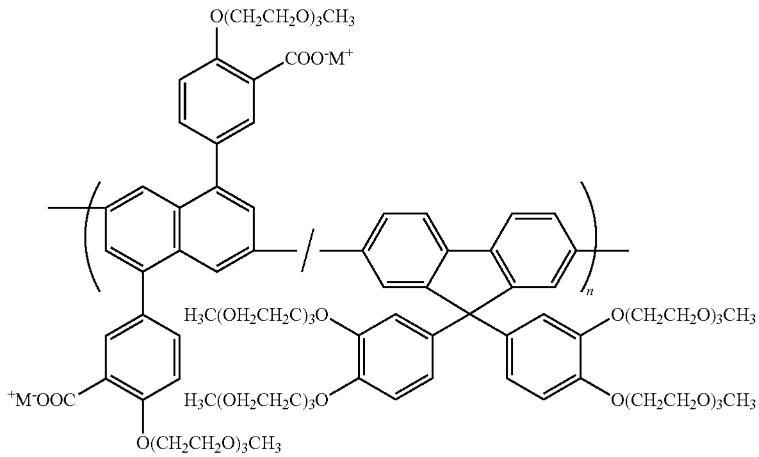
(p/100-p mol %)
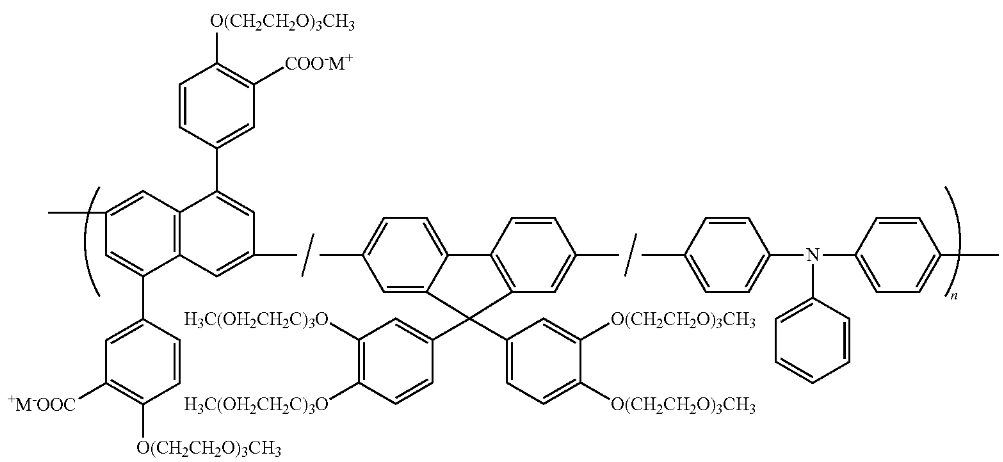
(p/q/100-p-q mol %)
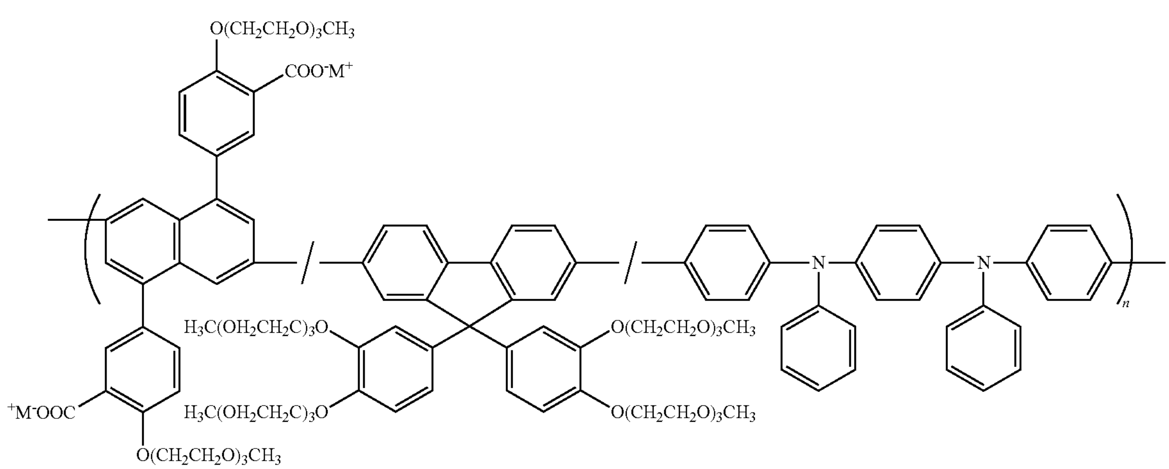
(p/q/100-p-q mol %)

-continued
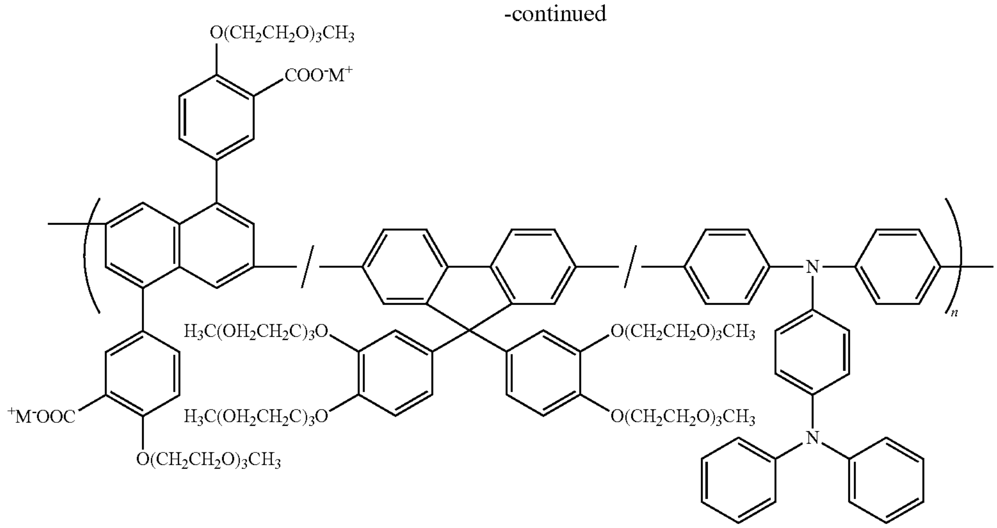
(p/q/100-p-q mol %)
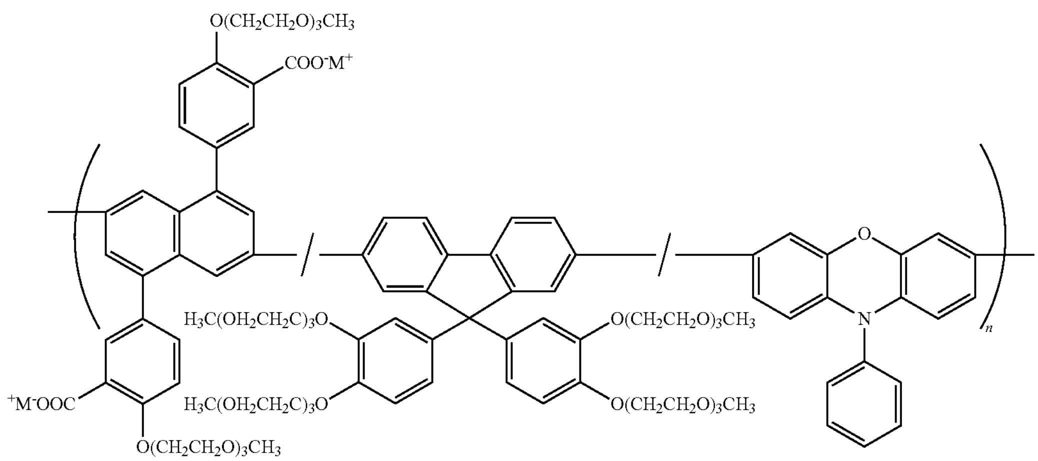
(p/q/100-p-q mol %)
[Chemical Formula 120]
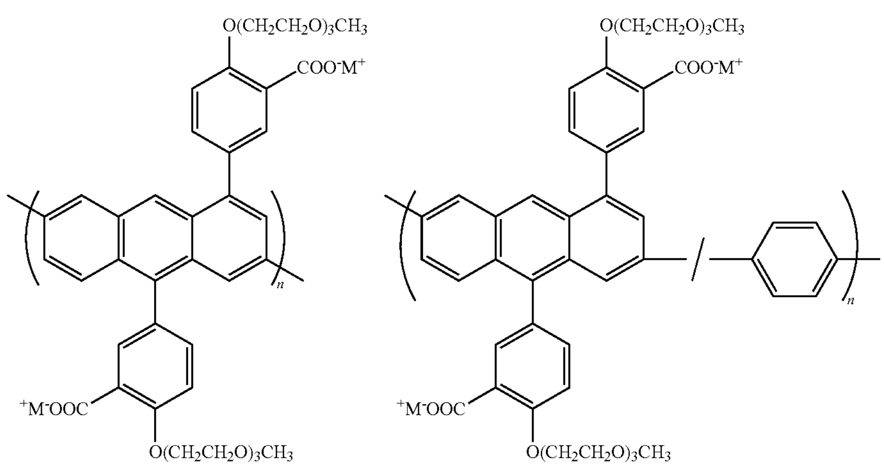
(p/100-p mol %)

-continued
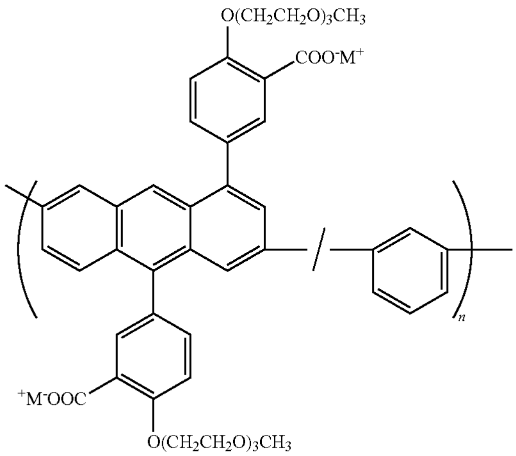
(p/100-p mol %)
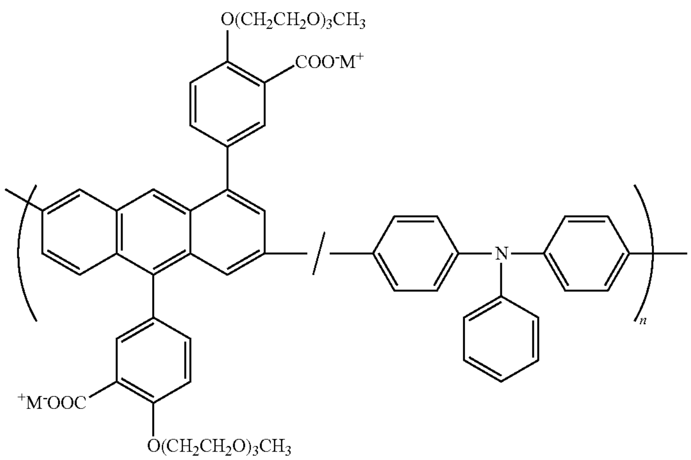
(p/100-p mol %)
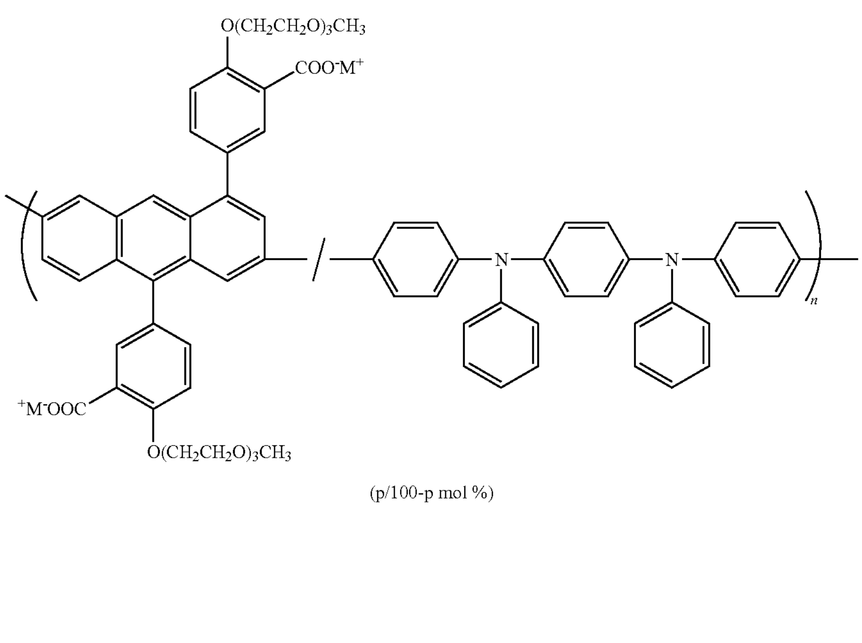
(p/100-p mol %)

-continued
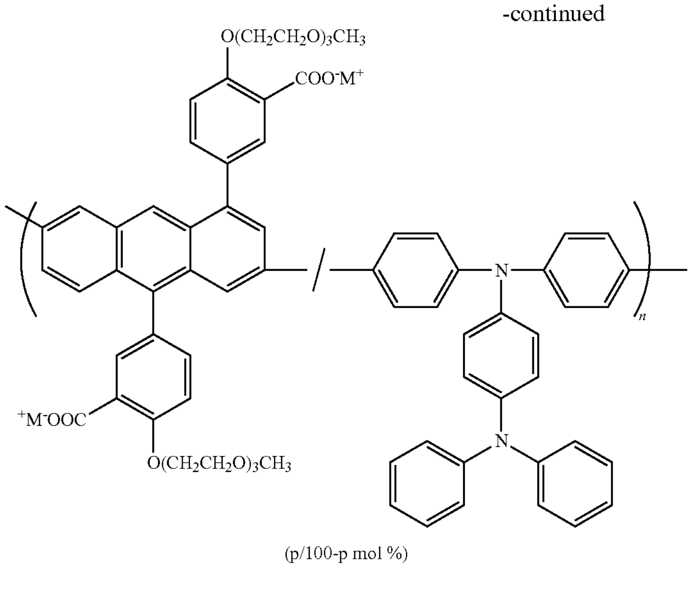
(p/100-p mol %)
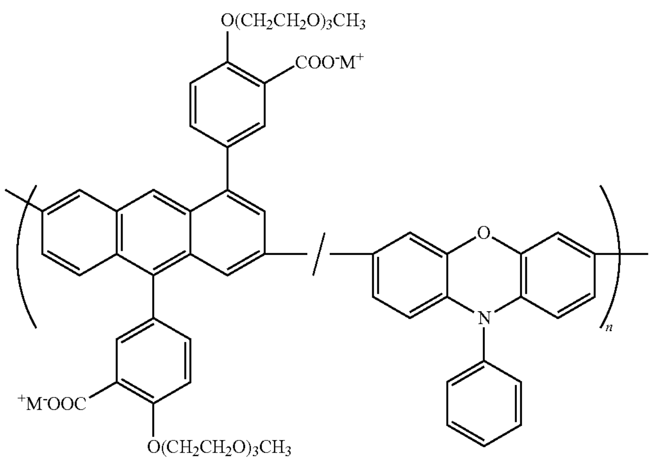
(p/100-p mol %)
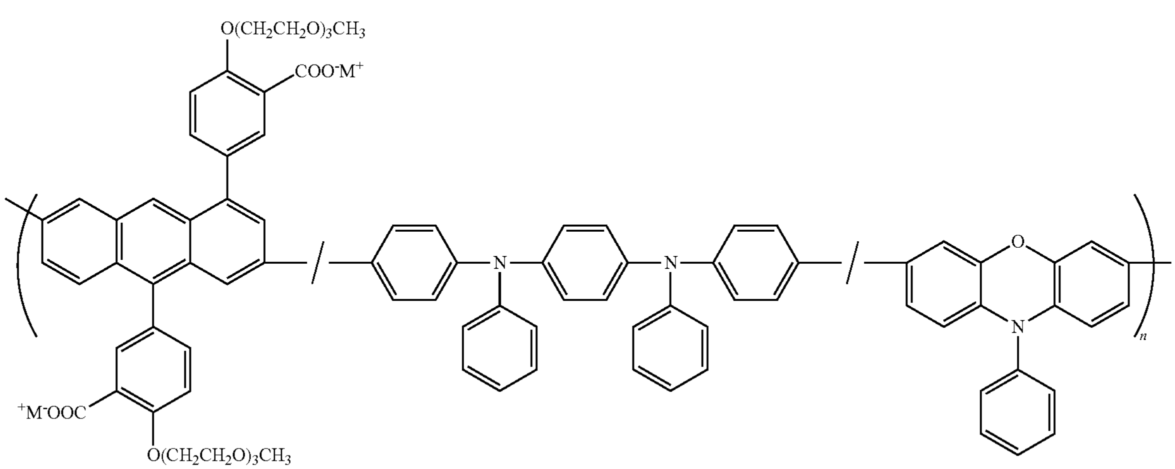
(p/q/100-p mol %)

-continued
[Chemical Formula 121]
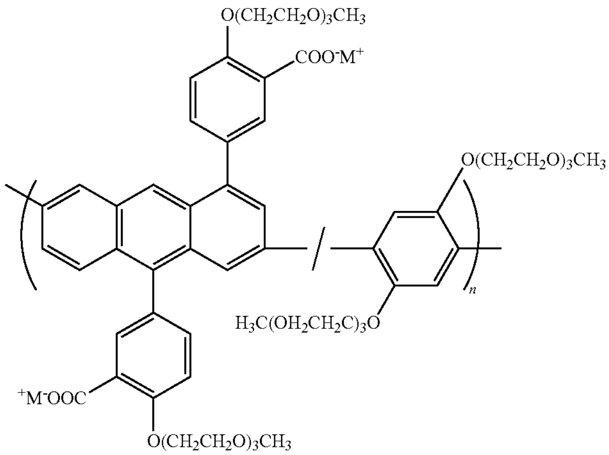
(p/100-p mol %)
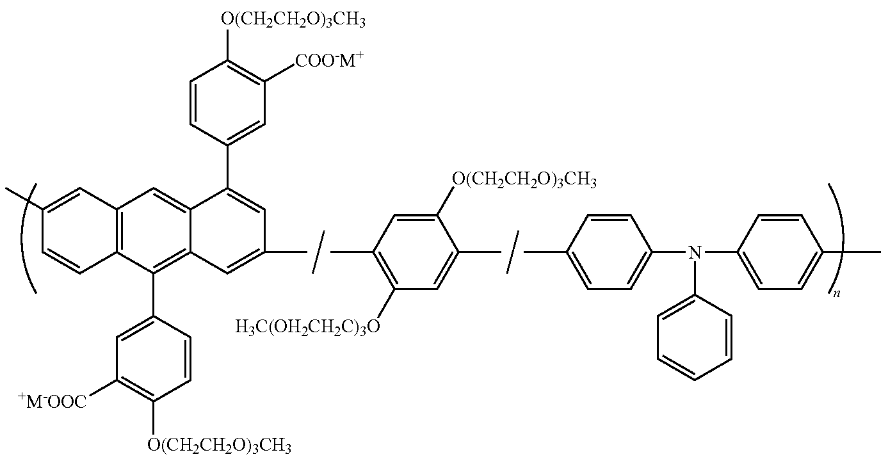
(p/q/100-p-q mol %)
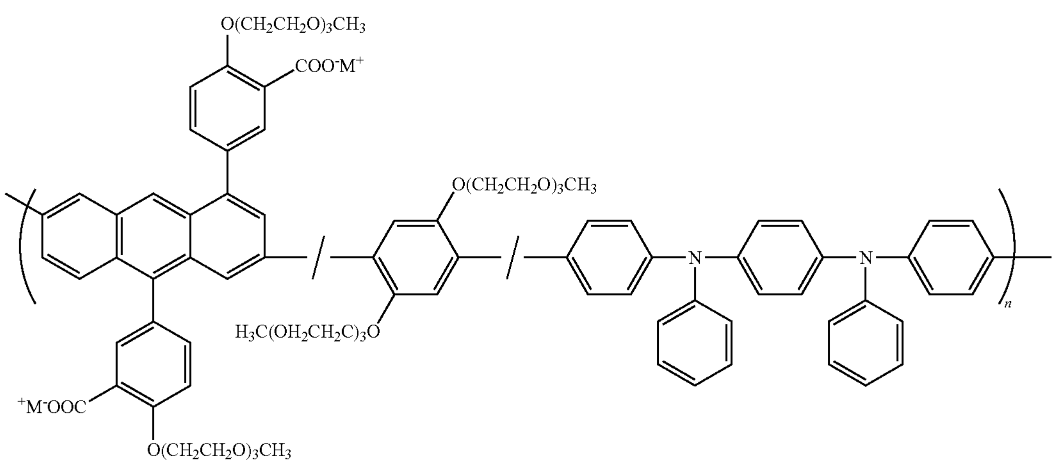
(p/q/100-p-q mol %)

-continued
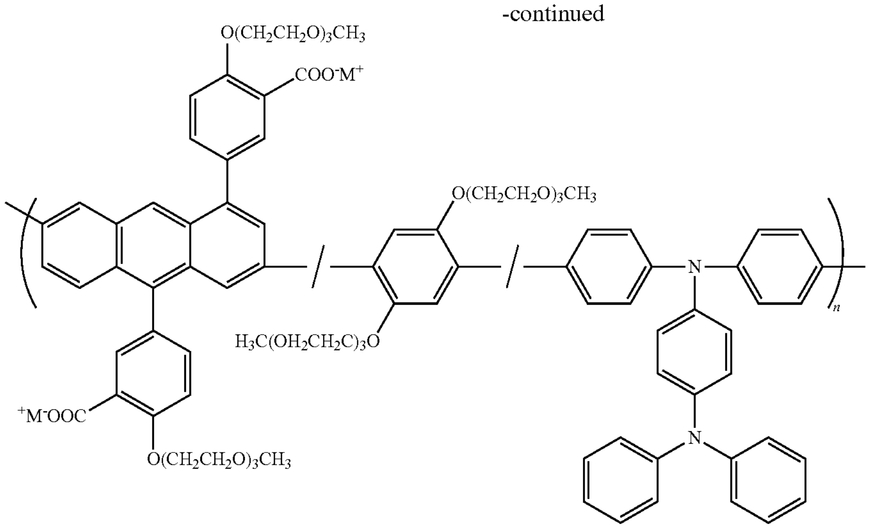
(p/q/100-p-q mol %)
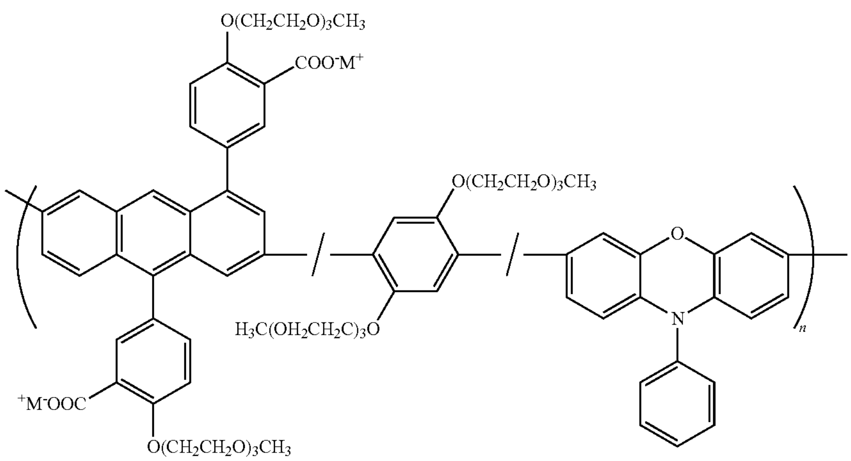
(p/q/100-p-q mol %)
[Chemical Formula 122]
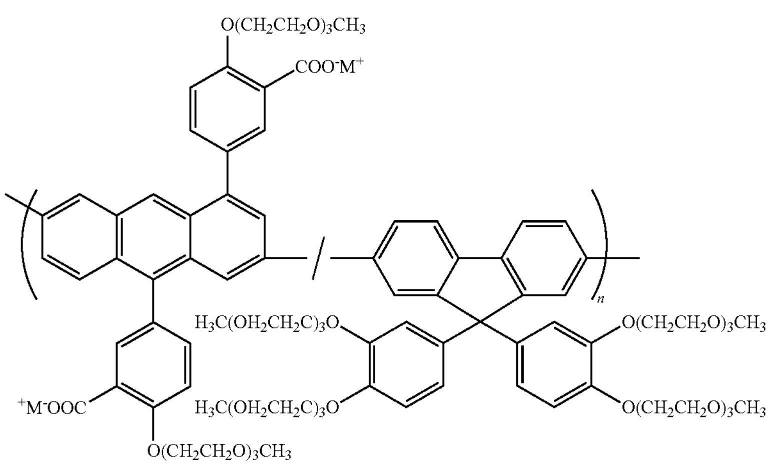
(p/100-p mol %)

-continued
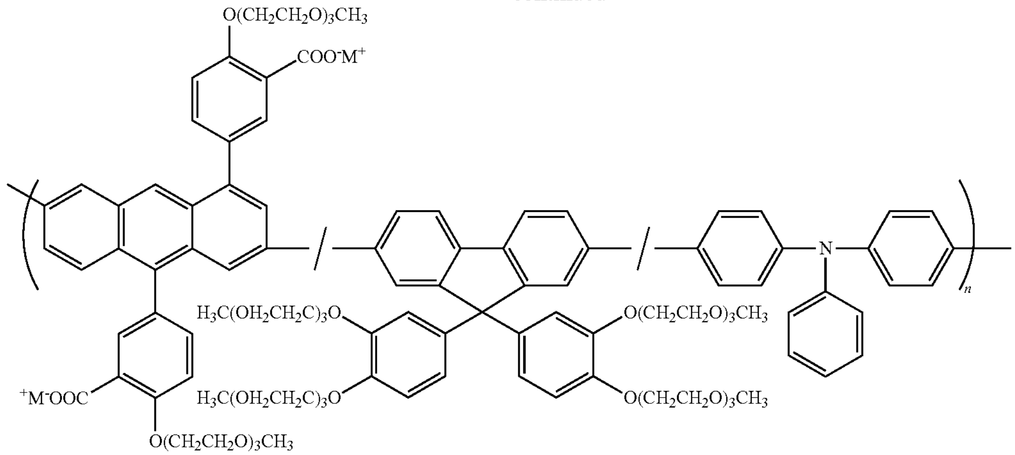
(p/q/100-p-q mol %)
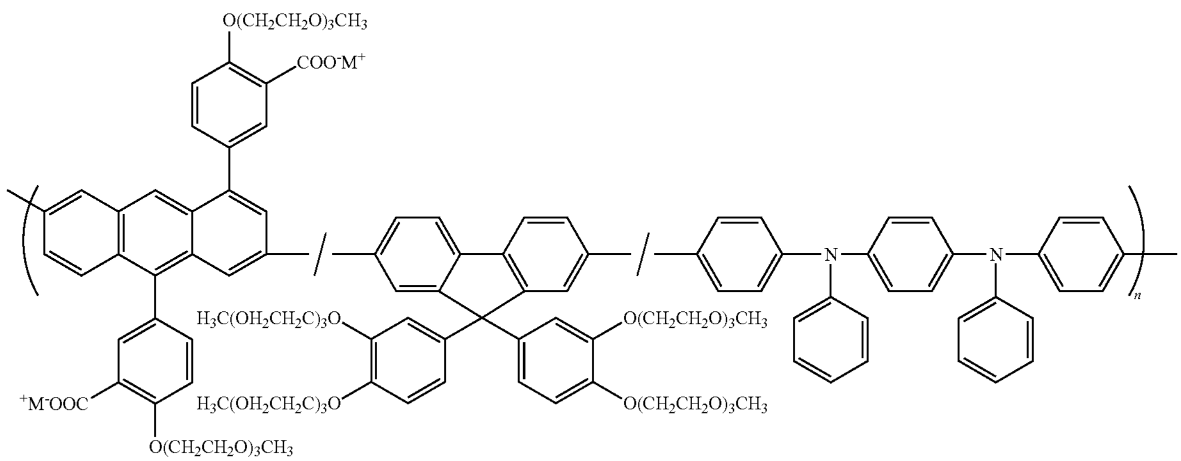
(p/q/100-p-q mol %)
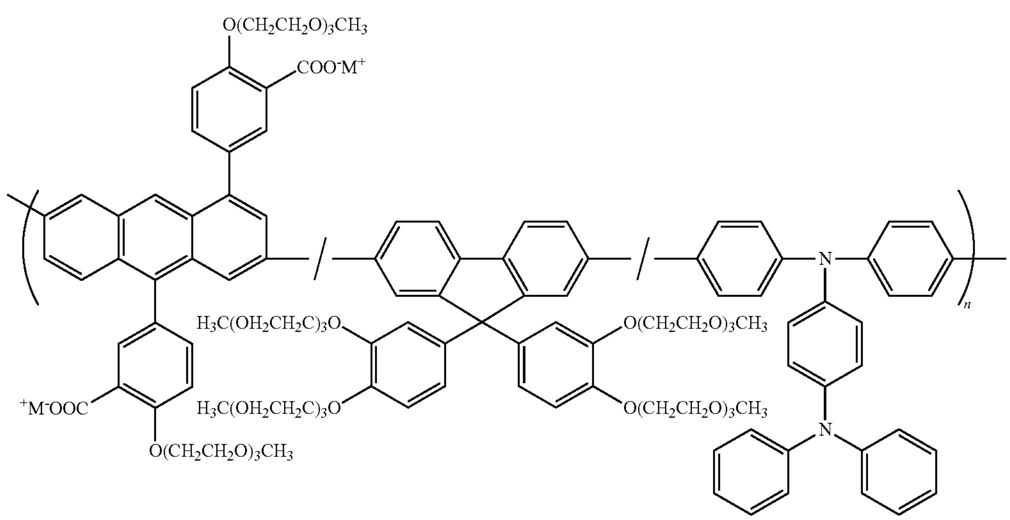
(p/q/100-p-q mol %)

-continued
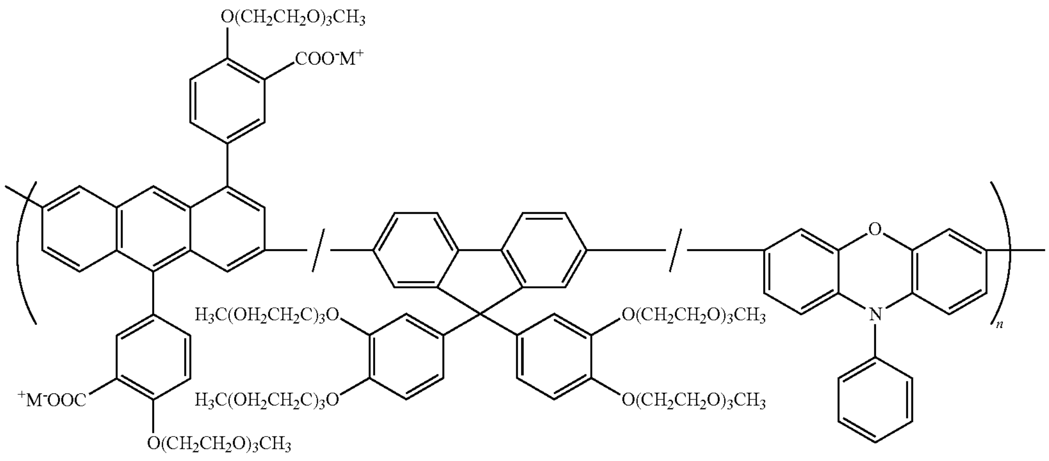
(p/q/100-p-q mol %)
[Chemical Formula 123]
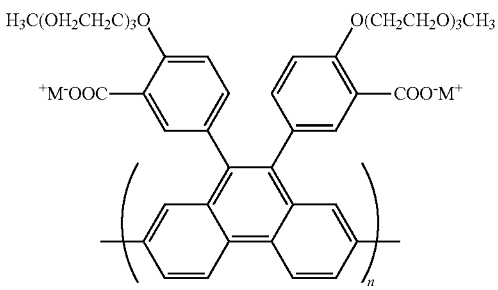
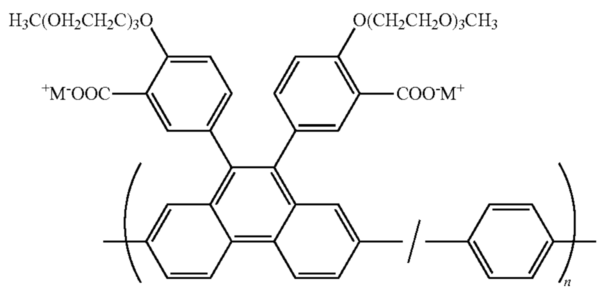
(p/100-p mol %)
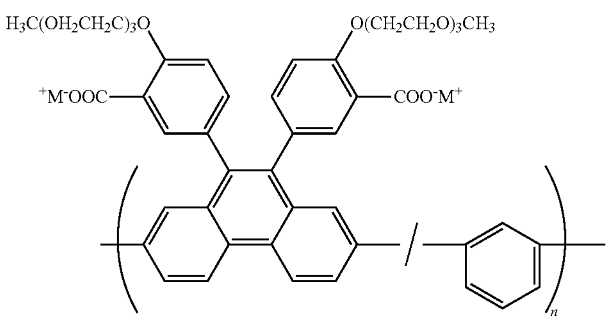
(p/100-p mol %)
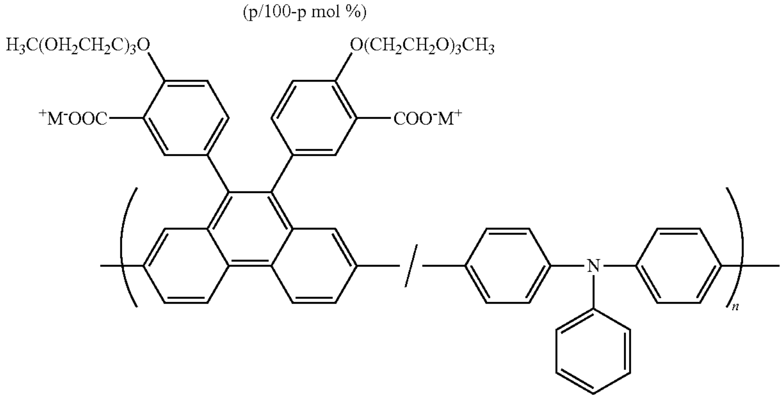
(p/100-p mol %)

-continued
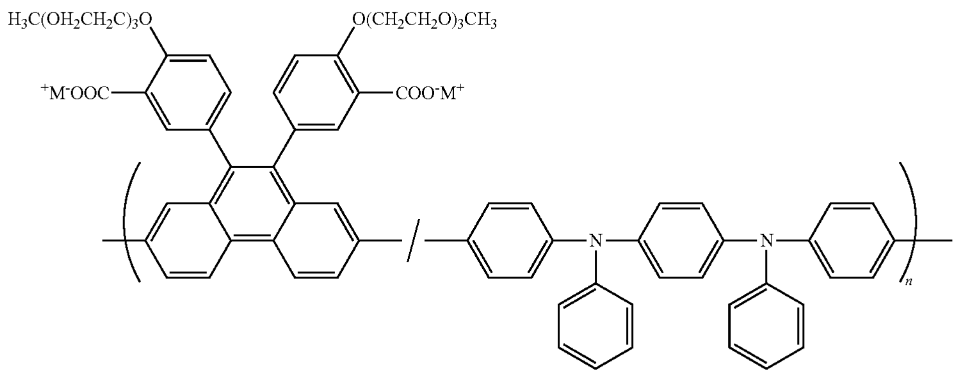
(p/100-p mol %)
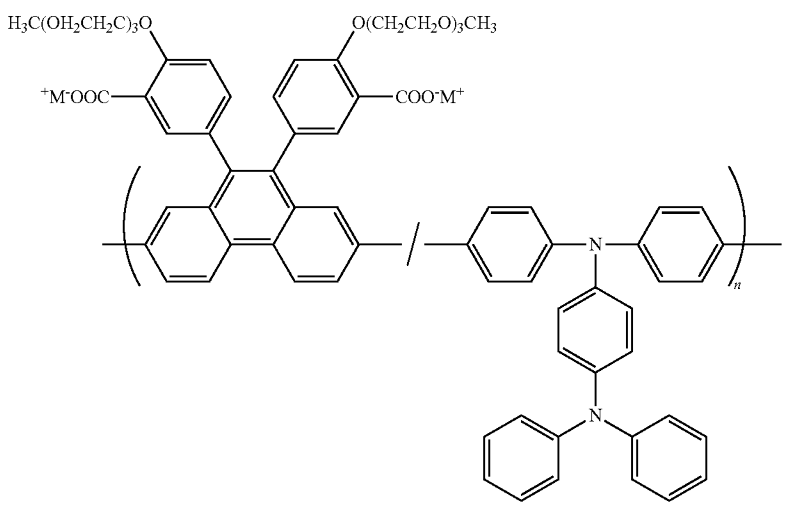
(p/100-p mol %)
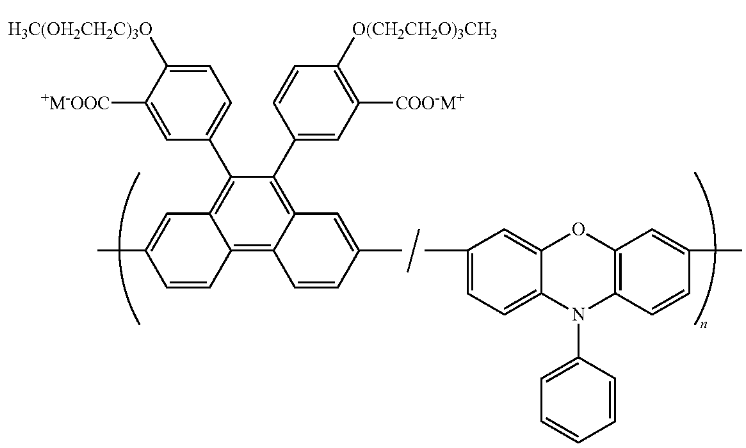
(p/100-p mol %)

-continued
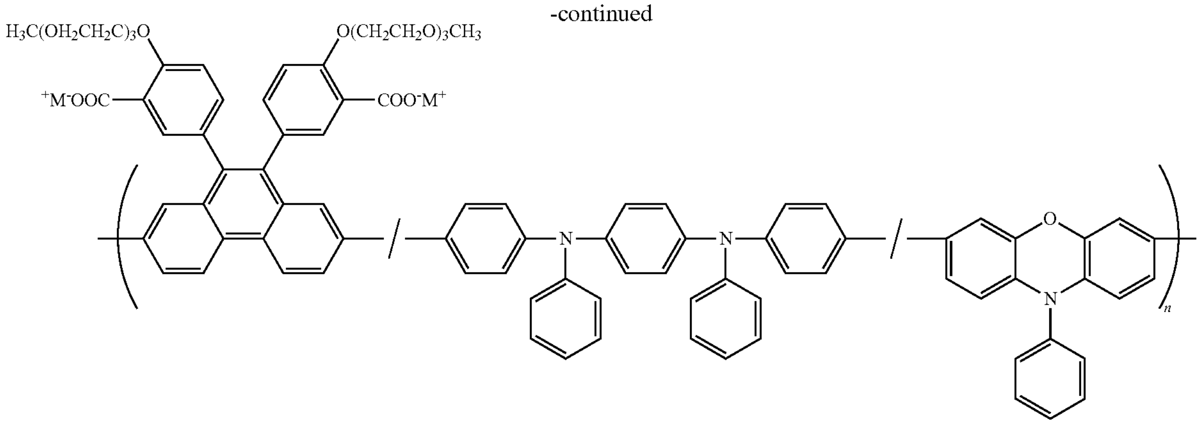
(p/q/100-p mol %)
[Chemical Formula 124]
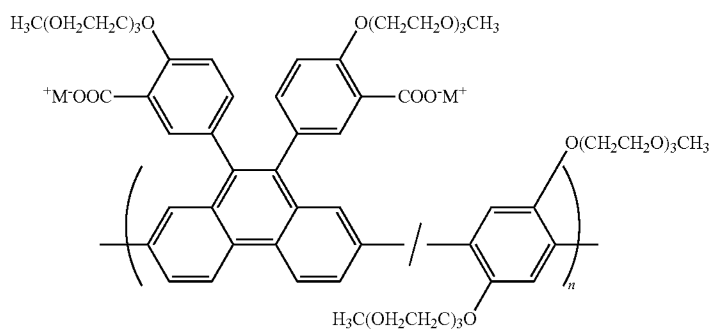
(p/100-p mol %)
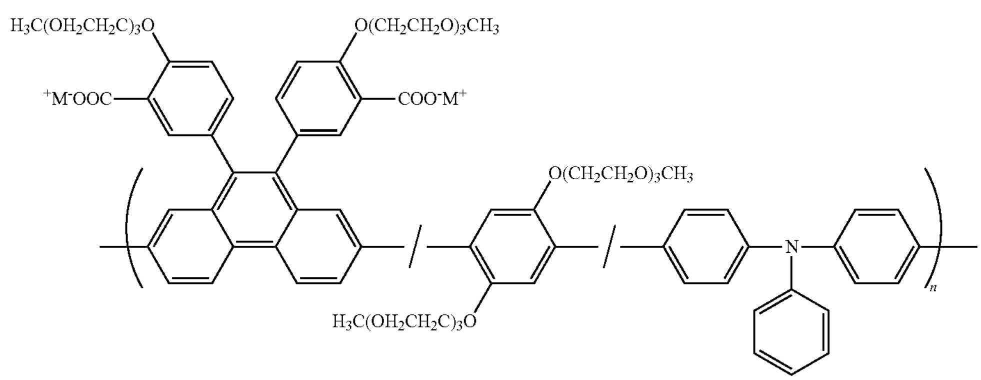
(p/q/100-p-q mol %)
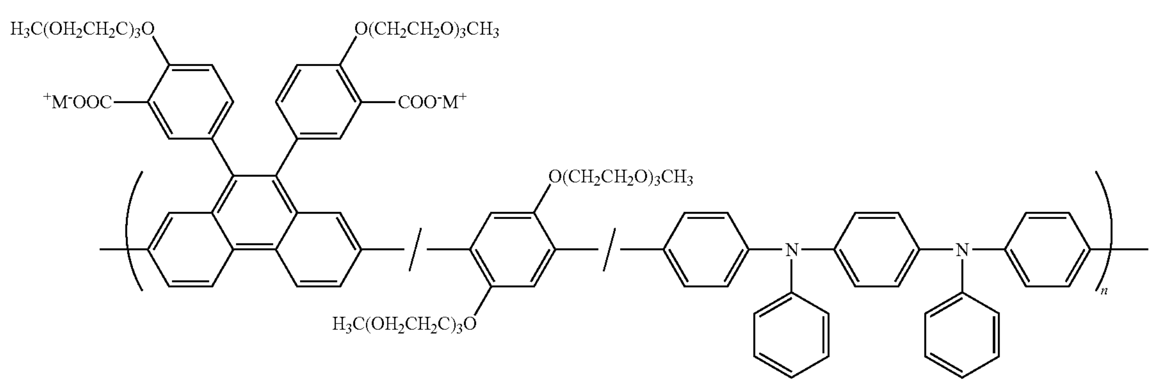
(p/q/100-p-q mol %)

-continued
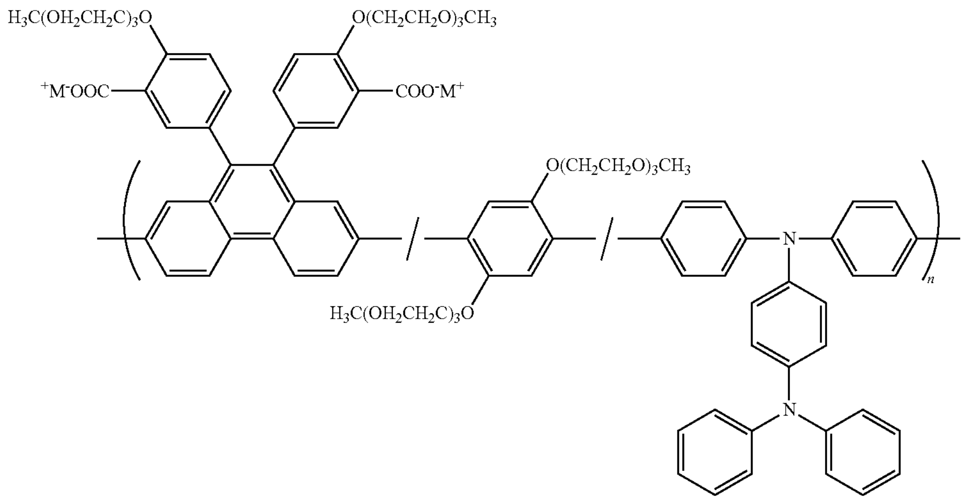
(p/q/100-p-q mol %)
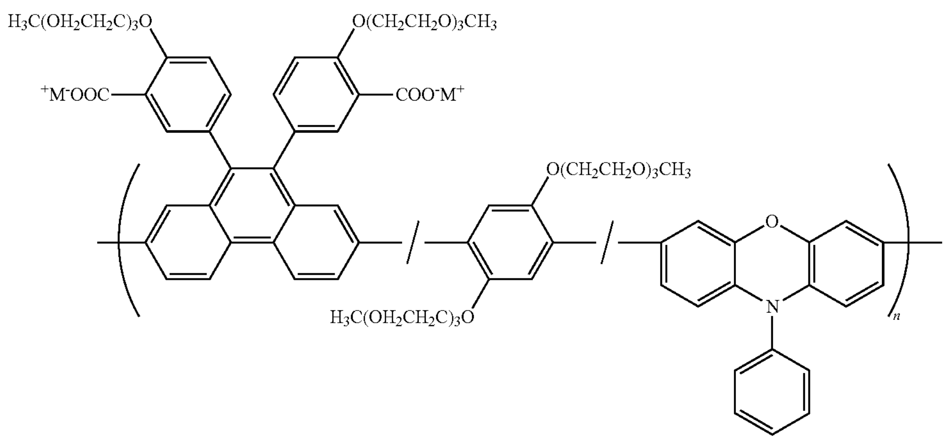
(p/q/100-p-q mol %)
[Chemical Formula 125]
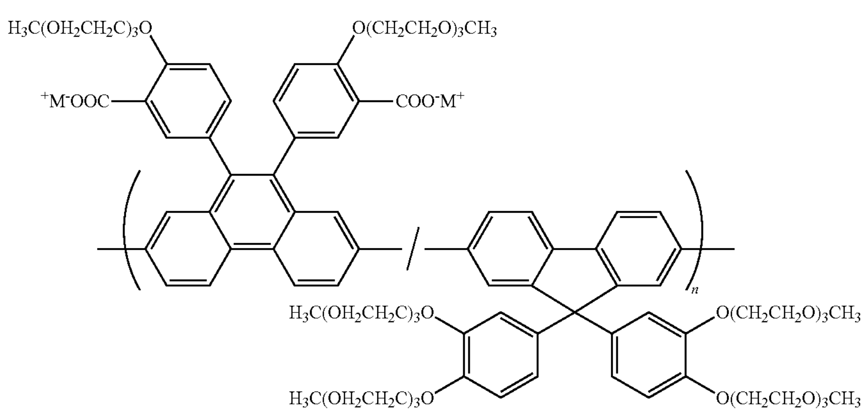
(p/100-p mol %)

-continued
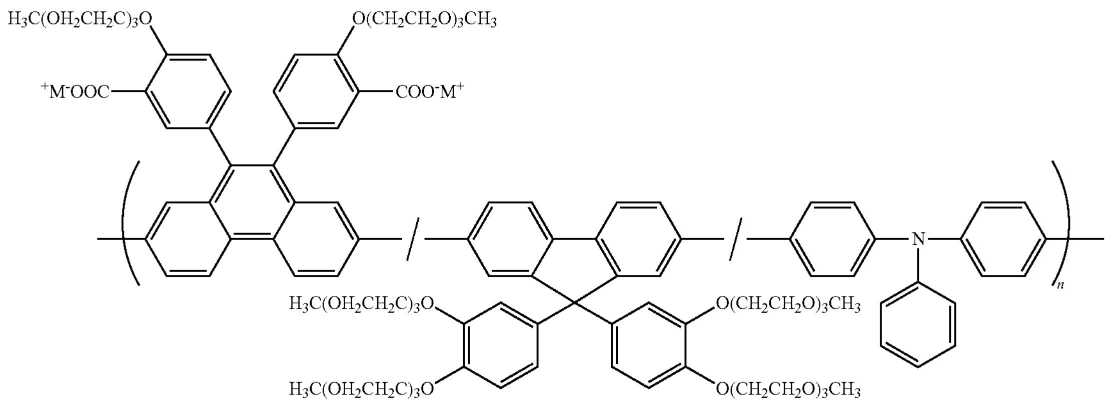
(p/q/100-p-q mol %)
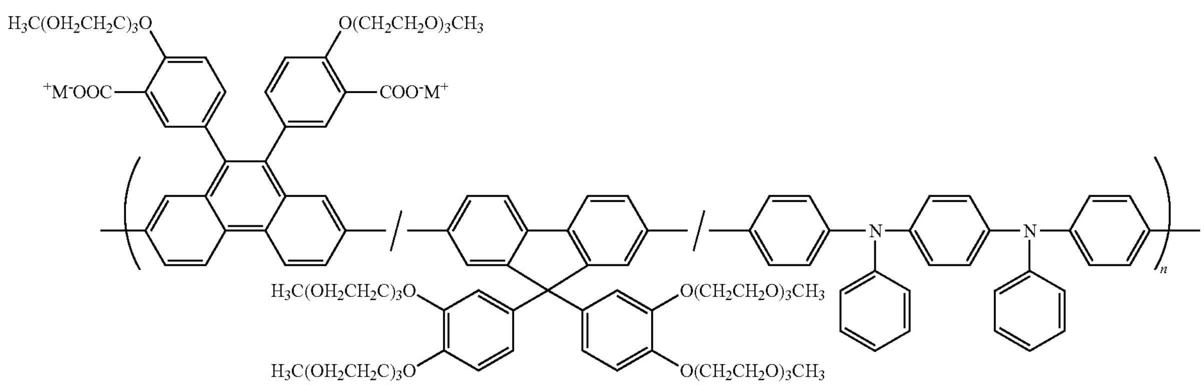
(p/q/100-p-q mol %)
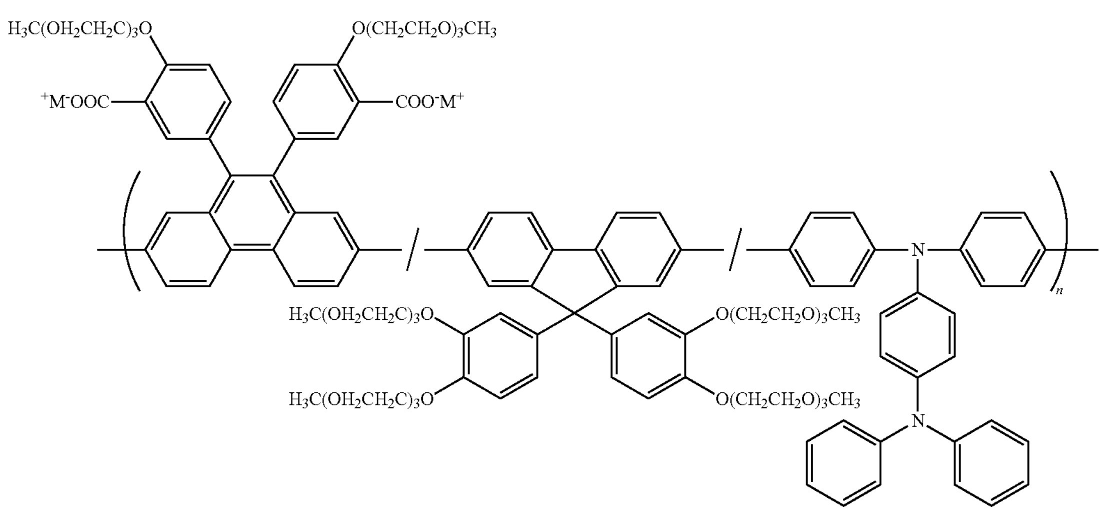
(p/q/100-p-q mol %)

-continued
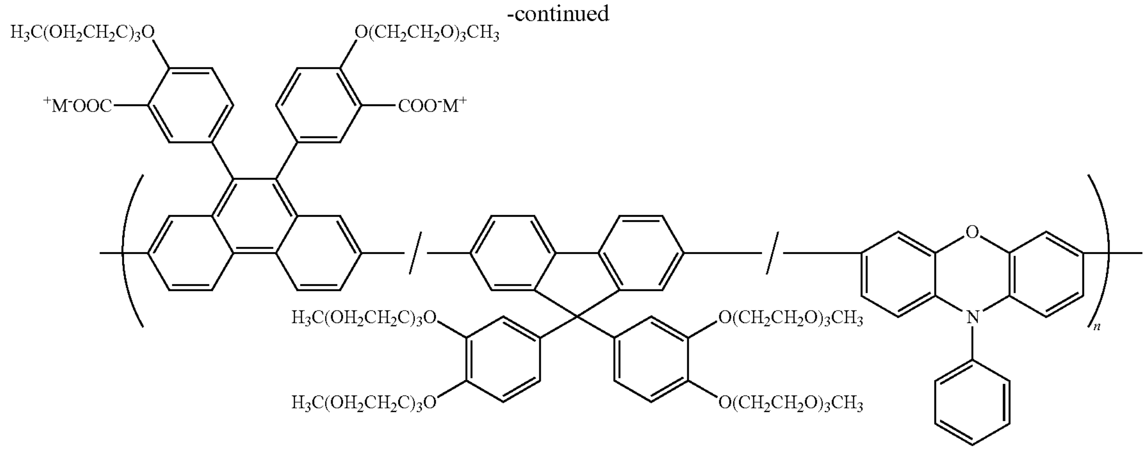
(p/q/100-p-q mol %)
[Chemical Formula 126]
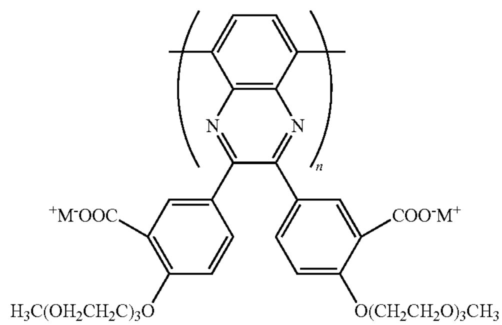
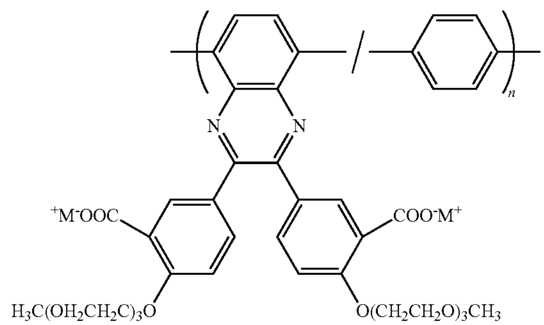
(p/100-p mol %)
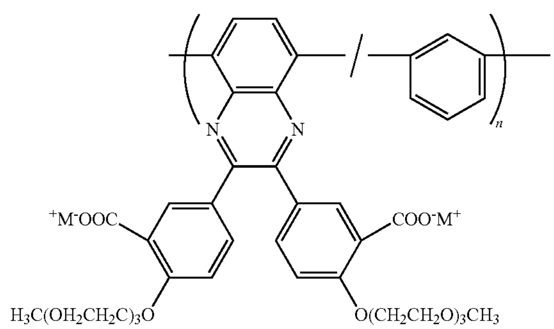
(p/100-p mol %)
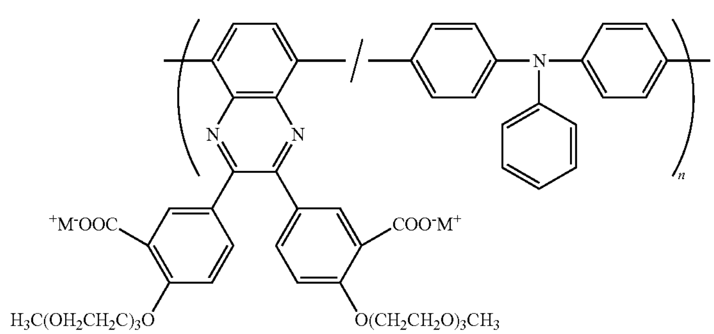
(p/100-p mol %)

-continued
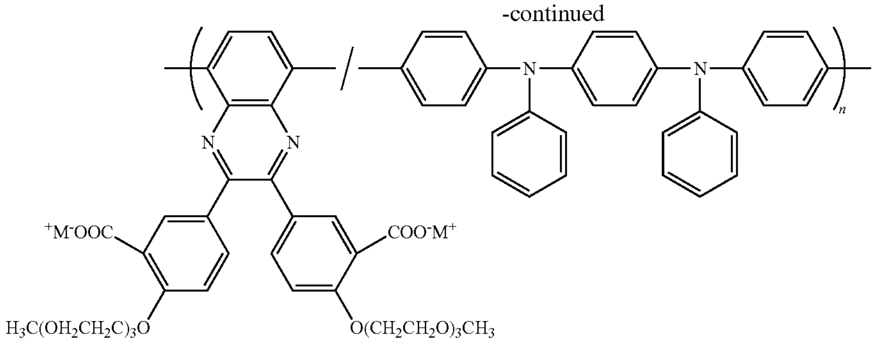
(p/100-p mol %)
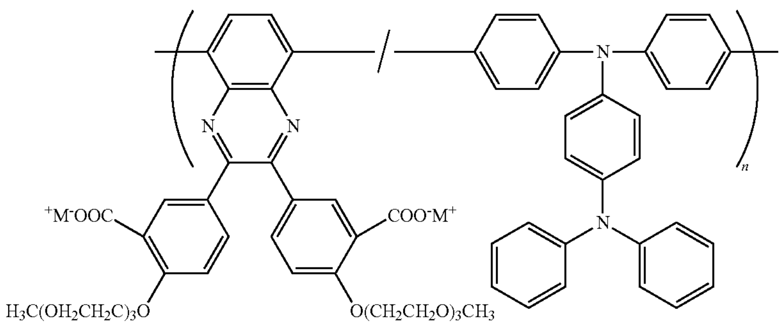
(p/100-p mol %)
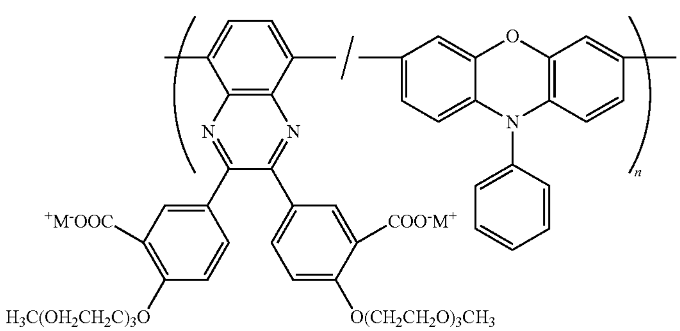
(p/100-p mol %)
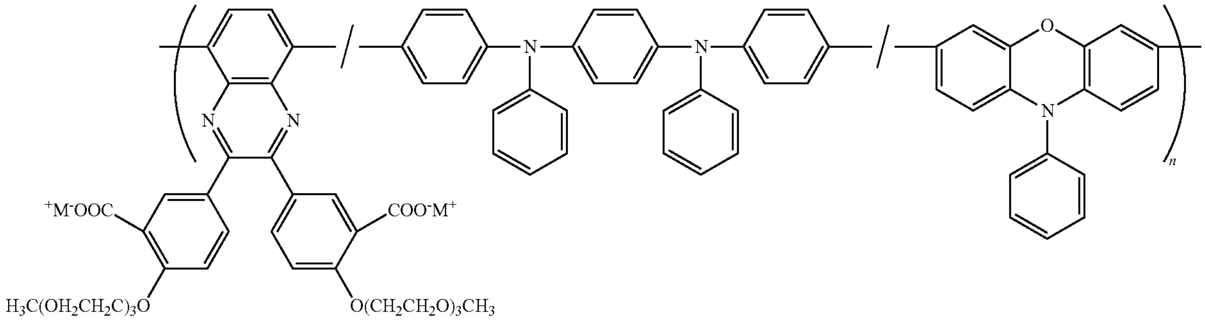
(p/q/100-p mol %)

-continued
[Chemical Formula 127]
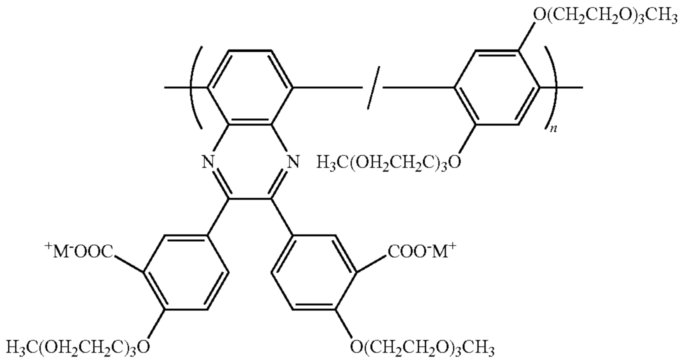
(p/100-p mol %)
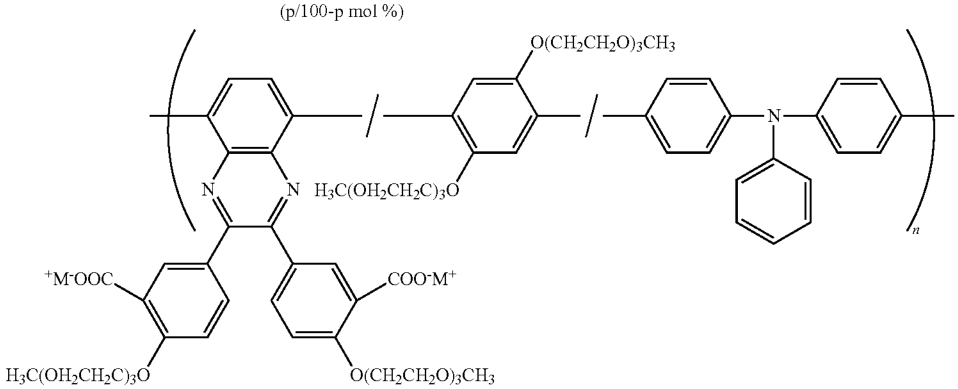
(p/q/100-p-q mol %)
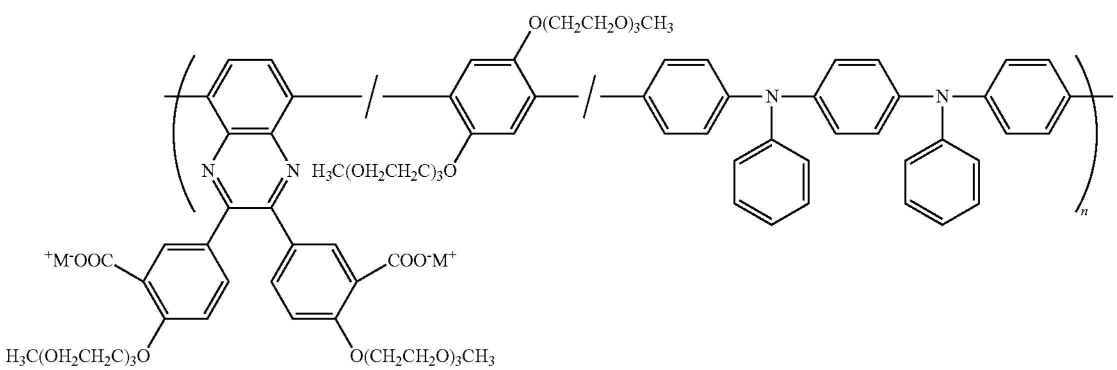
(p/q/100-p-q mol %)
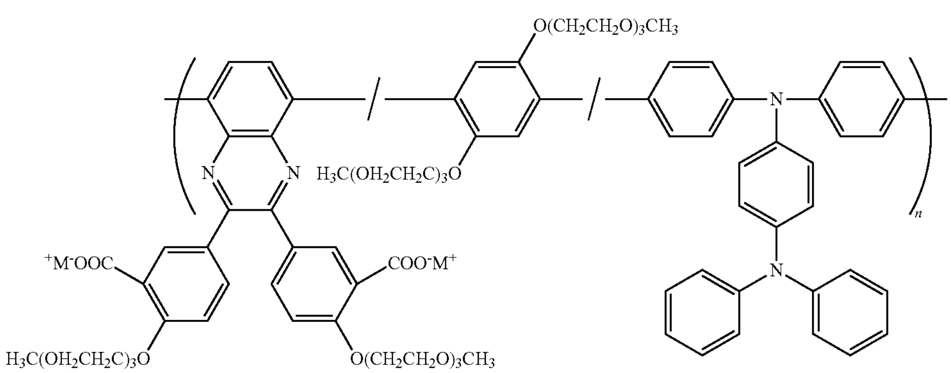
(p/q/100-p-q mol %)

-continued
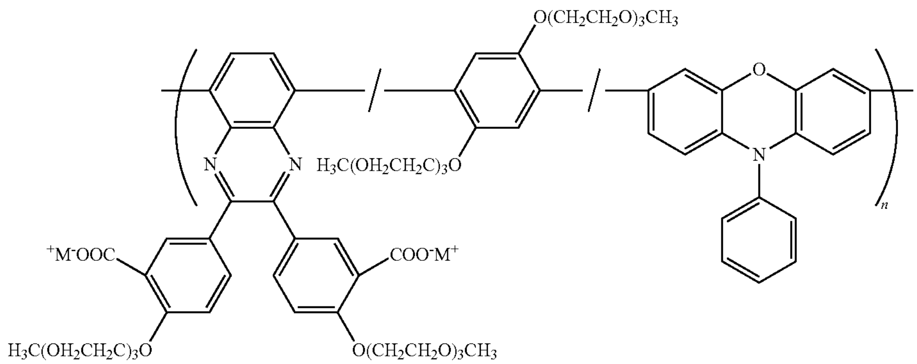
(p/q/100-p-q mol %)
[Chemical Formula 128]
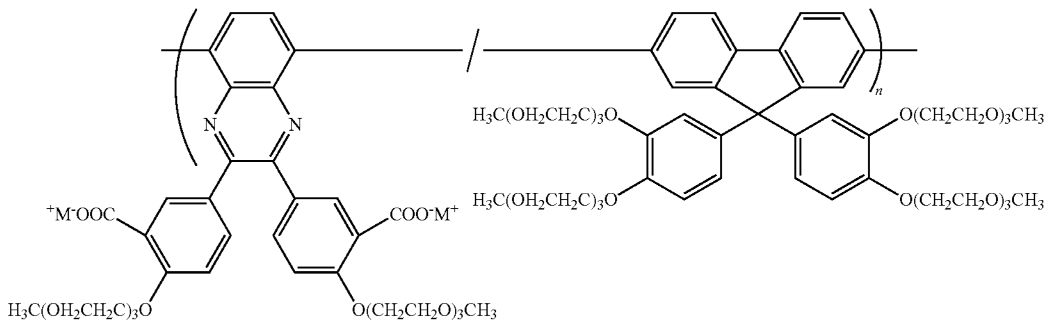
(p/100-p mol %)
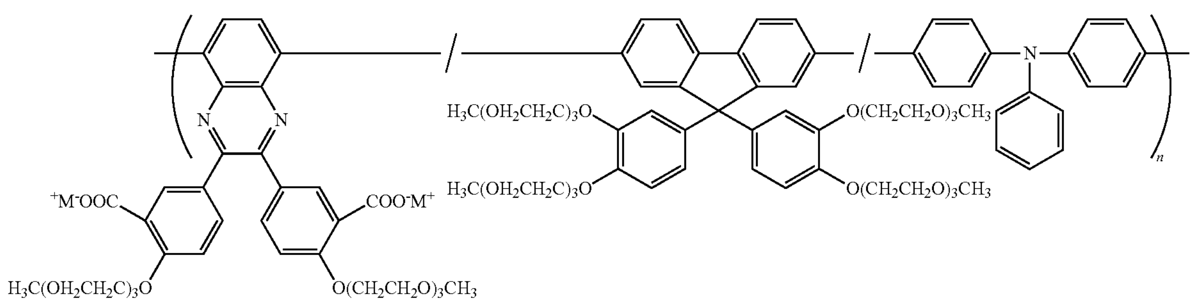
(p/q/100-p-q mol %)
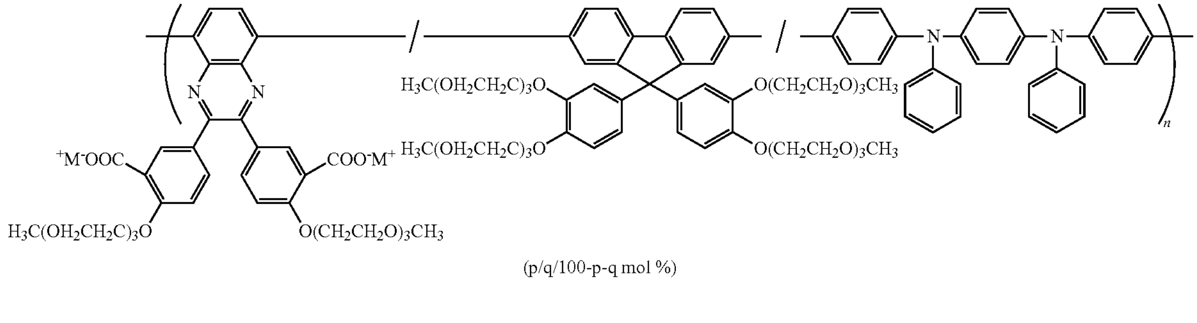
(p/q/100-p-q mol %)

-continued
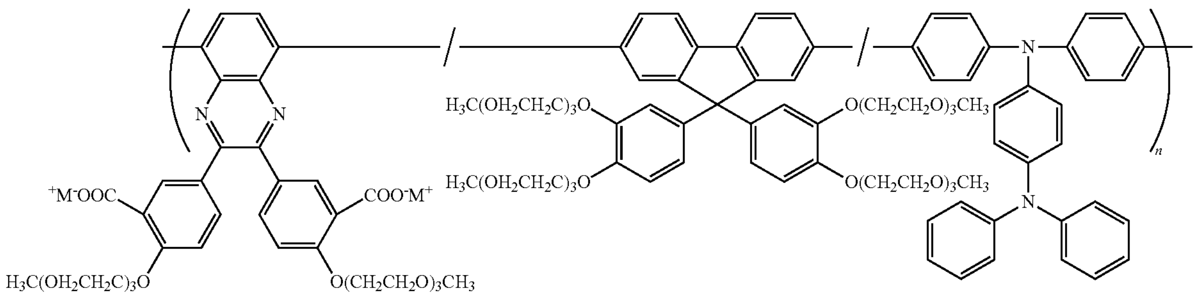
(p/q/100-p-q mol %)
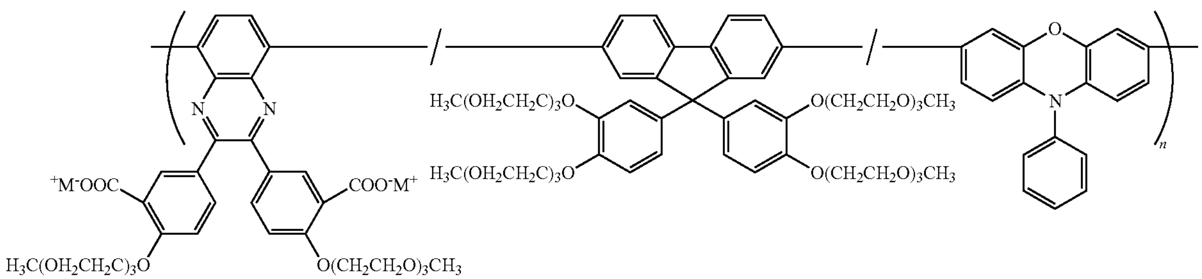
(p/q/100-p-q mol %)
[Chemical Formula 129]
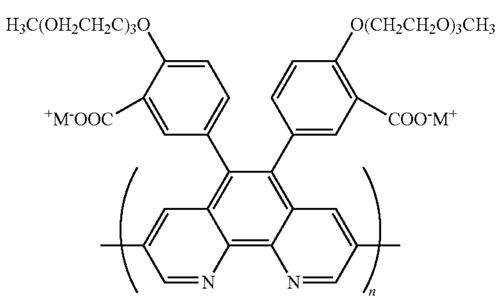
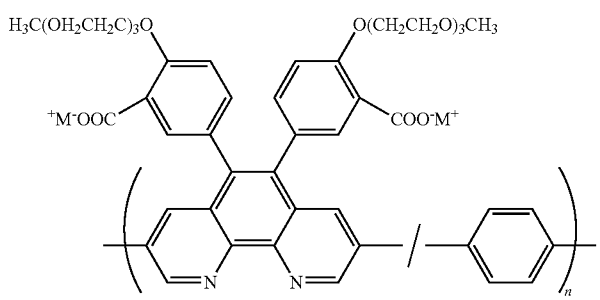
(p/100-p mol %)
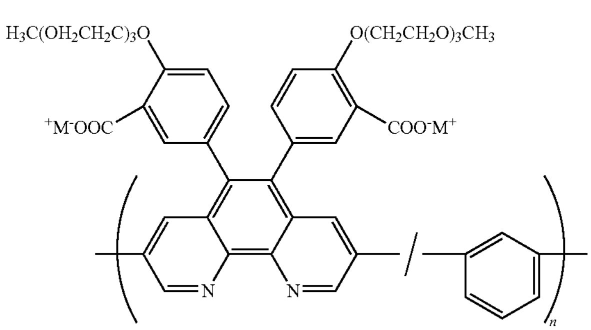
(p/100-p mol %)

-continued
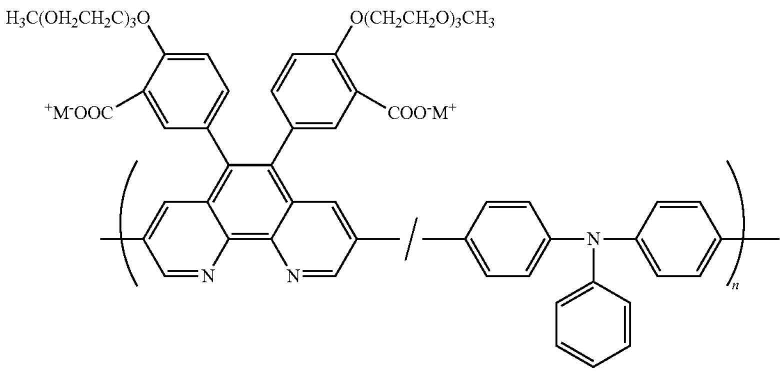
(p/100-p mol %)
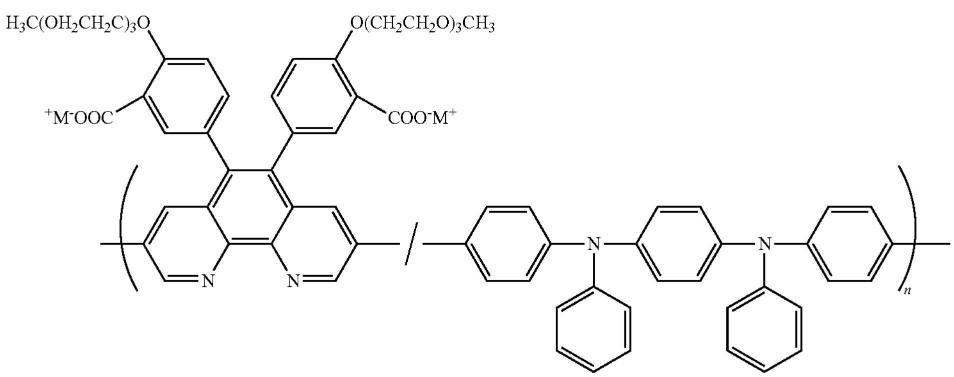
(p/100-p mol %)
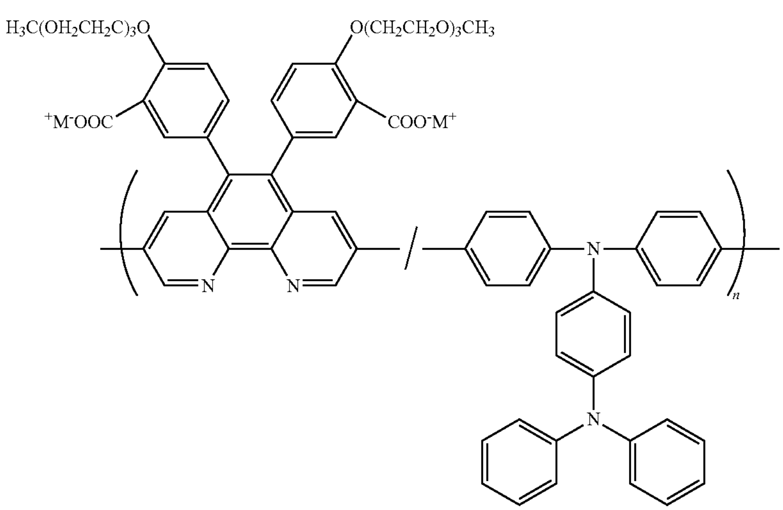
(p/100-p mol %)

-continued
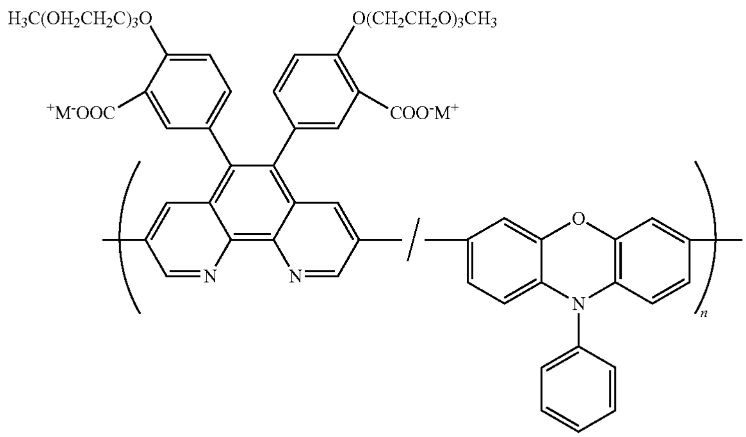
(p/100-p mol %)
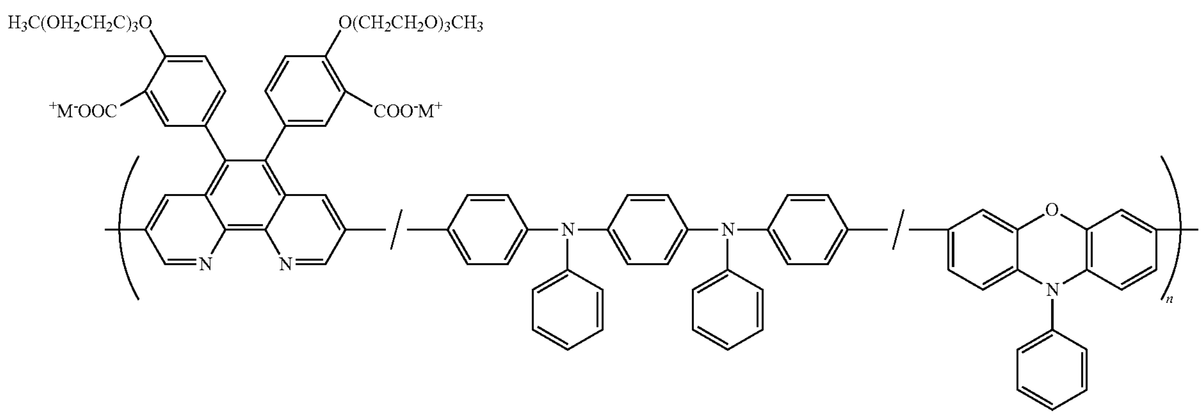
(p/q/100-p mol %)
[Chemical Formula 130]
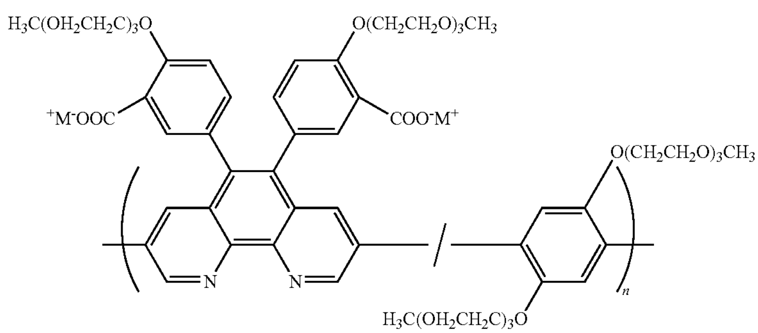
(p/100-p mol %)
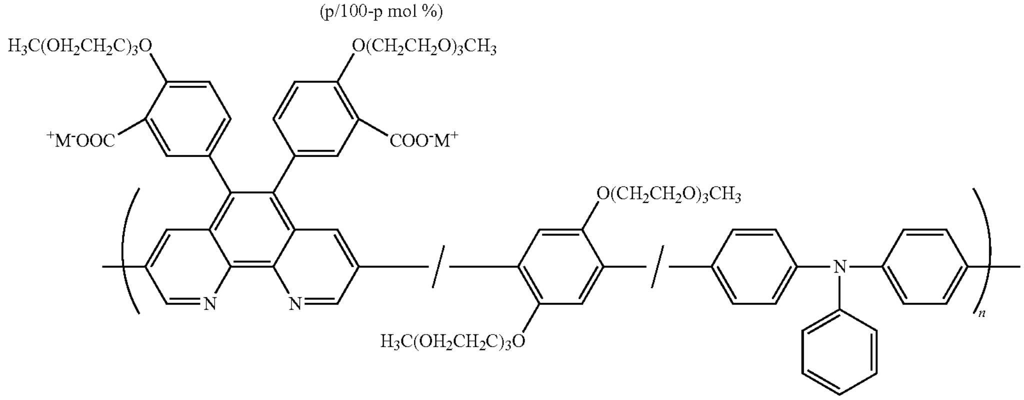
(p/q/100-p-q mol %)

-continued
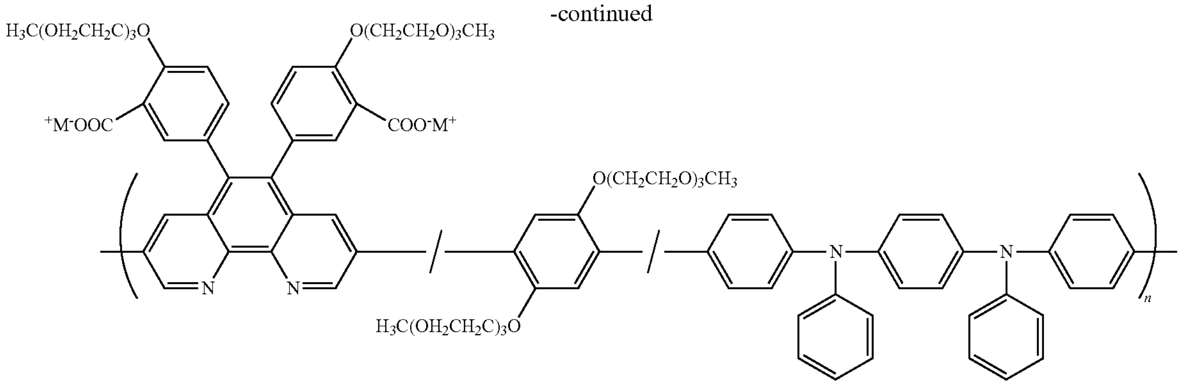
(p/q/100-p-q mol %)
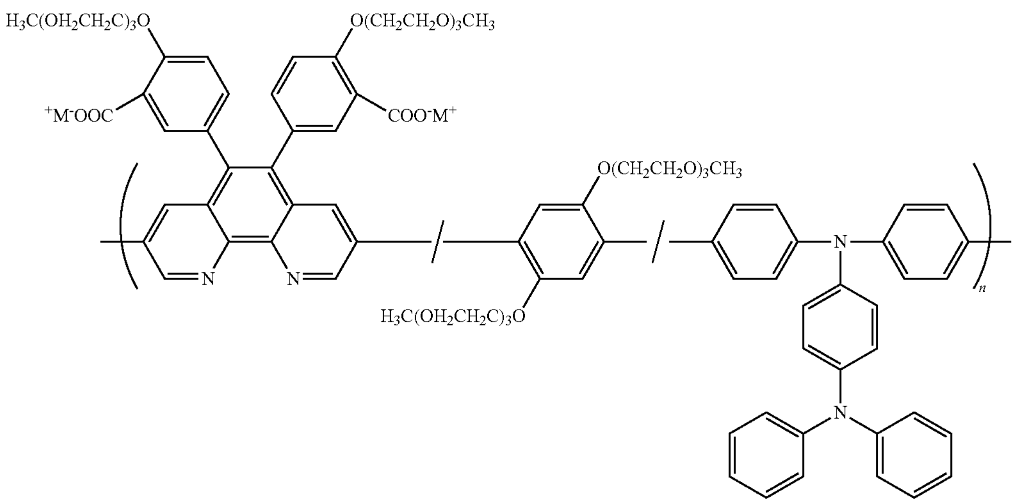
(p/q/100-p-q mol %)
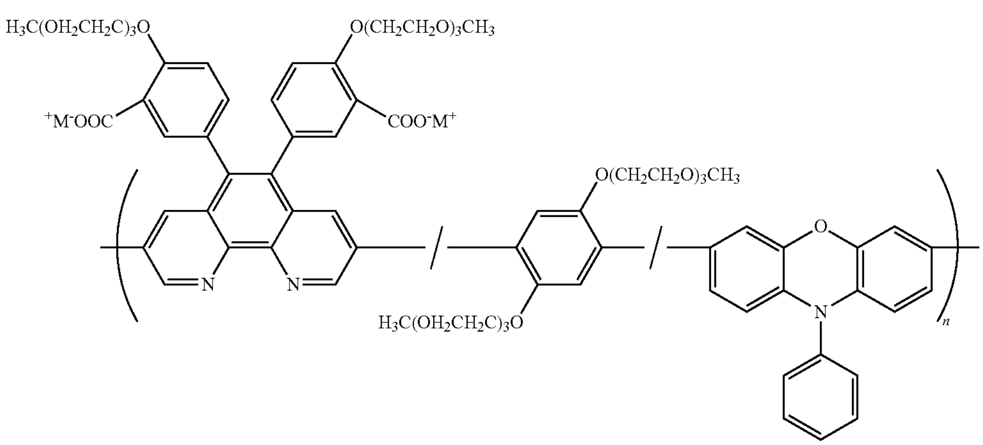
(p/q/100-p-q mol %)

-continued
[Chemical Formula 131]
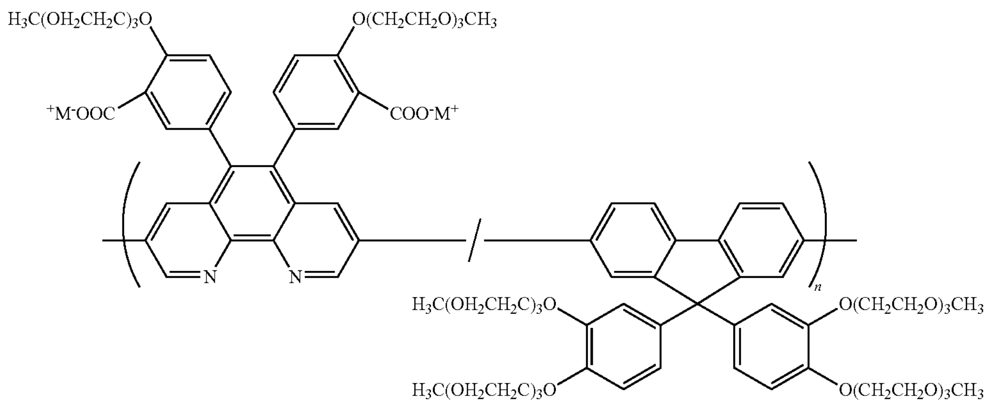
(p/100-p mol %)
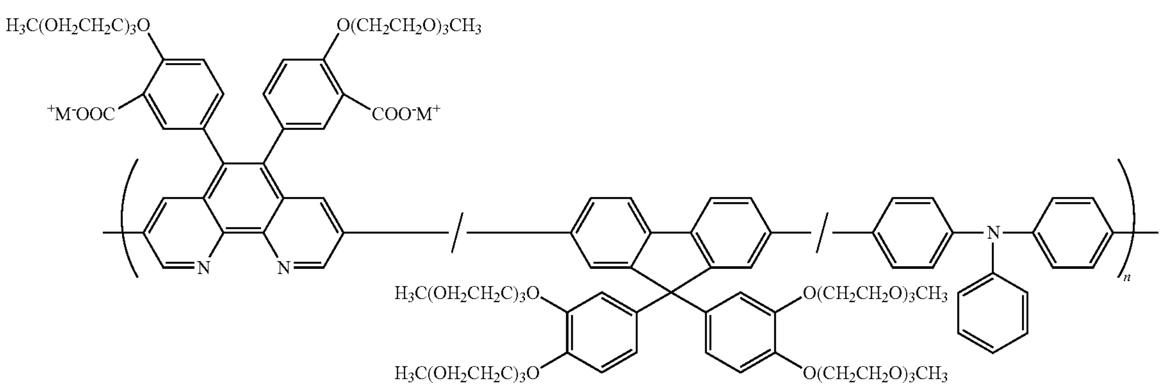
(p/q/100-p-q mol %)
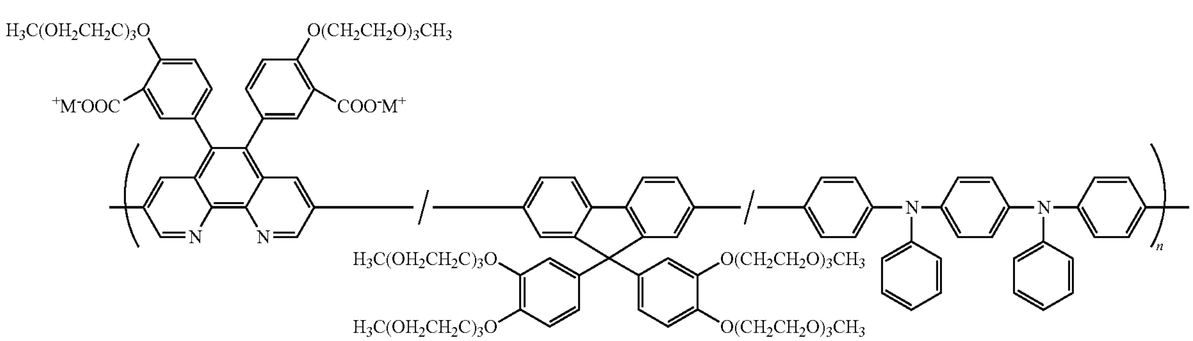
(p/q/100-p-q mol %)

-continued
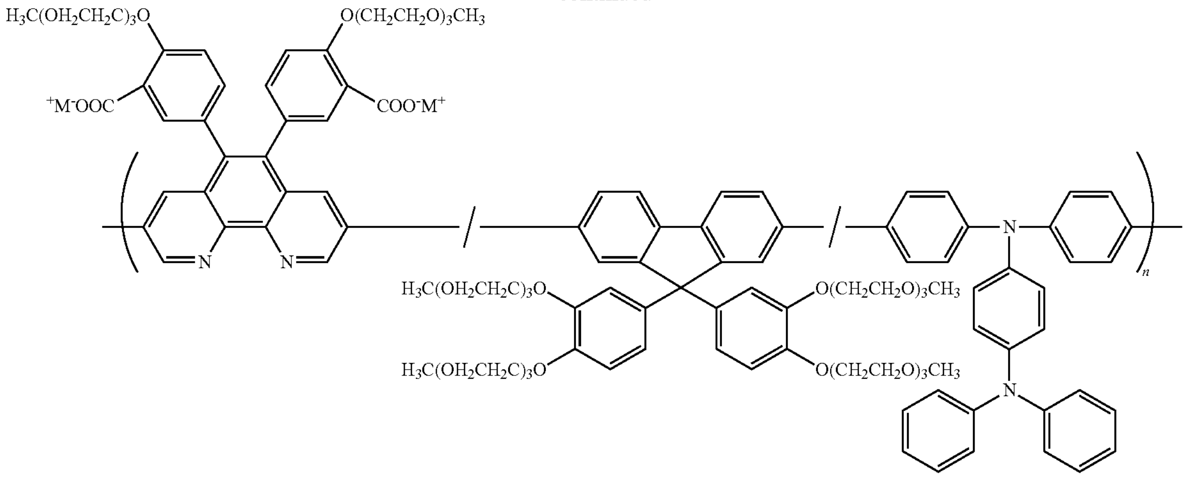
(p/q/100-p-q mol %)
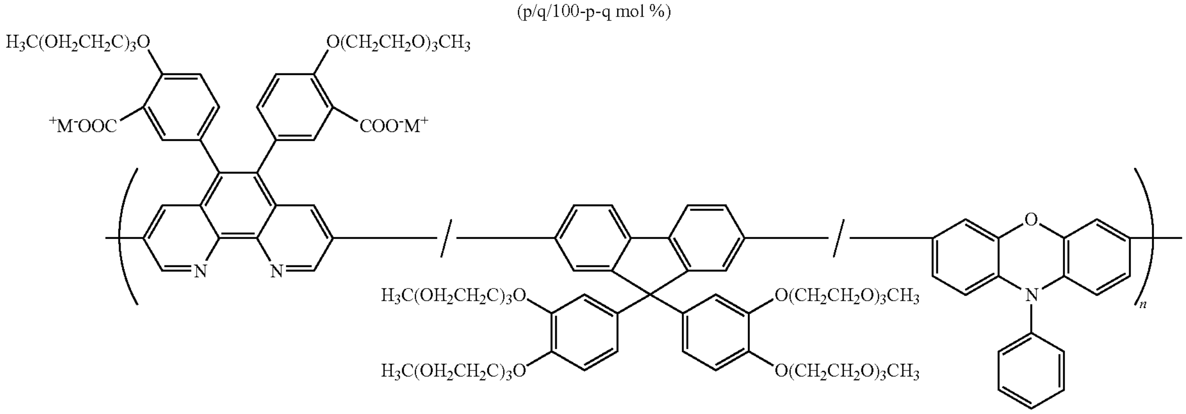
(p/q/100-p-q mol %)
[Chemical Formula 132]
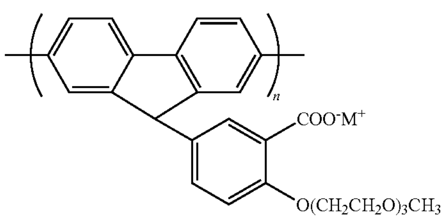
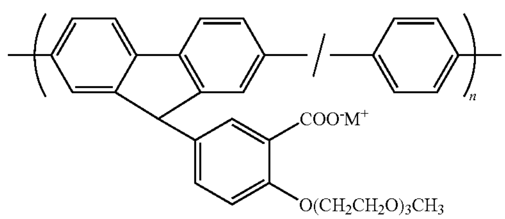
(p/100-p mol %)
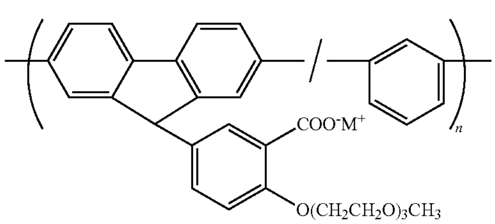
(p/100-p mol %)
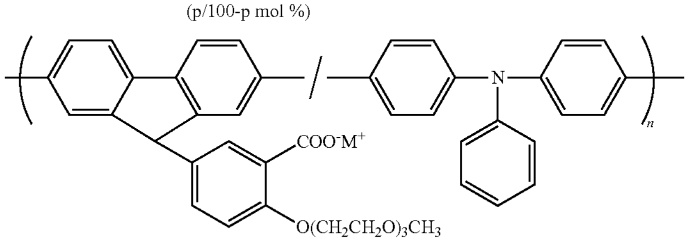
(p/100-p mol %)

-continued
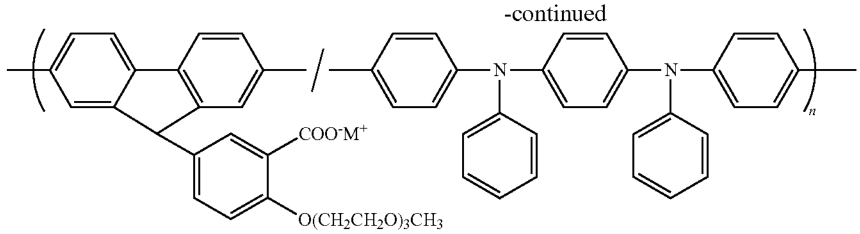
(p/100-p mol %)
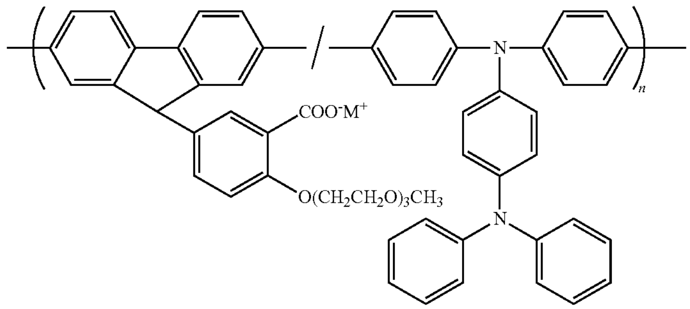
(p/100-p mol %)
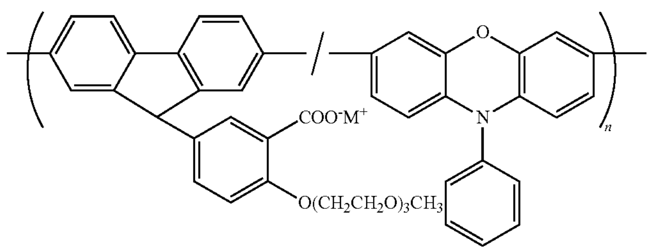
(p/100-p mol %)
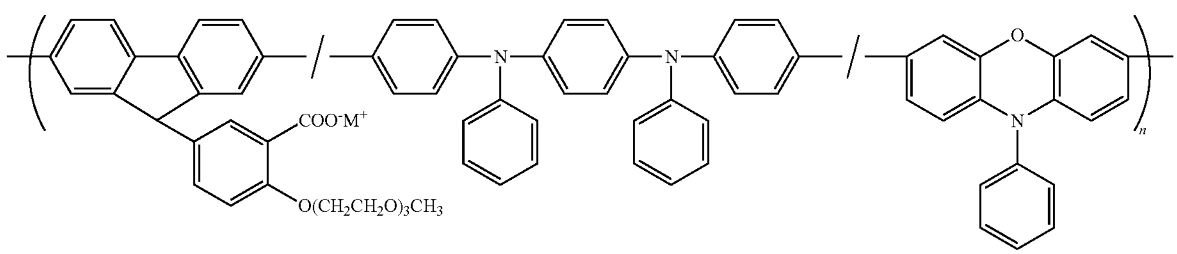
(p/q/100-p-q mol %)
[Chemical Formula 133]
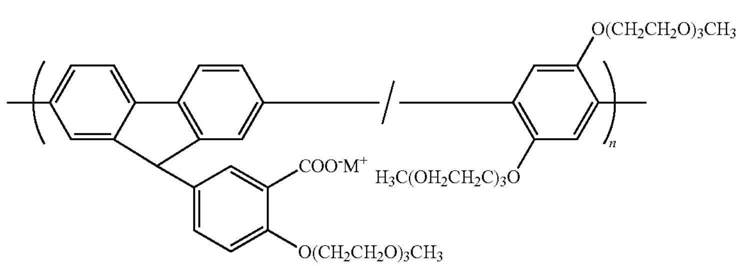
(p/100-p mol %)

-continued
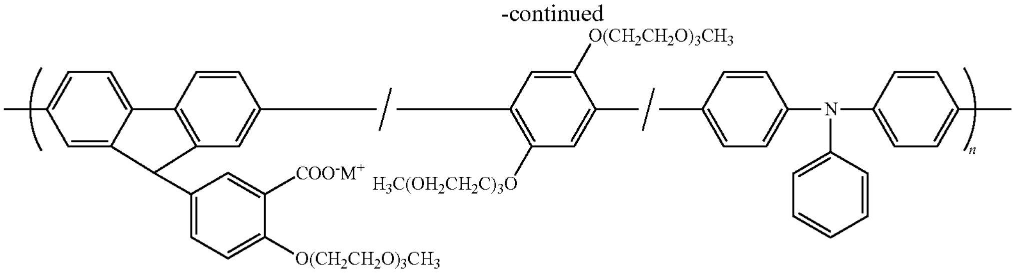
(p/q/100-p-q mol %)
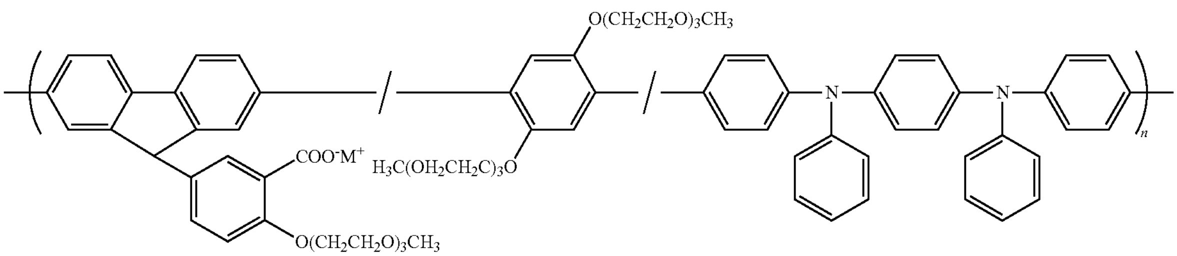
(p/q/100-p-q mol %)
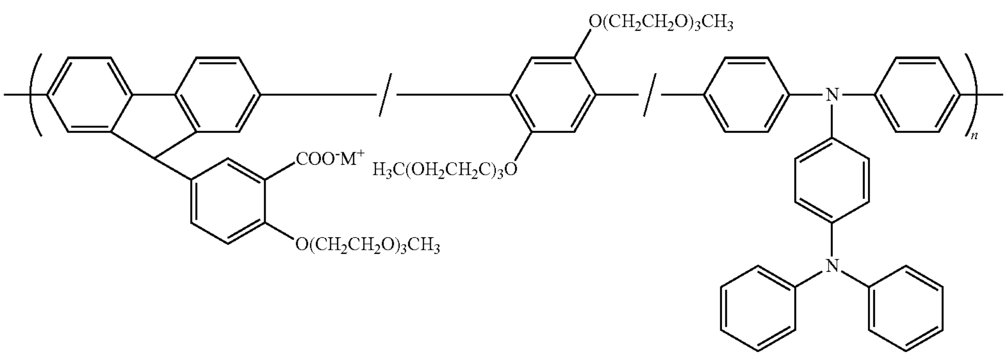
(p/q/100-p-q mol %)
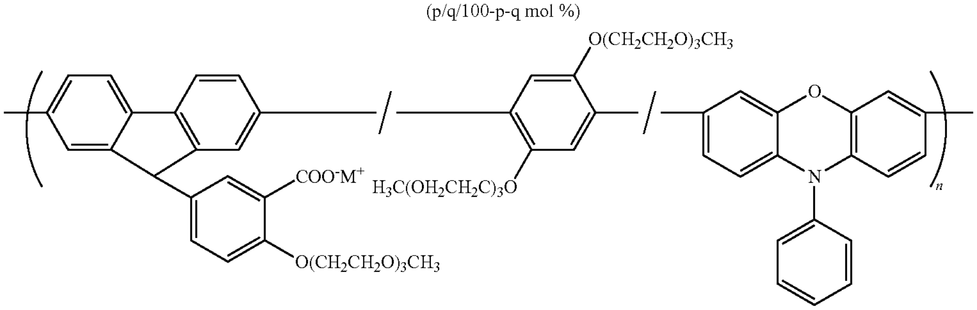
(p/q/100-p-q mol %)
[Chemical Formula 134]
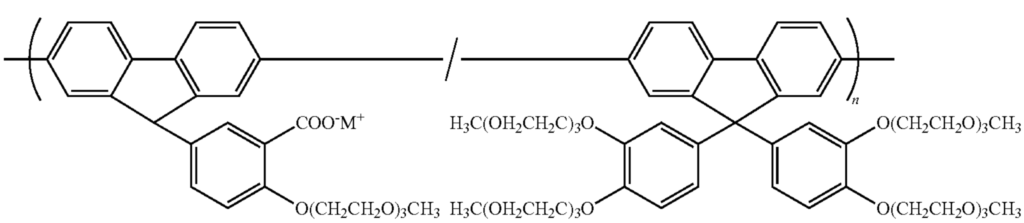
(p/100-p mol %)

-continued
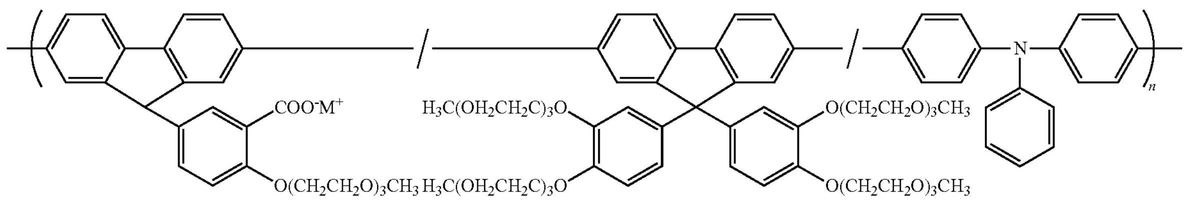
(p/q/100-p-q mol %)
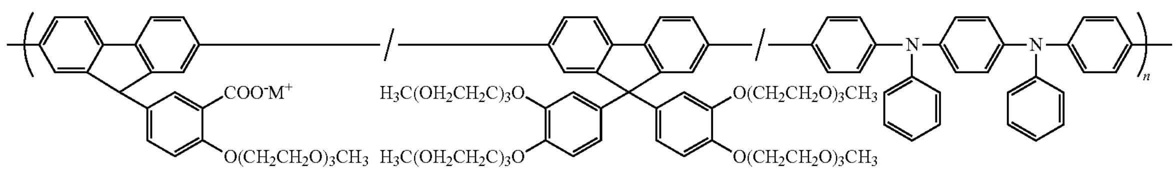
(p/q/100-p-q mol %)
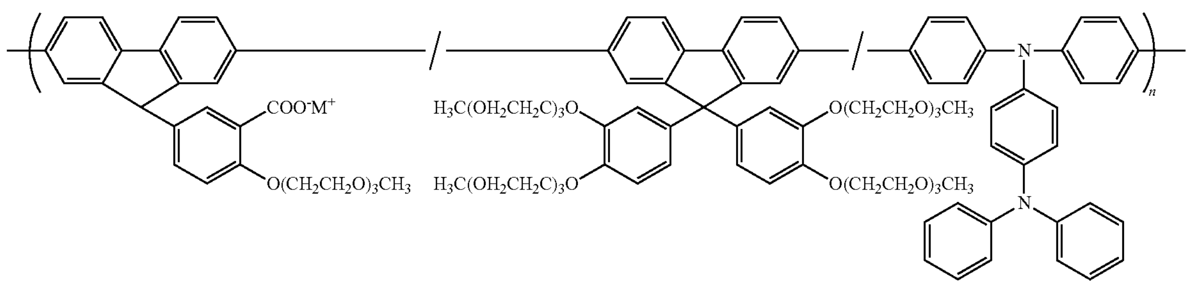
(p/q/100-p-q mol %)
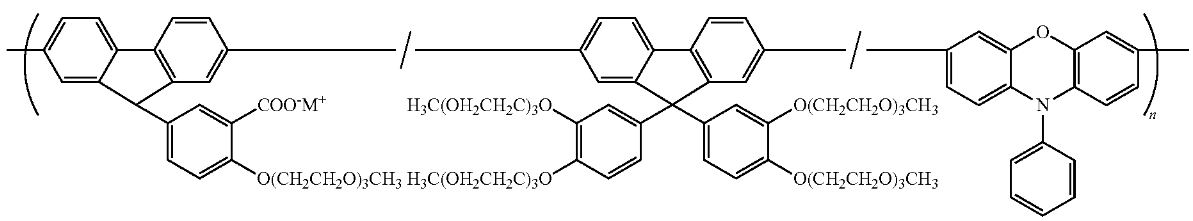
(p/q/100-p-q mol %)
[Chemical Formula 135]
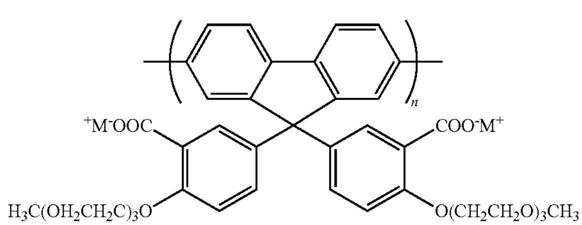
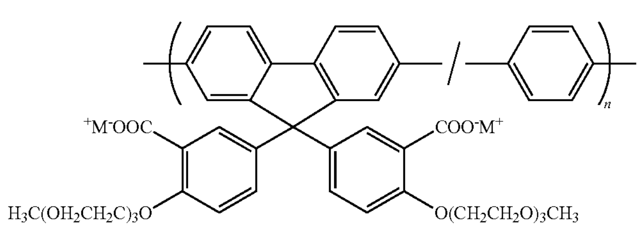
(p/100-p mol %)

-continued
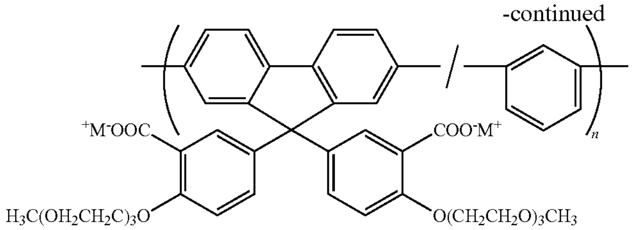
(p/100-p mol %)
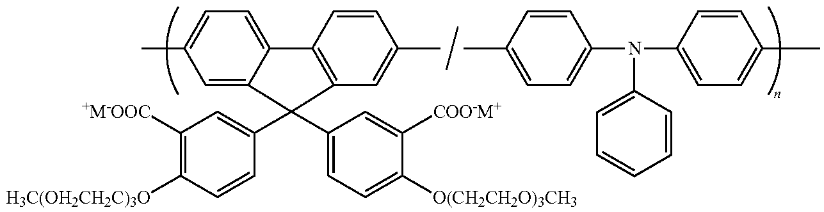
(p/100-p mol %)
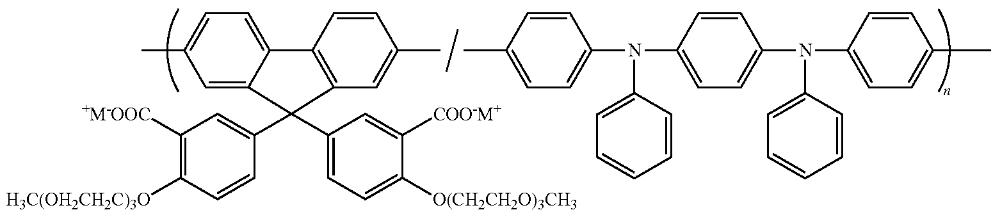
(p/100-p mol %)
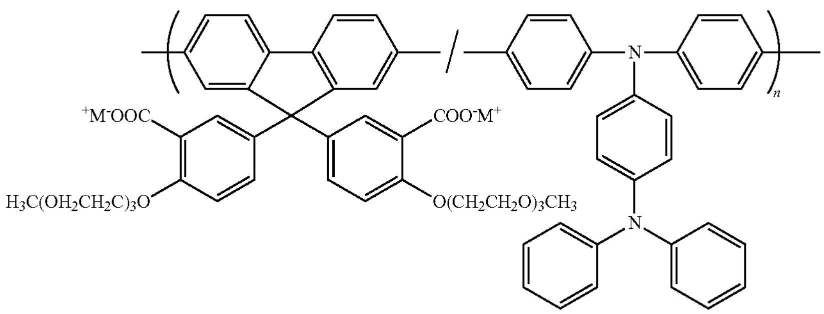
(p/100-p mol %)
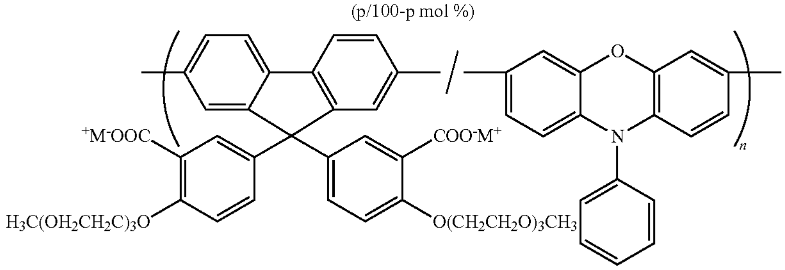
(p/100-p mol %)
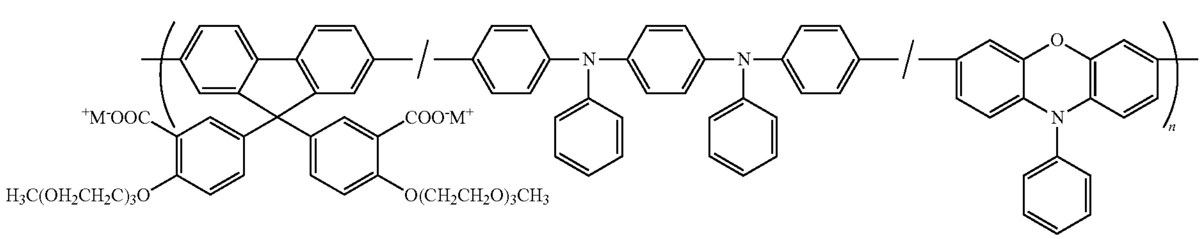
(p/q/100-p-q mol %)

-continued
[Chemical Formula 136]
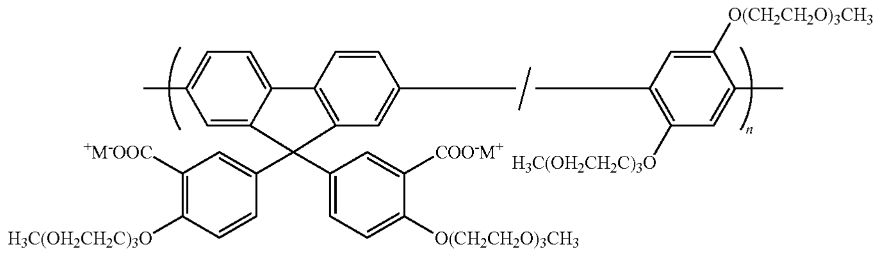
(p/100-p mol %)
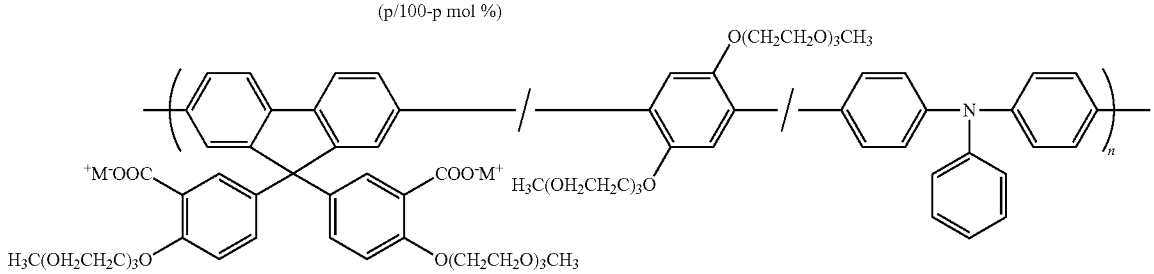
(p/q/100-p-q mol %)
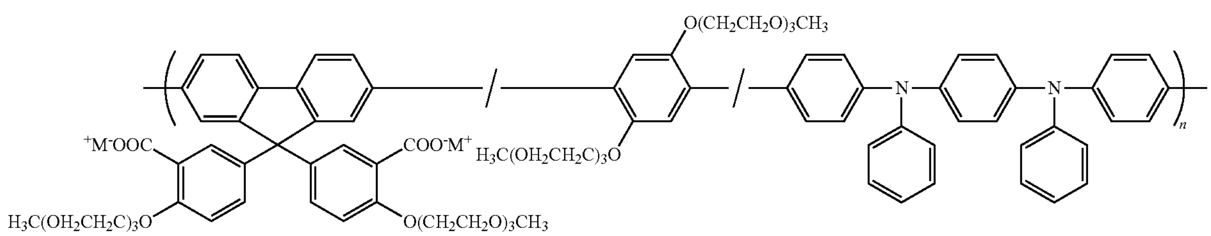
(p/q/100-p-q mol %)
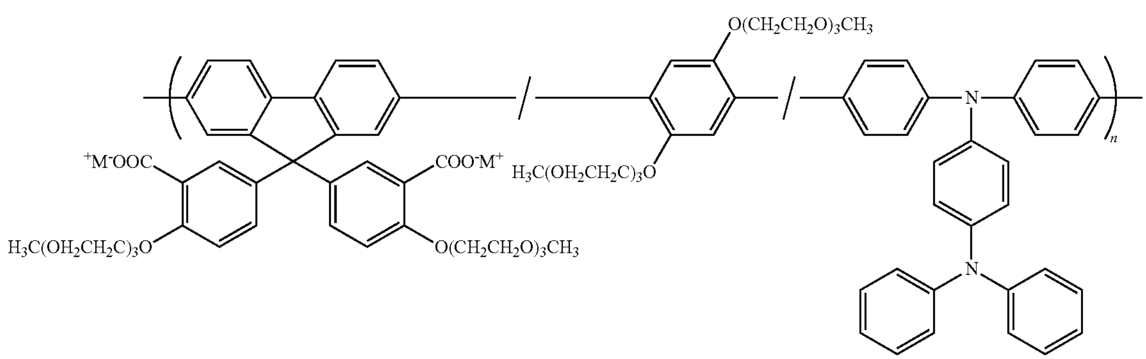
(p/q/100-p-q mol %)
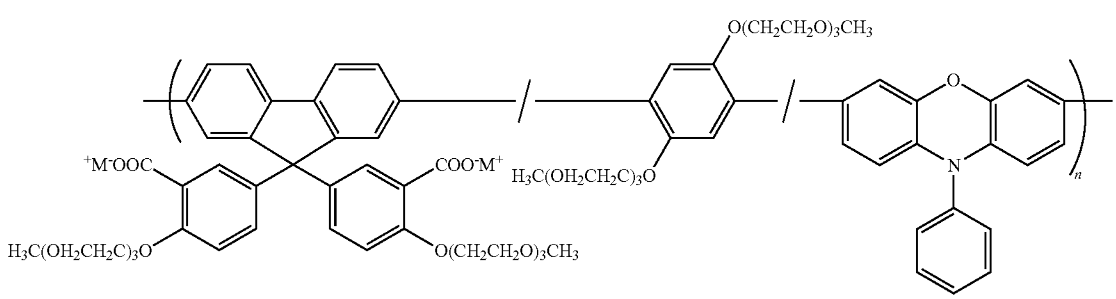
(p/q/100-p-q mol %)

-continued
[Chemical Formula 137]
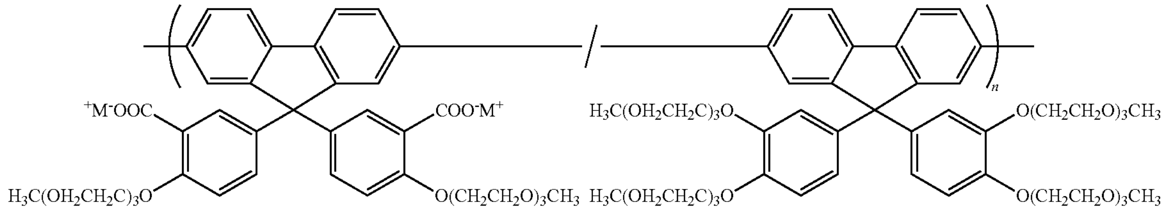
(p/100-p mol %)
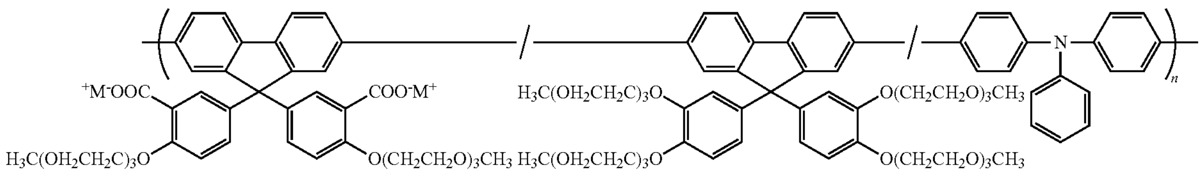
(p/q/100-p-q mol %)
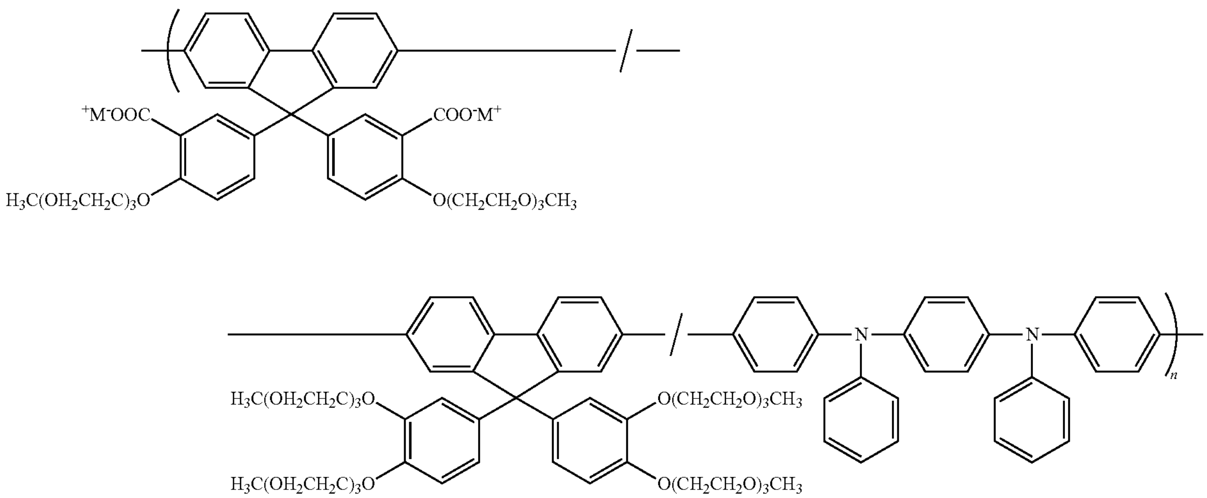
(p/q/100-p-q mol %)
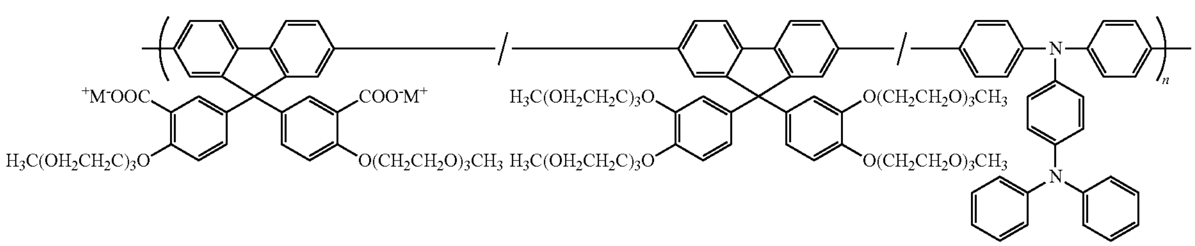
(p/q/100-p-q mol %)
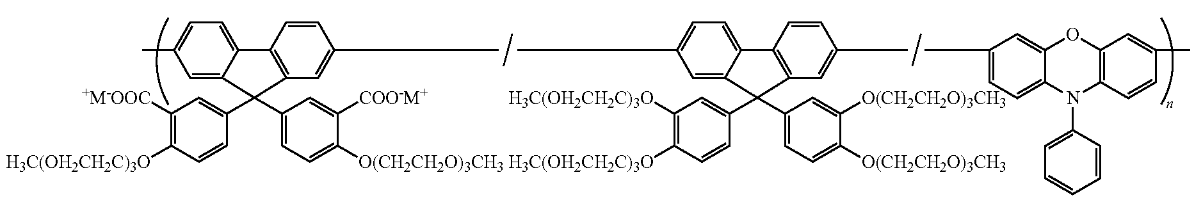
(p/q/100-p-q mol %)

-continued
[Chemical Formula 138]
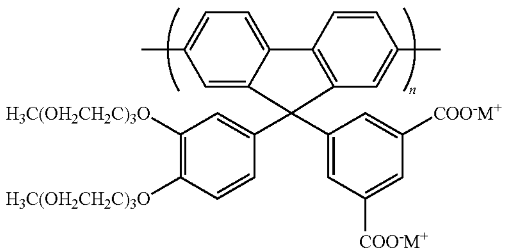
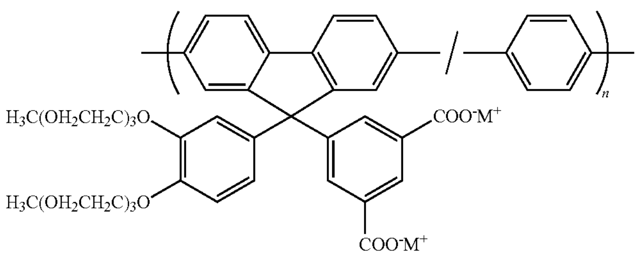
(p/100-p mol %)
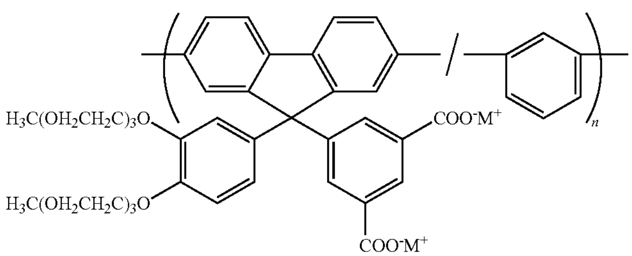
(p/100-p mol %)
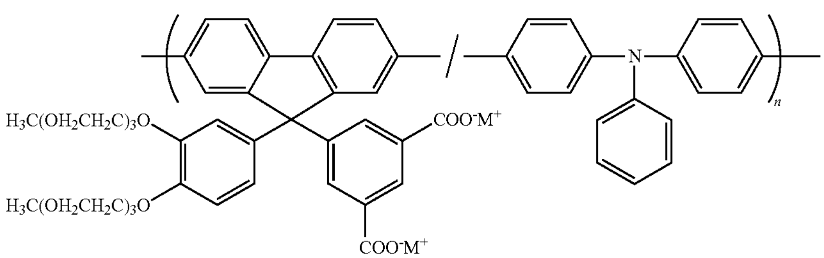
(p/100-p mol %)
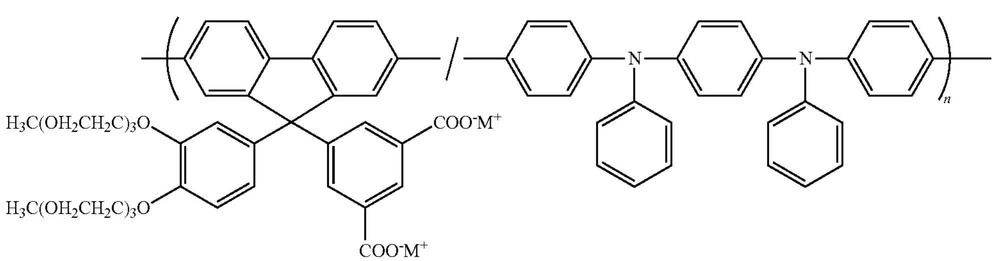
(p/100-p mol %)

-continued
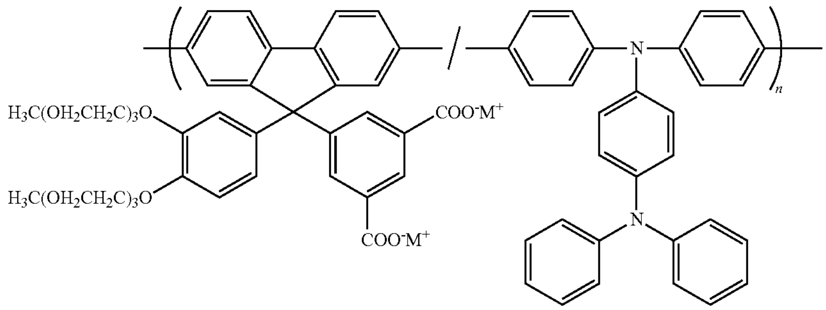
(p/100-p mol %)
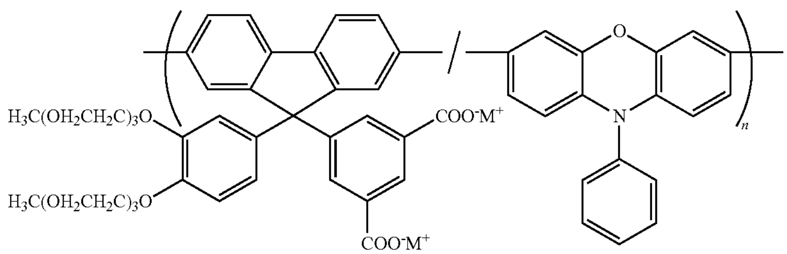
(p/100-p mol %)
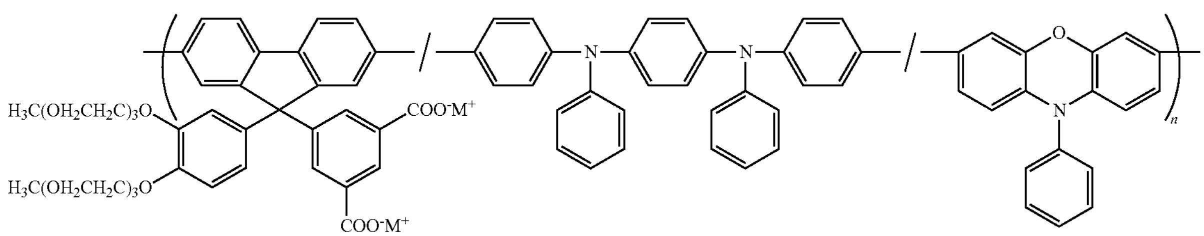
(p/q/100-p-q mol %)
[Chemical Formula 139]
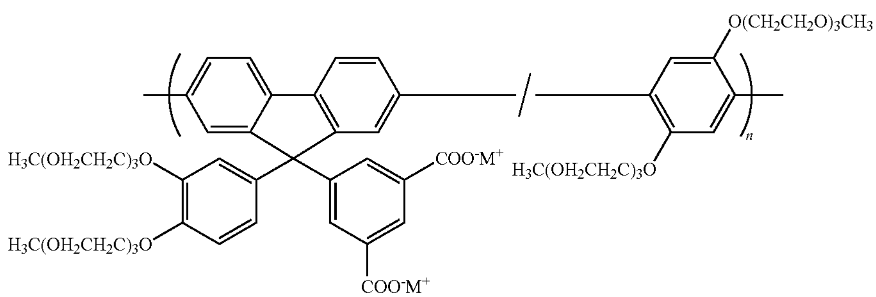
(p/100-p mol %)
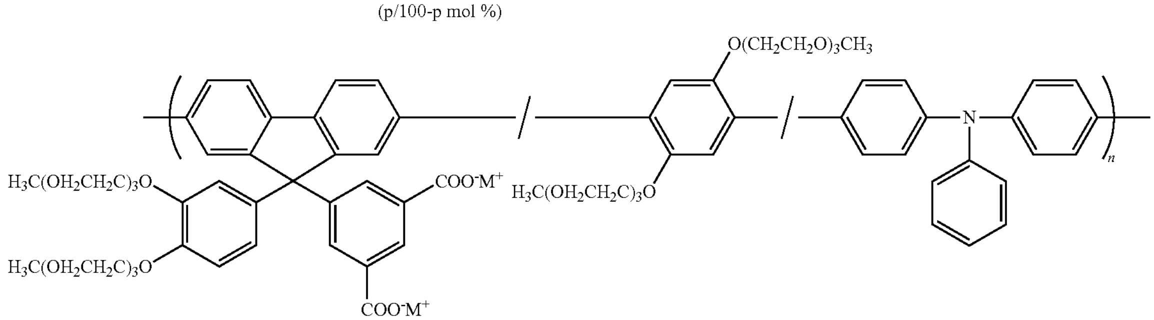
(p/q/100-p-q mol %)

-continued
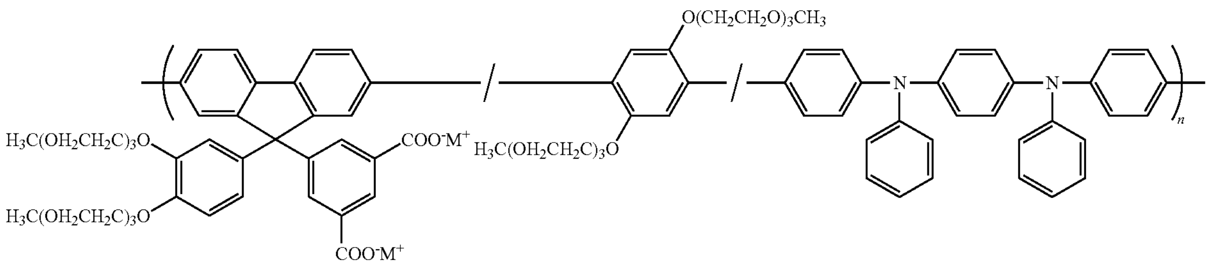
(p/q/100-p-q mol %)
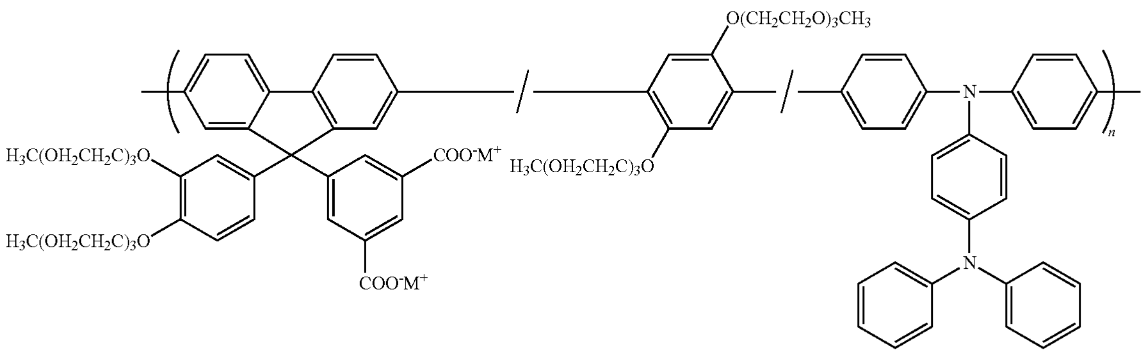
(p/q/100-p-q mol %)
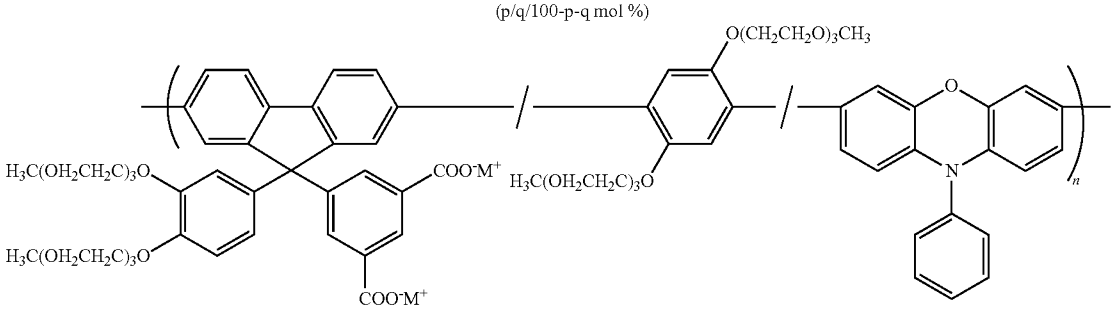
(p/q/100-p-q mol %)
[Chemical Formula 140]
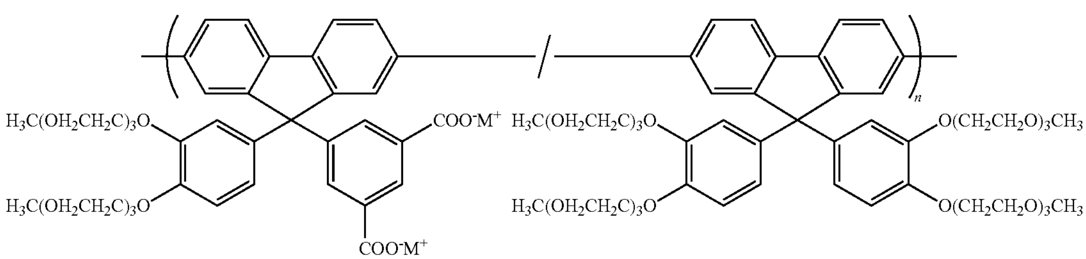
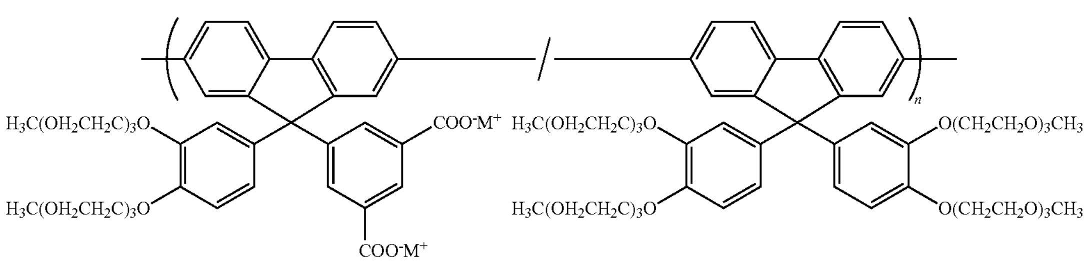
(p/100-p mol %)

-continued
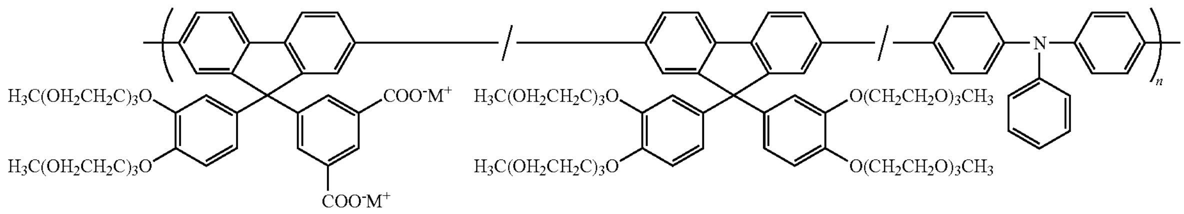
(p/q/100-p-q mol %)
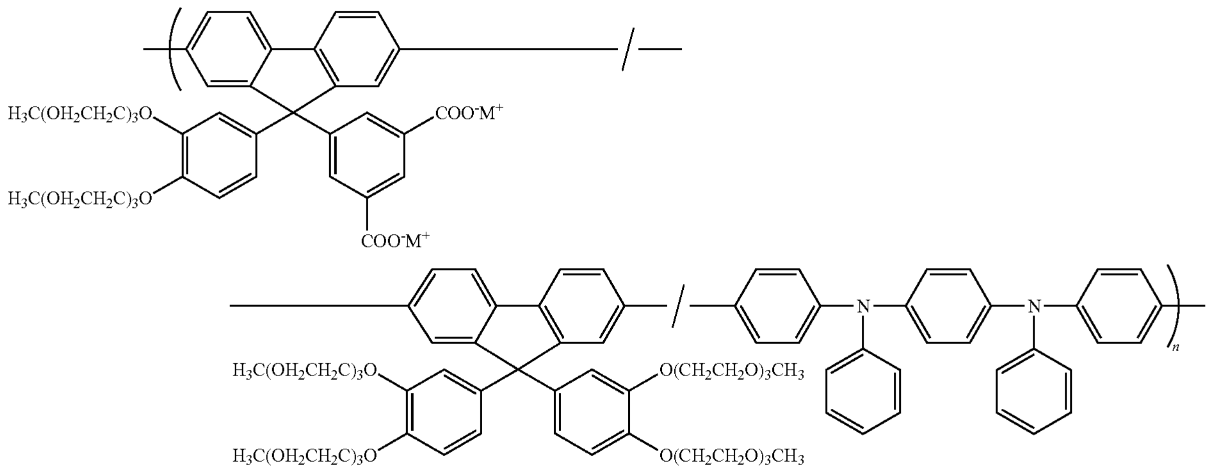
(p/q/100-p-q mol %)
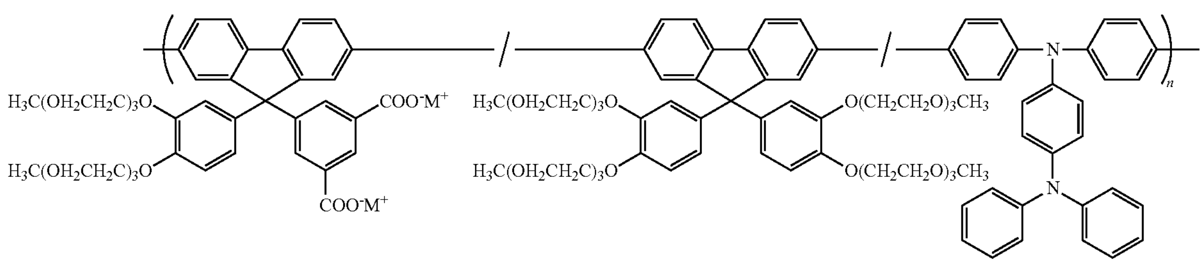
(p/q/100-p-q mol %)
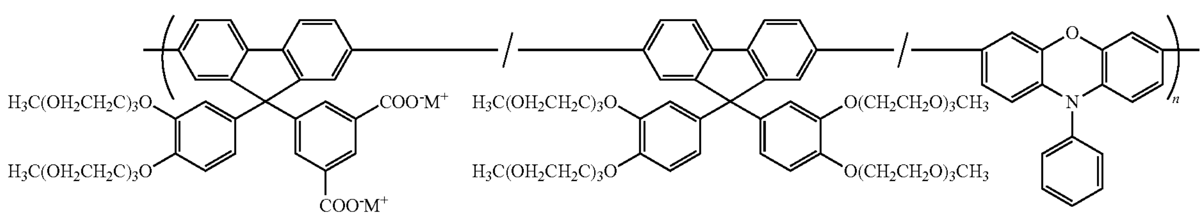
(p/q/100-p-q mol %)
[Chemical Formula 141]
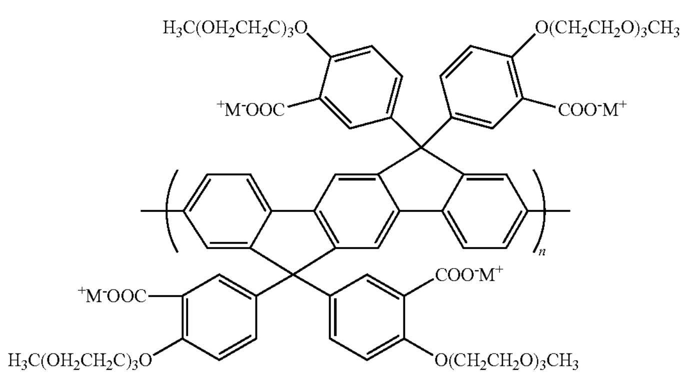

-continued
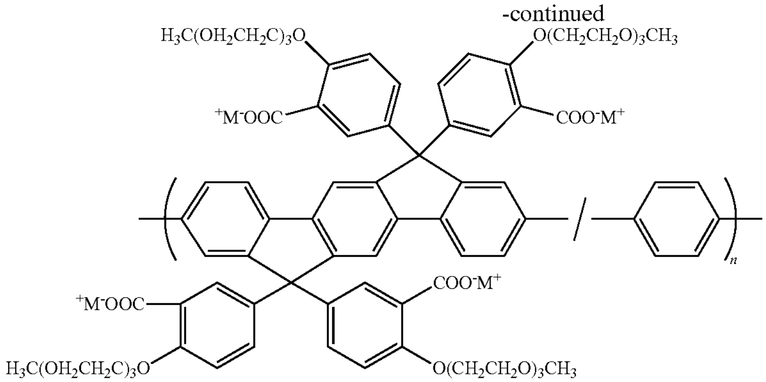
(p/100-p mol %)
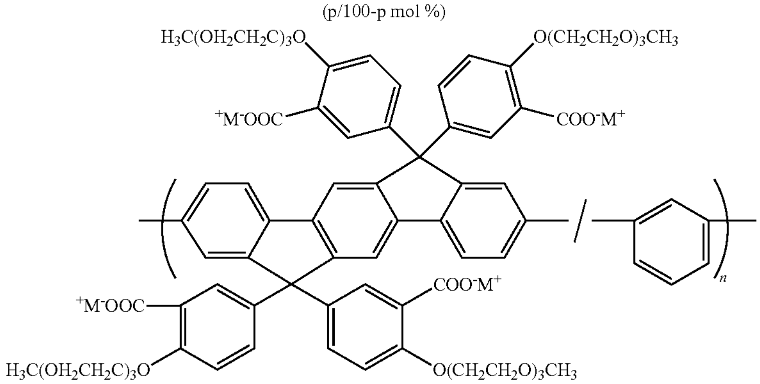
(p/100-p mol %)
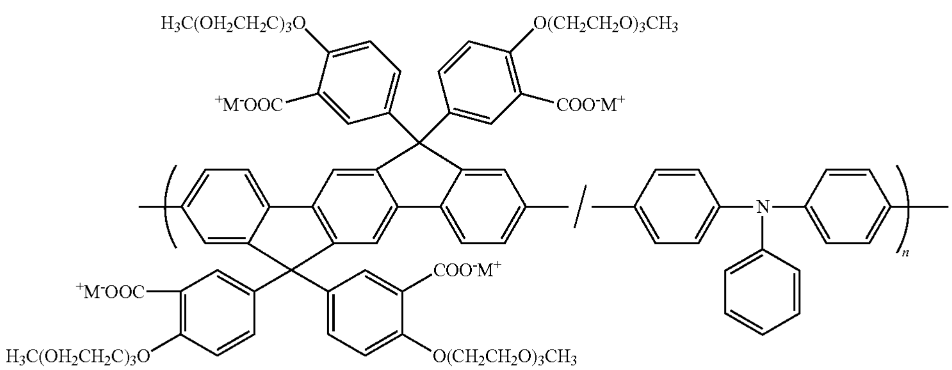
(p/q/100-p-q mol %)
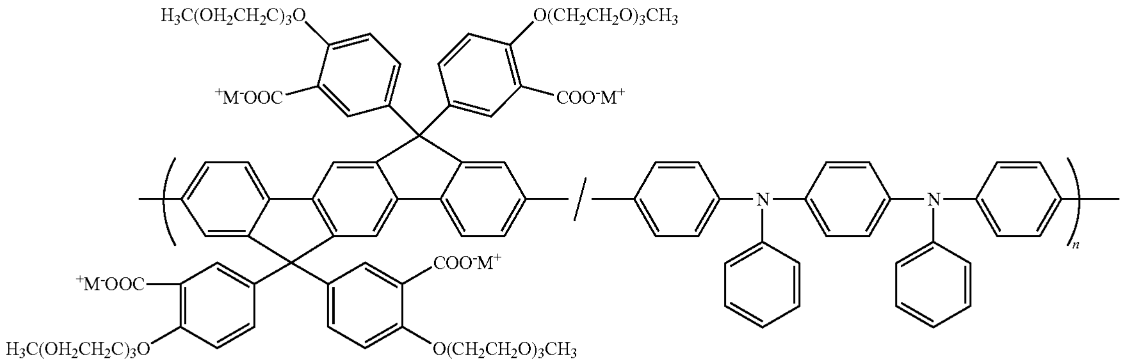
(p/q/100-p-q mol %)

-continued
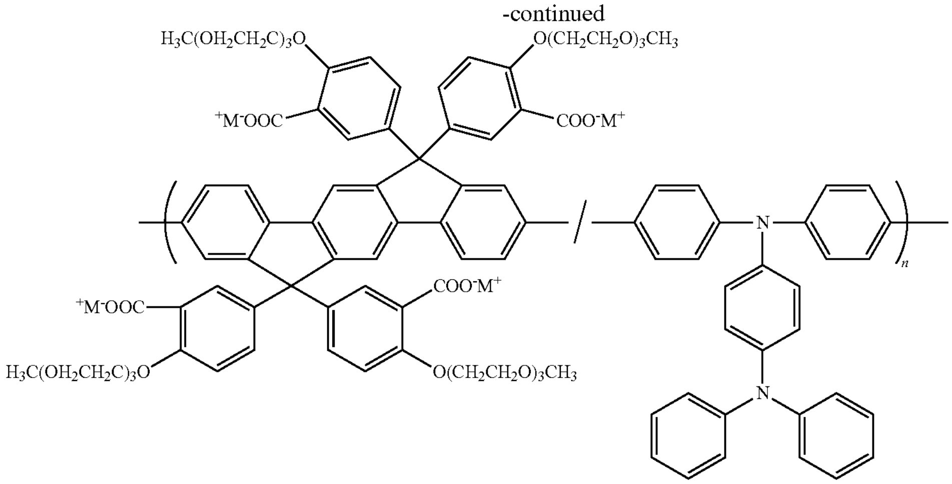
(p/q/100-p-q mol %)
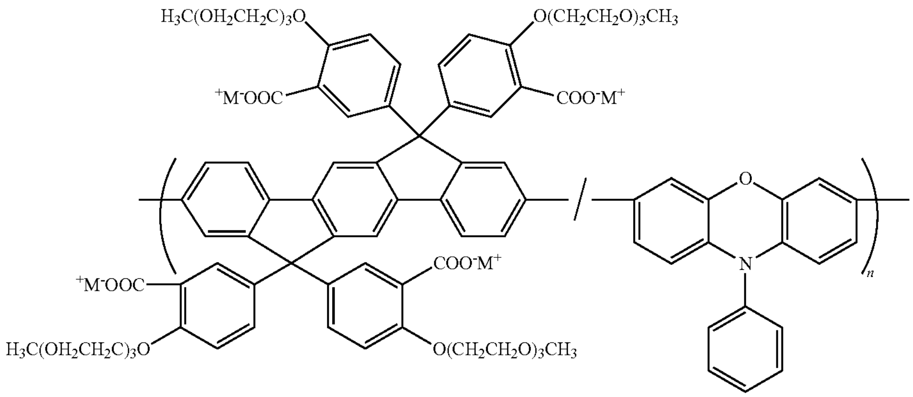
(p/q/100-p-q mol %)
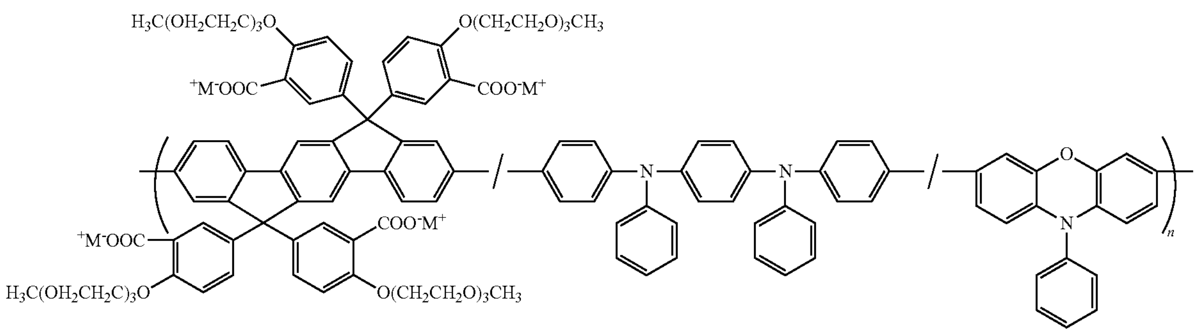
(p/q/100-p-q mol %)
[Chemical Formula 142]
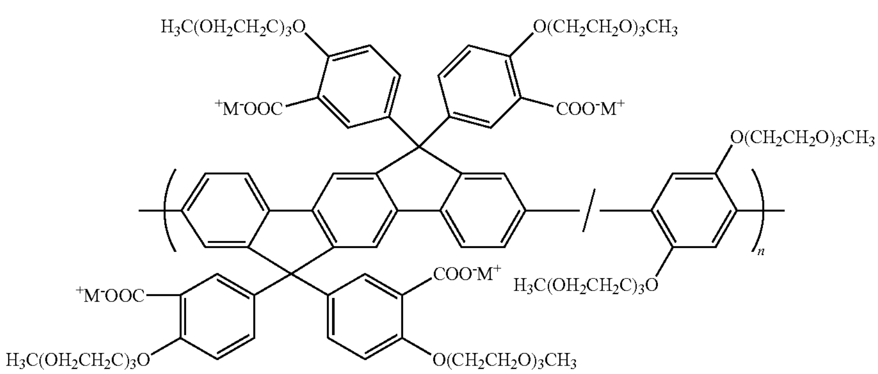
(p/100-p mol %)

-continued
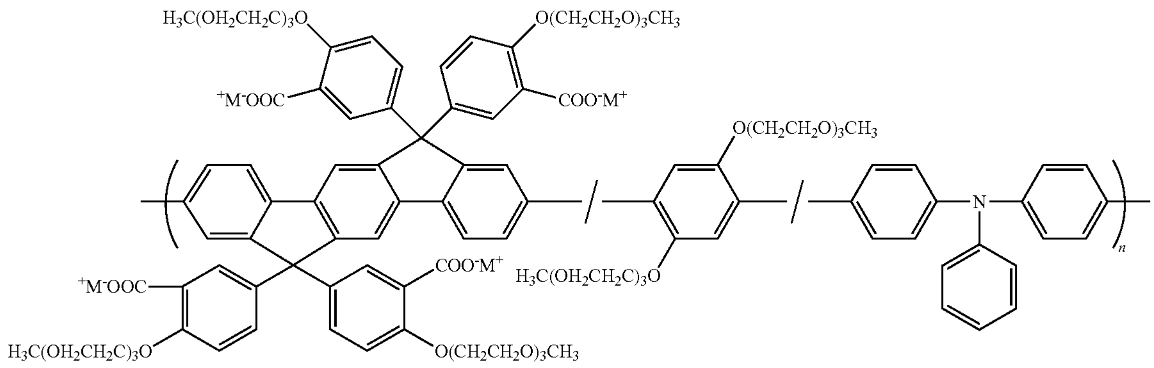
(p/q/100-p-q mol %)
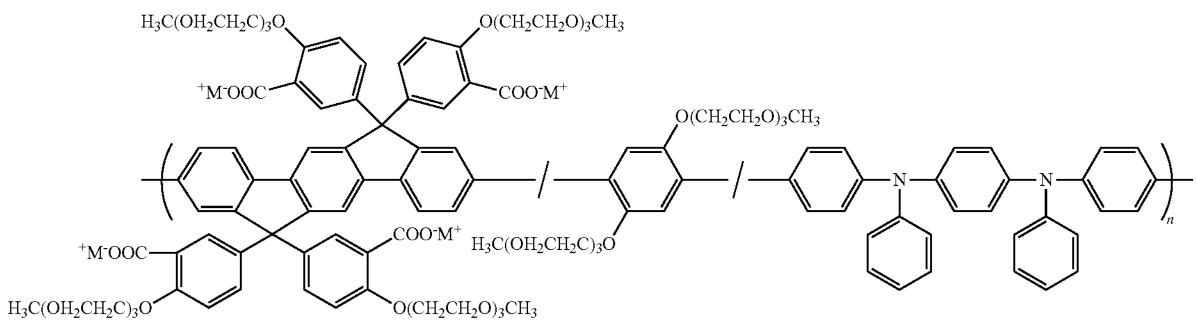
(p/q/100-p-q mol %)
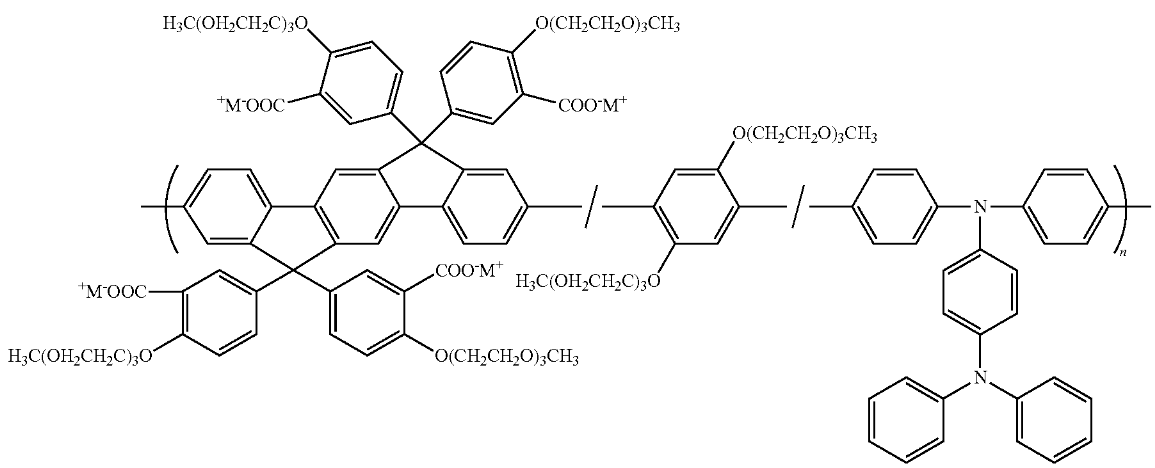
(p/q/100-p-q mol %)
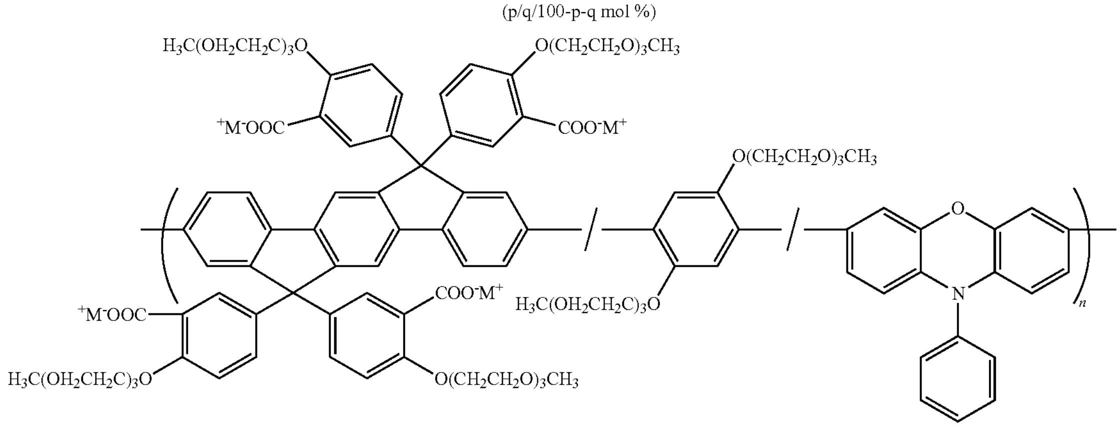
(p/q/100-p-q mol %)

-continued
[Chemical Formula 143]
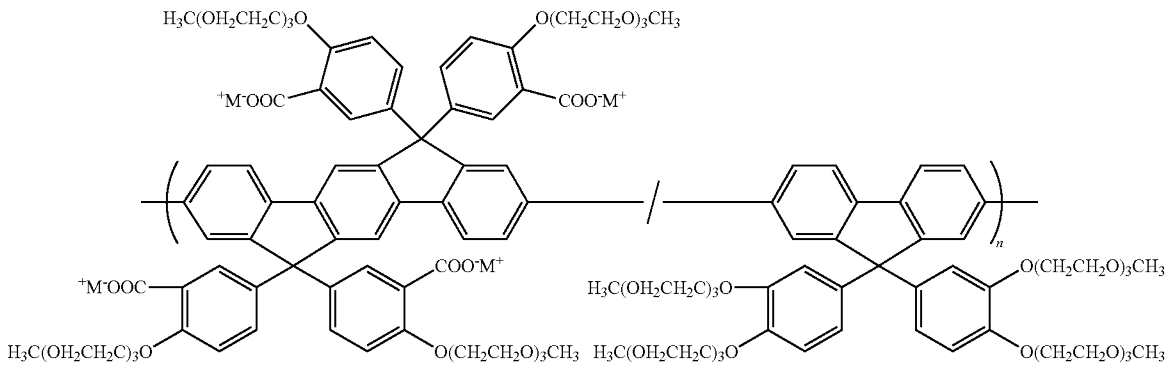
(p/100-p mol %)
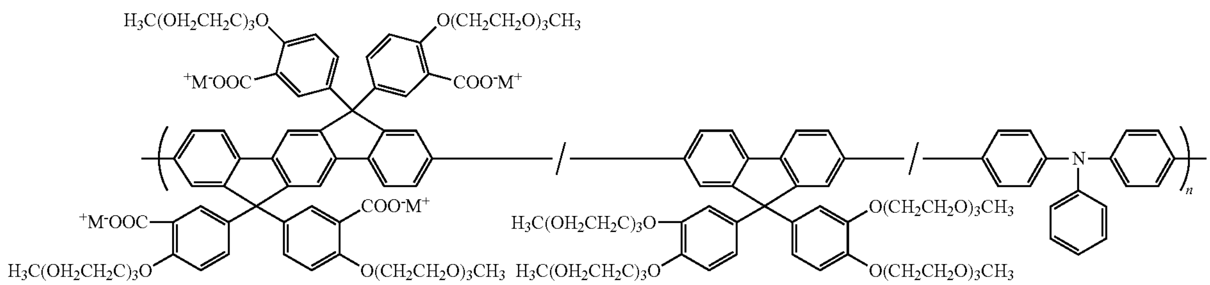
(p/q/100-p-q mol %)
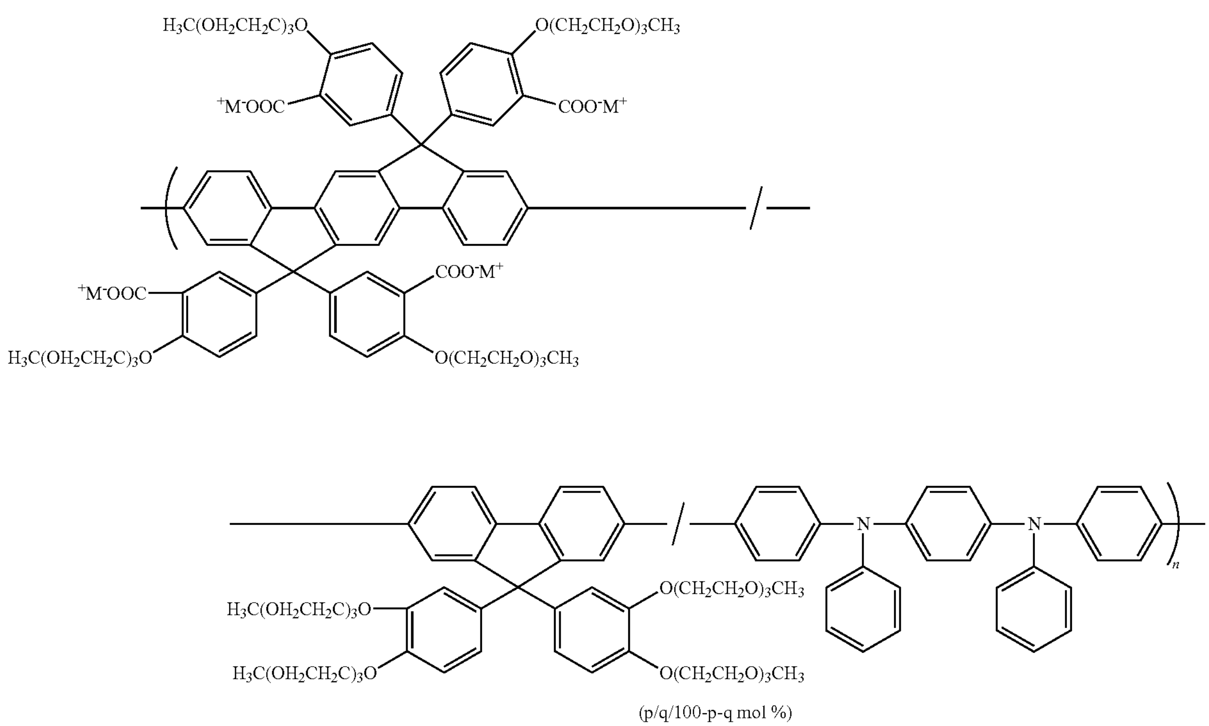
(p/q/100-p-q mol %)

-continued
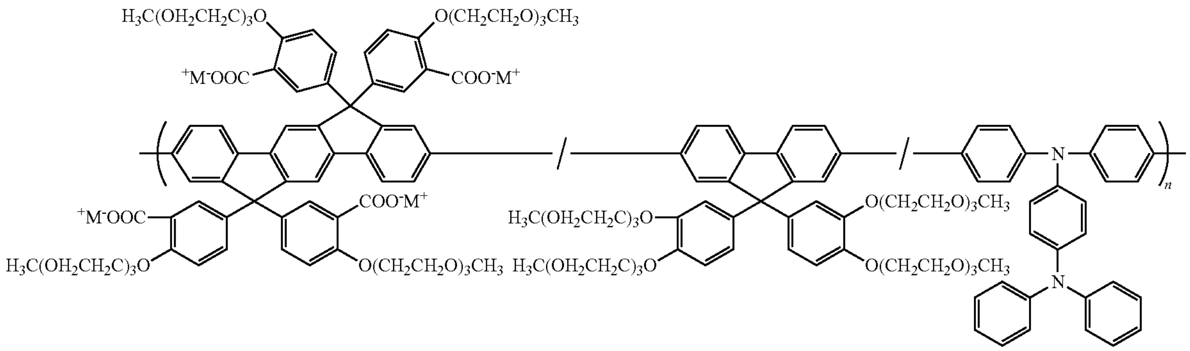
(p/q/100-p-q mol %)
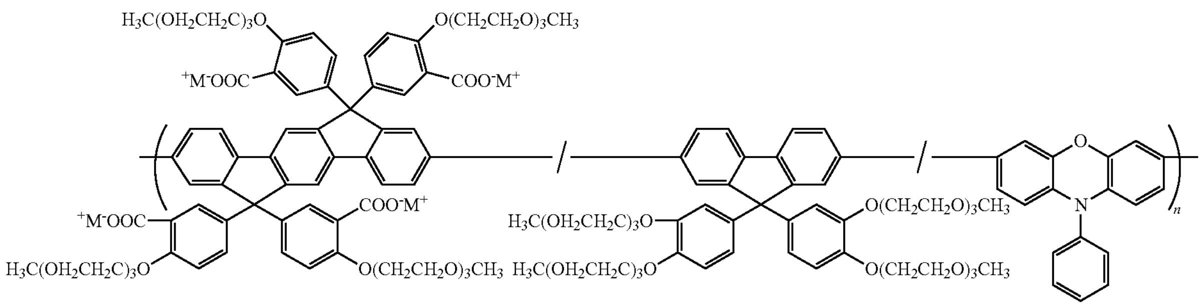
(p/q/100-p-q mol %)
[Chemical Formula 144]
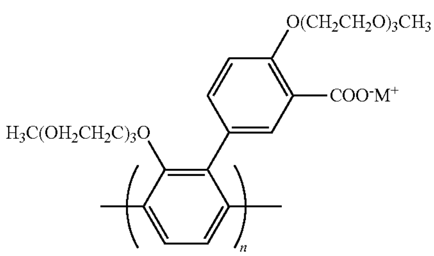
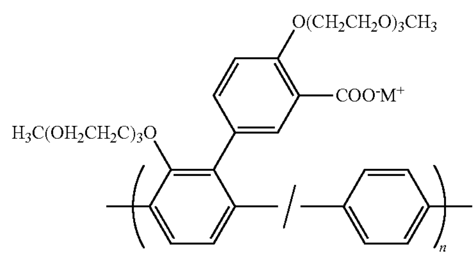
(p/100-p mol %)
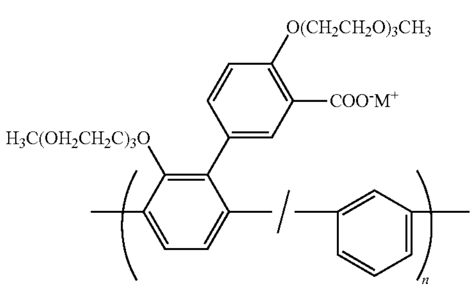
(p/100-p mol %)
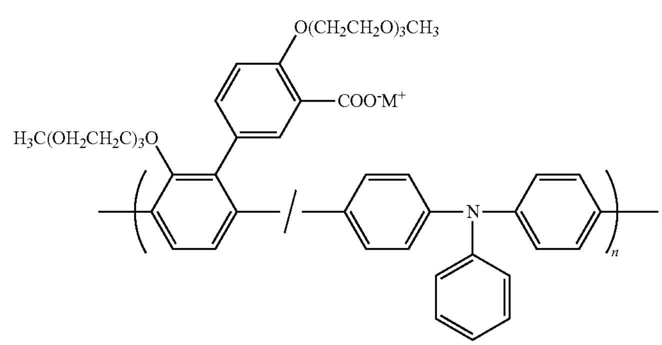
(p/100-p mol %)

-continued
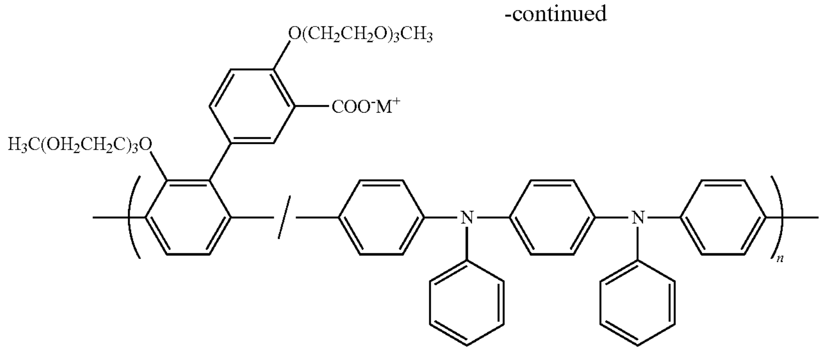
(p/100-p mol %)
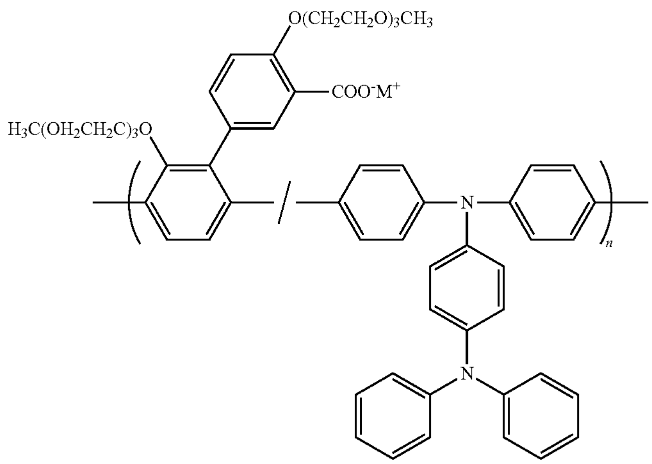
(p/100-p mol %)
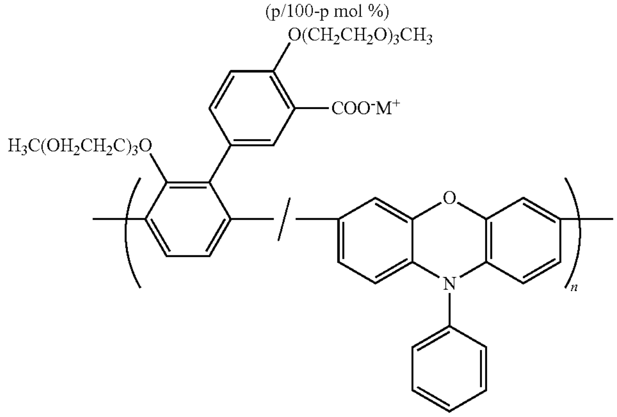
(p/100-p mol %)
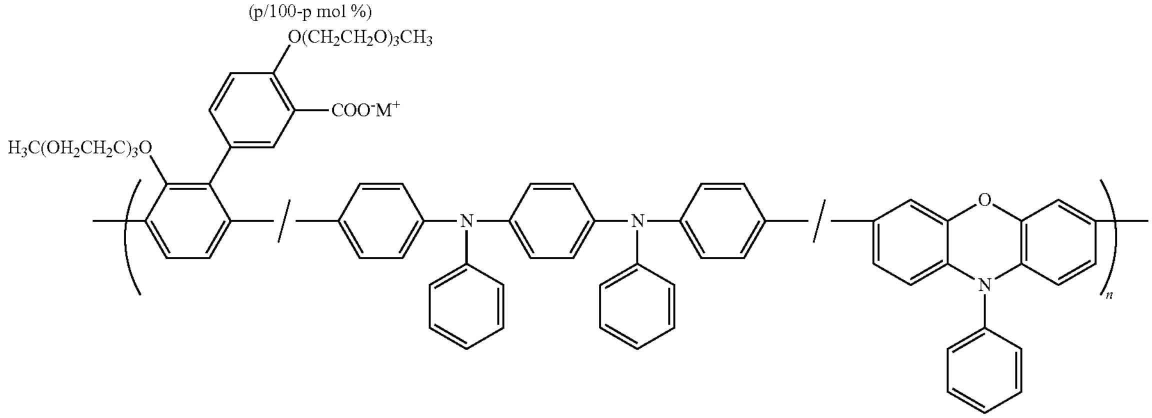
(p/q/100-p-q mol %)

-continued
[Chemical Formula 145]
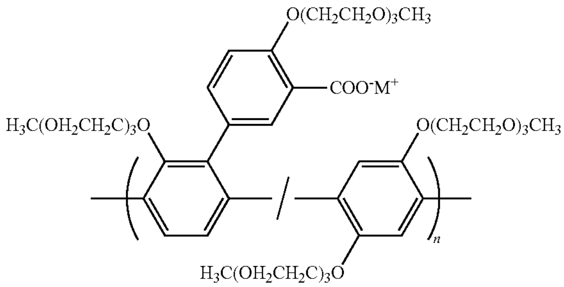
(p/100-p mol %)
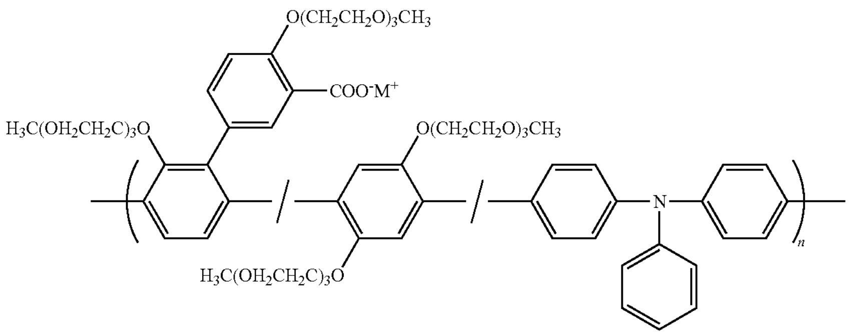
(p/q/100-p-q mol %)
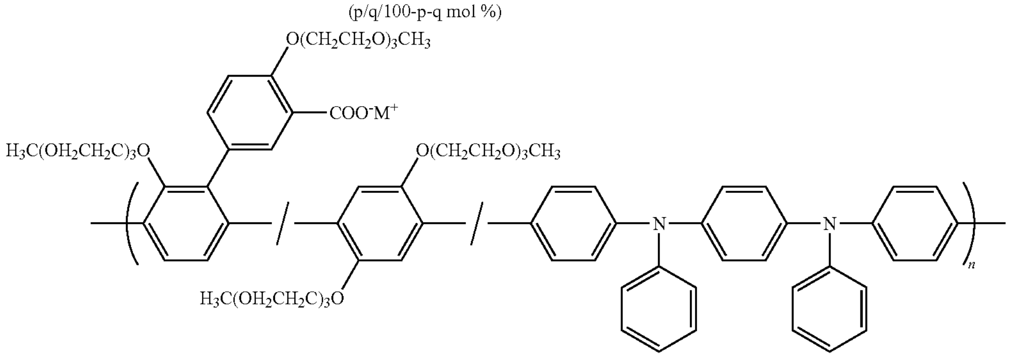
(p/q/100-p-q mol %)
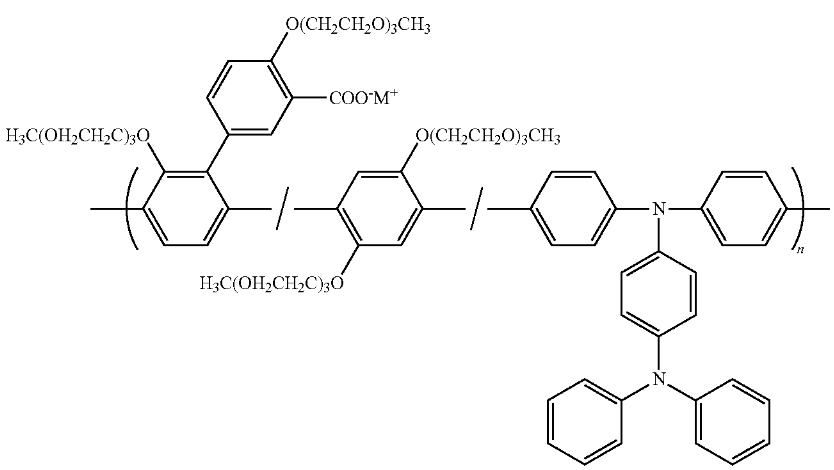
(p/q/100-p-q mol %)

-continued
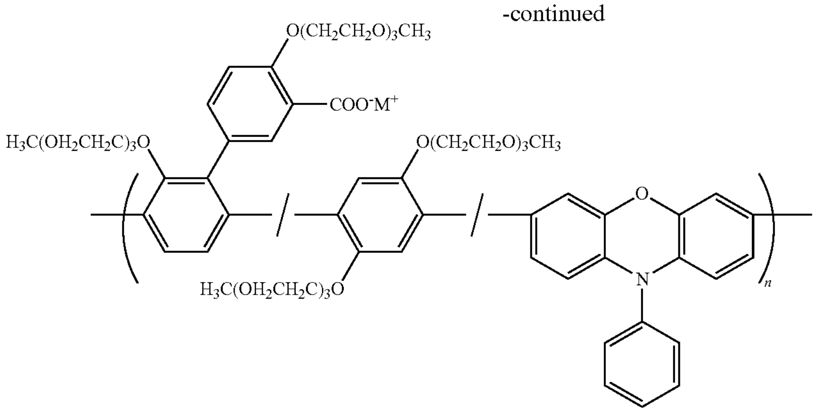
(p/q/100-p-q mol %)
[Chemical Formula 146]
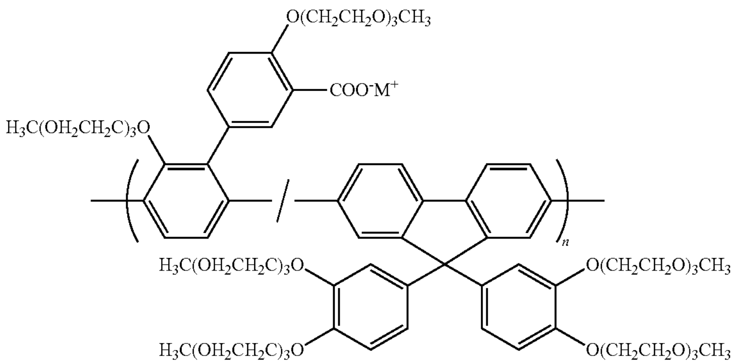
(p/100-p mol %)
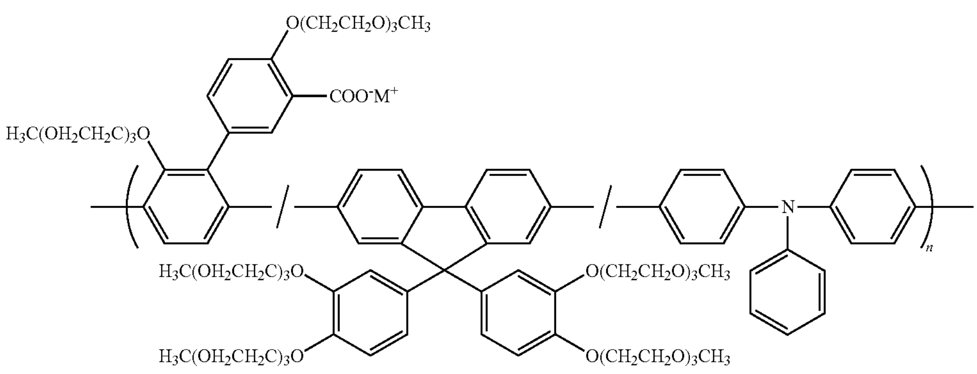
(p/q/100-p-q mol %)
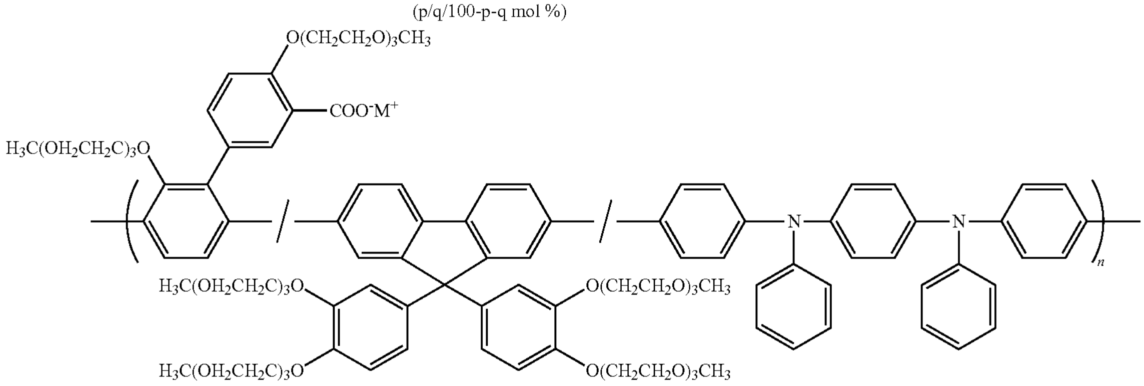
(p/q/100-p-q mol %)

-continued
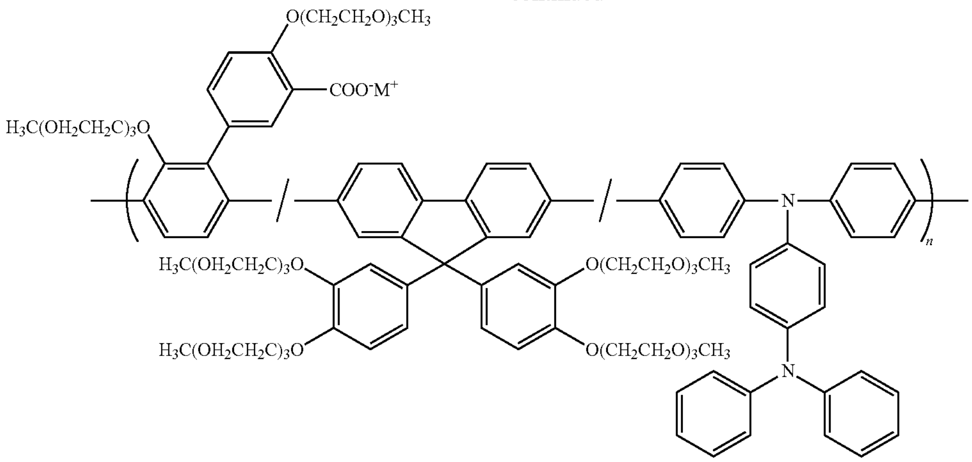
(p/q/100-p-q mol %)
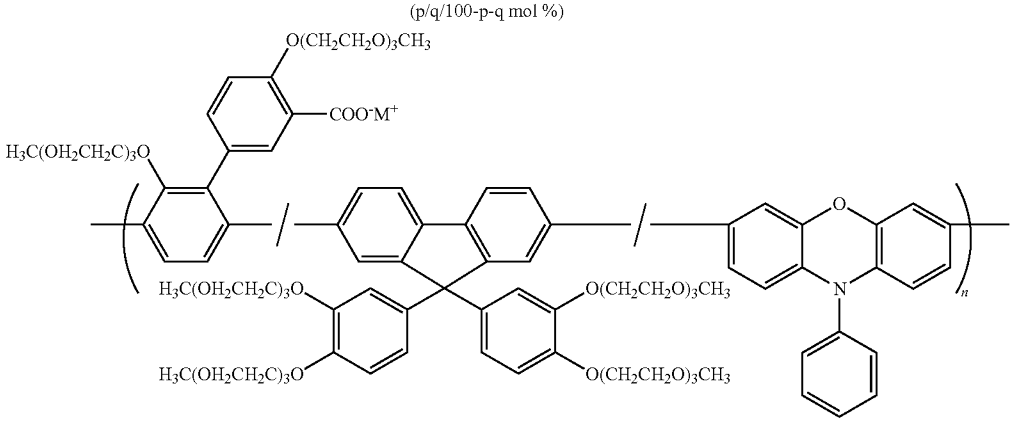
(p/q/100-p-q mol %)
[Chemical Formula 147]
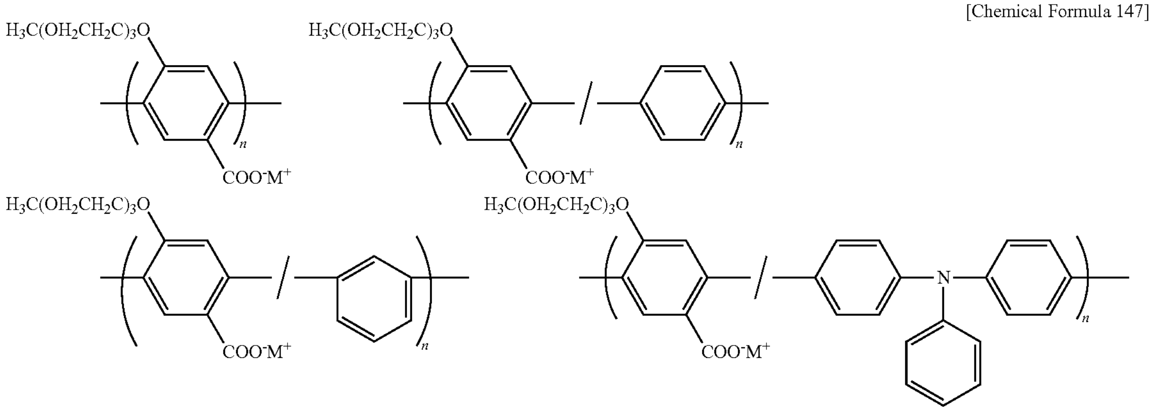
(p/100-p mol %)
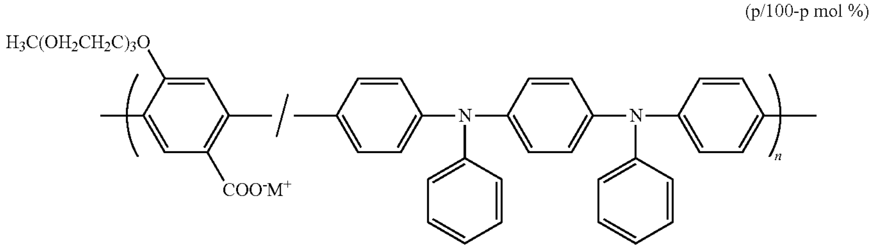
(p/100-p mol %)

-continued
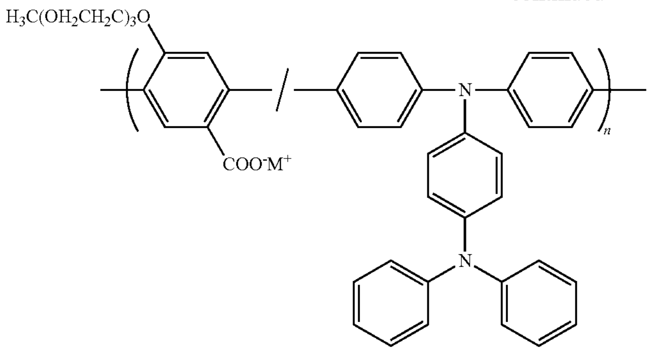
(p/100-p mol %)
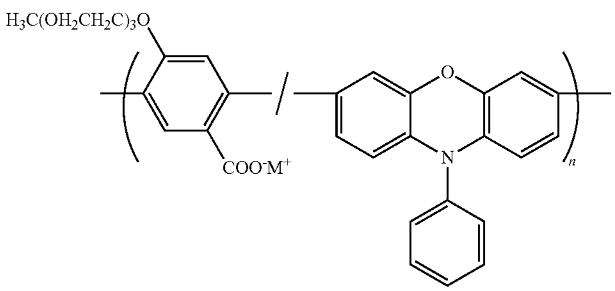
(p/100-p mol %)
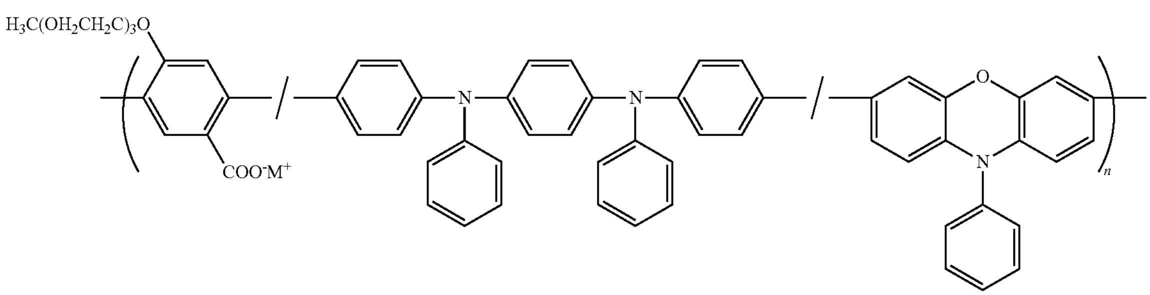
(p/q/100-p-q mol %)
[Chemical Formula 148]
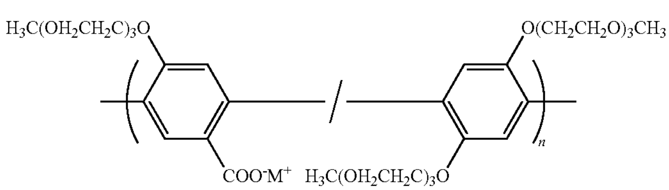
(p/100-p mol %)
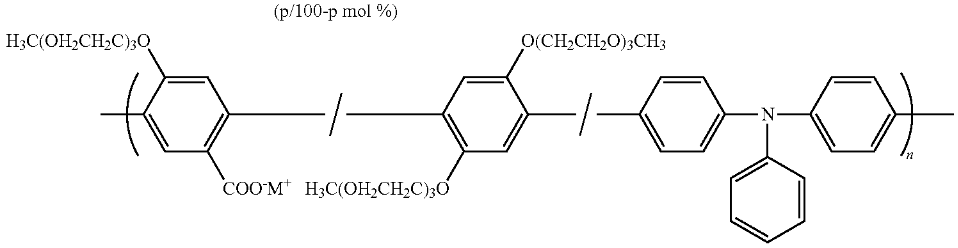
(p/q/100-p-q mol %)

-continued
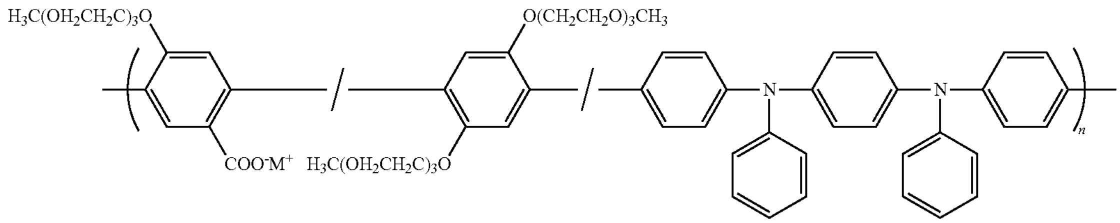
(p/q/100-p-q mol %)
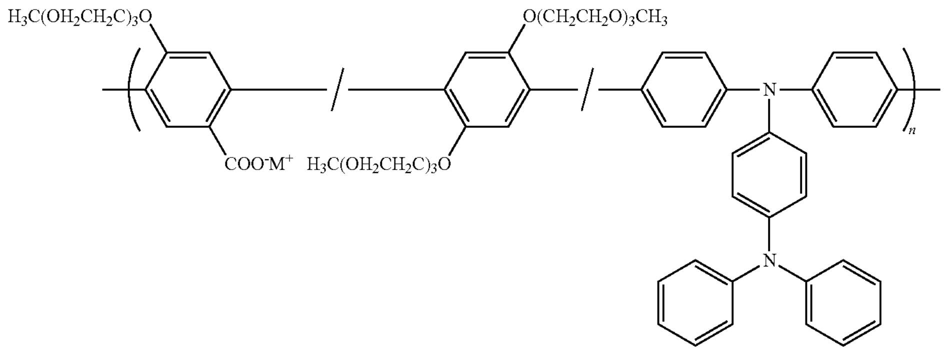
(p/q/100-p-q mol %)
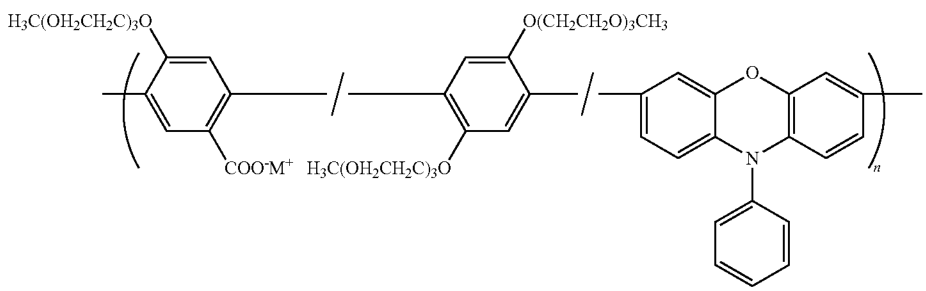
(p/q/100-p-q mol %)
[Chemical Formula 149]
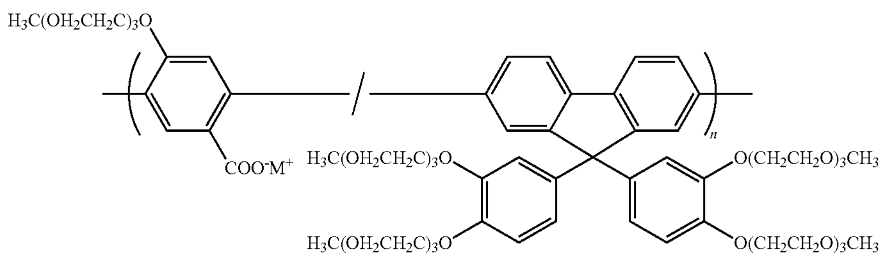
(p/100-p mol %)
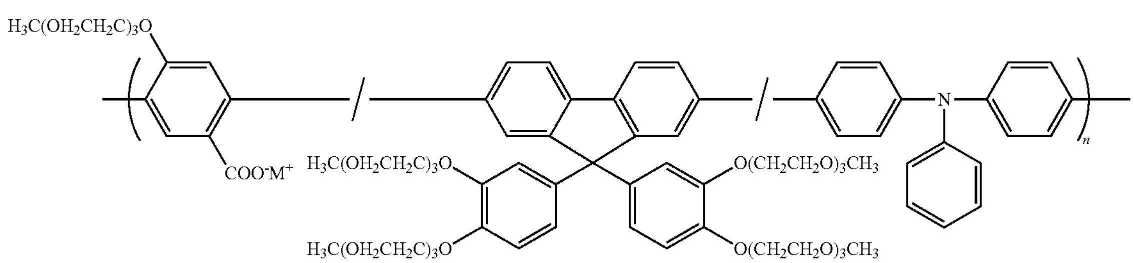
(p/q/100-p-q mol %)

-continued
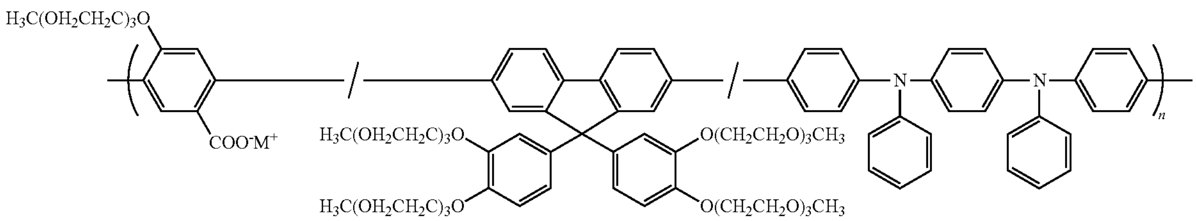
(p/q/100-p-q mol %)
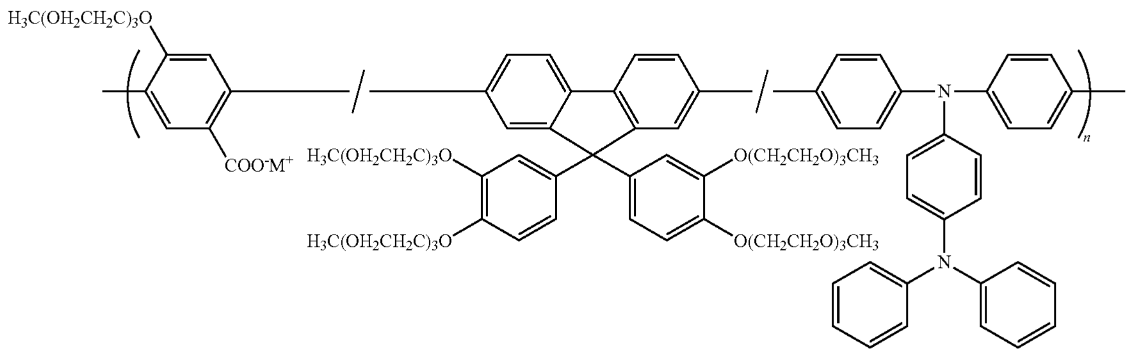
(p/q/100-p-q mol %)
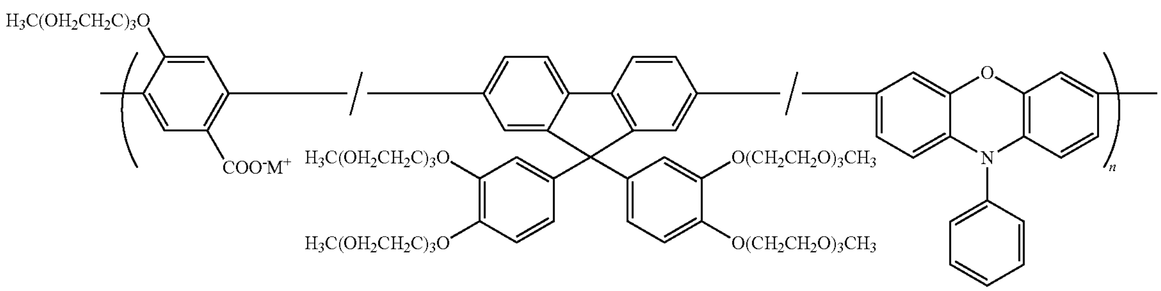
(p/q/100-p-q mol %)
[Chemical Formula 150]
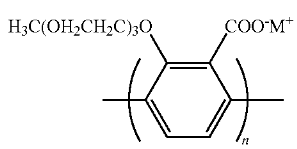
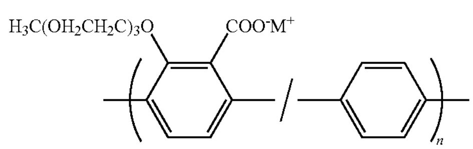
(p/100-p mol %)
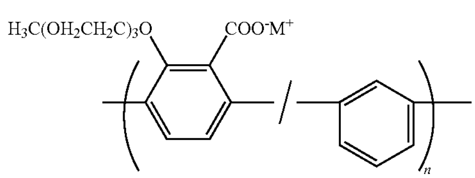
(p/100-p mol %)
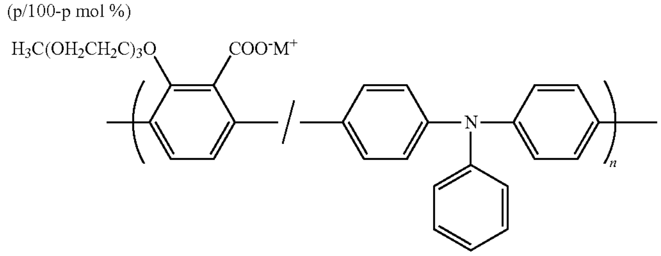
(p/100-p mol %)
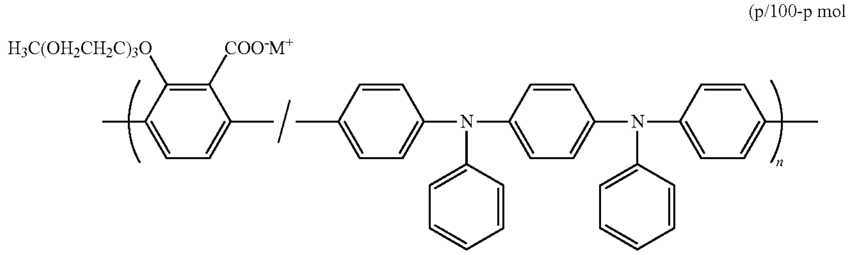
(p/100-p mol %)

-continued
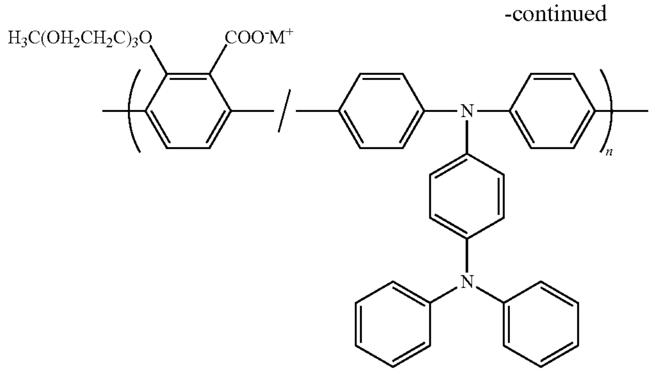
(p/100-p mol %)
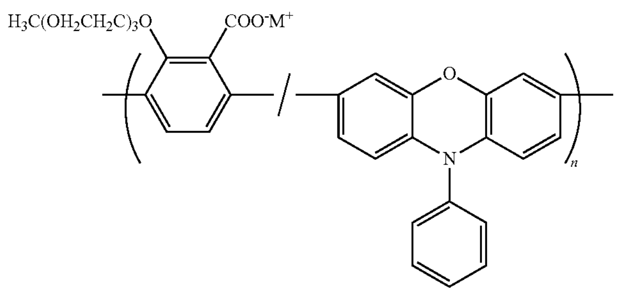
(p/100-p mol %)
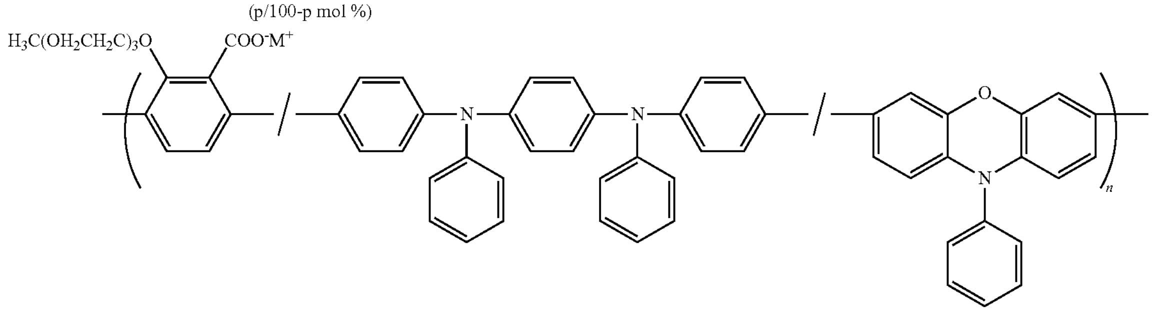
(p/q/100-p-q mol %)
[Chemical Formula 151]
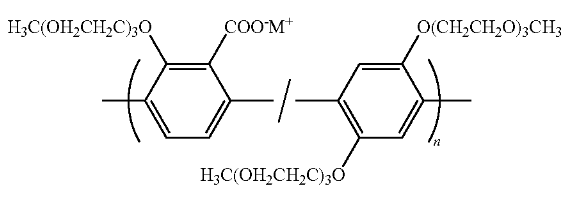
(p/100-p mol %)
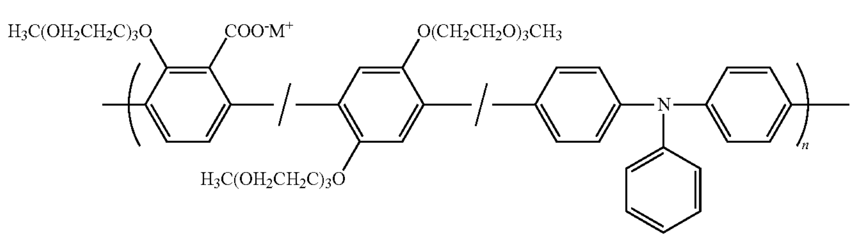
(p/q/100-p-q mol %)

-continued
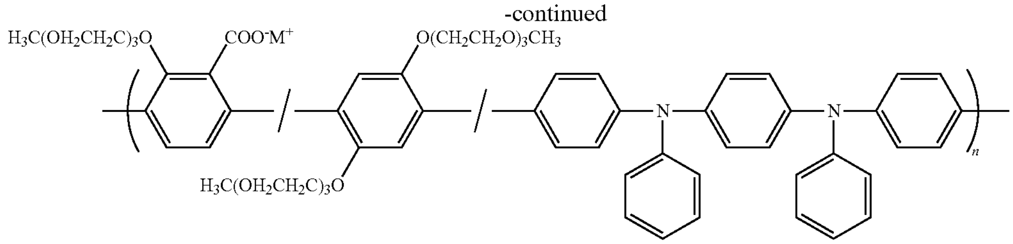
(p/q/100-p-q mol %)
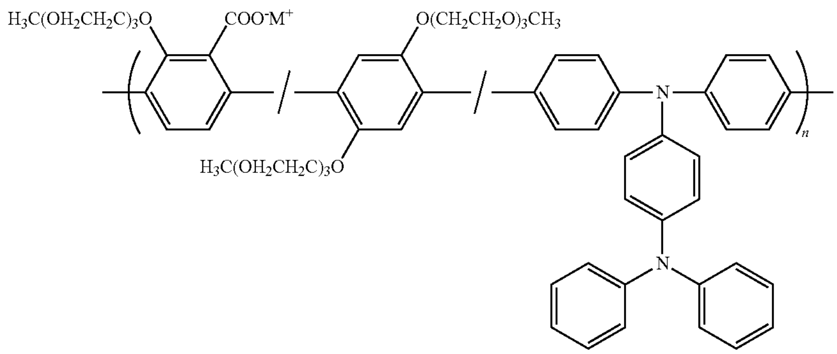
(p/q/100-p-q mol %)
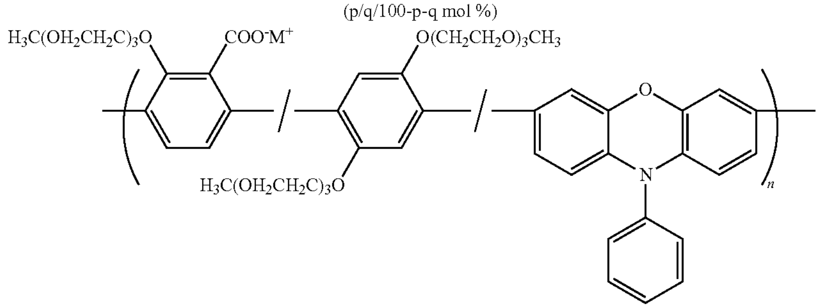
(p/q/100-p-q mol %)
[Chemical Formula 152]
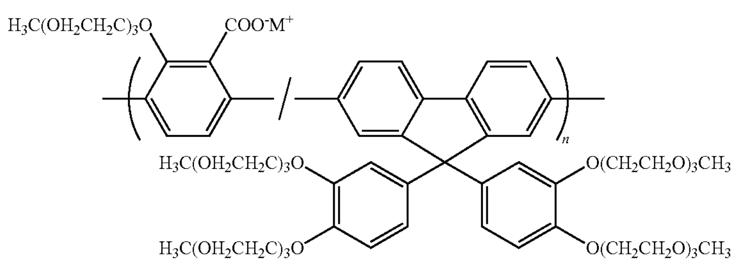
(p/100-p mol %)
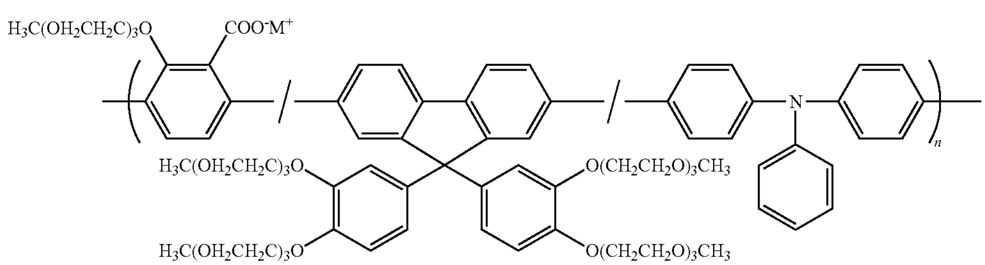
(p/q/100-p-q mol %)

-continued
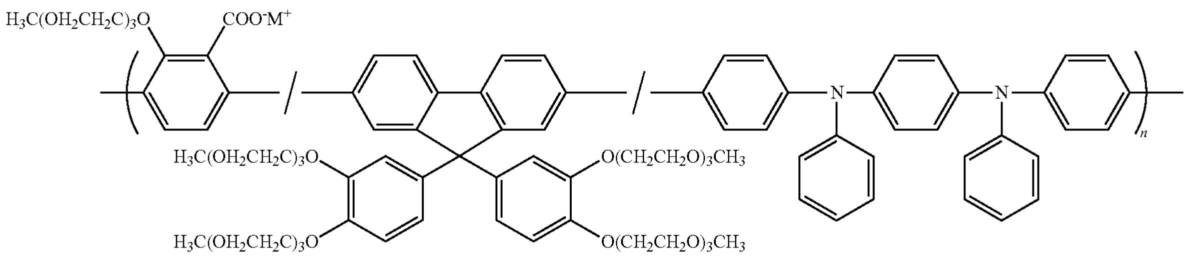
(p/q/100-p-q mol %)
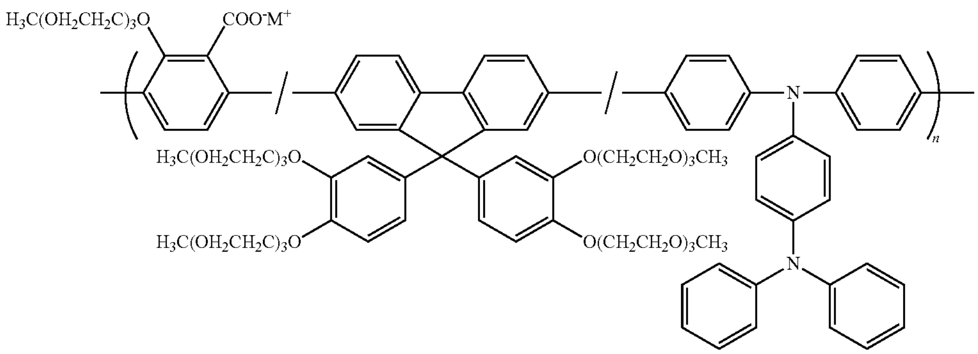
(p/q/100-p-q mol %)
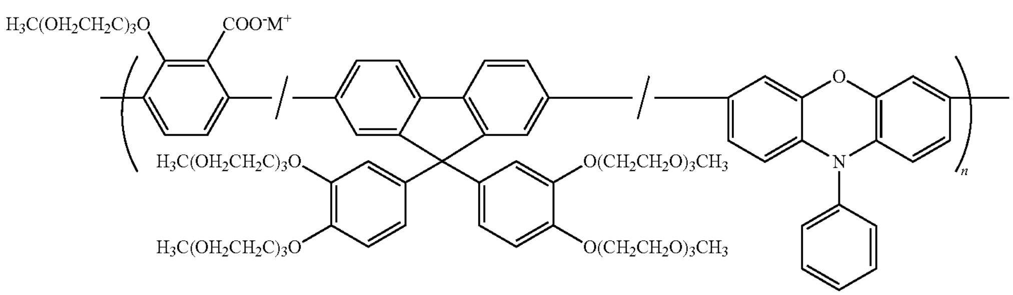
(p/q/100-p-q mol %)
[Chemical Formula 153]
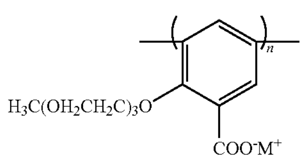
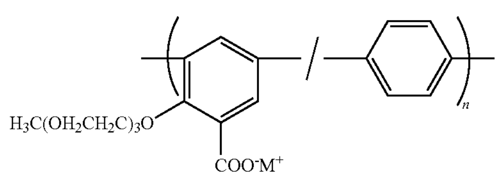
(p/100-p mol %)
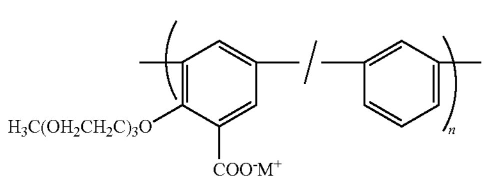
(p/100-p mol %)
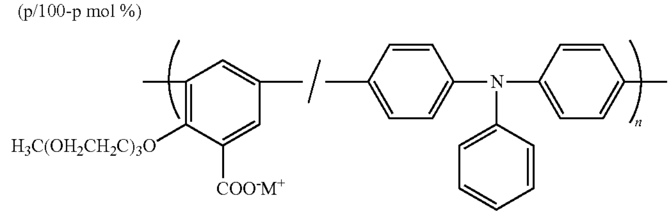
(p/100-p mol %)
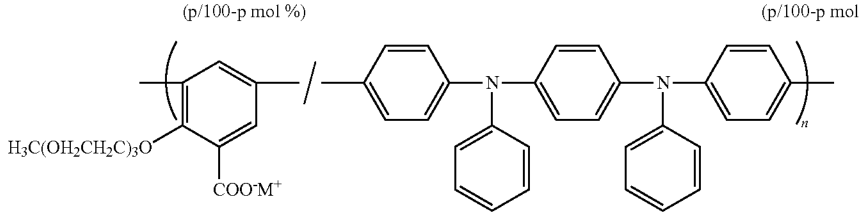
(p/100-p mol %)

-continued
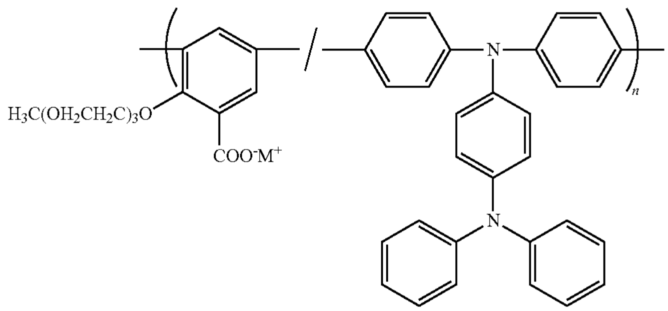
(p/100-p mol %)
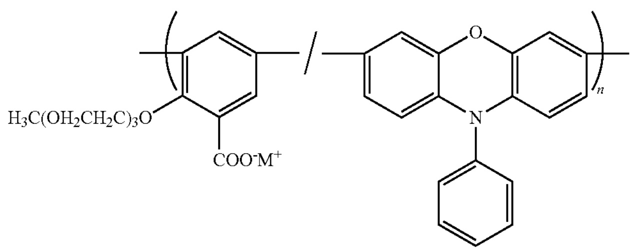
(p/100-p mol %)
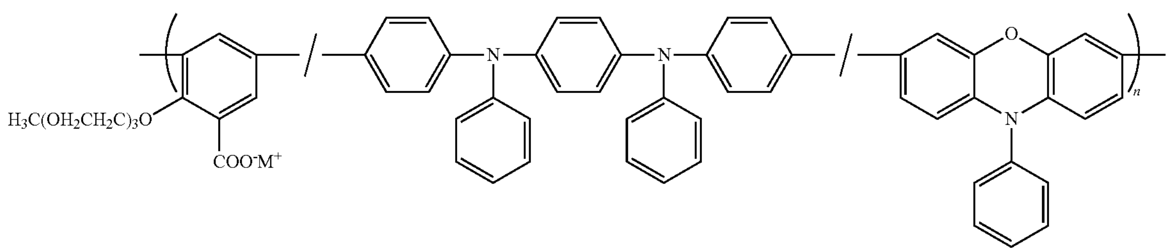
(p/q/100-p-q mol %)
[Chemical Formula 154]
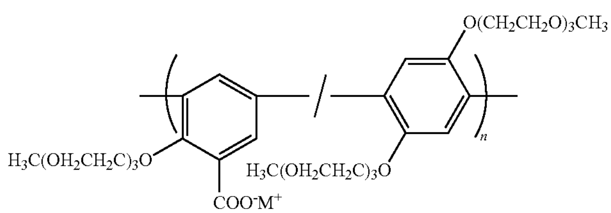
(p/100-p mol %)
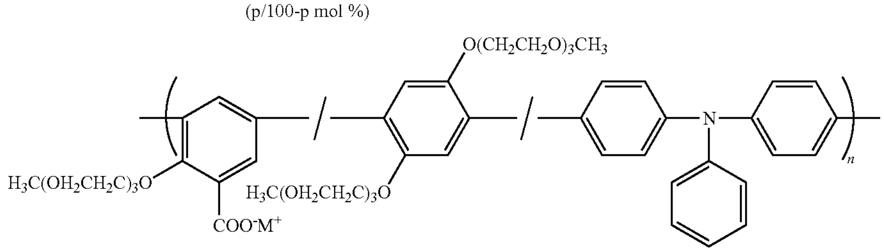
(p/q/100-p-q mol %)
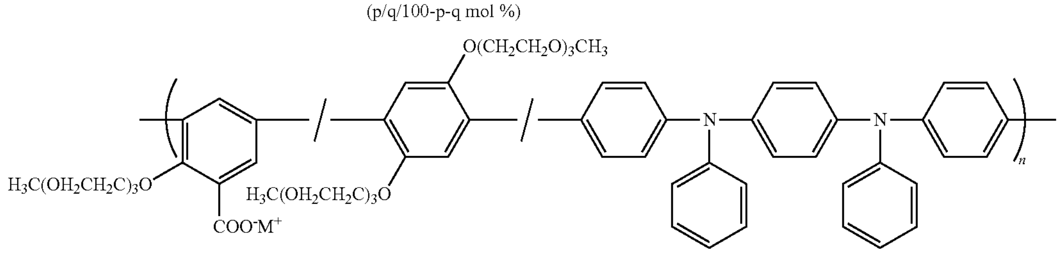
(p/q/100-p-q mol %)

-continued
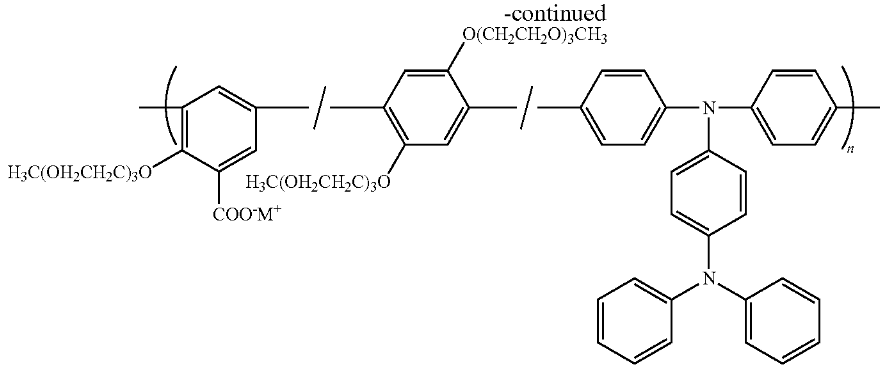
(p/q/100-p-q mol %)
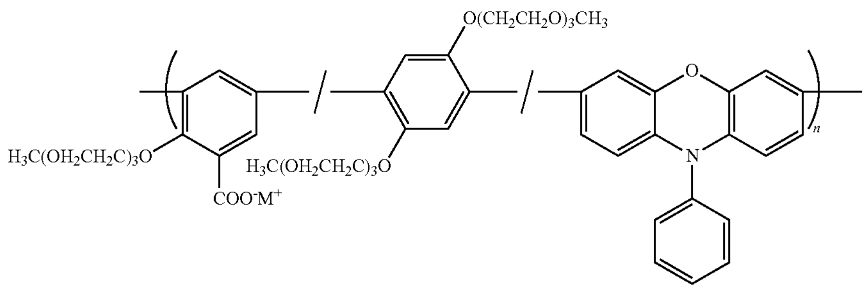
(p/q/100-p-q mol %)
[Chemical Formula 155]
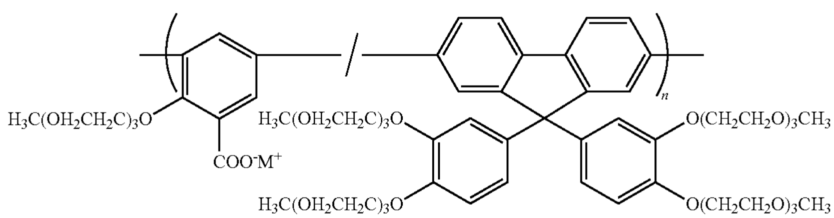
(p/100-p mol %)
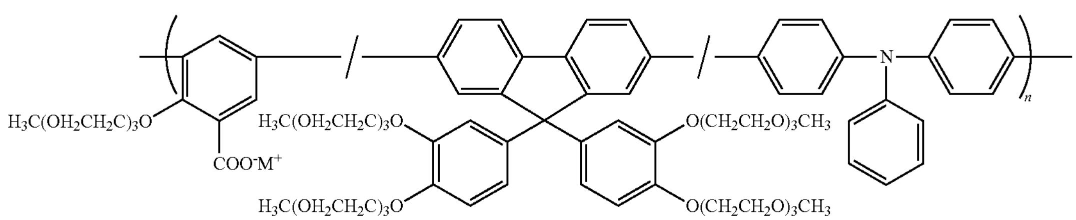
(p/q/100-p-q mol %)
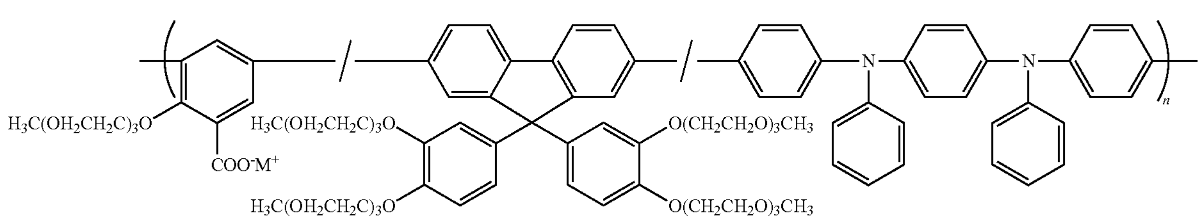
(p/q/100-p-q mol %)

-continued
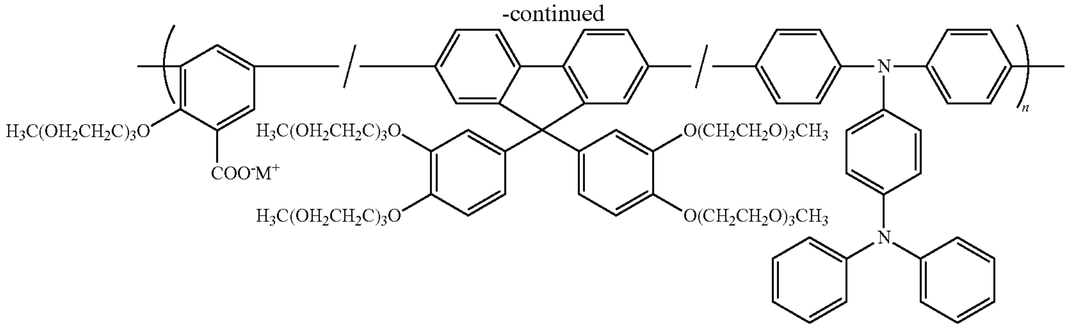
(p/q/100-p-q mol %)
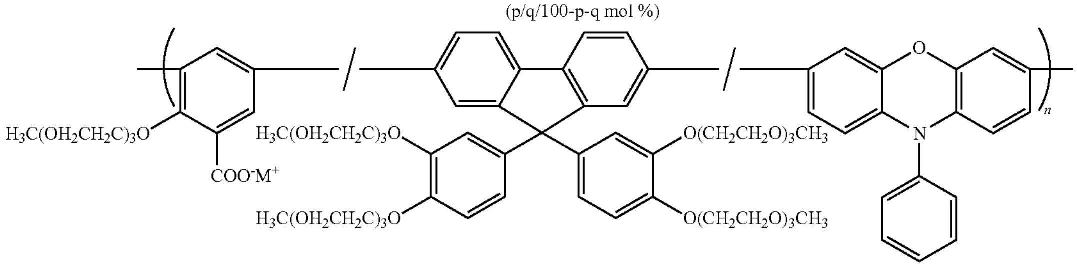
(p/q/100-p-q mol %)
[Chemical Formula 156]
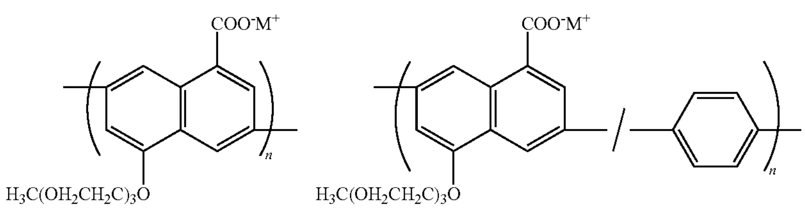
(p/100-p mol %)
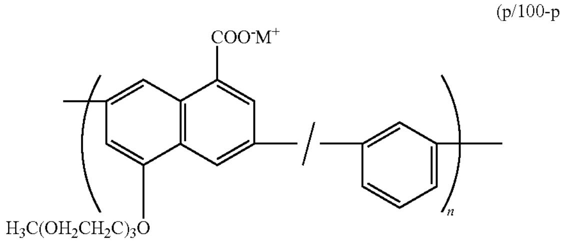
(p/100-p mol %)
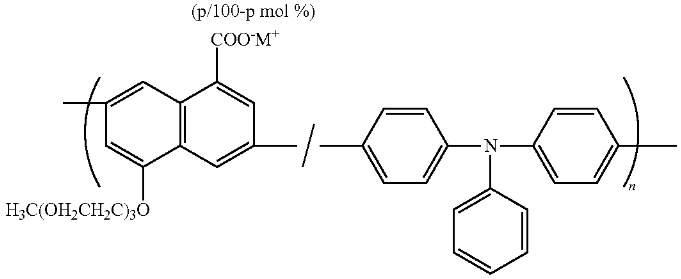
(p/100-p mol %)
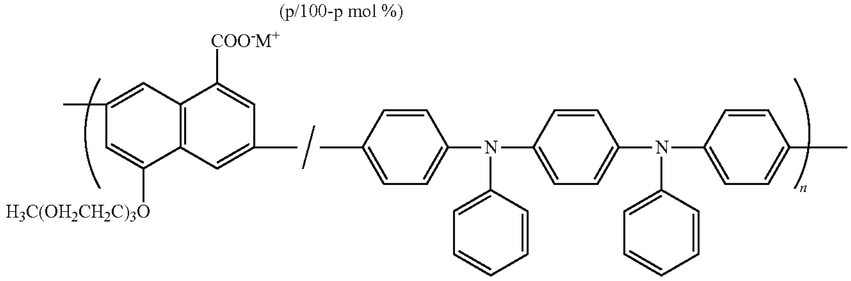
(p/100-p mol %)

-continued
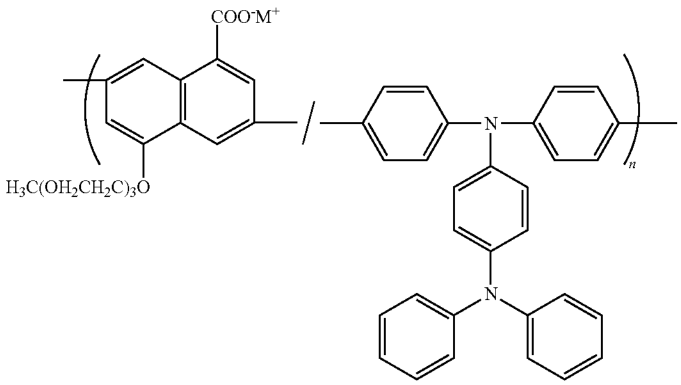
(p/100-p mol %)
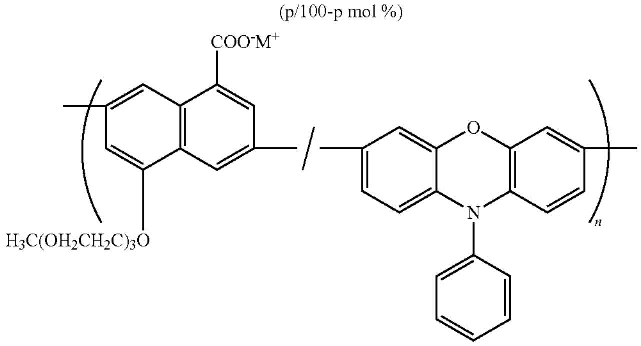
(p/100-p mol %)
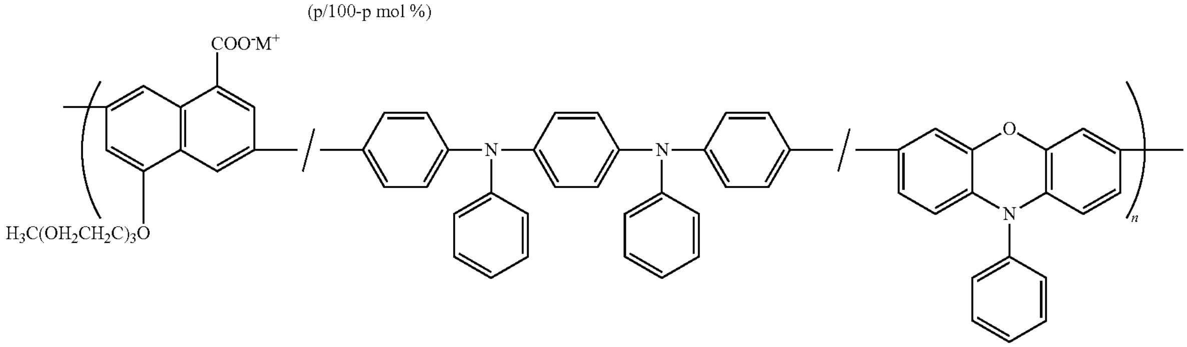
(p/q/100-p-q mol %)
[Chemical Formula 157]
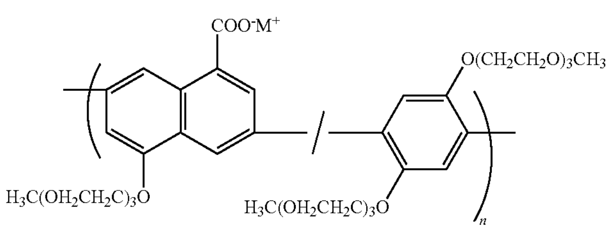
(p/100-p mol %)
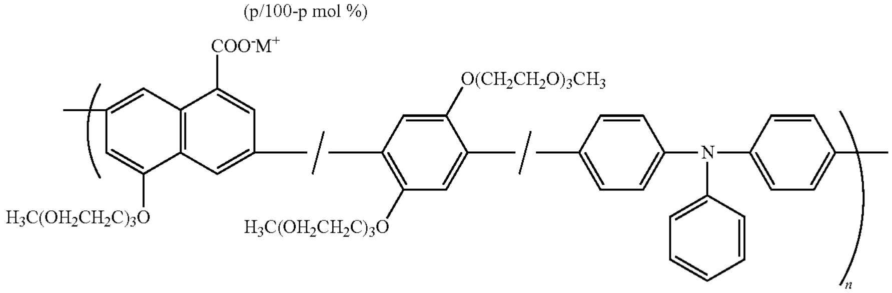
(p/q/100-p-q mol %)

-continued
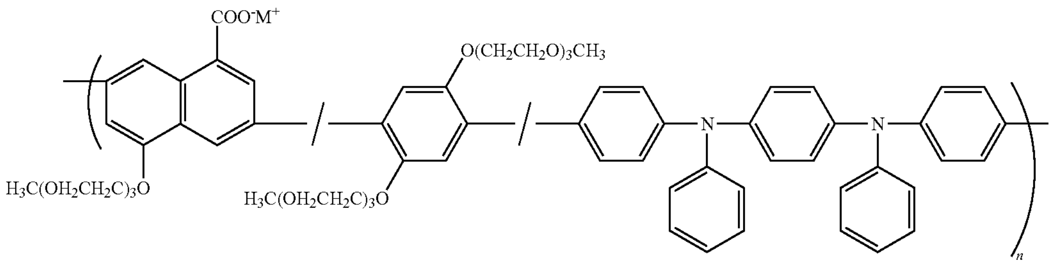
(p/q/100-p-q mol %)
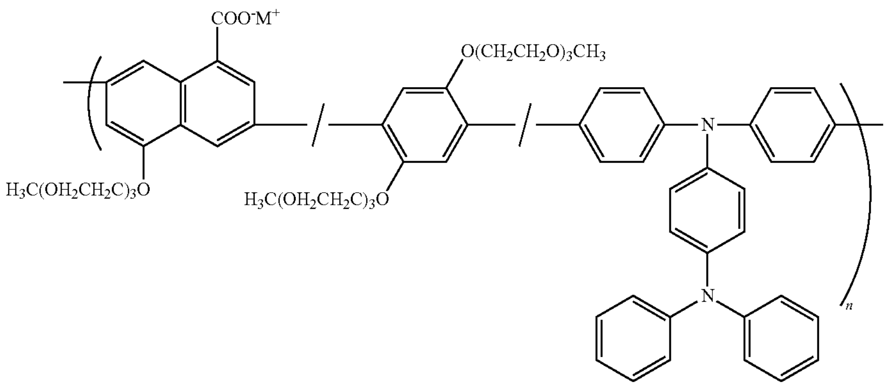
(p/q/100-p-q mol %)
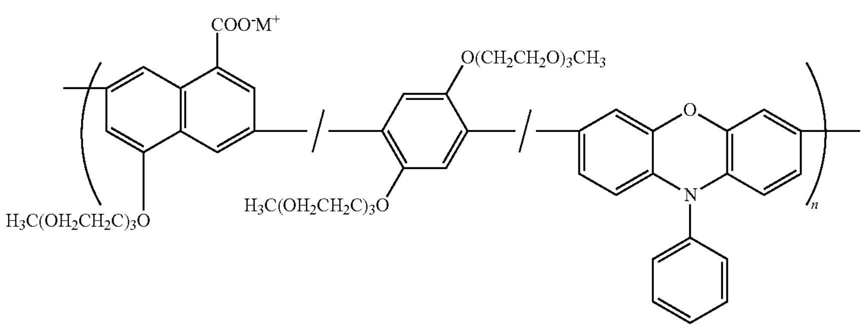
(p/q/100-p-q mol %)
[Chemical Formula 158]
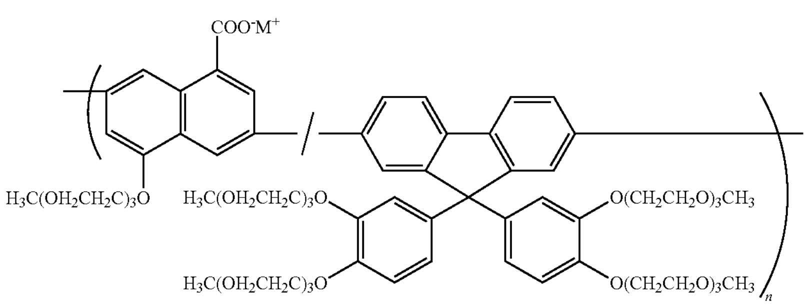
(p/100-p mol %)

-continued
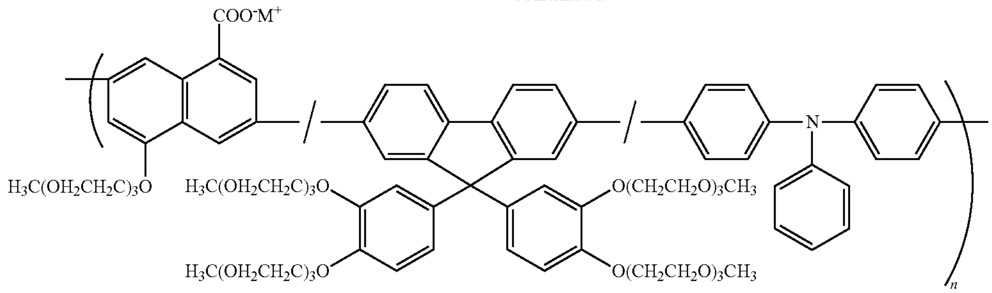
(p/q/100-p-q mol %)
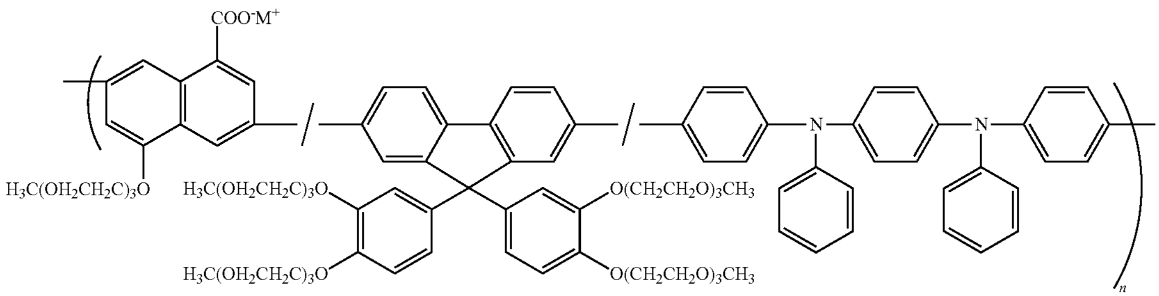
(p/q/100-p-q mol %)
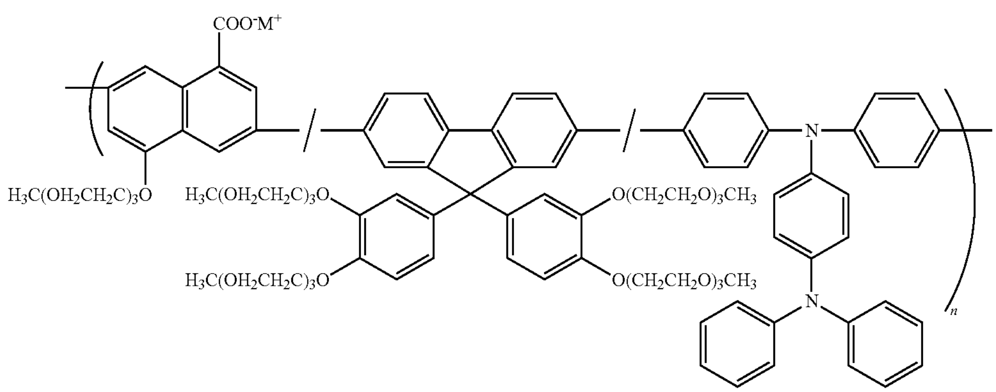
(p/q/100-p-q mol %)
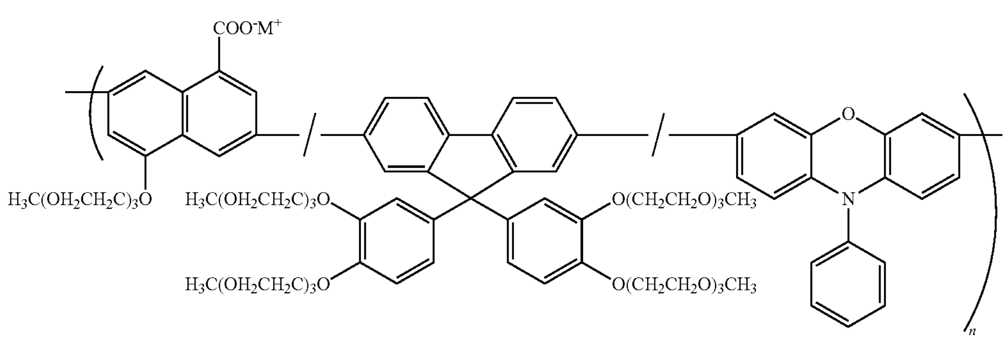
(p/q/100-p-q mol %)

-continued
[Chemical Formula 159]
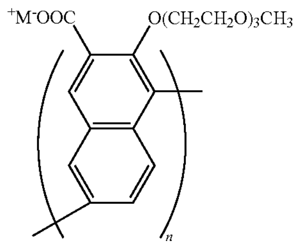
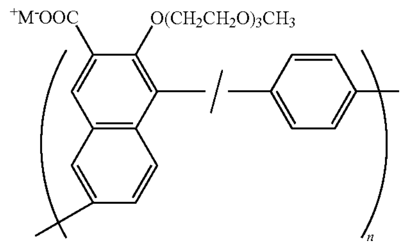
(p/100-p mol %)
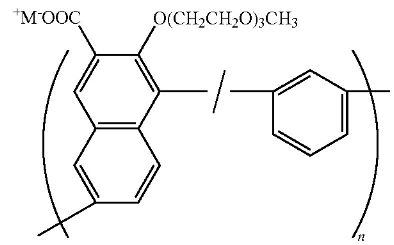
(p/100-p mol %)
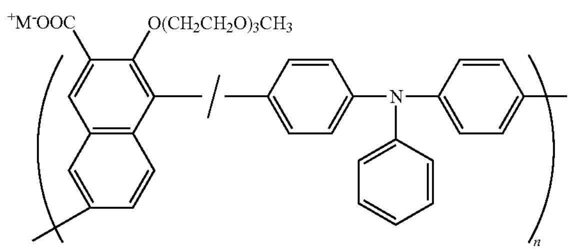
(p/100-p mol %)
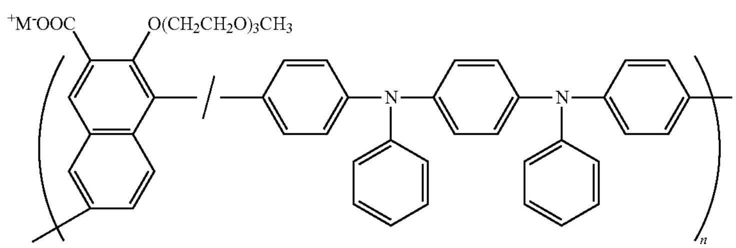
(p/100-p mol %)
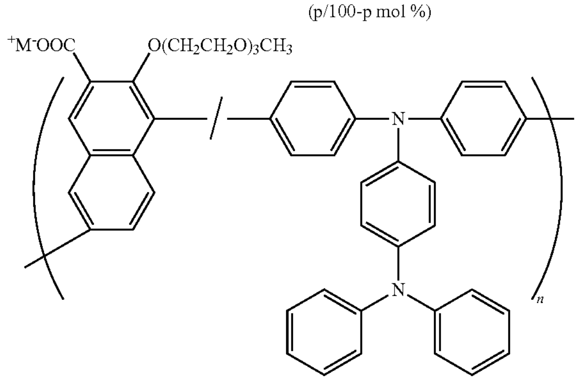
(p/100-p mol %)
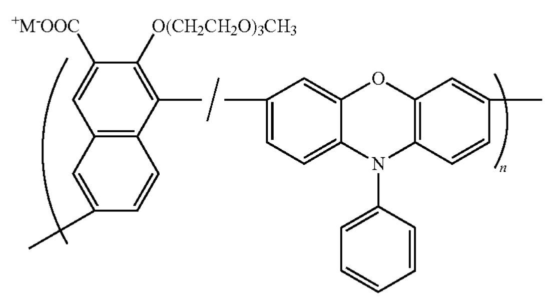
(p/100-p mol %)
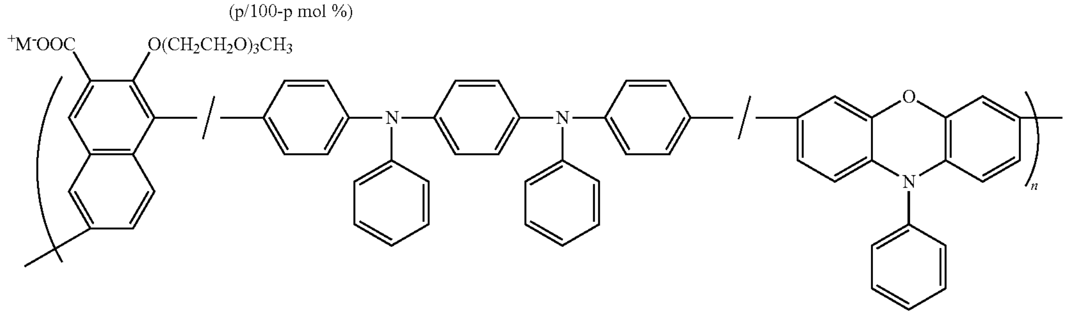
(p/q/100-p-q mol %)

-continued
[Chemical Formula 160]
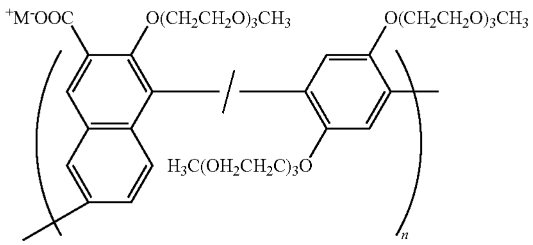
(p/100-p mol %)
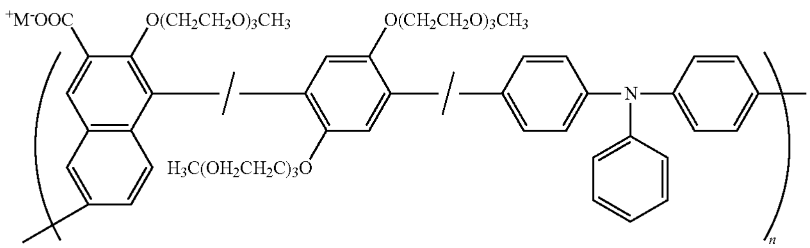
(p/q/100-p-q mol %)
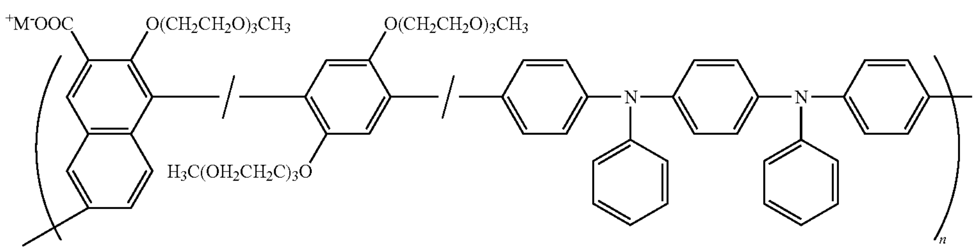
(p/q/100-p-q mol %)
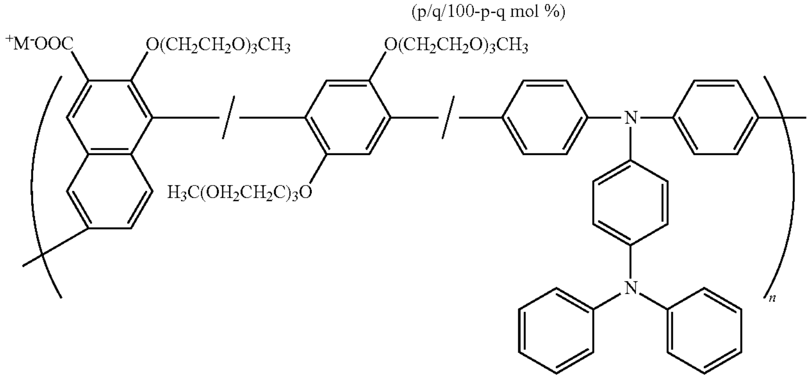
(p/q/100-p-q mol %)
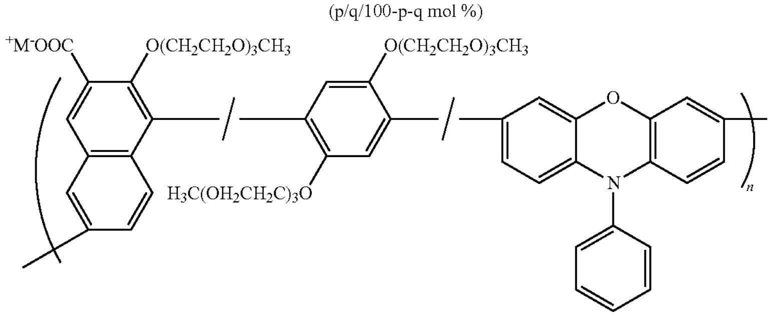
(p/q/100-p-q mol %)

-continued
[Chemical Formula 161]
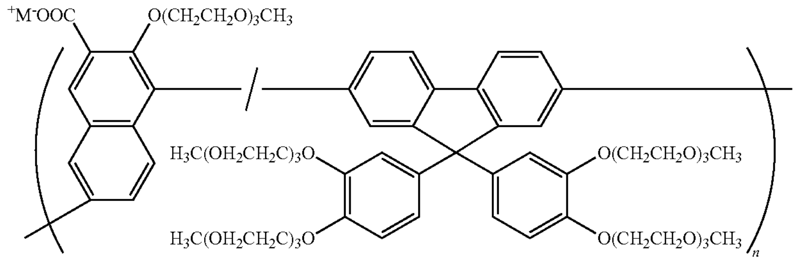
(p/100-p mol %)
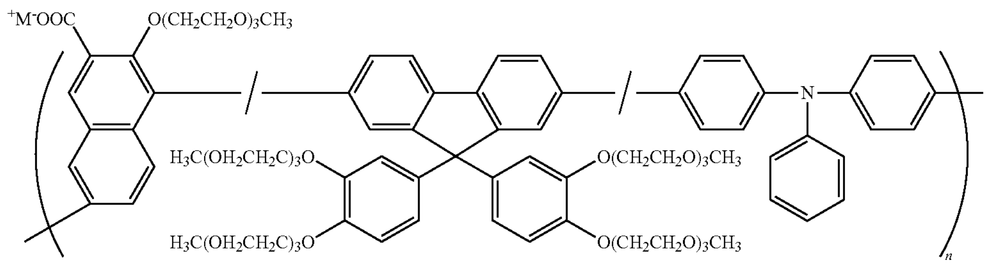
(p/q/100-p-q mol %)
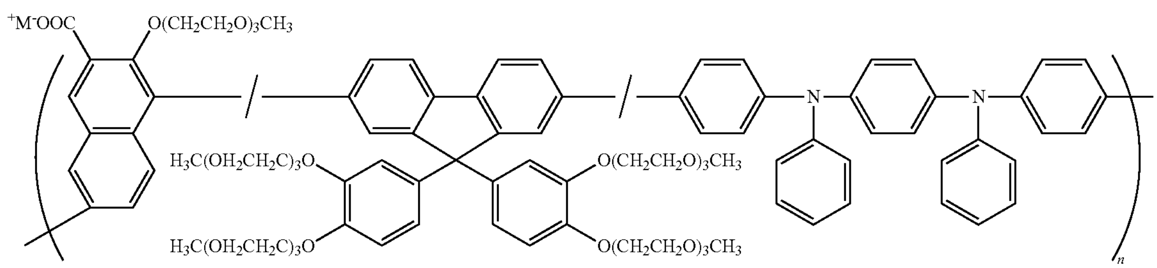
(p/q/100-p-q mol %)
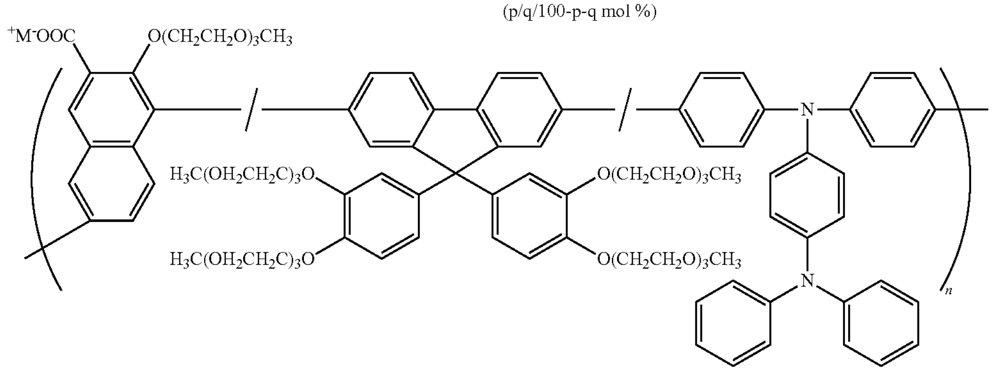
(p/q/100-p-q mol %)
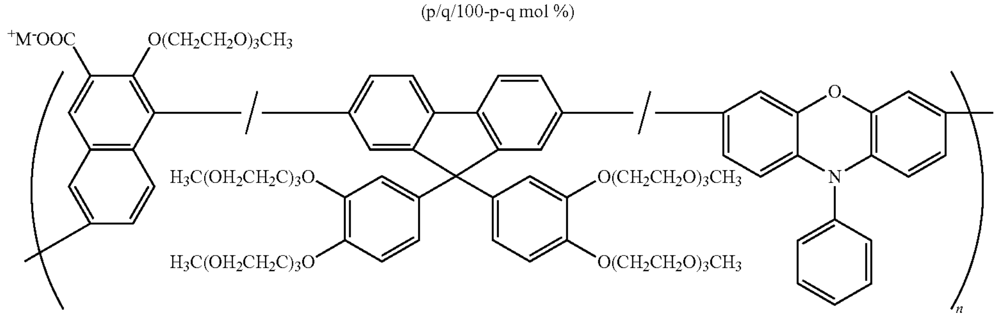
(p/q/100-p-q mol %)

-continued
[Chemical Formula 162]
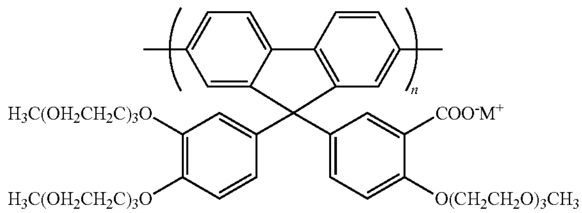
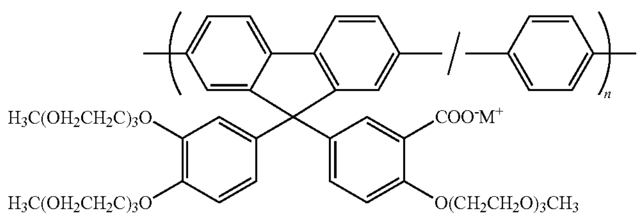
(p/100-p mol %)
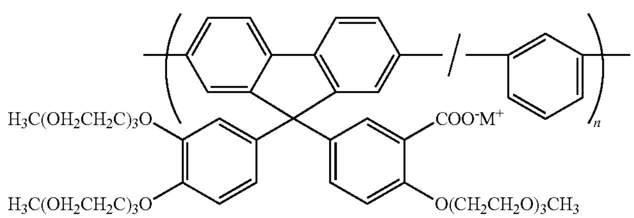
(p/100-p mol %)
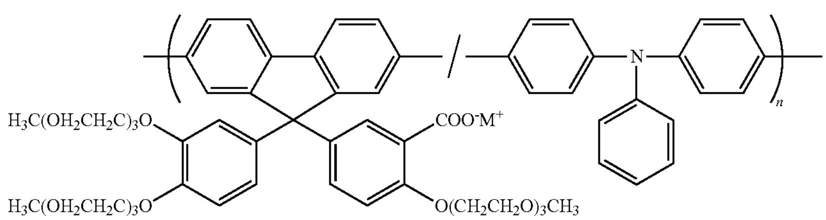
(p/100-p mol %)
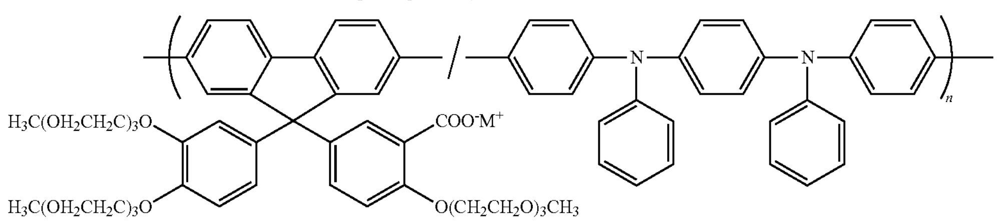
(p/100-p mol %)
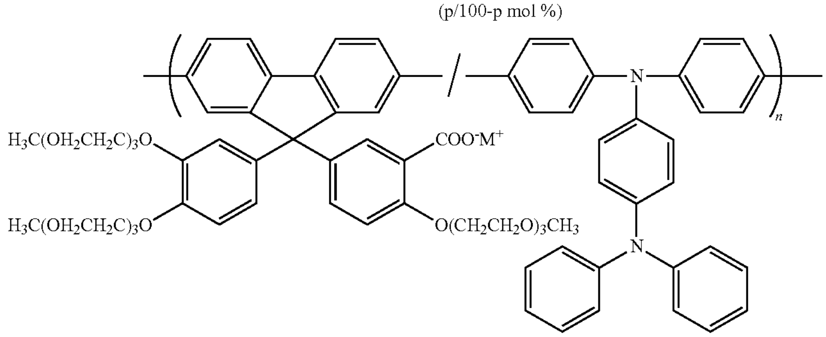
(p/100-p mol %)

-continued
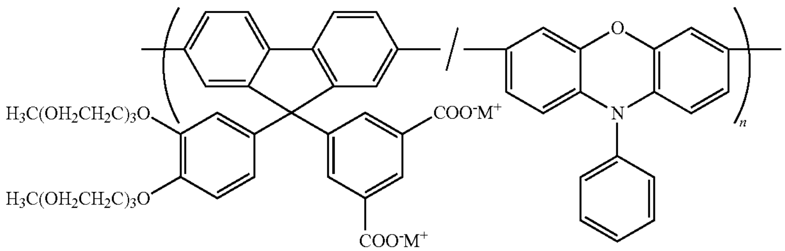
(p/100-p mol %)
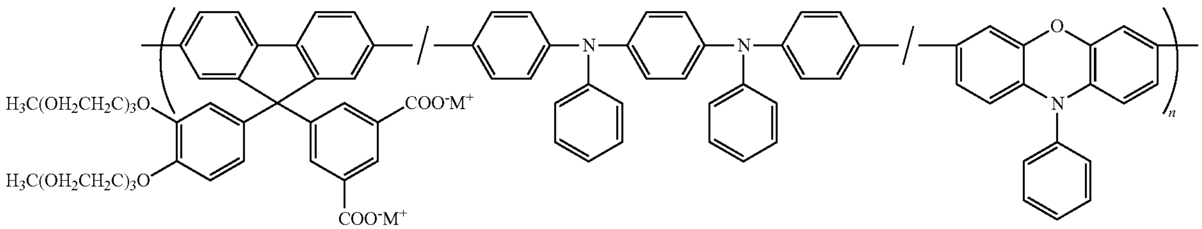
(p/q/100-p-q mol %)
[Chemical Formula 163]
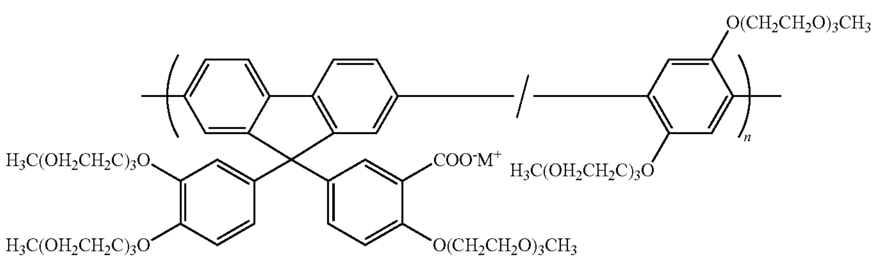
(p/100-p mol %)
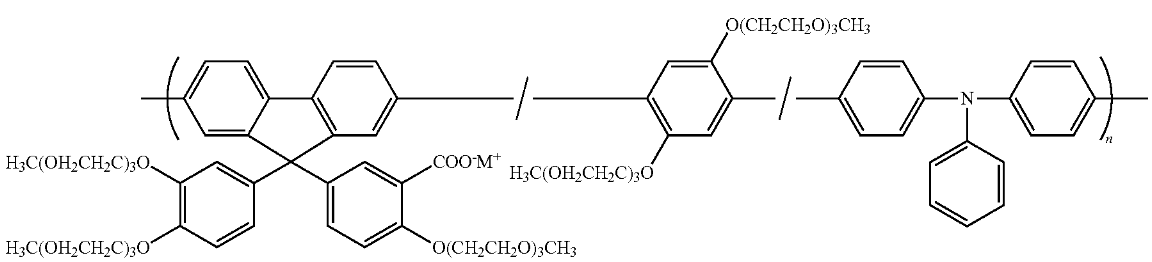
(p/q/100-p-q mol %)
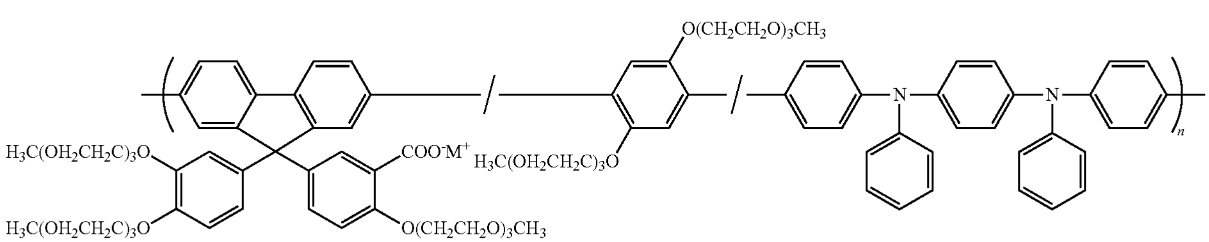
(p/q/100-p-q mol %)

-continued
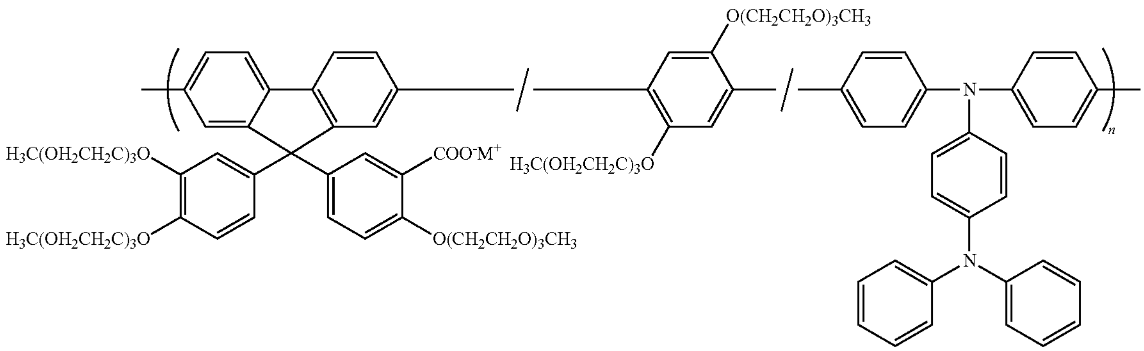
(p/q/100-p-q mol %)
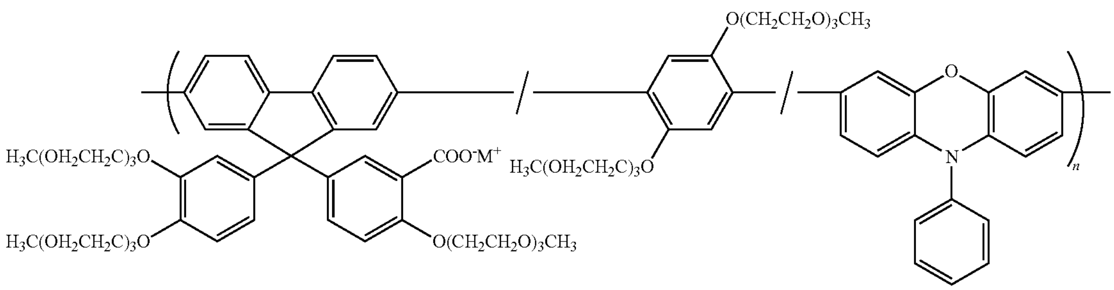
(p/q/100-p-q mol %)
[Chemical Formula 164]
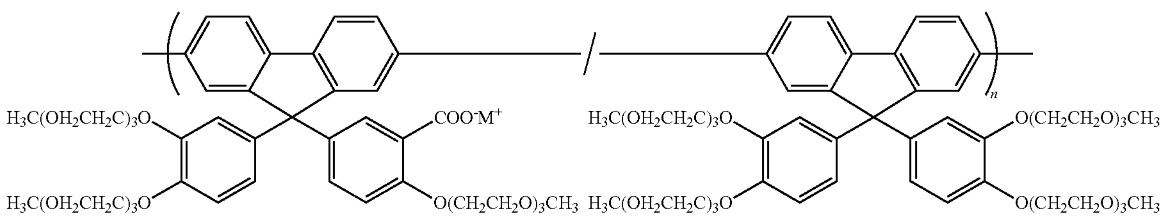
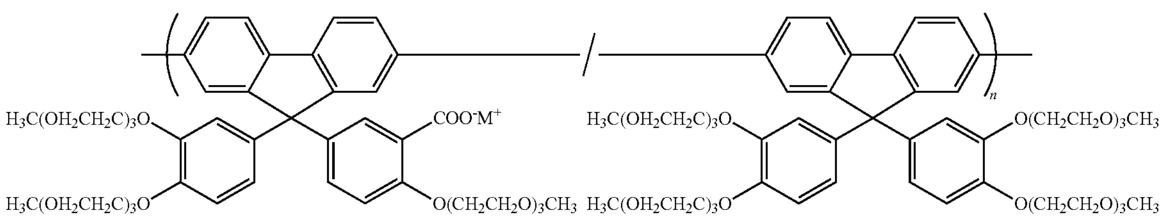
(p/100-p mol %)
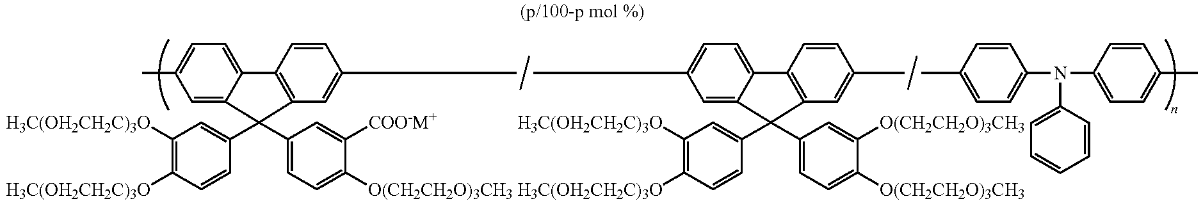
(p/q/100-p-q mol %)
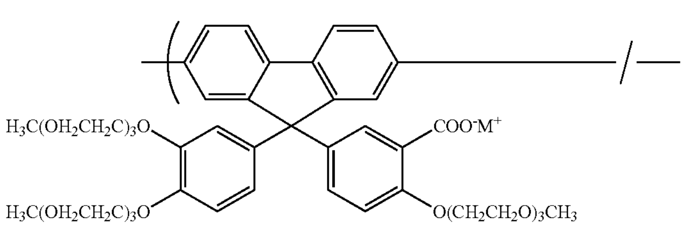

-continued

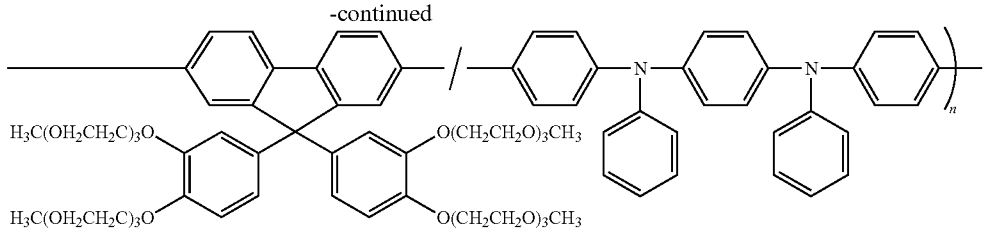

(p/q/100-p-q mol %)

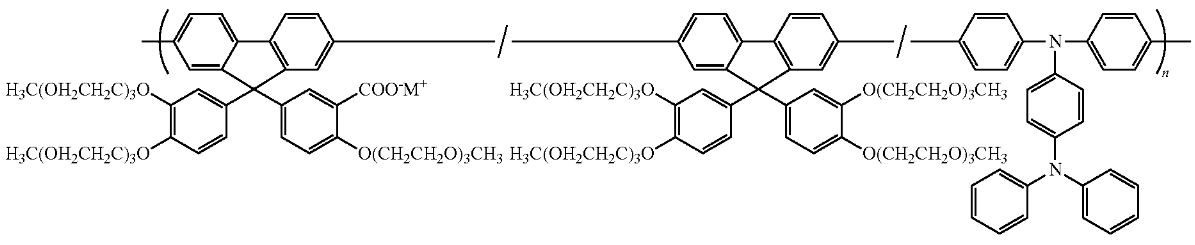

(p/q/100-p-q mol %)

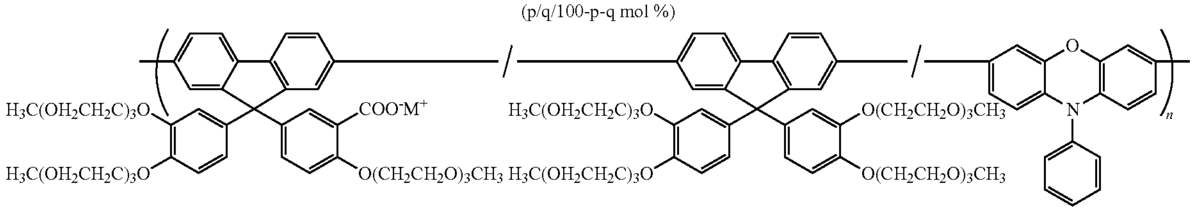

(p/q/100-p-q mol %)

[1.14. Method for Producing Polymer Compound]

Hereinafter, a method for producing the polymer compound used in the present invention will be described. Examples of the preferable method for producing the polymer compound used in the present invention include a method in which the compound represented by Formula (26) is used as one of the raw materials and the compound is polymerized by condensation polymerization and a method in which a polymer compound not including ions is synthesized in a first process and a polymer compound including ions is synthesized from the polymer compound not including the ions in a second process.

$$X^1\text{-}A^a\text{-}X^2 \quad (26)$$

(In Formula (26), $A^a$ is a structural unit including one or more groups selected from the group consisting of the group represented by Formula (2), the group represented by Formula (4), the group represented by Formula (6), the group represented by Formula (17), the group represented by Formula (19), the group represented by Formula (21), the group represented by Formula (27), and the group represented by Formula (28) as a substituent; and $X^2$ and $X^2$ are each independently a group that can participate in the condensation polymerization.)

$$—R^{16}\text{-}\{(Q^4)_{n14}\text{-}Y^4\}_{m15} \quad (27)$$

(In Formula (27), $R^{16}$ is a (1+m15)-valent organic group; $Q^4$ is a divalent organic group; $Y^4$ is $—CO_2R^χ$, $—SO_3R^χ$, $—SO_2R^χ$, $—PO_3(R^χ)_2$ or $—B(R^χ)_2$; n14 is an integer of 0 or more; $R^χ$ is a hydrogen atom, an alkyl group having 1 to 30 carbon atom(s) that optionally has a substituent or an aryl group having 6 to 50 carbon atoms that optionally has a substituent; m15 is an integer of 1 or more; when a plurality of $Q^4$ are present, each $Q^4$ may be the same as or different from each other; when a plurality of $Y^4$ are present, each $Y^4$ may be the same as or different from each other; when a plurality of n14 are present, each n14 may be the same as or different from each other; and when a plurality of $R^χ$ are present, each $R^χ$ may be the same as or different from each other).

$$—R^{17}—\{(Q^5)_{n15}\text{-}Y^5\}_{m16} \quad (28)$$

(In Formula (28), $R^{17}$ is a (1+m16)-valent organic group; $Q^5$ is a divalent organic group; $Y^5$ is a halogen atom, $—N(R^δ)_2$, $—P(R^δ)_2$ or $—SR^δ$; n15 is an integer of 0 or more; $R^δ$ is a hydrogen atom, an alkyl group having 1 to 30 carbon atom(s) that optionally has a substituent or an aryl group having 6 to 50 carbon atoms that optionally has a substituent; m16 is an integer of 1 or more; when a plurality of $Q^5$ are present, each $Q^5$ may be the same as or different from each other; when a plurality of $Y^5$ are present, each $Y^5$ may be the same as or different from each other; when a plurality of n15 are present, each n15 may be the same as or different from each other when a plurality of $R^δ$ are present, each $R^δ$ may be the same as or different from each other; and when a plurality of m16 are present, each m16 may be the same as or different from each other).

When a structural unit other than $-A_a-$ is included in addition to the structural unit represented by $-A^a-$ in the Formula (26) in the polymer compound used in the present invention, a compound having two substituents that can participate in the condensation polymerization and that becomes the structural unit other than $-A^a-$, may be used, and the compound may be polymerized by condensation polymerization in a co-existing state with the compound represented by Formula (26).

Examples of the compound having two substituents that can participate in the condensation polymerization include a compound represented by Formula (29).

$$X^3\text{-}A^b\text{-}X^4 \quad (29)$$

(In Formula (29), $A^b$ is a structural unit represented by a divalent aromatic group that optionally has a substituent represented by $Ar^8$ or a divalent aromatic amine residue that optionally has a substituent; and $X^3$ and $X^4$ are each independently a group that can participate in the condensation polymerization).

As described above, the compound represented by Formula (29) in addition to the compound represented by Formula (26) are polymerized by condensation polymerization, and thereby the polymer compound further having the structural unit represented by -$A^b$-used in the present invention can be produced.

Examples of the groups that can participate in the condensation polymerization in Formula (26) and Formula (29) ($X^1$, $X^2$, $X^3$, and $X^4$) include a hydrogen atom, a halogen atom, an alkylsulfonate group, an arylsulfonate group, an arylalkylsulfonate group, a boric acid ester residue, a sulfonium methyl group, a phosphonium methyl group, a phosphonate methyl group, a monohalogenated methyl group, —$B(OH)_2$, a formyl group, a cyano group, and a vinyl group.

Examples of the halogen atom that can be selected as a group that can participate in the condensation polymerization include a fluorine atom, a chlorine atom, a bromine atom, and an iodine atom.

Examples of the alkylsulfonate group that can be selected as a group that can participate in the condensation polymerization include a methanesulfonate group, an ethane sulfonate group, a trifluoromethanesulfonate group, and examples of the arylsulfonate group include a benzenesulfonate group and a p-toluenesulfonate group.

Examples of the arylalkylsulfonate group that can be selected as a group that can participate in the condensation polymerization include a benzylsulfonate group.

Examples of the boric acid ester that can be selected as a group that can participate in the condensation polymerization include a group represented by the following formulas.

[Chemical Formula 165]

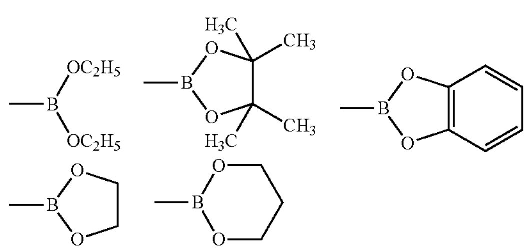

Examples of the sulfonium methyl group that can be selected as a group that can participate in the condensation polymerization include a group represented by the following formula:

$$—CH_2S^+Me_2E^- \text{ or } —CH_2S^+Ph_2E^-$$

wherein E is a halogen atom; Ph is a phenyl group; and the following formulas have the same definition.

Examples of the phosphonium methyl group that can be selected as a group that can participate in the condensation polymerization include a group represented by the following formula:

$$—CH_2P^+Ph_3E^-$$

wherein E is a halogen atom.

Examples of the phosphonate methyl group that can be selected as a group that can participate in the condensation polymerization include a group represented by the following formula:

$$—CH_2PO(OR)_2$$

wherein R is an alkyl group, an aryl group, or an arylalkyl group.

Examples of the monohalogenated methyl group that can be selected as a group that can participate in the condensation polymerization include a methyl fluoride group, a methyl chloride group, a methyl bromide group, and a methyl iodide group.

A preferable group as a group that can participate in the condensation polymerization differs depending on types of polymerization reactions. In the case of polymerization reaction in which a zero-valent nickel complex is used such as the Yamamoto coupling reaction, examples of the preferable group include a halogen atom, an alkylsulfonate group, an arylsulfonate group, and an arylalkylsulfonate group. In the case of polymerization reaction in which a nickel catalyst or a palladium catalyst is used such as the Suzuki coupling reaction, examples of the preferable group include an alkylsulfonate group, a halogen atom, a boric acid ester residue, and —$B(OH)_2$. In the case of oxidative polymerization using an oxidizing reagent or electrochemical oxidative polymerization, examples of the preferable group include a hydrogen atom.

When the polymer compound used in the present invention is produced, for example, a method for polymerizing in which the compound (the monomer) represented by Formula (26) with the compound (the monomer) represented by Formula (29), if needed, is dissolved in an organic solvent and then the monomer is reacted at a temperature of the melting point of the organic solvent or higher and the boiling of the organic solvent point or lower using an alkaline or an adequate catalyst may be employed. Examples of the method for polymerization include a method described in "Organic Reactions, Vol. 14, 270-490, John Wiley & Sons, Inc., 1965"; a method described in "Organic Syntheses, Collective Volume VI, 407-411, John Wiley & Sons, Inc., 1988"; a method described in "Chem. Rev., Vol. 95, 2457 (1995)"; a method described in "J. Organomet. Chem. Vol. 576, 147 (1999)", and a method described in "Macromol. Chem., Macromol. Symp., Vol. 12, 229 (1987)".

When the polymer compound used in the present invention is produced, a known condensation polymerization reaction may be employed depending on the group that can participate in the condensation polymerization. Examples of the condensation polymerization reaction described above include a method in which the corresponding monomer is polymerized by the Suzuki coupling reaction, a method in which the corresponding monomer is polymerized by the Grignard reaction, a method in which the corresponding monomer is polymerized using a zero-valent nickel complex (an Ni(0) complex), a method in which the corresponding monomer is polymerized using an oxidizing agent such as $FeCl_3$, a method in which the corresponding monomer is electrochemically polymerized by oxidation polymerization, and a method in which an intermediate polymer having an adequate leaving group is decomposed. Among these polymerization reactions, the method in which the corresponding monomer is polymerized by the Suzuki coupling reaction, the method in which the corresponding monomer is polymerized by the Grignard reaction, and the method in which the corresponding monomer is polymerized using a zero-valent nickel complex are preferable because the structure of the obtained polymer compound can be easily controlled.

As another embodiment of a preferable method for producing the polymer compound used in the present invention, a method in which a raw material monomer selected from the group consisting of the halogen atom, the alkylsulfonate group, the arylsulfonate group, and the arylalkylsulfonate group as a group that can participate in the condensation polymerization is polymerized in the presence of the zero-valent nickel complex by the condensation polymerization to produce the polymer compound is included. Examples of the raw material monomer that is used in such methods include a dihalogenated compound, a bis(alkylsulfonate) compound, a bis(arylsulfonate) compound, a bis(arylalkylsulfonate) compound, a halogen-alkylsulfonate compound, a halogen-arylsulfonate compound, a halogen-arylalkylsulfonate compound, an alkylsulfonate-arylsulfonate compound, an alkylsulfonate-arylalkylsulfonate compound, and an arylsulfonate-arylalkylsulfonate compound.

Examples of further another preferable embodiment of the method for producing the polymer compound used in the present invention include a method in which a raw material monomer that has a group selected from the group consisting of a halogen atom, an alkylsulfonate group, an arylsulfonate group, an arylalkylsulfonate group, —$B(OH)_2$, and a boric acid ester residue as a group that can participate in the condensation polymerization and in which a ratio of the total number of moles of the halogen atom, the alkylsulfonate group, the arylsulfonate group, and the arylalkylsulfonate group (J) to the total number of moles of —$B(OH)_2$ and the boric acid ester residue (K) is substantially 1 (usually, K/J is in a range of 0.7 to 1.2) is polymerized by condensation polymerization in the presence of a nickel catalyst or a palladium catalyst.

At the time of producing the polymer compound, an organic solvent may be used. Although the organic solvent is selected depending on a used compound or a reaction, generally, the organic solvent for which sufficient deoxidation treatment is carried out in order to reduce side reactions is preferably used. When the polymer compound is produced using the organic solvent, the reaction preferably proceeds under inert atmosphere. In the organic solvent, dehydration treatment as well as the deoxidation treatment is preferably carried out. Here, the dehydration treatment is not needed in a reaction carried out in two-phase system with water such as the Suzuki coupling reaction.

Examples of the organic solvent described above include the followings:

saturated hydrocarbons such as pentane, hexane, heptane, octane, and cyclohexane, and unsaturated hydrocarbons such as benzene, toluene, ethylbenzene, and xylene;

alcohols such as methanol, ethanol, propanol, isopropanol, butanol, and tert-butyl alcohol;

carboxylic acids such as formic acid, acetic acid, and propionic acid;

ethers such as dimethyl ether, diethyl ether, methyl-tert-butyl ether, tetrahydrofuran (hereinafter, abbreviated as THF), tetrahydropyran, and dioxane;

amines such as trimethylamine, triethylamine, N,N,N',N'-tetramethylethylenediamine, and pyridine, and amides such as N,N-dimethylformamide, N,N-dimethylacetamide, N,N-diethylacetamide, and N-methylmorpholine oxide.

These organic solvents may be used singly or in combination of two or more solvents. Among these organic solvents, the ethers are preferable and THF and diethyl ether are more preferable in terms of reactivity. Toluene and xylene are preferable in terms of reaction rate.

At the time of producing the polymer compound, an alkaline or a catalyst is preferably added to a reaction liquid in order to react the raw material monomer. Such an alkaline or a catalyst may be selected depending on an employed polymerization method, and the like. As such an alkaline or a catalyst, an alkaline or a catalyst that is sufficiently dissolved in the organic solvent used for the reaction is preferable. Examples of methods for mixing the alkaline or the catalyst include a method in which a solution of an alkaline or a catalyst is slowly added to a reaction liquid, with stirring under inert atmosphere such as argon and nitrogen, and a method in which the reaction liquid is slowly added to the solution of the alkaline or the catalyst.

In the polymer compound used in the present invention, the terminal group is optionally protected with a stable group. When an active group for polymerization remains at the terminal group, a light-emission property and/or a lifetime property of the obtained electroluminescent device may deteriorate. When the polymer compound used in the present invention is a conjugated polymer compound and its terminal group is protected with a stable group as described above, in a structure in which the terminal group is protected with the stable group, the polymer compound preferably has a conjugated bond that are sequential from the conjugated structure in the main chain of the polymer compound. Examples of this conjugated structure include a structure bonding to an aryl group or a heterocyclic group through a carbon-carbon bond. Examples of this stable group that protects the terminal group include a substituent such as a monovalent aromatic compound group represented by a structural formula of Chemical Formula 10 in Japanese Patent Application Laid-open No. H9-45478.

Hereinafter, the method in which the polymer compound not including ions is synthesized in a first process and the polymer compound including ions is synthesized from the polymer compound not including ions in a second process, which is described above as the preferable method for producing the polymer compound used in the present invention, will be described.

Examples of more preferable embodiment of the method include a method in which a polymer compound not including cations is synthesized in a first process and a polymer compound including cations is synthesized from the polymer compound not including the cations in a second process. In this method, examples of the first process include a method in which a polymer compound not including cations is polymerized by the condensation polymerization reaction described above. Examples of the second process include a method in which the polymer compound having no cations obtained in the first process and a metal hydroxide, a metal carbonate, an alkylammonium hydroxide, or the like, which is dissolved in a solvent such as water or an organic solvent if needed, are reacted at a temperature of the melting point of an organic solvent or higher and the boiling point of the organic solvent or lower.

Examples of more preferable another aspect of the method include a method in which a polymer compound not including anions is synthesized in a first process and a polymer compound including anions is synthesized from the polymer compound not including the anions in a second process. In this method, examples of the first process include a method in which a polymer compound having no anions is polymerized by the condensation polymerization reaction described above. Examples of the second process include a method in which the polymer compound having no anions obtained in the first process and a alkyl halide, $SbF_5$, or the like, which is dissolved in a solvent such as water or an organic solvent if needed, are reacted at a temperature of the melting point of an organic solvent or higher and the boiling point of the organic solvent or lower.

[2. Ionic Compound Represented by Formula (23)]

The composition of the present invention includes an ionic compound (that is, a salt) represented by Formula (23). Hereinafter, the ionic compound will be described.

In Formula (23), $M^3$ is a metallic cation or an ammonium cation that optionally has a substituent. $Z^3$ is $F^-$, $Cl^-$, $Br^-$, $I^-$, $OH^-$, $B(R^p)_4^-$, $R^pSO_3^-$, $R^pCOO^-$, $R^pO^-$, $ClO^-$, $ClO_2^-$, $ClO_3^-$, $ClO_4^-$, $SCN^-$, $CN^-$, $NO_3^-$, $CO_3^{2-}$, $SO_4^{2-}$, $HSO_4^-$, $PO_4^{3-}$, $HPO_4^{2-}$, $H_2PO_4^-$, $BF_4^-$, or $PF_6^-$. a5 is an integer of 1 or more. b1 is an integer of 1 or more. a5 and b1 are selected so that a charge of the ionic compound represented by Formula (23) is zero. $R^p$ is a monovalent organic group that optionally has a substituent. When a plurality of $R^p$ are present, each $R^p$ may be the same as or different from each other.

In Formula (23), $M^3$ is a metallic cation or an ammonium cation that optionally has a substituent. The metallic cation represented by $M^3$ is preferably a monovalent, divalent, or trivalent metallic cation. Examples of the monovalent, divalent, or trivalent metallic cation include a cation of Li, a cation of Na, a cation of K, a cation of Rb, a cation of Cs, a cation of Be, a cation of Mg, a cation of Ca, a cation of Ba, a cation of Ag, a cation of Al, a cation of Bi, a cation of Cu, a cation of Fe, a cation of Ga, a cation of Mn, a cation of Pb, a cation of Sn, a cation of Ti, a cation of V, a cation of W, a cation of Y, a cation of Yb, a cation of Zn, and a cation of Zr. Alkali metal cations such as $Li^+$, $Na^+$, $K^+$, $Rb^+$, and $Cs^+$ and alkaline earth metal cations such as $Mg^{2+}$ and $Ca^{2+}$ are preferable. Examples of the substituent that the ammonium cation optionally has include an alkyl group having 1 to 10 carbon atom(s) such as a methyl group, an ethyl group, a propyl group, an isopropyl group, an n-butyl group, an isobutyl group, a tert-butyl group, and an aryl group having 6 to 30 carbon atoms such as a phenyl group and a 1-naphthyl group.

In Formula (23), $Z^3$ is $F^-$, $Cl^-$, $Br^-$, $I^-$, $OH^-$, $B(R^p)_4^-$, $R^pSO_3^-$, $R^pCOO^-$, $R^pO^-$, $ClO^-$, $ClO_2^-$, $ClO_3^-$, $ClO_4^-$, $SCN^-$, $CN^-$, $NO_3^-$, $CO_3^{2-}$, $SO_4^{2-}$, $HSO_4^-$, $PO_4^{3-}$, $HPO_4^{2-}$, $H_2PO_4^-$, $BF_4^-$, or $PF_6^-$.

$R^p$ is a monovalent organic group that optionally has a substituent. Examples of the organic group include an alkyl group having 1 to 10 carbon atom(s) such as a methyl group, an ethyl group, a propyl group, an isopropyl group, an n-butyl group, an isobutyl group, a tert-butyl group, and an aryl group having 6 to 30 carbon atoms such as a phenyl group and a 1-naphthyl group.

In Formula (23), a5 is an integer of 1 or more, and b1 is an integer of 1 or more. a5 and b1 are selected so that a charge of the ionic compound represented by Formula (23) is zero.

The ionic compound represented by Formula (23) is preferably an ionic compound selected from the group consisting of metal hydroxides such as LiOH, NaOH, KOH, RbOH, and CsOH; metal halides such as LiF, NaF, KF, and CsF; metal carbonates such as $Li_2CO_3$, $Na_2CO_3$, $K_2CO_3$, and $Cs_2CO_3$, metal carboxylates such as $R^pCOOLi$, $R^pCOONa$, $R^pCOOK$, and $R^pCOOCs$; metal sulfates such as $R^pSO_3Li$, $R^pSO_3Na$, $R^pSO_3K$, $R^pSO_3Cs$, $Li_2SO_3$, $Na_2SO_3$, $K_2SO_3$, and $Cs_2SO_3$; metal alkoxides such as $R^pOLi$, $R^pONa$, $R^pOK$, and $R^pOCs$; and ammonium salts such as $(CH_3)_4NBr$, $(C_2H_5)_4NBr$, $(C_4H_9)_4NBr$, and $(C_6H_5)_4NBr$.

[3. Composition]

The composition of the present invention includes the polymer compound and the ionic compound. The composition of the present invention includes the polymer compound having one or more structural units selected from the group constituting of a structural unit represented by Formula (1), a structural unit represented by Formula (3), a structural unit represented by Formula (5), a structural unit represented by Formula (16), a structural unit represented by Formula (18), a structural unit represented by Formula (20), and a structural unit represented by Formula (22) and the ionic compound represented by Formula (23). The composition of the present invention optionally includes two or more of the polymer compounds and optionally includes two or more of the ionic compounds.

A ratio of the ionic compound represented by Formula (23) included in the composition of the present invention is preferably 0.1% by weight to 100% by weight, more preferably 0.1% by weight to 50% by weight, and further preferably 0.1% by weight to 30% by weight to the weight of the polymer compound included in the composition in terms of film formability at the time of forming a layer including the composition of the present invention. The ratio is preferably 1% by weight to 100% by weight, more preferably 5% by weight to 100% by weight, and further preferably 10% by weight to 100% by weight to the polymer compound in terms of charge injection properties and/or charge transport properties at the time of applying the layer including the composition of the present invention as a charge injection layer and/or a charge transport layer of an electronic device.

Examples of the method for producing the composition of the present invention include a method in which the polymer compound used in the present invention and the ionic compound represented by Formula (23) are mixed in a solid state; a method in which a solution of the polymer compound used in the present invention and a solution of the ionic compound represented by Formula (23) are mixed in a solution state; a method in which the ionic compound represented by Formula (23) is added to the solution of the polymer compound used in the present invention; and a method in which the ionic compound represented by Formula (23) is added at the time of synthesizing the polymer compound used in the present invention.

When a layer including the composition of the present invention is used for an electroluminescent device, an device that emits light in high brightness can be obtained because the composition has an excellent injection property and transport property of charges.

The layer including the composition of the present invention is preferably substantially nonluminous. Here, that a layer including a certain composition is "substantially nonluminous" is meant the following. First, in Example 26 described below, an electroluminescent device E is prepared in a similar manner to Example 26 except that a composition that is a measurement target is used instead of a composition 1. On the other hand, an electroluminescent device $C^1$ is prepared as described in Comparative Example 1 described below. The electroluminescent device E and the electroluminescent device C1 only differs in that the electroluminescent device includes a layer including the composition being a measurement target or not. Subsequently, a forward direction voltage of 10 V is applied to the electroluminescent device E and the electroluminescent device C1, and each emission spectrum is measured. In the obtained emission spectrum of the electroluminescent device C1, a wavelength λ that provides a maximum peak is determined. The obtained emission spectrum of the electroluminescent device C1 is normalized by setting emission intensity at the wavelength λ to 1, and an amount of normalized emission $S_0$ is calculated by integrating the emission spectrum with respect to the wavelength. Also, the obtained emission spectrum of the electroluminescent device E is normalized by setting emission intensity at the wavelength λ to 1, and an amount of normalized emission S is calculated by integrating the emission spectrum with respect to the wavelength. When a value (%) calculated by $(S-S_0)/S_0\times100$ is 30% or less, that is, when an increase in the amount of normalized emission of the electroluminescent device E that includes the composition being the measurement target compared to the amount of normalized emission of the electroluminescent device C1 that does not include the composition is 30% or less, the layer including the composition is substantially nonluminous. The value calculated by $(S-S_0)/S_0\times100$ is preferably 15% or less and more preferably 10% or less.

<Electronic Device>

Hereinafter, an electronic device using the composition of the present invention will be described.

The electronic device of the present invention has a layer including the composition of the present invention. The layer including the composition of the present invention can be restated as an organic film including the composition of the present invention. The electronic device of the present invention usually includes a first electrode, a second electrode, and a light emitting layer or a charge separation layer, in addition to the layer including the composition of the present invention. The layer including the composition of the present invention is preferably an organic film layer including the composition of the present invention. The light emitting layer or the charge separation layer is located at a position between the first electrode and the second electrode. The layer including the composition of the present invention is usually located at a position between the light emitting layer or the charge separation layer and the first electrode.

The electronic device of the present invention can be used for devices such as an electroluminescent device and a photovoltaic cell. When the electronic device of the present invention is used for the electroluminescent device (hereinafter, may be referred to as an "electroluminescent device of the present invention"), the electronic device has a light emitting layer. When the electronic device of the present invention is used for the photovoltaic cell (hereinafter, may be referred to as a "photovoltaic cell of the present invention"), the electronic device has a charge separation layer.

<Electroluminescent Device>

Hereinafter, the electroluminescent device of the present invention will be described. The electroluminescent device of the present invention is an electroluminescent device having a layer including the composition of the present invention, and can be restated as an electroluminescent device having the composition of the present invention.

The electroluminescent device of the present invention may have a cathode, an anode, a light emitting layer located at the position between the cathode and the anode, and the layer including the polymer compound used in the present invention located at the position between the light emitting layer and the cathode or the anode. The electroluminescent device of the present invention may have a substrate as an optional constitution element. The constitution of the electroluminescent device may be made by providing the cathode, the anode, the light emitting layer, the layer including the composition of the present invention, and an optional constitution element over the surface of the substrate.

As the layer constitution of the electroluminescent device of present invention include the following each embodiment:

(1) an embodiment in which an anode is provided on a substrate; a light emitting layer is stacked as an upper layer on the anode; a layer including the composition of the present invention is stacked as an upper layer on the light emitting layer; and a cathode is further stacked as an upper layer on the layer including the composition of the present invention;

(2) an embodiment in which an anode is provided on a substrate; a layer including the composition of the present invention is stacked as an upper layer on the anode; a light emitting layer is stacked; and a cathode is further stacked as an upper layer on the light emitting layer;

(3) an embodiment in which an anode is provided on a substrate; a layer including the composition of the present invention is stacked as an upper layer on the anode; a light emitting layer is stacked; a layer including the composition of the present invention is stacked as an upper layer on the light emitting layer; and a cathode is further stacked as an upper layer on the layer including the composition of the present invention;

(4) an embodiment in which a cathode is provided on a substrate; a layer including the composition of the present invention is stacked as an upper layer on the cathode; a light emitting layer is stacked as an upper layer on the layer including the composition of the present invention; and an anode is further stacked as an upper layer on the light emitting layer;

(5) an embodiment in which a cathode is provided on a substrate; a light emitting layer is stacked as an upper layer on the cathode; a layer including the composition of the present invention is stacked as an upper layer on the light emitting layer; and an anode is further stacked as an upper layer on the layer including the composition of the present invention; and (6) an embodiment in which a cathode is provided on a substrate; a layer including the composition of the present invention is stacked as an upper layer on the cathode; a light emitting layer is stacked as an upper layer on the layer including the composition of the present invention; a layer including the composition of the present invention is stacked as an upper layer on the light emitting layer; and an anode is further stacked as an upper layer on the layer including the composition of the present invention.

In each of the embodiments (1) to (6), a layer having other function such as a protection layer, a buffer layer, a reflecting layer, and a hole block layer may be further provided. The constitution of the electroluminescent device will be separately described below in detail. When the electroluminescent device is covered with a sealing film or a sealing substrate, a light emitting device in which the electroluminescent device is isolated from outside air is formed.

[1. Layer Including Composition of the Present Invention (Organic Film of the Present Invention)]

In the layer including the composition of the present invention, the composition of the present invention is optionally mixed with a known material. Examples of the known material include a polymer charge transport material, a low molecular charge transport material, conductive carbons such as graphene, a fullerene, and a carbon nanotube, electric conductive compounds such as a metal, an alloy, a metal oxide, and a metal sulfide, and a mixture thereof. As the charge transport material, a material constituting the hole transport layer and the electron transport layer may be used. As the metal, the alloy, the metal oxide, and the metal sulfide, a material constituting the anode or a material constituting the cathode may be used. An organic material not having a light emitting function or a charge transport function is optionally mixed within the range where the light emitting function as the electroluminescent device is not impaired.

The electroluminescent device of the present invention may be any type of electroluminescent device such as what is called a bottom emission type electroluminescent device that lets in light from the substrate side, what is called a top emission type electroluminescent device that lets in light from the opposite side of the substrate, and a both sides lighting type electroluminescent device.

Examples of a method for forming the layer including the composition of the present invention include a method in which a film is formed using a solution containing the composition.

Examples of solvents that is used for film formation from the solution described above include a solvent selected from the group consisting of water, alcohols, ethers, esters, nitrile compounds, nitro compounds, alkyl halides, aryl halides, thiols, sulfides, sulfoxides, thioketones, amides, and carboxylic acids and a mixed solvent made of two or more solvents selected from the group. Among them, the solvent having a solubility parameter of 9.3 or more is preferable. Examples of the solvent (a value in each parenthesis represents a value of a solubility parameter of each solvent) having a solubility parameter of 9.3 or more include water (21.0), methanol (12.9), ethanol (11.2), 2-propanol (11.5), 1-butanol (9.9), tert-butyl alcohol (10.5), acetonitrile (11.8), 1,2-ethanediol (14.7), N,N-dimethylformamide (11.5), dimethylsulfoxide (12.8), acetic acid (12.4), nitrobenzene (11.1), nitromethane (11.0), 1,2-dichloroethane (9.7), dichloromethane (9.6), chlorobenzene (9.6), bromobenzene (9.9), dioxane (9.8), propylene carbonate (13.3), pyridine (10.4), carbon disulfide (10.0), and a mixed solvent of these solvents. (For the values of the solubility parameters, refer to "Solvent Handbook 14th edition, Kodansha Ltd.).

Here, a solubility parameter ($\delta_m$) of the mixed solvent of two solvents (referred to as Solvent 1 and Solvent 2) can be determined by $\delta_m=\delta_1\times\phi_1+\delta_2\times\phi_2$ where $\delta_1$ is a solubility parameter of Solvent 1; $\phi_1$ is a volume fraction of Solvent 1; $\delta_2$ is a solubility parameter of Solvent 2; $\phi_2$ is a volume fraction of Solvent 2.

Examples of the method for forming the film from the solution include a coating method and a printing method. Preferable examples include a spin coating method, a casting method, a bar coating method, a roll coating method, a wire bar coating method, a dip coating method, a slit coating method, a cap coating method, a spray coating method, a capillary coating method, a nozzle coating method, a micro gravure printing method, a gravure printing method, a screen printing method, a flexographic printing method, an offset printing method, an inkjet printing method, a dispenser printing method, and a reverse printing method.

An optimum value of the thickness of the layer including the composition of the present invention differs depending on used compositions and the thickness may be selected so that values of driving voltage and light emitting efficiency are adequate. The thickness is usually 1 nm to 1 μm, preferably 2 nm to 500 nm, and more preferably 2 nm to 200 nm. In terms of protection of the light emitting layer, the thickness is preferably 5 nm to 1 μm.

[2. Layer Constitution of Electroluminescent Device]

The electroluminescent device generally has the cathode, the anode, the light emitting layer located at the position between the cathode and the anode, and, in addition, other constituent may be included.

For example, the electroluminescent device may have one or more layers of a hole injection layer and a hole transport layer between the anode and the light emitting layer. When the hole injection layer exists, the electroluminescent device may have the hole transport layer between the light emitting layer and the hole injection layer.

The electroluminescent device may have one or more layers of the electron injection layer and the electron transport layer between the cathode and the light emitting layer. When the electron injection layer exists, the electroluminescent device may have the electron transport layer between the light emitting layer and the electron injection layer.

The layer including the composition of the present invention may be used for a layer such as the hole injection layer, the hole transport layer, the electron injection layer, and the electron transport layer. When the layer including the composition of the present invention is used for one layer or two or more layers selected from the hole injection layer and the hole transport layer, the first electrode is the anode and the second electrode is the cathode. When the layer including the composition of the present invention is used for one layer or two or more layers selected from the electron injection layer and the electron transport layer, the first electrode is the cathode and the second electrode is the anode.

Here, the anode is an electrode that supplies holes to a layer such as the hole injection layer, the hole transport layer, and the light emitting layer. The cathode is an electrode that supplies electrons to a layer such as the electron injection layer, the electron transport layer, and the light emitting layer.

The light emitting layer means a layer having a function of receiving holes from a layer adjacent to the anode side and receiving electrons from a layer adjacent to the cathode side at the time of applying an electric field, a function of moving the received charges (the holes and the electrons) by electric field force, and a function of providing a field for recombination of the electrons and the holes and leading the recombination to light emission.

The electron injection layer means a layer adjacent to the cathode and a layer having a function of receiving electrons from the cathode. Further, the electron injection layer means a layer having any one of a function of transporting the electrons, a function of blocking holes injected from the anode, and a function of supplying the electrons to the light emitting layer, if needed. The electron transport layer means a layer mainly having a function of transporting electrons. Further, the electron transport layer means a layer having any one of a function of receiving electrons from the cathode, a function of blocking holes injected from the anode, and a function of supplying the electrons to the light emitting layer, if needed.

The hole injection layer means a layer adjacent to the anode and a layer having a function of receiving holes from the anode. Further, the hole injection layer means a layer having any one of a function of transporting the holes, a function of supplying the holes to the light emitting layer, and a function of blocking the electrons injected from the cathode, if needed. The hole transport layer means a layer mainly having a function of transporting holes. Further, the hole transport layer means a layer having any one of a function of receiving the holes from the anode, a function of supplying the holes to the light emitting layer, and a function of blocking the electrons injected from the cathode, if needed.

The electron transport layer and the hole transport layer may be collectively called the charge transport layer. The electron injection layer and the hole injection layer may be collectively called the charge injection layer.

In other words, the electroluminescent device using the composition of the present invention may have a layer constitution (a) described below or may also have a layer constitution in which any one layer of the hole injection layer, the hole transport layer, the electron transport layer, and the electron injection layer is removed from the layer constitution (a). In the layer constitution (a), the layer including the composition of the present invention may be used as one or more layers selected from the group consisting of the hole injection layer, the hole transport layer, the electron injection layer, and the electron transport layer.

(a) Anode-Hole injection layer-(Hole transport layer)-Light emitting layer-(Electron transport layer)-Electron injection layer-Cathode Here, the sign "-" means that each layer is adjacently stacked. "(Hole transport layer)" means a layer constitution that includes one or more hole transport layers. "(Electron transport layer)" means a layer constitution that includes one or more electron transport layers. This description is applicable to the description of layer constitutions described below.

The electroluminescent device using the composition of the present invention may have two light emitting layers in one layered structure. In this case, the electroluminescent device may have the layer constitution (b) described below or may also have a layer constitution in which one or more layers of the hole injection layer, the hole transport layer, the electron transport layer, the electron injection layer, and the electrode is removed from the layer constitution (b). In the layer constitution (b), the layer including the composition of the present invention is used as a layer existing between the anode and the light emitting layer nearest to the anode or a layer existing between the cathode and the light emitting layer nearest to the cathode.

(b) Anode-Hole injection layer-(Hole transport layer)-Light emitting layer-(Electron transport layer)-Electron injection layer-Electrode-Hole injection layer-(Hole transport layer)-Light emitting layer-(Electron transport layer)-Electron injection layer-Cathode The electroluminescent device using the composition of the present invention may have three or more light emitting layers in one layered structure. In this case, the electroluminescent device may have the layer constitution (c) described below or may also have a layer constitution in which one or more layers of the hole injection layer, the hole transport layer, the electron transport layer, the electron injection layer, and the electrode is removed from the layer constitution (c). In the layer constitution (c), the layer including the composition of the present invention is used as a layer existing between the anode and the light emitting layer nearest to the anode or a layer existing between the cathode and the light emitting layer nearest to the cathode.

(c) Anode-Hole injection layer-(Hole transport layer)-Light emitting layer-(Electron transport layer)-Electron injection layer-Repeating unit A-Repeating unit A . . . -Cathode Here, "Repeating unit A" means a unit of layer constitution of Electrode-Hole injection layer-(Hole transport layer)-Light emitting layer-(Electron transport layer)-Electron injection layer.

Preferable examples of the layer constitution of the electroluminescent device using the composition of the present invention include layer constitutions (d) to (n) described below. In the layer constitutions described below, the layer including the composition of the present invention may be used as one or more layers selecting from the group constituting of the hole injection layer, the hole transport layer, the electron injection layer, and the electron transport layer.

(d) Anode-Hole injection layer-Light emitting layer-Cathode (e) Anode-Light emitting layer-Electron injection layer-Cathode (f) Anode-Hole injection layer-Light emitting layer-Electron injection layer-Cathode (g) Anode-Hole injection layer-Hole transport layer-Light emitting layer-Cathode (k) Anode-Hole injection layer-Hole transport layer-Light emitting layer-Electron injection layer-Cathode (l) Anode-Light emitting layer-Electron transport layer-Electron injection layer-Cathode (m) Anode-Hole injection layer-Light emitting layer-Electron transport layer-Electron injection layer-Cathode (n) Anode-Hole injection layer-Hole transport layer-Light emitting layer-Electron transport layer-Electron injection layer-Cathode The layer including the composition of the present invention is preferably the electron injection layer or the electron transport layer. When the layer including the composition of the present invention is the electron injection layer or the electron transport layer, the first electrode is the cathode.

In order to improve adhesion to the electrode and/or in order to improve injection of charges (that is, holes or electrons) from the electrode, the electroluminescent device is optionally provided an insulating layer adjacent to the electrode. In order to improve adhesion at an interface and to prevent contamination, a thin buffer layer is optionally inserted at an interface of the charge transport layer (that is, the hole transport layer or the electron transport layer) or the light emitting layer. The order and the number of the stacked layer and a thickness of each layer can be determined in consideration of light emitting efficiency and/or device lifetime.

[3. Each Layer Constituting Electroluminescent Device]

Subsequently, materials and methods for forming each layer constituting the electroluminescent device of the present invention will be described in more detail.

[3.1. Substrate]

The substrate constituting the electroluminescent device of the present invention may be a substrate that is not chemically changed at the time of forming the electrode and forming a layer made of an organic compound. Examples of the substrate include a glass, a plastic, a polymer film, a metallic film, a silicon substrate, and a substrate made by stacking these materials. For the substrate, a commercially available substrate may be used or a substrate made by a known method may be used.

When the electroluminescent device constitutes pixels of a display device, a driver circuit for pixel driver may be provided on the substrate or a planarizing film may be provided on the driver circuit. A center line average roughness (Ra) of the planarizing film preferably satisfies $Ra<10$ nm.

Based on JIS-B0601-2001 in Japanese Industrial Standards (JIS), Ra can be measured with reference to, for example, JIS-B0651 to JIS-B0656 and JIS-B0671-1.

[3.2. Anode]

A work function at the surface of the anode at the side of the light emitting layer constituting the electroluminescent device of the present invention is preferably 4.0 eV or more in terms of a hole supply property to an organic semiconductor material used in a layer such as the hole injection layer, the hole transport layer, and the light emitting layer.

Examples of materials constituting the anode include a metal, an alloy, a conductive compound such as a metal oxide and a metal sulfide, and a mixture thereof. Preferable examples include conductive metal oxides such as tin oxide, zinc oxide, indium oxide, indium tin oxide (ITO), indium zinc oxide (IZO), and molybdenum oxide; metals such as gold, silver, chromium, and nickel; and a mixture of these conductive metal oxides and these metals.

The anode may be a single layer structure made of one or more of these materials, or may be a multi-layer structure made of a plurality of layers formed from the same composition or a plurality of layers formed from different compositions. When the anode has the multi-layer structure, a work function of the material at the outmost surface layer among the multiple layers at the light emitting layer side is preferably 4.0 eV or more.

Known methods are applicable for a method for producing the anode. Examples of the method include a vacuum deposition method, a sputtering method, an ion plating method, a plating method, and a method for forming a film from a solution (a mixed solution with a polymer binder may be used).

A thickness of the anode is usually 10 nm to 10 μm and preferably 40 nm to 500 nm.

In terms of prevention of electric connection from failure such as prevention of short circuit, a center line average roughness (Ra) of the surface of the anode at the side of light emitting layer preferably satisfies Ra<10 nm, and more preferably satisfies Ra<5 nm.

After the anode is produced by the method described above, the surface may be treated with UV ozone, a silane coupling agent, and a solution including an electron-acceptor compound such as 2,3,5,6-tetrafluoro-7,7,8,8-tetracyanoquinodimethane. Electrical connection between the anode and a layer in contact with the anode is improved by the surface treatment.

When the anode is used as a light reflection electrode in the electroluminescent device of the present invention, the anode preferably has a multi-layer structure in which a light reflection layer made of a high light reflective metal and a high work function material layer having a work function of 4.0 eV or more are coupled.

Examples of the constitution of the anode described above include the following constitutions.

(i) Ag—$MoO_3$ (ii) (Ag—Pd—Cu alloy)-(ITO and/or IZO)

(iii) (Al—Nd alloy)-(ITO and/or IZO)

(iv) (Mo—Cr alloy)-(ITO and/or IZO)

(v) (Ag—Pd—Cu alloy)-(ITO and/or IZO)-$MoO_3$

In order to obtain sufficient light reflectance, a thickness of the light reflection layer made of high light reflective metal such as Al, Ag, an Al alloy, an Ag alloy, and a Cr alloy is preferably 50 nm or more, and more preferably 80 nm or more. A thickness of the high work function material layer including a material having a work function of 4.0 eV or more such as ITO, IZO, and $MoO_3$ is usually in the range of 5 nm to 500 nm.

[3.3 Hole Injection Layer]

Examples of materials constituting the hole injection layer include the following materials in addition to the composition of the present invention:

carbazole derivatives, triazole derivatives, oxazole derivatives, oxadiazole derivatives, imidazole derivatives, fluorene derivatives, polyarylalkane derivatives, pyrazoline derivatives, pyrazolone derivatives, phenylenediamine derivatives, arylamine derivatives, starburst amines, phthalocyanine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine-based compounds, porphyrin-based compounds, polysilane-based compounds, poly (N-vinylcarbazole) derivatives, organic silane derivatives, and polymers containing one or more of these;

conductive metal oxides such as vanadium oxide, tantalum oxide, tungsten oxide, molybdenum oxide, ruthenium oxide, and an aluminum oxide;

conductive polymers and oligomers such as polyaniline, aniline-based copolymers, thiophene oligomers and polythiophene;

organic conductive materials such as poly(3,4-ethylenedioxythiophene), polystyrene sulfonic acid, and polypyrrole, and polymers including one or more of these organic conductive materials;

amorphous carbon;

acceptor organic compounds such as tetracyanoquinodimethane derivatives (for example, 2,3,5,6-tetrafluoro-7,7,8,8-tetracyanoquinodimethane), 1,4-naphthoquinone derivatives, diphenoquinone derivatives, and polynitro compounds; and silane coupling agents such as octadecyltrimethoxysilane.

The material may be a single component or a composition made of a plurality of components. The hole injection layer may be a single layer structure made of one or more of the materials described above, or may be a multi-layer structure made of a plurality of layers formed from the same composition or a plurality of layers formed from different compositions. The material shown as examples of a material constituting the hole transport layer may be used as a material constituting the hole injection layer.

Known methods are applicable for a method for producing the hole injection layer. When a hole injection material used for the hole injection layer is an inorganic material, a vacuum deposition method, a sputtering method, an ion plating method, and the like may be used, and when a low molecular organic material is used, a vacuum deposition method, a transfer method such as laser transfer and thermal transfer, a method of forming a film from a solution (a mixed solution with a polymer binder may be used), and the like may be used. When the hole injection material is a polymer organic material, the method of forming a film from a solution may be used.

When the hole injection material is the low molecular organic material such as the pyrazoline derivatives, the arylamine derivatives, the stilbene derivatives, and triphenyldiamine derivatives, the hole injection layer is preferably formed by the vacuum deposition method.

The hole injection layer may also be formed using a mixed solution in which a polymer compound binder and the low molecular organic material are dispersed.

As the mixed polymer compound binder, a compound that does not extremely inhibit charge transport and a compound that has not intense visible light absorption are preferable, and a compound that does not extremely inhibit charge transport and does not have intense visible light absorption is more preferable. Examples of the polymer compound binder include poly(N-vinylcarbazole), polyaniline and its derivatives, polythiophene and its derivatives, poly(p-phenylene vinylene) and its derivatives, poly(2,5-thienylenevinylene) and its derivatives, polycarbonate, polyacrylate, polymethyl acrylate, polymethyl methacrylate, polystyrene, polyvinyl chloride, and polysiloxane.

As a solvent for forming the film from the solution, a solvent that can dissolve the hole injection material may be used. Examples of the solvent include water, chlorine-containing solvents such as chloroform, methylene chloride, and dichloroethane; ether solvents such as THF; aromatic hydrocarbon solvents such as toluene and xylene; ketone solvents such as acetone and methyl ethyl ketone; and ester solvents such as ethyl acetate, butyl acetate, and ethyl cellosolve acetate.

Examples of the method for forming the film from the solution include a coating method and a printing method. Preferable examples include a spin coating method, a casting method, a micro gravure printing method, a gravure printing method, a bar coating method, a roll coating method, a wire bar coating method, a dip coating method, a slit coating method, a cap coating method, a spray coating method, a screen printing method, a flexographic printing method, an offset printing method, an inkjet printing method, a dispenser printing method, a nozzle coating method, a capillary coating method, and a reverse printing method. In terms of easy pattern forming, printing methods such as the gravure printing method, the screen printing method, the flexographic printing method, the offset printing method, the reverse printing method, and the inkjet printing method, or the nozzle coating method are preferably used.

At the time of sequentially forming an organic compound layer such as the hole transport layer and the light emitting layer after the hole injection layer, when both of the hole injection layer and the organic compound compound layer are formed by the coating method, a layered structure may not be formed because the previously applied layer (an under layer) is dissolved in the solvent that is contained in the solution of layer applying later. In this case, a method in which the under layer is insolubilized in the solvent may be used. Examples of the method in which the under layer is insolubilized in the solvent include a method in which a cross-linkable group is bonded to the polymer compound and the compound is crosslinked to insolubilize; a method in which a low molecular compound having a crosslinkable group having an aromatic ring represented by an aromatic bisazide is mixed as a cross-linking agent and the under layer is crosslinked to insolubilize; a method in which a low molecular compound having a crosslinkable group not having an aromatic ring represented by an acrylate group is mixed as a cross-linking agent and the under layer is crosslinked to insolubilize; a method in which the under layer is crosslinked by exposing with ultraviolet ray to insolubilize to an organic solvent used for producing the upper layer, and a method in which the under layer is crosslinked by heating to insolubilize to an organic solvent used for producing the upper layer. A heating temperature for heating the under layer is usually 100° C. to 300° C. and a heating time is usually 1 minute to 1 hour.

An other method than the method using crosslink for stacking the under layer without dissolving is a method in which solvents having different polarities are used for producing adjacent layers. Example of the method include a method in which a water-soluble polymer compound is used for the under layer and an oil-soluble polymer compound is used for the upper layer to insolubilize the underlayer when the upper layer is applied.

An optimum value of the thickness of the hole injection layer differs depending on used materials and the thickness may be selected so that values of driving voltage and light emitting efficiency are adequate. The thickness is usually 1 nm to 1 μm, preferably 2 nm to 500 nm, and more preferably 10 nm to 100 nm.

[3.4. Hole Transport Layer]

In the electroluminescent device of the present invention, examples of the material constituting the hole transport layer include, in addition to the composition of the present invention, carbazole derivatives, triazole derivatives, oxazole derivatives, oxadiazole derivatives, imidazole derivatives, fluorene derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine-based compounds, porphyrin-based compounds, polysilane-based compounds, poly(N-vinylcarbazole) derivatives, organic silane derivatives, and polymers containing one or more of these structures; conductive polymers and oligomers such as aniline-based copolymers, thiophene oligomers and polythiophene; and organic conductive materials such as polypyrrole.

The material may be a single component or a composition made of a plurality of components. The hole transport layer may be a single layer structure made of one or more of the materials described above, or may be a multi-layer structure made of a plurality of layers formed from the same composition or a plurality of layers formed from different compositions. The material shown as examples of a material constituting the hole injection layer may be also used as a material constituting the hole transport layer.

Examples of the method for producing the hole transport layer include a method similar to the method for producing the hole injection layer. Examples of the method for forming the film from the solution include a coating method and a printing method. Preferable examples include a spin coating method, a casting method, a bar coating method, a roll coating method, a wire bar coating method, a dip coating method, a slit coating method, a cap coating method, a spray coating method, a capillary coating method, a nozzle coating method, a micro gravure printing method, a gravure printing method, a screen printing method, a flexographic printing method, an offset printing method, an inkjet printing method, a dispenser printing method, and a reverse printing method. When a sublimation compound material is used as a material for the hole transport layer, a vacuum deposition method and a transfer method are usually used.

Examples of solvents that is used for film formation from a solution include the solvents shown as examples in the method for forming the film of the hole injection layer.

At the time of sequentially forming organic compound layers such as the light emitting layer after the hole transport layer by the coating method, when a previously applied layer (an under layer) is dissolved in the solvent that is contained in the solution of a layer applying later, the under layer can be insolubilized by a method similar to the method shown as examples in the method for forming the film of the hole injection layer.

An optimum value of the thickness of the hole transport layer differs depending on used materials and the thickness may be selected so that values of driving voltage and light emitting efficiency are adequate. The thickness is usually 1 nm to 1 μm, preferably 2 nm to 500 nm, and more preferably 5 nm to 100 nm.

[3.5. Light Emitting Layer]

When the light emitting layer includes the polymer compound in the electroluminescent device of the present invention, conjugated polymer compounds such as polyfluorene derivatives, polyparaphenylenevinylene derivatives, polyphenylene derivatives, polyparaphenylene derivatives, polythiophene derivatives, polydialkylfluorene, polyfluorene benzothiadiazole, and polyalkyl thiophene may be preferably used as the polymer compound.

The light emitting layer including the polymer compound include polymeric dye compounds such as perylene-based dyes, coumarin-based dyes, and rhodamine-based dyes and/or low molecular dye compounds such as rubrene, perylene, 9,10-diphenylanthracene, tetraphenylbutadiene, nile red, coumarin 6, and quinacridon. Examples of the light emitting layer including the polymer compound include naphthalene derivatives, anthracene and its derivatives, perylene and its derivatives, dyes such as polymethine-based dyes, xanthene-based dyes, coumarin-based dyes, and cyanine-based dyes; metal complexes of 8-hydroxyquinoline and its derivatives, aromatic amines, tetraphenylcyclopentadiene and its derivatives, and tetraphenylbutadiene and its derivatives, and metal complexes that emit phosphorescence such as tris-(2-phenylpyridine) iridium.

The light emitting layer may be constituted by a composition made of the non-conjugated polymer compound and the compound selected from the light emitting organic compounds such as the organic dye and the metal complex. Examples of the non-conjugated polymer compound include polyethylene, polyvinyl chloride, polycarbonate, polystyrene, polymethyl methacrylate, polybutyl methacrylate, polyesters, polysulfone, polyphenylene oxide, polybutadiene, poly(N-vinylcarbazole), hydrocarbon resins, ketone resins, phenoxy resins, polyamides, ethyl cellulose, vinyl acetate, ABS resins, polyurethane, melamine resins, unsaturated polyester resins, alkyd resins, epoxy resins, and silicone resins. The non-conjugated polymer compound may have one or more structures of a derivative or a compound selected from the group consisting of carbazole derivatives, triazole derivatives, oxazole derivatives, oxadiazole derivatives, imidazole derivatives, fluorene derivatives, polyarylalkane derivatives, pyrazoline derivatives, pyrazolone derivatives, phenylenediamine derivatives, arylamine derivatives, amino-substituted chalcone derivatives, styryllanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, and organic silane derivatives.

When the light emitting layer includes the low molecular compound, examples of the low molecular compound include low molecular dye compounds such as rubrene, perylene, 9,10-diphenylanthracene, tetraphenylbutadiene, nile red, coumarin 6, carbazole, and quinacridon; naphthalene derivatives, anthracene and its derivatives, perylene and its derivatives, dyes such as polymethine-based dyes, xanthene-based dyes, coumarin-based dyes, cyanine-based dyes, and indigo-based dyes; metal complexes of 8-hydroxyquinoline and its derivatives, metal complexes of phthalocyanine and its derivatives, aromatic amines, tetraphenylcyclopentadiene and its derivatives, and tetraphenylbutadiene and its derivatives.

The light emitting layer including the low molecular compound include a metal complex that emits phosphorescence. Examples of the metal complex include tris(2-phenylpyridine) iridium, a thienylpyridine ligand-containing iridium complex, a phenylquinoline ligand-containing iridium complex, and a triazacyclononane skeleton-containing terbium complex.

The material may be a single component or a composition made of a plurality of components. The light emitting layer may be a single layer structure made of one or more of the materials described above, or may be a multi-layer structure made of a plurality of layers formed from the same composition or a plurality of layers formed from different compositions.

Examples of the method for producing the light emitting layer include a method similar to the method for producing the hole injection layer. Examples of a method for forming a film from the solution include a coating method and a printing method. Preferable examples include a spin coating method, a casting method, a bar coating method, a roll coating method, a wire bar coating method, a dip coating method, a slit coating method, a cap coating method, a spray coating method, a capillary coating method, a nozzle coating method, a micro gravure printing method, a gravure printing method, a screen printing method, a flexographic printing method, an offset printing method, an inkjet printing method, a dispenser printing method, and a reverse printing method. When a sublimation compound material is used as a material for the light emitting layer, a vacuum deposition method and a transfer method are usually used.

Examples of solvents that is used for film formation from a solution include the solvents shown as examples in the method for forming the film of the hole injection layer.

At the time of sequentially forming organic compound layers such as the light electron transport layer after the light emitting layer by the coating method, when a previously applied layer (an under layer) is dissolved in the solvent that is contained in the solution of a layer applying later, the under layer can be insolubilized by a method similar to the method shown as examples in the method for forming the film of the hole injection layer.

An optimum value of the thickness of the light emitting layer differs depending on used materials and the thickness may be selected so that values of driving voltage and light emitting efficiency are adequate. The thickness is usually 5 nm to 1 μm, preferably 10 nm to 500 nm, and more preferably 30 nm to 200 nm.

[3.6. Electron Transport Layer]

In the electroluminescent device of the present invention, known materials in addition to the composition of the present invention may be used as a material constituting the electron transport layer. Examples of the material include triazole derivatives, oxazole derivatives, oxadiazole derivatives, imidazole derivatives, fluorene derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, anthraquinodimethane derivatives, anthrone derivatives, thiopyran dioxide derivatives, carbodiimide derivatives, fluorenylidenemethane derivatives, distyrylpyrazine derivatives, aromatic rings (for example, naphthalene and perylene) tetracarboxylic anhydride, phthalocyanine derivatives, metal complexes such as metal complexes of 8-quinolinol derivative, metal complexes including phthalocyanine as a ligand, metal complexes including benzoxazole as a ligand, and metal complexes including benzothiazole as a ligand, organic silane derivatives, metal complexes of 8-hydroxyquinoline and its derivatives, polyquinoline and its derivatives, polyquinoxaline and its derivatives, and polyfluorene and its derivatives. Among these materials, the triazole derivatives, the oxadiazole derivatives, benzoquinone and its derivatives, anthraquinone and its derivatives, the metal complexes of 8-hydroxyquinoline and its derivatives, polyquinoline and its derivatives, polyquinoxaline and its derivatives, and polyfluorene and its derivative are preferable.

The material may be a single component or a composition made of a plurality of components. The electron transport layer may be a single layer structure made of one or more of the materials described above, or may be a multi-layer structure made of a plurality of layers formed from the same composition or a plurality of layers formed from different compositions. The material shown as examples of a material constituting the electron injection layer may be also used as a material constituting the electron transport layer.

Examples of the method for forming the film of the electron transport layer include a method similar to the method for forming the film of the hole injection layer. Examples of a method for forming a film from the solution include a coating method and a printing method. Preferable examples include a spin coating method, a casting method, a bar coating method, a roll coating method, a wire bar coating method, a dip coating method, a slit coating method, a cap coating method, a spray coating method, a capillary coating method, a nozzle coating method, a micro gravure printing method, a gravure printing method, a screen printing method, a flexographic printing method, an offset printing method, an inkjet printing method, a dispenser printing method, and a reverse printing method. When a sublimation compound material is used for the electron transport layer, a vacuum deposition method, a transfer method, or the like is usually used.

Examples of solvents that is used for film formation from the solution include the solvents shown as examples in the method for forming the film of the hole injection layer.

At the time of sequentially forming organic compound layers such as the electron injection layer after the electron transport layer by the coating method, when a previously applied layer (an under layer) is dissolved in the solvent that is contained in the solution of a layer applying later, the under layer can be insolubilized by a method similar to the method shown as examples in the method for forming the film of the hole injection layer.

An optimum value of the thickness of the electron transport layer differs depending on used materials and the thickness may be selected so that values of driving voltage and light emitting efficiency are adequate. The thickness is usually 1 nm to 1 μm, preferably 2 nm to 500 nm, and more preferably 5 nm to 100 nm.

[3.7. Electron Injection Layer]

In the electroluminescent device of the present invention, known materials in addition to the composition of the present invention may be used as a material constituting the electron injection layer. Examples of the material include triazole derivatives, oxazole derivatives, oxadiazole derivatives, imidazole derivatives, fluorene derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, anthraquinodimethane derivatives, anthrone derivatives, thiopyran dioxide derivatives, carbodiimide derivatives, fluorenylidenemethane derivatives, distyrylpyrazine derivatives, aromatic rings (for example, naphthalene and perylene) tetracarboxylic acid anhydride, phthalocyanine derivatives, metal complexes (for example, metal complexes of 8-quinolinol derivatives, metal phthalocyanine, metal complexes including benzoxazole or benzothiazole as a ligand) and organic silane derivatives.

The material may be a single component or a composition made of a plurality of components. The electron injection layer may be a single layer structure made of one or more of the materials described above, or may be a multi-layer structure made of a plurality of layers formed from the same composition or a plurality of layers formed from different compositions. The material shown as examples of the material constituting the electron transport layer may be also used as a material constituting the electron injection layer.

Examples of the method for forming the film of the electron injection layer include a method similar to the method for forming the film of the hole injection layer. Examples of a method for forming a film from the solution include a coating method and a printing method. Preferable examples include a spin coating method, a casting method, a bar coating method, a roll coating method, a wire bar coating method, a dip coating method, a slit coating method, a cap coating method, a spray coating method, a capillary coating method, a nozzle coating method, a micro gravure printing method, a gravure printing method, a screen printing method, a flexographic printing method, an offset printing method, an inkjet printing method, a dispenser printing method, and a reverse printing method. When a sublimation compound material is used as a material for the electron injection layer, a vacuum deposition method and a transfer method are usually used.

Examples of solvents that is used for film formation from the solution include the solvents shown as examples in the method for forming the film of the hole injection layer.

An optimum value of the thickness of the electron injection layer differs depending on used materials and the thickness may be selected so that values of driving voltage and light emitting efficiency are adequate. The thickness is usually 1 nm to 1 μm, preferably 2 nm to 500 nm, and more preferably 5 nm to 100 nm.

[3.8. Cathode]

The cathode may be a single layer structure made of one or more of the materials, or may be a multi-layer structure made of a plurality of layers formed from the same composition or a plurality of layers formed from different compositions.

When the cathode is the single layer structure, examples of the material constituting the cathode include low-resistance metals such as gold, silver, copper, aluminum, chromium, tin, lead, nickel, and titanium; alloys including one or more metal selected from these low-resistance metals, conductive metal oxides such as tin oxide, zinc oxide, indium oxide, indium tin oxide (ITO), indium zinc oxide (IZO), and molybdenum oxide, and a mixture of these conductive metal oxides and metals.

When the cathode is the multi-layer structure, a two-layer structure of a first cathode layer and a cathode covering layer or a three layer structure of the first cathode layer, a second cathode layer, and the cathode covering layer. Here, the first cathode layer means a layer located at the position nearest to light emitting layer side among the cathodes and the cathode covering layer means a layer covering the first cathode layer in the case of the two-layer structure and covering the first cathode layer and the second cathode layer in the case of the three-layer structure. In terms of electron supplying ability, a work function of the material constituting the first cathode layer is preferably 3.5 eV or less. For the material constituting this first cathode layer, metals having a work function of 3.5 eV or less, oxides of the metals, fluorides of the metals, carbonates of the metals, or complex oxides of the metals are preferably used. For the material of the cathode covering layer, a material having low resistivity and having high corrosion resistance to water such as metals and metal oxides is preferably used.

Examples of the material constituting the first cathode layer include one or more material selected from the group consisting of metals such as alkali metals and alkaline earth metals, alloys including one or more of the metals, oxides of the metals, halides of the metals, carbonates of the metals, complex oxides of the metals, and mixtures thereof. Examples of the alkali metals, oxides of the alkali metals, halides of the alkali metals, carbonates of the alkali metals, and complex oxides of the alkali metals include lithium, sodium, potassium, rubidium, cesium, lithium oxide, sodium oxide, potassium oxide, rubidium oxide, cesium oxide, lithium fluoride, sodium fluoride, potassium fluoride, rubidium fluoride, cesium fluoride, lithium carbonate, sodium carbonate, potassium carbonate, rubidium carbonate, cesium carbonate, potassium molybdate, potassium titanate, potassium tungstate, and cesium molybdate. Examples of the alkaline earth metals, oxides of the alkaline earth metals, halides of the alkaline earth metals, carbonates of the earth alkaline metals, and complex oxides of the alkaline earth metals include magnesium, calcium, strontium, barium, magnesium oxide, calcium oxide, strontium oxide, barium oxide, magnesium fluoride, calcium fluoride, strontium fluoride, barium fluoride, magnesium carbonate, calcium carbonate, strontium carbonate, barium carbonate, barium molybdate, and barium tungstate. Examples of the alloys including one or more of the alkali metals and the alkaline earth metals include a Li—Al alloy, an Mg—Ag alloy, an Al—Ba alloy, an Mg—Ba alloy, a Ba—Ag alloy, and a Ca—Bi—Pb—Sn alloy. A composition of the material shown as examples of the material constituting the first cathode layer and the material shown as examples of the material constituting the electron injection layer may be also used as the material constituting the first cathode layer. Examples of a material constituting the second cathode layer include a material similar to the material constituting the first cathode layer.

Examples of the material constituting the cathode covering layer include low-resistance metals such as gold, silver, copper, aluminum, chromium, tin, lead, nickel, and titanium; alloys including one or more of these low-resistance metals, metal nanoparticles, metal nanowires, conductive metal oxides such as tin oxide, zinc oxide, indium oxide, indium tin oxide (ITO), indium zinc oxide (IZO), and molybdenum oxide, a mixture of these conductive metal oxides and metals, nanoparticles of the conductive metal oxides, nanowires of the conductive metal oxides, and conductive carbons such as graphene, fullerene, and carbon nanotube. ITO and IZO are preferable as the metal oxide.

In terms of conductivity of the cathode, an aspect ratio of the metal nanowire and an aspect ratio of the nanowire of the conductive metal oxide are preferably 2 or more, more preferably 5 or more, further preferably 10 or more, particularly preferably 50 or more, especially preferably 100 or more, and extremely preferably 300 or more.

In terms of dispersibility, the aspect ratio of the metal nanowire and the aspect ratio of the nanowire of the conductive metal oxide are preferably 1.4 or less and more preferably 1.3 or less.

Here, the aspect ratio means a ratio of the longest diameter and the shortest diameter (longest diameter/shortest diameter) in a rod-like body, a wire-like body, a particle-like body, and the like. When the aspect ratio has distribution, the average value is determined as the aspect ratio. Here, the average value means an arithmetic average value. Each aspect ratio of the metal nanoparticle, the metal nanowire, the nanoparticle of the conductive metal oxide, and the nanowire of the conductive metal oxide can be specified by using a photograph taken by a scanning electron microscope.

Each of the shortest diameter of the metal nanoparticle, the metal nanowire, the nanoparticle of the conductive metal oxide, and the nanowire of the conductive metal oxide is usually 1 nm or more and less than 1000 nm. Because of good dispersibility, each of the shortest diameter of the metal nanoparticle, the metal nanowire, the nanoparticle of the conductive metal oxide, and the nanowire of the conductive metal oxide is preferably 800 nm or less, more preferably 600 nm or less, further preferably 300 nm or less, particularly preferably 150 nm or less, and especially preferably 100 nm or less.

Because of good dispersibility, each of the longest diameter of the metal nanoparticle, the metal nanowire, the nanoparticle of the conductive metal oxide, and the nanowire of the conductive metal oxide is preferably 1000 nm or less, more preferably 800 nm or less, further preferably 500 nm or less, particularly preferably 300 nm or less, especially preferably 100 nm or less, and extremely preferably 50 nm or less.

Number average Feret diameters of the metal nanoparticle, the metal nanowire, the nanoparticle of the conductive metal oxide, and the nanowire of the conductive metal oxide are preferably 1000 nm or less, more preferably 800 nm or less, further preferably 500 nm or less, particularly preferably 300 nm or less, especially preferably 100 nm or less, and extremely preferably 50 nm or less.

The metal nanoparticle, the metal nanowire, the nanoparticle of the conductive metal oxide, and the nanowire of the conductive metal oxide are commercially available or may be produced by a conventionally known method. For the production of the metal nanoparticle, the metal nanowire, the nanoparticle of the conductive metal oxide, and the nanowire of the conductive metal oxide, any method may be used. Examples of the method include a method for producing such as a liquid phase method and a gas phase method.

As the method for producing the metal nanoparticle, the metal nanowire, the nanoparticle of the conductive metal oxide, and the nanowire of the conductive metal oxide, the method for producing a gold nanostructure is disclosed in Japanese Patent Application Laid-open No. 2006-233252. The method for producing a silver nanostructure is disclosed in Xia, Y, et al., Che. Mater. (2002), 14, 4736-4745, and Xia, Y, et al., NanoLetters (2003) 3, 955-960, and Xia, Y, et al., Mater. Che. (2008) 18, 437-441. The method for producing a copper nanostructure is disclosed in Japanese Patent Application Laid-open No. 2002-266007. The method for producing a cobalt nanostructure is disclosed in Japanese Patent Application Laid-open No. 2004-149871.

When the cathode is the multi-layer structure, constitution examples include two-layer structures of the first cathode layer and the cathode covering layer such as Mg/Al, Ca/Al, Ba/Al, NaF/Al, KF/Al, RbF/Al, CsF/Al, $Na_2CO_3$/Al, $K_2CO_3$/Al, and $Cs_2CO_3$/Al; and three-layer structures of the first cathode layer, the second cathode layer, and the cathode covering layer such as LiF/Ca/Al, NaF/Ca/Al, KF/Ca/Al, RbF/Ca/Al, CsF/Ca/Al, Ba/Al/Ag, KF/Al/Ag, KF/Ca/Ag, and $K_2CO_3$/Ca/Ag. Here, the sign "/" means that each layer is adjacent. The material constituting the second cathode layer is preferably has reduction effect to the material constituting the first cathode layer. Here, presence or absence of and a degree of the reduction effect between the materials can be estimated by, for example, bond dissociation energy between compounds ($\Delta rH°$). More specifically, in a reduction reaction of the material constituting the second cathode layer to the material constituting the first cathode layer, the material constituting the second cathode layer has the reduction effect to the material constituting the first cathode layer in the case of the combination having the positive bond dissociation energy. The dissociation energy can be referred to, for example, "Denki Kagaku Binran (Electrochemistry Handbook), 5th edition" (Maruzen Company, Limited, published in 2000) and "Netsurikigaku Database MALT (Thermodynamics Database MALT)" (Kagaku Gijutsu-Sha, published in 1992).

Known methods are applicable for a method for producing the cathode. Examples of the method include a vacuum deposition method, a sputtering method, an ion plating method, and a method for forming a film from a solution (a mixed solution with a polymer binder may be used). When the cathode is produced by using one or more material selected from metals, metal oxides, metal fluorides, and metal carbonates, the vacuum deposition method is frequently used, whereas, when the cathode is produced by using one or more material selected from metal oxides having high boiling point, metal complex oxides, and conductive metal oxides such as indium-tin oxide (ITO), the sputtering method and the ion plating method are frequently used. When the cathode is produced by using two or more materials selected from the group consisting of metals, metal oxides, metal fluorides, metal carbonates, metal oxides having high boiling point, metal complex oxides, and conductive metal oxides as the material constituting the cathode, a co-evaporation method, the sputtering method and the ion plating method are frequently used. When the cathode is produced by using one or more material selected from metal nanoparticles, metal nanowires, nanoparticles of conductive metal oxides, and nanowires of conductive metal oxides as the material constituting the cathode, a method for forming a film from a solution is frequently used. When a film is formed by a composition made of a low molecular organic compound and one or more material selected from the group consisting of metals, metal oxides, metal fluorides, and metal carbonates as the material constituting the cathode, the co-evaporation method is suitable.

An optimum value of the thickness of the cathode differs depending on used materials and a layer structure and the thickness may be selected so that values of driving voltage, light emitting efficiency, and device lifetime are adequate. The thickness of the first cathode layer is usually 0.5 nm to 20 nm. The thickness of the cathode covering layer is usually 10 nm to 1 μm. For example, when Ba or Ca is used for the first cathode layer and Al is used for the cathode covering layer, the thickness of Ba or Ca is preferably 2 nm to 10 nm, and the thickness of Al is preferably 10 nm to 500 nm. For example, when NaF or KF is used for the first cathode layer and Al is used for the cathode covering layer, the thickness of NaF or KF is preferably 1 nm to 8 nm, and the thickness of Al is preferably 10 nm to 500 nm. When the metal nanoparticle, metal nanowire, the nanoparticle of the conductive metal oxide, or the nanowire of the conductive metal oxide is used as a material constituting the cathode, the thickness of the cathode is preferably 100 nm to 1 μm.

When the cathode is used as a light transmission electrode in the electroluminescent device, a visible light transmittance of the cathode covering layer is preferably 40% or more, and more preferably 50% or more. This visible light transmittance is easily achieved by using transparent conductive metal oxides such as indium tin oxide (ITO), indium zinc oxide (IZO), and molybdenum oxide as a material constituting the cathode covering layer. Alternatively, this visible light transmittance is also easily achieved by using low-resistance metals such as gold, silver, copper, aluminum, chromium, tin, and lead and alloys including one or more metal selected from the group consisting of the low-resistance metals and by setting the thickness of the cathode covering layer to 30 nm or less.

An antireflection layer may be provided on the cathode covering layer in the cathode for the purpose of improving light transmittance from the cathode side. A refractive index of a material constituting the antireflection layer is preferably 1.8 to 3.0. Examples of materials satisfying this refractive index include ZnS, ZnSe, and $WO_3$. The thickness of the antireflection layer differs depending on used materials. The thickness is usually 10 nm to 150 nm.

[3.9 Insulating Layer]

The insulating layer is a layer having functions of improving adhesion to an electrode, improving charge injection form the electrode, and preventing mixing with an adjacent layer. Examples of materials constituting the insulating layer include metal fluorides, metal oxides, and organic insulating materials such as polymethyl methacrylate. The thickness of the insulating layer is usually 5 nm or less. Examples of positions where the insulating layer such as an insulating layer having a thickness of 5 nm or less is placed include a position adjacent to the cathode and a position adjacent to the anode.

[3.10. Other Constituents]

The electroluminescent device may have a sealing member. A position of the sealing member is usually an opposite to the substrate across the light emitting layer and the like. The electroluminescent device may have any constituents for constituting a display device including filters such as a color filter and a fluorescent conversion filter, circuits required for driving pixels, and wirings.

[4. Method for Producing Electroluminescent Device]

The electroluminescent device of the present invention may be produced by sequentially stacking each layer constituting the electroluminescent device over the substrate. As one example, the electroluminescent device may be produced by providing an anode on a substrate, sequentially stacking layers such as a hole injection layer and a hole transport layer over the anode, stacking the light emitting layer on the layers such as a hole injection layer and a hole transport layer, stacking layers such as an electron transport layer and an electron injection layer over the light emitting layer, and further stacking a cathode on the layers such as an electron transport layer and an electron injection layer. As another example, the electroluminescent device may be produced by providing a cathode on a substrate, sequentially stacking each layer of an electron injection layer, an electron transport layer, a light emitting layer, a hole transport layer, and a hole injection layer over the cathode, and further stacking an anode on the layers. As further another example, the electroluminescent device may be produced by joining an anode or a substrate at the anode side over which each layer is stacked and a cathode or a substrate at the cathode side over which each layer is stacked in facing each other.

[5. Application of Electroluminescent Device]

A display device may be produced by using the electroluminescent device of the present invention. The display device has the electroluminescent device as one pixel. A form of an array of pixels may be an array that is usually employed in display devices such as a television set, and may be a form in which many pixels are arrayed on a common substrate. In the display device of the present invention, pixels arrayed on the substrate may be formed in a pixel region defined by a bank.

The electroluminescent device of the present invention may be used for a plane-shape or a curved surface-shape illumination device.

<Photovoltaic Cell>

Hereinafter the photovoltaic cell of the present invention will be described. The photovoltaic cell of the present invention can be restated as a photovoltaic cell having a layer including the composition of the present invention or a photovoltaic cell having an organic film including the composition of the present invention.

The photovoltaic cell of the present invention has, for example, an anode, a cathode, a charge separation layer located at the position between the anode and the cathode, and a layer including the composition of the present invention; located at the position between the charge separation layer and the anode or the cathode. The photovoltaic cell of the present invention may have a substrate as an optional constituent. Over the surface of the substrate described above, a constitution including the anode, the cathode, the charge separation layer, the layer including the composition of the present invention, and an optional constituent may be provided.

Examples of each embodiment as a layer constitution of the photovoltaic cell that uses the composition of the present invention include the following aspects:

(1) an embodiment in which a cathode is provided on a substrate; a charge separation layer is stacked as an upper layer on the cathode; a layer including the composition of the present invention is stacked as an upper layer on the charge separation layer; and an anode is further stacked as an upper layer on the layer including the composition;

(2) an embodiment in which a cathode is provided on a substrate; a layer including the composition of the present invention is stacked as an upper layer on the cathode; a charge separation layer is stacked, and an anode is further stacked as an upper layer on the charge separation layer;

(3) an embodiment in which a cathode is provided on a substrate; a layer including the composition of the present invention is stacked as an upper layer on the cathode; a charge separation layer is stacked, and an anode is further stacked as an upper layer on the layer including the composition;

(4) an embodiment in which an anode is provided on a substrate; a layer including the composition of the present invention is stacked as an upper layer on the anode; a charge separation layer is stacked as an upper layer on the layer including the composition; and a cathode is further stacked as an upper layer on the charge separation layer;

(5) an embodiment in which an anode is provided on a substrate; a charge separation layer is stacked as an upper layer on the anode; a layer including the composition of the present invention is stacked as an upper layer on the charge separation layer; and a cathode is further stacked as an upper layer on the layer including the composition; and (6) an embodiment in which an anode is provided on a substrate; a layer including the composition of the present invention is stacked as an upper layer on the anode; a charge separation layer is stacked as an upper layer on the layer including the composition; a layer including the composition of the present invention is stacked as an upper layer on the charge separation layer; and a cathode is further stacked as an upper layer on the layer including the composition.

In each of the embodiments (1) to (6), other layers may be further provided in addition to the layer including the composition of the present invention and the charge separation layer. A constitution of the photovoltaic cell will be separately described below in detail.

[1. Layer Including Composition of the Present Invention (Organic Film of the Present Invention)]

In the layer including the composition of the present invention, the composition of the present invention may be mixed with a known material. Examples of known materials include electron-donor compounds, electron-acceptor compounds, metal nanoparticles, and metal oxide nanoparticles.

Examples of a method for forming the layer including the composition of the present invention include a method in which a film is formed by using a solution containing the composition.

Examples of solvents that is used for film formation from the solution described above include a solvent selected from the group consisting of water, alcohols, ethers, esters, carboxylic acids, alkyl halides, heterocyclic aromatic compounds, thiols, sulfides, thioketones, sulfoxides, nitro compounds, and nitrile compounds, and a mixed solvent made of two or more solvents selected from the group. Among them, the solvent having a solubility parameter of 9.3 or more and the mixed solvent made of two or more solvents selected from the group are preferable. Examples (a value in each parenthesis represents a value of a solubility parameter of each solvent) of the solvent having a solubility parameter of 9.3 or more include water (21.0), methanol (12.9), ethanol (11.2), 2-propanol (11.5), 1-butanol (9.9), tert-butyl alcohol (10.5), acetonitrile (11.8), 1,2-ethanediol (14.7), N,N-dimethylformamide (11.5), dimethylsulfoxide (12.8), acetic acid (12.4), nitrobenzene (11.1), nitromethane (11.0), 1,2-dichloroethane (9.7), dichloromethane (9.6), chlorobenzene (9.6), bromobenzene (9.9), dioxane (9.8), propylene carbonate (13.3), pyridine (10.4), carbon disulfide (10.0), and a mixed solvent of these solvents. (For the values of the solubility parameters, refer to "Solvent Handbook 14th edition, Kodansha Ltd.).

Here, a solubility parameter ($\delta_m$) of the mixed solvent of two solvents (referred to as Solvent 1 and Solvent 2) can be determined by $\delta_m=\delta_1\times\phi_1+\delta_2\times\phi_2$ where δ1 is a solubility parameter of Solvent 1; $\phi_1$ is a volume fraction of Solvent 1; $\delta_2$ is a solubility parameter of Solvent 2; $\phi_2$ is a volume fraction of Solvent 2.

Examples of the method for forming the film from the solution include a coating method and a printing method. Preferable examples include a spin coating method, a casting method, a bar coating method, a roll coating method, a wire bar coating method, a dip coating method, a slit coating method, a cap coating method, a spray coating method, a capillary coating method, a nozzle coating method, a micro gravure printing method, a gravure printing method, a screen printing method, a flexographic printing method, an offset printing method, an inkjet printing method, a dispenser printing method, and a reverse printing method.

An optimum value of the thickness of the layer including the composition of the present invention differs depending on used compositions and the thickness may be selected so that a value of photovoltaic efficiency is adequate. The thickness is preferably 1 nm to 1 μm, more preferably 2 nm to 500 nm, and further preferably 2 nm to 200 nm.

[2. Layer Constitution of Photovoltaic Cell]

The photovoltaic cell that uses the composition of the present invention has the anode, the cathode, and the charge separation layer located at the position between the anode and the cathode, and further has the layer including the composition of the present invention. A position of the layer including the composition of the present invention is preferably a position between the charge separation layer and the anode, and/or a position between the charge separation layer and the anode, and more preferably the position between the anode and the charge separation layer.

[3. Each Layer Constituting Photovoltaic Cell]

[3.1. Charge Separation Layer]

The charge separation layer of the photovoltaic cell that uses the composition of the present invention preferably includes the electron-donor compound and the electron-acceptor compound.

The charge separation layer include the electron-donor compound singly or in combination of two or more compounds. The charge separation layer include the electron-acceptor compound singly or in combination of two or more compounds. The electron-donor compound and the electron-acceptor compound are relatively determined from energy level of these compounds.

Examples of the electron-donor compound include pyrazoline derivatives, arylamine derivatives, stilbene derivatives, triphenyldiamine derivatives, and conjugated polymer compounds. Examples of the conjugated polymer compound include oligothiophene and its derivatives, polyfluorene and its derivatives, polyvinylcarbazole and its derivatives, polysilane and its derivatives, polysiloxane derivatives having an aromatic amine in the side chain or the main chain of the polysiloxane derivatives, polyaniline and its derivatives, polypyrrole and its derivatives, polyphenylenevinylene and its derivatives, and polythienylenevinylene and its derivatives.

Examples of the electron-acceptor compound include oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, metal complexes of 8-hydroxyquinoline and its derivatives, polyquinoline and its derivatives, polyquinoxaline and its derivatives, polyfluorene and its derivatives, $C_{60}$ fullerene and other fullerenes and their derivatives, phenanthrene derivatives such as bathocuproine, metal oxides such as titanium oxide, and carbon nanotubes. The electron-acceptor compound is preferably titanium oxide, the carbon nanotubes, the fullerenes and their derivatives, and more preferably the fullerenes and their derivatives.

The thickness of the charge separation layer is usually 1 nm to 100 μm, preferably 2 nm to 1000 nm, more preferably 5 nm to 500 nm, and further preferably 20 nm to 200 nm.

Any method can be applicable for producing the charge separation layer. Examples of the method include a method for forming a film from a solution and a vacuum deposition method.

Examples of the method for forming the film from the solution include coating method such as a spin coating method, a casting method, a micro gravure printing method, a gravure printing method, a bar coating method, a roll coating method, a wire bar coating method, a dip coating method, a slit coating method, a cap coating method, a spray coating method, a screen printing method, a flexographic printing method, an offset printing method, an inkjet printing method, a dispenser printing method, a nozzle coating method, and a capillary coating method. The spin coating method, the flexographic printing method, the gravure printing method, and the dispenser printing method are preferable.

[3.2. Substrate]

The photovoltaic cell that uses the composition of the present invention is usually formed on a substrate. The substrate may be a substrate that does not change at the time of forming an electrode and forming a layer of an organic compound. Examples of materials of the substrate include a glass, a plastic, a polymer film, and silicon. When an opaque substrate is used, an opposite electrode (that is, an electrode further from the substrate) is preferably transparent or translucent.

[3.3. Electrode]

Examples of materials constituting the transparent or translucent electrode include conductive metal oxide film and translucent thin metal film. Preferable examples include indium oxide, zinc oxide, tin oxide, complexes thereof such as indium tin oxide (ITO) and indium zinc oxide, NESA, gold, platinum, silver, and copper. Among them, ITO, indium zinc oxide, and tin oxide are preferable.

Examples of methods for producing the electrode include a vacuum deposition method, a sputtering method, an ion plating method, and a plating method.

As materials for constituting the electrode, organic transparent conductive film such as polyaniline and its derivatives and polythiophene and its derivatives may be used. Further, as the materials for constituting the electrode, for example, metals and conductive polymers may be used. A material constituting one electrode in a pair of electrodes is preferable a material having a smaller work function. Examples of the material include metals such as lithium, sodium, potassium, rubidium, cesium, magnesium, calcium, strontium, barium, aluminum, scandium, vanadium, zinc, yttrium, indium, cerium, samarium, europium, terbium and ytterbium; alloys made of two or more metals selected from these metals; alloys made of one or more metal selected from these metals and one or more metal selected from the group consisting of gold, silver, platinum, copper, manganese, titanium, cobalt, nickel, tungsten, and tin; graphite; and graphite intercalation compounds. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

[3.4. Interlayer]

As a means for improving photovoltaic efficiency of the photovoltaic cell of the present invention, an interlayer may be included in addition to the layer including the composition of the present invention and the charge separation layer. Examples of materials constituting the interlayer include halides of alkali metals such as lithium fluoride, oxides of the alkali metals, halides of alkaline earth metals, and oxides of the alkaline earth metals. Examples of the materials may also include fine particles of inorganic semiconductors such as titanium oxide and PEDOT (poly-3,4-ethylenedioxythiophene).

[4. Application of Photovoltaic Cell]

The photovoltaic cell of the present invention can be operated as an organic film solar cell because photovoltaic force is generated between the transparent or translucent electrodes by irradiating with light such as sunlight from the electrodes. The photovoltaic cell can also be used as an organic film solar cell module by integrating a plurality of organic film solar cells.

The photovoltaic cell can be operated as an organic optical sensor in a manner that photocurrent is flown by irradiating with light from the transparent or translucent electrodes in a state of applying voltage between the electrode or in a state of not applying voltage. The photovoltaic cell can also be used as an organic image sensor by integrating a plurality of organic optical sensors.

[5. Solar Cell Module]

The organic film solar cell may basically have a similar module structure to a conventional solar cell module. In the solar cell module, cells are usually constituted on a supporting substrate made of metals, ceramics, or the like and the solar cell module has a structure in which the cells are covered with a filling resin or a protection glass and light is taken from the opposite side of the supporting substrate. On the other hand, the structure may be a structure in which a transparent material such as tempered glass is used for the supporting substrate of the solar cell module and cells are constituted on the supporting substrate to take light from the transparent supporting substrate side. As structures of the solar cell module, for example, module structures called a superstraight type structure, a substrate type structure, and a potting type structure, and a substrate-integrated module structure used in amorphous silicon solar cells and the like are known. The organic film solar cell of the present invention can adequately determine the structure selected from these module structures depending on an intended use, a use place and a use environment.

In typical superstraight type and substrate type module structures, cells are arranged in uniform intervals between supporting substrates in which one side is or both sides are transparent and antireflection treatment is applied. Cells adjacent to each other are connected by lead metal, flexible wiring or the like. At an outer edge part, a structure in which collecting electrodes are arranged and generated electricity is taken out to the outside is formed. In order to improve cell protection and/or current collection efficiency, various types of plastic materials such as ethylene-vinyl acetate (EVA) may be positioned between the substrate and the cell in the form of film or filled resin depending on purposes. When the module is used in a place where the surface does not need to be covered with a hard material such as a place where external impact is rarely applied, a protection function is provided by constituting a surface protection layer with a transparent plastic film or curing the filled resin, and thereby, one side of the supporting substrate can be eliminated. In order to seal inside of the module and ensure the rigidity of the module, circumference of the supporting substrate is fixed with a metal frame in a sandwiching manner and a gap between the supporting substrate and the frame is hermetically sealed with a sealing material. The solar cell may also be constituted on a curvature surface if a flexible material is used for the cell itself, the supporting substrate, the filled material, and the sealing material.

In the case of the solar cells in which a flexible support such as a polymer film is used, a solar cell body may be produced by sequentially forming cells with the roll shape support being fed, cutting the cells in a desired size, and thereafter sealing the circumference with a flexible and moistureproof material. The solar cell using the flexible support may also form a module structure called "SCAF" described in Solar Energy Materials and Solar Cells, 48, 383-391. The solar cell using the flexible support may also be used in a manner that the solar cell is adhered and fixed on a curved glass or the like.

EXAMPLES

Hereinafter, the present invention will be described more specifically based on Examples and Comparative Example. The present invention, however, is not limited to the following Examples.

Weight average molecular weights (Mw) and number average molecular weights (Mn) of polymer compounds were determined as polystyrene-equivalent weight average molecular weights and polystyrene-equivalent number average molecular weights by using a gel permeation chromatography (GPC) (manufactured by Tosoh Corporation: HLC-8220GPC). Samples that were measured were dissolved in THF to be about 0.5% by weight, and 50 μL of the solution was injected into GPC. THF was used as a mobile phase of GPC, and the sample was flown in a flow rate of 0.5 mL/minute.

Structural analysis of compounds and polymer compounds was carried out by $^{1}$H-NMR analysis using a 300-MHz NMR spectrometer manufactured by Varian Inc. Measurement was carried out in a manner that a sample was dissolved in deuterated solvent (a solvent in which hydrogen atom(s) is(are) substituted with deuterium atom(s)) that was capable of dissolving the sample at a concentration of 20 mg/mL.

An orbital energy of a highest occupied molecular orbital (HOMO) of a polymer compound was determined by measuring an ionization potential of the polymer compound and the obtained ionization potential was defined as the orbital energy.

An orbital energy of a lowest unoccupied molecular orbital (LUMO) of the polymer compound was determined by calculating energy difference between HOMO and LUMO, and a sum of the value and the ionization potential measured above was defined as the orbital energy. A photoelectron spectrometer (manufactured by Riken Keiki Co., Ltd.: AC-2) was used for measurement of the ionization potential. An absorption spectrum of the polymer compound was measured by using an ultraviolet-visible-near-infrared spectrophotometer (manufactured by Varian Inc.: Cary 5E) and energy difference between HOMO and LUMO was determined from absorption end of the absorption spectrum. Film samples of the polymer compounds having a thickness of about 100 nm that were formed on quartz substrates were used for these measurements.

Preparation Example 1

Synthesis of 2,7-dibromo-9,9-bis[3-ethoxycarbonyl-4-[2-[2-(2-methoxyethoxy)ethoxy]ethoxy]phenyl]-fluorene (Compound A)

2,7-dibromo-9-fluorenone (52.5 g), ethyl salicylate (154.8 g), and mercaptoacetic acid (1.4 g) were poured in a 300 ml flask and the gas in the flask was replaced with nitrogen. Methanesulfonic acid (630 mL) was added, and the mixture was stirred overnight at 75° C. The mixture was allowed to cool, added to ice water, and stirred for 1 hour. The generated solid was filtered and washed with heated acetonitrile. The washed solid was dissolved in acetone. A solid was recrystallized from the obtained acetone solution and filtered. The obtained solid (62.7 g), 2-[2-(2-methoxyethoxy)ethoxy]ethyl p-toluenesulfonate (86.3 g), potassium carbonate (62.6 g), and 18-crown-6 (7.2 g) were dissolved in N,N-dimethylformamide (DMF) (670 mL) and the solution was transferred to a flask and stirred overnight at 105° C. The obtained mixture was allowed to cool to room temperature, added to ice water, and stirred for 1 hour. The reaction liquid was separately extracted by adding chloroform and the solution was concentrated, thus obtaining 2,7-dibromo-9,9-bis[3-ethoxycarbonyl-4-[2-[2-(2-methoxyethoxy)ethoxy]ethoxy]phenyl]-fluorene (Compound A) (51.2 g).

[Chemical Formula 166]

Compound A

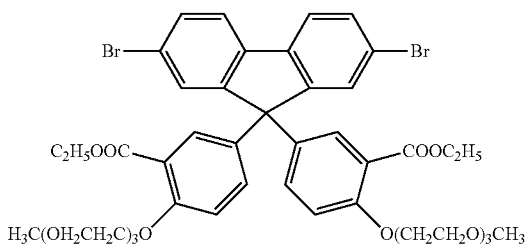

Preparation Example 2

Synthesis of 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (Compound B)

Under a nitrogen atmosphere, Compound A (15 g), bis(pinacolato)diboron (8.9 g), [1,1'-bis(diphenylphosphino)ferrocene]dichloropalladium (II) dichloromethane complex (0.8 g), 1,1'-bis(diphenylphosphino)ferrocene (0.5 g), potassium acetate (9.4 g), and dioxane (400 mL) were mixed. The reaction solution was heated to 110° C. and refluxed for 10 hours. After the reaction solution was allowed to cool, the reaction liquid was filtered and the filtrate was concentrated under reduced pressure. The reaction mixture was washed with methanol three times. A precipitate was dissolved in toluene. Activated carbon was added to the solution and the solution was stirred. Subsequently, the mixture was filtered and the filtrate was concentrated under reduced pressure, thus obtaining 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (Compound B) (11.7 g).

[Chemical Formula 167]

Compound B

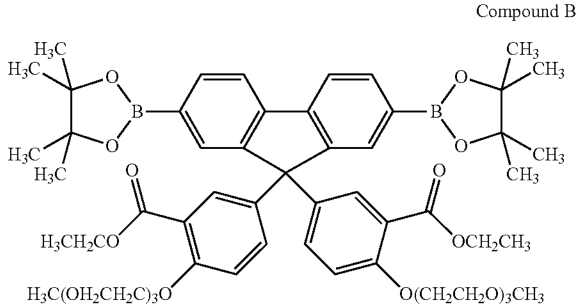

Preparation Example 3

Synthesis of poly[9,9-bis[3-ethoxycarbonyl-4-[2-[2-(2-methoxyethoxy)ethoxy]ethoxy]phenyl]-fluorene] (Polymer Compound A) by Suzuki Coupling Under an inert atmosphere, Compound A (0.55 g), Compound B (0.61 g), triphenylphosphine palladium (0.01 g), methyltrioctylammonium chloride (manufactured by Sigma-Aldrich Co., trade name Aliquat 336 (registered trademark)) (0.20 g), and toluene (10 mL) were mixed and the reaction solution was heated to 105° C. To the reaction liquid, 2M sodium carbonate aqueous solution (6 mL) was added dropwise and the mixture was refluxed for 8 hours. To the reaction liquid, 4-tert-butylphenyl boronic acid (0.01 g) was added and the mixture was refluxed for 6 hours. Subsequently, sodium diethyldithiacarbamate aqueous solution (10 mL, concentration: 0.05 g/ml) was added and the mixed solution was stirred for 2 hours. After the mixed solution was added dropwise into methanol and the mixture was stirred for 1 hour, a deposited precipitate was filtered, dried for 2 hours under reduced pressure, and dissolved in THF. After the obtained solution was added dropwise into a mixed solvent of methanol and 3% by weight acetic acid aqueous solution and the mixture was stirred for 1 hour, a deposited precipitate was filtered and dissolved in THF. After thus obtained solution was added dropwise into methanol and the mixture was stirred for 30 minutes, a deposited precipitate was filtered, thus obtaining a solid. The obtained solid was dissolved in THF and purified through an alumina column and a silica gel column. After the THF solution recovered from the columns was concentrated, the solution was added dropwise into methanol and a deposited solid was filtered and dried. A yield of the obtained poly[9,9-bis[3-ethoxycarbonyl-4-[2-[2-(2-methoxyethoxy)ethoxy]ethoxy]phenyl]-fluorene] (Polymer Compound A) was 520 mg.

The polystyrene-equivalent number average molecular weight of Polymer Compound A was $5.2\times10^4$. Polymer Compound A is made of the structural unit represented by Formula (A).

[Chemical Formula 168]

(A)

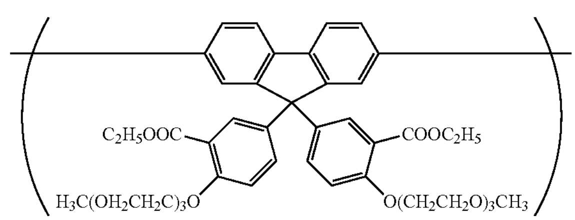

Preparation Example 4

Synthesis of poly[9,9-bis[3-ethoxycarbonyl-4-[2-[2-(2-methoxyethoxy)ethoxy]ethoxy]phenyl]-fluorene] (Polymer Compound A) by Yamamoto Polymerization Under an inert atmosphere, Compound A (1.31 g), 2,2'-bipyridine (0.48 g), bis(1,5-cyclooctadiene) nickel (0.84 g), and THF (150 mL) were mixed and the mixture was stirred for 5 hours at 55° C. After the mixture was cooled to room temperature, the reaction solution was added dropwise into a mixture of methanol, water, and 15% by weight aqueous ammonia. After a generated precipitate was collected by filtration, dried under reduced pressure, and redissolved in THF. After the solution was filtered using celite, the filtrate was concentrated under reduced pressure. Methanol was added dropwise into the concentrated solution and a generated precipitate was collected by filtration and then dried under reduced pressure, thus obtaining Polymer Compound A (970 mg). The polystyrene-equivalent number average molecular weight of Polymer Compound A was $1.5\times10^5$.

Preparation Example 5

Synthesis of Cesium Salt of Polymer Compound A (Conjugated Polymer Compound 1)

Polymer Compound A (200 mg) synthesized in the method described in Preparation Example 3 was placed in a 100 mL flask and the gas in the flask was replaced with nitrogen. THF (20 mL) and ethanol (20 mL) were added and the mixture was heated to 55° C. An aqueous solution in which cesium hydroxide monohydrate (200 mg) was dissolved in water (2 mL) was added to the mixture and the obtained mixture was stirred for 6 hours at 55° C. After the mixture was cooled to room temperature, the reaction solvent was removed by distillation under reduced pressure. A generated solid was washed with water and dried under reduced pressure, thus obtaining a light yellow solid (150 mg). From NMR spectrum, complete disappearance of the signal derived from ethyl groups at the ethyl ester portion in Polymer Compound A was confirmed. The obtained cesium salt of Polymer Compound A is called Conjugated Polymer Compound 1. Conjugated Polymer Compound 1 is made of a structural unit represented by Formula (B).

[Chemical Formula 169]

(B)

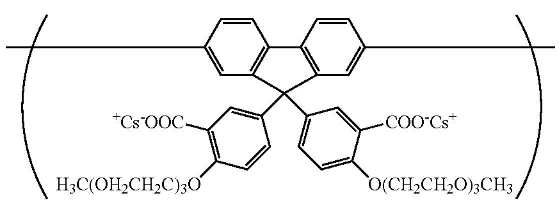

An orbital energy of HOMO of Conjugated Polymer Compound 1 was −5.5 eV and an orbital energy of LUMO was −2.7 eV.

Preparation Example 6

Synthesis of Potassium Salt of Polymer Compound A (Conjugated Polymer Compound 2)

Polymer Compound A (200 mg) synthesized in the method described in Preparation Example 3 was placed in a 100 mL flask and the gas in the flask was replaced with nitrogen. THF (20 mL) and methanol (10 mL) were mixed and an aqueous solution in which potassium hydroxide (400 mg) was dissolved in water (2 mL) was added to the mixed solution. The obtained mixture was stirred for 1 hour at 65° C. To the reaction solution, 50 mL of methanol was added and the mixture was further stirred for 4 hours at 65° C. After the mixture was cooled to room temperature, the reaction solvent was removed by distillation under reduced pressure. A generated solid was washed with water and dried under reduced pressure, thus obtaining a light yellow solid (131 mg).

From NMR spectrum, complete disappearance of the signal derived from ethyl groups at the ethyl ester portion in Polymer Compound A was confirmed. The obtained potassium salt of Polymer Compound A is called Conjugated Polymer Compound 2. Conjugated Polymer Compound 2 made of a structural unit represented by Formula (C).

[Chemical Formula 170]

(C)

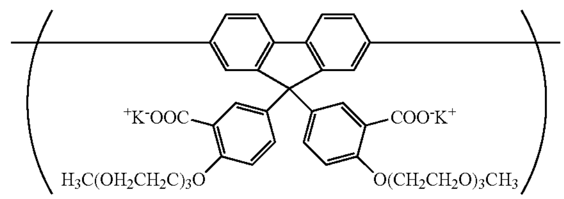

An orbital energy of HOMO of Conjugated Polymer Compound 2 was −5.5 eV and an orbital energy of LUMO was −2.7 eV.

Preparation Example 7

Synthesis of Sodium Salt of Polymer Compound A (Conjugated Polymer Compound 3)

Polymer Compound A (200 mg) synthesized in the method described in Preparation Example 3 was placed in a 100 mL flask and the gas in the flask was replaced with nitrogen. THF (20 mL) and methanol (10 mL) were mixed and an aqueous solution in which sodium hydroxide (260 mg) was dissolved in water (2 mL) was added to the mixed solution. The obtained mixture was stirred for 1 hour at 65° C. To the reaction solution 30 mL of methanol was added and the mixture was further stirred for 4 hours at 65° C. After the mixture was cooled to room temperature, the reaction solvent was removed by distillation under reduced pressure. A generated solid was washed with water and dried under reduced pressure, thus obtaining a light yellow solid (123 mg). From NMR spectrum, complete disappearance of the signal derived from ethyl groups at the ethyl ester portion in Polymer Compound A was confirmed. The obtained sodium salt of Polymer Compound A is called Conjugated Polymer Compound 3. Conjugated Polymer Compound 3 is made of a structural unit represented by Formula (D).

[Chemical Formula 171]

(D)

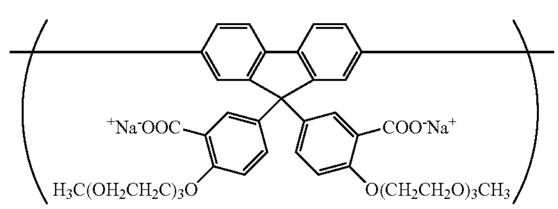

An orbital energy of HOMO of Conjugated Polymer Compound 3 was −5.6 eV and an orbital energy of LUMO was −2.8 eV.

Preparation Example 8

Synthesis of Ammonium Salt of Polymer Compound A (Conjugated Polymer Compound 4)

Polymer Compound A (200 mg) synthesized in the method described in Preparation Example 3 was placed in a 100 mL flask and the gas in the flask was replaced with nitrogen. THF (20 mL) and methanol (15 mL) were mixed and an aqueous solution in which tetramethylammonium hydroxide (50 mg) was dissolved in water (1 mL) was added to the mixed solution. The obtained mixture was stirred for 6 hours at 65° C. To the reaction solution, an aqueous solution in which tetramethylammonium hydroxide (50 mg) was dissolved in water (1 mL) was added and the mixture was further stirred for 4 hours at 65° C. After the mixture was cooled to room temperature, the reaction solvent was removed by distillation under reduced pressure. A generated solid was washed with water and dried under reduced pressure, thus obtaining a light yellow solid (150 mg). From NMR spectrum, 90% of disappearance of the signal derived from ethyl groups at the ethyl ester portion in Polymer Compound A was confirmed. The obtained ammonium salt of Polymer Compound A is called Conjugated Polymer Compound 4. Conjugated Polymer Compound 4 is made of a structural unit represented by Formula (E).

[Chemical Formula 172]

(E)

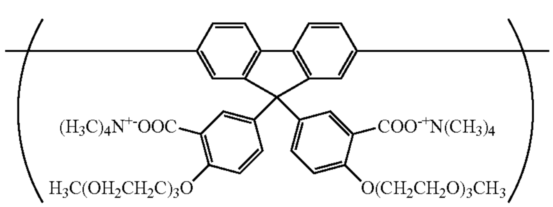

An orbital energy of HOMO of Conjugated Polymer Compound 4 was −5.6 eV and an orbital energy of LUMO was −2.8 eV.

Preparation Example 9

Synthesis of Polymer Compound B

Under an inert atmosphere, Compound A (0.40 g), Compound B (0.49 g), N,N'-bis(4-bromophenyl)-N,N'-bis(4-tert-butyl-2,6-dimethylphenyl)1,4-phenylenediamine (35 mg), triphenylphosphine palladium (8 mg), methyltrioctylammonium chloride (manufactured by Sigma-Aldrich Corp., trade name Aliquat 336 (registered trademark)) (0.20 g), and toluene (10 mL) were mixed and the reaction solution was heated to 105° C. To the reaction liquid, 2M sodium carbonate aqueous solution (6 mL) was added dropwise and the mixture was refluxed for 8 hours. Phenylboronic acid (0.01 g) was added to the reaction liquid, and the mixture was refluxed for 6 hours.

Subsequently, sodium diethyldithiacarbamate aqueous solution (10 mL, concentration: 0.05 g/mL) was added and the mixture was stirred for 2 hours. After the mixed solution was added dropwise into methanol and the mixture was stirred for 1 hour, a deposited precipitate was filtered, dried under reduced pressure for 2 hours, and dissolved in THF. After the obtained solution was added dropwise into a mixed solvent of methanol and 3% by weight acetic acid aqueous solution and the mixture was stirred for 1 hour, a deposited precipitate was filtered and dissolved in THF. After thus obtained solution was added dropwise into methanol and the mixture was stirred for 30 minutes, a deposited precipitate was filtered, thus obtaining a solid. The obtained solid was dissolved in THF and purified through an alumina column and a silica gel column. After the THF solution recovered from the columns was concentrated, the concentrated solution was added dropwise into methanol and a deposited solid was filtered and dried. A yield of obtained Polymer Compound B was 526 mg.

The polystyrene-equivalent number average molecular weight of Polymer Compound B was $3.6\times10^4$. Polymer Compound B is made of a structural unit represented by Formula (F).

[Chemical Formula 173]

(F)

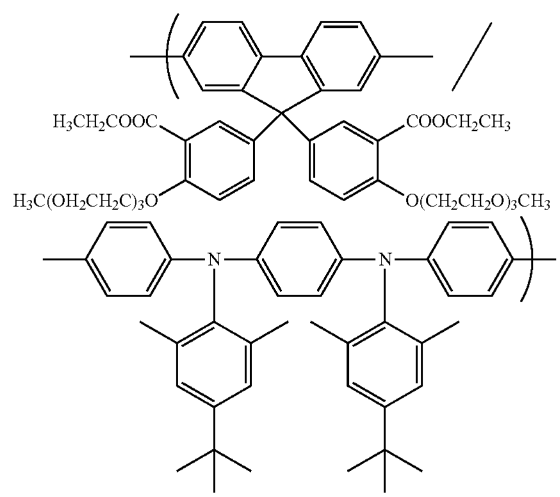

(95:5 mol %)

N,N'-bis(4-bromophenyl)-N,N'-bis(4-tert-butyl-2,6-dimethylphenyl)1,4-phenylenediamine can be synthesized by, for example, the method described in Japanese Patent Application Laid-open No. 2008-74917.

Preparation Example 10

Synthesis of Cesium Salt of Polymer Compound B (Conjugated Polymer Compound 5)

Polymer Compound B (200 mg) was placed in a 100 mL flask and the gas in the flask was replaced with nitrogen. THF (20 mL) and methanol (20 mL) were added and mixed. To the mixed solution, an aqueous solution in which cesium hydroxide (200 mg) was dissolved in water (2 mL) was added, and the obtained mixture was stirred for 1 hour at 65° C. To the reaction solution, 30 mL of methanol was added and the mixture was further stirred for 4 hours at 65° C. After the mixture was cooled to room temperature, the reaction solvent was removed by distillation under reduced pressure.

A generated solid was washed with water and dried under reduced pressure, thus obtaining a light yellow solid (150 mg). From NMR spectrum, complete disappearance of the signal derived from ethyl groups at the ethyl ester portion in Polymer Compound B was confirmed. The obtained cesium salt of Polymer Compound B is called Conjugated Polymer Compound 5. Conjugated Polymer Compound 5 is made of a structural unit represented by Formula (G).

[Chemical Formula 174]

(G)

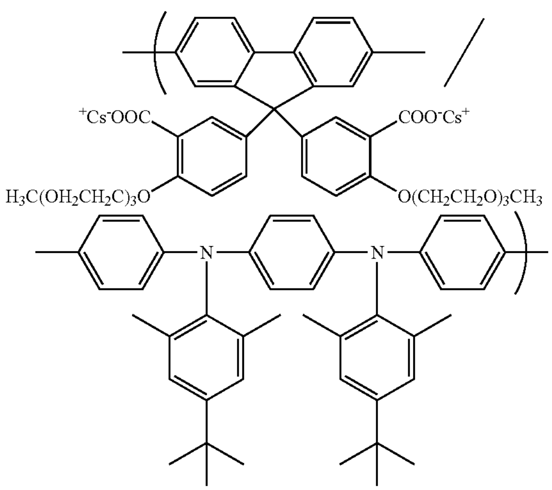

(95:5 mol %)

An orbital energy of HOMO of Conjugated Polymer Compound 5 was −5.3 eV and an orbital energy of LUMO was −2.6 eV.

Preparation Example 11

Synthesis of Polymer Compound C

Under an inert atmosphere, Compound A (0.55 g), Compound B (0.67 g), N,N'-bis(4-bromophenyl)-N,N'-bis(4-tert-butyl-2,6-dimethylphenyl)1,4-phenylenediamine (0.038 g), 3,7-dibromo-N-(4-n-butylphenyl) phenoxazine (0.009 g), triphenylphosphine palladium (0.01 g), methyltrioctylammonium chloride (manufactured by Sigma-Aldrich Co., trade name Aliquat 336 (registered trademark)) (0.20 g), and toluene (10 mL) were mixed, and the mixture was heated to 105° C. To the reaction liquid, 2M sodium carbonate aqueous solution (6 mL) was added dropwise and the mixture was refluxed for 2 hours. Phenylboronic acid (0.004 g) was added to the reaction liquid, and the mixture was refluxed for 6 hours. Subsequently, sodium diethyldithiacarbamate aqueous solution (10 mL, concentration: 0.05 g/mL) was added and the mixture was stirred for 2 hours. After the mixed solution was added dropwise into methanol and the mixture was stirred for 1 hour, a deposited precipitate was filtered and dried under reduced pressure for 2 hours. The obtained solid was dissolved in THF. After the obtained solution was added dropwise into a mixed solvent of methanol and 3% by weight of acetic acid aqueous solution and the mixture was stirred for 1 hour, a deposited precipitate was filtered and dissolved in THF. After thus obtained solution was added dropwise into methanol and the mixture was stirred for 30 minutes, a deposited precipitate was filtered, thus obtaining a solid. The obtained solid was dissolved in THF and purified through an alumina column and a silica gel column. After the THF solution recovered from the columns was concentrated, the concentrated solution was added dropwise into methanol and a deposited solid was filtered and dried. A yield of obtained Polymer Compound C was 590 mg.

The polystyrene-equivalent number average molecular weight of Polymer Compound C was $2.7\times10^4$. Polymer Compound C is made of a structural unit represented by Formula (H).

[Chemical Formula 175]

(H)

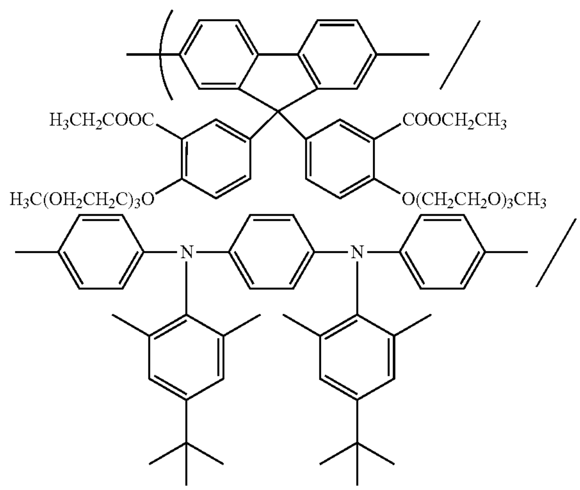

(95:4:1 mol %)

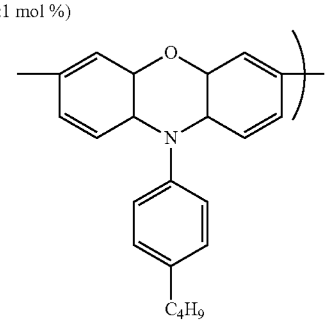

3,7-dibromo-N-(4-n-butylphenyl)phenoxazine was synthesized by the method described in Japanese Patent Application Laid-open No. 2004-137456.

Preparation Example 12

Synthesis of Cesium Salt of Polymer Compound C (Conjugated Polymer Compound 6)

Polymer Compound C (200 mg) was placed in a 100 mL flask and the gas in the flask was replaced with nitrogen. THF (15 mL) and methanol (10 mL) were mixed. To the mixed solution, an aqueous solution in which cesium hydroxide (360 mg) was dissolved in water (2 mL) was added, and the obtained mixture was stirred for 3 hours at 65° C. To the reaction solution, 10 mL of methanol was added and the mixture was further stirred for 4 hours at 65° C. After the mixture was cooled to room temperature, the reaction solvent was removed by distillation under reduced pressure. A generated solid was washed with water and dried under reduced pressure, thus obtaining a light yellow solid (210 mg). From NMR spectrum, complete disappearance of the signal derived from ethyl groups at the ethyl ester portion in Polymer Compound C was confirmed. The obtained cesium salt of Polymer Compound C is called Conjugated Polymer Compound 6. Conjugated Polymer Compound 6 is made of a structural unit represented by Formula (I).

[Chemical Formula 176]

(I)

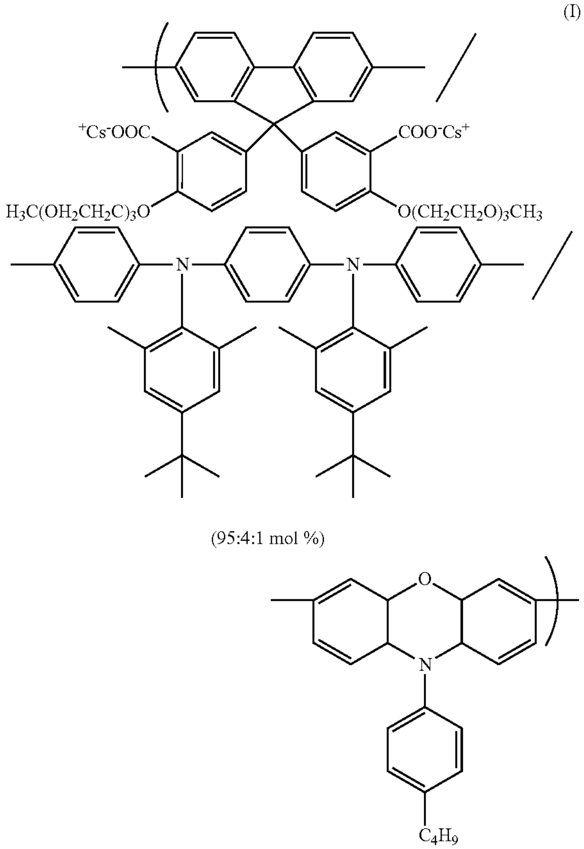

(95:4:1 mol %)

An orbital energy of HOMO of Conjugated Polymer Compound 6 was −5.3 eV and an orbital energy of LUMO was −2.4 eV.

Preparation Example 13

Synthesis of Polymer Compound D

Under an inert atmosphere, Compound A (0.37 g), Compound B (0.82 g), 1,3-dibromobenzene (0.09 g), triphenylphosphine palladium (0.01 g), methyltrioctylammonium chloride (manufactured by Sigma-Aldrich Co., trade name Aliquat 336 (registered trademark)) (0.20 g), and toluene (10 mL) were mixed and the reaction solution was heated to 105° C. To the reaction liquid, 2M sodium carbonate aqueous solution (6 mL) was added dropwise and the reaction solution was refluxed for 7 hours. Phenylboronic acid (0.002 g) was added to the reaction liquid, and the reaction solution was refluxed for 10 hours. Subsequently, sodium diethyldithiacarbamate aqueous solution (10 mL, concentration: 0.05 g/mL) was added and the mixed solution was stirred for 1 hour. After the mixed solution was added dropwise into 300 mL of methanol and the mixture was stirred for 1 hour, a deposited precipitate was filtered, dried under reduced pressure for 2 hours, and dissolved in 20 mL of THF. After the obtained solution was added dropwise into a mixed solvent of methanol and 3% by weight acetic acid aqueous solution and the mixture was stirred for 1 hour, a deposited precipitate was filtered and dissolved in THF. After thus obtained solution was added dropwise into methanol and the mixture was stirred for 30 minutes, a deposited precipitate was filtered, thus obtaining a solid. The obtained solid was dissolved in THF and purified through an alumina column and a silica gel column. After the THF solution recovered from the columns was concentrated, the concentrated solution was added dropwise into methanol and a deposited solid was filtered and dried. A yield of obtained Polymer Compound D was 293 mg.

The polystyrene-equivalent number average molecular weight of Polymer Compound D was $1.8\times10^4$. Polymer Compound D is made of the structural unit represented by Formula (J).

[Chemical Formula 177]

(J)

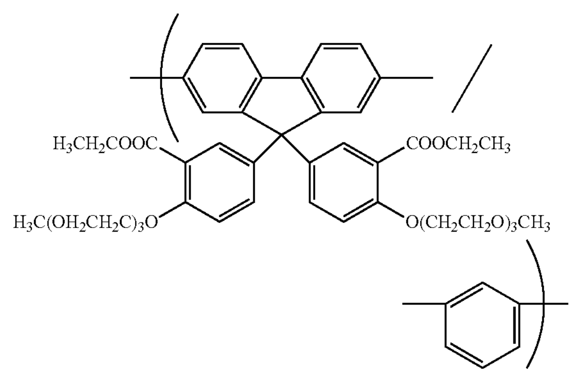

(75:25 mol %)

Preparation Example 14

Synthesis of Cesium Salt of Polymer Compound D (Conjugated Polymer Compound 7)

Polymer Compound D (200 mg) was placed in a 100 mL flask and the gas in the flask was replaced with nitrogen. THF (10 mL) and methanol (5 mL) were mixed. To the mixed solution, an aqueous solution in which cesium hydroxide (200 mg) was dissolved in water (2 mL) was added, and the reaction solution was stirred for 2 hours at 65° C. To the reaction solution, 10 mL of methanol was added and the mixture was further stirred for 5 hours at 65° C. After the mixture was cooled to room temperature, the reaction solvent was removed by distillation under reduced pressure. A generated solid was washed with water and dried under reduced pressure, thus obtaining a light yellow solid (170 mg). From NMR spectrum, complete disappearance of the signal derived from ethyl groups at the ethyl ester portion in Polymer Compound D was confirmed. The obtained cesium salt of Polymer Compound D is called Conjugated Polymer Compound 7. Conjugated Polymer Compound 7 is made of a structural unit represented by Formula (K).

[Chemical Formula 178]

(K)

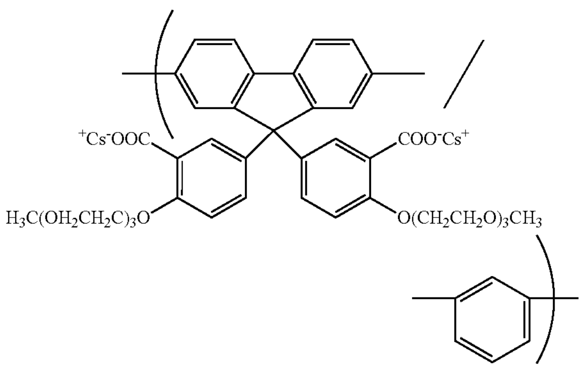

(75:25 mol %)

An orbital energy of HOMO of Conjugated Polymer Compound 7 was −5.6 eV and an orbital energy of LUMO was −2.6 eV.

Preparation Example 15

Synthesis of Polymer Compound E

Under an inert atmosphere, Compound B (1.01 g), 1,4-dibromo-2,3,5,6-tetrafluorobenzene (0.30 g), triphenylphosphine palladium (0.02 g), methyltrioctylammonium chloride (manufactured by Sigma-Aldrich Co., trade name Aliquat 336 (registered trademark)) (0.20 g), and toluene (10 mL) were mixed and the reaction solution was heated to 105° C. To the reaction liquid, 2M sodium carbonate aqueous solution (6 mL) was added dropwise and the reaction solution was refluxed for 4 hours. Phenylboronic acid (0.002 g) was added to the reaction liquid, and the mixture was refluxed for 4 hours. Subsequently, sodium diethyldithiacarbamate aqueous solution (10 mL, concentration: 0.05 g/mL) was added and the mixture was stirred for 1 hour. After the mixed solution was added dropwise into methanol and the mixture was stirred for 1 hour, a deposited precipitate was filtered and dried under reduced pressure for 2 hours. The obtained solid was dissolved in THF. After the obtained solution was added dropwise into a mixed solvent of methanol and 3% by weight of acetic acid aqueous solution and the mixture was stirred for 1 hour, a deposited precipitate was filtered and dissolved in THF. After thus obtained solution was added dropwise into methanol and the mixture was stirred for 30 minutes, a deposited precipitate was filtered, thus obtaining a solid. The obtained solid was dissolved in a mixed solvent of THF/ethyl acetate (1/1 (volume ratio)) and purified through an alumina column and a silica gel column. After the THF solution recovered from the columns was concentrated, the concentrated solution was added dropwise into methanol and a deposited solid was filtered and dried. A yield of obtained Polymer Compound E was 343 mg.

The polystyrene-equivalent number average molecular weight of Polymer Compound E was $6.0\times10^4$. Polymer Compound E is made of a structural unit represented by Formula (L).

[Chemical Formula 179]

(L)

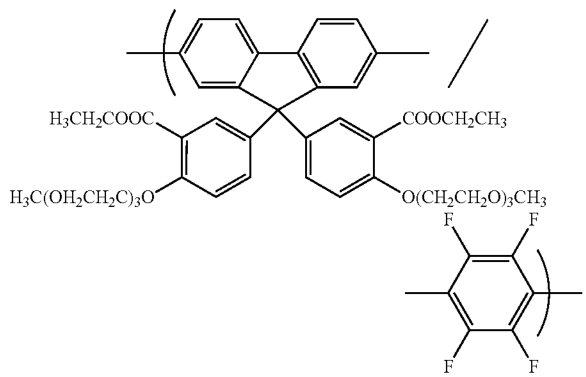

(75:25 mol %)

Preparation Example 16

Synthesis of Cesium Salt of Polymer Compound E (Conjugated Polymer Compound 8)

Polymer Compound E (150 mg) was placed in a 100 mL flask and the gas in the flask was replaced with nitrogen. THF (10 mL) and methanol (5 mL) were mixed. To the mixed solution, an aqueous solution in which cesium hydroxide (260 mg) was dissolved in water (2 mL) was added, and the obtained reaction solution was stirred for 2 hours at 65° C. To the reaction solution, 10 mL of methanol was added and the mixture was further stirred for 5 hours at 65° C. After the mixture was cooled to room temperature, the reaction solvent was removed by distillation under reduced pressure. A generated solid was washed with water and dried under reduced pressure, thus obtaining a light yellow solid (130 mg). From NMR spectrum, complete disappearance of the signal derived from ethyl groups at the ethyl ester portion in Polymer Compound E was confirmed. The obtained cesium salt of Polymer Compound E is called Conjugated Polymer Compound 8. Conjugated Polymer Compound 8 is made of a structural unit represented by Formula (M).

[Chemical Formula 180]

(M)

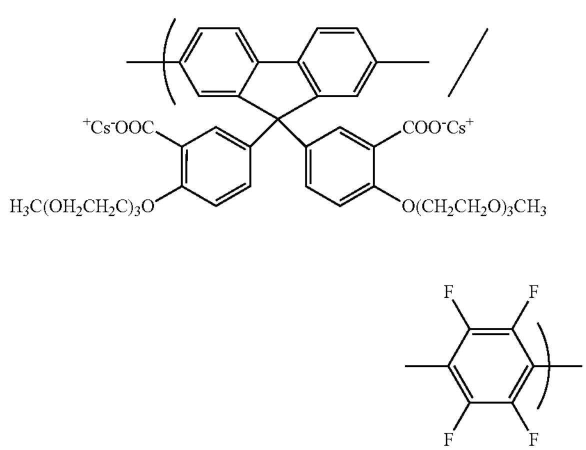

(75:25 mol %)

An orbital energy of HOMO of Conjugated Polymer Compound 8 was −5.9 eV and an orbital energy of LUMO was −2.8 eV.

Preparation Example 17

Synthesis of 1,3-dibromo-5-ethoxycarbonyl-6-[2-[2-(2-methoxyethoxy)ethoxy]ethoxy]benzene Under an inert atmosphere, 3,5-dibromosalicylic acid (20 g), ethanol (17 mL), concentrated sulfuric acid (1.5 mL), and toluene (7 mL) were mixed and the reaction solution was heated and stirred for 20 hours at 130° C. After the reaction solution was allowed to cool, the reaction solution was added to ice water (100 mL). The obtained mixture was separately extracted with chloroform and the obtained solution was concentrated. The obtained solid was dissolved in isopropanol and the solution was added dropwise into distilled water. The obtained deposit was filtered, thus obtaining a solid (18 g). Under an inert atmosphere, the obtained solid (1 g), 2-[2-(2-methoxyethoxy)ethoxy]ethyl p-toluenesulfonate (1.5 g), potassium carbonate (0.7 g), and DMF (15 mL) were mixed and the reaction solution was heated and stirred for 4 hours at 100° C. After the reaction solution was allowed to cool, the reaction solution was separately extracted with chloroform, and the solution was concentrated. The concentrated product was dissolved in chloroform and purified through a silica gel column. The solution was concentrated, thus obtaining 1,3-dibromo-5-ethoxycarbonyl-6-[2-[2-(2-methoxyethoxy)ethoxy]ethoxy]benzene (1.0 g).

Preparation Example 18

Synthesis of Polymer Compound F

Under an inert atmosphere, Compound A (0.2 g), Compound B (0.5 g), 1,3-dibromo-5-ethoxycarbonyl-6-[2-[2-(2-methoxyethoxy)ethoxy]ethoxy]benzene (0.1 g), triphenylphosphine palladium (30 mg), tetrabutylammonium bromide (4 mg), and toluene (19 mL) were mixed and the reaction solution was heated to 105° C. To the reaction liquid, 2M sodium carbonate aqueous solution (5 mL) was added dropwise and the reaction solution was refluxed for 5 hours. Phenylboronic acid (6 mg) was added to the reaction liquid, and the mixture was refluxed for 14 hours. Subsequently, sodium diethyldithiacarbamate aqueous solution (10 mL, concentration: 0.05 g/mL) was added and the mixture was stirred for 2 hours. The water layer was removed, and the organic layer was washed with distilled water. The organic layer was concentrated, and the obtained solid was dissolved in chloroform and purified through an alumina column and a silica gel column. The eluted solution from the column was concentrated and dried. A yield of obtained Polymer Compound F was 0.44 g.

The polystyrene-equivalent number average molecular weight of Polymer Compound F was $3.6\times10^4$. Polymer Compound F is made of a structural unit represented by Formula (N).

[Chemical Formula 181]

(N)

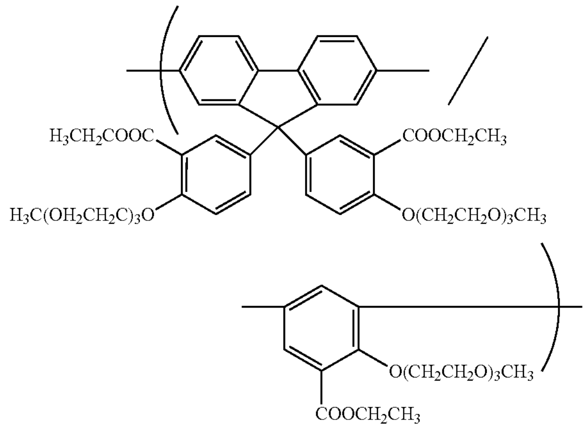

(75:25 mol %)

Preparation Example 19

Synthesis of Cesium Salt of Polymer Compound F (Conjugated Polymer Compound 9)

Polymer Compound F (200 mg) was placed in a 100 mL flask and the gas in the flask was replaced with nitrogen. THF (14 mL) and methanol (7 mL) were added and mixed. To the mixed solution, an aqueous solution in which cesium hydroxide (90 mg) was dissolved in water (1 mL) was added, and the reaction solution was stirred for 1 hour at 65° C. To the reaction solution, 5 mL of methanol was added and the mixture was further stirred for 4 hours at 65° C. After the mixture was cooled to room temperature, the reaction solvent was removed by distillation under reduced pressure. A generated solid was washed with water and dried under reduced pressure, thus obtaining a light yellow solid (190 mg). From NMR spectrum, complete disappearance of the signal derived from ethyl groups at the ethyl ester portion in Polymer Compound F was confirmed. The obtained cesium salt of Polymer Compound F is called Conjugated Polymer Compound 9. Conjugated Polymer Compound 9 is made of a structural unit represented by Formula (O).

[Chemical Formula 182]

(O)

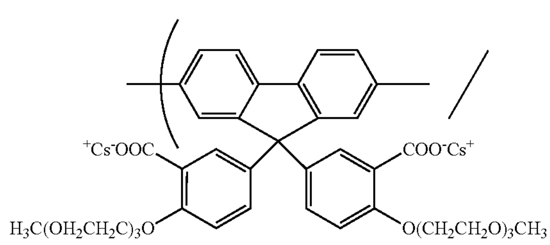

-continued

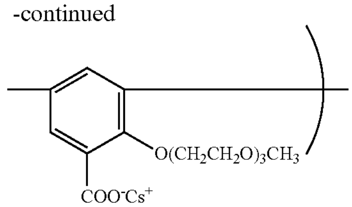

(75:25 mol %)

An orbital energy of HOMO of Conjugated Polymer Compound 9 was −5.6 eV and an orbital energy of LUMO was −2.8 eV.

Preparation Example 20

Synthesis of Compound C

Under a nitrogen atmosphere, 2,7-dibromo-9-fluorenone (92.0 g, 272 mmol) and diethyl ether (3.7 L) were mixed and cooled to 0° C., and 1 mol/L of methyl iodide magnesium-diethyl ether solution (0.5 L, 545 mmol) was added dropwise. The reaction mixture was stirred for 3 hours. An ammonium chloride aqueous solution was added to the reaction mixture and the water layer was removed. The organic layer was dried over anhydrous sodium sulfate and concentrated under reduced pressure. The obtained crude product was purified by silica gel column chromatography, thus obtaining Compound C (92.81 g, 262 mmol, and yield 96%).

[Chemical Formula 183]

Compound C

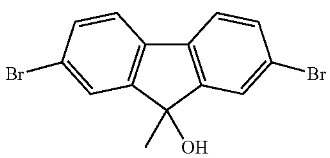

Preparation Example 21

Synthesis of Compound D

Under a nitrogen atmosphere, Compound C (83.0 g, 234 mmol), p-toluenesulfonic acid monohydrate (4.49 g, 23.6 mmol), and chloroform (2.5 L) were refluxed for 1 hour. An ammonium chloride aqueous solution was added to the reaction mixture and the water layer was removed. The organic layer was dried over anhydrous sodium sulfate and concentrated under reduced pressure, thus obtaining Compound D (73.6 g, 219 mmol, and yield 93%).

[Chemical Formula 184]

Compound D

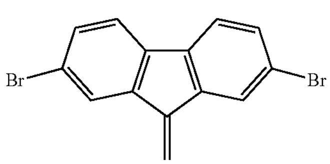

Preparation Example 22

Synthesis of Compound E

Under a nitrogen atmosphere, Compound D (70.0 g, 208 mmol), ethyl salicylate (104 g, 625 mmol), mercaptoacetic acid (4.20 g, 45.6 mmol), and methane sulfonic acid (1214 g) were stirred for 8 hours at 70° C. The reaction mixture was added dropwise into ice water and a deposited solid was recovered by filtration. The solid was washed with methanol. The crude product was purified by silica gel column chromatography, thus obtaining Compound E (52.14 g, 104 mmol, and yield 50%).

[Chemical Formula 185]

Compound E

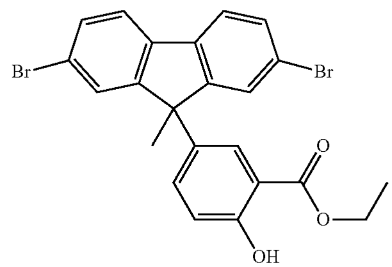

Preparation Example 23

Synthesis of Compound F

Under a nitrogen atmosphere, Compound E (41.2 g, 82.0 mmol), 2-[2-(2-methoxyethoxy)ethoxy]-ethyl-p-toluenesulfonate (75.8 g, 238 mmol), dimethylformamide (214 g), potassium carbonate (54.4 g, 394 mmol), and 18-crown-6 (4.68 g, 18 mmol) were stirred for 2 hours at 105° C. Water was added to the reaction mixture and the obtained mixture was extracted with ethyl acetate. The organic layer was dried over anhydrous sodium sulfate and concentrated under reduced pressure. The obtained crude product was purified by silica gel column chromatography, thus obtaining Compound F (40.2 g, 62.0 mmol, and yield 76%).

$^1$H NMR (400 MHz, $CDCl_3$, rt): δ (ppm)=1.37 (3H), 1.84 (3H), 3.36 (3H), 3.53 (2H), 3.58-3.79 (6H), 3.73 (2H), 4.12 (2H), 4.34 (2H), 6.80 (1H), 6.90 (1H), 7.28 (2H), 7.48 (2H), 7.58 (2H), 7.70 (1H).

[Chemical Formula 186]

Compound F

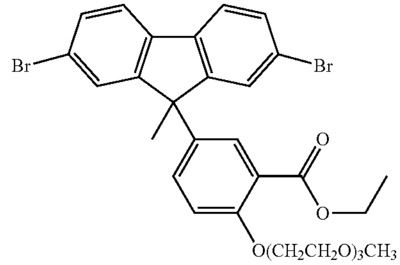

Preparation Example 24

Synthesis of Compound G

Under a nitrogen atmosphere, Compound F (28.4 g, 43.8 mmol), bis(pinacolato)diboron (24.30 g, 95.7 mol), dichloromethane adduct of [1,1'-bis(diphenylphosphino)ferrocene]palladium (II) dichloride (0.35 g, 0.4 mmol), 1,1'-bis(diphenylphosphino)ferrocene (0.24 g, 0.4 mmol), potassium acetate (25.60 g, 260 mmol), and 1,4-dioxane (480 mL) were stirred for 17 hours at 120° C., and the reaction mixture was filtered and washed with ethyl acetate. The filtrate was concentrated under reduced pressure and purified by silica gel column chromatography. Subsequently, the product was purified by recrystallization, thus obtaining Compound G (18.22 g, 24.5 mmol, and yield 56%).

$^1$H NMR (400 MHz, $CDCl_3$, rt): δ (ppm)=1.30-1.47 (27H), 1.88 (3H), 3.35 (3H), 3.53 (2H), 3.60-3.69 (4H), 3.73 (2H), 3.84 (2H), 4.10 (2H), 4.34 (2H), 6.74 (1H), 6.87 (1H), 7.58 (2H), 7.72-7.89 (5H).

[Chemical Formula 187]

Compound G

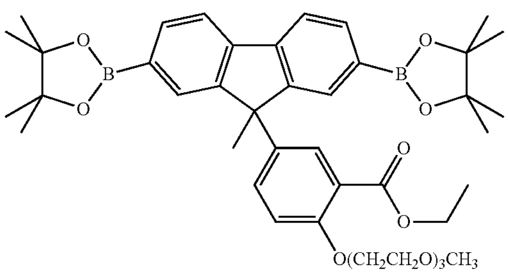

Preparation Example 25

Synthesis of Polymer Compound G

Under an argon atmosphere, Compound F (0.47 g), Compound G (0.48 g), dichloro bis(triphenylphosphine) palladium (0.6 mg), tetrabutylammonium bromide (6 mg), toluene (6 mL), and 2 mol/L sodium carbonate aqueous solution (2 mL) were stirred for 6 hours at 105° C. Subsequently, phenylboronic acid (35 mg) was added and the reaction mixture was stirred for 14 hours at 105° C. Sodium diethyldithiocarbamate trihydrate (0.65 g) and water (13 mL) were added to the reaction mixture, and the obtained mixture was stirred for 2 hours at 80° C. The mixture was added dropwise into methanol, and the deposit was recovered by filtration and dried. The solid was dissolved in chloroform and purified by alumina and silica gel column chromatography. The eluted solution was added dropwise into methanol, and the deposit was recovered by filtration and dried, thus obtaining Polymer Compound G (0.57 g).

The polystyrene-equivalent number average molecular weight of Polymer Compound G was $2.0\times10^4$. Polymer Compound G is made of a structural unit represented by Formula (P).

[Chemical Formula 188]

(P)

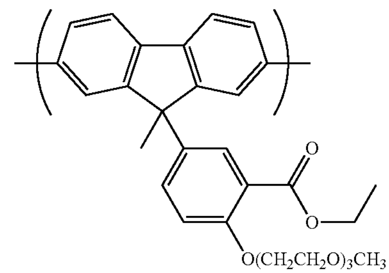

Preparation Example 26

Synthesis of Cesium Salt of Polymer Compound G (Conjugated Polymer Compound 10)

Under an argon atmosphere, Polymer Compound G (0.20 g), THF (18 mL), methanol (9 mL), cesium hydroxide monohydrate (97 mg), and water (1 mL) were stirred for 2 hours at 65° C. Subsequently, methanol (52 mL) was added and the reaction mixture was stirred for 6 hours at 65° C. The reaction mixture was concentrated and dried. Methanol was added to the solid and the mixture was filtered. The filtrate was added dropwise into isopropanol, and the solid was recovered by filtration, thus obtaining a cesium salt of Polymer Compound G (0.20 g). The obtained cesium salt of Polymer Compound G is called Conjugated Polymer Compound 10. Conjugated Polymer Compound 10 is made of a structural unit represented by Formula (Q).

[Chemical Formula 189]

(Q)

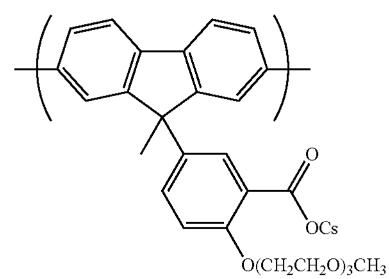

An orbital energy of HOMO of Conjugated Polymer Compound 10 was −5.51 eV and an orbital energy of LUMO was −2.64 eV.

Preparation Example 27

Synthesis of Polymer Compound H

Under an argon atmosphere, Compound F (0.528 g), Compound G (0.493 g), dichloro bis(triphenylphosphine) palladium (0.56 mg), N,N'-bis(4-bromophenyl)-N,N'-bis(4- tert-butyl-2,6-dimethylphenyl)1,4-phenylenediamine (35.8 mg), methyltrioctylammonium chloride (manufactured by Sigma-Aldrich Corp., trade name Aliquat 336 (registered trademark)) (8.10 mg, 0.0200 mmol), toluene (20 mL), and 2 mol/L sodium carbonate aqueous solution (10 mL) were stirred for 6 hours at 105° C. Subsequently, phenylboronic acid (35 mg) was added and the reaction mixture was stirred for 14 hours at 105° C. Sodium diethyldithiocarbamate trihydrate (0.72 g) and water (14 mL) were added to the reaction mixture, and the obtained mixture was stirred for 2 hours at 80° C. The mixture was added dropwise into methanol, and the deposit was recovered by filtration and dried. The solid was dissolved in chloroform and purified by alumina and silica gel column chromatography. The eluted solution was concentrated and dried. The concentrated product was dissolved in toluene and the solution was added dropwise into methanol. The deposit was recovered by filtration and dried, thus obtaining Polymer Compound H (0.31 g).

The polystyrene-equivalent number average molecular weight of Polymer Compound H was $1.8\times10^4$. Polymer Compound H is made of a structural unit represented by Formula (R).

[Chemical Formula 190]

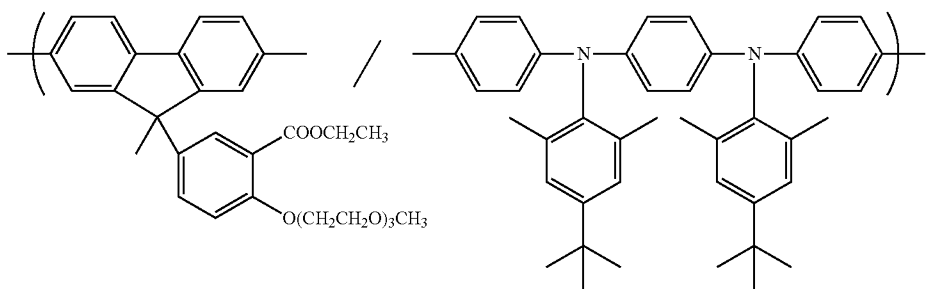

(R)

(95:5 mol %)

Preparation Example 28

Synthesis of Cesium Salt of Polymer Compound H (Conjugated Polymer Compound 11)

Under an argon atmosphere, Polymer Compound H (0.15 g), THF (20 mL), methanol (10 mL), cesium hydroxide monohydrate (103 mg), and water (1 mL) were stirred for 2 hours at 65° C. Subsequently, methanol (20 mL) was added and the reaction mixture was stirred for 2 hours at 65° C. The reaction mixture was concentrated and dried. Methanol was added to the solid and the mixture was filtered. The filtrate was added dropwise into isopropanol, and the solid was recovered by filtration, thus obtaining a cesium salt of Polymer Compound H (0.15 g). The obtained cesium salt of Polymer Compound H is called Conjugated Polymer Compound 11. Conjugated Polymer Compound 11 is made of a structural unit represented by Formula (S).

[Chemical Formula 191]

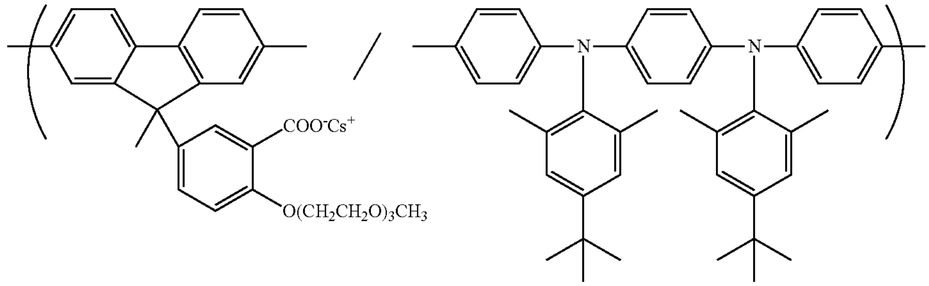

(S)

(95:5 mol %)

An orbital energy of HOMO of Conjugated Polymer Compound 11 was −5.23 eV and an orbital energy of LUMO was −2.36 eV.

Preparation Example 29

Synthesis of 2,7-dibromo-9,9-bis(3,4-dihydroxy)-fluorene

Under nitrogen gas stream, 2,7-dibromo-9-fluorenone (121.9 g), catechol (883.1 g), and 3-mercaptopropionic acid (4.87 g), and concentrated sulfuric acid (18.4 g) were mixed and stirred for 2 hours at 125° C. The mixture was allowed to cool and added to ice water. The generated solid was separated by filtration. The obtained solid was dissolved in ethanol, and the ethanol solution was added to hexane. The generated solid was separated by filtration, thus obtaining 2,7-dibromo-9,9-bis(3,4-dihydroxy)-fluorene (168.1 g) represented by the following formula.

[Chemical Formula 192]

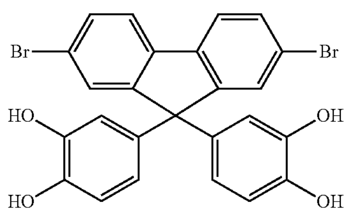

Preparation Example 30

Synthesis of Compound H

Under nitrogen gas stream, 2,7-dibromo-9,9-bis(3,4-dihydroxy)-fluorene (138.4 g), 2-[2-(2-methoxyethoxy)ethoxy]-ethyl-p-toluenesulfonate (408.6 g), potassium carbonate (358.5 g), and acetonitrile (2.5 L) were mixed and the mixture was refluxed for 3 hours. After the reaction mixture was allowed to cool, the reaction mixture was filtered and the filtrate was concentrated under reduced pressure. The concentrated filtrate was purified by silica gel column chromatography, thus obtaining Compound H (109.4).

[Chemical Formula 193]

Compound H

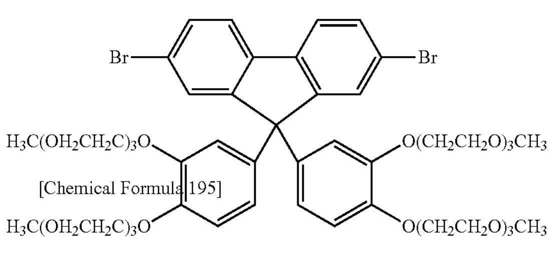

[Chemical Formula 195]

Preparation Example 31

Synthesis of Compound I

Under a nitrogen atmosphere, Compound H (101.2 g), bis(pinacolato)diboron (53.1 g), dichloromethane complex of [1,1'-bis(diphenylphosphino)ferrocene]dichloro-palladium (II) (3.7 g), 1,1'-bis(diphenylphosphino)ferrocene (5.4 g), potassium acetate (90.6 g), and dioxane (900 mL) were mixed and the reaction solution was heated to 110° C. and reflexed for 8 hours. After allowed to cool, the reaction liquid was filtered and the filtrate was concentrated under reduced pressure. The concentrated filtrate was purified by silica gel column chromatography, thus obtaining Compound I (51.4 g).

[Chemical Formula 194]

Compound I

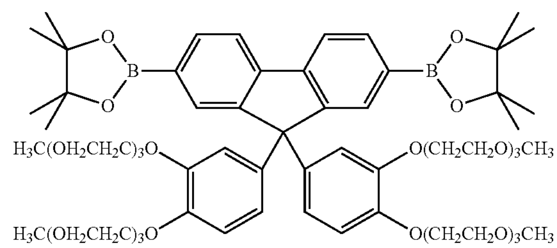

Preparation Example 32

Synthesis of Polymer Compound I

Compound G (0.360 g), Compound I (0.273 g), Compound H (0.493 g), N,N'-bis(4-bromophenyl)-N,N'-bis(4-tert-butyl-2,6-dimethylphenyl)1,4-phenylenediamine (35.8 mg), aliquot 336 (8.10 mg), bis(triphenylphosphine)dichloro palladium (1.12 mg), 2 mol/L of sodium carbonate aqueous solution (15 mL), and toluene (20 mL) were stirred for 6 hours at 105° C. Subsequently, phenylboronic acid (39 mg) was added and the obtained mixture was stirred for 6 hours at 105° C. Sodium diethyldithiocarbamate trihydrate (0.72 g) and water (14 mL) were added to the reaction mixture, and the obtained mixture was stirred for 2 hours at 80° C. The mixture was added dropwise into methanol, and the deposit was recovered by filtration and dried. The solid was dissolved in chloroform and purified by alumina and silica gel column chromatography. The eluted solution was concentrated and dried. The concentrated product was dissolved in toluene and the solution was added dropwise into methanol. The deposit was recovered by filtration and dried, thus obtaining Polymer Compound I (0.41 g).

The polystyrene-equivalent number average molecular weight of Polymer Compound I was $2.0\times10^4$. Polymer Compound I is made of a structural unit represented by Formula (T).

(T)

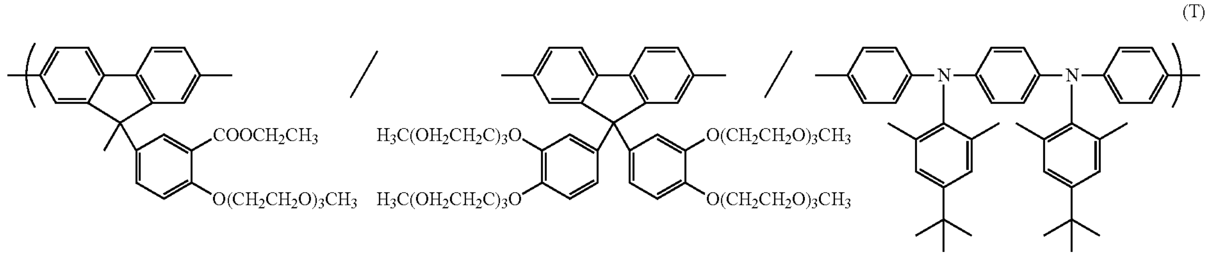

(82:15:3 mol %)

Preparation Example 33

Synthesis of Cesium Salt of Polymer Compound I (Conjugated Polymer Compound 12)

Under an argon atmosphere, Polymer Compound I (0.15 g), THF (20 mL), methanol (10 mL), cesium hydroxide monohydrate (103 mg), and water (1 mL) were stirred for 2 hours at 65° C. Subsequently, methanol (20 mL) was added and the mixture was stirred for 2 hours at 65° C. The reaction mixture was concentrated and dried. Methanol was added to the solid and the mixture was filtered. The filtrate was added dropwise into isopropanol, and the solid was recovered by filtration and dried, thus obtaining a cesium salt of Polymer Compound I (0.17 g). The obtained cesium salt of Polymer Compound I is called Conjugated Polymer Compound 12. Conjugated Polymer Compound 12 is made of a structural unit represented by Formula (U).

[Chemical Formula 196]

(U)

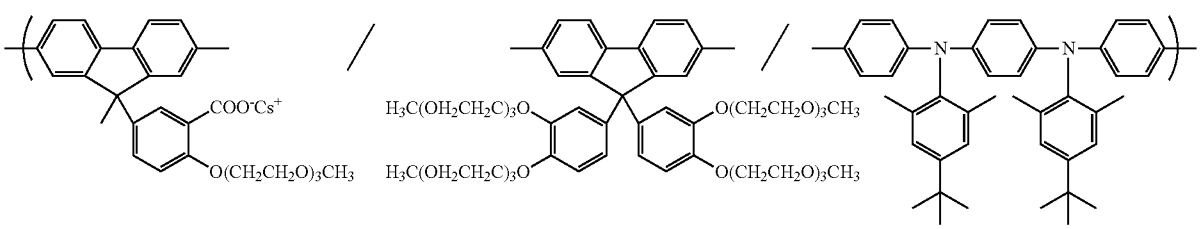

(82:15:3 mol %)

An orbital energy of HOMO of Conjugated Polymer Compound 12 was −5.25 eV and an orbital energy of LUMO was −2.38 eV.

Preparation Example 34

Synthesis of Polymer Compound J

Compound I (0.715 g), Compound F (0.426 g), methyltrioctylammonium chloride (manufactured by Sigma-Aldrich Co., trade name Aliquat 336 (trademark)) (6.60 mg), bis(triphenylphosphine)dichloro palladium (0.460 mg), 2 mol/L sodium carbonate aqueous solution (10 mL), and toluene (20 mL) were added and the mixture was stirred at 105° C. Toluene (20 ml) was stirred for 5 hours at 105° C. Subsequently, phenylboronic acid (32 mg) was added and the mixture was stirred for 6 hours at 105° C. Sodium diethyldithiocarbamate trihydrate (0.72 g) and water (14 mL) were added to the reaction mixture, and the obtained mixture was stirred for 2 hours at 80° C. The mixture was added dropwise into methanol, and the deposit was recovered by filtration and dried. The solid was dissolved in chloroform and purified by alumina and silica gel column chromatography. The eluted solution was concentrated and dried. The concentrated product was dissolved in toluene and the solution was added dropwise into methanol. The deposit was recovered by filtration and dried, thus obtaining Polymer Compound J (0.55 g).

The polystyrene-equivalent number average molecular weight of Polymer Compound J was $2.3\times10^4$. Polymer Compound J is made of a structural unit represented by Formula (V).

[Chemical Formula 197]

(V)

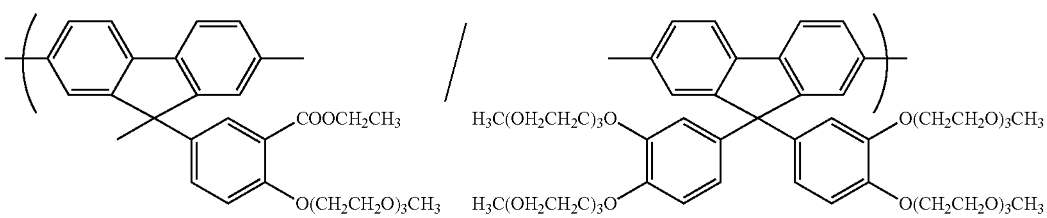

(50:50 mol %)

Preparation Example 35

Synthesis of Cesium Salt of Polymer Compound J (Conjugated Polymer Compound 13)

Under an argon atmosphere, Polymer Compound J (0.15 g), THF (20 mL), methanol (10 mL), cesium hydroxide monohydrate (103 mg), and water (1 mL) were stirred for 2 hours at 65° C. Subsequently, methanol (20 mL) was added and the mixture was stirred for 2 hours at 65° C. The reaction mixture was concentrated and dried, and methanol was added to the solid and the mixture was filtered. The obtained filtrate was concentrated and dried, and the obtained solid was dried after washed with water, thus obtaining a cesium salt of Polymer Compound J (0.14 g). The obtained cesium salt of Polymer Compound J is called Conjugated Polymer Compound 13. Conjugated Polymer Compound 13 is made of a structural unit represented by Formula (W).

Preparation Example 37

Synthesis of Compound K

Under a nitrogen atmosphere, Compound J (95.0 g), bis(pinacolato)diboron (108.5 g), dichloromethane adduct of [1,1'-bis(diphenylphosphino)ferrocene]palladium (II) dichloride (3.3 g), 1,1'-bis(diphenylphosphino)ferrocene (2.2 g), potassium acetate (117.2 g), and 1,4-dioxane (1.3 L) were stirred for 22 hours at 105° C. The reaction mixture was filtered and washed with dioxane and toluene. The filtrate was concentrated under reduced pressure and ethyl acetate was added. The mixture was washed with saturated saline. The organic layer was dried over anhydrous sodium sulfate and concentrated under reduced pressure. The obtained crude product was purified by silica gel column chromatography, thus obtaining Compound K (90.1 g, 308 mmol).

[Chemical Formula 198]

(W)

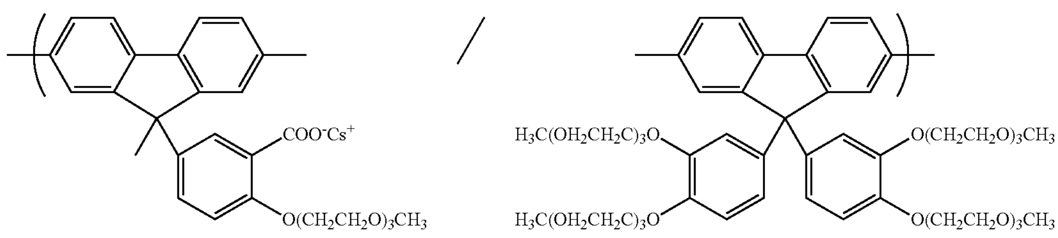

(50:50 mol %)

An orbital energy of HOMO of Conjugated Polymer Compound 13 was −5.56 eV and an orbital energy of LUMO was −2.67 eV.

[Chemical Formula 200]

Compound K

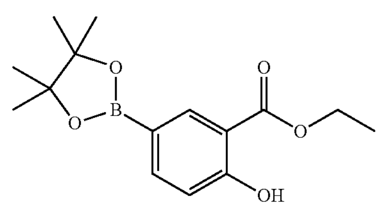

Preparation Example 36

Synthesis of Compound J

Under a nitrogen atmosphere, 5-bromo-2-hydroxybenzoic acid (92.85 g), ethanol (1140 mL), and concentrated sulfuric acid (45 mL) were refluxed for 48 hours. After the mixture was concentered under reduced pressure, ethyl acetate was added and the organic layer was washed with water and 10% by weight sodium carbonate aqueous solution. The organic layer was dried over anhydrous sodium sulfate and concentrated under reduced pressure. The obtained crude product was purified by silica gel column chromatography, thus obtaining Compound J (95.38 g, yield 91%).

[Chemical Formula 199]

Compound J

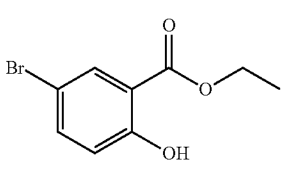

Preparation Example 38

Synthesis of Compound L

Under a nitrogen atmosphere, 1,5-dihydroxynaphthalene (15.0 g), triethylamine (28.5 g), and chloroform (150 mL) were mixed and cooled to 0° C. Trifluoromethanesulfonic acid anhydride (68.7 g) was added dropwise, and the reaction mixture was stirred for 1 hour. Water and chloroform were added to the reaction mixture. The water layer was removed and the organic layer was washed with water. The organic layer was dried over anhydrous sodium sulfate and concentrated under reduced pressure. The obtained solid was purified by recrystallization, thus obtaining Compound L (31.46 g). In the following formula, Tf represents a trifluoromethylsulfonyl group.

[Chemical Formula 201]

Compound L

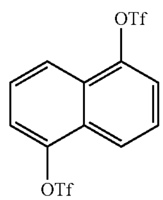

Preparation Example 39

Synthesis of Compound M

Under a nitrogen atmosphere, Compound L (16.90 g), Compound K (23.30 g), tetrakis(triphenylphosphine) palladium (0) (4.60 g), potassium phosphate (42.30 g), and 1,2-dimethoxyethane (340 mL) were stirred for 14 hours at 80° C., and the reaction mixture was filtered and washed with chloroform and methanol. The filtrate was concentrated under reduced pressure and the concentrate product was purified by silica gel column chromatography, thus obtaining Compound M (8.85 g).

[Chemical Formula 202]

Compound M

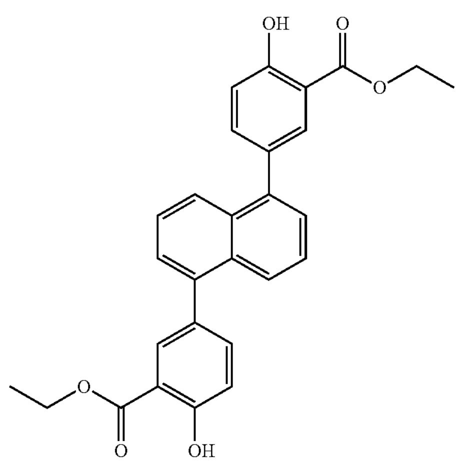

Preparation Example 40

Synthesis of Compound N

Under a nitrogen atmosphere, Compound M (8.80 g), 2-[2-(2-methoxyethoxy)ethoxy]-ethyl-p-toluenesulfonate (12.52 g), dimethylformamide (380 mL), potassium carbonate (13.32 g), and 18-crown-6 (1.02 g) were stirred for 23 hours at 100° C. The reaction mixture was added to water and extracted with ethyl acetate. The organic layer was washed with a sodium chloride aqueous solution, dried over anhydrous sodium sulfate, and concentrated under reduced pressure. The obtained crude product was purified by silica gel column chromatography, thus obtaining Compound N (7.38 g)

[Chemical Formula 203]

Compound N

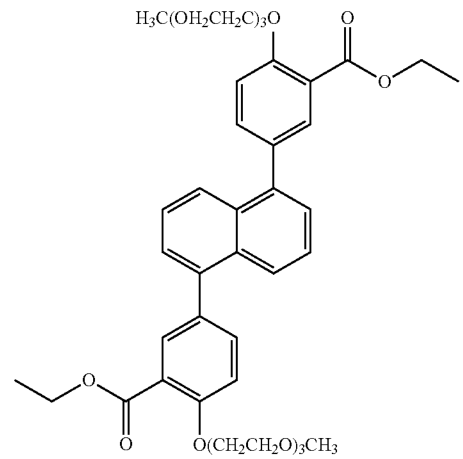

Preparation Example 41

Synthesis of Compound O

Under a nitrogen atmosphere, Compound N (5.53 g), bis(pinacolato)diboron (11.25 g), (1,5-cyclooctadiene) (methoxy) iridium (I) dimer (0.15 g, manufactured by Sigma-Aldrich Co., Ltd.), 4,4'-di-tert-butyl-2,2'-dipyridyl (0.12 g, manufactured by Sigma-Aldrich Co., Ltd.), and 1,4-dioxane (300 mL) were stirred for 19 hours at 110° C., and the reaction mixture was concentrated under reduced pressure. The crude product was purified by silica gel column chromatography, and subsequently, the product was purified by recrystallization, thus obtaining Compound O (5.81 g).

$^{1}H$ NMR (400 MHz, $CDCl_3$, rt): δ (ppm)=1.27-1.41 (30H), 3.39 (6H), 3.57 (4H), 3.66-3.75 (8H), 3.83 (4H), 3.99 (4H), 4.27-4.42 (8H), 7.13 (2H), 7.60 (2H), 7.76 (2H), 7.93 (2H), 8.30 (2H).

[Chemical Formula 204]

Compound O

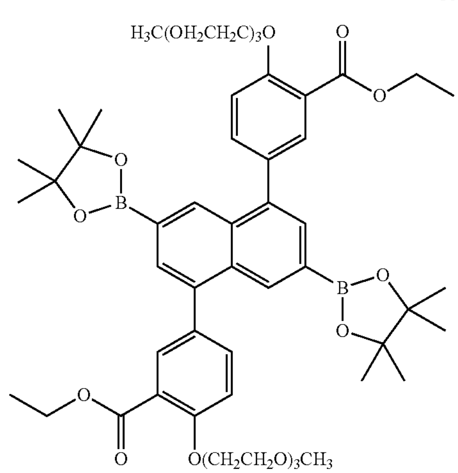

Preparation Example 42

Synthesis of Polymer Compound K

Under an argon atmosphere, Compound H (0.53 g), Compound O (0.43 g), dichlorobis(triphenylphosphine) palladium (0.3 mg), Aliquat 336 (5 mg, manufactured by Sigma-Aldrich Co., Ltd.), toluene (12 mL), and 2 mol/L sodium carbonate aqueous solution (1 mL) were stirred for 9 hours at 105° C. Subsequently, phenylboronic acid (23 mg) was added and the mixture was stirred for 14 hours at 105° C. Sodium diethyldithiocarbamate trihydrate (0.40 g) and water (8 mL) were added to the reaction mixture, and the obtained mixture was stirred for 2 hours at 80° C. The mixture was added dropwise into methanol, and the deposit was recovered by filtration and dried. The solid was dissolved in chloroform and purified by alumina and silica gel column chromatography. The eluted solution was added dropwise into methanol, and the deposit was recovered by filtration and dried, thus obtaining Polymer Compound K (0.56 g).

The polystyrene-equivalent number average molecular weight of Polymer Compound K was $3.4\times10^4$. Polymer Compound K is made of a structural unit represented by Formula (W).

[Chemical Formula 205]

(W)

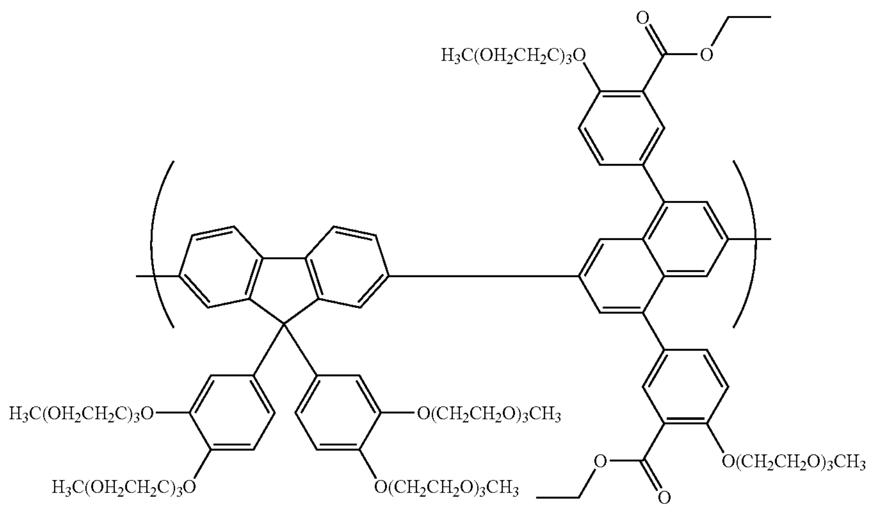

Preparation Example 43

Synthesis of Cesium Salt of Polymer Compound K (Conjugated Polymer Compound 14)

Under an argon atmosphere, Polymer Compound K (0.25 g), THF (13 mL), methanol (6 mL), cesium hydroxide monohydrate (69 mg), and water (1 mL) were stirred for 6 hours at 65° C. The reaction mixture was concentrated and added dropwise into isopropanol, and the solid was recovered by filtration and dried. Methanol was added to the solid and the mixture was filtered. The filtrate was added dropwise into isopropanol, and the obtained solid was recovered by filtration and dried, thus obtaining a cesium salt of Polymer Compound K (0.19 g). The obtained cesium salt of Polymer Compound K is called Conjugated Polymer Compound 14. Conjugated Polymer Compound 14 is made of a structural unit represented by Formula (X).

[Chemical Formula 206]

(X)

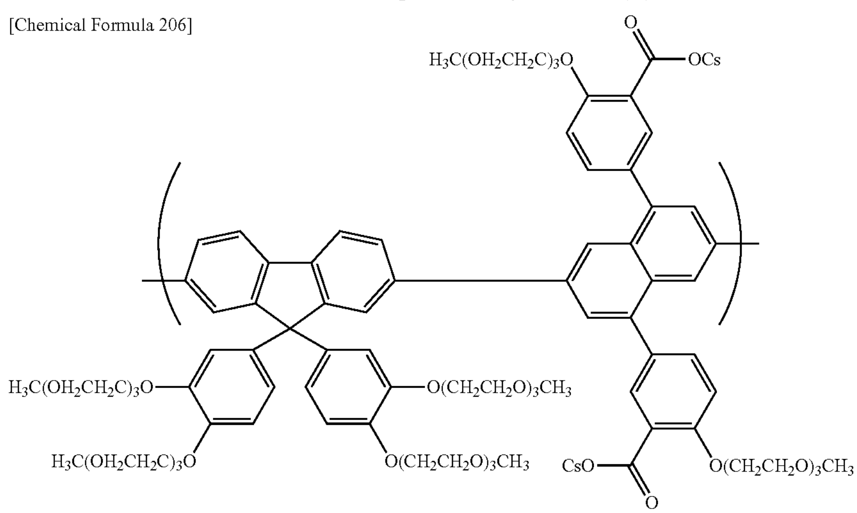

An orbital energy of HOMO of Conjugated Polymer Compound 14 was −5.50 eV and an orbital energy of LUMO was −2.65 eV.

Preparation Example 44

Synthesis of Compound P

Under a nitrogen atmosphere, Compound K (60.01 g), 1,4-dibromo-2-iodobenzene (111.61 g, synthesized by the method described in Angew. Chem. Int. Ed. 2008, 888-890), tetrakis(triphenylphosphine) palladium (0) (12.32 g), silver carbonate (84.95 g), and THF (1200 mL) were stirred for 11 hours at 65° C. The reaction mixture was filtered and washed with THF and toluene. The filtrate was concentrated under reduced pressure and the concentrated filtrate was purified by silica gel column chromatography, thus obtaining Compound P (36.82 g).

[Chemical Formula 207]

Compound P

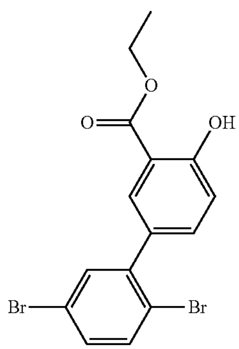

Preparation Example 45

Synthesis of Compound Q

Under a nitrogen atmosphere, Compound P (22.0 g), 2-[2-(2-methoxyethoxy)ethoxy]-ethyl-p-toluenesulfonate (17.8 g), dimethylformamide (370 mL), potassium carbonate (18.31 g), and 18-crown-6 (2.30 g) were stirred for 14 hours at 95° C. Water was added to the reaction mixture and extracted with ethyl acetate. The organic layer was washed with a saturated saline, dried over anhydrous sodium sulfate, and concentrated under reduced pressure. The obtained crude product was purified by silica gel column chromatography, thus obtaining Compound Q (26.30 g)

$^1$H NMR (400 MHz, $CDCl_3$, rt): δ (ppm)=1.38 (3H), 3.38 (3H), 3.55 (2H), 3.62-3.71 (4H), 3.78 (2H), 3.93 (2H), 4.25 (2H), 4.36 (2H), 7.04 (1H), 7.32 (1H), 7.44-7.53 (3H), 7.80 (1H).

[Chemical Formula 208]

Compound Q

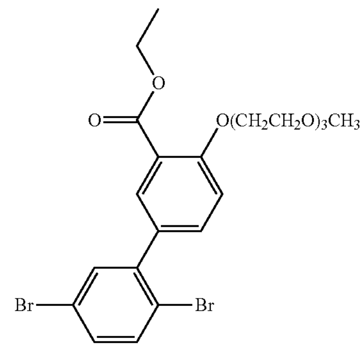

Preparation Example 46

Synthesis of Polymer Compound L

Under an argon atmosphere, Compound I (1.09 g), Compound Q (0.41 g), dichloro bis(triphenylphosphine) palladium (1.1 mg), methyltrioctylammonium chloride (manufactured by Sigma-Aldrich Co., Ltd., trade name Aliquat 336 (registered trademark)) (8 mg), toluene (18 mL), and 2 mol/L sodium carbonate aqueous solution (2 mL) were stirred for 23 hours at 105° C., and subsequently, phenylboronic acid (37 mg) was added and the mixture was stirred for 6 hours at 105° C. Water was added to the reaction mixture and the organic layer was concentrated under reduced pressure, thus obtaining Polymer Compound L (1.26 g).

The polystyrene-equivalent number average molecular weight of Polymer Compound L was $8\times10^3$. Polymer Compound L is made of a structural unit represented by Formula (Y).

[Chemical Formula 209]

(Y)

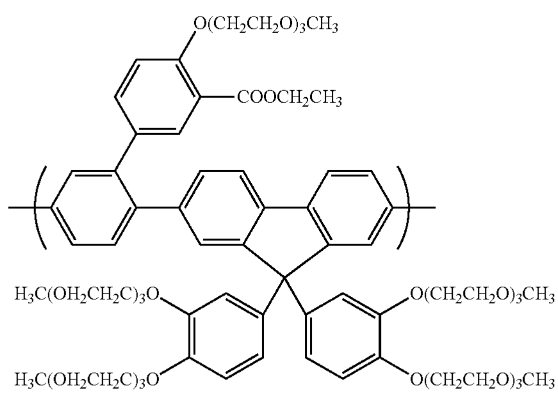

Preparation Example 47

Synthesis of Cesium Salt of Polymer Compound L (Conjugated Polymer Compound 15)

Under an argon atmosphere, Polymer Compound L (0.20 g), THF (13 mL), methanol (6 mL), cesium hydroxide monohydrate (40 mg), and water (1 mL) were stirred for 4 hours at 70° C., and the reaction mixture was concentrated under reduced pressure. Water was added to the solid and the mixture was filtered. The solid was dried, thus obtaining a cesium salt of Polymer Compound L (0.19 g). The obtained cesium salt of Polymer Compound L is called Conjugated Polymer Compound 15. Conjugated Polymer Compound 15 is made of a structural unit represented by Formula (Z).

[Chemical Formula 210]

(Z)

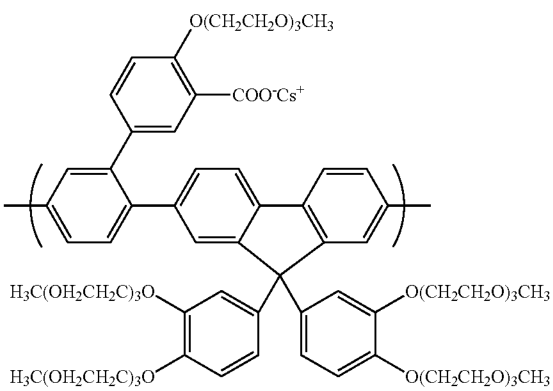

An orbital energy of HOMO of Conjugated Polymer Compound 15 was −5.67 eV and an orbital energy of LUMO was −2.59 eV.

Example 1

Preparation of Composition 1

Conjugated Polymer Compound 1 (2 mg) and cesium hydroxide monohydrate (0.2 mg) were mixed, thus obtaining Composition 1 made of Conjugated Polymer Compound 1 and cesium hydroxide.

Example 2

Preparation of Composition 2

Conjugated Polymer Compound 2 (2 mg) and cesium hydroxide monohydrate (0.2 mg) were mixed, thus obtaining Composition 2 made of Conjugated Polymer Compound 2 and cesium hydroxide.

Example 3

Preparation of Composition 3

Conjugated Polymer Compound 3 (2 mg) and cesium hydroxide monohydrate (0.2 mg) were mixed, thus obtaining Composition 3 made of Conjugated Polymer Compound 3 and cesium hydroxide.

Example 4

Preparation of Composition 4

Conjugated Polymer Compound 4 (2 mg) and cesium hydroxide monohydrate (0.2 mg) were mixed, thus obtaining Composition 4 made of Conjugated Polymer Compound 4 and cesium hydroxide.

Example 5

Preparation of Composition 5

Conjugated Polymer Compound 5 (2 mg) and cesium hydroxide monohydrate (0.2 mg) were mixed, thus obtaining Composition 5 made of Conjugated Polymer Compound 5 and cesium hydroxide.

Example 6

Preparation of Composition 6

Conjugated Polymer Compound 6 (2 mg) and cesium hydroxide monohydrate (0.2 mg) were mixed, thus obtaining Composition 6 made of Conjugated Polymer Compound 6 and cesium hydroxide.

Example 7

Preparation of Composition 7

Conjugated Polymer Compound 7 (2 mg) and cesium hydroxide monohydrate (0.2 mg) were mixed, thus obtaining Composition 7 made of Conjugated Polymer Compound 7 and cesium hydroxide.

Example 8

Preparation of Composition 8

Conjugated Polymer Compound 8 (2 mg) and cesium hydroxide monohydrate (0.2 mg) were mixed, thus obtaining Composition 8 made of Conjugated Polymer Compound 8 and cesium hydroxide.

Example 9

Preparation of Composition 9

Conjugated Polymer Compound 9 (2 mg) and cesium hydroxide monohydrate (0.2 mg) were mixed, thus obtaining Composition 9 made of Conjugated Polymer Compound 9 and cesium hydroxide.

Example 10

Preparation of Composition 10

Conjugated Polymer Compound 10 (2 mg) and cesium hydroxide monohydrate (0.2 mg) were mixed, thus obtaining Composition 10 made of Conjugated Polymer Compound 10 and cesium hydroxide.

Example 11

Preparation of Composition 11

Conjugated Polymer Compound 11 (2 mg) and cesium hydroxide monohydrate (0.2 mg) were mixed, thus obtaining Composition 11 made of Conjugated Polymer Compound 11 and cesium hydroxide.

Example 12

Preparation of Composition 12

Conjugated Polymer Compound 12 (2 mg) and cesium hydroxide monohydrate (0.2 mg) were mixed, thus obtaining Composition 12 made of Conjugated Polymer Compound 12 and cesium hydroxide.

Example 13

Preparation of Composition 13

Conjugated Polymer Compound 13 (2 mg) and cesium hydroxide monohydrate (0.2 mg) were mixed, thus obtaining Composition 13 made of Conjugated Polymer Compound 13 and cesium hydroxide.

Example 14

Preparation of Composition 14

Conjugated Polymer Compound 14 (2 mg) and cesium hydroxide monohydrate (0.2 mg) were mixed, thus obtaining Composition 14 made of Conjugated Polymer Compound 14 and cesium hydroxide.

Example 15

Preparation of Composition 15

Conjugated Polymer Compound 15 (2 mg) and cesium hydroxide monohydrate (0.2 mg) were mixed, thus obtaining Composition 15 made of Conjugated Polymer Compound 15 and cesium hydroxide.

Example 16

Preparation of Composition 16

Conjugated Polymer Compound 10 (2 mg) and cesium hydroxide monohydrate (0.1 mg) were mixed, thus obtaining Composition 16 made of Conjugated Polymer Compound 10 and cesium hydroxide.

Example 17

Preparation of Composition 17

Conjugated Polymer Compound 10 (2 mg) and cesium hydroxide monohydrate (0.4 mg) were mixed, thus obtaining Composition 17 made of Conjugated Polymer Compound 10 and cesium hydroxide.

Example 18

Preparation of Composition 18

Conjugated Polymer Compound 10 (2 mg) and cesium hydroxide monohydrate (1 mg) were mixed, thus obtaining Composition 18 made of Conjugated Polymer Compound 10 and cesium hydroxide.

Example 19

Preparation of Composition 19

Conjugated Polymer Compound 1 (2 mg) and cesium acetate (0.2 mg) were mixed, thus obtaining Composition 19 made of Conjugated Polymer Compound 1 and cesium acetate.

Example 20

Preparation of Composition 20

Conjugated Polymer Compound 1 (2 mg) and cesium benzoate (0.2 mg) were mixed, thus obtaining Composition 20 made of Conjugated Polymer Compound 1 and cesium benzoate.

Example 21

Preparation of Composition 21

Conjugated Polymer Compound 1 (2 mg) and sodium benzoate (0.2 mg) were mixed, thus obtaining Composition 21 made of Conjugated Polymer Compound 1 and sodium benzoate.

Preparation Example 48

Synthesis of Compound R

Under a nitrogen atmosphere, ethyl salicylate (5.0 g), 2-[2-(2-methoxyethoxy)ethoxy]-ethyl-p-toluenesulfonate (10.1 g), potassium carbonate (6.24 g), and dimethylformamide (20 mL) were stirred for 3 hours at 100° C., and the reaction mixture was added to water and the obtained mixture was extracted with chloroform. The organic layer was washed with water, dried over anhydrous sodium sulfate, and concentrated under reduced pressure. The obtained crude product was purified by silica gel column chromatography, thus obtaining Compound R (8.78 g)

[Chemical Formula 211]

Compound R

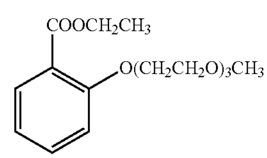

Preparation Example 49

Synthesis of Compound S

Under a nitrogen atmosphere, Compound R (1.00 g), methanol (5 mL), cesium hydroxide monohydrate (0.57 g), and water (2 mL) were stirred for 5 hours at 80° C., and the reaction mixture was concentrated under reduced pressure. The solid was dried, thus obtaining Compound S (1.36 g).

[Chemical Formula 212]

Compound S

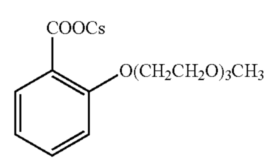

Example 22

Preparation of Composition 22

Conjugated Polymer Compound 1 (2 mg) and Compound S (0.2 mg) were mixed, thus obtaining Composition 22 made of Conjugated Polymer Compound 1 and Compound S.

Example 23

Preparation of Composition 23

Conjugated Polymer Compound 1 (2 mg) and potassium methoxide (0.2 mg) were mixed, thus obtaining Composition 23 made of Conjugated Polymer Compound 1 and potassium methoxide.

Example 24

Preparation of Composition 24

Conjugated Polymer Compound 1 (2 mg) and cesium carbonate (0.2 mg) were mixed, thus obtaining Composition 24 made of Conjugated Polymer Compound 1 and cesium carbonate.

Example 25

Preparation of Composition 25

Conjugated Polymer Compound 1 (2 mg) and sodium tetraphenylborate (0.2 mg) were mixed, thus obtaining Composition 25 made of Conjugated Polymer Compound 1 and sodium tetraphenylborate.

Example 26

Preparation of Electroluminescent Device 1

A hole injection material solution was applied onto an ITO anode (thickness: 45 nm) that was formed and patterned on a surface of a glass substrate by a spin coating method to form a film of a hole injection layer having a thickness of 60 nm. The glass substrate on which the film of the hole injection layer was formed was heated for 10 minutes at 200° C. under an inert atmosphere (under a nitrogen atmosphere) to insolubilize the hole injection layer. The substrate was naturally cooled to room temperature, thus obtaining a substrate on which the hole injection layer was formed.

Here, as the hole injection material solution, AQ-1200 being a polythiophene-sulfonic acid-based hole injection material obtained from Plextronics Inc. was used.

Subsequently, Hole Transport Polymer Material A and xylene were mixed, thus obtaining Hole Transport Layer Forming Composition A including 0.7% by weight of Hole Transport Polymer Material A.

Here, Hole Transport Polymer Material A was synthesized by the following method.

Under an inert gas atmosphere, 2,7-dibromo-9,9-di(octyl) fluorene (1.4 g), 2,7-bis(4,4,5,5-tetramethyl-1,3,2-dioxaborolan-2-yl)-9,9-di(octyl)fluorene (6.4 g), N,N-bis(4-bromophenyl)-N',N'-bis(4-butylphenyl)-1,4-phenylenediamine (4.1 g), bis(4-bromophenyl)benzocyclobuteneamine (0.6 g), tetraethylammonium hydroxide (1.7 g), palladium acetate (4.5 mg), tri(2-methoxy-phenyl)phosphine (0.03 g), and toluene (100 mL) were mixed and the mixture was heated and stirred for 2 hours at 100° C. Subsequently, phenylboronic acid (0.06 g) was added and the obtained mixture was stirred for 10 hours. After the mixture was allowed to cool, the water layer was removed. After sodium diethyldithiocarbamate aqueous solution was added and stirred, the water layer was removed and the organic layer was washed with water and 3% by weight acetic acid aqueous solution. After the organic layer was poured to methanol to precipitate a polymer, the polymer separated by filtration was dissolved in toluene again. The solution was flown though columns of silica gel and alumina. The eluted toluene solution including the polymer was recovered, and the recovered toluene solution was poured to methanol to precipitate the polymer. The precipitated polymer was separated by filteration and dried under vacuum at 50° C., thus obtaining Hole Transport Polymer Material A. The polystyrene-equivalent weight average molecular weight of Hole Transport Polymer Material A was $3.0\times10^5$.

Onto the above-obtained hole injection layer on the substrate on which the hole injection layer was formed, Hole Transport Layer Forming Composition A was applied by the spin coating method, thus obtaining a coating film having a thickness of 20 nm. After the substrate having the coating film was heated for 60 minutes at 180° C. under an inert atmosphere (a nitrogen atmosphere) to insolubilize the coating film, the substrate was naturally cooled to room temperature, thus obtaining the substrate on which a hole transport layer was formed.

Subsequently, Light Emitting Polymer Material A and xylene were mixed, thus obtaining Light Emitting Layer Forming Composition A including 1.4% by weight of Light Emitting Polymer Material A.

Here, Light Emitting Polymer Material A was synthesized by the following method.

Under an inert gas atmosphere, 2,7-dibromo-9,9-di(octyl) fluorene (9.0 g), N,N'-bis(4-bromophenyl)-N,N'-bis(4-tert-butyl-2,6-dimethylphenyl)1,4-phenylenediamine (1.3 g), 2,7-bis(4,4,5,5-tetramethyl-1,3,2-dioxaborolan-2-yl)-9,9-di (4-hexylphenyl)fluorene (13.4 g), tetraethylammonium hydroxide (43.0 g), palladium acetate (8 mg), tri(2-methoxyphenyl)phosphine (0.05 g), and toluene (200 mL) were mixed and the mixture was heated and stirred for 8 hours at 90° C. Subsequently, phenylboronic acid (0.22 g) was added and the obtained mixture was stirred for 14 hours. After the mixture was allowed to cool, the water layer was removed. After sodium diethyldithiocarbamate aqueous solution was added and stirred, the water layer was removed and the organic layer was washed with water and 3% by weight acetic acid aqueous solution. After the organic layer was poured to methanol to precipitate a polymer, the polymer separated by filtration was dissolved in toluene again. The solution was flown though columns of silica gel and alumina. The eluted toluene solution including the polymer was recovered, and the recovered toluene solution was poured to methanol to precipitate the polymer. The precipitated polymer was dried under vacuum at 50° C., thus obtaining Light Emitting Polymer Material A (12.5 g). According to gel permeation chromatography, the polystyrene-equivalent weight average molecular weight of Light Emitting Polymer Material A was $3.1\times10^5$.

Onto the above-obtained hole transport layer over the substrate over which the hole transport layer was formed, Light Emitting Layer Forming Composition A was applied by the spin coating method, thus obtaining a coating film having a thickness of 80 nm. After the substrate having the coating film was heated for 10 minutes at 130° C. under an inert atmosphere (a nitrogen atmosphere) to evaporate the solvent, the substrate was naturally cooled to room temperature, thus obtaining the substrate over which a light emitting layer was formed.

Methanol and Composition 1 were mixed, thus obtaining a solution including 0.2% by weight of Composition 1. Onto the light emitting layer of the above-obtained substrate over which the light emitting layer was formed, the solution was applied by the spin coating method, thus obtaining a coating film having a thickness of 10 nm. After the substrate having the coating film was heated for 10 minutes at 130° C. under an inert atmosphere (a nitrogen atmosphere) to evaporate the solvent, the substrate was naturally cooled to room temperature, thus obtaining the substrate over which a layer including Composition 1 was formed.

The above-obtained substrate over which a layer including Composition 1 was formed was inserted into vacuum apparatus. An Al film having a thickness of 80 nm was formed on the layer by a vacuum deposition method to form a cathode, and thereby Layered Structure 1 was prepared.

The above-obtained Layered Structure 1 was taken out from the vacuum apparatus and was sealed with sealing glasses and a two-component epoxy resin under an inert atmosphere (a nitrogen atmosphere), thus obtaining Electroluminescent Device 1.

Example 27

Preparation of Electroluminescent Device 2

Electroluminescent Device 2 was obtained in a similar manner to Example 26 except that Composition 2 was used instead of Composition 1 in Example 26.

Example 28

Preparation of Electroluminescent Device 3

Electroluminescent Device 3 was obtained in a similar manner to Example 26 except that Composition 3 was used instead of Composition 1 in Example 26.

Example 29

Preparation of Electroluminescent Device 4

Electroluminescent Device 4 was obtained in a similar manner to Example 26 except that Composition 4 was used instead of Composition 1 in Example 26.

Example 30

Preparation of Electroluminescent Device 5

Electroluminescent Device 5 was obtained in a similar manner to Example 26 except that Composition 5 was used instead of Composition 1 in Example 26.

Example 31

Preparation of Electroluminescent Device 6

Electroluminescent Device 6 was obtained in a similar manner to Example 26 except that Composition 6 was used instead of Composition 1 in Example 26.

Example 32

Preparation of Electroluminescent Device 7

Electroluminescent Device 7 was obtained in a similar manner to Example 26 except that Composition 7 was used instead of Composition 1 in Example 26.

Example 33

Preparation of Electroluminescent Device 8

Electroluminescent Device 8 was obtained in a similar manner to Example 26 except that Composition 8 was used instead of Composition 1 in Example 26.

Example 34

Preparation of Electroluminescent Device 9

Electroluminescent Device 9 was obtained in a similar manner to Example 26 except that Composition 9 was used instead of Composition 1 in Example 26.

Example 35

Preparation of Electroluminescent Device 10

Electroluminescent Device 10 was obtained in a similar manner to Example 26 except that Composition 10 was used instead of Composition 1 in Example 26.

Example 36

Preparation of Electroluminescent Device 11

Electroluminescent Device 11 was obtained in a similar manner to Example 26 except that Composition 11 was used instead of Composition 1 in Example 26.

Example 37

Preparation of Electroluminescent Device 12

Electroluminescent Device 12 was obtained in a similar manner to Example 26 except that Composition 12 was used instead of Composition 1 in Example 26.

Example 38

Preparation of Electroluminescent Device 13

Electroluminescent Device 13 was obtained in a similar manner to Example 26 except that Composition 13 was used instead of Composition 1 in Example 26.

Example 39

Preparation of Electroluminescent Device 14

Electroluminescent Device 14 was obtained in a similar manner to Example 26 except that Composition 14 was used instead of Composition 1 in Example 26.

Example 40

Preparation of Electroluminescent Device 15

Electroluminescent Device 15 was obtained in a similar manner to Example 26 except that Composition 15 was used instead of Composition 1 in Example 26.

Example 41

Preparation of Electroluminescent Device 16

Electroluminescent Device 16 was obtained in a similar manner to Example 26 except that Composition 16 was used instead of Composition 1 in Example 26.

Example 42

Preparation of Electroluminescent Device 17

Electroluminescent Device 17 was obtained in a similar manner to Example 26 except that Composition 17 was used instead of Composition 1 in Example 26.

Example 43

Preparation of Electroluminescent Device 18

Electroluminescent Device 18 was obtained in a similar manner to Example 26 except that Composition 18 was used instead of Composition 1 in Example 26.

Example 44

Preparation of Electroluminescent Device 19

Electroluminescent Device 19 was obtained in a similar manner to Example 26 except that Composition 19 was used instead of Composition 1 in Example 26.

Example 45

Preparation of Electroluminescent Device 20

Electroluminescent Device 20 was obtained in a similar manner to Example 26 except that Composition 20 was used instead of Composition 1 in Example 26.

Example 46

Preparation of Electroluminescent Device 21

Electroluminescent Device 21 was obtained in a similar manner to Example 26 except that Composition 21 was used instead of Composition 1 in Example 26.

Example 47

Preparation of Electroluminescent Device 22

Electroluminescent Device 22 was obtained in a similar manner to Example 26 except that Composition 22 was used instead of Composition 1 in Example 26.

Example 48

Preparation of Electroluminescent Device 23

Electroluminescent Device 23 was obtained in a similar manner to Example 26 except that Composition 23 was used instead of Composition 1 in Example 26.

Example 49

Preparation of Electroluminescent Device 24

Electroluminescent Device 24 was obtained in a similar manner to Example 26 except that Composition 24 was used instead of Composition 1 in Example 26.

Example 50

Preparation of Electroluminescent Device 25

Electroluminescent Device 25 was obtained in a similar manner to Example 26 except that Composition 25 was used instead of Composition 1 in Example 26.

Example 51

Preparation of Electroluminescent Device 26

Electroluminescent Device 26 was obtained in a similar manner to Example 26 except that Ag was used instead of Al in Example 26.

Example 52

Preparation of Electroluminescent Device 27

Electroluminescent Device 26 was obtained in a similar manner to Example 26 except that Au was used instead of Al in Example 26.

Comparative Example 1

Preparation of Electroluminescent Device A1

Electroluminescent Device A1 was obtained in a similar manner to Example 26 except that the layer including Composition 1 was not formed and the cathode was directly formed on the light emitting layer in Example 26.

Comparative Example 2

Preparation of Electroluminescent Device A2

Electroluminescent Device A2 was obtained in a similar manner to Example 51 except that the layer including Composition 1 was not formed and the cathode was directly formed on the light emitting layer in Example 51.

Comparative Example 3

Preparation of Electroluminescent Device A3

Electroluminescent Device A3 was obtained in a similar manner to Example 52 except that the layer including Composition 1 was not formed and the cathode was directly formed on the light emitting layer in Example 52.

[Evaluation of Electroluminescent Device]

To Electroluminescent Devices 1 to 27 and Electroluminescent Devices A1 to A3, 10 V of forward direction voltage was applied and light emitting brightness and light emitting efficiency were measured. The results are listed in Table 1.

TABLE 1

| | COMPOSITION | CATHODE | BRIGHTNESS ($cd/m^2$) | LUMINOUS EFFICIENCY (cd/A) |
|---|---|---|---|---|
| EXAMPLE 26 (ELECTROLUMINESCENT DEVICE 1) | COMPOSITION 1 | Al | 5855.3 | 3.56 |
| EXAMPLE 27 (ELECTROLUMINESCENT DEVICE 2) | COMPOSITION 2 | Al | 5618.6 | 3.31 |
| EXAMPLE 28 (ELECTROLUMINESCENT DEVICE 3) | COMPOSITION 3 | Al | 4490.0 | 3.69 |
| EXAMPLE 29 (ELECTROLUMINESCENT DEVICE 4) | COMPOSITION 4 | Al | 1535.0 | 3.23 |
| EXAMPLE 30 (ELECTROLUMINESCENT DEVICE 5) | COMPOSITION 5 | Al | 2976.7 | 2.85 |
| EXAMPLE 31 (ELECTROLUMINESCENT DEVICE 6) | COMPOSITION 6 | Al | 8762.7 | 3.08 |
| EXAMPLE 32 (ELECTROLUMINESCENT DEVICE 7) | COMPOSITION 7 | Al | 2748.7 | 2.89 |
| EXAMPLE 33 (ELECTROLUMINESCENT DEVICE 8) | COMPOSITION 8 | Al | 502.1 | 2.41 |
| EXAMPLE 34 (ELECTROLUMINESCENT DEVICE 9) | COMPOSITION 9 | Al | 2677.0 | 3.40 |
| EXAMPLE 35 (ELECTROLUMINESCENT DEVICE 10) | COMPOSITION 10 | Al | 4713.3 | 3.14 |
| EXAMPLE 36 (ELECTROLUMINESCENT DEVICE 11) | COMPOSITION 11 | Al | 4452.9 | 1.02 |
| EXAMPLE 37 (ELECTROLUMINESCENT DEVICE 12) | COMPOSITION 12 | Al | 9356.0 | 3.11 |
| EXAMPLE 38 (ELECTROLUMINESCENT DEVICE 13) | COMPOSITION 13 | Al | 4385.1 | 3.73 |
| EXAMPLE 39 (ELECTROLUMINESCENT DEVICE 14) | COMPOSITION 14 | Al | 6532.6 | 3.27 |
| EXAMPLE 40 (ELECTROLUMINESCENT DEVICE 15) | COMPOSITION 15 | Al | 374.8 | 1.80 |
| EXAMPLE 41 (ELECTROLUMINESCENT DEVICE 16) | COMPOSITION 16 | Al | 3476.0 | 2.88 |
| EXAMPLE 42 (ELECTROLUMINESCENT DEVICE 17) | COMPOSITION 17 | Al | 5148.0 | 3.69 |
| EXAMPLE 43 (ELECTROLUMINESCENT DEVICE 18) | COMPOSITION 18 | Al | 6102.4 | 3.44 |
| EXAMPLE 44 (ELECTROLUMINESCENT DEVICE 19) | COMPOSITION 19 | Al | 6662.9 | 4.47 |
| EXAMPLE 45 (ELECTROLUMINESCENT DEVICE 20) | COMPOSITION 20 | Al | 4664.2 | 4.71 |
| EXAMPLE 46 (ELECTROLUMINESCENT DEVICE 21) | COMPOSITION 21 | Al | 8534.1 | 5.07 |
| EXAMPLE 47 (ELECTROLUMINESCENT DEVICE 22) | COMPOSITION 22 | Al | 5161.1 | 4.93 |
| EXAMPLE 48 (ELECTROLUMINESCENT DEVICE 23) | COMPOSITION 23 | Al | 19554.8 | 3.80 |
| EXAMPLE 49 (ELECTROLUMINESCENT DEVICE 24) | COMPOSITION 24 | Al | 6549.0 | 4.30 |
| EXAMPLE 50 (ELECTROLUMINESCENT DEVICE 25) | COMPOSITION 25 | Al | 6410.8 | 5.14 |
| EXAMPLE 51 (ELECTROLUMINESCENT DEVICE 26) | COMPOSITION 1 | Ag | 96.1 | 1.10 |
| EXAMPLE 52 (ELECTROLUMINESCENT DEVICE 27) | COMPOSITION 1 | Au | 19.1 | 0.22 |
| COMPARATIVE EXAMPLE 1 (ELECTROLUMINESCENT DEVICE A1) | NOT INCLUDED | Al | 1.50 | 0.01 |
| COMPARATIVE EXAMPLE 2 (ELECTROLUMINESCENT DEVICE A2) | NOT INCLUDED | Ag | 12.8 | 0.5 |
| COMPARATIVE EXAMPLE 3 (ELECTROLUMINESCENT DEVICE A3) | NOT INCLUDED | Au | NOT EMIT | NOT EMIT |

Preparation Example 50

Synthesis of Silver Nanostructure A

A flask having a capacity of 50 mL in which 5 ml of ethylene glycol was placed was immersed in an oil bath of 150° C., and pre-heating was carried out with ethylene glycol being bubbled with air for 60 minutes. After the pre-heating, the atmosphere in the flask was replaced with nitrogen gas by switching air to nitrogen gas and the bubbling was stopped. Subsequently, 1.5 mL of 0.1 M silver nitrate-ethylene glycol solution, 1.5 mL of 0.15 mol/L polyvinylpyrrolidone-ethylene glycol solution (polyvinylpyrrolidone may be abbreviated to "PVP", manufactured by Sigma-Aldrich Corp., weight average molecular weight listed in the catalog: $5.5\times10^4$), and 40 μL of 4 mmol/L copper chloride dihydrate-ethylene glycol solution were poured and stirred for 120 minutes, thus obtaining a dispersion of silver nanostructure. After the obtained dispersion was cooled to 40° C., the dispersion was centrifuged to obtain a precipitate. The obtained precipitate was dried, thus obtaining a silver nanostructure (hereinafter referred to as "Silver Nanostructure A").

When the obtained Silver Nanostructure A was visually inspected using a photograph taken by a scanning electron microscope (manufactured by JEOL Ltd., trade name: JSM-5500) (hereinafter referred to as "SEM"), Silver Nanostructures A had a shape of a wire, an average value of the shortest diameter of about 30 nm, and an average value of the longest diameter of 15 μm. An average value of the aspect ratio of at least ten Silver Nanostructures A observed by the method described above was about 500.

Preparation Example 51

Synthesis of Composition 26

Conjugated Polymer Compound 1 (2 mg) and cesium hydroxide monohydrate (0.7 mg) were mixed, thus obtaining Composition 26 made of Conjugated Polymer Compound 1 and cesium hydroxide.

Preparation Example 52

Synthesis of Composition for Cathode A

Silver Nanostructure A (10.0 mg) was mixed with 1.3 mL of water and the mixture was stirred for 1 hour to prepare Composition for Cathode A.

Example 53

Preparation of Electroluminescent Device 28

A hole injection material solution was applied onto an ITO anode (thickness: 45 nm) that is formed and patterned on a surface of a glass substrate by a spin coating method to form a film of a hole injection layer having a thickness of 70 nm. The glass substrate on which the film of the hole injection layer was formed was heated for 10 minutes at 200° C. under an inert atmosphere (under a nitrogen atmosphere) to insolubilize the hole injection layer. The substrate was naturally cooled to room temperature, thus obtaining a substrate on which the hole injection layer was formed.

Here, as the hole injection material solution, poly(3,4-ethylenedioxythiophene)-polystyrene sulfonic acid (manufactured by H. C. Starck GmbH, PEDOT: PSS solution, product name: CLEVIOS (registered trademark) P VP AI 4083) was used.

Subsequently, Hole Transport Polymer Material A and xylene were mixed, thus obtaining Hole Transport Layer Forming Composition B including 0.6% by weight of Hole Transport Polymer Material A.

Onto the above-obtained hole injection layer on the substrate on which the hole injection layer was formed, Hole Transport Layer Forming Composition B was applied by the spin coating method, thus obtaining a coating film having a thickness of 33 nm. After the substrate having the coating film was heated for 20 minutes at 200° C. under an inert atmosphere (a nitrogen atmosphere) to insolubilize the coating film, the substrate was naturally cooled to room temperature, thus obtaining the substrate over which a hole transport layer was formed.

Subsequently, Light Emitting Polymer Material A and xylene were mixed, thus obtaining Light Emitting Layer Forming Composition B including 1.3% by weight of Light Emitting Polymer Material A.

Onto the above-obtained hole transport layer over the substrate over which the hole transport layer was formed, Light Emitting Layer Forming Composition B was applied by the spin coating method, thus obtaining a coating film having a thickness of 99 nm. After the substrate having the coating film was heated for 15 minutes at 130° C. under an inert atmosphere (a nitrogen atmosphere) to evaporate the solvent, the substrate was naturally cooled to room temperature, thus obtaining the substrate over which a light emitting layer was formed.

Methanol and Composition 26 were mixed, thus obtaining a solution including 0.2% by weight of Composition 26. Onto the above-obtained light emitting layer over the substrate over which the light emitting layer was formed, the solution was applied by the spin coating method, thus obtaining a coating film having a thickness of 10 nm. After the substrate having the coating film was heated for 10 minutes at 130° C. under an inert atmosphere (a nitrogen atmosphere) to evaporate the solvent, the substrate was naturally cooled to room temperature, thus obtaining the substrate over which a layer including Composition 26 was formed.

Composition for Cathode A was applied to the above-obtained substrate over which the layer including Compound 26 was formed to form a coating film having a thickness of about 200 nm. After the substrate over which the coating film was formed was heated for 10 minutes at 130° C. under a nitrogen atmosphere to evaporate the solvent, the substrate was naturally cooled to room temperature, thus obtaining Layered Structure 2 in which a cathode was formed.

The above-obtained Layered Structure 2 was sealed with sealing glasses and a two-component epoxy resin under an inert atmosphere (a nitrogen atmosphere), thus obtaining Electroluminescent Device 28.

Example 54

Preparation of Electroluminescent Device 29

Electroluminescent Device 29 was obtained in a similar manner to Example 53 except that, instead of Cathode Composition A, a cathode was formed in a manner that Cathode Composition B that is a dispersion of silver nanoparticles having a number average Feret diameter of 7 nm (NPS-JL, manufactured by Harima Chemicals, Ltd., aspect ratio of silver particles: 1.0) was applied by the casting method to form a coating film having a thickness of 200 nm, the substrate over which the coating film was formed being heated for 10 minutes at 130° C. under a nitrogen atmosphere to evaporate the solvent, and the sample being naturally cooled to room temperature to form a cathode.

Comparative Example 4

Preparation of Electroluminescent Device A4

Electroluminescent Device A4 was obtained in a similar manner to Example 53 except that the layer including Composition 26 was not formed in Example 53.

Comparative Example 5

Preparation of Electroluminescent Device A5

Electroluminescent Device A5 was obtained in a similar manner to Example 54 except that the layer including Composition 26 was not formed in Example 54.

[Evaluation of Electroluminescent Device]

To Electroluminescent Devices 28 and 29 and Electroluminescent Devices A4 and A5, 14 V of forward direction voltage was applied and light emitting brightness and light emitting efficiency were measured. The results are listed in Table 2.

TABLE 2

| | Composition | Cathode | Light emission brightness ($cd/m^2$) | Light emission efficiency (cd/A) |
|---|---|---|---|---|
| Example 53 (Electroluminescent Device 28) | Composition 26 | Silver Nano-structure A | 21.0 | 0.41 |
| Example 54 (Electroluminescent Device 29) | Composition 26 | Silver nanoparticle | 409.7 | 1.82 |
| Comparative Example 4 (Electroluminescent Device A4) | None | Silver Nano-structure A | Not emitted | Not emitted |
| Comparative Example 5 (Electroluminescent Device A5) | None | Silver nanoparticle | Not emitted | Not emitted |

As is clear from Table 1 and Table 2, the electroluminescent devices including the composition of the present invention emits light in high brightness compared with the electroluminescent devices not including the composition. In addition, the electroluminescent device including the composition of the present invention has high light emitting efficiency compared with the electroluminescent device not including the composition.

What is claimed is:

1. A composition comprising:

a polymer compound comprising one or more structural unit(s) selected from the group consisting of a structural unit represented by Formula (16), a structural unit represented by Formula (18), a structural unit represented by Formula (20), and a structural unit represented by Formula (22); and an ionic compound represented by Formula (23);

wherein the structural unit represented by Formula (16) is:

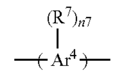
(16)

wherein:

$R^7$ is a monovalent group comprising a group represented by Formula (17);

$Ar^4$ is a (2+n7)-valent aromatic group that optionally has a substituent other than $R^7$;

n7 is an integer of 1 or more;

when a plurality of $R^7$ are present, each $R^7$ may be the same as or different from each other; and wherein the structural unit represented by Formula (17) is:

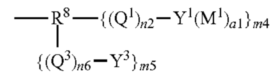
(17)

wherein:

$R^8$ is a (1+m4+m5)-valent organic group;

$Q^1$ is a divalent organic group;

$Q^3$ is a divalent organic group;

$Y^1$ is $—CO_2^-$, $—SO_3^-$, $—SO_2^-$, $PO_3^{2-}$, OR $—B(R^\alpha)_3^-$;

$R^\alpha$ is an alkyl group having 1 to 30 carbon atoms that optionally have a substituent or an aryl group having 6 to 50 carbon atoms that optionally has a substituent;

each $R^\alpha$ may be the same as or different from each other;

$M^1$ is a metallic cation or an ammonium cation that optionally has a substituent;

$Y^3$ is a cyano group or a group represented by either of Formulas (7) to (15);

n2 is an integer of 0 or more;

a1 is an integer of 1 or more and is selected so that the charge of the group represented by Formula (17) is zero;

n6 is an integer of 0 or more;

m4 and m5 are each independently an integer of 1 or more;

when a plurality of $Q^1$ are present, each $Q^1$ may be the same as or different from each other;

when a plurality of $Q^3$ are present, each $Q^3$ may be the same as or different from each other;

when a plurality of $Y^1$ are present, each $Y^1$ may be the same as or different from each other;

when a plurality of $M^1$ are present, each $M^1$ may be the same as or different from each other;

when a plurality of $Y^3$ are present, each $Y^3$ may be the same as or different from each other;

when a plurality of n2 are present, each n2 may be the same as or different from each other;

when a plurality of a1 are present, each a1 may be the same as or different from each other; and when a plurality of n6 are present, each n6 may be the same as or different from each other;

wherein Formulas (7) to (15) are:

$$—O—(R'O)_{a3}—R'' \quad (7)$$

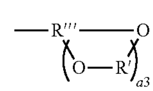
(8)

—S—(R'S)$_{a4}$—R" (9)

—C(═O)—(R'—C(═O))$_{a4}$—R" (10)

—C(═S)—(R'—C(═S))$_{a4}$—R" (11)

—N{(R')$_{a4}$—R"}$_2$ (12)

—C(═O)O—(R'—C(═O)O)$_{a4}$—R" (13)

—C(═O)O—(R'O)$_{a4}$—R" (14)

—NHC(═O)—(R'NHC(═O))$_{a4}$—R" (15)

wherein:

R' is a divalent hydrocarbon group that optionally has a substituent;

R" is a hydrogen atom, a monovalent hydrocarbon group that optionally has a substituent, a carboxyl group, a sulfo group, a hydroxyl group, a mercapto group, —NR$^C_2$, a cyano group, or —C(═O)NR$^C_2$;

R''' is a trivalent hydrocarbon group that optionally has a substituent;

a3 is an integer of 1 or more;

a4 is an integer of 0 or more;

R$^c$ is an alkyl group having 1 to 30 carbon atoms that optionally has a substituent or an aryl group having 6 to 50 carbon atoms that optionally has a substituent;

each R$^c$ may be the same as or different from each other;

when a plurality of R' are present, each R' may be the same as or different from each other;

when a plurality of R" are present, each R" may be the same as or different from each other; and when a plurality of a4 are present, each a4 may be the same as or different from each other;

wherein the structural unit represented by Formula (18) is:

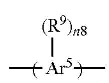

(18)

wherein:

R$^9$ is a monovalent group comprising a group represented by Formula (19);

Ar$^5$ is a (2+n8)-valent aromatic group that optionally has a substituent other than R$^9$;

n8 is an integer of 1 or more;

when a plurality of R$^9$ are present, each R$^9$ may be the same as or different from each other; and wherein the group represented by Formula (19) is:

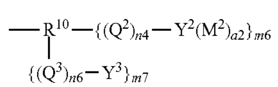

(19)

wherein:

R$^{10}$ is a (1+m6+m7)-valent organic group;

Q$^3$, and n6 are the same as the corresponding definitions above;

Q$^2$ is a divalent organic group;

Y$^2$ is a carbocation, an ammonium cation, a phosphonium cation, a sulfonium cation, or an iodonium cation;

M$^2$ is F$^-$, Cl$^-$, Br$^-$, I$^-$, OH$^-$, B(R$^b$)$_4^-$, R$^b$SO$_3^-$, R$^b$COO$^-$, ClO$^-$, ClO$_2^-$, ClO$_3^-$, ClO$_4^-$, SCN$^-$, CN$^-$, NO$_3^-$, HSO$_4^-$, H$_2$PO$_4^-$, BF$_4^-$, or PF$_6^-$;

R$^b$ is an alkyl group having 1 to 30 carbon atoms that optionally has a substituent or an aryl group having 6 to 50 carbon atoms that optionally has a substituent;

when a plurality of R$^b$ are present, and each R$^b$ may be the same as or different from each other;

n4 is an integer of 0 or more;

a2 is 1;

m6 and m7 are each independently an integer of 1 or more; and when a plurality of Q$^2$ are present, each Q$^2$ may be the same as or different from each other;

when a plurality of Q$^3$ are present, each Q$^3$ may be the same as or different from each other;

when a plurality of Y$^2$ are present, each Y$^2$ may be the same as or different from each other;

when a plurality of M$^2$ are present, each M$^2$ may be the same as or different from each other;

when a plurality of Y$^3$ are present, each Y$^3$ may be the same as or different from each other;

when a plurality of n4 are present, each n4 may be the same as or different from each other; and when a plurality of n6 are present, each n6 may be the same as or different from each other;

wherein the structural unit represented by Formula (20) is:

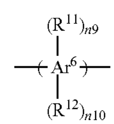

(20)

wherein:

R$^{11}$ is a monovalent group comprising a group represented by Formula (2) or a group represented by Formula (17);

R$^{12}$ is a monovalent group comprising a group represented by Formula (21);

Ar$^6$ is a (2+n9+n10)-valent aromatic group that optionally has a substituent other than either R$^{11}$ or R$^{12}$;

n9 and n10 are each independently an integer of 1 or more; and when a plurality of R$^{11}$ are present, each R$^{11}$ may be the same as or different from each other;

when a plurality of R$^{12}$ are present, each R$^{12}$ may be the same as or different from each other; and wherein the group represented by Formula (21) is:

—R$^{13}$-{(Q$^3$)$_{n6}$-Y$^3$}$_{m8}$ (21)

wherein:

R$^{13}$ is a single bond or a (1+m8)-valent organic group;

Q$^3$, Y$^3$, and n6 are the same as the corresponding definitions above;

m8 is an integer of 1 or more, and when R$^{13}$ is a single bond, m8 is 1;

when a plurality of Q$^3$ are present, each Q$^3$ may be the same as or different from each other;

when a plurality of Y$^3$ are present, each Y$^3$ may be the same as or different from each other; and when a plurality of n6 are present, each n6 may be the same as or different from each other;

wherein the group represented by Formula (2) is:

—R$^2$-{(Q$^1$)$_{n2}$-Y$^1$(M$^1$)$_{a1}$}$_{m1}$ (2)

wherein:

Q$^1$, Y$^1$, M$^1$, n2, and a1 are the same as the corresponding definitions above;

$R^2$ is a single bond or a (1+m1) valent organic group;

a1 is an integer of 1 or more and is selected so that the charge of the group represented by Formula (2) is zero;

m1 is an integer of 1 or more, and when $R^2$ is a single bond, m1 is 1;

when a plurality of $Q^1$ are present, each $Q^1$ may be the same as or different from each other;

when a plurality of $Y^1$ are present, each $Y^1$ may be the same as or different from each other;

when a plurality of $M^1$ are present, each $M^1$ may be the same as or different from each other;

when a plurality of n2 are present, each n2 may be the same as or different from each other;

when a plurality of a1 are present, each a1 may be the same as or different from each other;

wherein the structural unit represented by Formula (22) is:

(22)

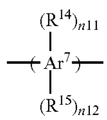

wherein:

$R^{14}$ is a monovalent group comprising a group represented by Formula (4) or a group represented by Formula (19);

$R^{15}$ is a monovalent group comprising a group represented by Formula (21);

$Ar^{17}$ is a (2+n11+n12)-valent aromatic group that optionally has a substituent other than either $R^{14}$ or $R^{15}$;

n11 and n12 are each independently an integer of 1 or more;

when a plurality of $R^{14}$ are present, each $R^{14}$ may be the same as or different from each other;

when a plurality of $R^{15}$ are present, each $R^{15}$ may be the same as or different from each other; and wherein the group represented by Formula (4) is:

$$—R^4\text{-}\{(Q^2)_{n4}\text{-}Y^2(M^2)_{a2}\}_{m2} \quad (4)$$

wherein:

$Q^2$, $Y^2$, $M^2$, n4, and a2 are the same as the corresponding definitions above;

$R^4$ is a single bond or a (1+m2)-valent organic group;

m2 is an integer of 1 or more, and when $R^4$ is a single bond, m2 is 1;

when a plurality of $Q^2$ are present, each $Q^2$ may be the same as or different from each other;

when a plurality of $Y^2$ are present, each $Y^2$ may be the same as or different from each other;

when a plurality of $M^2$ are present, each $M^2$ may be the same as or different from each other;

when a plurality of n4 are present, each n4 may be the same as or different from each other;

wherein the group represented by Formula (23) is:

$$(M^3)_{a5}(Z^3)_{b1} \quad (23)$$

wherein:

$M^3$ is a metallic cation or an ammonium cation that optionally has a substituent;

$Z^3$ is $F^-$, $Cl^-$, $Br^-$, $I^-$, $OH^-$, $B(R^P)_4^-$, $R^PSO_3^-$, $R^PCOO^-$, $R^PO^-$, $ClO^-$, $ClO_2^-$, $ClO_3^-$, $ClO_4^-$, $SCN^-$, $CN^-$, $NO_3^-$, $CO_3^{2-}$, $SO_4^{2-}$, $HSO_4^-$, $PO_4^{3-}$, $HPO_4^{2-}$, $H_2PO_4^-$, $BF_4^-$, or $PF_6^-$;

a5 is an integer of 1 or more, b1 is an integer of 1 or more, and a5 and b1 are selected so that the charge of the ionic compound represented by Formula (23) is zero;

$R^P$ is a monovalent organic group that optionally has a substituent; and when a plurality of $R^P$ are present, each $R^P$ may be the same as or different from each other.

2. The composition according to claim 1, wherein the (2+n7)-valent aromatic group represented by $Ar^4$ is a group in which (2+n7) hydrogen atoms are removed from a ring represented by any one of Formulas 1 to 4, 6, 13 to 15, 19, 21, 23, 31 to 33, 43, 46, 47, and 51:

1

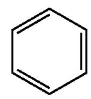

2

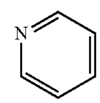

3

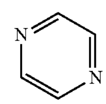

4

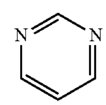

6

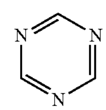

13

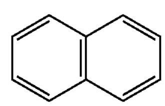

14

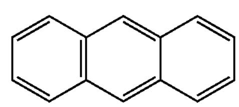

15

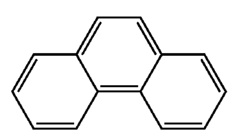

19

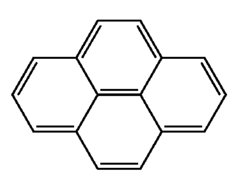

21

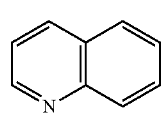

23

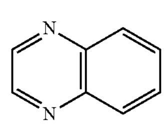

-continued

31
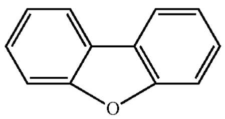

32
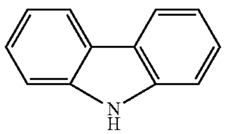

33
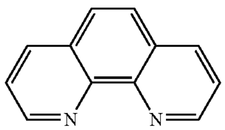

43
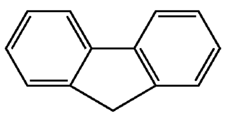

46
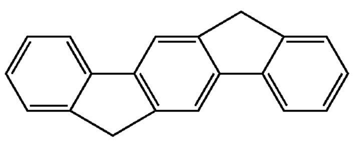

47
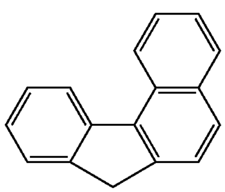

51
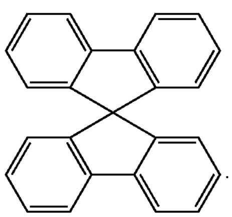

3. The composition according to claim 1, wherein the (2+n7)-valent aromatic group represented by $Ar^4$ is a group in which n7 hydrogen atom is removed from a group represented by any one of Formulas 1', 3', 6', 13' to 15', 21', 23', 33', 43', 46', and 47':

1'
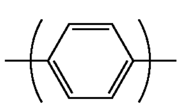

3'
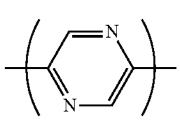

-continued

6'
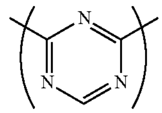

13'
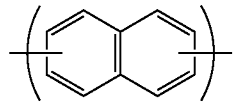

14'
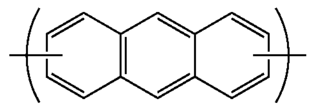

15'
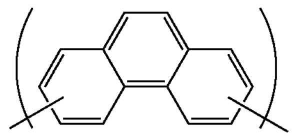

21'
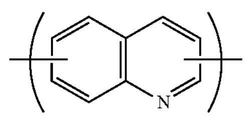

23'
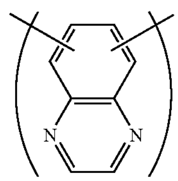

33'
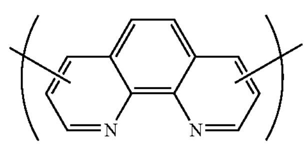

43'
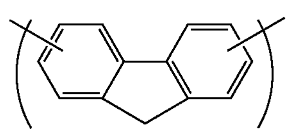

46'
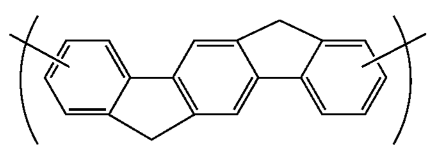

47'
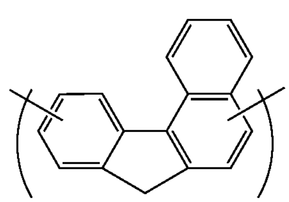

4. The composition according to claim 1, wherein the (2+n8)-valent aromatic group represented by $Ar^5$ is a group in which (2+n8) hydrogen atoms are removed from a ring represented by any one of Formulas 1 to 4, 6, 13 to 15, 19, 21, 23, 31 to 33, 43, 46, 47, and 51:

1
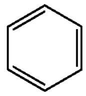
2
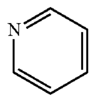
3
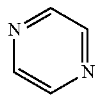
4
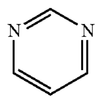
6
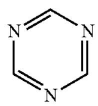
13
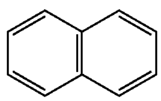
14
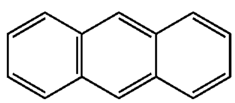
15
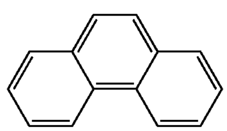
19
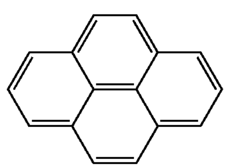
21
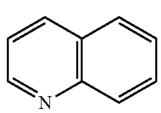
23
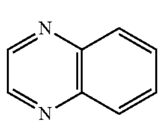
31
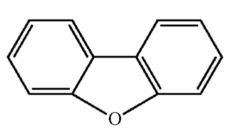
32
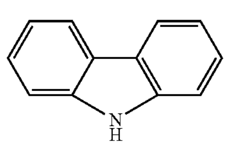
-continued
33
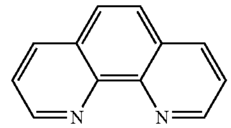
43
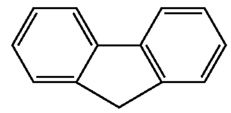
46
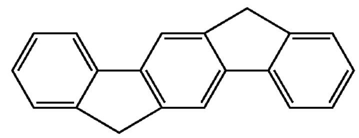
47
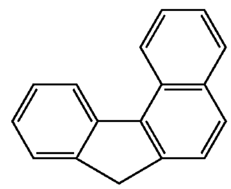
51
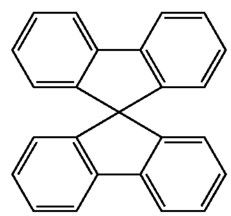
5. The composition according to claim 1, wherein the (2+n8)-valent aromatic group represented by $Ar^5$ is a group in which n8 hydrogen atom is removed from a group represented by any one of Formulas 1', 3', 6', 13' to 15', 21', 23', 33', 43', 46', and 47':
1'
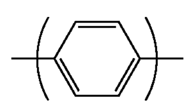
3'
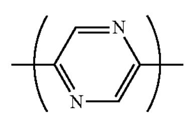
6'
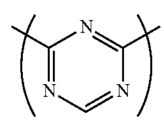
13'
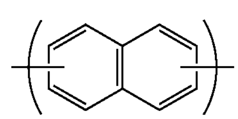
14'
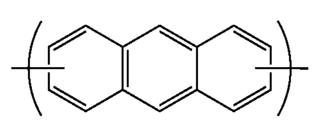

-continued
15′
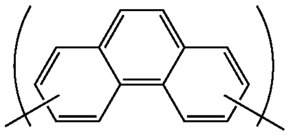
21′
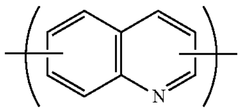
23′
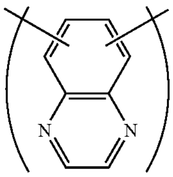
33′
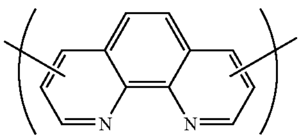
43′
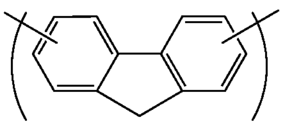
46′
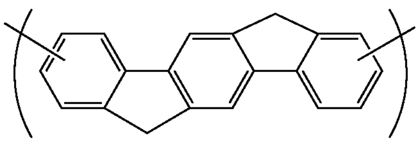
47′
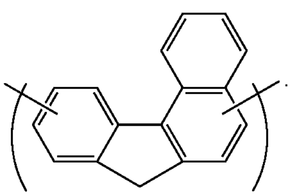
6. The composition according to claim 1, wherein the (2+n9+n10)-valent aromatic group represented by $Ar^6$ is a group in which (2+n9+n10) hydrogen atoms are removed from a ring represented by any one of Formulas 1 to 4, 13 to 15, 19, 21, 23, 31 to 33, 43, 46, 47, and 51:
1
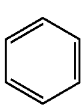
2
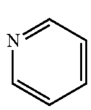
3
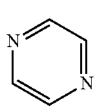
-continued
4
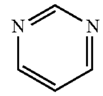
13
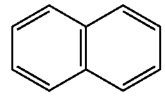
14
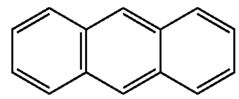
15
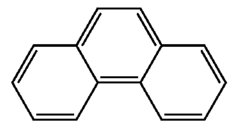
19
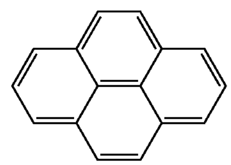
21
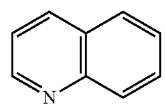
23
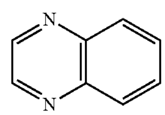
31
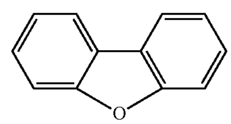
32
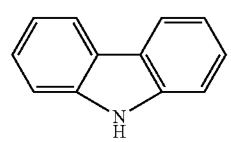
33
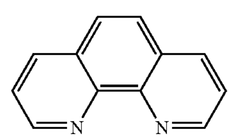
43
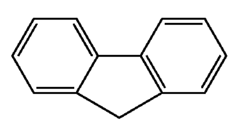
46
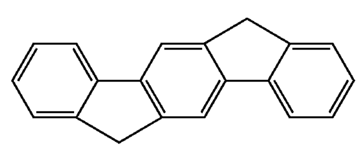

-continued

47

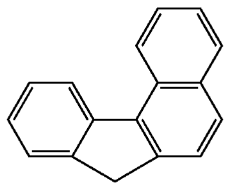

51

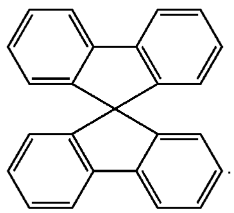

7. The composition according to claim 1, wherein the (2+n9+n10)-valent aromatic group represented by $Ar^6$ is a group in which (n9+n10) hydrogen atoms are removed from a group represented by any one of Formulas 1', 3', 13' to 15', 21', 23', 33', 43', 46', and 47':

1′

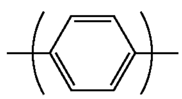

3′

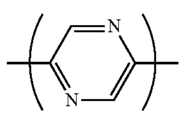

13′

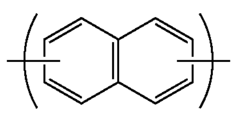

14′

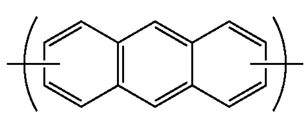

15′

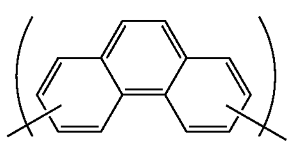

21′

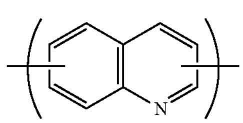

23′

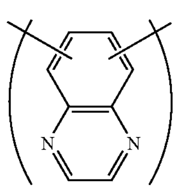

-continued

33′

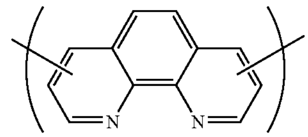

43′

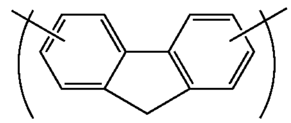

46′

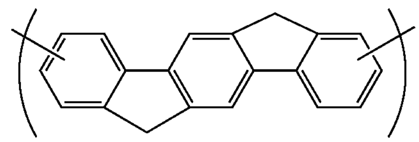

47′

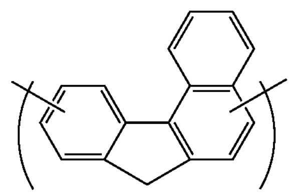

8. The composition according to claim 1, wherein the (2+n11+n12)-valent aromatic group represented by $Ar^7$ is a group in which (2+n11+n12) hydrogen atoms are removed from a ring represented by any one of Formulas 1 to 4, 13 to 15, 19, 21, 23, 31 to 33, 43, 46, 47, and 51:

1

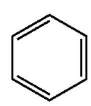

2

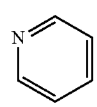

3

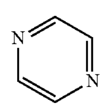

4

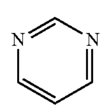

13

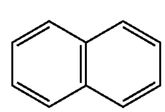

14

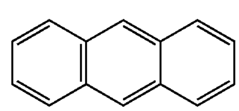

-continued
15
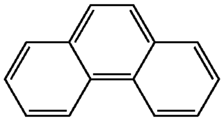
19
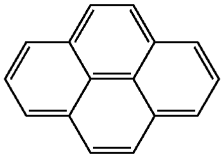
21
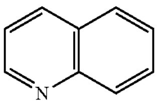
23
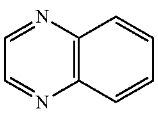
31
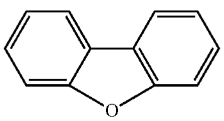
32
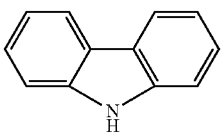
33
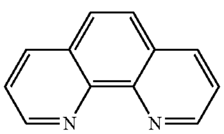
43
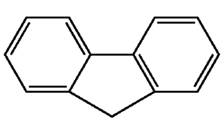
46
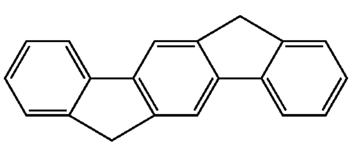
47
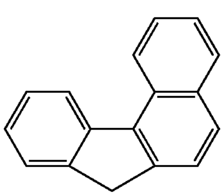
-continued
51
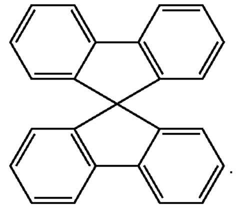
9. The composition according to claim 1, wherein the (2+n11+n12)-valent aromatic group represented by $Ar^7$ is a group in which (n11+n12) hydrogen atoms are removed from a group represented by any one of Formulas 1', 3', 13' to 15', 21', 23', 33', 43', 46', and 47':
1′
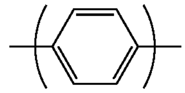
3′
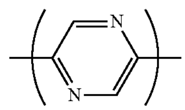
13′
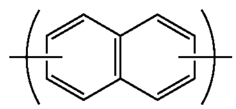
14′
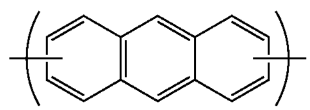
15′
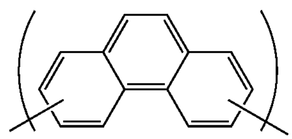
21′
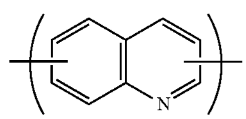
23′
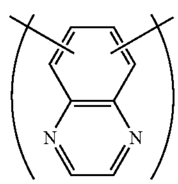
33′
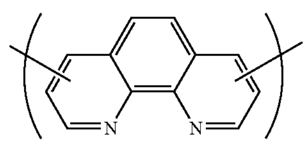
43′
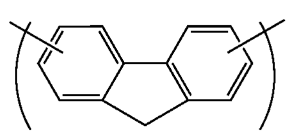

-continued

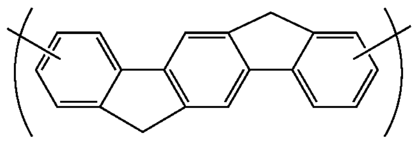

46'

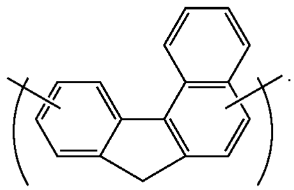

47'

10. The composition according to claim 1, wherein $M^3$ is an alkali metal cation or an alkaline earth metal cation.

11. The composition according to claim 1, wherein the proportion of the ionic compound represented by Formula (23) comprised in the composition is 0.1 to 100% by weight to the weight of a polymer compound comprised in the composition.

12. An organic film comprising the composition according to claim 1.

13. An electric device comprising:

a first electrode;

a second electrode;

a light emitting layer or a charge separation layer placed between the first electrode and the second electrode; and a layer comprising the compound according to claim 1 placed between the first electrode and any one of the light emitting layer or the charge separation layer.

14. The electric device according to claim 13, wherein the first electrode is a cathode.

* * * * *